United States Patent
Wang et al.

(10) Patent No.: US 10,468,543 B2
(45) Date of Patent: *Nov. 5, 2019

(54) MICROSTRUCTURE ENHANCED ABSORPTION PHOTOSENSITIVE DEVICES

(71) Applicant: W&WSens, Devices Inc., Los Altos, CA (US)

(72) Inventors: Shih-Yuan Wang, Palo Alto, CA (US); Shih-Ping Wang, Los Altos, CA (US); M. Saif Islam, Davis, CA (US)

(73) Assignee: W&Wsens Devices, Inc., Los Altos, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/296,985

(22) Filed: Mar. 8, 2019

(65) Prior Publication Data

US 2019/0288132 A1  Sep. 19, 2019

Related U.S. Application Data

(63) Continuation of application No. 15/797,821, filed on Oct. 30, 2017, which is a continuation-in-part of
(Continued)

(51) Int. Cl.
*H01L 31/0236* (2006.01)
*H01L 31/0232* (2014.01)
(Continued)

(52) U.S. Cl.
CPC ........ *H01L 31/02363* (2013.01); *G02B 1/002* (2013.01); *G02B 1/005* (2013.01);
(Continued)

(58) Field of Classification Search
CPC ... H01L 31/00; H01L 31/02; H01L 31/02016; H01L 31/02027; H01L 31/0216;
(Continued)

(56) References Cited

U.S. PATENT DOCUMENTS 4,292,512 A   9/1981   Miller et al.
4,571,559 A   2/1986   Henry et al.
(Continued)

FOREIGN PATENT DOCUMENTS

JP   6-53424       2/1994
JP   2003-142778   5/2003
(Continued)

OTHER PUBLICATIONS

Zang K. et al. "Silicon single-photon avalanche diodes with nanostructured light trapping" Nat. Comm. 2017, 8, 628.
(Continued)

*Primary Examiner* — Eduardo A Rodela
(74) *Attorney, Agent, or Firm* — Cooper & Dunham LLP

(57) ABSTRACT

Microstructure enhanced photodiodes and avalanche photodiodes are monolithically integrated with CMOS/BiCMOS circuitry such as transimpedance amplifiers. Microstructures, such as holes, can improve quantum efficiency in silicon and III-V materials and can also reduce avalanche voltages for avalanche photodiodes. Applications include optical communications within and between datacenters, telecommunications, LIDAR, and free space data communication.

44 Claims, 131 Drawing Sheets

Related U.S. Application Data application No. 15/309,922, filed as application No. PCT/US2015/061120 on Nov. 17, 2015, now Pat. No. 9,818,893, said application No. 15/309,922 is a continuation of application No. 14/943,898, filed on Nov. 17, 2015, now Pat. No. 9,530,905, which is a continuation of application No. 14/945,003, filed on Nov. 18, 2015, now Pat. No. 9,525,084, said application No. 15/797,821 is a continuation-in-part of application No. 14/947,718, which is a continuation of application No. PCT/US2014/039208, filed on May 22, 2014, which is a continuation-in-part of application No. PCT/US2016/067977, filed on Dec. 21, 2016.

(60) Provisional application No. 62/081,538, filed on Nov. 18, 2014, provisional application No. 62/090,879, filed on Dec. 11, 2014, provisional application No. 62/100,025, filed on Jan. 5, 2015, provisional application No. 62/111,582, filed on Feb. 3, 2015, provisional application No. 62/139,511, filed on Mar. 27, 2015, provisional application No. 62/153,443, filed on Apr. 27, 2015, provisional application No. 62/154,675, filed on Apr. 29, 2015, provisional application No. 62/157,876, filed on May 6, 2015, provisional application No. 62/171,915, filed on Jun. 5, 2015, provisional application No. 62/174,498, filed on Jun. 11, 2015, provisional application No. 62/175,855, filed on Jun. 15, 2015, provisional application No. 62/182,602, filed on Jun. 21, 2015, provisional application No. 62/188,876, filed on Jul. 6, 2015, provisional application No. 62/197,120, filed on Jul. 27, 2015, provisional application No. 62/199,607, filed on Jul. 31, 2015, provisional application No. 62/205,717, filed on Aug. 15, 2015, provisional application No. 62/209,311, filed on Aug. 24, 2015, provisional application No. 62/213,556, filed on Sep. 2, 2015, provisional application No. 62/232,716, filed on Sep. 25, 2015, provisional application No. 62/081,538, filed on Nov. 18, 2014, provisional application No. 62/090,879, filed on Dec. 11, 2014, provisional application No. 62/100,025, filed on Jan. 5, 2015, provisional application No. 62/111,582, filed on Feb. 3, 2015, provisional application No. 62/139,511, filed on Mar. 27, 2015, provisional application No. 62/153,443, filed on Apr. 27, 2015, provisional application No. 62/154,675, filed on Apr. 29, 2015, provisional application No. 62/157,876, filed on May 6, 2015, provisional application No. 62/171,915, filed on Jun. 5, 2015, provisional application No. 62/174,498, filed on Jun. 11, 2015, provisional application No. 62/175,855, filed on Jun. 15, 2015, provisional application No. 62/182,602, filed on Jun. 21, 2015, provisional application No. 62/188,876, filed on Jul. 6, 2015, provisional application No. 62/197,120, filed on Jul. 27, 2015, provisional application No. 62/199,607, filed on Jul. 31, 2015, provisional application No. 62/205,717, filed on Aug. 15, 2015, provisional application No. 62/209,311, filed on Aug. 24, 2015, provisional application No. 62/213,556, filed on Sep. 2, 2015, provisional application No. 62/232,716, filed on Sep. 25, 2015, provisional application No. 62/081,538, filed on Nov. 18, 2014, provisional application No. 62/090,879, filed on Dec. 11, 2014, provisional application No. 62/100,025, filed on Jan. 5, 2015, provisional application No. 62/111,582, filed on Feb. 3, 2015, provisional application No. 62/139,511, filed on Mar. 27, 2015, provisional application No. 62/153,443, filed on Apr. 27, 2015, provisional application No. 62/154,675, filed on Apr. 29, 2015, provisional application No. 62/157,876, filed on May 6, 2015, provisional application No. 62/171,915, filed on Jun. 5, 2015, provisional application No. 62/174,498, filed on Jun. 11, 2015, provisional application No. 62/175,855, filed on Jun. 15, 2015, provisional application No. 62/182,602, filed on Jun. 21, 2015, provisional application No. 62/188,876, filed on Jul. 6, 2015, provisional application No. 62/197,120, filed on Jul. 27, 2015, provisional application No. 62/199,607, filed on Jul. 31, 2015, provisional application No. 62/205,717, filed on Aug. 15, 2015, provisional application No. 62/209,311, filed on Aug. 24, 2015, provisional application No. 62/213,556, filed on Sep. 2, 2015, provisional application No. 62/232,716, filed on Sep. 25, 2015, provisional application No. 61/826,446, filed on May 22, 2013, provisional application No. 61/834,873, filed on Jun. 13, 2013, provisional application No. 61/843,021, filed on Jul. 4, 2013, provisional application No. 62/270,577, filed on Dec. 21, 2015, provisional application No. 62/290,391, filed on Feb. 2, 2016, provisional application No. 62/304,907, filed on Mar. 7, 2016, provisional application No. 62/334,934, filed on May 11, 2016, provisional application No. 62/338,263, filed on May 18, 2016, provisional application No. 62/346,850, filed on Jun. 7, 2016, provisional application No. 62/359,349, filed on Jul. 7, 2016, provisional application No. 62/366,188, filed on Jul. 25, 2016, provisional application No. 62/368,109, filed on Jul. 28, 2016, provisional application No. 62/374,828, filed on Aug. 13, 2016, provisional application No. 62/376,869, filed on Aug. 18, 2016, provisional application No. 62/380,364, filed on Aug. 27, 2016, provisional application No. 62/383,391, filed on Sep. 3, 2016, provisional application No. 62/383,479, filed on Sep. 4, 2016, provisional application No. 62/394,222, filed on Sep. 14, 2016, provisional application No. 62/398,607, filed on Sep. 23, 2016, provisional application No. 62/401,126, filed on Sep. 28, 2016, provisional application No. 62/406,999, filed on Oct. 12, 2016, provisional application No. 62/414,671, filed on Oct. 29, 2016, provisional application No. 62/415,339, filed on Oct. 31, 2016, provisional application No. 62/465,734, filed on Mar. 1, 2017, provisional application No. 62/474,179, filed on Mar. 21, 2017, provisional application No. 62/484,474, filed on Apr. 12, 2017, provisional application No. 62/487,606, filed on Apr. 20, 2017, provisional application No. 62/488,998, filed on Apr. 24, 2017, provisional application No. 62/500,581, filed on May 3, 2017, provisional application No. 62/505,974, filed on May 14, 2017, provisional application No. 62/509,093, filed on May 20, 2017, provisional application No. 62/510,249, filed on May 23, 2017, provisional application No. 62/514,889, filed on Jun. 4, 2017, provisional application No. 62/521,504, filed on Jun. 18, 2017, provisional application No. 62/522,169, filed on Jun. 20, 2017, provisional application No. 62/527,962, filed on Jun. 30, 2017, provisional application No. 62/530,281, filed on Jul. 9, 2017, provisional application No. 62/533,078, filed on Jul. 16, 2017, provisional application No. 62/533,603, filed on Jul. 17, 2017, provisional application No. 62/535,801, filed on Jul. 21, 2017, provisional application No. 62/540,524, filed on Aug. 2, 2017, provisional application No. 62/542,243, filed on Aug. 7, 2017, provisional application No. 62/547,728, filed on Aug. 18, 2017, provisional application No. 62/553,844, filed on Sep. 2, 2017, provisional application No. 62/556,426, filed on Sep. 10, 2017, provisional application No. 62/561,869, filed on Sep. 22, 2017, provisional application No. 61/905,109, filed on Nov. 15, 2013.

(51) Int. Cl.
*G02B 1/00* (2006.01)
*H01L 31/02* (2006.01)
*H01L 31/028* (2006.01)
*H01L 27/144* (2006.01)
*H01L 27/146* (2006.01)
*H01L 31/103* (2006.01)
*H01L 31/107* (2006.01)
*H01L 31/0352* (2006.01)
*H01L 31/18* (2006.01)
*H04B 10/69* (2013.01)
*H04B 10/40* (2013.01)
*H04B 10/25* (2013.01)
*H04B 10/80* (2013.01)
*H01L 31/09* (2006.01)
*H01L 31/105* (2006.01)

(52) U.S. Cl.
CPC ...... *H01L 27/1443* (2013.01); *H01L 27/1446* (2013.01); *H01L 27/14625* (2013.01); *H01L 31/02* (2013.01); *H01L 31/02002* (2013.01); *H01L 31/028* (2013.01); *H01L 31/02016* (2013.01); *H01L 31/0232* (2013.01); *H01L 31/0236* (2013.01); *H01L 31/02325* (2013.01); *H01L 31/02327* (2013.01); *H01L 31/035218* (2013.01); *H01L 31/035281* (2013.01); *H01L 31/09* (2013.01); *H01L 31/103* (2013.01); *H01L 31/105* (2013.01); *H01L 31/107* (2013.01); *H01L 31/1804* (2013.01); *H01L 31/1808* (2013.01); *H04B 10/25* (2013.01); *H04B 10/40* (2013.01); *H04B 10/691* (2013.01); *H04B 10/6971* (2013.01); *H04B 10/801* (2013.01); *Y02E 10/547* (2013.01)

(58) Field of Classification Search
CPC ........... H01L 31/0232; H01L 31/02327; H01L 31/0236; H01L 31/02363; H01L 31/09; H01L 31/101; H01L 31/105
See application file for complete search history.

(56) References Cited

U.S. PATENT DOCUMENTS

| | | |
|---|---|---|
| 4,637,129 A | 1/1987 | Derkits, Jr. et al. |
| 4,716,449 A | 12/1987 | Miller |
| 4,814,847 A | 3/1989 | Tabatabaie |
| 5,244,749 A | 9/1993 | Bean et al. |
| 5,451,767 A | 9/1995 | Amano et al. |
| 5,457,327 A | 10/1995 | Taguchi |
| 5,525,828 A | 6/1996 | Bassous et al. |
| 5,625,636 A | 4/1997 | Bryan et al. |
| 5,757,057 A | 5/1998 | Dabrowski |
| 5,886,374 A | 3/1999 | Sakamoto et al. |
| 6,027,956 A | 2/2000 | Irissou |
| 6,177,289 B1 | 1/2001 | Crow et al. |
| 6,392,282 B1 | 5/2002 | Sahara et al. |
| 6,538,299 B1 | 3/2003 | Kwark et al. |
| 6,667,528 B2 | 12/2003 | Cohen et al. |
| 6,724,798 B2 | 4/2004 | Liu et al. |
| 6,845,034 B2 | 1/2005 | Bhattacharyya |
| 6,879,014 B2 | 4/2005 | Wagner et al. |
| 7,115,971 B2 | 10/2006 | Stumbo |
| 7,161,220 B2 | 1/2007 | Cohen |
| 7,251,386 B1 | 7/2007 | Dickinson et al. |
| 7,264,982 B2 | 9/2007 | Cheng et al. |
| 7,340,709 B1 | 3/2008 | Masini et al. |
| 7,397,101 B1 | 7/2008 | Masini et al. |
| 7,495,306 B2 | 2/2009 | Langguth et al. |
| 7,510,904 B2 | 3/2009 | Chu et al. |
| 7,601,597 B2 | 10/2009 | Takei |
| 7,605,406 B2 | 10/2009 | Iguchi |
| 7,674,563 B2 | 3/2010 | Suda |
| 7,772,615 B2 | 8/2010 | Ledentsov et al. |
| 7,795,064 B2 | 9/2010 | Pan et al. |
| 7,893,348 B2 | 2/2011 | Korevaar |
| 7,898,052 B2 | 3/2011 | Prantl et al. |
| 7,972,934 B2 | 7/2011 | Wilson et al. |
| 7,977,637 B1 | 7/2011 | Yap et al. |
| 8,114,695 B2 | 2/2012 | Masuoka et al. |
| 8,129,710 B2 | 3/2012 | Cho et al. |
| 8,319,241 B2 | 11/2012 | Na et al. |
| 8,357,960 B1 | 1/2013 | Dutta |
| 8,436,370 B2 | 5/2013 | Park et al. |
| 8,728,847 B2 | 5/2014 | Maruyama et al. |
| 9,045,418 B2 | 6/2015 | Jordan et al. |
| 9,360,554 B2 | 6/2016 | Retterath et al. |
| 9,453,190 B1 | 9/2016 | Byron et al. |
| 9,496,435 B2 | 11/2016 | Wang et al. |
| 9,525,084 B2 | 12/2016 | Wang et al. |
| 9,530,905 B2 | 12/2016 | Wang et al. |
| 9,793,439 B2 | 10/2017 | Lunev et al. |
| 9,818,893 B2 | 11/2017 | Wang et al. |
| 2002/0000244 A1 | 1/2002 | Zaidi |
| 2002/0097962 A1 | 7/2002 | Yoshimura et al. |
| 2003/0059820 A1 | 3/2003 | Vo-Dinh |
| 2003/0122210 A1 | 7/2003 | Cohen |
| 2004/0222357 A1 | 11/2004 | King et al. |
| 2005/0092925 A1 | 5/2005 | Zentai et al. |
| 2005/0184354 A1 | 8/2005 | Chu et al. |
| 2006/0186501 A1 | 8/2006 | Ishimura |
| 2006/0267054 A1 | 11/2006 | Martin et al. |
| 2007/0092192 A1 | 4/2007 | Achouche et al. |
| 2007/0170536 A1 | 7/2007 | Hsu et al. |
| 2007/0190434 A1 | 8/2007 | Suda |
| 2007/0215968 A1 | 9/2007 | Wilson |
| 2007/0277869 A1 | 12/2007 | Shan |
| 2008/0102582 A1 | 1/2008 | Takei |
| 2008/0047604 A1 | 2/2008 | Korevaar et al. |
| 2008/0079022 A1 | 4/2008 | Yamamoto et al. |
| 2008/0080854 A1 | 4/2008 | Tian et al. |
| 2008/0218740 A1 | 9/2008 | Williams et al. |
| 2008/0229941 A1 | 9/2008 | Heidari |
| 2008/0248608 A1 | 10/2008 | Wilson et al. |
| 2008/0265449 A1 | 10/2008 | Meinders et al. |
| 2009/0008735 A1 | 1/2009 | Ogino et al. |
| 2009/0166628 A1* | 7/2009 | Han ................. H01L 27/14632 257/53 |
| 2009/0188557 A1 | 7/2009 | Wang et al. |
| 2009/0225804 A1 | 9/2009 | Sasahata et al. |
| 2009/0230498 A1 | 9/2009 | Iwai et al. |
| 2009/0267049 A1 | 10/2009 | Cho et al. |
| 2009/0321868 A1 | 12/2009 | Nakaji |
| 2010/0029067 A1 | 2/2010 | Vijh |
| 2010/0059789 A1 | 3/2010 | Choi |
| 2010/0059822 A1 | 3/2010 | Pinguet et al. |
| 2010/0126548 A1 | 5/2010 | Jang et al. |
| 2010/0148318 A1 | 6/2010 | Wang et al. |
| 2010/0193768 A1 | 8/2010 | Habib |
| 2010/0197068 A1 | 8/2010 | Poon |
| 2010/0207223 A1 | 8/2010 | Feng et al. |
| 2010/0221866 A1 | 9/2010 | Graham |

(56) References Cited

U.S. PATENT DOCUMENTS

| | | |
|---|---|---|
| 2010/0288341 A1 | 11/2010 | Kim et al. |
| 2010/0289939 A1 | 11/2010 | Ogino et al. |
| 2010/0308428 A1 | 12/2010 | Okamoto et al. |
| 2010/0313941 A1 | 12/2010 | Huang |
| 2011/0000545 A1 | 1/2011 | Nishi et al. |
| 2011/0255046 A1 | 10/2011 | Kurokawa et al. |
| 2012/0012741 A1 | 1/2012 | Vasylyev |
| 2012/0141122 A1 | 6/2012 | Carusone et al. |
| 2012/0153260 A1 | 6/2012 | Kim et al. |
| 2012/0193676 A1 | 8/2012 | Bobde et al. |
| 2012/0279553 A1 | 11/2012 | Shigeta et al. |
| 2012/0292676 A1 | 11/2012 | Pan |
| 2013/0009265 A1 | 1/2013 | Dautet et al. |
| 2013/0084044 A1 | 4/2013 | Ertel et al. |
| 2013/0114629 A1 | 5/2013 | Firth et al. |
| 2013/0207222 A1 | 8/2013 | Qu et al. |
| 2013/0230272 A1 | 9/2013 | Raj et al. |
| 2014/0001528 A1 | 1/2014 | Pfirsch et al. |
| 2014/0167107 A1 | 6/2014 | Yoneda et al. |
| 2014/0225063 A1 | 8/2014 | Klem et al. |
| 2014/0263975 A1 | 9/2014 | Nagano et al. |
| 2015/0041965 A1 | 2/2015 | Schulze et al. |
| 2015/0054997 A1 | 2/2015 | Hynecek |
| 2015/0108327 A1 | 4/2015 | Huang et al. |
| 2015/0340538 A1 | 11/2015 | Novack et al. |
| 2016/0225631 A1 | 8/2016 | Jun et al. |
| 2016/0240718 A1 | 8/2016 | Giziewicz |
| 2016/0254407 A1 | 9/2016 | Wang et al. |
| 2017/0338367 A1 | 11/2017 | Novack et al. |
| 2018/0145098 A1 | 5/2018 | Yamashita |

FOREIGN PATENT DOCUMENTS

| | | |
|---|---|---|
| JP | 2012-502466 | 1/2012 |
| WO | WO2012034078 | 3/2012 |
| WO | WO2012149441 | 11/2012 |
| WO | WO2013180690 | 12/2013 |
| WO | WO2014190189 | 11/2014 |
| WO | WO2016081476 | 5/2016 |
| WO | WO2017112747 | 6/2017 |

OTHER PUBLICATIONS

Gao, Y. et al. "Photon-trapping microstructures enable high-speed high-efficiency silicon photodiodes" Nature, 2017, 11, 301-308.

International Search Report dated Nov. 28, 2014 in connection with PCT/US2014/39208.

International Search Report dated Dec. 23, 2011 in connection with PCT/US2011/051091.

International Search report dated Mar. 11, 2016 in connection with PCT/US2015/061120.

International Search report dated Mar. 9, 2017 in connection with PCT/US2016/67977.

Ren, R., et al., "Enhanced absorption in elliptical silicon nanowire arrays for solar energy harvesting", Optical Engineering, vol. 53(2), 027102, Feb. 2014, http://opticalengineering.spiedigitallibrary.org/article.aspx?articleid=1828860.

Dayal, G., et al, "Broadband infrared metamaterial absorber with visible transparency using ITO as ground plane", Optics Express 15104 Jun. 2014.

Donnelly, J. L., et al., "Mode-based analysis of silicon nanohole arrays for photovoltaic applications," vol. 22, No. S5, Optics Express, A1343, Aug. 25, 2014.

Gasca, L., "From O to L: The Future of Optical-Wavelength Bands," Broadband Properties, Jun. 2008, pp. 83-85. www.broadbandproperties.com.

"Finisar, "World's Largest Supplier of Optical Solutions for the Communications Industry." http://files.shareholder.com/downloads/FNSR/0x0x382377/0b3893ea-fb06-417d-ac71-84f2f9084b0d/Finisar_Investor_Presentation.pdf,)".

Silvaco., "Investigation of the SiGe Waveguide Phototides Using FDTD Method for High Speed Optical Communication," Simulation Standard, http://www.silvaco.com/tech_lib_TCAD/simulationstandard/2010/apr_may_jun/a1/a1.html).

Kolodzey, J., et al, "Optical and electronic properties of SiGeC alloys grown on Si substrates," Journal of Crystal Growth 157, 386-391, (1995).

Kraus, T.F., "Slow light in photonic crystal waveguides," Journal of Physics D: Applied Physics, 2007, vol. 40, pp. 2666-2670.

Liu, A., et al., "Quantum dot lasers for silicon photonics [Invited]," Photonics Research, vol. 3, No. 5, Oct. 2015.

"Liu, N., et al, "Infrared Perfect Absorber and Its Application as Plasmonic Sensor," Nano Lett. 10, 2342-2348, (2010)."

Kang, Y., "Monolithic Ge/Si Avalnache Photodiodes," 978-1-4244-4403, IEEE, (2009).

Liu, A.Y., et al., Quantum Dot Lasers on Silicon, aUCSB Materials Department, Santa Barbara, California, USA, bUCSB Department of Electrical and Computer Engineering, Santa Barbara, California, USA.

Logeeswaran et al. "A 14-ps full width at half maximum high-speed photoconductor fabricated with intersecting InP nanowires on an amorphous surface," Applied Physics A, vol. 91, 1-5., (2008).

Hu, L., et al. "Analysis of Optical Absorption in Silicon Nanowire Arrays for Photovoltaic Applications," Nano Lett. vol. 7, No. 11, 2007.

Meng, L., et al. "Polarization-sensitive perfect absorbers at near-infrared wavelengths," Optics Express, A111, Dec. 2012.

Molin, D. et al. "850-950nm WideBand OM4 Multimode Fiber for Next-Generation WDM Systems," OFC (2015).

Piels, et al., "40 GHz Si/Ge uni-traveling carrier waveguide phototiode", Journal of Lightwave Technology, 15908, (2014).

Fountaine, K., et al., "Near-unity broadband absorption designs for semiconducting nanowire arrays via localized radial mode excitation", vol. 22, No. Optics Express A930, May 5, 2014.

Feng, D., et al, "High-speed Ge photodetector monolithically integrated with large cross-section silicon-on-insulator waveguide," Applied Physics Letters 95, 261105 (2009).

Schaub, J.D., et al. "Resonant-Cavity-Enhanced High-Speed Si Photodiode Grown by Epitaxial Lateral Overgrowth," IIEE Photonics Technology Letters, vol. 11, No. 12, Dec. 1999.

Seyedi, M.A., et al., "Efficient Schottky-like junction GaAs nanowire photodetector with 9 GHz modulation bandwidth with large active area," Applied Physics Letters 105, 041105 (2014).

Piatek, S., "Physics and Operation of an MPPC," Tutorials, Hamanatsu Phototonics, Nov. 16, 2015; http://www.hamamatsu.com/us/en/community/optical_sensors/tutorials/physics_of_mppc/index.html?utm_source=googleplus&utm_medium=social&utm_campaign=hc-social.

Garnett, E., et al. "Light Trapping in Silicon Nanowire Solar Cells", Nano Letters 2010, 10, pp. 1082-1087.

Tanus et al.; "High-performance 1200-nm InGaAs and 1300-nm InGaAsN quantum-well lasers by metalorganic chemical vapor deposition," Selected Topics in Quantum Electronics, IEEE Journal of Selected Topics in Quantum Electronics, vol. 9, Issue: 5 (2003).

Kelzenberg, et al., Enhanced absorption and carrier collection in Si wire arrays for photovoltaic applications, Nature Materials, vol. 9, Mar. 2010, p. 239-244. http://authors.library.caltech.edu/17688/.

Lin, et al., "Optical absorption enhancement in silicon nanowire and nanohole arrays for photovoltaic applications," Proceeding of SPIE, vol. 772, 77721G-1, (2010).

Chang-Hasnain, C., et al., "High contrast gratings for integrated optoelectrionics" Advances in Optics and Photonics vol. 4, (2012), p. 379-440. http://www.eecs.berkeley.edu/Pubs/TechRpts/2014/EECS-2014-197.html.

Chu., H-J.,et al., "Wurtzite InP nanowire arrays grown by selective area MOCVD," Phys. Status Solidi vol. C 7, No. 10, (2010), p. 2494-2497.

Kang et al., "Epitaxially-grown Ge/Si avalanche photodiodes for 1.3 μm light detection," Optics Express 9365, vol. 16, No. 13, Jun. 23, 2008.

E. D. Palik, Handbook of optical constants of solids. Orlando: Academic Press, 1985.

(56) References Cited

OTHER PUBLICATIONS

M. K. Emsley, O. Dosunmu, and M. S. Unlu, "High-speed resonant-cavity-enhanced silicon photodetectors on reflecting silicon-on-insulator substrates," IEEE Photonics Technology Letters, vol. 14, pp. 519-521, Apr. 2002.
E. Ozbay, M. S. Islam, B. Onat, M. Gokkavas, O. Aytur, G. Tuttle, et al., "Fabrication of high-speed resonant cavity enhanced Schottky photodiodes," IEEE Photonics Technology Letters, vol. 9, pp. 672-674, May 1997.
T. Knodl, H. K. H. Choy, J. L. Pan, R. King, R. Jager, G. Lullo et al., "RCE photodetectors based on VCSEL structures," IEE Photonics Technology Letters, vol. 11, pp. 1289-1291, Oct. 1999.
K. Kato, "Ultrawide-band/high-frequency photodetectors," IEEE Transactions on Microwave Theory and Techniques, vol. 47, pp. 1265-1281, Jul. 1999.
M. Amani, D. H. Lien, D. Kiriya, J. Xiao, A. Azcatl, J. Noh, et al., "Near-unity photoluminescence quantum yield in MoS2," Science, vol. 350, pp. 1065-1068, Nov. 27, 2015.
T. Mueller, F. N. A. Xia, and P. Avouris, "Graphene photodetectors for high-speed optical communications," Nature Photonics, vol. 4, pp. 297-301, May 2010.
L. Chen and M. Lipson "Ultra-low capacitance and high speed germanium photodetectors on silicon," Optics Express, vol. 17, pp. 7901-7906, May 11, 2009.
P. Kuang, S. Eyderman, M. L. Hsieh, A. Post, S. John, and S. Y. Lin "Achieving an Accurate Surface Profile of a Photonic Crystal for Near-Unity Solar Absorption in a Super Thin-Film Architecture," ACS Nano, vol. 10, pp. 6116-6124, Jun. 2016.
A. Mavrokefalos, S. E. Han, S. Yerci, M. S. Branham and G. Chen "Efficient Light Trapping in Inverted Nanopyramid Thin Crystalline Silicon Membranes for Solar Cell Applications," Nano Letters, vol. 12, pp. 2792-2796, Jun. 2012.
K. X. Z. Wang, Z. F. Yu, V. Liu, A. Raman, Y. Cui, and S. H. Fan, "Light trapping in photonic crystals," Energy & Environmental Science, vol. 7, pp. 2725-2738, Aug. 2014.
E. Garnett and P. D. Yang, "Light Trapping in Silicon Nanowire Solar Cells," Nano Letters, vol. 10, pp. 1082-1087, Mar. 2010.
S. E. Han and G. Chen "Optical Absorption Enhancement in Silicon Nanohole Arrays for Solar Photovoltaics," Nano Letters, vol. 10, pp. 1012-1015, Mar. 2010.
Y. Park, E. Drouard, O. El Daif, X. Letartre, P. Viktorovotich, A. Fave et al., "Absorption enhancement using photonic crystals for silicon thin film solar cells," Optics Express, vol. 17, pp. 14312-14321, Aug. 3, 2009.
C. Yeh and F. I. Shimabukuro "The essence of dielectric waveguides". New York ; London: Springer, 2008.
Berenschot et al. "Fabrication of 3D fractal structures using nanoscale anisotropic etching of single crystalline silicon" J. Micromech. Microeng. 2013, 23,055024 (10pp).
Sato "Basic 2 Anisotropic Wet-etching of Silicon: Characterization and Modeling of Changeable Anisotropy" http://gcoe.mech.nagoya-u.ac.jp/basic/pdf/basic-02.pdf.
Sato et al. "Anisotropic etching rates of single-crystal silicon for TMAH water solution as a function of crystallographic orientation" Sensors and Actuators, 73(1999) 131-137.
Bassous "Fabrication of Novel Three Dimensinal Microstructures by the Anisotropic Etching of (100) and (110) Silicon" IEEE Transactions of Electron Devices, ED-25, 10, 1978.
Zubel "Anisotropic etching of silicon in solutions containing tensioactive compounds" Proc. of SPIE vol. 10175 101750L-1.
Hsiao et al. "Compact and passive-alignment 4-channel ×2.5-Gbps optical interconnect modules based on silicon optical benches with 45° micro-reflectors" Optics Express, Dec. 21, 2009, vol. 17, No. 26, 24250.
Rola "Anisotropic etching of silicon in KOH + Triton X-100 for 45° micromirror applications" Microsyst Technol (2017) 23:1463-1473.
Rola et al "Triton Surfactant as an Additive to KOH Silicon Etchant" Journal of Microelectromechanical Systems, vol. 22, No. 6, Dec. 2013.
Izumi et al. "C.M.O.S. Devices Fabricated on Buried SiO2 Layers Formed by Oxygen Implantation Into Silicon" Electronics Letters, Aug. 31, 1978 vol. 14 No. 1.
Hauthan et al. "Improvement in buried silicon nitride silicon-on-insulator structures by fluorine-ion implantation" J. Appl. Phys., vol. 83, No. 7, Apr. 1, 1998.
Judy "Microelectromechanical systems (MEMS): fabrication, design and applications" Smart Mater. Struct. 10 (2001) 1115-1134.
Smith et al. "Embedded Micromechanical Devices for the Monolithic Integration of MEMS with CMOS" Proc. 1995 IEDM, pp. 609-612.
Gao et al. "High Speed Surface Illuminated Si Photodiode Using Microstructured Holes for Absorption Enhancements at 900-1000 nm Wavelength" DOI: 10.1021/acsphotonics.7b00486.
Fiori et al. "Electronics based on two-dimensional materials" Published Online: Oct. 6, 2014 | DOI: 10.1038/NNANO.2014.207.
Molle et al. "Buckled two-dimensional Xene sheets" Published Online: Jan. 16, 2017 | DOI: 10.1038/NMAT4802.
Mak et al. "Photonics and optoelectronics of 2D semiconductor transition metal dichalcogenides" Published Online: Mar. 31, 2016 | DOI: 10.1038/NPHOTON.2015.282.
Takai et al. "Single-Photon Avalanche Diode with Enhanced NIR-Sensitivity for Automotive LIDAR Systems" Sensors 2016, 16, 459; doi:10.3390/s16040459.
Carey K.W., et al. "Characterization of InP/GaInAs/InP heterostructures grown by organometallic vapor phase epitaxy for high-speed pin photodiode" Journal of Crystal Growth 1986.
Chen et al. "Optimization of InGaAs/InAlAs Avalanche Photodiodes" Nanoscale Research Letters (2017) 12:33.
Miura et al. "Modeling and Fabrication of Hollow Optical Waveguide for Photonic Integrated Circuits" Jpn. J. Appl. Phys. vol. 41 (2002) pp. 4785-4789.
Germanium Electrical Properties: http://www.ioffe.ru/SVA/NSM/Semicond/Ge/electric.html.
Rylyakov et al. "A 40-Gb/s, 850-nm, VCSEL-Based Full Optical Link" 2012.
Kenneth et al. "A BiCMOS Process Utilizing Selective Epitaxy for Analog/Digital Applications", IEEE Transactions on Electron Devices. vol. 36. No. 7. Jul. 1989.
Litchinitser et al. "Antiresonant reflecting photonic crystal optical waveguides" Optics Letters 2002, vol. 27, No. 18, 1592.
Tatarczak et al. "Reach Extension and Capacity Enhancement of VCSEL-Based Transmission Over Single-Lane MMF Links" Journal of Lightwave Technology, vol. 35, No. 4, Feb. 15, 2017.
Paneva et al. "Nitrogen implanted etch-stop layers in silicon" Microelectronic Engineering 27 (1995) 509-512.
Wada et al. "Very high speed GaInAs metal-semiconductor-metal photodiode incorporating an AlInAs/GaInAs graded superlattice" Appl. Phys. Lett. 54, 16 (1989). American Institute of Physics.
Liu et al. "140-GHz metal-semiconductor-metal photodetectors on silicon-on-insulator substrate with a scaled active layer" Appl. Phys. Lett. 65, 887 (1994). American Institute of Physics.
Zang et al. "Application of dopant segregation to metal-germanium-metal photodetectors and its dark current suppression mechanism" Appl. Phys. Lett. 92, 051110 (2008). American Institute of Physics.
Ghanbarzadeh, et al. "Low Dark Current Amorphous SiliconMetal-Semiconductor-Metal Photodetector for Digital Imaging Applications" IEEE Electron Device Letters, vol. 35, No. 2, Feb. 2014. pp. 234-237.
Assefa, et al. "A 90nm CMOS Integrated Nano-Photonics Technology for 25Gbps WDM Optical Communications Applications" IEEE International Electron Devices Meeting (IEDM), postdeadline session 33.8, Dec. 10-12, 2012.
Gao et al. "High Speed Surface Illuminated Si Photodiode Using Microstructured Holes for Absorption Enhancements at 900-1000 nm Wavelength" ACS Photonics, pp. A-H, Jul. 18, 2017.
Anderson et al. "HPSM4 Technology & Relative Cost Analysis Update" IEEE P802.3bm TF, Phoenix, AZ, Jan. 21-24, 2013.
Xi et al. "Optical thin-film materials with low refractive index for broadband elimination of Fresnel reflection" Nature Photonics, vol. 1, Mar. 2007.

(56) References Cited

OTHER PUBLICATIONS

Assefa et al. "CMOS-integrated high-speed MSM germanium waveguide photodetector" Mar. 1, 2010 / vol. 18, No. 5 / Optics Express pp. 4986-4999.
Zheng et al. "Fluidic Heterogeneous Microsystems Assembly and Packaging" Journal of Microelectromechanical Systems vol. 15, No. 4, Aug. 2006, pp. 864-870.
Xue et al. "1 X 4 Ge-on-SOI PIN Photodetector Array forParallel Optical Interconnects" Journal of Lightwave Technology, vol. 27, No. 24, Dec. 15, 2009, pp. 5687-5689.
DiLello et al. "Characterization of dark current in Ge-on-Si photodiodes"Journal of Applied Physics 112, 054506 (2012).
Dong et al., "Suppression of dark current in germanium-tin on silicon p-i-n photodiode by a silicon surface passivation technique", Optical Society of America, Jul. 13, 2015 | vol. 23, No. 14 | DOI:10.1364/OE.23.018611 | Optics Express, pp. 18611-18619.
Koester et al., "Ge-on-SOI-Detector/Si-CMOS-Amplifier Receivers for High-Performance Optical-Communication Applications", Journal of Lightwave Technology, vol. 25, No. 1, Jan. 2007, pp. 46-57.
Pearson et al., "Germanium Photodetectors on Amorphous Substrates for Electronic-Photonic Integration", 2016 IEEE, pp. 20-21.
Michel et al., "High-performance Ge-on-Si photodetectors," Nature Photonics | vol. 4 | Aug. 2010, pp. 527-534.
Knoll et al., "Monolithically Integrated 25Gbit/sec Receiver for 1.55 µm in Photonic BiCMOS Technology", Optical Society of America 2014.
Xiao et al., "A 2 Gb/s optical receiver with monolithically integrated MSM photodetector in standard CMOS process", Chinese Science Bulletin, Jul. 2011, vol. 56, No. 21, pp. 2281-2285.
Nishimura et al., "A Significant Shift of Schottky Barrier Heights at Strongly Pinned Metal/Germanium Interface by Inserting an Ultra-Thin Insulating Film", The Japan Society of Applied Physics, Applied Physics Express 1 (2008), pp. 051406-1-051406-3.
Urino et al., "Demonstration of 12.5-Gbps optical interconnects integrated with lasers, optical splitters, optical modulators and photodetectors on a single silicon substrate", Optical Society of America, Dec. 10, 2012 / vol. 20, No. 26 / Optics Express B256.
Miura et al., "Differential receivers with highly-uniform MSM Germanium photodetectors capped by SiGe layer", Optical Society of America, Oct. 7, 2013 | vol. 21, No. 20 | DOI:10.1364/OE.21.023295 | Optics Express 23295.
Kang et al. "Suppression of dark current in GeOx-passivated germanium metal-semiconductor-metal photodetector by plasma post-oxidation", Optical Society of America, Jun. 29, 2015 | vol. 23, No. 13 | DOI:10.1364/OE.23.016967 | Optics Express 16967.
Dushaq et al. "Metal-germanium-metal photodetector grown on silicon using low temperature RF-PECVD", vol. 25, No. 25 | Dec. 11, 2017 | Optics Express, pp. 32110-32119.
Zang et al. "Asymmetrically contacted germanium photodiode using a metal-interlayer-semiconductor-metal structure for extremely large dark current suppression", Optical Society of America, vol. 41, No. 16 / Aug. 15, 2016 / Optics Letters, pp. 3686-3689.
Y. G. Wang, Y. X. Kang, W. J. Zhao, S. Yan, P. J. Zhai, and X. W. Tang, "Studies on surface damage induced by ion bombardment," Journal of Applied Physics, vol. 83, pp. 1341-1344, Feb. 1, 1998.
Liu Ay et al., High performance continous wave 1.3 µm quantum dot lasers on silicon, Appl. Phys. Letters, 2014, 104, 041104.
European Patent Office Supplementary Search Report issued in European Application No. 14801543 dated Dec. 6, 2016.
Joshi et al., "25 Gbps 850 nm photodiode for emerging 100 Gb ethernet applications" SPIE Proceedings vol. 8054, May 4, 2011, (May 4, 2011), Abstract http://proceedings.spiedigitallibrary.org/proceeding.aspx?articleid= 1351039.
"Dosunmu et al., "Germanium on double-SOI photodetectors for 1550 nm operation." Conference: Lasers and Electro-Optics Society, Nov. 2003, (Nov. 2003). https://www.researchgate.neVpublication/224745299".
Fan et al. "Differences in etching characteristics of TMAH and KOH on preparing inverted pyramids for silicon solar cells", Applied Surface Science, 2013, 264, 761-766.
Wu et al. "High aspect ration silicon etch: A review" J. Appl. Phys. 2010, 108, 051101.
Singh et al. "Silicon on Insulator technology review", International Journal of Engineering Sciences & Emerging Technologies, 2011, 1, 1, 1-16.
Montalenti et al. "Fully coherent growth of Ge on free-standing Si(001) nanomesas", Physical Review B 89, 014101 (2014).
Collot et al. "Dry-etch monitoring of III-V heterostructures using laser reflectometry and optical emission spectroscopy", J. Vac. Sci. Technol. B9 (5) Sep./Oct. 1991.
Ingham "Future of Short-Reach Optical Interconnects based on MMF Technologies" OFC 2017.
Sun et al. "SWDM PAM4 Transmission Over Next Generation Wide-Band Multimode Optical Fiber" Journal of Lightwave Technology, vol. 35, No. 4, Feb. 15, 2017.
Tekin "Review of packaging of Optoelectronic, Photonic and MEMS Components" IEEE Journal of Selected Topics in Quantum Electronics, vol. 17, No. 3, 2011.
Orcutt et al. "Monolithic Silicon Photonics at 25 Gb/s" OFC 2016 © OSA (2016).
Eshaghi et al., "Optical and electrical properties of indium tin oxide (ITO) nanostructured thin films deposited on polycarbonate substrates "thickness effect"", Optik 125 (2014) 1478-1481.
Uddin et al. "Highly efficient color filter array using resonant Si3N4 gratings" Optics Express May 20, 2013, vol. 21, No. 10, 12497.
Jacob et al., "Normally incident resonant grating reflection filters for efficient narrow-band spectral filtering of finite beams" J. Opt. Soc. Am. A, vol. 18, No. 9, Sep. 2001.
Zhou et al., "Surface-normal emission of a high-Q resonator using a subwavelength high-contrast grating" Optics Express, Oct. 27, 2008,vol. 16, No. 22, 17282.
Poulton et al., "MIT and DARPA Pack Lidar Sensor Onto Single Chip" http://spectrum.ieee.org/tech-talk/semiconductors/optoelectronics/mit-lidar-on-a-chip, IEEE Spectrum, 2016.
Rasshofer et al., "Influences of weather phenomena on automotive laser radar systems" Adv. Radio Sci., 9, 49-60, 2011.
Youn et al. "10-Gb/s 850-nm CMOS OEIC Receiver with a Silicon Avalanche Photodetector" IEEE Journal of Quantum Electronics, vol. 48, No. 2, Feb. 2012.
Swoboda et al., "11Gb/s Monolithically Integrated Silicon Optical Receiver for 850nm Wavelength" 006 IEEE International Solid-State Circuits Conference.
Tavernier et al. "Power Efficient 4.5Gbit/s Optical Receiver in 130nm CMOS with Integrated Photodiode" 34th European Solid-State Circuits Conference, 2008.
CMOS Manufacturing Process, EE141 UCBerkeley, http://bwrcs.eecs.berkeley.edu/Classes/icdesign/ee141_s02/Lectures/Lecture5-Manufacturing.pdf.
Williams "Ion Implantation of Semiconductors, Materials Science and Engineering" A253 (1998) 8-15.
Gibbons "Ion Implantation in Semiconductors—Part I Range Distribution Theory and Experiments" Proceedings of the IEEE, vol. 56. No. 3, 1968.
Assefa et al. "Monolithically Integrated Silicon Nanophotonics Receiver in 90nm CMOS Technology Node" OFC/NFOEC Technical Digest © 2013 OSA.
Taubenblatt "Optical Interconnects for High-Performance Computing" Journal of Lightwave Technology, vol. 30, No. 4, Feb. 15, 2012.
Chen et al. "A 1.8-V 10-Gb/s Fully Integrated CMOS Optical Receiver Analog Front-End" IEEE Journal of Solid-State Circuits, vol. 40, No. 6, Jun. 2005.
Kuchta et al., "A 55Gb/s Directly Modulated 850nm VCSEL-Based Optical Link" IEEE Photonics Conference 2012 (IPC 2012) Post Deadline Paper PD 1.5.
Lengyel et al. "Sensitivity Improvements in an 850-nm VCSEL-Based Link Using a Two-Tap Pre-Emphasis Electronic Filter" Journal of Lightwave Technology, vol. 35, No. 9, May 1, 2017.
Ghosh et al. "On Integrated CMOS-MEMS System-on-Chip" IEEE-NEWCAS Conference, 2005.
Kalogerakis et al. "A Quad 25Gb/s 270mW TIA in 0.13 µm BiCMOS with <0.15dB Crosstalk Penalty" ISSCC 2013, Session 7, Optical Transceivers and Silicon Photonics, 7.1.

(56) References Cited

OTHER PUBLICATIONS

Knochenhauer et al. "40 Gbit/s transimpedance amplifier with high linearity range in 0.13 mm SiGe BiCMOS" Electronics Letters May 12, 2011 vol. 47 No. 10.
Nishihara et al. "10.3 Gbit/s burst-mode PIN-TIA module with high sensitivity, wide dynamic range and quick response" Electronics Letters Jan. 31, 2008 vol. 44 No. 3.
Racanelli et al. "SiGe BiCMOS Technology for Communication Products" IEEE 2003 Custom Integrated Circuits Conference.
General Properties of Silicon, http://www.pveducation.org/pvcdrom/materials/general-properties-of-silicon.
Wegrzecka et al. "Design and properties of silicon avalanche photodiodes" Opto-Electronics Review 12(1), 95-104 (2004).
Xie et al. "Post-CMOS Processing for High-Aspect-Ratio Integrated Silicon Microstructures" Journal of Microelectromechanical Systems, vol. 11, No. 2, Apr. 2002.
Huang et al. "A 10-Gb/s OEIC with Meshed Spatially-Modulated PhotoDetectorin 0.18-umCMOSTechnology" IEEE Journal of Solid-State Circuits, vol. 46, No. 5, May 2011.
Tavernier et al. "High-Speed Optical Receivers With Integrated Photodiode in 130 nm CMOS" IEEE Journal of Solid-State Circuits, vol. 44, No. 10, Oct. 2009.
Kao et al. "A 5-Gbit/s CMOS Optical Receiver With Integrated Spatially Modulated Light Detector and Equalization" IEEE Transactions on Circuits and Systems—I: Regular Papers.
Hartman et al. "A Monolithic Silicon Photodetector/Amplifier IC for Fiber and Integrated Optics Application" Journal of Lightwave Technology, vol. LT-3, No. 4, Aug. 1985.
Radovanovic et al. "A 3-Gb/s Optical Detector in Standard CMOS for 850-nm Optical Communication" IEEE Journal of Solid-State Circuits, vol. 40, No. 8, Aug. 2005.
Csutak et al. "High-Speed Monolithically Integrated Silicon Photoreceivers Fabricated in 130-nm CMOS Technology" Journal of Lightwave Technology, vol. 20, No. 9, Sep. 2002.
Yin et al. "Integrated ARROW waveguides with hollow cores" Optics Express, Jun. 14, 2004, vol. 12, No. 12, 2710.
Michel et al. "High-performance Ge-on-Si photodetectors" Nature Photonics, Jul. 30, 2010, DOI: 10.1038/NPHOTON.2010.157.
Analog Devices, Inc. data sheet ADN3010-11 11.3 Gbps Optical Receiver.
Yashiki et al. "5 mW/Gbps hybrid-integrated Si-photonics-based optical I/O cores and their 25-Gbps/ch error-free operation with over 300-m MMF" OFC 2015 © OSA 2015.
Pyo et al., "3D Printed Nanophotonic Waveguides" Adv. Optical Mater. 2016, 4, 1190-1195.
Zang et al., "Silicon single-photon avalanche diodes with nanostructured light trapping" Nature Communications | 8: 628 (Sep. 20, 2017).
Liu et al. "Tensile strained Ge photodetectors on Si platform for C and L band telecommunications", Appl. Phys. Lett. 87 (2005). American Institute of Physics. pp. 011110-1-011110-3.
Chen et al. "Ultra-low capacitance and high speed germanium photodetectors on silicon", Optical Society of America, May 11, 2009 / vol. 17, No. 10 / Optics Express pp. 7901-7906.
Houng et al., "Characterization of the Nanoporous Template Using Anodic Alumina Method", Journal of Nanomaterials, vol. 2014, Article 10 130716, pp. 1-7.
Ackert, "10 Gbps silicon waveguide-integrated infrared avalanche photodiode." Optics 3 Express, Aug. 12, 2013, (Aug. 12, 2013), Abstract, pp. 19535 https:/lwww.osapublishing.org/DirectPDFAccess/5DB4DFDB-E034-29D4-E6AEE5BDEF4D8089 2601821 Je-21-17 -19530 .pdf?da= 1 &id=260 182&seg=0&mobile=no.
Jul. 16, 2018 European Search Report issued by the European Patent Office in connection with European Patent Application No. 15861593.0.
Jan. 8, 2019 official action issued by the Japanese Patent Office in connection with Japanese Patent Application No. 2016-515097.
Jan. 15, 2019 International Search Report of the International Searching Authority in connection with PCT/US2018/057963.
Feb. 12, 2019 International Search Report of the International Searching Authority in connection with PCT/US2018/043289.

Yokogawa, s., et al. IR sensitivity enhancement of CMOS Image Sensor with diffractive light trapping pixels, Scientific Reports/ 7:3832/DOI:10.1038/s41598-017-04200-y, Jun. 19, 2017.
U.S. Appl. No. 14/947,718, filed Nov. 20, 2015, published as publication No. US 2016/0254407 A1 on Sep. 1, 2016.
U.S. Appl. No. 14/892,821, filed Nov. 20, 2015, published as publication No. US 2016/0126381 A1 on May 5, 2016, now U.S. Pat. No. 9,496,435 issued Nov. 15, 2016.
U.S. Appl. No. 14/943,898, filed Nov. 17, 2015, published as publication No. US 2016/0307939 A1 on Oct. 20, 2016, now U.S. Pat. No. 9,530,905 issued Dec. 27, 2016.
U.S. Appl. No. 14/945,003, filed Nov. 18, 2015, published as publication No. US 2016/0308075 A1 on Oct. 20, 2016, now U.S. Pat. No. 9,525,084 issued Dec. 20, 2016.
U.S. Appl. No. 15/309,922, filed Nov. 9, 2016, published as publication No. US 2017/0194522 A1 US on Jul. 6, 2017, now U.S. Pat. No. 9,818,893 issued Nov. 14, 2017.
U.S. Appl. No. 15/797,821, filed Oct. 30, 2017, published as publication No. US 2018/0102442 A1 on Apr. 12, 2018.
U.S. Appl. No. 13/821,963, filed Oct. 22, 2013, published as publication No. US 2014/0034120 A1 on Feb. 6, 2014, now U.S. Pat. No. 9,559,231 issued Jan. 31, 2017.
International Application No. PCT/US14/39208 filed May 22, 2014.
International Application No. PCT/US15/61120 filed Nov. 17, 2015.
International Application No. PCT/US16/67977 filed Dec. 21, 2016.
International Applicaiton No. PCT/US11/51091 filed Sep. 9, 2011.
Hideyuki Nasu et al, 1.3-Tb/s VCSEL-Based On-Board Parallel-Optical Transceiver Module for High-Density Optical Interconnects, Journal of Lightwave Technology, vol. 31, No. XX Jan. 2018.
Molly Piels et al., 40 GHz Si/Ge uni-traveling carrier waveguide photodiode, Journal of Lightwave Technology, 2013, pp. 1-7.
Cristiano Niclass et al., A 0.18-m CMOS SoC for a 100-m-Range 10-Frame/s 200 96-Pixel Time-of-Flight Depth Sensor, IEEE Journal of Solid-State Circuits, vol. 49, No. 1, Jan. 2014, pp. 315-330.
Cristiano Niclass et al., A 0.18 μm CMOS Single-Photon Sensor for Coaxial Laser Rangefinders, IEEE Asian Solid-State Circuits Conference Nov. 8-10, 2010 / Beijing, China.
Cristiano Niclass et al., A 100-m Range 10-Frame/s 340 96-Pixel Time-of-Flight Depth Sensor in 0.18-m CMOS, IEEE Journal of Solid-State Circuits, vol. 48, No. 2, Feb. 2013, pp. 559-572.
Sanggwon Lee et al., A Back-Illuminated Time-of-Flight Image Sensor with SOI-Based Fully Depleted Detector Technology for LiDAR Application, Nov. 22, 2018, Proceedings 2018, 2, 798; doi:10.3390/proceedings2130798, pp. 1-4.
Z. Chen, R. Fan, X. Li, Z. Dong, Z. Zhou, G. Ye, D. Chen, Accuracy improvement of imaging lidar based on time-correlated single-photon counting using three laser beams, Optics Communications (2018), https://doi.org/10.1016/j.optcom.2018.08.017.
Ulrich Hofmann, MEMS mirror for low cost laser scanners, <URL: http://www. minfaros.eu>.
Frederic Laforce, Low noise optical receiver using Si APD, Proc. SPIE vol. 7212, 721210 (Feb. 6, 2009).
Hamamatsu Photonics K.K., Solid State Division, Technical Information SD-28 Characteristics and Use of Si APD (Avalanche Photodiode), May 2004.
Federica Villa et al., CMOS Imager With 1024 SPADs and TDCs for Single-Photon Timing, IEEE Journal of Selected Topics in Quantum Electronics, vol. 20, No. 6, Nov./Dec. 2014.
Chao Zhang et al., A CMOS SPAD Imager with Collision Detection and 128 Dynamically Reallocating TDCs for Single-Photon Counting and 3D Time-of-Flight Imaging, Sensors 2018, 18, 4016; doi:10.3390/s18114016.
Cristiano Niclass et al., Design and characterization of a 256x64-pixel single-photon imager in CMOS for a MEMSbased laser scanning time-of-flight sensor, May 2012 / vol. 20, No. 11 / Optics Express 11863-11881.
I. Wêgrzecka et al,, Design and properties of silicon avalanche photodiodes, Opto-Electronics Review 12 (1), 95-104 (2004).
Hallman et al., Detection jitter of pulsed time-of-flight lidar with dual pulse triggering, Review of Scientific Instruments 85, 036105 (2014); doi: 10.1063/1.4868590.
Takashi Baba et al., Development of an InGaAs SPAD 2D array for flash LIDAR, Quantum Sensing and Nano Electronics and Photon-

(56) References Cited

OTHER PUBLICATIONS ics XV, edited by Manijeh Razeghi, Gail J. Brown, Jay S. Lewis, Giuseppe Leo, Proc. of SPIE vol. 10540, 105400L © 2018 SPIE.
M. Saiful Islam et al., Distributed Balanced Photodetectors for Broad-Band Noise Suppression, IEEE Transactions on Microwave Theory and Techniques, vol. 47, No. 7, Jul. 1999.
Jean Benoit Heroux et al., Energy-Efficient 1060-nm Optical Link Operating up to 28 Gb/s, Journal of Lightwave Technology, vol. 33, No. 4, Feb. 15, 2015, pp. 733-740.
Se-Chul Park et al., A First Implementation of an Automated Reel-to-Reel Fluidic Self-Assembly Machine, https://doi.org/10.1002/adma.201401573, Jun. 27, 2014.
Jaehoon Chung et al., Fluidic Heterogeneous Microsystems Assembly and Packaging, Journal of Microelectromechanical Systems—Sep. 2006, p. 864-870.
Huei Pei Kuo et al., Free-space optical links for board-to-board interconnects, Appl Phys A (2009) 95: 955-965, DOI 10.1007/s00339-009-5144-z, Mar. 5, 2009.
Ghada Dushaq et al., Metal-germanium-metal photodetector grown on silicon using low temperature RF-PECVD, vol. 25, No. 25 | Dec. 11, 2017 | Optics Express 32110-32119.
D. Renker, Geiger-mode avalanche photodiodes, history, properties and problems, Nuclear Instruments and Methods in Physics Research A 567 (2006) 48-56.
Steven J. Koester et al., Ge-on-SOI-Detector/Si-CMOS-Amplifier Receivers for High-Performance Optical-Communication Applications, Journal of Lightwave Technology, vol. 25, No. 1, Jan. 2007.
Wissem Sfar Zaoui, Origin of the Gain-Bandwidth-Product Enhancement in Separate-Absorption-Charge-Multiplication Ge/Si Avalanche Photodiodes, 2009 OSA/OFC/NFOEC 2009.
Fuad E. Doany, High Density Optical Interconnects for High Performance Computing, OFC 2014 © OSA 2014.
Sungeun Jo et al., High resolution three-dimensional flash LIDAR system using a polarization modulating Pockels cell and a micropolarizer CCD camera, vol. 24, No. 26 | Dec. 26, 2016 | Optics Express A1580-A1585.
High-Speed Germanium-on-SOI Lateral PIN Photodiodes, IEEE Photonics Technology Letters, vol. 16, No. 11, Nov. 2004, pp. 2547-2549.
Joris Van Kerrebrouck et al., High-Speed PAM4-Based Optical SDM Interconnects With Directly Modulated Long-Wavelength VCSEL, DOI 10.1109/JLT.2018.2875538, Journal of Lightwave Technology 2018.
Y. Wang et al., InP-based Balanced Photodiodes Heterogeneously Integrated on SOI Nano-Waveguides, 978-1-5090-1602-0/16/$31.00 © 2016 IEEE, pp. 237-240.
Yokogawa et al., IR sensitivity enhancement of CMOS Image Sensor with diffractive light trapping pixels, Scientific Reports | 7: 3832 | DOI:10.1038/s41598-017-04200-y, Jun. 19, 2017.
E. Simpanen et al., Long-Reach 1060 nm SM VCSEL—SMF Optical Interconnects, Optical Fiber Technology, vol. 44, p. 36-42. Aug. 2018.
Jean Benoit Héroux et al., Low power CMOS-driven 1060 nm multimode optical link, OFC 2014 © OSA 2014.
Yimin Kang et al., Monolithic germanium/silicon avalanche photodiodes with 340 GHz gain—bandwidth product, nature photonics, Published Online: Dec. 7, 2008 | DOI: 10.1038/NPHOTON.2008.247, pp. 59-63.
D. Knoll et al., Monolithically Integrated 25Gbit/sec Receiver for 1.55 μm in Photonic BiCMOS Technology, 978-1-55752-993-0/14/$31.00 © 2014 Optical Society of America.
Claudio Piemonte et al., Overview on the main parameters and technology of modern Silicon Photomultipliers, Nuclear Inst. and Methods in Physics Research, A 926 (2019) 2-15.
Photodetectors for LiDAR, Hamamatsu, May 2017.
S. Vasile et al., Photon Detection with High Gain Avalanche Photodiode Arrays, IEEE Transactions on Nuclear Science, vol. 45, No. 3, Jun. 1998.
Jin-Sung Youn et al., A 12.5-Gb/s SiGe BiCMOS Optical Receiver with a Monolithically Integrated 850-nm Avalanche Photodetector, OFC/NFOEC Technical Digest © 2012 OSA.
Koichi Liyama, Silicon Lateral Avalanche Photodiodes Fabricated by Standard 0.18 um CMOS Process, ECOC 2009, Sep. 20-24, 2009, Vienna, Austria.
X. Li, et al., Silicon photodiodes with high photoconductive gain at room temperature, Feb. 27, 2012 / vol. 20, No. 5 / Optics Express 5518.
Seigo Ito et al., Small Imaging Depth LIDAR and DCNN-Based Localization for Automated Guided Vehicle, Sensors 2018, 18, 177; doi:10.3390/s18010177.
Maik Beer et al., SPAD-based flash LiDAR sensor with high ambient light rejection for automotive applications, Proceedings of SPIE, SPIEDigitalLibrary.org/conference-proceedings-of-spie, Event: SPIE OPTO, 2018, San Francisco, California, United States.
Fuad E. Doany, Terabit/Sec VCSEL-Based 48-Channel Optical Module Based on Holey CMOS Transceiver IC, Journal of Lightwave Technology, vol. 31, No. 4, Feb. 15, 2013.
Patrick Runge, Waveguide Integrated Balanced Photodetectors for Coherent Receivers, IEEE Journal of Selected Topics in Quantum Electronics, vol. 24, No. 2, Mar./Apr. 2018.
Shiyang Zhu et al., Waveguided Ge/Si Avalanche Photodiode With Separate Vertical SEG-Ge Absorption, Lateral Si Charge, and Multiplication Configuration, IEEE Electron Device Letters, vol. 30, No. 9, Sep. 2009.

* cited by examiner

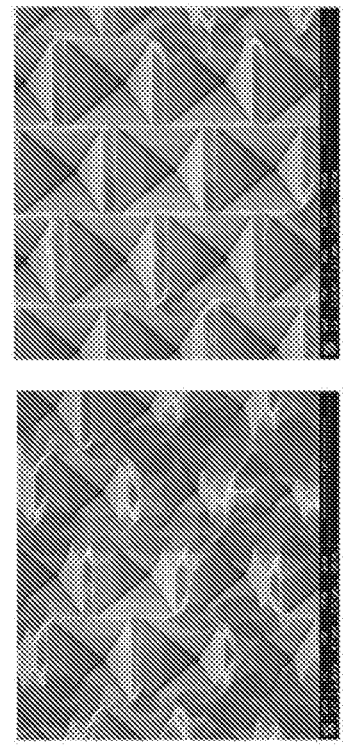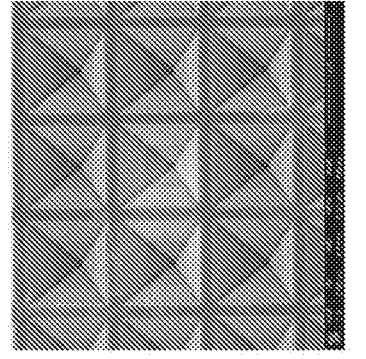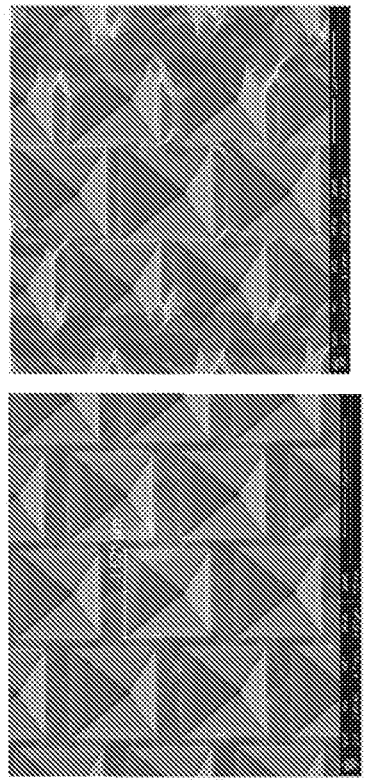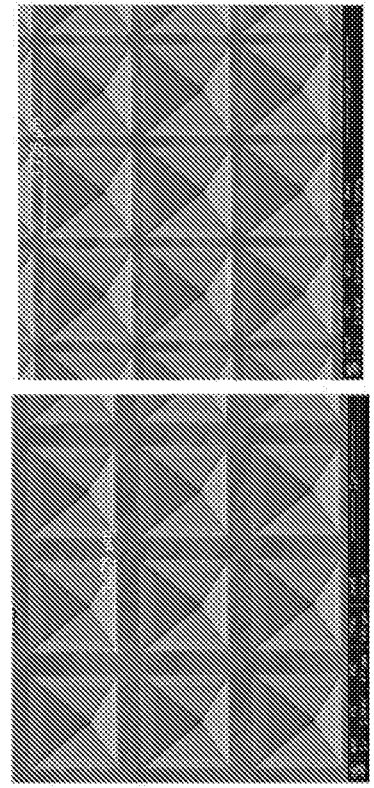

| CMOS Layer(s) |
| P Si and/or GeSi |
| I Si and/or GeSi |
| N Si and/or GeSi |
| Etch stop layer(s) |
| Si P or N substrate and/or SOI |

FIG. 9A

| d/p:700/1000nm | Responsivity (A/W) @980 nm | Responsivity (A/W) @990 nm |
|---|---|---|
| KOH-only | 0.156 | 0.138 |
| KOH+DRIE | 0.142 | 0.116 |
| 61° tapered | 0.144 | 0.130 |
| 68° tapered | 0.122 | 0.111 |
| 83° tapered | 0.112 | 0.096 |
| 90° straight | 0.092 | 0.079 |
| 2 μm Si-theory | 0.015 | 0.012 |

*FIG. 28*

| Ion Implanted P layer | CMOS Layer(s) such as P⁻ layer(s) for N wells |
|---|---|
| I Si and or GeSi 0.5-2 um < 2E15 | |
| N Si 0.1-0.2 um > 6E19 | |
| Optional N or P Si 0.1-0.2 um 1-30 ohms-cm | |
| Optional BOX 2 um or etch stop layer | |
| Si Substrate | |

FIG. 33

| CMOS/BiCMOS Layer(s) |
|---|
| I Si and or GeSi 0.5-2 um < 2E15 |
| P Si and or GeSi 0.1 um 1.8E17 |
| I Si 0.5 um < 1E16 |
| N Si 0.1-0.2 um > 6E19 |
| Optional N or P Si 0.1-0.2 um 1-30 ohms-cm |
| Optional BOX 2 um or etch stop layer |
| Si Substrate |

FIG. 35

| 6802 | 1-10 ohm-cm N-- (or P--)Ge or GeSi |
|---|---|
| 6804 | Buried N+ layer, implanted, diffused or epitaxially gorwn |
| 6806 | 1-30 ohm cm N--Si |
| | With or without BOX |
| | Si Substrate |

*FIG. 68A*

MICROSTRUCTURE ENHANCED ABSORPTION PHOTOSENSITIVE DEVICES

REFERENCE TO RELATED APPLICATIONS

This application is a continuation of U.S. patent application Ser. No. 15/797,821 filed Oct. 30, 2017 and allowed Feb. 6, 2019, which is a continuation-in-part of each of:
U.S. patent application Ser. No. 15/309,922, now U.S. Pat. No. 9,818,893, which is a § 371 national stage of International Patent Appl. No. PCT/US15/061120 filed Nov. 17, 2015;
U.S. patent application Ser. No. 14/947,718 filed Nov. 20, 2015; and
International Patent Appl. No. PCT/US16/67977 filed Dec. 21, 2016 published as WO 2017/112747.

This application incorporates by reference and claims the benefit of the filing date of each of the above-identified patent applications, as well as of the applications that they incorporate by reference, directly or indirectly, and the benefit of which they claim, including U.S. provisional applications, U.S. non-provisional applications, and International applications.

Said application Ser. No. 15/309,922 is a continuation of each of (i) U.S. patent application Ser. No. 14/943,898 (now U.S. Pat. No. 9,530,905), (ii) U.S. patent application Ser. No. 14/945,003 (now U.S. Pat. No. 9,525,084), and is a § 371 national stage of International Patent Appl. No. PCT/US15/061120, and incorporates each by reference and claims the benefit of the filing date of each as well as of each of the U.S. Provisional Patent applications the benefit of which they claim, including:
U.S. Prov. Ser. No. 62/081,538 filed Nov. 18, 2014;
U.S. Prov. Ser. No. 62/090,879 filed Dec. 11, 2014;
U.S. Prov. Ser. No. 62/100,025 filed Jan. 5, 2015;
U.S. Prov. Ser. No. 62/111,582 filed Feb. 3, 2015;
U.S. Prov. Ser. No. 62/139,511 filed Mar. 27, 2015;
U.S. Prov. Ser. No. 62/153,443 filed Apr. 27, 2015
U.S. Prov. Ser. No. 62/154,675 filed Apr. 29, 2015;
U.S. Prov. Ser. No. 62/157,876 filed May 6, 2015;
U.S. Prov. Ser. No. 62/171,915 filed Jun. 5, 2015;
U.S. Prov. Ser. No. 62/174,498 filed Jun. 11, 2015
U.S. Prov. Ser. No. 62/175,855 filed Jun. 15, 2015;
U.S. Prov. Ser. No. 62/182,602 filed Jun. 21, 2015;
U.S. Prov. Ser. No. 62/188,876 filed Jul. 6, 2015;
U.S. Prov. Ser. No. 62/197,120 filed Jul. 27, 2015;
U.S. Prov. Ser. No. 62/199,607 filed Jul. 31, 2015;
U.S. Prov. Ser. No. 62/205,717 filed Aug. 15, 2015;
U.S. Prov. Ser. No. 62/209,311 filed Aug. 24, 2015;
U.S. Prov. Ser. No. 62/213,556 filed Sep. 2, 2015; and
U.S. Prov. Ser. No. 62/232,716 filed Sep. 25, 2015.

Said application Ser. No. 14/947,718 is a continuation of International Patent Appl. No. PCT/US14/39208, published as WO 2014/190189, and incorporates each by reference and claims the benefit of the filing date thereof and of each of the U.S. Provisional Patent applications the benefit of which it claims including:
U.S. Prov. Ser. No. 61/826,446 filed May 22, 2013;
U.S. Prov. Ser. No. 61/834,873 filed Jun. 13, 2013;
U.S. Prov. Ser. No. 61/843,021 filed Jul. 4, 2013; and
U.S. Prov. Ser. No. 61/905,109 filed Nov. 15, 2013.

Said International Patent Appl. No. PCT/US16/67977 claims the benefit of the filing date of each of the following U.S. Provisional Patent applications:
U.S. Prov. Ser. No. 62/270,577 filed Dec. 21, 2015;
U.S. Prov. Ser. No. 62/290,391 filed Feb. 2, 2016;
U.S. Prov. Ser. No. 62/304,907 filed Mar. 7, 2016;
U.S. Prov. Ser. No. 62/334,934 filed May 11, 2016;
U.S. Prov. Ser. No. 62/338,263 filed May 18, 2016;
U.S. Prov. Ser. No. 62/346,850 filed Jun. 7, 2016;
U.S. Prov. Ser. No. 62/359,349 filed Jul. 7, 2016;
U.S. Prov. Ser. No. 62/366,188 filed Jul. 25, 2016;
U.S. Prov. Ser. No. 62/368,109 filed Jul. 28, 2016;
U.S. Prov. Ser. No. 62/374,828 filed Aug. 13, 2016;
U.S. Prov. Ser. No. 62/376,869 filed Aug. 18, 2016;
U.S. Prov. Ser. No. 62/380,364 filed Aug. 27, 2016;
U.S. Prov. Ser. No. 62/383,391 filed Sep. 3, 2016;
U.S. Prov. Ser. No. 62/383,479 filed Sep. 4, 2016;
U.S. Prov. Ser. No. 62/394,222 filed Sep. 14, 2016;
U.S. Prov. Ser. No. 62/398,607 filed Sep. 23, 2016;
U.S. Prov. Ser. No. 62/401,126 filed Sep. 28, 2016;
U.S. Prov. Ser. No. 62/406,999 filed Oct. 12, 2016;
U.S. Prov. Ser. No. 62/414,671 filed Oct. 29, 2016; and
U.S. Prov. Ser. No. 62/415,339 filed Oct. 31, 2016.

Said application Ser. No. 15/797,821 claims the benefit of and incorporates by reference each of the following provisional applications:
U.S. Prov. Ser. No. 62/465,734 filed Mar. 1, 2017;
U.S. Prov. Ser. No. 62/474,179 filed Mar. 21, 2017;
U.S. Prov. Ser. No. 62/484,474 filed Apr. 12, 2017;
U.S. Prov. Ser. No. 62/487,606 filed Apr. 20, 2017;
U.S. Prov. Ser. No. 62/488,998 filed Apr. 24, 2017;
U.S. Prov. Ser. No. 62/500,581 filed May 3, 2017;
U.S. Prov. Ser. No. 62/505,974 filed May 14, 2017;
U.S. Prov. Ser. No. 62/509,093 filed May 20, 2017;
U.S. Prov. Ser. No. 62/510,249 filed May 23, 2017;
U.S. Prov. Ser. No. 62/514,889 filed Jun. 4, 2017;
U.S. Prov. Ser. No. 62/521,504 filed Jun. 18, 2017;
U.S. Prov. Ser. No. 62/522,169 filed Jun. 20, 2017;
U.S. Prov. Ser. No. 62/527,962 filed Jun. 30, 2017;
U.S. Prov. Ser. No. 62/530,281 filed Jul. 9, 2017;
U.S. Prov. Ser. No. 62/533,078 filed Jul. 16, 2017;
U.S. Prov. Ser. No. 62/533,603 filed Jul. 17, 2017;
U.S. Prov. Ser. No. 62/535,801 filed Jul. 21, 2017;
U.S. Prov. Ser. No. 62/540,524 filed Aug. 2, 2017;
U.S. Prov. Ser. No. 62/542,243 filed Aug. 7, 2017;
U.S. Prov. Ser. No. 62/547,728 filed Aug. 18, 2017;
U.S. Prov. Ser. No. 62/553,844 filed Sep. 2, 2017;
U.S. Prov. Ser. No. 62/556,426 filed Sep. 10, 2017; and
U.S. Prov. Ser. No. 62/561,869 filed Sep. 22, 2017.

All of the above-referenced provisional and non-provisional patent applications are collectively referenced herein as "the commonly assigned incorporated applications."

FIELD

This patent specification relates mainly to photosensitive devices. More particularly, some embodiments relate to photosensitive devices having microstructure enhanced absorption characteristics.

BACKGROUND

Fiber-optic communication is widely used in applications such as telecommunications, communication within large data centers, and communications between data centers. Because of attenuation losses associated with using shorter optical wavelengths, most fiber-optic data communication uses optical wavelengths of 800 nm and longer. Commonly used multimode and single mode optical fiber uses wavelengths between 800 nm and 1675 nm. A main component of optical receivers used in fiber-optic communication system is the photo detector, usually in the form of a photodiode (PD) or avalanche photodiode (APD).

High-quality low-noise APDs can be made from silicon. However, while silicon will absorb light in the visible and near infrared range, it becomes more transparent at longer optical wavelengths. Silicon PDs and APDs can be made for optical wavelengths of 800 nm and longer by increasing the thickness of the absorption "I" region of the device. However, in order to obtain adequate quantum efficiency (also known as external quantum efficiency), the thickness of the silicon "I" region becomes so large that the device's maximum bandwidth (also referred to as "data rate") is too low for many current and future telecom and data center applications.

To avoid the inherent problem that silicon PDs and APDs have with longer wavelengths and higher bandwidths, other materials are used. Germanium (Ge) APDs detect infrared out to a wavelength of 2000 nm, but has relatively high multiplication noise. InGaAs APDs can detect out to longer than 1600 nm, and have less multiplication noise than Ge, but still far greater multiplication noise than silicon APDs. InGaAs is known to be used as the absorption region of a heterostructure diode, most typically involving InP as a substrate and as a multiplication layer. This material system is compatible with an absorption window of roughly 900 to 1700 nm. However, both InGaAs PD and APD devices are relatively expensive and have relatively high multiplication noise when compared with silicon and are difficult to integrate with Si electronics as a single chip.

Information published by a major company in the business of photodetectors (See http://files.shareholder.com/downloads/FNSR/0x0x382377/0b3893ea-fb06-417d-ac71-84f2f9084b0d/Finisar_Investor_Presentation.pdf) indicates at page 10 that the current market for optical communication devices is over 7 billion U.S. dollars with a compounded annual growth rate of 12%. Photodiodes (PD) used for 850-950 nm wavelength employ GaAs material and for 1550-1650 nm wavelength photodiodes are InP material based, which is both expensive and difficult to integrate with Si based electronics. Therefore, there is a large market and a long-felt need that has not been met for the development of a better device. To date there are no Si material based photodiodes nor avalanche photodiodes (APD) for 850-950 nm and no Ge on Si material based photodiodes nor avalanche photodiodes for 1550-1650 nm that are top-surface or bottom-surface illuminated, with a data rate of at least 25 Gb/s, and are monolithically integrated with CMOS/BiCMOS silicon electronics on a single chip that are commercially available to the knowledge of the inventors herein. However, there has been no lack of trying to develop a better device for this large market. For example, there have been proposals for resonant photodiodes fabricated in Si material (see *Resonant-Cavity-Enhanced High-Speed Si Photodiode Grown by Epitaxial Lateral Overgrowth*, Schaub et al., IEEE PHOTONICS TECHNOLOGY LETTERS, VOL. 11, NO. 12, December 1999), but they have not reached the known commercial market. Other forms of high speed photodiodes in a waveguide configuration have been proposed, such as in 40 *GHz Si/Ge uni-traveling carrier waveguide photodiode*, Piels et al, DOI 10.1109/JLT.2014.2310780, Journal of Lightwave Technology (incorporated herein by reference); *Monolithic germanium/silicon avalanche photodiodes with 340 GHz gain-bandwidth product*, NATURE PHOTONICS | VOL 3 | January 2009 | www.nature.com/naturephotonics (incorporated herein by reference and referred to herein as "Kang et al. 2009"); High-speed Ge photodetector monolithically integrated with large cross-section silicon-on-insulator waveguide, Feng et al., Applied Physics Letters 95, 261105 (2009), doi: 10.1063/1.3279129 (incorporated herein by reference); where light is coupled edge-wise into an optical waveguide and where the absorption length can be 100 um or longer to compensate for the weak absorption coefficient of Ge at 1550 nm. In these previously proposed waveguide photodiode structures, light propagates along the length of the waveguide and the electric field is applied across the PIN waveguide such that the direction of light propagation and the direction of the electric field are predominantly perpendicular in this waveguide configuration. Since light in Si travels approximately 1000 times faster than the saturated velocity of electrons/holes, a waveguide PD can be 200 microns long for example and the "I" in the PIN can be 2 microns, for example, and achieve a bandwidth of over 10 Gb/s. Such edge coupling of light is costly in packaging as compared to surface illumination as described in this patent specification, where dimensions of the waveguide cross section are typically a few microns as compared to tens of microns for known surface illuminated photodiodes or avalanche photodiodes. Known waveguide PD/APD are often only single mode optical systems whereas surface illuminated PD/APD described in this patent specification can be used in both single and multimode optical systems. In addition, known waveguide photodiodes are difficult to test at wafer level, whereas surface illuminated photodiodes described in this patent specification can be easily tested at wafer level. Known waveguide photodiodes/avalanche photodiodes are used mostly in specialty photonic circuits and in many cases require careful temperature control, which can be costly and inefficient in a hostile data center environment. A top or bottom illuminated Si and Ge on Si or GeSi on Si PD/APD that can be integrated with Si is not known to be commercially available at data rates of 25 Gb/s or more at wavelengths of 850-950 nm, 1250-1350 nm and 1550-1650 nm. In contrast, photodiodes on Si based material, as described in this patent specification, can be monolithically integrated with integrated electronic circuits on a single Si chip, thereby significantly reducing the cost of packaging. In addition, the microstructured PD/APD at 850 nm, 1300 nm and 1550 nm nominal wavelengths described in this patent specification can be predominantly for short haul (short reach), medium haul (reach gap) and long haul (long reach), distances less than 300 meters, in certain cases less than 2000 meters, in certain cases less than 10000 meters and in certain cases greater than 10000 meters optical data transmission. The microstructured PD/APD direction of incident optical beam and the electric field in the "I" region of a PIN or NIP structure, are predominately collinear and/or almost collinear. This patent specification enables such a device and is expected to transform the current data centers to almost all optical data transmission between blades, within a blade, between racks and/or between data centers, that will vastly increase the data transmission bandwidth capabilities and significantly reduce electrical power usage.

The subject matter claimed herein is not limited to embodiments that solve any specific disadvantages or that operate only in environments such as those described above. Rather, this background is only provided to illustrate one exemplary technology area where some embodiments described herein may be practiced.

Each published document referenced in this patent specification is hereby incorporated by reference.

SUMMARY

According to some embodiments, a single-chip device comprises an integrated combination of a microstructure-enhanced photodetector (MSPD) and an active electronic circuit, both formed on or in a single substrate and configured to receive an optical input that in cross-section is substantially continuous spatially at least some of time, convert the optical input to an electrical output, and process the electrical output into a processed output. The MSPD on or in said single substrate comprises an intermediate layer, a first layer at one side of the intermediate layer, and a second layer at an opposite side of the intermediate layer, wherein: each of the layers comprises Silicon, Germanium, or an alloy thereof; at least one of said layers, or an overlying covering layer that may be present, has holes intentionally formed therein, extending in directions transverse to the layers; each of the first and second layers comprises a doped material; the intermediate layer comprises a material that is less doped than at least one of the first and second layers or is undoped, wherein the degree of doping is the same or different for different positions in the intermediate layer; an input portion configured to concurrently receive at a plurality of said holes said optical input that has said substantially continuous cross-section; and an output portion configured to provide said electrical output from the MSPD. The active electronic circuit on or in said single substrate is configured to process the electrical output from the MSPD by applying thereto: amplification to form said processed output from the single-chip device; processing other than or in addition to amplification to form said processed output from the single-chip device; and routing to one or more selected destinations. A communication channel on or in said single-chip device is configured to deliver the electrical output from the MSPD to the active electronic circuit.

The active electronic circuit can at least partly extend beyond said substrate, or can be at least partly inside said substrate. An overlying layer can be present as a superstrate at one side of said first, intermediate, and second layers, and can contain said holes. The MSPD can comprises a III-V materials family photodiode. An air-filled volume can be formed between the substrate and the MSPD. A layer of a dielectric material that is in the propagation path of said optical input can be provided to cover the holes as well as spaces between the holes. An avalanche region can be provided at one side of the MSPD, forming therewith an avalanche microstructured photodiode (MSAPD). The holes can be present in said intermediate layer, in at least one of the first and second layers, or in each of the three layers. Each of said first and second layers and said intermediate layer has a thickness and at least some of said holes extend through the entire thickness of the intermediate layer and of one of said first layer and second layer and through at least a part of the thickness of the other one of said first and second layers.

At least some of said holes can be shaped as inverted pyramids, can have triangular sections in planes transverse to said layers, and the vertices of the pyramids of the triangular sections can be within the intermediate layer. The holes can have sidewalls that slope in planes transverse to said layers, and the holes can have plural different slopes along their inside walls. At least some of said holes on the same substrate can differ from each other in at least one of (i) distance by which the holes extend in said directions, (ii) shape of the holes, and (iii) spacing of the holes from each other. When the intermediate layer includes holes, one of the first and second layers can be in the form of a layer that conformally covers inside walls of the holes as well as spaces between the holes. The holes can be partly or entirely filled with a dielectric material.

The optical input enters the MSPD through one or both of said first and second layers, and each of the first and second layers through which the optical input enters can be no more than 500 nanometers thick.

At least one of the first layer, the second layer, and the intermediate layer comprises a material represented by $Ge_x Si_{1-x}$, where x is greater than zero.

The MSPD further comprises ohmic contacts configured for reverse-biasing the MSPD, and at least one of said ohmic contact can be through a via in said substrate.

The single-chip device can further comprise a light guide to said MSPD for directing said optical input thereto, and electrical contacts from the active electronic circuit configured to carry said processed output out of the single-chip device. The light guide can be configured to bend the optical input from an initial propagation direction to a propagation direction transverse to said layers.

The single-chip device can have one or more additional MSPD on or in the same substrate, one or more additional active electronic circuits, and respective different optical bandpass filters coupled with at least two of the MSPDs on or in said single substrate, whereby at least two of said MSPDs can be configured to respond to different wavelength ranges that are within said optical input. The additional active electronic circuits can comprise one or more transimpedance amplifiers (TIAs) and one or more application specific integrated circuits (ASICs), and any of them can comprise CMOS, BiCMOS, and/or bipolar active devices. The single-chip device can be configured into an optical communication structure or a light distance and ranging (LIDAR) structure, and can include a laser emitter formed on or in said single substrate.

The MSPD in the single-chip device can include a layer of selected material that is over a side of one of the first and second layers facing away from the intermediate layer and is configured to reduce sheet resistance. In another example, the layer of selected material can be configured to reflect light that has passed through the intermediate layer back toward the intermediate layer. In yet another example, a deliberately textured surface is formed at a side of one of said first and second layers facing away from the intermediate layer. A layer of micro-nano structures can be formed at of one of said first and second facing, at a surface thereof facing away from the intermediate layer. One or more distributed Bragg reflectors can be formed at one of said first and second layers, at a surface thereof away from the intermediate layer. An isolation trench between the MSPD and the active electronic circuit can be included in the single-chip device, and a light shield layer can be formed over said active electronic circuit.

The optical input to the MSPD in the single-chip device and the electrical output from the MSPD can each be modulated at a frequency of at least 30 Gigabits per second, and the MSPD can operate at quantum efficiency of at least 1.5 times greater than that of a photodetector that is otherwise the same but lacks said holes.

According to some embodiments, the single-chip device is hermetically sealed, for example with a dielectric such as silicon oxide or nitride and/or a polymer. This may obviate a need for additional hermetic packaging in practical applications of the single-chip device, such as in data centers.

According to some embodiments, a microstructure-enhanced photodetector (MSPD) configured to convert to an electrical output an optical input that in cross-section is essentially continuous spatially at least some of the time, comprises a substrate and a top layer, a bottom layer, and an intermediate layer between the top and bottom layers formed on or in the substrate, wherein: at least one of the layers has holes intentionally formed therein, extending in directions transverse to the layers; each of the top and bottom layers comprises a doped material; and the intermediate layer comprises a material that is undoped or is less doped than the top or bottom layer, wherein the degree of doping is the same or different for different positions in the intermediate layer. The MSPD includes an input portion configured to receive, concurrently at a plurality of said holes, said optical input that has said essentially continuous cross-section; and an output portion configured to provide said electrical output.

In some embodiments, the top layer is no more than 500 nm thick and the holes are at least in the top layer, an air-filled volume is provided between the substrate and the MSPD, a layer of a dielectric material is provided that is at a surface of said substrate, over the holes and spaces between the holes, and in the path of said optical input.

The MSPD can further include an avalanche region under the MSPD, forming therewith an avalanche microstructured photodiode (MSAPD).

The holes in the MSPD can be in the intermediate layer, in one of the top and bottom layers, or through the entire thickness of all three layers, or through the entire thickness of one of the top and bottom layers but only partly into the other.

A least some of said holes can be shaped as inverted pyramids, can have triangular sections in planes transverse to said layers, the vertices of the pyramids and triangular sections can be within the intermediate layer, the holes can have sidewalls that slope in planes transverse to said layers, and there can be plural different slopes along inside walls of the holes. At least some of said holes in the same substrate can differ from each other in at least one of (i) distance by which the holes extend in said directions, (ii) shape of the holes, and (iii) spacing of the holes from each other.

When the holes extend into the intermediate layer, one of said top and bottom layers can conformally cover inside walls of the holes as well as spaces between the holes. The holes can be partly or entirely filled with a dielectric material.

At least one of the top and bottom layers and the intermediate layer can comprise a material represented by $Ge_x Si_{1-x}$, where x is greater than zero but less than unity, or where x is zero or unity or a value between zero and unity.

The MSPD can further comprise ohmic contacts configured for reverse-biasing the MSPD, and at least one of said ohmic contact can be through a via in said substrate. The MSPD can further comprise a light guide for directing said optical input thereto. The light guide can be configured to bend the optical input from an initial propagation direction to a propagation direction transverse to at least some of said layers. The MSPD can further comprise one or more additional MSPDs formed on or in the same substrate, and respective different optical bandpass filters coupled with respective ones of the MSPDs, whereby at least two of said MSPDs are configured to respond to different wavelength ranges that are within said optical input. The plural MSPDs on or in the same substrate can be configured into an optical communication structure or a light distance and ranging (LIDAR) structure. The MSPD can further comprise a laser emitter formed on or in said single substrate.

The MSPD can include a material that is over a side of one of the top and bottom layers facing away from the intermediate layer and is configured to reduce sheet resistance, a material that is over a side of one of the top and bottom layers facing away from the intermediate layer and is configured to reflect light that has passed through the intermediate layer back toward the intermediate layer, a deliberately textured surface at a side of one of said top and bottom layers facing away from the intermediate layer, a layer of micro-nano structures formed at a side of one of said top and bottom layers facing away from the intermediate layer, and/or one or more distributed Bragg reflectors formed at a surface of one of said top and bottom layers facing away from the intermediate layer.

When one or more active electronic circuits are formed on or in the same substrate as the MSPD and coupled to said MSPD to receive said electrical output therefrom and process it into a processed output, the resulting combination forms a single-chip integrated circuit configured to receive said optical input, convert it to said electrical output, and provide said processed output.

The MSPD is configured to operate when its optical input and electrical output are each modulated at a frequency of at least 30 Gigabits per second, at a quantum efficiency of at least 1.5 times that of an otherwise the same photoconductor lacking said holes.

According to some embodiments, the MSPD is hermetically sealed, for example with a dielectric such as silicon oxide or nitride and/or a polymer. This may obviate a need for additional hermetic packaging in practical applications of MSPD, such as in data centers.

According to some embodiments, a method of making a microstructure-enhanced photodetector (MSPD) configured to convert an optical input that at least some of the time has a cross-section that is essentially continuous spatially to an electrical output, comprises: providing a substrate and forming on or in said substrate a top layer, a bottom layer, and an intermediate layer between the top and bottom layers, wherein at least one of the layers has holes intentionally formed therein, extending in directions transverse to the layers, each of the top and bottom layers comprises a doped material, the intermediate layer comprises a material that is undoped or is less doped than the top or bottom layer, wherein the degree of doping is the same or different for different positions in the intermediate layer. The method further includes forming an input portion configured to receive, concurrently at a plurality of said holes, said optical input that has said essentially continuous cross-section, and forming an output configured to provide said electrical output.

The step of forming the top layer can comprise limiting the top layer to a thickness of no more than 500 nm, and the step of forming the holes can comprise forming the holes at least in the top layer. The method can further include forming an air-filled volume between the substrate and the MSPD, a layer of a dielectric material that is at a surface of said substrate, over the holes and spaces between holes, and in the path of said optical input, and an avalanche region under the MSPD, forming therewith an avalanche microstructured photodiode (MSAPD). Forming the holes can comprise including the holes in said intermediate layer, in said intermediate layer as well as in at least one of the top and bottom layers, and/or forming the holes in each of the first, second, and intermediate layer.

The method of claim 1, in which each of said top and bottom layers and said intermediate layer has a thickness and the forming of the holes comprises extending the holes through the entire thickness of said intermediate layer and of one of said top layer and bottom layer and through at least a part of the thickness of the other one of said top and bottom layers.

The method can include forming at least some of said holes in the shape of inverted pyramids, with triangular sections in planes transverse to said layers, with vertices of the pyramids or triangular sections in the intermediate layer, and/or with plural different slopes along inside walls of the holes. The forming of holes can comprise forming at least some of said holes such that they differ from each other in at least one of (i) distance by which the holes extend in said directions, (ii) shape of the holes, and (iii) spacing of the holes from each other.

When the holes extend into the intermediate layer, the method can include forming one of the top and bottom layers to conformally cover inside walls of the holes as well as spaces between the holes. The method can include partially or entirely filling the holes with a dielectric material, and forming at least one of the top layer, the bottom layer, and the intermediate layer of a material represented by $Ge_x Si_{1-x}$, where x is greater than zero or where x is zero or unity or a value between zero and unity. The method can further comprise forming ohmic contacts configured for reverse-bias the MSPD, forming a light guide to said MSPD for directing said optical input thereto, where the light guide can bend the optical input from an initial propagation direction to a propagation direction transverse to said layers, and forming one or more additional MSPD formed on or in said substrate for receiving respective optical inputs, and forming respective different bandpass filters for said optical inputs, thereby configuring different MSPDs on said substrate to respond to different wavelength ranges that are within said optical input.

According to some embodiments, the method includes forming one or more additional MSPDs in an array on or in the same substrate, said MSPDs being configured into an optical communication structure or a light distance and ranging structure (LIDAR), forming a laser emitter on or in said substrate, forming a layer of selected material that is over a side of one of the top and bottom layers facing away from the intermediate layers and is configured to reduce sheet resistance and/or to reflect light that has passed through the intermediate layer back toward the intermediate layer, deliberately texturing a surface at a side of one of said top and bottom layers facing away from the intermediate layer, forming a layer of micro-nano structures formed at of one of said top and bottom layers, at a surface thereof facing away from the intermediate layer, and/or forming one or more distributed Bragg reflectors at one of said top and bottom layers, at a surface thereof away from the intermediate layer.

According to some embodiments, the method further includes forming, on or in the same substrate as the MSPD, one or more active electronic circuits configured to process the electrical output from the MSPD into a processed output, thereby forming a single-chip integrated circuit configured to receive said optical input, convert it to said electrical output, and provide said processed output.

According to some embodiments, the method further includes hermetically sealing the MSPD and/or the single-chip device, for example with a dielectric such as silicon oxide or nitride and/or a polymer. This may obviate a need for additional hermetic packaging in practical applications of the single-chip device and/or the MSPD, such as in data centers.

BRIEF DESCRIPTION OF THE DRAWINGS

To further clarify the above and other advantages and features of the subject matter of this patent specification, specific examples of embodiments thereof are illustrated in the appended drawings. It should be appreciated that these drawings depict only illustrative embodiments and are therefore not to be considered limiting of the scope of this patent specification or the appended claims. The subject matter hereof will be described and explained with additional specificity and detail through the use of the accompanying drawings in which:

FIGS. 1A-1H are top-view scanning electron micrographs of inverted pyramid holes used in a microstructure high speed photodiode (MSPD) and/or a high speed microstructure avalanche photodiode (MSAPD), according to some embodiments;

FIGS. 9A and 9B are schematic cross sections of a possible MSPD P-I-N structure, according to some embodiments;

FIG. 28 is a table showing experimental measurements of a MSPD with approximately 1000 nm thick I layer, 200 nm N layer and approximately 1500 nm P layer on 2000 nm BOX on silicon substrate, according to some embodiments;

FIG. 33 is a diagram showing a similar structure to FIG. 30 but with selective P layer growth, diffusion and/or ion implantation on parts of the I layer surface, according to some embodiments;

FIG. 35 is a cross section view showing an epitaxial layer structure for an MSAPD monolithically integrated with CMOS/BiCMOS ASICs, according to some embodiments;

FIG. 68A is a cross section showing a layer structure of Ge and/or GeSi on Si for monolithic integration of an MSPD with CMOS/BiCMOS ASICs, according to some embodiments;

DETAILED DESCRIPTION

Figures 2A, 2B, 2C, 2D:
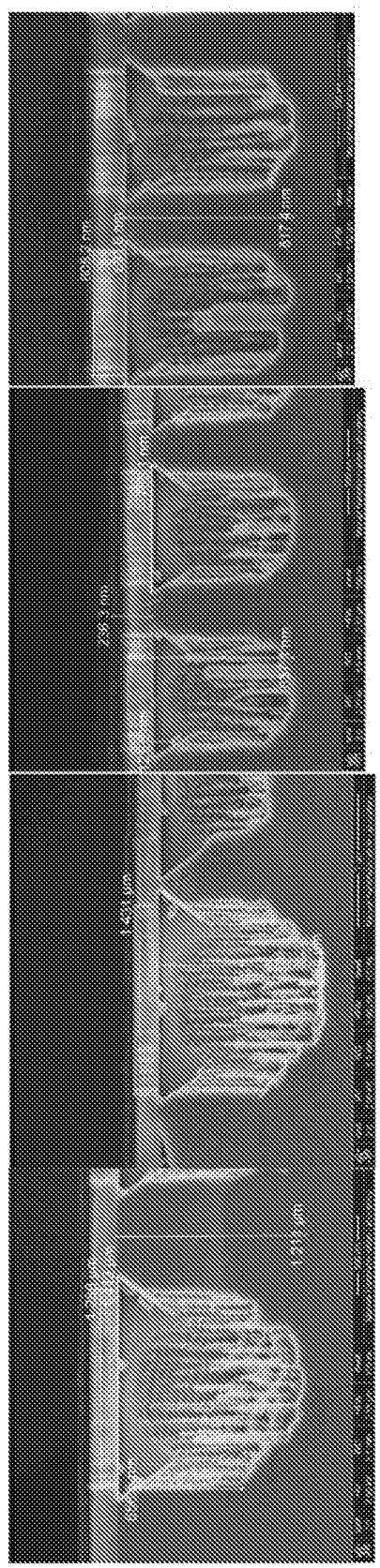
FIGS. 2A-2D are cross-section scanning electron microscope (SEM) micrographs of holes that are first wet etched using KOH and then dry etched using deep reactive ion etching (DRIE), according to some embodiments.

A detailed description of examples of preferred embodiments is provided below. While several embodiments are described, it should be understood that the new subject matter described in this patent specification is not limited to any one embodiment or combination of embodiments described herein, but instead encompasses numerous alternatives, modifications, and equivalents. In addition, while numerous specific details are set forth in the following description in order to provide a thorough understanding, some embodiments can be practiced without some or all of these details. Moreover, for the purpose of clarity, certain technical material that is known in the related art has not been described in detail in order to avoid unnecessarily obscuring the new subject matter described herein. It should be clear that individual features of one or several of the specific embodiments described herein can be used in combination with features or other described embodiments. Further, like reference numbers and designations in the various drawings indicate like elements.

Microstructures in photodiodes and microstructures avalanche photodiodes can enhance the absorption of incident signal photons and can result in a larger external quantum efficiency over a similar structure without microstructures for enhancement of the absorption over a given wavelength range. Enhancement of the absorption can also be viewed as an enhancement in the absorption length. Light can interact with absorbing layer(s) for a longer length of time, which if velocity is constant can equivalently be longer distance. The optical modes excited in a microstructured photodiode/avalanche photodiode can propagate in a direction that is the same and/or different from the incident photon direction impinging in the microstructured photodiode/avalanche photodiode (MPD/APD) which can include a predominantly lateral direction in the plane of the epitaxial layers and/or a mixture of lateral and vertical stationary and/or propagating optical modes. The optical modes can be any arithmetic combination of vertical and lateral modes which are complex coupled modes of many resonators that may be similar and/or different In addition, slow waves can be generated by the microstructures that further enhance absorption and therefore quantum efficiency (external quantum efficiency where reflection off the incident surface and transmission through the structure and any scattering can be accounted for, when quantum efficiency is mentioned it is always the external quantum efficiency) which is proportional to absorption in the case of photodiodes. Ratios of quantum efficiency to absorption can range from 1 to 0.3, for example. For a heterostructure photodiode, for example a P-I-N structure where the P and N are silicon and the I can be GeSi alloy, at longer wavelengths, for example, 950 nm or longer, the P and N will absorb less and most of the absorption will occur in the I GeSi layer. This can result in a quantum efficiency to absorption ratio closer to 1, for example 0.6-0.99. In the case of avalanche photodiode where there is gain, quantum efficiency can often be greater than 100%; for example with an absorption of 60% and a ratio of quantum efficiency to absorption ratio of 70% (in the case of unity gain) the quantum efficiency is 42% and with a gain of 2 (3 dB) the quantum efficiency can be 84% and with a gain of 4 (6 dB) the quantum efficiency can be 164%.

The microstructured photodiodes and microstructured avalanche photodiodes are predominantly surface illuminated where the optical signal impinges on either the top or bottom or both surfaces of the photodiode/avalanche photodiode. The angle of the incident photon, depending on the numerical aperture and/or angle of the fiber, can range in angles from 80 degrees off normal to normal.

The microstructure holes can be etched in a KOH solution, see Refs. Fan et al, Differences in etching characteristics of TMAH and KOH on preparing inverted pyramids for silicon solar cells, Applied Surface Science 264 (2013) 761-766; and Mavrokefalos et al, Efficient Light Trapping in Inverted Nanopyramid Thin Crystalline Silicon Membranes for Solar Cell Applications, Nano Lett. 2012, 12, 2792-2796 (both incorporated herein by reference).

In addition, holes can be etched with any combinations of wet and dry etching and also can have a multiple of wet/dry/wet/dry/wet etchings to define different hole shapes, different features such as nano glass to reduce reflections, and different wet and dry etching methods and chemicals.

FIGS. 1A-1H are top-view scanning electron micrographs of holes in the shape of inverted pyramids used in a microstructure high speed photodiode (MSPD) and/or a high speed microstructure avalanche photodiode (MSAPD), according to some embodiments. The microstructures were etched using a KOH anisotropic etch for holes ranging in diagonal from 250 nm to 700 nm and period ranging from 500 nm to 1000 nm. In some cases, the hole diameters can range from 200 nm to 2500 nm and periods can ranging from 300 nm to 3000 nm. An etch depth of 0.5-1.2 microns is shown, depending on hole diameter or diagonal. In some cases, etch depth can range from 0.2 to 10 microns for example. These microstructures resemble invented pyramids. Inverse pyramids are illustrated in Zhang et al, Silicon single-photon avalanche diodes with nano-structured light trapping, Nature Communications, 8:628, published online 20 Sep. 2017 (DOI 10:1038/s41467-017-00733-y; www.nature.com/naturecommunications). The stated publication date of this paper is later than the filing dates of all but the most recent of the provisional applications the benefit of which this patent specification claims directly. While there are significant differences between the paper and the embodiments described in this patent specification, the paper can be considered a confirmation of benefits of inverted (inverse) pyramids illuminated by a beam of light.

FIGS. 2A-2D are cross-section scanning electron microscope (SEM) micrographs of holes that are first wet etched using KOH and then dry etched using deep reactive ion etching (DRIE), according to some embodiments. See e.g., Wu et al, High aspect ratio silicon etch: A review, J. Appl. Phys. 108, 051101 ⌊ 2010 (incorporated herein by reference and referred to herein as "Wu et al"). Some nano-grass can also appear after dry etching due to any contaminants such as flakes of silicon nitride etch mask, that may be on the surface of the holes after the wet etch. The nano-grass can help reduce reflections and improve the enhancement of absorption and therefore the quantum efficiency. The nano-grass can also be removed by further wet etching. Cycles of wet and dry etching can be repeated to generate the desired hole profile for optimizing the absorption enhancements over a certain wavelength range, spanning from a few nanometers to tens of nanometers to hundred nanometers or more. In FIGS. 1A-1H and 2A-2D the material is silicon for wavelength ranges from 800 nm to 980 nm and in some cases from 840 nm to 960 nm and in some cases from 850 nm to 950 nm. According to some embodiments, the material can be germanium in silicon, $Ge_xSi_{1-x}$, where x can range from 0 to 1, and in some cases 0.01 to 0.1 and in some cases from 0.1 to 0.2 and in some cases from 0.2 to 0.4 and in some cases from 0.4 to 0.8. With the addition of Ge and if the layers are not relaxed, or with strain, the wavelength range can be extended beyond 900 nm, in some cases beyond 1000 nm, in some cases beyond 1200 nm, in some cases beyond 1400 and in some cases beyond 1550 nm. In all cases the wavelength range is above the bandgap energy of the GeSi alloy with strain which can further reduce the bandgap energy, and in some cases without strain. The quantum efficiency can range from 40% to 90% or more in at least one wavelength in these wavelength ranges, and in some cases from 50% to 80% or more and in some cases from 60% to 80% or more.

Microstructure enhancement of the absorption where the bulk absorption without micro/nano-structures can be in the range of a few hundred $cm^{-1}$ can range from 2 to 10, in some cases from 10 to 50, in some cases 50 to 100 and in some cases more than a 100 times in either Si and/or GeSi alloys PIN, PIPIN photodiode and/or avalanche photodiode structures. In some cases, a strongly absorbing layer of 8000 $cm^{-1}$ or more can be very thin, for example 1 micron or less, such that the absorption can be weak and microstructure holes can enhance the absorption. In these cases, the incident photons can be mostly collinear with the electric field in the I region. However once the optical field is trapped in the microstructures and propagates within the microstructure and its proximity, the optical mode and field can be very complex and may have some components that may be collinear with the applied electric field in the I region.

Figure 3:
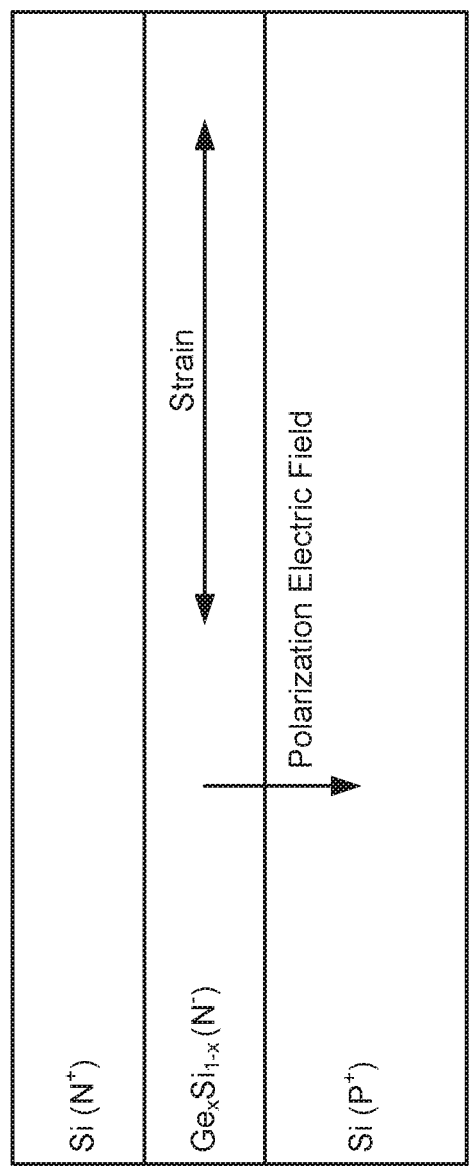
FIG. 3 is a schematic cross section of a N-I-P photodiode structure that can be grown on a silicon substrate or a SOI substrate, according to some embodiments.

FIG. 3 is a schematic cross section of a N-I-P photodiode structure that can be grown on a silicon substrate or a SOI substrate, according to some embodiments. The I layer can be intrinsic (I) not intentionally doped and/or very low background with a N type doping $N^-$. In some cases it can be very low background P type doping $P^-$. In FIG. 3, the I or $N^-$ layer is $Ge_xSi_{1-x}$ alloy with x ranging from greater than 0 to 1, for example for a few percent of x, 1-10% or more, and in some cases 4-8% and in some cases 10-20%, and in some cases 20-40% or more. Due to lattice mismatch between GeSi alloy and Si, a strain is created that can result in a electric field that can assist the transport of electron hole pairs that are generated by photoabsorption. The strain also can narrow the bandgap of the GeSi alloy. By taking advantage of the strain electric field in the same direction as a reverse bias electric field, the photogenerated carriers can be more effectively swept through the I or low doped regions to generate an electrical signal in the external circuits attached to the anode and cathode of the photodiode and/or avalanche photodiode.

Figure 4:
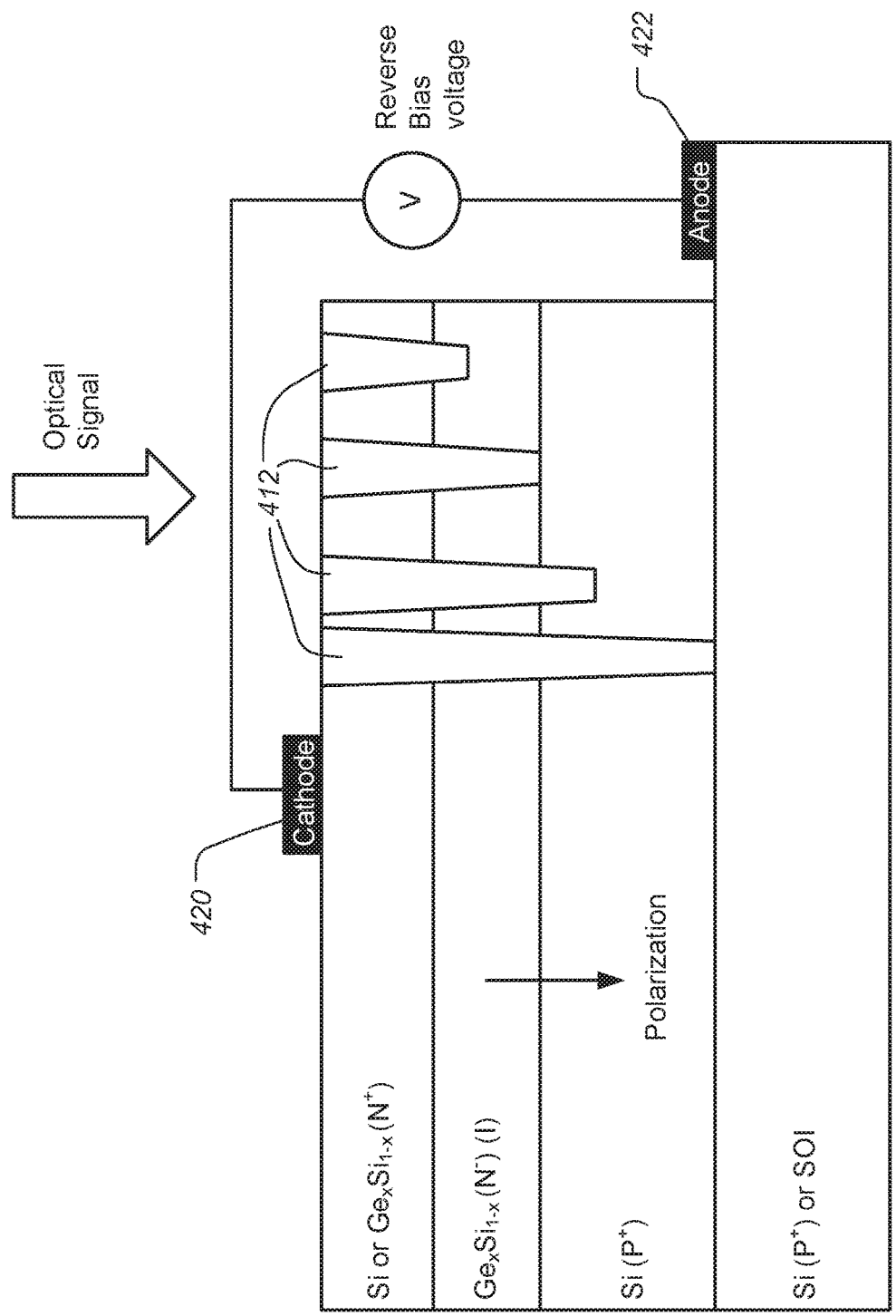
FIG. 4 is a cross sectional schematic drawing of a possible MSPD using the layers shown in FIG. 3, according to some embodiments.

FIG. 4 is a cross sectional schematic drawing of a possible MSPD using the layers shown in FIG. 3, according to some embodiments. The top $N^+$ layer can have a thickness of 0.1-0.5 microns and doping in the range of greater than $5 \times 10^{18}$ $cm^{-3}$, and in some cases greater than $2 \times 10^{19}$ $cm^{-3}$ of phosphorous and/or arsenic for example. A thin layer of transparent conducting oxide and/or metal can also be included on top of the $N^+$ layer to further reduce the sheet resistance. The $N^+$ layer can be SI and/or GeSi with thickness ranging from 0.1 to 0.5 microns and with doping greater than $2 \times 10^{19}$ $cm^{-3}$. The I intrinsic layer, or the very low doped $N^-$ (or $P^-$) layer can have a thickness ranging from 0.5-3 microns, and in some cases 1.8-2.2 microns, can have a background doping of less than $5 \times 10^{15}$ $cm^{-3}$ and in some cases less than $2 \times 10^{15}$ $cm^{-3}$. The I or $N^-$ layer can be $Ge_xSi_{1-x}$ with x between greater than 0 and less than or equal to 1. The bottom P layer can be Si and/or GeSi alloy, with thickness ranging from 0.1 to 0.5 microns with doping greater than $5 \times 10^{19}$ $cm^{-3}$ and in some cases greater than $1 \times 10^{20}$ $cm^{-3}$ with boron and/or aluminum for example. Other dopants may be used in the periodic table for P and N such as carbon, antimony, to name a few but these are less common and seldom used in CMOS processing. The N-I-P layers can be grown on a silicon substrate that can be either P or N doping, or on a SOI (silicon on insulator) substrate with a device layer of either P or N. Microstructure holes 412 are etched into the N-I-P (or P-I-N, or P-I-P-I-N for MSAPDs) structure using both wet anisotropic etch, isotropic etch and dry etching such as DRIE, ICP (inductive coupled plasma), HAR (high aspect ratio) etching as in Wu et al. A mixture of wet and dry etching can be used with a final wet etch to remove any dry etching damage to the Si, GeSi. Hole dimensions, diameter, diagonal, sides, major and minor semi-axis, can range from 200 nm to 3000 nm and in some cases 400 nm to 2000 nm and in some cases from 500 nm to 1800 nm, and spacing between the micro/nano structures can be periodic, aperiodic and/or any combination or periodic and aperiodic; the spacing can range from 0 nm (touching and/or intersecting) to 5000 nm, and in some cases 100 nm to 3000 nm and in some cases 100 nm to 2000 nm and in some cases 100 nm to 1500 nm. The spacing in the lateral directions, such as the x and y directions on a plane for example, can be different and/or the same, can be periodic and/or aperiodic and/or any combination of periodic and aperiodic. Other geometries such as hexagonal, the distance to the nearest neighbor holes can be same or different and can be periodic and/or aperiodic and/or any combination of periodic and aperiodic. Hole dimension can also be different and/or the same as adjacent holes, hole etch depth can also be different and/or the same, hole depth can range from 0.2 microns to 10 microns. As shown in FIG. 4, the holes 412 can be trapezoidal, and/or can have any number of slopes of its sidewalls and can be etched within the top N or P layer, partially into the I layer, through the I layer, partially into the bottom P or N layer, through the P or N layer to the silicon dioxide layer of a SOI wafer for example or to an etch stop layer in a bulk silicon substrate for example.

Light impinges from the top layer at an angle normal to 50 degrees off normal. The MSPD is operated at a reverse bias voltage applied between the anode and cathode, ranging from −1 to −10 volts and for a MSAPD, a reverse bias voltage is applied between the anode and cathode ranging from −4 to −45 volts. Electrical signal is extracted via the anode 420 and cathode 422 connected to a transmission line that in turn is connected to signal processing and biasing circuits which can be monolithically integrated with the MSPD/MSAPD into a single chip.

The wavelength range, depending on the percentage of Ge in Si, for 0% Ge can range from 840-960 nm, and with 10% Ge or less in GeSi alloy that is either relaxed or not relaxed, the wavelength can range from 840-990 nm for not relaxed GeSi layer and 840-960 nm for relax, for 20% or less Ge, the wavelength can be extended to 1000 nm and in some cases to 1250 nm for not relaxed GeSi layer and for 40% or less Ge, the wavelength can be extended to 1310 nm. Depending on the amount of strain, the bandgap narrowing of GeSi alloy can vary over a wider or narrower range of wavelengths. Quantum efficiency can be 40% or more at at least one or more wavelengths in the wavelength range.

With zero external bias, the MSPD with strained GeSi layer can operate in a photovoltage mode and it can be seen that the addition of strain can result in an electric field that can assist in the collection of photogenerated carriers between the N and P regions that can result in a higher quantum efficiency for the photovoltaic cell; quantum efficiency greater than 25% and in some cases greater than 28% under one sun at sea level, air mass 1 (AM1).

Figure 5:
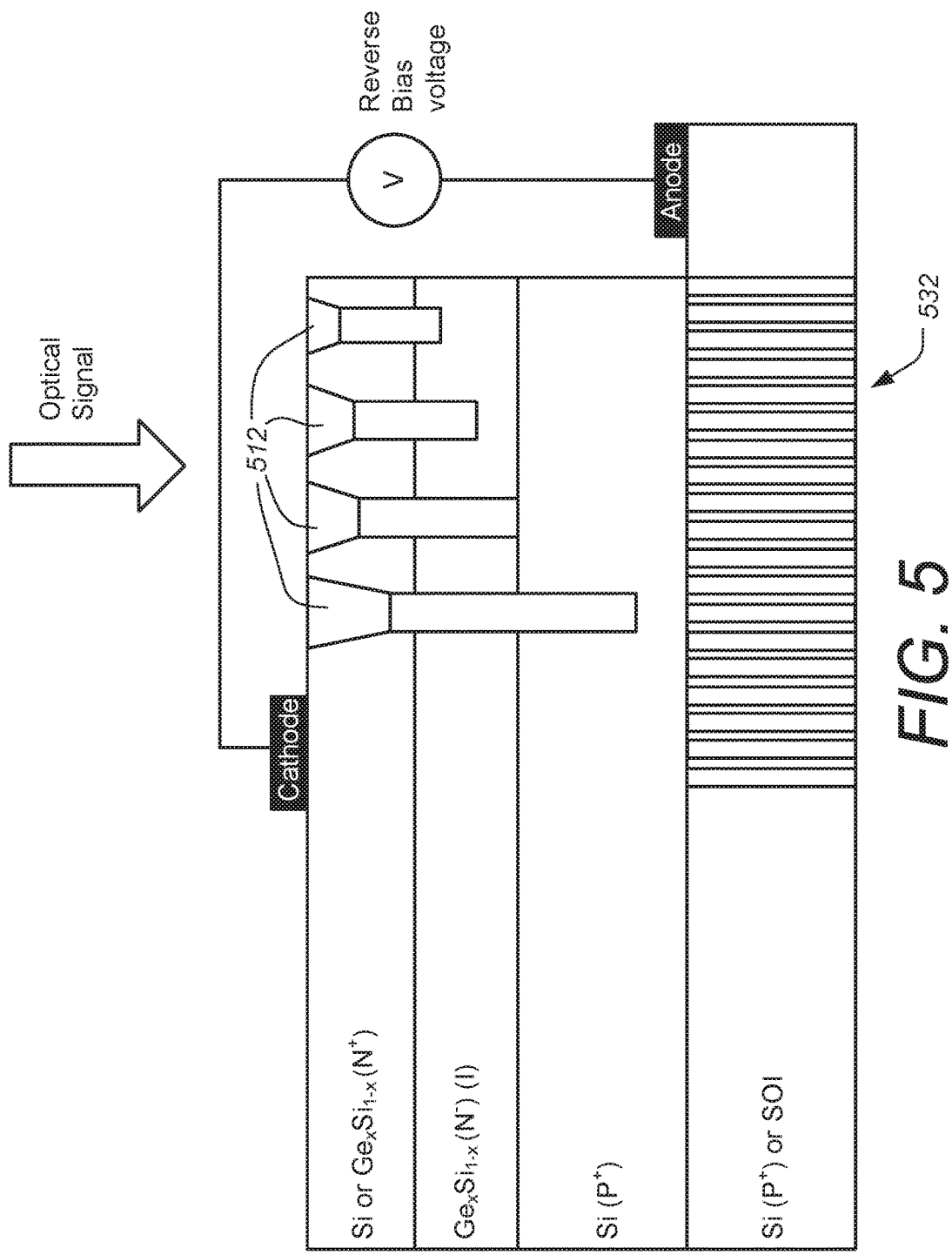
FIG. 5 is a schematic cross section of a MSPD with N-I($N^-$)-P structure on P silicon substrate or SOI substrate where the microstructure holes have an initial funnel followed by a more cylindrical hole, according to some embodiments.

FIG. 5 is a schematic cross section of a MSPD with N-I(N$^-$)-P structure on P silicon substrate or SOI substrate where the microstructure holes have an initial funnel followed by a more cylindrical hole, according to some embodiments. The shapes of holes 512 can be accomplished by a combination of wet and dry etching, see FIG. 2. The layer structures, microstructure hole dimensions, depth can be similar to those in FIG. 4, with the addition of additional micro/nano structure holes 532 that are etched from the bottom substrate that may or may not include a SOI. The substrate can be thinned from its usual 600-700 microns thickness to under 200 microns for example. These bottom holes 532 can be photonic crystal in design to provide a reflectivity of optical waves that impinge from the top surface back toward the light trapping micro/nano structures for absorption enhancements and therefore the enhancement of the quantum efficiency. Also, the bottom holes 532 can provide a lower effective refractive indices such that optical signal from the top can be reflected back toward the photon trapping structures. The bottom holes can have any shape, periodic and/or aperiodic and the etch depth can be to the bottom P layer, before the bottom P layer and/or partially into the bottom P layer. The bottom holes can have shapes of cylindrical, pyramidal, trapezoidal, polygonal, rectangular, oval, and any combination of shapes and dimensions.

Figure 6A:
FIGS. 6A-6D are diagrams illustrating forming of silicon on holes (SOH), according to some embodiments.
Figure 6B:
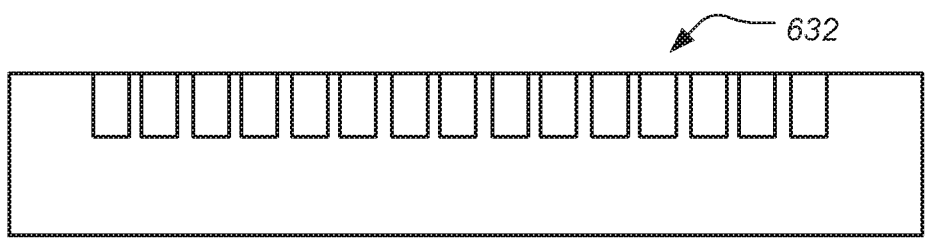
Figure 6C:
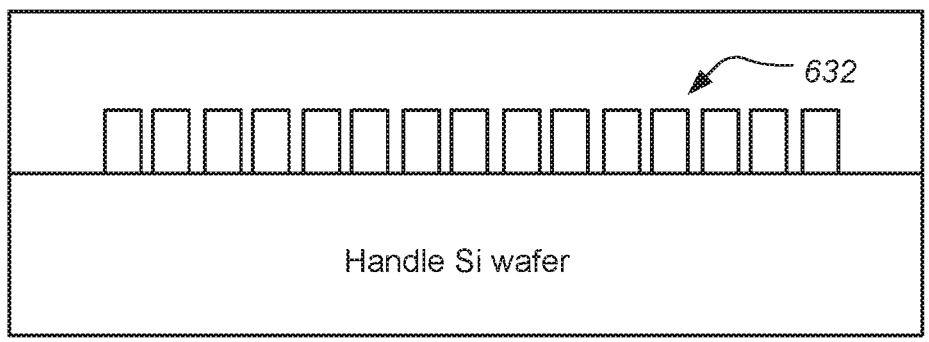
Figure 6D:
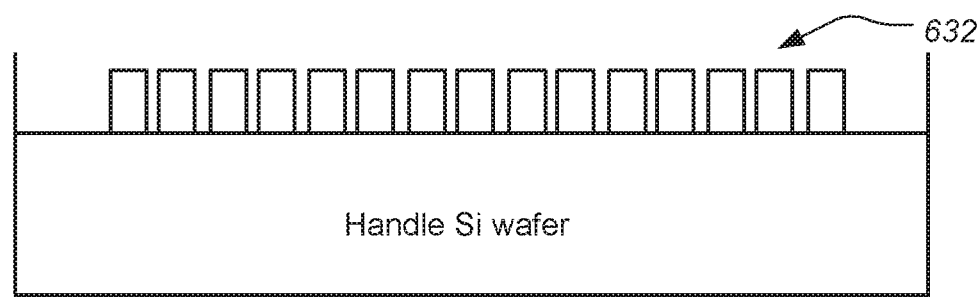

FIGS. 6A-6D are diagrams illustrating forming of silicon on holes (SOH), according to some embodiments. The SOH can be formed where the bottom holes 632 can be formed first on a different substrate (FIG. 6B) and subsequently wafer bonded to another wafer using SOI manufacturing methods (FIG. 6C). See, e.g., Singh et al, SILICON ON INSULATOR TECHNOLOGY REVIEW, International Journal of Engineering Sciences & Emerging Technologies, May 2011, Volume 1, Issue 1, pp: 1-16 ©IJESET (incorporated herein by reference and referred to herein as "Singh"), discussing holes similar to silicon dioxide can be buried and the MSPD/MSAPD/CMOS, BiCMOS layers can be grown to the buried hole device layer. The basic steps consist of etching holes in a device wafer that can include epitaxial layers that can include doped P and/or N and/or I layers, SOI, additional dielectric coatings, metallic layers/fillers, graphene, ceramic, amorphous semiconductor, transparent conducting oxides, spin on glass to name a few, and can be periodic, aperiodic, and any combination of periodic and aperiodic, different and/or same dimensions, different and/or same shaped holes, different and/or same spacings with its nearest neighbor holes. The holes 632 can be filled with gas such as He, Ar, N, Xe, H, to name a few. In addition the holes can be over the entire wafer and/or over only partial of the wafer and/or any patterns on the wafer. The holes 632 in addition to different dimensions can also have different depths. Alignment registration holes can be included such that different devices can be positioned over different hole patterns for that particular functionality. The wafer with holes or any other patterns of voids is then flipped over and wafer bonded to a handle wafer which can include etch stop layers, device layers such as PN junctions, P-I-N or N-I-P layers, and/or any other layers for device fabrication. It can also include ion implanted layers such as H, N, Ar, Xe, Ni, Al, B, As, P, Ga, In, Ge, Si, V, He, Mg, Mn, and/or other elements in the periodic table. Using techniques developed for SOI manufacturing, the device wafer is cut and chemical mechanical polished (CMP) (FIG. 6D) and is ready for growth of further device layers such as MSPD, MSAPD, CMOS and/or BiCMOS for application specific integrated circuits (ASIC), and other structures such as microwave transmission lines, microwave devices, light emitting diodes, lasers, surface emitting lasers to name a few for monolithic integration into a single silicon chip.

Figure 6E:
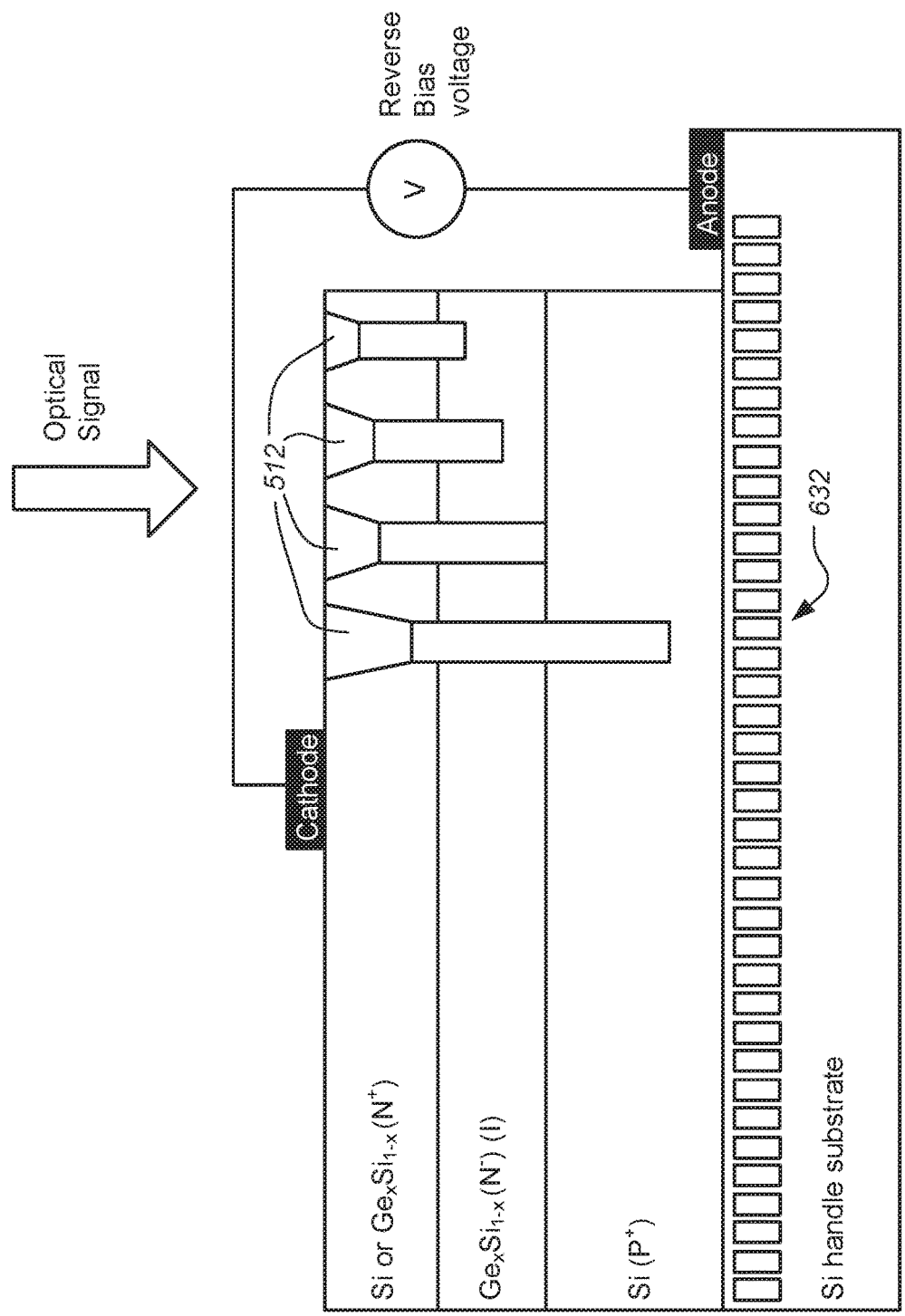
FIG. 6E is a cross sectional schematic diagram showing the device in FIG. 5 fabricated on a substrate SOH (silicon on holes), according to some embodiments.

FIG. 6E is a cross sectional schematic diagram showing the device in FIG. 5 fabricated on a substrate SOH (silicon on holes), according to some embodiments. Using similar methods as SOI manufacturing, the oxide layer is replaced by holes 632 that are etched and then bonded to a handle wafer and using SmartCut (as described in Singh) a thin device layer above the holes can be formed and with subsequent chemical mechanical polishing the surface of the device layer can be used for subsequent epitaxial layer growth to fabricate MSPD, MSAPD, CMOS, BiCMOS, lasers, surface emitting lasers, microwave transmission lines, solar cells, and any other optical, electrical, mechanical, chemical, devices, sensors for example. All the MSPD, MSAPD, monolithic integration with CMOS, BiCMOS mentioned in this application can be fabricated on a SOH wafer, in addition to SOI and bulk wafers.

Figure 7A:
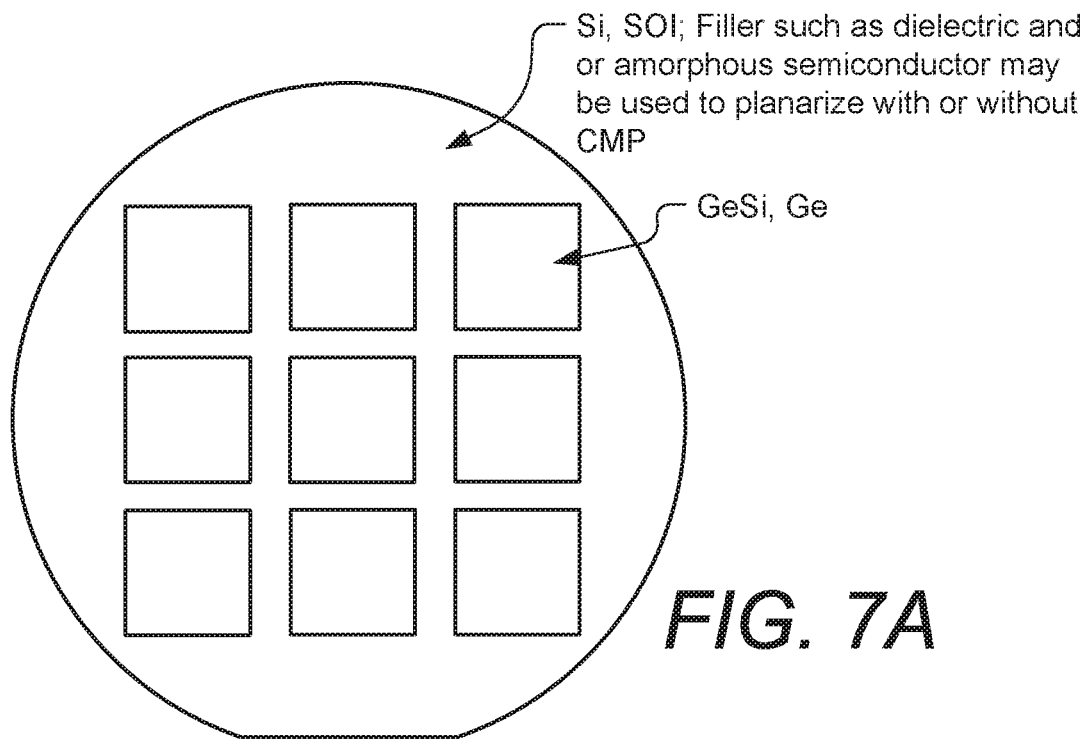
FIG. 7A is a top view of GeSi and/or Ge on silicon, according to some embodiments.

FIG. 7A is a top view of GeSi and/or Ge on silicon, according to some embodiments. The GeSi and/or Ge can have a top layer of Si and/or GeSi. Due to the lattice difference between the GeSi and/or Ge on Si, the wafer tends to bow after the growth of GeSi and/or Ge on Si layers on silicon wafer, especially for thick layers of GeSi and/or Ge of 1-3 micron range and in some cases 0.5-2 micron range in the case where the GeSi and/or Ge is not relaxed and under strain. For photodetectors, it can be desirable for the GeSi and/or Ge to be under strain as this tends to narrow the bandgap (in lasers strain tend to increase the gain), thereby extending the usable wavelength further into the infrared. However, the bowing of the wafer can be undesirable in high volume manufacturing as many machines used in manufacturing require wafers to be flat or at least with minimal bowing. To remove the overall stain and just allow local strain, a grid pattern in a Manhattan geometry, shown in FIG. 7A, can be etched or in any other pattern such that strain is only at local areas. Material can be etched to the Si layer such that only patches of GeSi and/or Ge remain on the Si, SOI or SOH substrate. In some cases not all the GeSi and/or Ge need to be removed; only sufficient material is etched so that the bowing is less. The wafer can also be planarized with the addition of dielectric, amorphous semiconductor for example and followed by chemical mechanical polishing. Once it is flat and/or almost flat, high resolution photolithography as those used in CMOS manufacturing, can be used.

In addition, the islands of GeSi/Si and/or Ge layers can be formed by selective area epitaxial growth where patterns of dielectric such as grids can be deposited on the Si and/or SOI/SOH wafers such that epitaxial Ge and/or GeSi, and/or Si are grown on bare Si surfaces and amorphous Ge and/or GeSi and/or Si can be deposited on the dielectric layer which can be silicon dioxide, silicon nitride, silicon carbide to name a few, and/or no significant deposition occur on the dielectrics.

In some cases, using selective epitaxial growth, the GeSi alloy and/or Ge can also be grown within the nano/micro structured holes to partially and/or fully fill the holes and/or mushroom over the top surface. The GeSi and/or Ge can be doped P-I-N to match the doping approximately of the layers outside the nano/micro structure holes which can be Si and/or GeSI and/or Ge and/or any combination thereof. See, Montalenti et al, Fully coherent growth of Ge on freestanding Si(001) nanomesas, PHYSICAL REVIEW B 89, 014101 (2014) (incorporated herein by reference).

Figure 7B:
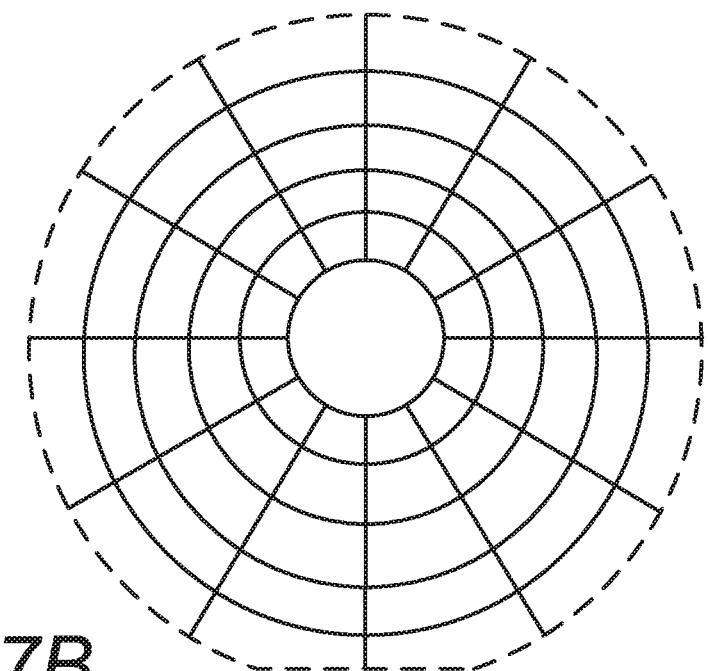
FIG. 7B is a top view of a spherical grid pattern of GeSi and/or Ge on silicon, according to some embodiments.

FIG. 7B is a top view of a spherical grid patter of GeSi and/or Ge on silicon, according to some embodiments. As in the case of FIG. 7A, the pattern relieves bowing of a GeSi and/or Ge on Si. The dark lines represent the etched part and the dotted line represent the edge of the wafer. Different grid spacing, and pie cut angles other than 30 degrees, can be used and different etch trench width can be used to optimize device density and tradeoff between grid spacing and bowing tolerance.

Figure 7C:
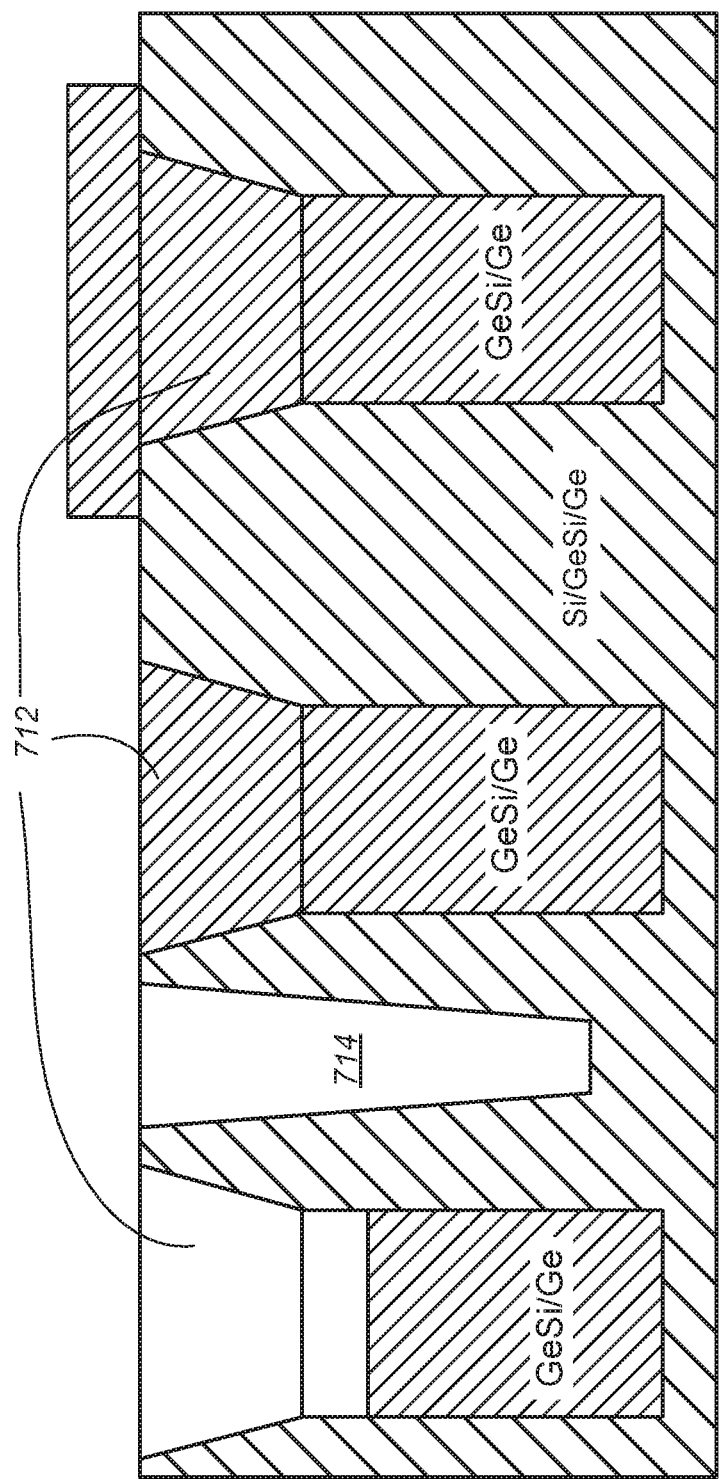
FIG. 7C shows three examples of nano/micro structure holes filled or partially filled with GeSi and/or Ge, according to some embodiments.

FIG. 7C shows three examples of nano/micro structure holes filled or partially filled with GeSi and/or Ge, according to some embodiments. The holes 712 can be partially filled, fully filled and overflowing with GeSi and/or Ge on a Si and/or SiGe and/or Ge P-I-N (or N-I-P or P-I-P-I-N) structure and any combination of Si, GeSi, Ge layers. For example, the bottom of the hole can be Si, GeSi and/or Ge, the I layer can be Si, GeSi and/or Ge and the top P layer can be Si, GeSi and/or Ge.

In some cases, the region without the nano/microstructured holes can be Si P-I-N and in some cases it can be Si/GeSi/Si P-I-N and in some cases it can be Si/GeSi or Si/GeSi or Si or Ge P-I-N (or N-I-P or P-I-P-I-N for MSAPD where P-I-P can be Si and/or GeSi and/or Ge and I-N can be Si for example). After selective area growth of GeSi and/or Ge, additional nano/micro structured holes 714 can be etched to further optimize the enhancement of absorption by photon trapping and/or slow waves for example.

Figure 8:
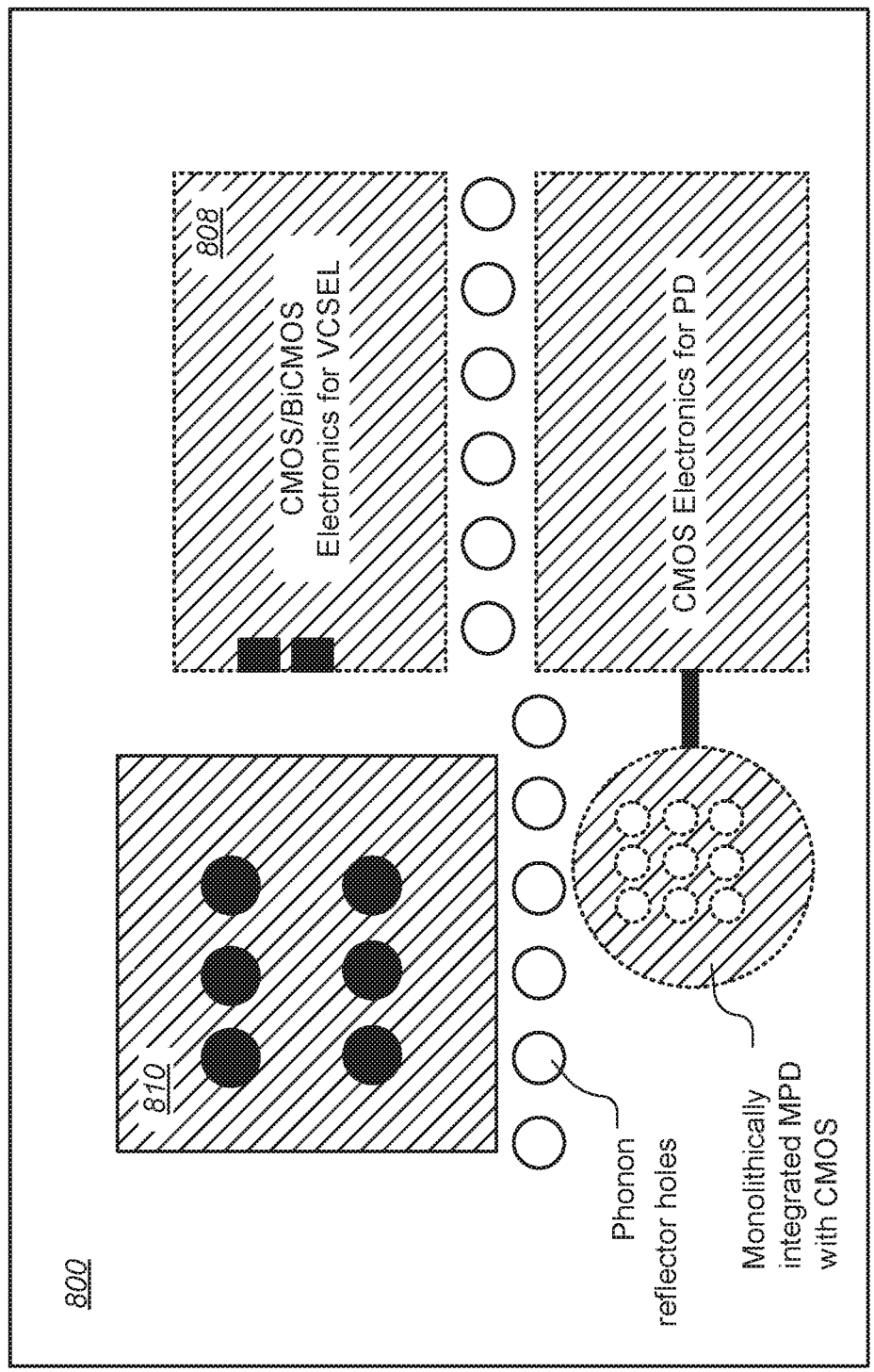
FIG. 8 is a diagram illustrating a monolithically integrated single silicon chip that can include single and/or multiple combinations of devices, according to some embodiments.

FIG. 8 is a diagram illustrating a monolithically integrated single silicon chip that can include single and/or multiple combinations of devices, according to some embodiments. Silicon chip 800 can any combination of the following devices: MSPDs; MSAPDs; vertical cavity surface emitting lasers (VCSEL) that are either wafer bonded to the chip and/or have a precision cavity for dropping the VCSEL into as in a silicon platform; CMOS/BiCMOS ASICs configured for functions such as signal processing, amplifying, transmission, storage, conditioning, analyzing, and/or configured as laser drivers and/or power amplifiers; holes for thermal removal, ventilation of the chip; thermal barriers; transmission lines; and microwave components such as inductors. The VCSEL 810, typically made of III-V material can be fluidically assembled on to the monolithic integrated chip with electronics and photodetectors. With post processing steps, electrodes can be attached to the VCSEL to connect the VCSEL(s) to the driver electronics. The VCSEL 810 is positioned in a slot or precision cavity in chip 800. A heat sink at the bottom of the precision cavity can be magnetic to attract the VCSEL and rapid thermal annealing can be used to attach the VCSEL 810. Post processing such as metallic plating can attach the microwave transmission lines from the ASIC 808 to the VCSEL 810.

Figure 9B:
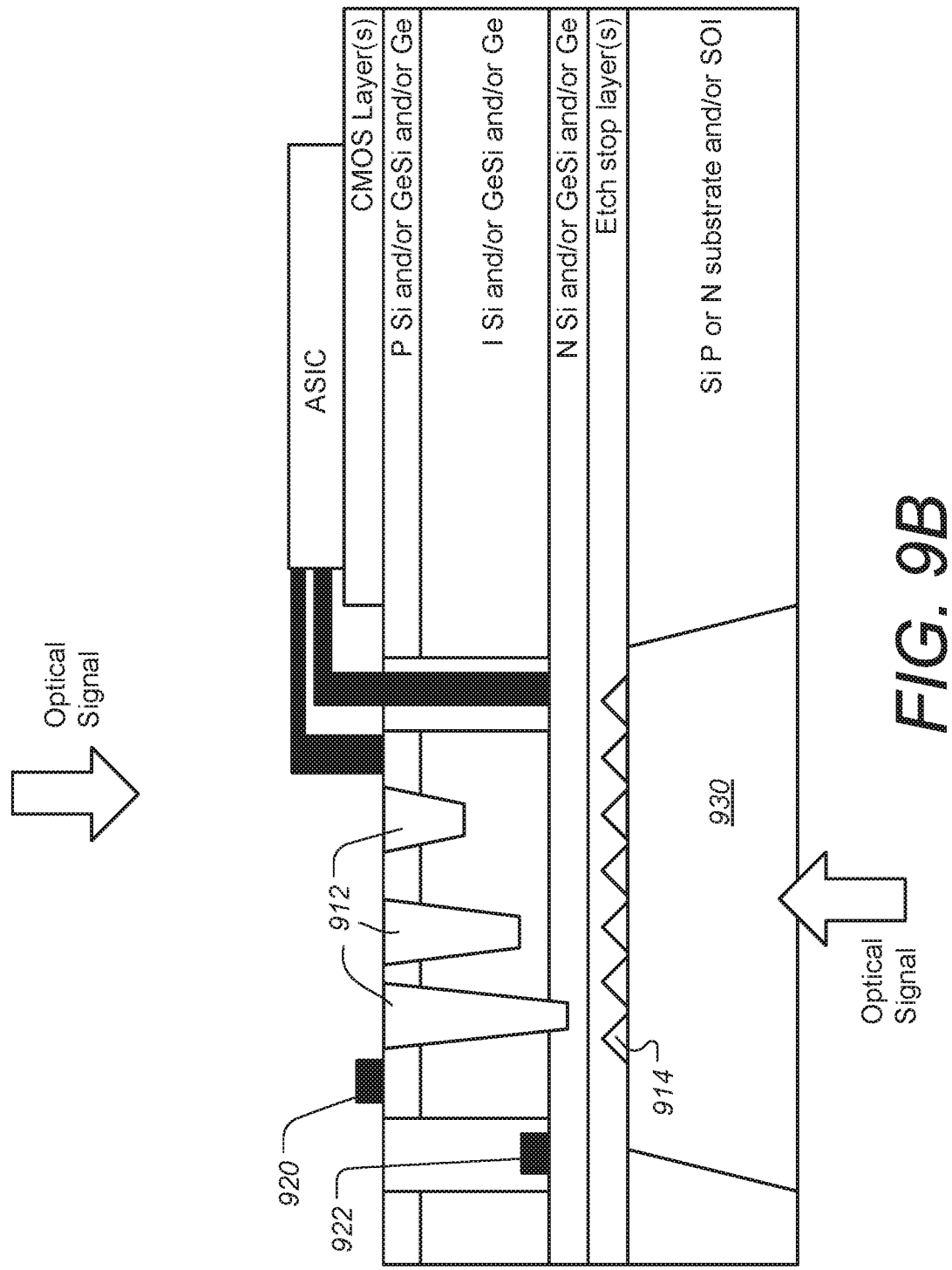

FIGS. 9A and 9B are schematic cross sections of a possible MSPD P-I-N structure, according to some embodiments. The device can also be a MSAPD P-I-P-I-N structure where the layers can be Si and/or GeSi and/or Ge compositions and any combinations of Si, GeSi and Ge. The P-I-N layers can be Si and/or GeSi and/or Ge and/or any combination thereof. CMOS and/or BiCMOS layer(s) can be grown on top of the P-I-N (or N-I-P) with or without additional layers.

The top $P^+$ layer can be SI and/or GeSi and/or Ge with a thickness ranging from 0.1 to 0.5 microns with a doping greater than $1 \times 10^{20}$ cm$^{-3}$ with boron for example. The I intrinsic layer, or the very low doped $N^-$ (or $P^-$) layer can have a thickness ranging from 0.5-3 microns, and in some cases 1.8-2.2 microns, and can have a background doping of less than $5 \times 10^{15}$ cm$^{-3}$ and in some cases less than $2 \times 10^{15}$ cm$^{-3}$. The I or $N^-$ layer can be $Ge_xSi_{1-x}$ with x between 0 (and including 0) and less than or equal to 1. The bottom N layer can be Si and/or GeSi alloy and/or Ge, with thickness ranging from 0.1 to 0.5 microns with doping greater than $2 \times 10^{19}$ cm$^{-3}$ with arsenic and/or phosphor for example. Other dopants may be used in the periodic table for P and N such as carbon, antimony, to name a few but these are less common and seldom used in CMOS processing. The P-I-N layers can be grown on a silicon substrate that can be either P or N doping, or on a SOI (silicon on insulator) substrate with a device layer of either P or N and/or on a SOH wafer with device layers of either N or P.

Microstructure holes 912 are etched into the P-I-N (or N-I-P, or P-I-P-I-N for MSAPD) structure using both wet anisotropic, isotropic etch and dry etching such as DRIE, ICP (inductive coupled plasma), HAR (high aspect ratio) etching as in Wu et al. A mixture of wet and dry etching can be used with a final wet etch to remove any dry etching damage to the Si, GeSi, Ge. Hole dimensions, diameter, diagonal, sides, major and minor semi-axis, can range from 200 nm to 3000 nm and in some cases 400 nm to 2000 nm and in some cases from 500 nm to 1800 nm, and spacing between the micro/nano structures can be periodic, aperiodic and/or any combination or periodic and aperiodic; the spacing can range from 0 nm (touching and/or intersecting) to 5000 nm, and in some cases 100 nm to 3000 nm and in some cases 100 nm to 2000 nm and in some cases 100 nm to 1500 nm. The spacing in the lateral directions, such as the x and y directions on a plane for example, can be different and/or the same, can be periodic and/or aperiodic and/or any combination of periodic and aperiodic. Other geometries such as hexagonal, the distance to the nearest neighbor holes can be same or different and can be periodic and/or aperiodic and/or any combination of periodic and aperiodic. Hole dimension can also be different and/or the same as adjacent holes, hole etch depth can also be different and/or the same, hole depth can range from 0.2 microns to 10 microns. As shown in FIG. 9B, the holes 912 can be trapezoidal, and/or can have any number of slopes of its sidewalls and can be etched within the top P layer, partially into the I layer, through the I layer, partially into the bottom N layer, through the N layer to the silicon dioxide layer of a SOI wafer for example or to an etch stop layer in a bulk silicon substrate or SOI or SOH for example. Ohmic contacts 920 can be added as shown, for reverse biasing.

The wavelength range, depending on the percentage of Ge in Si, for 0% can range from 840-960 nm and in some cases 840 nm to 990 nm, and with 10% Ge or less in GeSi alloy that is either relaxed or not relaxed, the wavelength can range from 840-990 nm and in some cases 840 nm to 1000 nm for not relaxed GeSi layer and 840-960 nm for relax, for 20% or less Ge, the wavelength can be extended to 1000 nm and in some cases to 1250 nm for not relaxed GeSi layer and for 40% or less Ge, the wavelength can be extended to 1310 nm and in some cases to 1400 nm. Depending on the amount of strain, the bandgap narrowing of GeSi alloy can vary over a wider or narrower range of wavelengths. Quantum efficiency can be 40% or more at at least one or more wavelengths in the wavelength range.

Etch stop layer(s) can be included, for example heavily doped P layer with boron, or carbon and Ge can sometimes be added to compensate for the strain, or a thin layer of GeSi alloy, silicon dioxide buried layer, and/or nitrogen implant. See e.g., Paneva et al, Nitrogen implanted etch-stop layers in silicon, Microelectronic Engineering 27 (1995) 509-512 (incorporated herein by reference). The etch stop layer can be grown on bulk silicon substrate, SOH or SOI wafers. In the case of bulk Si wafer, a via 930 can be etched to remove most or all of the substrate to the etch stop layer which can in addition be patterned with nano-micro structures 914 and/or can be coated with dielectric distributed Bragg reflectors. By removing most and/or all of the substrate beneath the MSPD/MSAPD, provides a semiconductor-air interface and allow optical signal to reflect and/or to be confined mostly in the I region allowing more efficient lateral propagation and improving photon trapping. The lateral propagation of the optical signal within the MSPD/MSAPD can be Bloch modes, slow waves, transverse modes, total internal reflection waves, that can increase the interaction distance and duration of the optical signal with the I layer which contribute the bulk of the photogenerated carriers that are swept out toward the anode and cathode under an externally applied bias voltage which then result in an electrical signal in the external circuits that are connected to the anode and cathode (930).

As shown in FIG. 9B, the MSPD/MSAPD can be monolithically integrated with silicon electronics such as CMOS and/or BiCMOS ASIC that provide signal processing, amplification, storage, analysis, transmission. Arrays of MSPD/MSAPD can be monolithically integrated with CMOS/BiCMOS electronics. Such arrays greatly simplify the assembly and packaging of multichannel optical receivers.

The optical signal can impinge from either the top or bottom surfaces and can be normal and/or off normal by as much as 45 degrees or more. The fiber input angle can range from 0 (normal) to 50 degrees and/or the MSPD/MSAPD can be tilted by 0 (no tilt) to 50 degrees from the vertical axis. The launching of the optical signal off normal can improve the trapping of the optical signal with the MSPD/MSAPD thereby improving the external quantum efficiency (QE) and also reducing the reflection back into the optical fiber which can affect the performance of the optical system.

Figure 10:
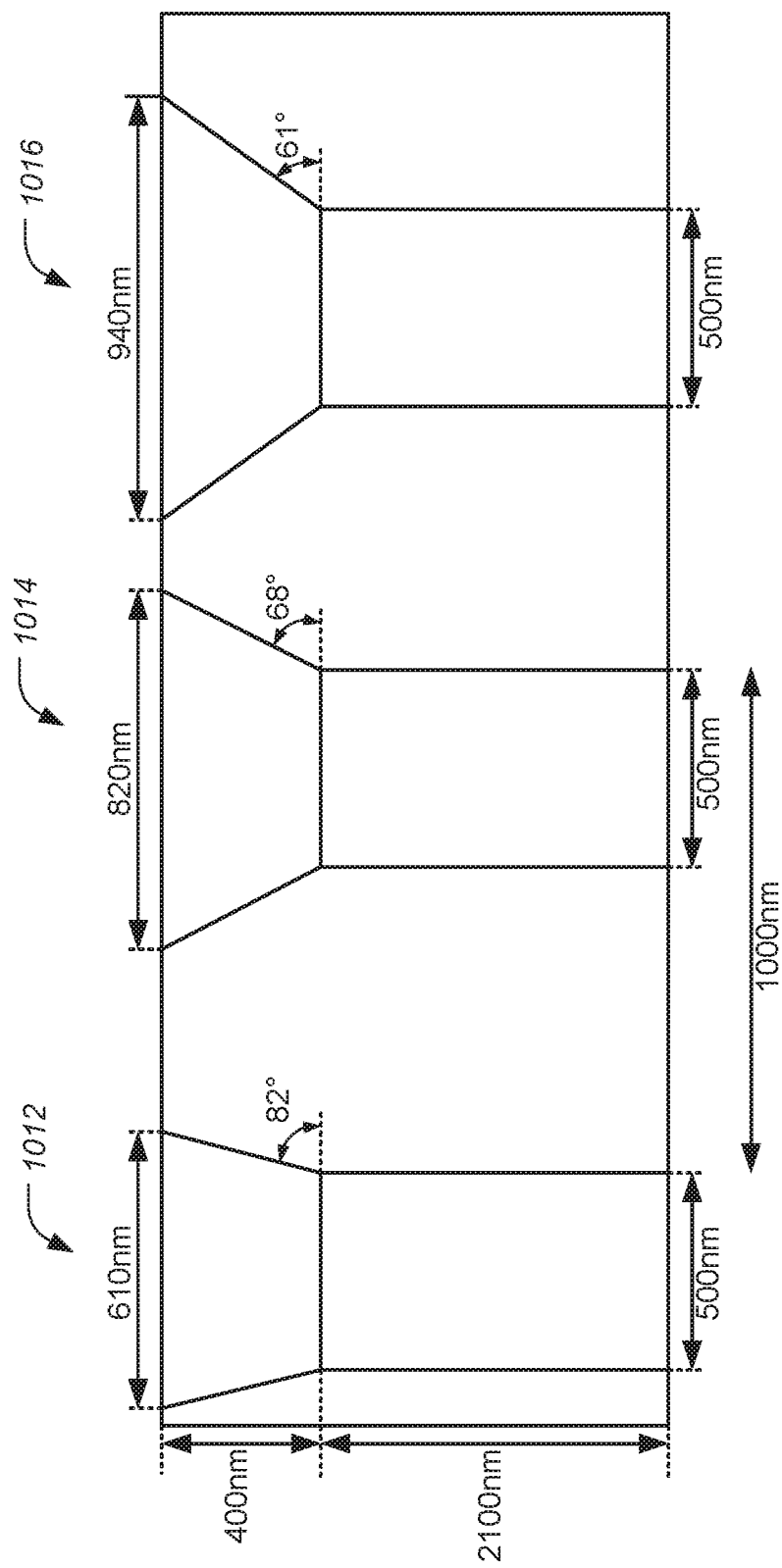
FIG. 10 is a cross section view of three funnel shaped holes, according to some embodiments.
Figure 11:
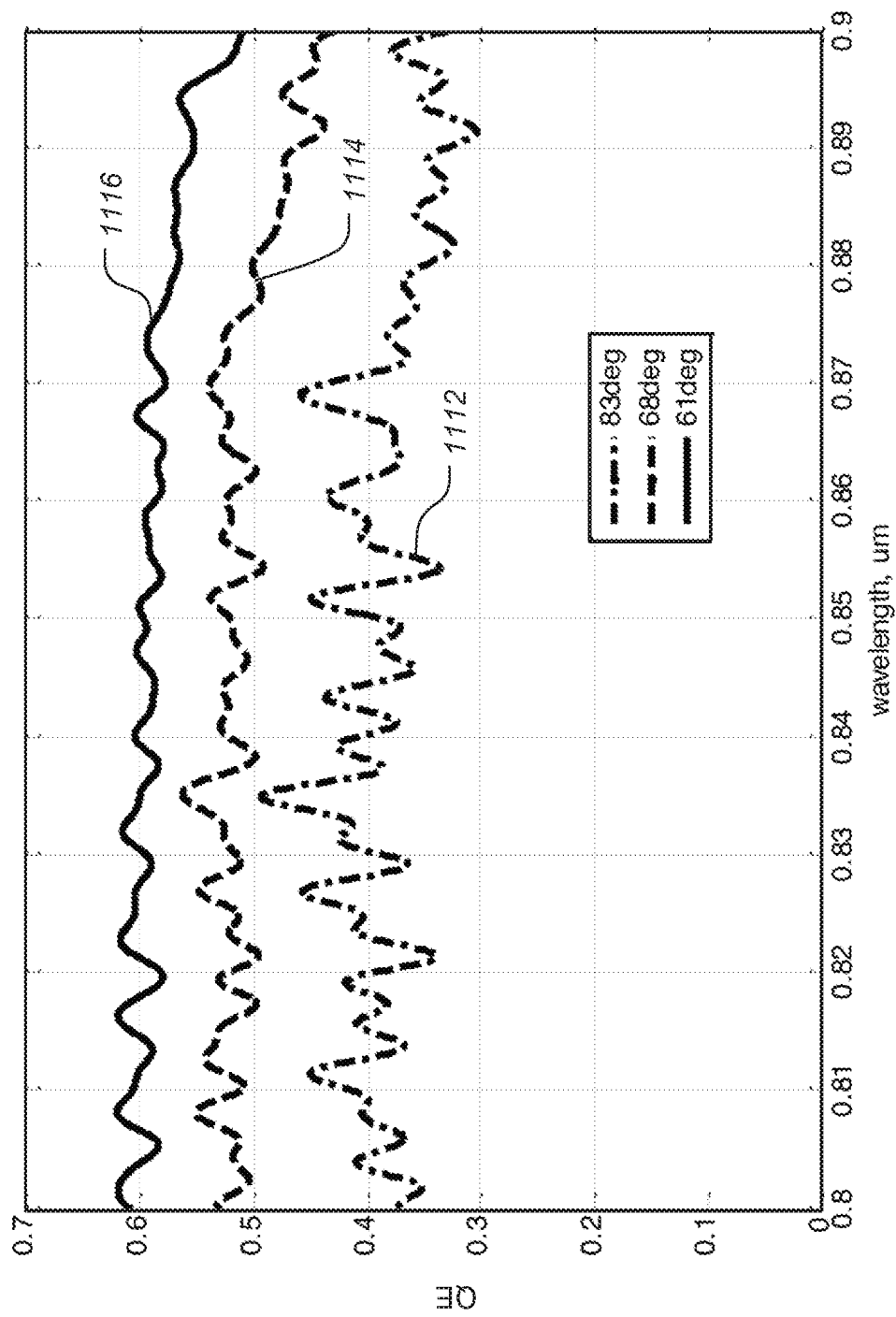
FIG. 11 is a plot showing a FDTD (Finite Difference Time Domain) simulation for the optical field in a structure as shown in FIG. 10.

FIG. 10 is a cross section view of three funnel shaped holes, according to some embodiments. Within the about the first 400 nm from the surface the holes have a funnel with different sidewall angles of 61 degrees (hole 1016), 68 degrees (hole 1014) and 82 degrees (hole 1012), all measured from the horizontal plane. Each of the holes have a cylindrical portion of approximately 2100 nm with a diameter of 500 nm. The diameters of the top funnel holes are 940 nm at 61 degree slope (hole 1016), 820 nm at 68 degree slope (hole 1014) and 610 nm at 82 degree slope (hole 1012). The period of the holes is 1000 nm in a hexagonal lattice. All the material in this example is silicon. The bottom layer of the holes is silicon dioxide of 2000 nm thick on Si substrate. The diameters, slopes, and three-dimensional shapes can be same for all holes that are in or on the same substrate or can differ between holes in or on the same substrate, for this and other embodiments described in this patent specification. FIG. 11 is a plot showing a FDTD (Finite Difference Time Domain) simulation for the optical field in a structure as shown in FIG. 10. The funnel holes are in a hexagonal lattice with a period of 1000 nm with a certain sidewall angle. The structure is a P-I-N on SOI with 400 nm P layer, 1200 nm I layer and 1100 nm N layer on 2000 nm silicon dioxide on silicon for example (this was the non optimal structure after epitaxial growth where the dopant diffused as used in an experimental testing). The plot shows the QE due to enhanced absorption in the I layer verses incident optical photon wavelength from 800 nm to 900 nm. The solid curve 1116 is for a funnel with a slope of 61 degrees, the dash curve 1114 is for a slope of 68 degrees and the dash dot curve 1112 is for a slope of 83 degrees. As can be seen from the simulation, the shallow slope funnel of 61 degrees gave the highest QE of approximately 60% from 800-900 nm with a slight droop toward the 900 nm wavelength. For this simulation, the material was all silicon, however the general trend holds for other material such as GeSi and Ge homojunctions, single heterojunctions and/or double heterojunctions and for other wavelength ranges such as 840 nm to 960 nm, 840 nm to 1000 nm, 900 nm to 1250 nm, 1250 nm to 1350 nm, 1350 nm to 1450 nm, 1450 nm to 1550 nm, 1550 nm to 1650 nm, and any wavelength between the ranges mentioned. QE can be 40% or greater at least for wavelengths in the ranges and/or between the ranges.

Experimental results of QE (external quantum efficiency) of 50-60% were observed at 800-850 nm wavelength with this structure.

It can be seen that nano/micro structured holes with a wide funnel can be more efficient at absorbing and trapping photons that a similar hole with a higher sloped funnel and/or no funnel.

Figure 12A:
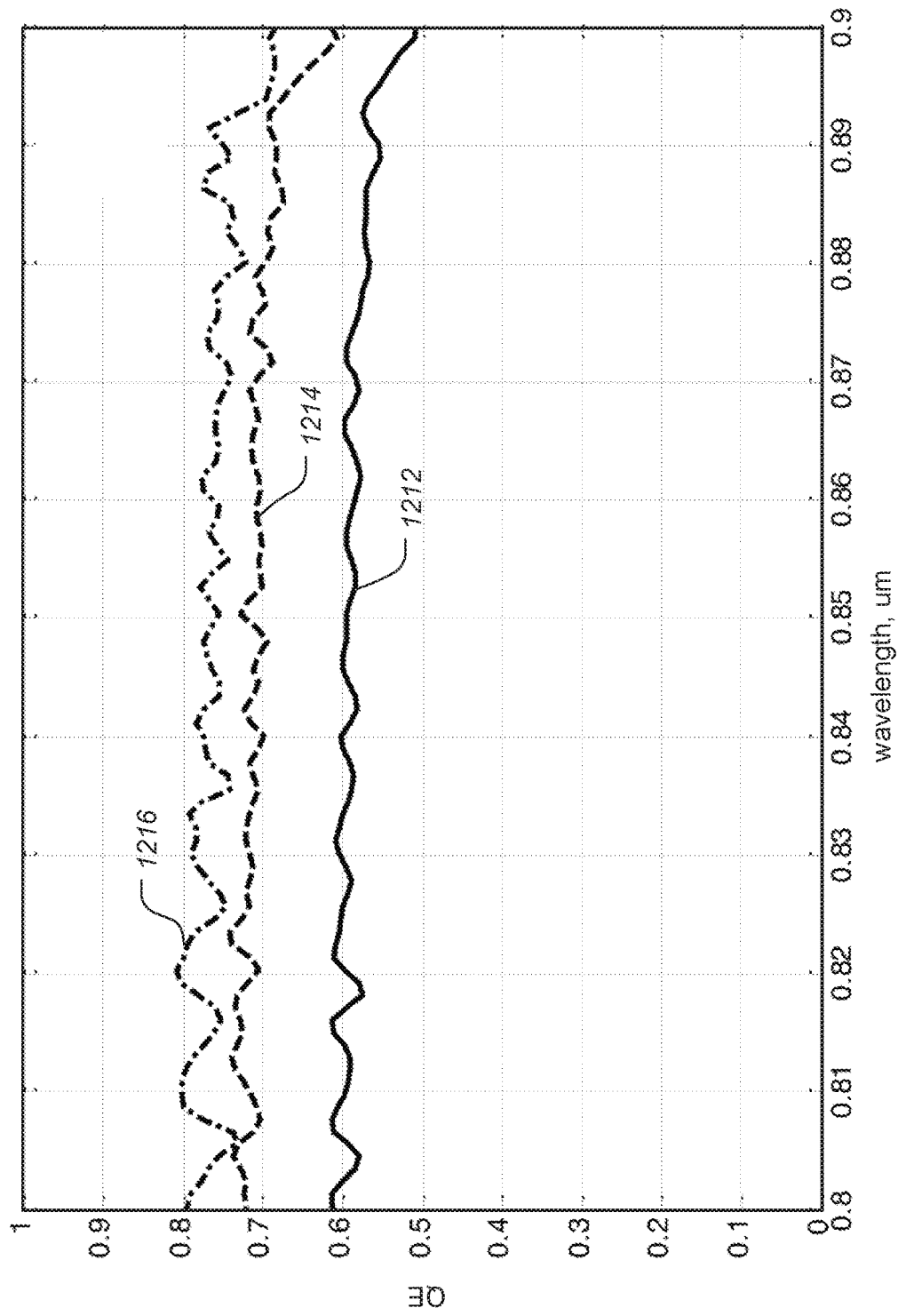
FIG. 12A is a plot of a FDTD simulation of a hexagonal lattice with holes given in FIG. 10 where the holes are funnel shaped with a funnel slope of 61 degrees.

FIG. 12A is a plot of a FDTD simulation of a hexagonal lattice with holes given in FIG. 10 where the holes are funnel shaped with a funnel slope of 61 degrees. The vertical axis is QE and the horizontal axis is optical wavelength from 800-900 nm and the material is silicon on SOI. The solid line (1212) is a P-I-N or N-I-P structure on 2000 nm silicon dioxide on silicon substrate where the layer thicknesses are 400 nm for the top doped P or N layer, 1200 nm not intentionally doped and/or intrinsic I layer, and 1100 nm oppositely doped from the top layer N or P layer on 2000 nm SiO$_2$ on silicon substrate. QE is between 50 and 60% in the wavelength span of 800-900 nm. Dashed line (1214) is for a thinner layer structure of 300 nm doped top layer P or N, 2000 nm I layer, 300 nm oppositely doped from the top layer N or P on 2000 nm SiO$_2$ on silicon substrate, the QE is between 60 and 70% in the wavelength span of 800-900 nm. Dash dot line (1216) is for a layer structure of 300 nm doped top layer of P or N, 2000 nm I layer, 100 nm oppositely doped from the top layer N or P on 2000 nm SiO$_2$ on silicon substrate, the QE is between 70-80% for wavelength ranges 800-900 nm. To reduce the series resistance of the thin top layer, transparent conducting metal oxide such as indium tin oxide (ITO) for example, can be used as an additional layer on top of the top 100 nm layer. The ITO is transparent at the infrared wavelengths and can range in thicknesses of 20 nm to 300 nm for example or any thickness that can reduce the sheet resistances to less than 200 ohm square and in some cases less than 100 ohms square and in some cases less than 50 ohms square.

Figure 12B:
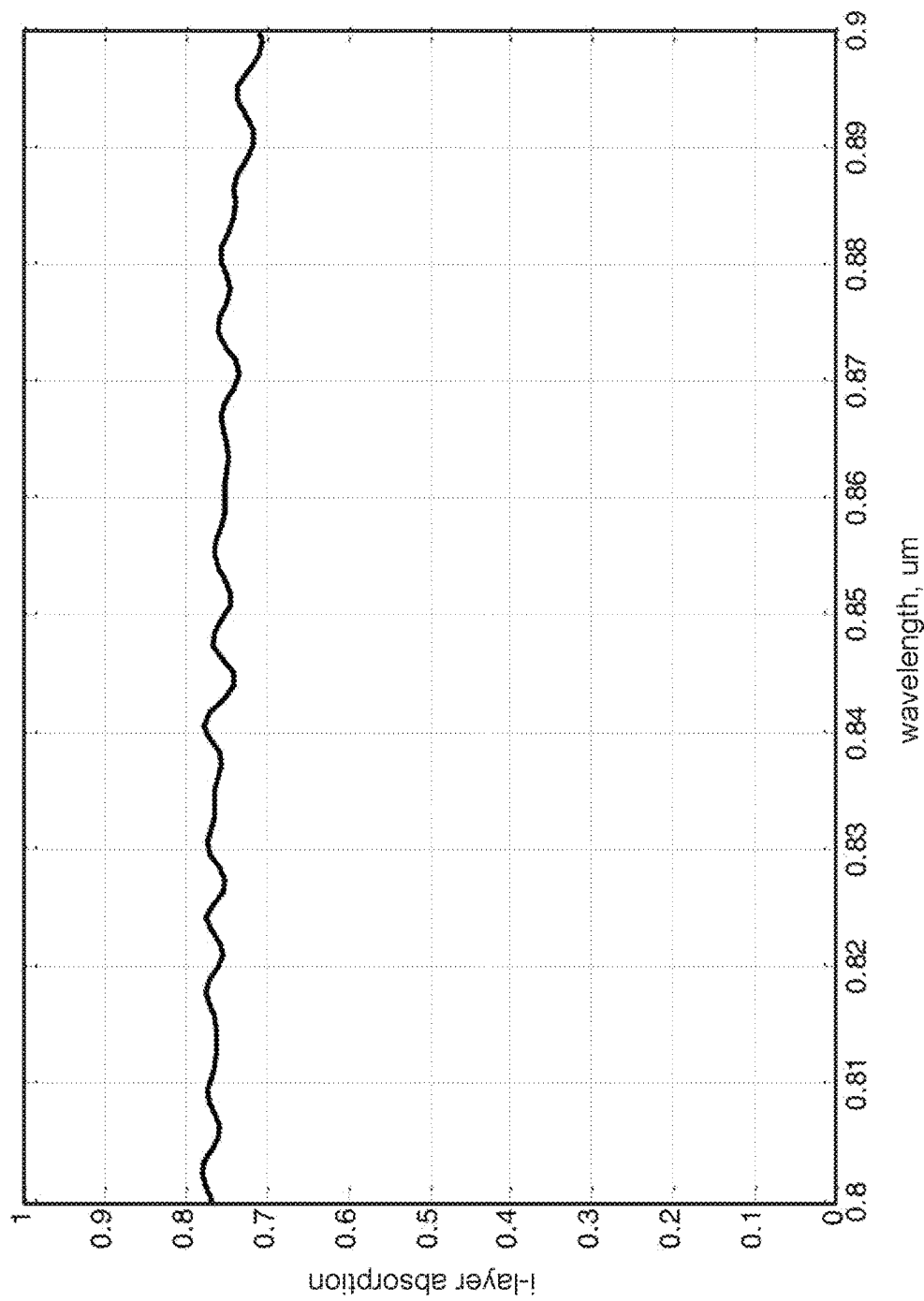
FIG. 12B is a plot showing the QE of a MSPD as in curve 1216 of FIG. 12A.

FIG. 12B is a plot showing the QE of a MSPD as in curve 1216 of FIG. 12A. The MSPD has a P-I-N or N-I-P layer thickness of 100 nm top P or N layer, 2000 nm I layer and 300 nm N or P layer on buried oxide (BOX) layer of 2000 nm on silicon substrate. The QE which is equivalent to absorption in the I layer is between 70-80% in the wavelength range from 800-900 nm. The device layer of the SOI can be P or N for either P-I-N or N-I-P structures. In some cases a pn junction can be formed between the SOI device layer and the bottom layer of a P-I-N or N-I-P MSPD which may or may not have an etch stop layer. The pn junction in some cases can help push away photogenerated carriers in the P or N layer away from the I layer thereby reducing a diffusion of minority carriers to the I region which can cause a slow response due to a "tail" in the impulse response of the MSPD.

The same thin structures can also be applied to MSAPD where the P-I-P layers are kept thin, of less than 300 nm and in some cases less than or equal to 100 nm.

Thinner P and N layers can result in higher QE and faster response of the MSPD/MSAPD. The same can be implemented in MSAPD where the P-I-P-I-N, the top layer P can be thin with an additional transparent metal oxide layer to reduce the sheet resistance.

Bandwidth of the thinner P and N layers MSPD can be greater than 10 Gb/s and in some cases greater than or equal to 20 Gb/s and in some cases greater than or equal to 25 Gb/s and in some cases can be greater than or equal to 30 Gb/s and in some cases greater than or equal to 40 Gb/s and in some cases greater than or equal to 50 Gb/s. With thinner I layer, 50 Gb/s, 60 Gb/s, 80 Gb/s, 100 Gb/s can be achieved.

The thin P and N layers can be implemented in P-I-N (or N-I-P) layer structures such as Si/Ge$_x$Si$_{1-x}$/Si (P/I/N) double heterostructures, where x can have values from greater than 0 to 1, and in some cases Ge$_y$Si$_{1-y}$/Ge$_x$Si$_{1-x}$/Si where x and y can have same and/or different values and can range from 0 to 1, and in some cases Ge$_y$Si$_{1-y}$/Ge$_x$Si$_{1-x}$/Ge$_z$Si$_{1-z}$ where x, y and z can be same and/or different values ranging from 0 to 1. It is desirable in optimizing QE and speed of response of the MSPD. The absorbing I layer can be cladded by wider bandgap material that can be less absorbing so that most of the photo generated electrons and holes are generated in the I region of the MSPD/MSAPD (MSAPD have two I regions, one for the absorption of light and the other I region for multiplication; the multiplication I region can be silicon and the absorption I region can be Ge$_x$Si$_{1-x}$ where x can have values from 0 to 1 and in some cases greater than 0 to 1).

Figure 13:
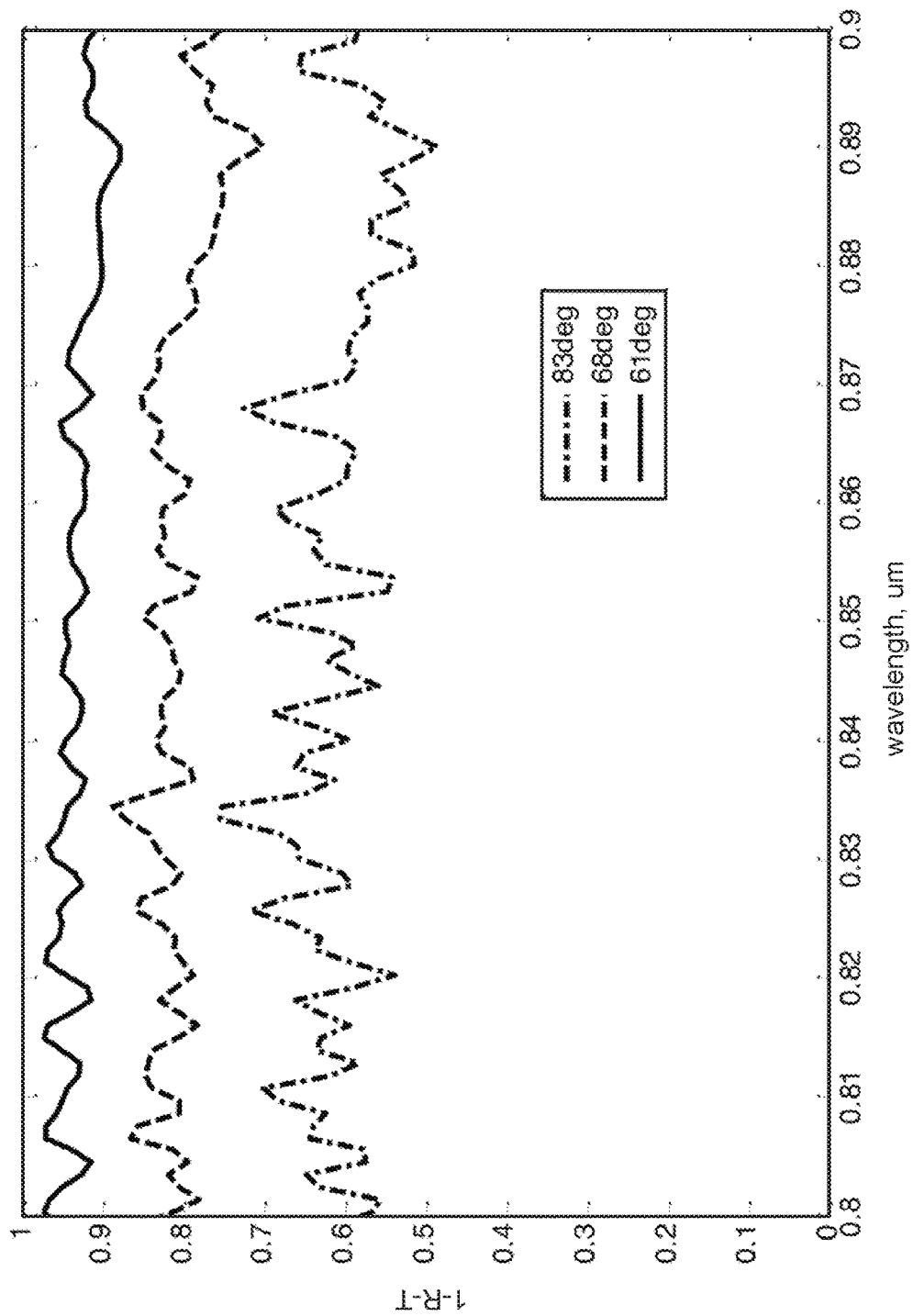
FIG. 13 is a plot showing the enhanced absorption vs. wavelength from 800-900 nm for an all silicon structure shown in FIG. 10.

FIG. 13 is a plot showing the enhanced absorption (1-reflection-transmission) on the vertical axis and wavelength on the horizontal axis from 800-900 nm for an all silicon structure shown in FIG. 10. The total thickness is 2500 nm on 2000 nm of SiO$_2$ on a silicon substrate. The three plots are for different slope of the funnel, the best result is for a funnel slope of 61 degrees in this example. Over 90% enhanced absorption can be achieved over a wavelength span of 800-900 nm. To maximize the absorption in the I layer, it is desirable to have thin P and N layers in the cases where P and N layers can also absorb photons such as all silicon P-I-N MSPD/MSAPD and in some cases Ge P—Ge I—Si N, and in some cases GeSi P—GeSi—I—Si N, in cases where at least one junction is a homojuction for example. Double heterojuctions where the P and N have larger bandgaps than the I layer, and where the P and N are weakly absorbing, can minimize the generation of photogenerated electron hole pairs in the P and N regions. In addition the optical refractive index of larger bandgap material is in general lower than the refractive index of smaller bandgap material, therefor in the case of a double heterojunction P-I-N where P and N have higher bandgap than the I region can help confine the lateral propagating waves, Bloch waves, slow waves, within mostly the I layer, can improve the absorption of the photons in the I layer which can further enhance the absorption and increase the quantum efficiency. Examples of double heterojunctions are Si P—Ge$_x$Si$_{1-x}$ I—Si N where x can be greater than 0 but less than or equal to 1. Other examples are Ge$_x$Si$_{1-x}$ P—Ge$_y$Si$_{1-y}$I—Ge$_z$Si$_{1-z}$ N and where y is greater than x and z and x and z can be the same or different value. X,y,z can have values from 0 to 1. In some cases the x and/or y and/or z can be graded where the values can vary within each P,I,N region. Grading can further help confine lateral photons within mostly the I region such as for a graded index optical fiber or optical waveguide.

In dry etching there are many techniques of monitoring etch depth, one of the method involves optical interference and/or monitoring the chemical species that are in the etch chamber or exhaust using spectroscopy. See e.g., Collot et al, Dry-etch monitoring of III-V heterostructures using laser reflectometry and optical emission spectroscopy, J. Vac. Sci. Techno!. B 9 (5), September/October 1991 (incorporated herein by reference). Similarly, in etching Si, GeSi, Ge with P and N dopings optical interference can be used where GeSi/Si can form an optical interference layer, and/or sensing the species of Ge, As, B in the reaction by product during dry etching using a spectrometer either optical and/or mass spectrometer.

Using etch depth monitoring, thin P and N layers can be used in the P-I-N MSPD (also MSAPD for P-I-P-I-N layers), the thin layers of P and/or N can be fortifiled with transparent conducting metal oxide such as indium tin oxide and/or metal layers to reduce the sheet resistivity. P and N layers can be as thin as 100 nm or less, and can be Si, and/or GeSi and/or Ge.

Figure 14:
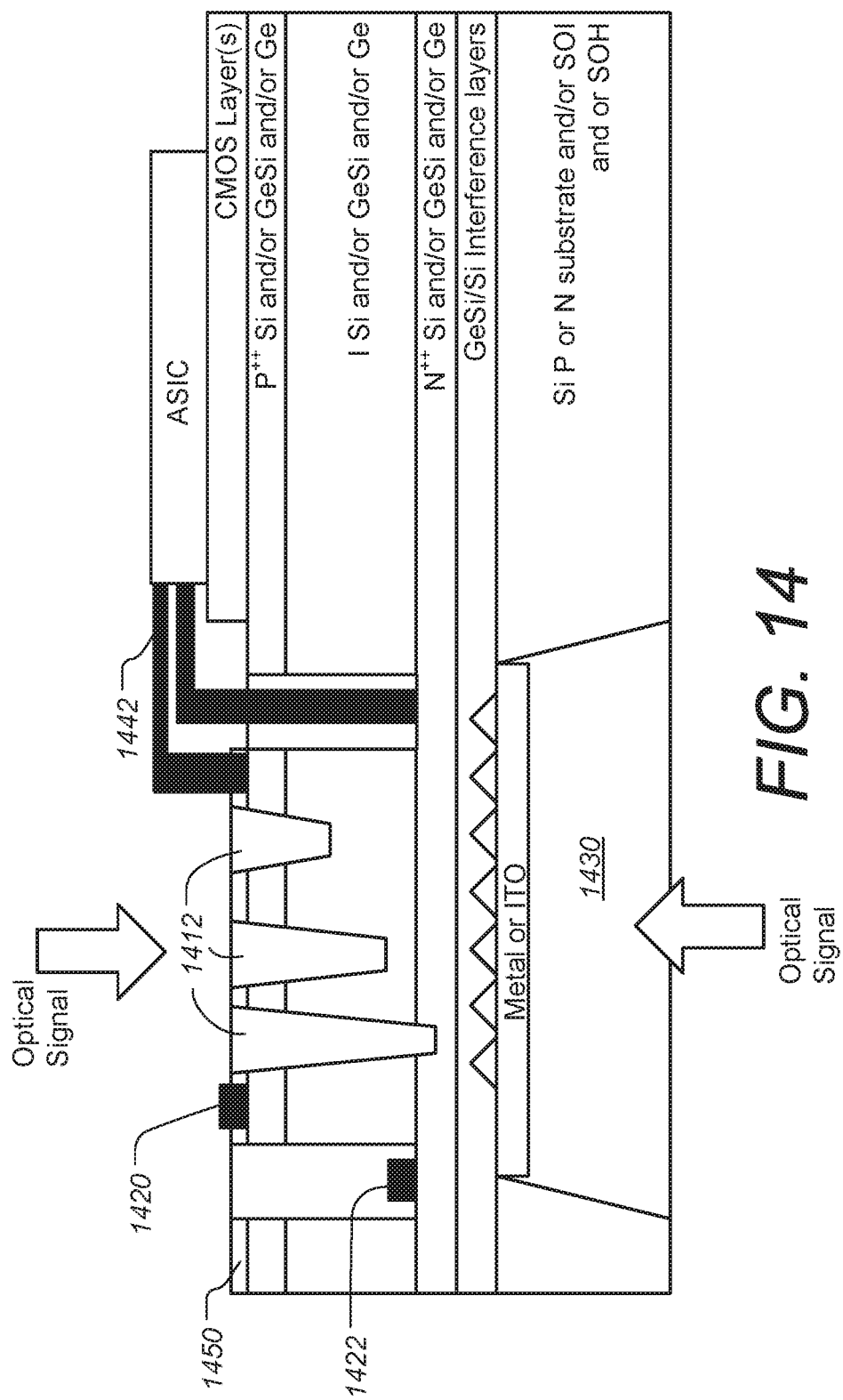
FIG. 14 is a cross section schematic of a MSPD monolithically integrated with CMOS/BiCMOS electronics in a single chip, according to some embodiments.

FIG. 14 is a cross section schematic of a MSPD monolithically integrated with CMOS/BiCMOS electronics in a single chip, according to some embodiments. The chip can include multiple MSPD (and/or MSAPD) with single and/or multiple CMOS/BiCMOS electronic application specific integrated circuits. Each such integrated chip can be the optical receiver for either unidirectional and/or bidirectional optical fiber using a single fiber and/or multiple fibers and/or free space applications for optical data communications. On a bulk Si substrate of either N or P doping, and/or a SOI substrate where the device layer can be either N or P doping and/or on a SOH wafer where the device layer can be either N or P doping, on which an etch stop layer of GeSi and/or Si layer(s) can be grown of thickness ranging from 50 nm to 200 nm or more, followed by a highly doped and/or degenerately doped N Si and/or GeSi layer(s) of thickness ranging from 50 nm to 300 nm or more, followed by an intrinsic I layer that is not intentionally doped and/or lightly doped with doping level less than $3\times10^{15}$ cm$^{-3}$ that is Si and/or GeSi layer(s) with thickness ranging from 500 nm to 5000 nm and in some cases from 500 nm to 2000 nm followed by highly doped ($5\times10^{18}$-$10^{20}$ cm$^{-3}$ dopant concentration or higher) and/or degenerately doped ($10^{21}$ cm$^{-3}$ or higher dopant concentration) P Si and/or GeSi layer(s) with thicknesses ranging from 30 nm to 300 nm or more, followed by a buffer Si and/or GeSi layer(s) if necessary and followed by Si and/or GeSi layer(s) for CMOS/BiCMOS electronics which can have multiple layers of CMOS/BiCMOS electronics which are electrically connected to one or more MSPD and/or MSAPD. In the case of MSAPD, P-I-P-I-N layers are used and where each layer can be Si and/or GeSi layer(s), and in some cases the multiplication I layer adjacent to the N layer is Si. In all the GeSi layer(s), the fraction of Ge in each layer(s) can be same and/or different, and in some cases it is desirable that the I absorbing layer is cladded by higher bandgap material, for example the cladding P and N layers have less Ge and/or no Ge than the I GeSi layer. It should be noted that all layers absorb photons to some extend, but the photogenerated carriers in the I absorbing layer contribute the most to the high speed properties of the MSPD and/or MSAPD. Photogenerated carriers in the P and N regions can result in minority carrier diffusion back to the high electric field I absorbing region that can result in a slow tail to the fast impulse response of the MSPD/MSAPD that can degrade the speed or bandwidth of the MSPD/MSAPD.

Also shown in FIG. 14 is a via 1430 where the substrate is mostly and/or entirely removed and micro and/or nano structures can be etched or not etched into the bottom layer(s) and further the bottom layer can be coated with a transparent conducting metal oxide such as indium tin oxide and/or semitransparent metal layer and/or metal layer and/or dielectric Bragg reflector layer(s). The Bragg reflector layers can also be a bandpass filter for coarse wavelength division multiplexing (CWDM) applications and light can impinge from the bottom and the via can be a guide for the fiber for example. The top layer(s) can be etched with micro-nano structure holes 1412 using dry and/or wet etching methods and the depth of the holes can range from 50 nm to 3000 nm or more, and in some cases partially into the I layer, and/or through the I layer and/or past the I layer as shown in FIG. 14. The holes 1412 can be periodic in a lattice structure and/or non periodic and/or in a random and/or pseudo random pattern, the holes can have any shape and the shape can vary with depth into the layer(s), the diameter and/or diagonal and/or a measure of its size, can range in value from 250 nm to 5000 nm and in some cases from 350 nm to 2300 nm for wavelength ranges of 800 nm to 1600 nm depending on the composition of the I absorbing layer(s) which can be Si and/or $Ge_xSi_{1-x}$ layer(s) with Ge fraction x ranging from 0 to 1. External quantum efficiency can range from 15% to 90% or more at at least one of the wavelengths in the range. In some cases for Si I absorbing layer the wavelength can range from 800 to 990 nm with the quantum efficiency (or absorption in the I layer) ranging from 20% to 90% at some wavelengths in the range. In some cases at 990 nm the QE can be equal to and/or greater than 20% and in some cases equal to and/or greater than 40% for a MSPD. Data rate bandwidths can be 10 Gb/s and in some cases 25 Gb/s and in some cases 50 Gb/s and in some cases greater than 50 Gb/s.

Layer 1450 is a thin ITO like material, and/or thin metal material with thickness ranging from 5 nm to 500 nm or more that can be deposited on the P and/or N layer(s) to reduce the sheet resistance of these layers. In some cases with the addition of transparent conductive metal oxide and/or metal layers the P and N layers can be medium doped ($10^{17}$-$10^{18}$ $cm^{-3}$ concentration of dopants) and/or low doped ($10^{16}$ $cm^{-3}$ dopant concentration or less). Ohmic contacts 1420 to the P and N regions are made and transmission lines 1442 connect the MSPD and/or MSAPD to the CMOS/BiCMOS electronics. A reverse bias is applied between the anode and cathode, the bias voltage can range from −2 to −4V and in some cases −2 to −6V for MSPD and −10 to −50V for MSAPD. Light can impinge from the top surface at a normal and/or almost normal incidence to the surface, and in some cases it can be off normal by an angle ranging from 5 degrees to 50 degrees off normal. In some cases, off normal provides less reflection back into the fiber. Reflection can be as low as 5% or less and in some cases 3% or less and in some cases 1% or less from the surface of the MSPD/MSAPD back into the fiber and/or back toward the incident beam of light. The schematic in FIG. 14 only shows basic features for clarity.

Figure 15:
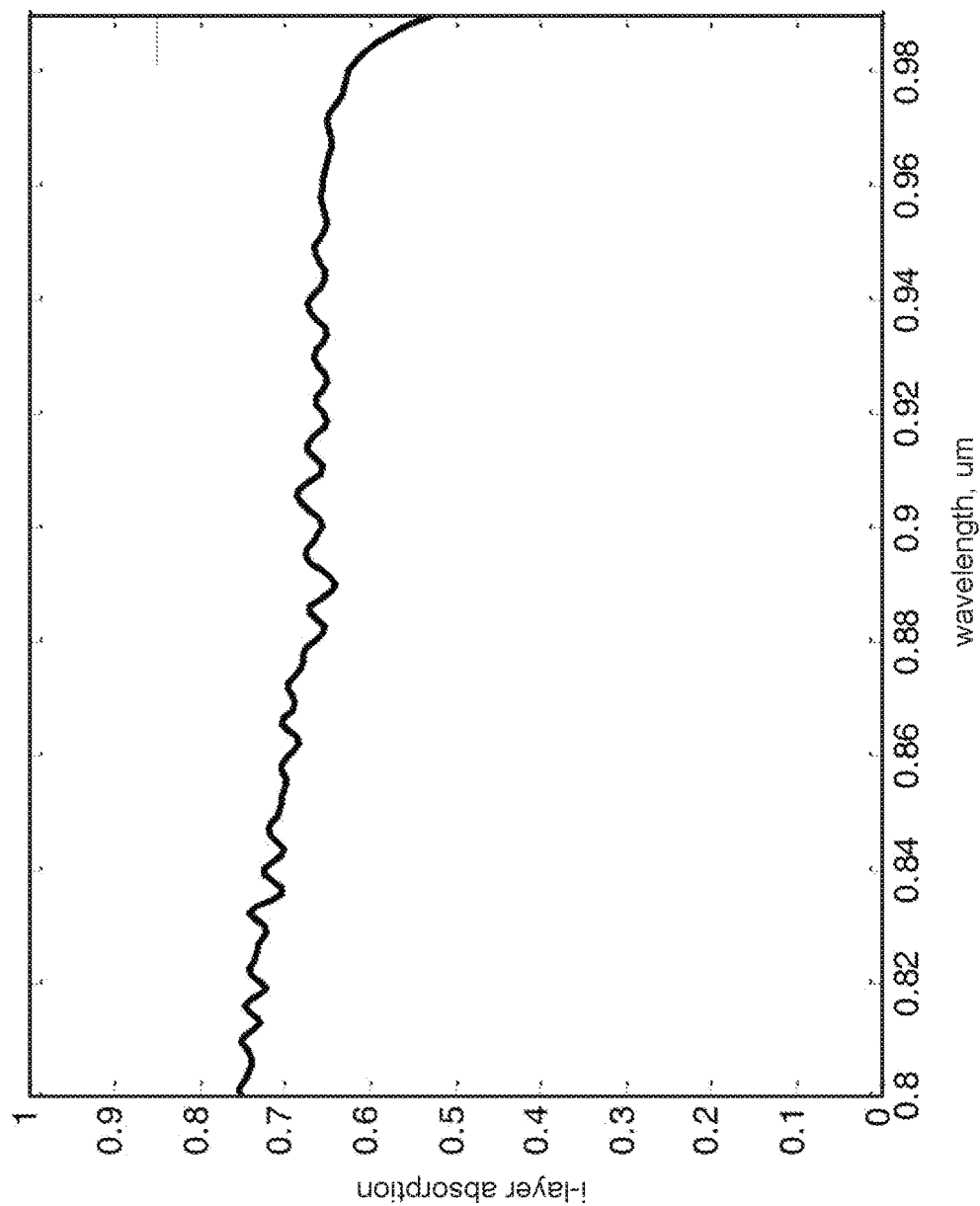
FIG. 15 is a plot of a FDTD simulation of absorption for a structure similar to FIG. 10.

FIG. 15 is a plot of a FDTD simulation of absorption in the I layer which is equivalent to the quantum efficiency of a structure similar to FIG. 10. The funnel angle is 61 degrees and 400 nm in depth followed by a cylindrical section of 2200 nm. The MSPD P-I-N structure is 300 nm P, 2000 nm I and 300 nm N on SOI where the oxide is 2000 nm thick on silicon substrate. The vertical axis is QE (or absorption in the I layer only), and the horizontal axis is wavelength from 800 nm to 990 nm. The material is all silicon. The simulation shows that the QE range from over 70% to approximately 60% over the wavelength span of 800-980 nm, The funnel diameter is 940 nm and the cylindrical diameter is 500 nm, with a period of 1000 nm in a hexagonal lattice. This is just one example of the hole dimensions, other dimensions ranging from 300 nm to 3000 nm and spacing between holes ranging from 50 nm to 3000 nm can be other examples.

In some cases, the QE at 980 nm can be 10% or greater, and in some cases the QE at 980 nm can be 20% or greater, and in some cases the QE at 980 nm can be 30% or greater and in some cases the QE can be 40% or greater at 980 nm and in some cases the QE can be 50% or greater at 980 nm where the absorbing I layer is silicon. The lower QE can be due to other effects such as scattering and losses due to roughness of the hole's sidewalls. In some cases, smooth side walls of the holes can reduce scattering losses and therefor increase the Q of the collectively connected resonant hole structure for enhancement of the absorption. Q values can range from 2 to 500 or more for example for the microstructured holes for the enhancement of absorption. The Q is typically higher when the material absorption coefficient is low, for example less than 200 $cm^{-1}$.

Ingham, Future of Short-Reach Optical Interconnects based on MMF Technologies, OFC 2017 ©OSA 2017 (incorporated herein by reference and referred to herein as "Ingham"); and Sun et al, SWDM PAM4 Transmission Over Next Generation Wide-Band Multimode Optical Fiber, JOURNAL OF LIGHTWAVE TECHNOLOGY, VOL. 35, NO. 4, Feb. 15, 2017 (incorporated herein by reference and referred to herein as "Sun") discuss the use of wavelengths 850, 880, 910, 940, 980 nm for coarse wavelength division multiplexing and using PAM-4 (pulse amplitude modulation using 4 pulses) for an aggregated data rate of over 200 Gb/s on a single multimode fiber. In such applications the linearity of the MSPD is important and MSPD have shown that the linearity of photocurrent vs input optical power is linear to over 10 mW.

Ingham and Sun discuss an application of MSPD in short reach optical data links. In some cases the MSPD can be monolithically integrated with CMOS and/or BiCMOS electronics such as transimpedance amplifier for example, which can greatly reduce the cost of the transceiver. See, e.g., Tekin, Review of Packaging of Optoelectronic, Photonic, and MEMS Components, IEEE JOURNAL OF SELECTED TOPICS IN QUANTUM ELECTRONICS, VOL. 17, NO. 3, May/June 2011 (incorporated herein by reference) and Orcutt et al, Monolithic Silicon Photonics at 25 Gb/s, OFC 2016 ©OSA (2016) (incorporated herein by reference) where cost of packaging can be significantly reduced with monolithic integration of components.

Figure 16:
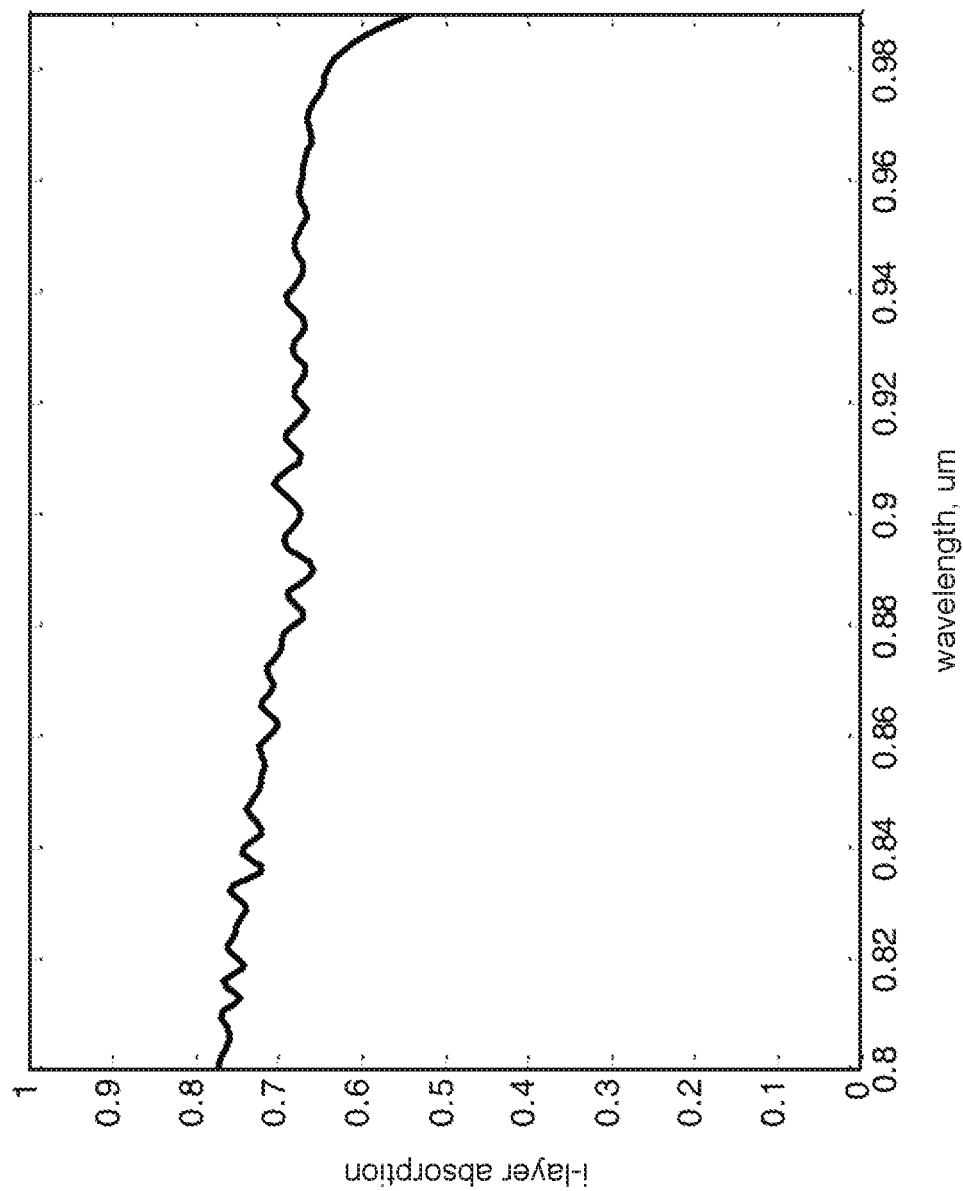
FIG. 16 is a plot of a FDTD simulation of a structure similar to that of the plot in FIG. 15 except with a thinner top layer.

FIG. 16 is a plot of a FDTD simulation of a structure similar to that of the plot in FIG. 15 but with a thinner top layer of 100 nm rather than 300 nm. The MSPD (can also be MSAPD with the addition of charge and multiplication layers for the situation where gain is 1) P-I-N (can also be N-I-P) where all the layers are silicon with the following thicknesses, P Si 100 nm, I Si 2000 nm and N Si 300 nm on SOI where the buried oxide layer is 2000 nm on a silicon substrate. The thinner top P layer allow more photons into the I layer resulting in an improvement in the QE of the MSPD/MSAPD. The simulation shows response to 990 nm with QE above 60% and in some cases with QE above 20% at 980 nm and in some cases with QE above 30% at 980 nm and in some cases with QE above 40% at 980 nm. The lower QE at 980 nm may be due to scattering losses. The Q at 980 nm may range from 4 to 100 or more.

A transparent conducting metal oxide such as indium tin oxide can be used on the top layer to reduce the sheet resistivity. The ITO thickness can range from 10 nm to 400 nm. See, e.g., Eshaghi et al, Optical and electrical properties of indium tin oxide (ITO) nanostructured thin films deposited on polycarbonate substrates "thickness effect", Optik 125 (2014) 1478-1481 (incorporated herein by reference).

Figure 17:
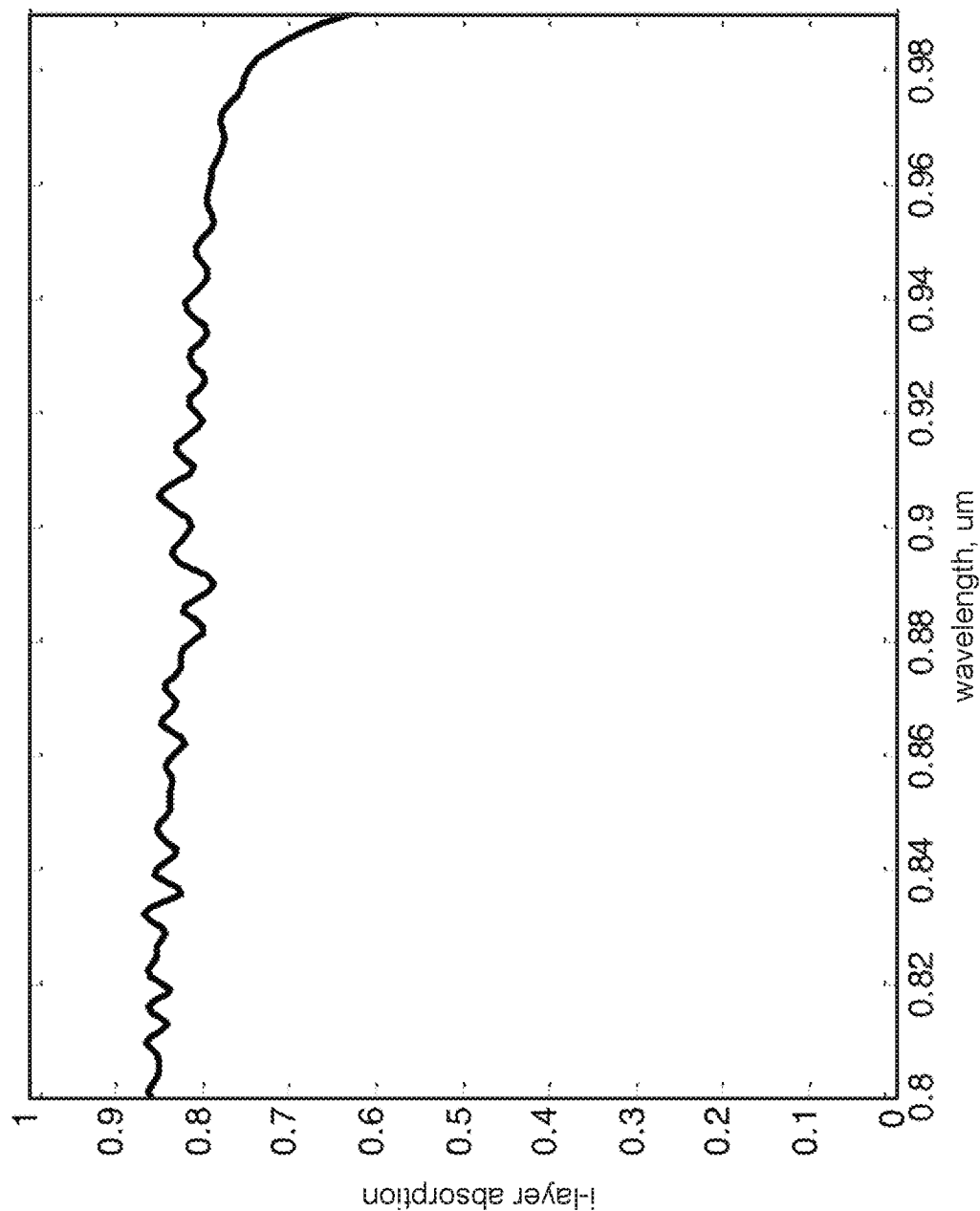
FIG. 17 is a plot of a FDTD simulation of a structure similar that plotted in FIG. 15 except with P and N layers being 100 nm thickness.

FIG. 17 is a plot of a FDTD simulation of a structure similar that plotted in FIG. 15 but with P and N layers of 100 nm thick, for a MSPD P-I-N structure as P Si 100 nm, I Si 2000 nm, N Si 100 nm on SOI with oxide thickness of 2000 nm on silicon substrate. As shown in FIG. 14, materials other than SOI may be used, for example, bulk Si where a via is etched and/or on SOH substrate and where the SOH substrate and/or SOI wafer may have different hole pattern and/or photonic crystal and/or high contrast grating (HCG) and/or grating filters for each MSPD in an array for CWDM where light can impinge from the substrate side through a via. With thinner P and N layers more photons are absorbed in the I layer resulting in higher QE over the wavelength span from 800-990 nm. The Y axis shows absorption in the I layer which is equivalent to QE and the X axis is the wavelength in microns. With the thin P and N layers, metal layers, thin semitransparent metal layers, transparent conducting metal oxide may be used to reduce the sheet resistance. As shown in FIG. 14 a via in the backside can be etched to allow the coating of a metal or ITO type material to reduce sheet resistance and other dielectrics for reflectivity such as Bragg reflectors. The via can also be used as a light guide and/or to guide an optical fiber toward the MSPD/MSAPD.

QE can be as high as over 80% at some wavelengths in the range from 800-980 nm, and in some cases over 20% and in some cases over 30% and in some cases over 40% and in some cases over 50% and in some cases over 60%.

Figure 18A:
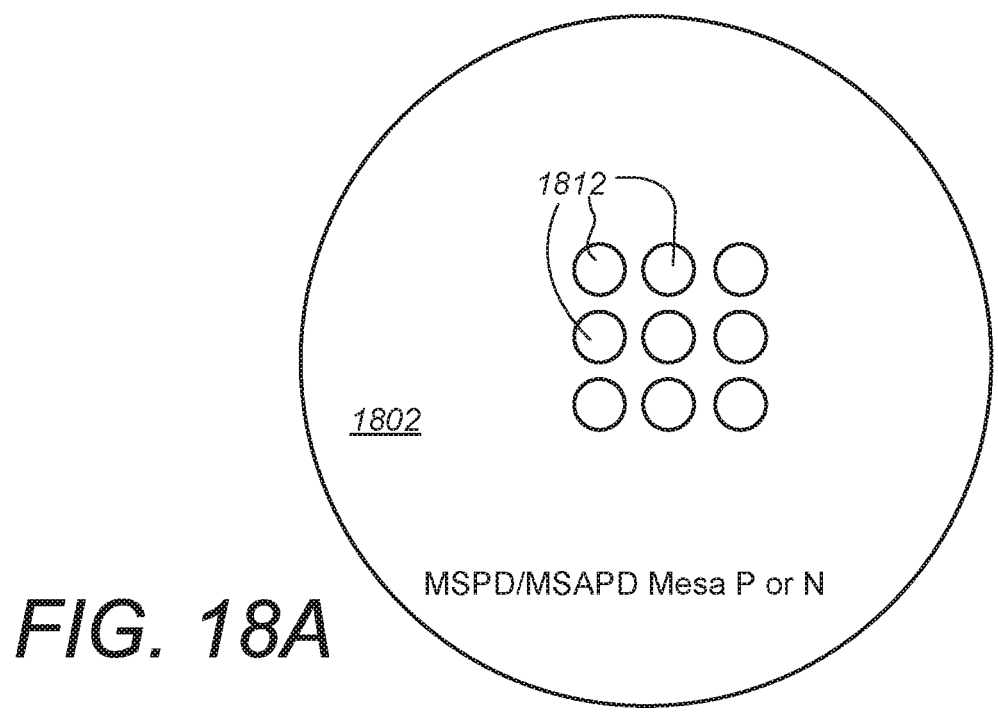
FIG. 18A-18E are schematic diagrams of microstructured holes positioned on a photosensitive surface of a MSPD/MSAPD, according to some embodiments.

FIG. 18A-18E are schematic diagrams of microstructured holes positioned on a photosensitive surface of a MSPD/MSAPD, according to some embodiments. In FIG. 18A, the microstructure holes 1812 for enhancing absorption can be grouped near the center of the MSPD/MSAPD photosensitive region that can be defined by a mesa 1802 for example. For clarity other components of the MSPD/MSAPD are not shown such as the P or N metal ohmic contacts, electrodes, mesas, passivations, dielectic and/or polyimide, antireflection coatings.

Figure 18B:
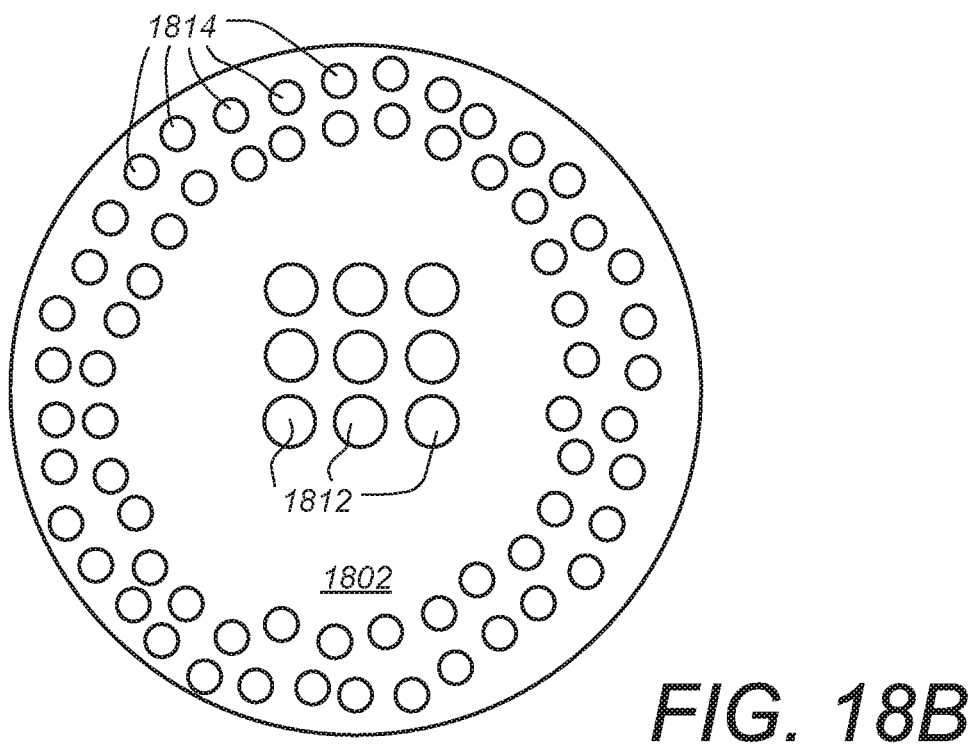

FIG. 18B shows that in addition to the microstructure holes 1812 in the center for absorption enhancement, the periphery of the photosensitive area of a MSPD/MSAPD can have photonic crystal holes 1814 to reflect laterally propagation optical modes back toward the photon absorbing and absorption enhancement regions.

Figure 18C:
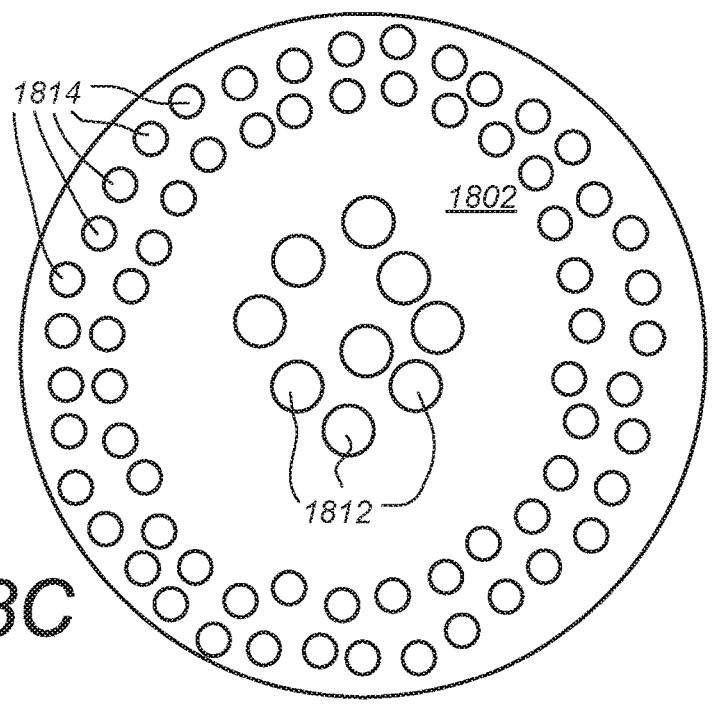

FIG. 18C shows microstructured holes 1812 can be in a aperiodic and/or non periodic arrangements as compared to a periodic arrangement shown in FIGS. 18A and 18B.

Figure 18D:
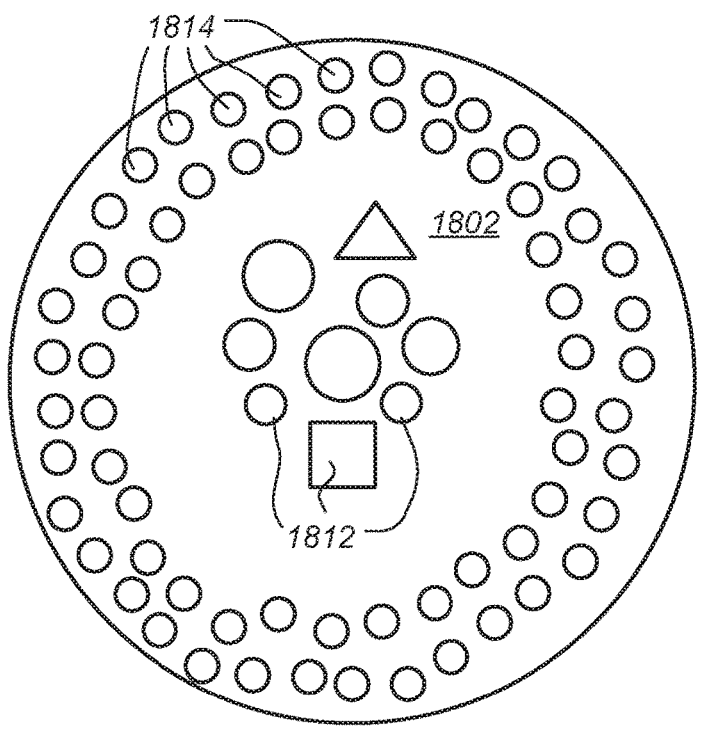

FIG. 18D shows that the microstructured holes 1812 can have different shapes and sizes and can be periodic and/or non periodically arranged.

Figure 18E:
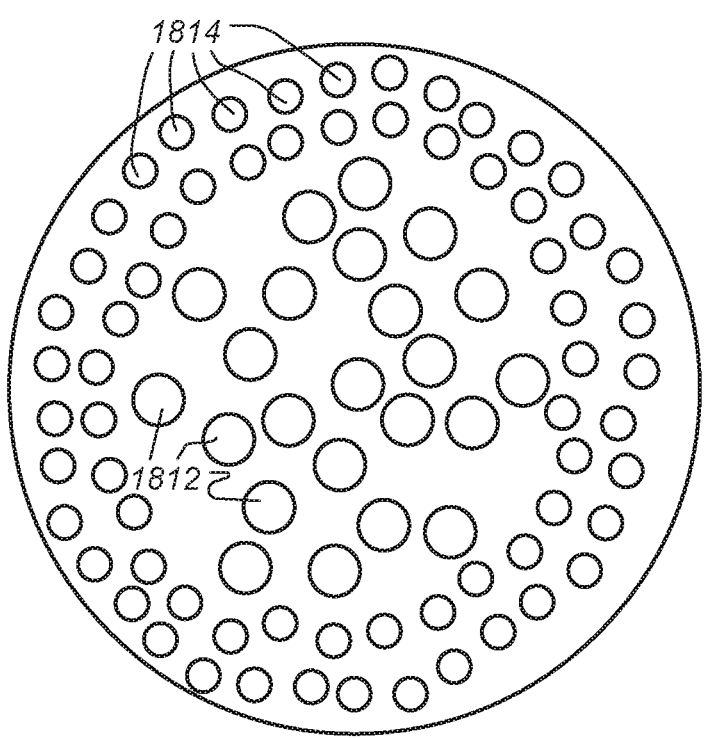

FIG. 18E shows that the microstructured holes 1812 can cover most of the photosensitive areas of a MSPD/MSAPD.

The holes in FIGS. 18A-E, can have characteristic dimensions (diameter, diagonal, average dimensions) that range from 100 nm to 3000 nm and in some cases from 250 nm to 2000 nm and in some cases from 500 nm to 1500 nm and in some cases from 600 nm to 2500 nm. Spacing between adjacent holes and/or nearest neighbor holes can range from 10 nm to 5000 nm and where the holes can be periodic, non periodic, partially periodic, and/or any combination of periodic and/or non periodic and/or randomness. The diameter or characteristic dimension of the photosensitive area can range from 5 micrometer to 500 micrometers or more. In some cases for high speed applications, the diameter of the photosensitive area can range from 5 micrometers to 100 micrometers and in some cases from 30 micrometers to 80 micrometers.

Figure 19A:
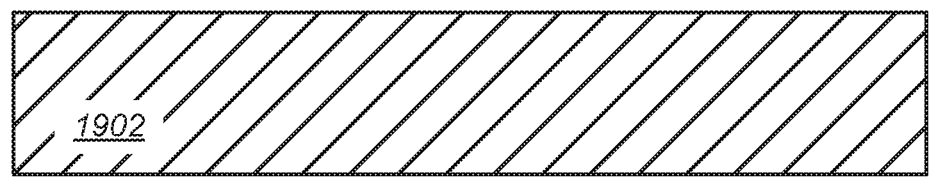
FIGS. 19A-19D are a series of cross section views illustrating holes being etched into a buried oxide layer of a SOI wafer, according to some embodiments.
Figure 19B:
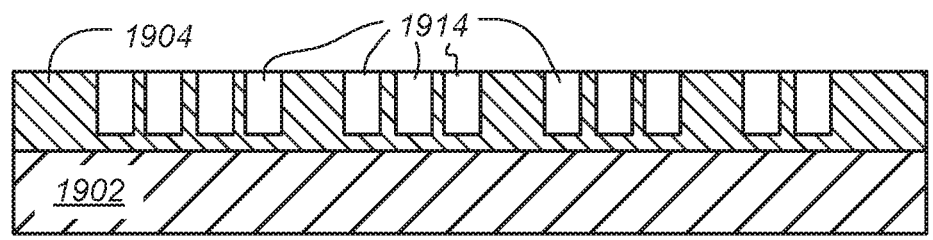
Figure 19C:
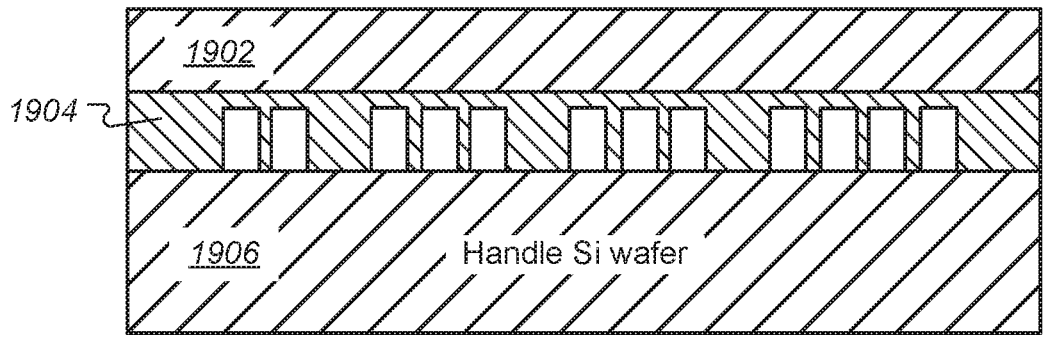
Figure 19D:
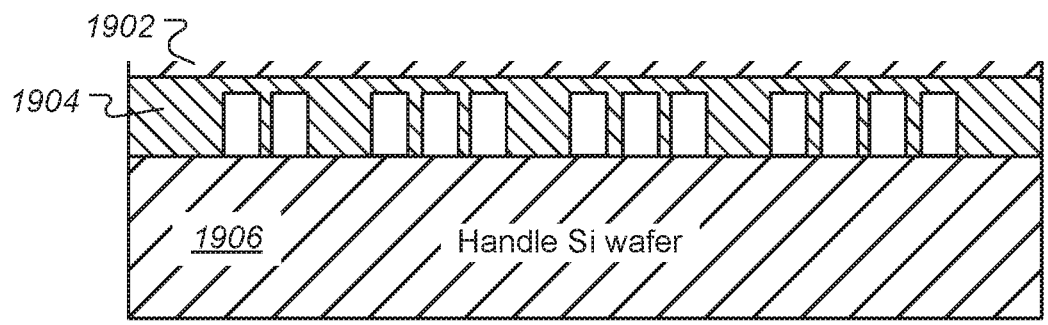
Figure 19E:
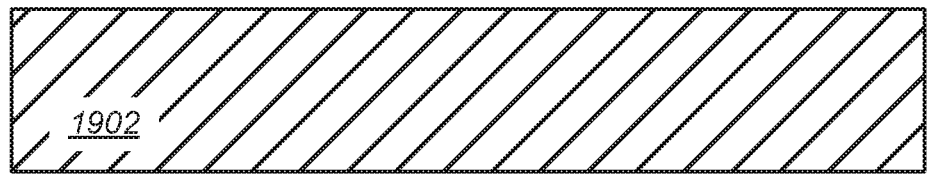
FIGS. 19E-19H are a series of cross section views illustrating shows holes etched into the oxide of a SOI wafer that are filled with a high index dielectric, according to some embodiments.
Figure 19F:
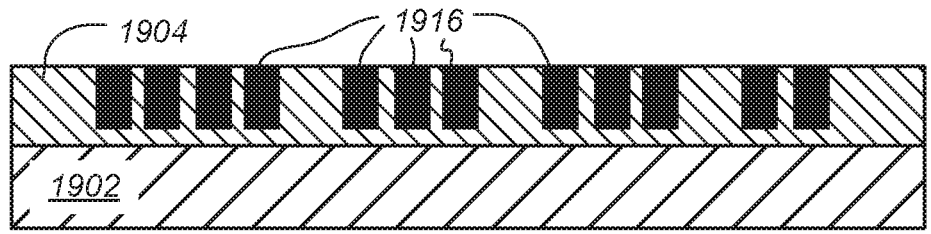
Figure 19G:
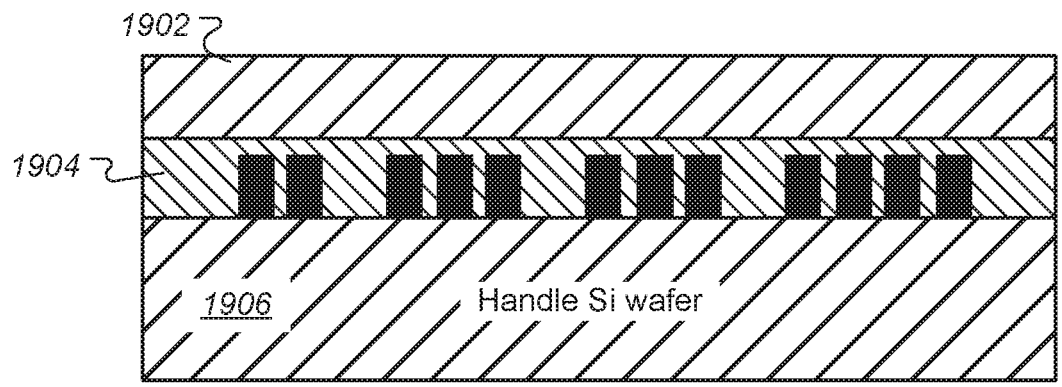
Figure 19H:
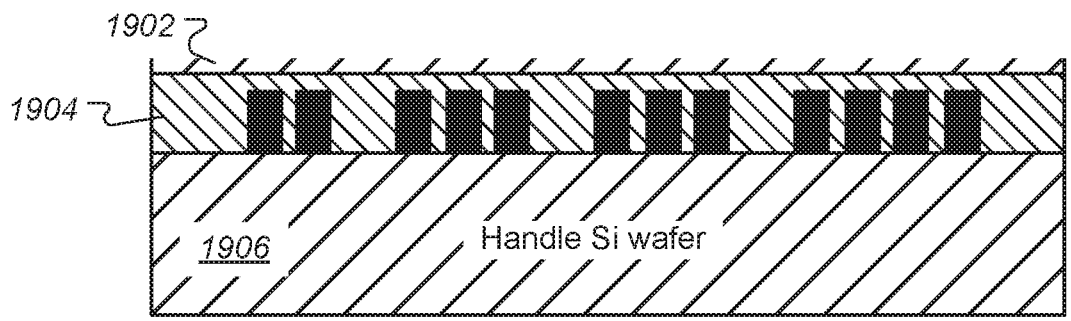

FIGS. 19A-19D are a series of cross section views illustrating holes being etched into a buried oxide layer of a SOI wafer, according to some embodiments. FIG. 19A shows the starting wafer. FIG. 19B shows oxide 1904 formed on wafer 1902 and holes 1914 etched in the oxide. In FIG. 19C, the wafer and oxide 1902 and 1904 are flipped and bonded to a handle silicon wafer 1906. In FIG. 19D, the wafer 1902 is cut and/or subjected to CMP. The pattern of holes 1914 can be a one or two dimensional grating, photonic crystal lattice and/or any other hole patterns that can be used as a filter such that a bandpass region exist in the wavelength span. FIGS. 6A-6D show an alternative where the holes 632 can be etched directly into silicon. For photons with energies greater than the Si bandgap, oxide with holes is less absorbing and for photon energies less than the Si bandgap, silicon with holes can be used since it is minimally absorbing.

These holes 1914 are etched in a pattern to allow a bandpass and are etched at specific locations on the wafer such that MSPD/MSAPD arrays can be fabricated over the holes either in the oxide and/or in the silicon such that each MSPD/MSAPD in an array can have a distinct bandpass filter associated with the array or with each or two or more individual MSPD/MSAPD in the array. This enables coarse wavelength division multiplexing (CWDM) optical signal to be selectively detected by the MSPD/MSAPD and/or photodiodes without absorption enhancement hole arrays.

Alignment marks can be provided in the oxide and/or silicon such the photolithographic process using stepper at the device level can align to the patterns in the SOI with holes and/or SOH substrates.

FIGS. 19E-19H are a series of cross section views illustrating holes etched into the oxide of a SOI wafer that are filled with a high index dielectric, according to some embodiments. Examples of the high index dielectric include: hafnium oxide; silicon nitride; zirconium oxide; hafnium nitride; and zirconium. This provides a higher index grating. The holes can be etched partially into the oxide, through the oxide, and/or into the silicon handle substrate. The holes 1916 can be partially filled, and/or completely filled with another dielectric(s) and/or amorphous semiconductor and can be multiple layers. Surface normal color filters can be fabricated in this manner. See, e.g., Uddin et al, Highly efficient color filter array using resonant Si3N4 gratings, 20 May 2013 | Vol. 21, No. 10 | DOI:10.1364/OE.21.012495 | OPTICS EXPRESS 12497 (incorporated herein by reference and referred to herein as "Uddin"); Jacob et al, Normally incident resonant grating reflection filters for efficient narrow-band spectral filtering of finite beams, Vol. 18, No. 9/September 2001/J. Opt. Soc. Am. A (incorporated herein by reference); and Zhou et al, Surface-normal emission of a high-Q resonator using a subwavelength high-contrast grating, 27 Oct. 2008/Vol. 16, No. 22/OPTICS EXPRESS 17282 (incorporated herein by reference). The filter can be photonic crystal, grating and high contrast grating in one and/or two dimensions that are photo lithographically imaged and wet and/or dry etched in to silicon dioxide, any high dielectric such as hafnium oxide, silicon layer(s) substrate prior to epitaxial deposition of MSPD P-I-N layers and/or MSAPD P-I-P-I-N layers in Si and/or GeSi epitaxial layers.

In some cases photons with wavelengths from 900 nm to 1100 nm can be used with silicon as a photonic crystal, grating and/or high contrast grating Ref. Zhou. For wavelengths 1000 nm and/or longer, Si can be used as a grating and/or high contrast grating and/or photonic crystal.

Figure 19I:
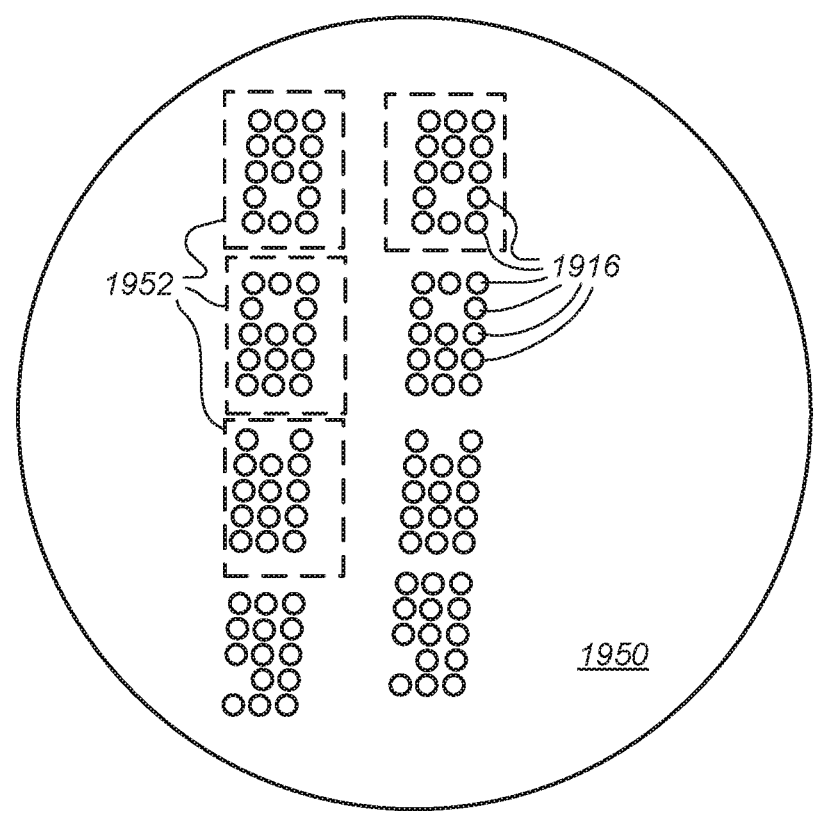
FIG. 19I is a diagram showing a silicon wafer having hole patterns etched for bandpass filtering in locations where MSPDs/MSAPDs are to be fabricated, according to some embodiments.

FIG. 19I is a diagram showing a silicon wafer having hole patterns etched for bandpass filtering in locations where MSPDs/MSAPDs are to be fabricated, according to some embodiments. Wafer 1950 is a silicon wafer that can be a SOI and/or bulk where holes and/or gratings 1914 (see FIG. 19B) are formed in one or two dimensions. The holes and/or gratings 1914 are etched in specific locations which match the position 1952 where MSPDs/MSAPDs are to be fabricated. The MSPSs/MSAPDs can be fabricated on epitaxial layers grown on the substrate with the holes and/or gratings 1914 forming a bandpass filter and can select the wavelength in a CWDM or dense wavelength division multiplexing (DWDM) optical signal impinging on the bandpass filter prior to impinging on the MSPD/MSAPD. This arrangement allows integration of a bandpass filter specific to each MSPD/MSAPD in an array of two or more MSPD/MSAPD photodetectors that are monolithically integrated with CMOS and/or BiCMOS electronics including ASICs such as transimpendance amplifiers for example.

Bandpass filters can also be fabricated on the top surface where the microstructured holes for absorption enhancement are etched. By using a viscous spin on glass polymer, a glassy film can be deposited over the microstructured holes without filling the holes. Subsequent silicon nitride or hafnium oxide can be deposited and a grating in one and/or two dimension can be etched to form a bandpass filter. See, e.g., Uddin.

Figure 20:
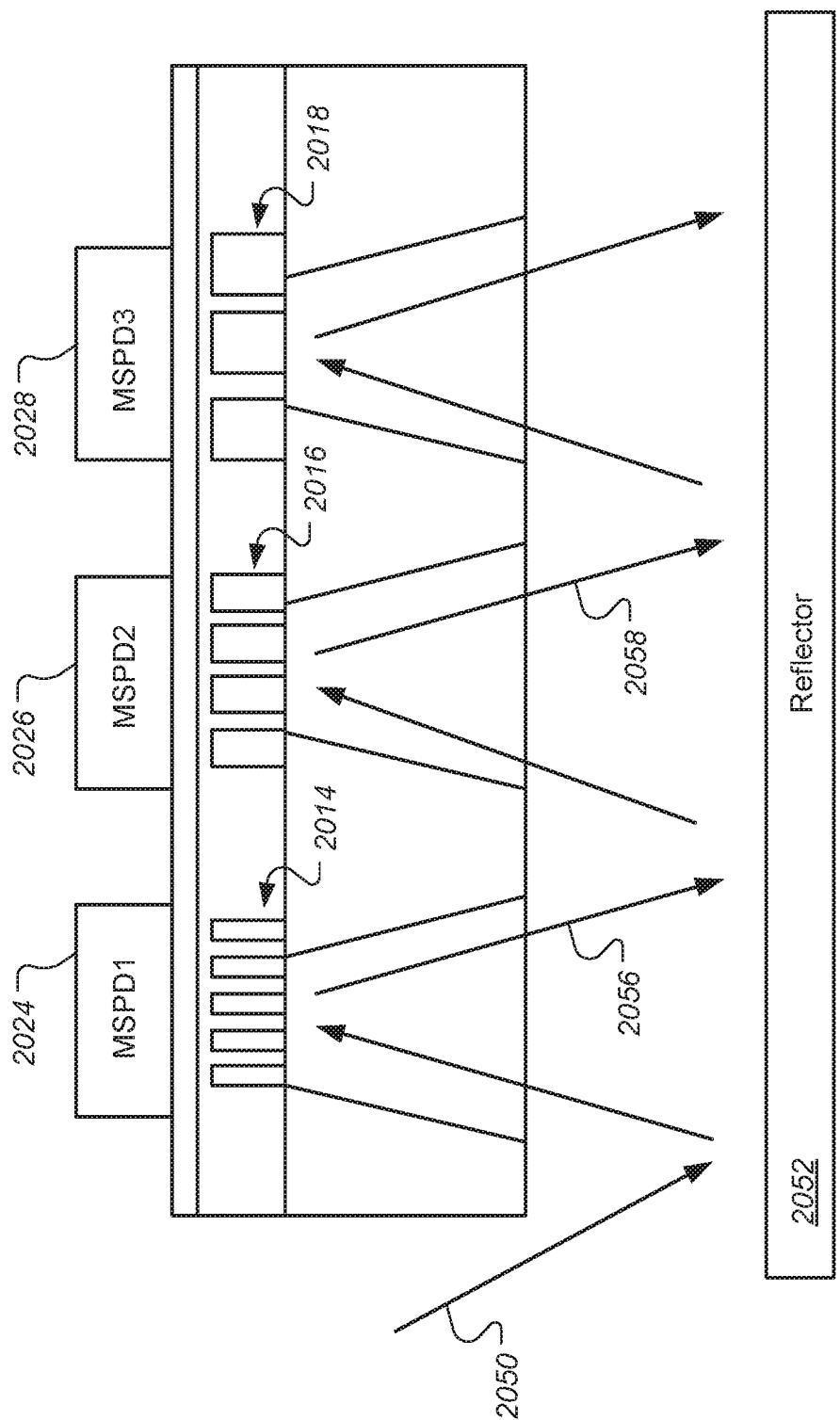
FIG. 20 is a cross sectional diagram showing several filters, each having a different passband for each of several MSPDs, according to some embodiments.

FIG. 20 is a cross sectional diagram showing several filters, each having a different passband for each of several MSPDs, according to some embodiments. Note that some or all of the MSPDs can also be MSAPDs. The MSPDs form an array where each MSPD1, MSPD2, MSPD3, . . . MSPDn has a bandpass filter with its own unique bandpass wavelength. Having a different bandpass wavelength for each of the MSPD in the array allows for the selection of specific wavelengths in a CWDM optical signal. One example is to bounce the incoming CWDM signal 2060 off a reflector 2052 and through the first bandpass filter 2014 and into MSPD1 2024. Bandpass filter 2014 is configured such that only a specific wavelength range is transmitted to MSPD1 2024 and the rest of the CWDM signal 2056 is reflected back toward the reflector 2052 where it is bounced into the second MSPD2 2026 and a specific wavelength range is selected for transmitting through the bandpass filter 2016 toward MSPD2 2026, the rest of the CWDM wavelengths 2058 are reflected back toward the reflector 2052 where it then bounce to the next MSPD in the array (MSPD3 2028, having its own bandpass filter 2018). For light impinging from the bottom though a via, the top surface of each MSPD that includes microstructured holes for absorption enhancement can be covered with a dielectric such as spin on glass followed by a metal layer to reflect light that propagates through the P-I-N structure and reflect back toward the microstructured holes for absorption enhancement.

Figure 21:
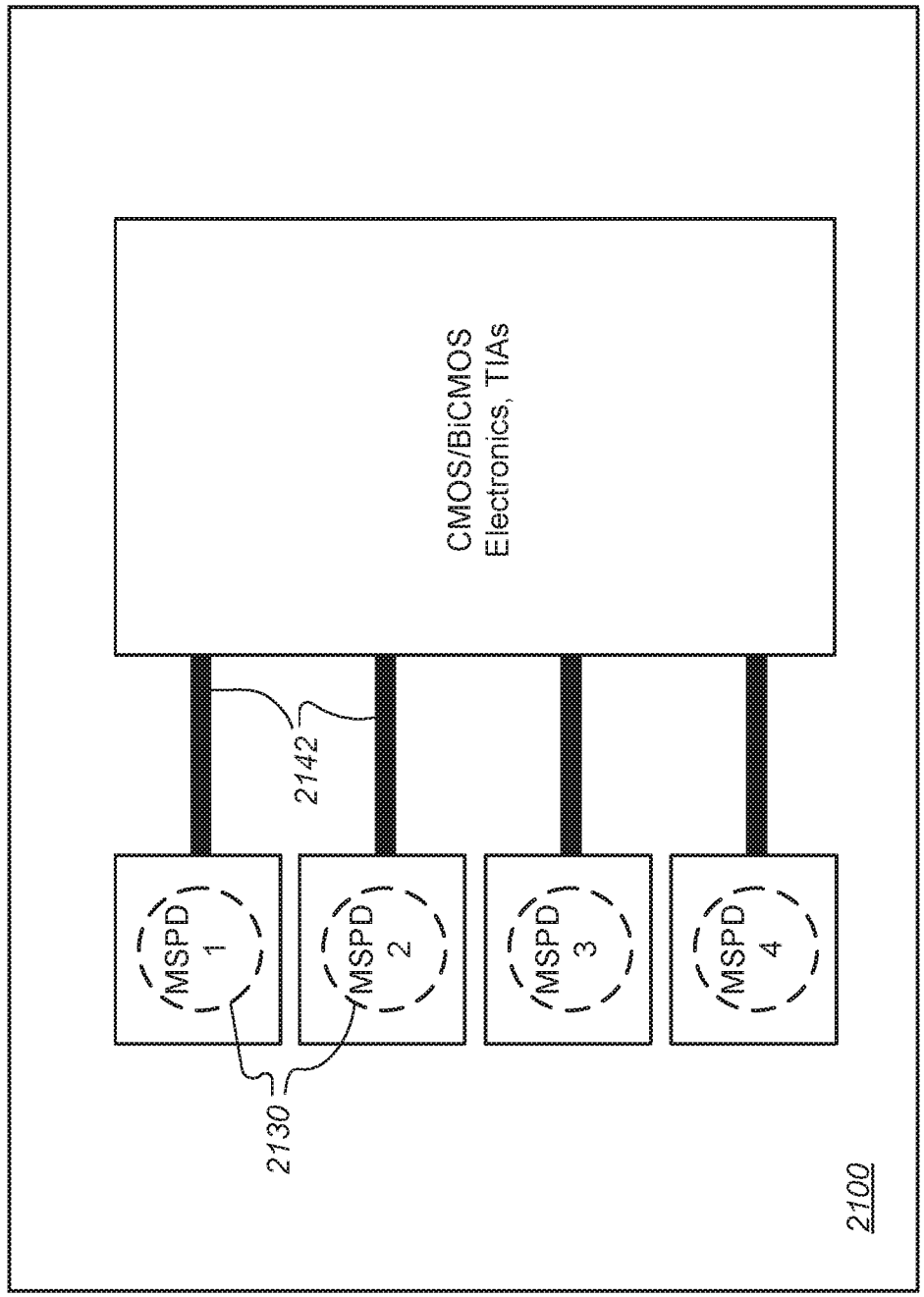
FIG. 21 is a simple schematic diagram showing MSPD/MSAPD arrays monolithically integrated with CMOS and/or BiCMOS electronics, according to some embodiments.

FIG. 21 is a simple schematic diagram showing MSPD/MSAPD arrays monolithically integrated with CMOS and/or BiCMOS electronics, according to some embodiments. The MSPDs/MSAPDs (MSPD1, MSPD2, MSPD3, MSPD4, etc.) are connected to the CMOS/BiCMOS electronics with a transmission line 2142. Directly below the MSPD/MSAPD are the bandpass filter grating/holes and via (dotted circle 2130) for allowing light to impinge on the bottom surface and/or to act as a light guide for optical fibers. Each MSPD/MSAPD can have a different bandpass filter that allows a specific wavelength span to be transmitted to the MSPD/MSAPD. The monolithically integrated chip 2100 can be flipped and the electronics can be solder bumped to external circuits such as on a printed circuit board (PCB) (not shown) for electrical signal transmission and electrical power. The monolithic integration also significantly reduces parasitic capacitance, inductance and resistances and can significantly improve the performance of the monolithically integrated optical receiver.

Figure 22A:
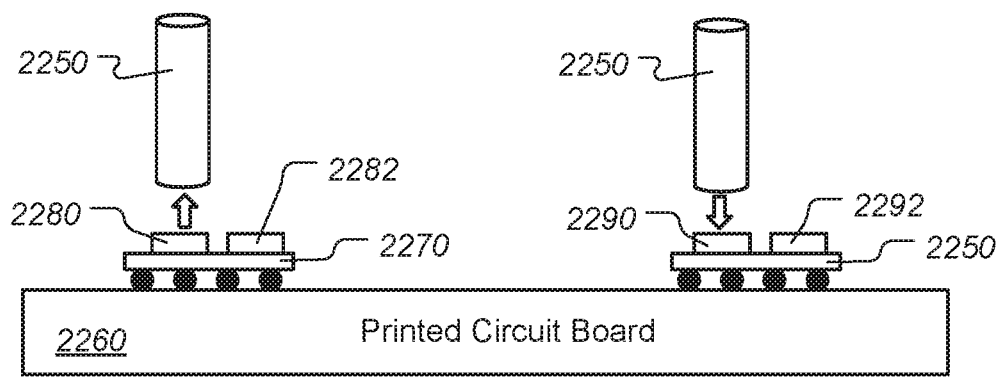
FIGS. 22A and 22B are diagrams illustrating cost savings from using a monolithically integrated MSPD(s)/MSAPD(s) with ASIC(s)
Figure 22B:
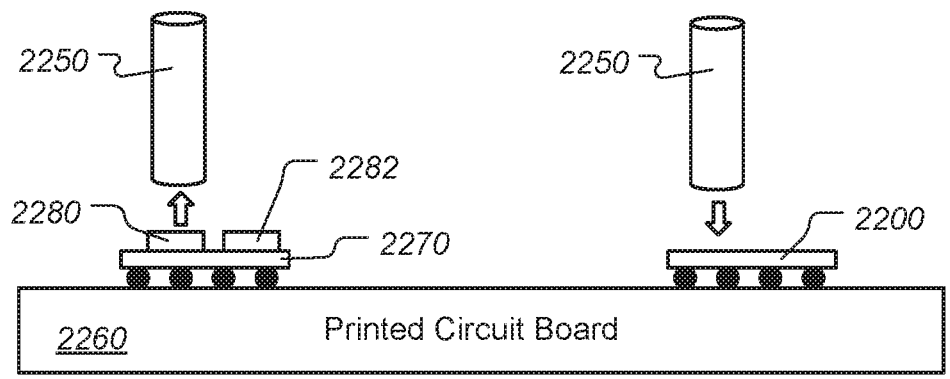

FIGS. 22A and 22B are diagrams illustrating cost savings from using a monolithically integrated MSPD(s)/MSAPD(s) with ASIC(s). FIG. 22A shows a conventional packaging arrangement used in short, medium and long reach optical data communication links. FIG. 22B shows a packaging arrangement according to some embodiments of this disclosure wherein an MSPD/MSAPD is monolithically integrated with ASIC(s) which can include TIA(s), signal processors, storage, transmission electronics, central processing units (CPU), pre amplifiers, amplifiers, etc. into a single silicon chip. In both FIGS. 22A and 22B the optical fiber 2250 (e.g MMF) received the optical signal from a VCSEL 2280. The VCSEL 2280 is mounted along with an LD driver 2282 to a multichip carrier 2270. The carrier 2270 in turn is mounted, for example using solder bumps, to a printed circuit board 2260. In FIG. 22A, the photodiode (PD) 2290 is separate from the ASIC 2292 such as TIA (transimpedance amplifier). The PD 2290 and TIA 2292 are each bonded to a substrate 2250, which in some cases is a ceramic multichip carrier, in some cases a glass substrate, and in some cases another silicon piece. FIG. 22B shows an arrangement according to some embodiments of this disclosure, where for short reach, medium reach and long reach optical data communication, the MSPD(s)/MSAPD(s) are monolithically integrated with ASIC(s) on a single silicon substrate 2200 thereby significantly reducing the cost of packaging and parts needed, in addition to improving performance of the optical receiver. See, e.g., Tekin, Review of Packaging of Optoelectronic, Photonic, and MEMS Components, IEEE JOURNAL OF SELECTED TOPICS IN QUANTUM ELECTRONICS, VOL. 17, NO. 3, May/June 2011 (incorporated herein by reference); and Doany et al, 300 Gb/s 24-Channel Bidirectional Si Carrier Transceiver Optochip for Board-Level Interconnects, 2008 Electronic Components and Technology Conference (incorporated herein by reference) which discusses cases where the PD and TIA are separate chips and need to be attached to a third common substrate.

Figure 23:
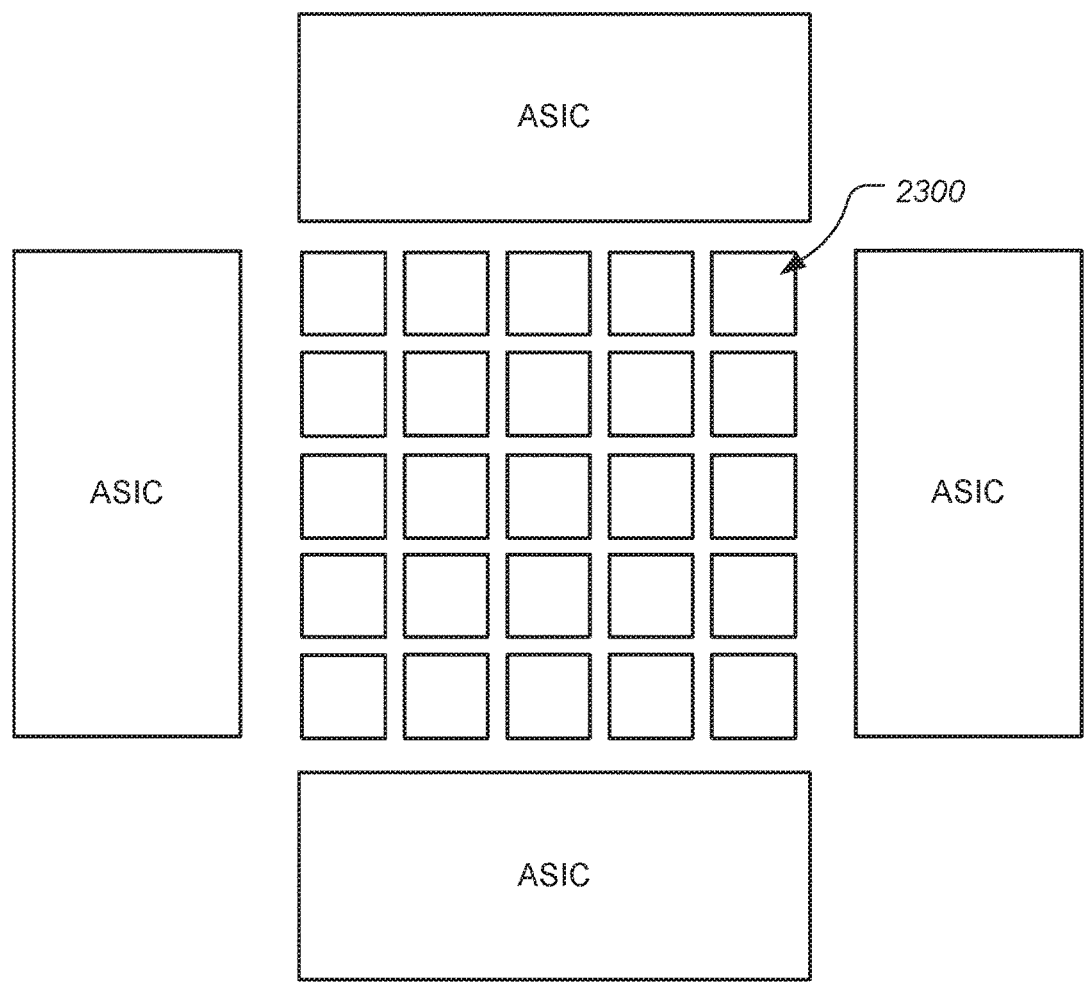
FIG. 23 is a simple schematic diagram showing MSPDs/MSAPDs in an array, according to some embodiments.

FIG. 23 is a simple schematic diagram showing MSPDs/MSAPDs in an array, according to some embodiments. Although FIG. 23 illustrates MSPDs/MSAPDs 2300 arranged in a two-dimensional array, in some cases they can be arranged in a one-dimensional array, and in some cases they can be arranged in a three-dimensional array. In all cases the MSPD/MSAPD in the array are monolithically integrated with ASIC(s). The transmission lines from the MSPD/MSAPD are not shown for simplicity. The array can be used for optical data communication. According to some embodiments, the array can be used for light distance and ranging (LIDAR) applications, such as for vehicles, robots, wheel chairs, drones, and/or smart canes for people with sight impairments. Silicon MSPDs/MSAPDs can be used in wavelength ranges from 780-990 nm, and GeSi MSPD/MSAPD can be used in wavelength ranges 850-1400 nm and longer depending on the Ge fraction in GeSi for the absorbing I layer. The two-dimensional array of MSPDs/MSAPDs can offer an imaging of the light bouncing back from an object or objects. See, e.g., Poulton et al, http://spectrum.ieee.orgtech-talk/semiconductorsoptoelectronicsimit-idar-on-a-chip (incorporated herein by reference); and Rasshofer et al, Influences of weather phenomena on automotive laser radar systems, Adv. Radio Sci., 9, 49-60, 2011 (incorporated herein by reference). Conventional Si PDs can reach 3 Gb/s in the near infrared wavelength ranges. For higher data rates, MSPDs/MSAPDs as described herein can be used. According to some embodiments, MSPDs/MSAPDs as described herein can provide data rates of 5, 10, 20, 25 Gb/s or more with QE better than 30% at near infrared wavelengths. The QE can be further improved using MSAPD for example.

In some cases, the array can be MSAPDs for LIDAR applications where the I or low doped layer for photon absorption and trapping can be GeSi where the Ge fraction can range from 0 to 1. The structure can be a PIPIN avalanche photodiode structure where the avalanche and/or gain can take place in a Si and/or GeSi I layer, as shown in multiple examples of MSAPDs throughout this disclosure. The data rate bandwidth can be less than a few Gb/s, in some cases less than 10 Gb/s, in some cases less than 25 Gb/s and in some cases less than 1 Gb/s. The addition of microstructure holes for photon trapping can reduce the overall thickness of the APD and can result in a reduction of the avalanche voltage which can be desirable in some applications, such as those requiring reliability in hostile environments. The photosensitive diameter or lateral dimension of each MSAPD can range from 100 microns to 1000 microns or more. In some cases the lateral dimension of the photosensitive area of a MSAPD in the array can range from 50 microns to 5000 microns. The monolithically integrated chip can have a dimensions such as: millimeters by millimeters; millimeters by centimeters; and centimeters by centimeters. The microstructure holes can be fully passivated to reduce any excess dark current and the MSAPDs can be entirely passivated for reliability. The I low doped layer for photon absorption and trapping can have a thickness ranging from 2 to 10 microns and can be tailored for the data rate bandwidth, responsivity or QE and avalanche voltage.

In some cases, three-dimensional arrays can be made by stacking two-dimensional arrays (such as shown in FIG. 23) on top of each other and where the top arrays are silicon for example and response to wavelengths from 700-1000 nm and the middle array can be GeSi responding to wavelengths from 1150-1350 nm and the bottom array can be Ge responding to wavelengths of 1400-2000 nm for example and where light impinge from the top surface and where the shorter wavelengths are absorbed first and the top array can be transparent to the longer wavelengths and allow it to pass through. This can be used in LIDAR and/or CWDM and other applications that may have large wavelengths spans. In this described example thee stacked 2D arrays can be provided. According to some embodiments, more than 3 may be possible with changes of Ge fraction in the GeSi alloy.

In FIGS. 21 and 23 the array of MSPDs/MSAPDs can also include bandpass filters such that specific wavelengths can be addressed to each MSPD/MSAPD and is some cases groups of MSPDs/MSAPDs can have specific bandpass filters. By using color filters and single and/or multiple arrays of MSPDs/MSAPDs, single and/or multiple wavelength imaging LIDAR can be provided for further image processing and enhancement for example to remove background noise and interference.

In LIDAR applications, the array of microstructured photodetectors (MS-PD) can be microstructured avalanched photodiodes (MSAPD) and where the photosensitive area of the MSAPD can be larger than for a high speed MSAPD for data communications. For LIDAR, the diagonal, assume a square photosensitive region, can range from 50 to 500 micrometers and the thickness of the I layer where photogenerated carriers are swept out due to the high electric field, can range from 500 nm to 5000 nm and in some cases from 500 nm to 2000 nm and in some cases from 500 nm to 1200 nm. LIDAR time resolution can range from 100 ps to nanoseconds. MSAPD allow the layers to be thin and therefore the avalanche voltage can be lower. See e.g., Youn et al, 10-Gb/s 850-nm CMOS OEIC Receiver with a Silicon Avalanche Photodetector, IEEE JOURNAL OF QUANTUM ELECTRONICS, VOL. 48, NO. 2, February 2012 (incorporated herein by reference and referred to herein and 'Youn et al'), which shows less than 11V reverse bias and Kang et al, Epitaxially-grown Ge/Si avalanche photodiodes for 1.3 μm light detection, 23 Jun. 2008/Vol. 16, No. 13/OPTICS EXPRESS 9366 (incorporated herein by reference and referred there herein as "Kang et al 2008"), which shows an approximately −27V reverse bias. With MSAPDs, the mircrostructure holes allowing photon trapping can have thinner layers and therefore lower reverse bias voltage which is desirable in system applications. Reverse bias voltages in the range −6 to −25 volts for MSAPD can be developed and integrated with CMOS/BiCMOS electronics for signal and/or image processing. By timing the time of flight for photons pulses from a vertical cavity surface emitting laser (VCSEL) array at wavelengths that can range from 780 nm to 1350 nm and in some cases 850 nm to 980 nm and the time the MSPD and/or MSAPD receives the signal, the distance and/or the image such as the shape of the object reflecting the laser pulses can be determined. For LIDAR applications, sensitivity of the photodetector is important as well as voltage for system reliability, and MSPD and/or MSAPD can be used. As will be described infra, microstructure optical waveguide photodiode and/or avalanche photodiode (MSOWPD/MSOWAPD) may also be used for this application.

Figure 24:
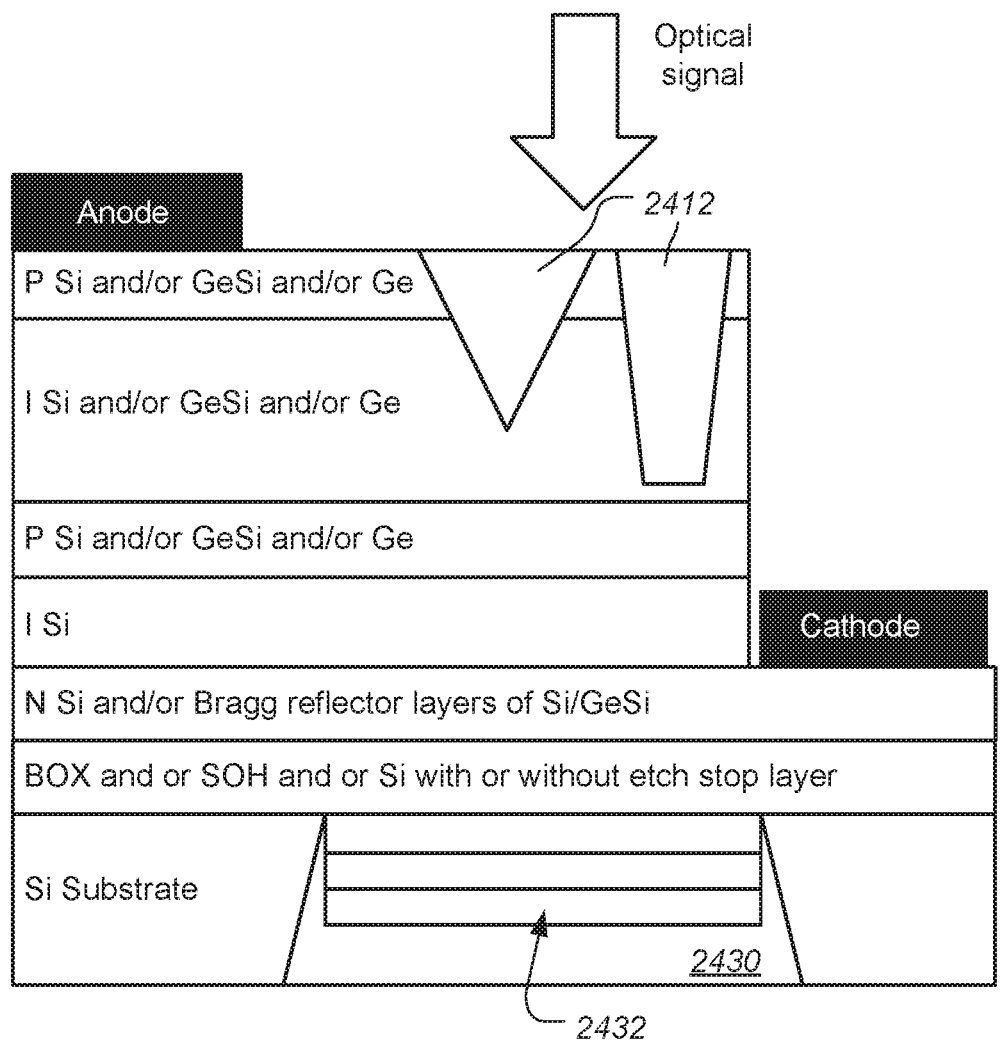
FIGS. 24 and 25 are schematic cross section views of a MSAPD with holes that can have various shapes, according to some embodiments.
Figure 25:
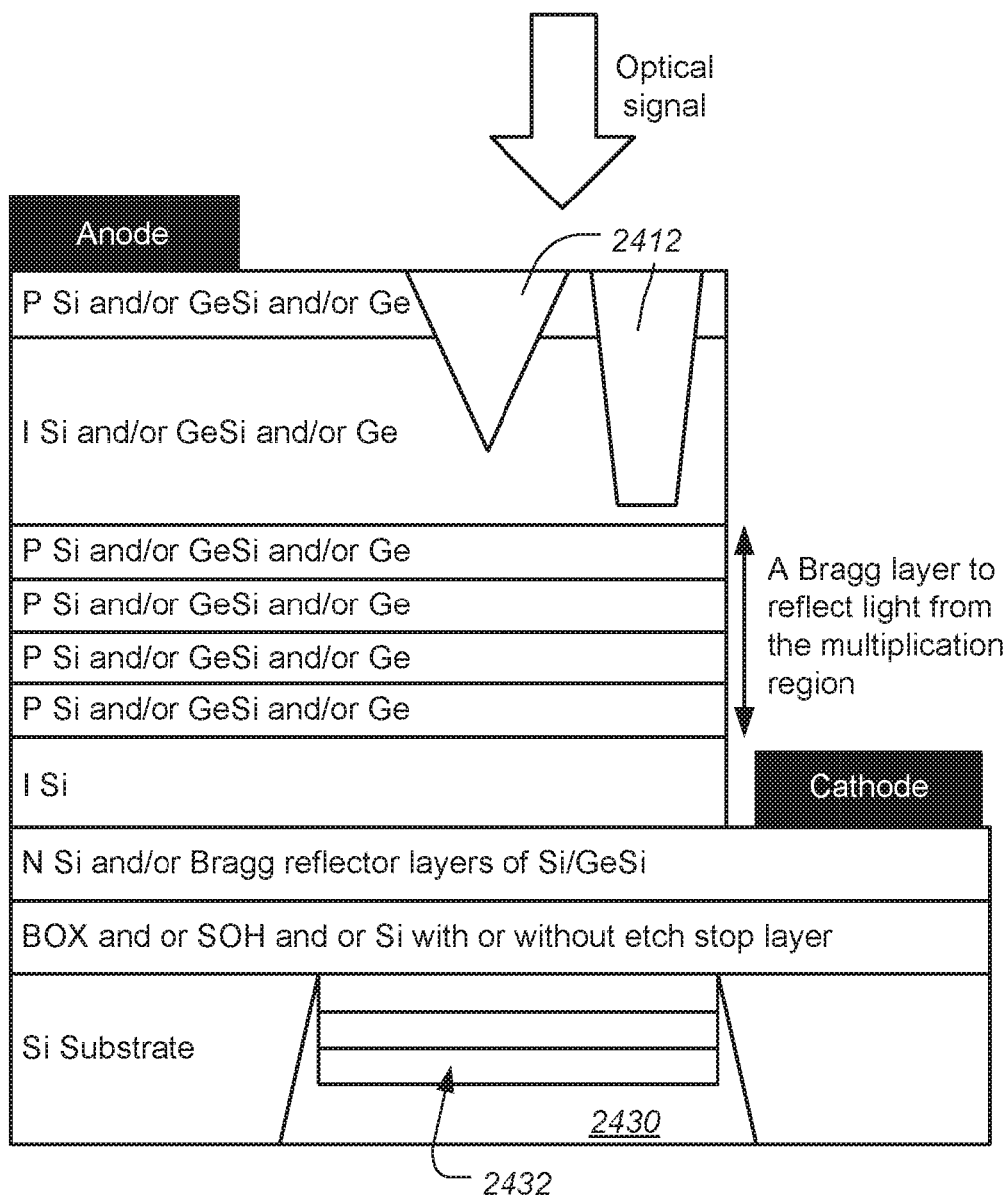

FIGS. 24 and 25 are schematic cross section views of a MSAPD with holes that can have various shape, according to some embodiments. Microstructure holes 2412 in general can have any shape, and in some cases are pyramidal, funnel shaped, cylindrical, polygonal, and/or a combination of shapes. Various fabrication techniques can be used alone or in combination including: wet etching; dry etching; ion milling; and other ways of removing semiconductor and/or non semiconductor material. Starting with a silicon substrate that can have a buried oxide (BOX) layer and/or buried hole layer (SOH silicon on hole), and/or with or without an etch stop layer and/or the device layer of the SOI can be N and/or P on which cathode N layer is grown with doping concentration ranging from $5 \times 10^{18}$ to $2 \times 10^{20}/cm^3$ and thickness ranging from 50 nm to 500 nm; the multiplication Si layer is grown with doping concentration ranging from $1 \times 10^{15}$ to $2 \times 10^{18}/cm^3$ and thickness ranging from 200 nm to 800 nm and in some cases the multiplication layer can be $Ge_xSi_{1-x}$ where the Ge alloy fraction x can range from less than 1% to 10% or more, followed by a charge layer that can be Si and/or GeSi where the Ge alloy fraction can range from less than 1% to 10% or more and is grown with p-type doping concentration ranging from $8 \times 10^{16}$ to $5 \times 10^{17}/cm^3$ and thickness ranging from 50 nm to 200 nm; followed by an I (intrinsic and/or not intentionally doped) high field layer where photons absorbed in this region contribute the bulk of the high speed response of the MSAPD to an optical signal, in some cases also called the absorption layer (even though other layers may also absorb photons but have less contribution to the high speed response of the MSAPD to an optical signal), that can be Si and/or GeSi with the Ge alloy fraction ranging from less than 1% to 100% (all Ge) and is grown with doping concentration ranging from $5 \times 10^{13}$ to $6 \times 10^{15}/cm^3$ and thickness ranging from 500 nm to 5000 nm; followed by the anode P layer which can be Si and/or GeSi where the Ge alloy fraction can range from less than 1% to 100% and is grown with doping concentration ranging from $5 \times 10^{19}$ to $5 \times 10^{20}/cm^3$ and thickness ranging from 50 nm to 500 nm and in some cases 10 nm to 10000 nm; and in some cases a thin metal such as Ag, Au, Pt, Ni, Cr, Al, Zr, and/or metal alloys and/or silicide such as AlSi, NiSi to name a few and/or transparent metal oxide such as indium tin oxide and/or any combination of metal, transparent metal oxide, silicide and/or other conducting transparent semitransparent to the optical signal material may be used on the surface of the P anode layer to further reduce sheet resistance of the anode layer. Thickness of such layers can range from 5 nm to 500 nm.

Holes 2412 can have diameters and/or a significant dimension such as a diagonal, ranging from 100 nm to 5000 nm and in some cases ranging from 500 nm to 2500 nm and in some cases ranging from 600 nm to 1500 nm, the hole depth can range from 300 nm to 5000 nm or deeper and in some cases can be partially in the I layer and in some cases to the P charge layer and in some cases partially into the multiplication layer and in some cases to the N cathode layer and in some cases partially into the N cathode layer and in some case through the N cathode layer. A backside via 2430 can be etched to remove the substrate to the oxide layer and/or to the etch stop layer and/or to the N layer which can also be a Si/GeSi Bragg layer. A coating of metal, transparent conducting metal oxide, can be applied to reduce the sheet resistance and in addition a dielectric Bragg reflector and/or dielectric 2432 can be applied to further enhance absorption by reflecting stray light. In addition the Bragg dielectric stack 2432 can be a bandpass filter to allow only certain wavelengths of light to pass through for certain applications where wavelength selective detection is desired such as CWDM and/or bi directional free space optical communication.

Operational wavelengths for all Si layers can range from 780 nm to 980 nm and in some cases from 820 nm to 880 nm and in some cases from 820 nm to 950 nm and in some cases from 840 nm to 980 nm with quantum efficiencies better or equal to 20% and/or with responsivity better or equal to 0.1 A/W (amp per watt). In some cases the quantum efficiency can be better than and/or equal to 50% at at least one wavelength in the wavelength range of 800 nm to 980 nm.

With the addition of Ge in the I layer to form GeSi alloy, with the Ge alloy fraction ranging from a few percent to tens of percent, the wavelength can be extended beyond 1000 nm and in some cases to 1300 nm and in some cases to 1450 nm with high Ge alloy percentages. QE can be 50% or better at at least one wavelength in the range 980 nm to 1300 nm and in some cases in the range 980 nm to 1450 nm. In some cases the QE can be 30% or better in at least one wavelength in the wavelength range 980 nm to 1450 nm.

Metal ohmics and metal electrodes are applied to the anode and cathode layers and a reverse bias voltage ranging from −15 to −45 volts can be applied to the anode and cathode. Light can impinge from the top surface and/or from the bottom surface. Gain bandwidth product of the MSAPD can range from 10 Gb/s to 100 Gb/s or more and in some cases can range from 20 Gb/s to 200 Gb/s or more and in some cases from 100 Gb/s to 300 Gb/s or more.

The MSPD and MSAPD can be thought of as lossy high contrast gratings with Q ranging from 2 to 1000 as compared to a silicon high contrast grating operating at wavelengths less than the silicon bandgap, and the Q can be as high as one million. In some cases, the smoothness of the side wall of the microstructured holes may be important to achieve Q greater than 20 for example to Q of 100 that can increase the effective optical path in the I layer by 40 to 200 times.

In addition, metal nanoparticles and/or III-V quantum dots added to the holes, and/or on the surface of the holes, can further assist in the absorption of photons. In some cases, a via may not be implemented.

FIG. 25 is similar to FIG. 24 except with the addition of a Bragg reflector region at the charge layer of Si/GeSi layers that can be one or multiple periods to reflect partially and/or entirely optical signals that are transmitted through the I layer to further enhance the absorption. The design of the Bragg layer is well known in prior art and consist of quarter wavelength thickness layers ranging from 60-90 nm in thickness per layer at near infrared wavelengths. For example one period Bragg reflector at 980 nm wavelength can be approximately 140 nm thick. In some cases a via may not be required.

Figure 26:
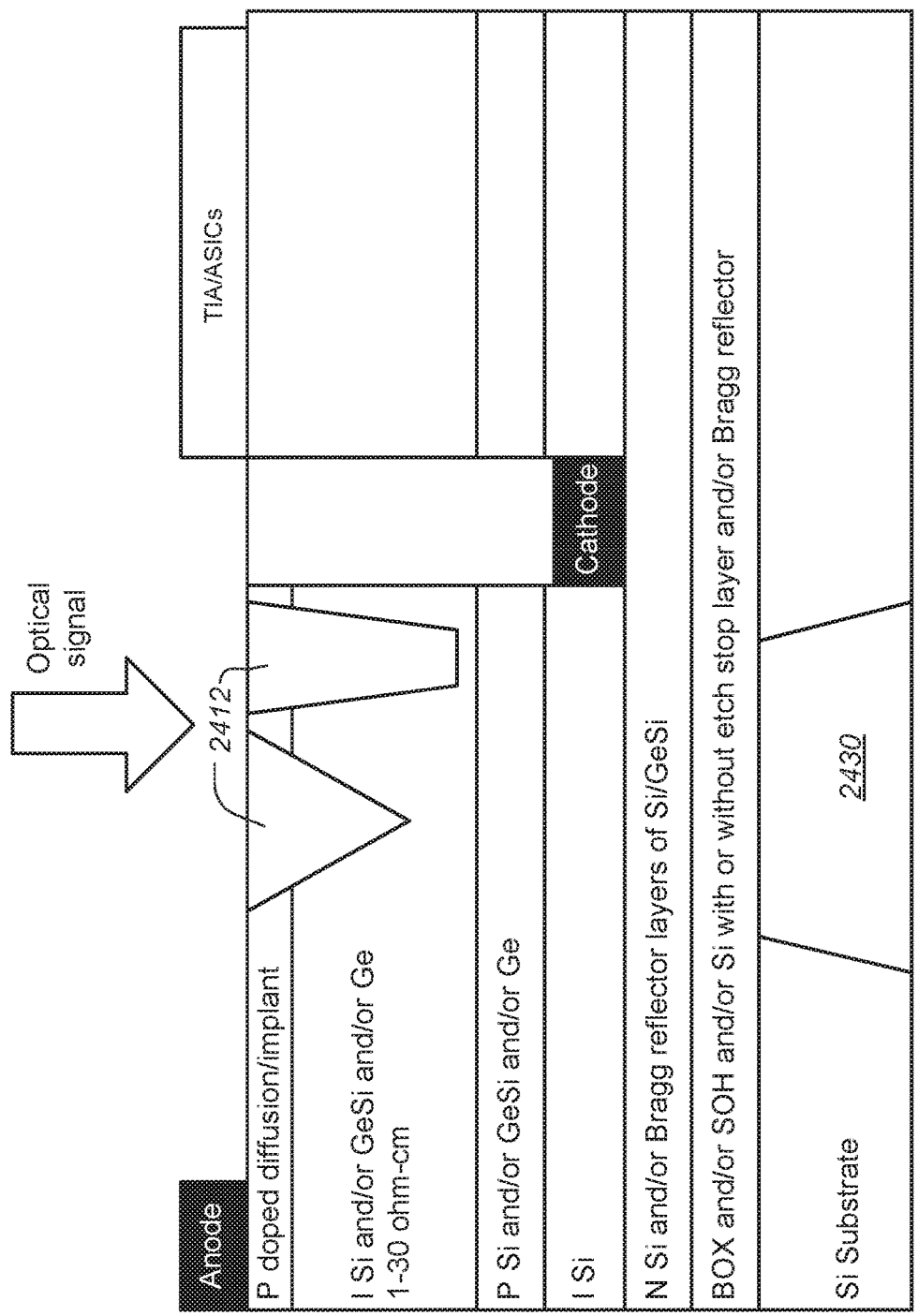
FIG. 26 is schematic diagram illustrating integration of the MSAPD structure in FIG. 24 with CMOS and/or BiCMOS electronics, according to some embodiments.

FIG. 26 is schematic diagram illustrating integration of the MSAPD structure in FIG. 24 with CMOS and/or BiC-MOS electronics, according to some embodiments. Other possible configurations are also possible and this is just one example. The MSAPD layers are grown first followed by the CMOS and/or BiCMOS layer(s) if any. Not shown in FIG. 26, the anode and cathode of the MSAPD are connected to the electronics circuits and bias circuits of the ASIC CMOS and/or BiCMOS electronics for signal processing, equalization, conditioning, amplification and transmission. The integration of the MSAPD can be a single device and/or an array of MSAPD with a single ASIC and/or an array of ASIC and in some cases, the MSAPD can have bandpass filters for example in the photonic crystal holes in the substrate that can select certain wavelengths of light to convert to electron hole pairs for high speed detection. In the case of integration with CMOS/BiCMOS electronics, the I layer can be low doped and/or undoped with resistivity in the neighborhood of 1-30 ohm-cm or more, and thicknesses ranging from 0.5 to 5 micrometers and in some cases 0.5-2 micrometers and in some cases about 1 micrometer. A P well can be formed on the top I layer by diffusion and/or ion implantation of P type ions such as boron to a thickness ranging from 100 nm to 500 nm and in some cases 100 nm to 300 nm with a resistivity in the neighborhood of 0.01 to 0.001 ohm-cm or less. In some cases a transparent conducting metal oxide such as indium tin oxide and/or a thin metal layer of less than 5 nm thick such as platinum can be used on the P doped top surface to reduce the series resistance. CMOS/BiCMOS electronics can be formed on the top I layer with proper P and N wells, dielectrics and metal interconnects as in Swoboda et al, 11 Gb/s Monolithically Integrated Silicon Optical Receiver for 850 nm Wavelength, 006 IEEE International Solid-State Circuits Conference (incorporated herein by reference and referred to herein as "Swoboda"). In some cases a via 2430 may not be implemented.

Figure 27:
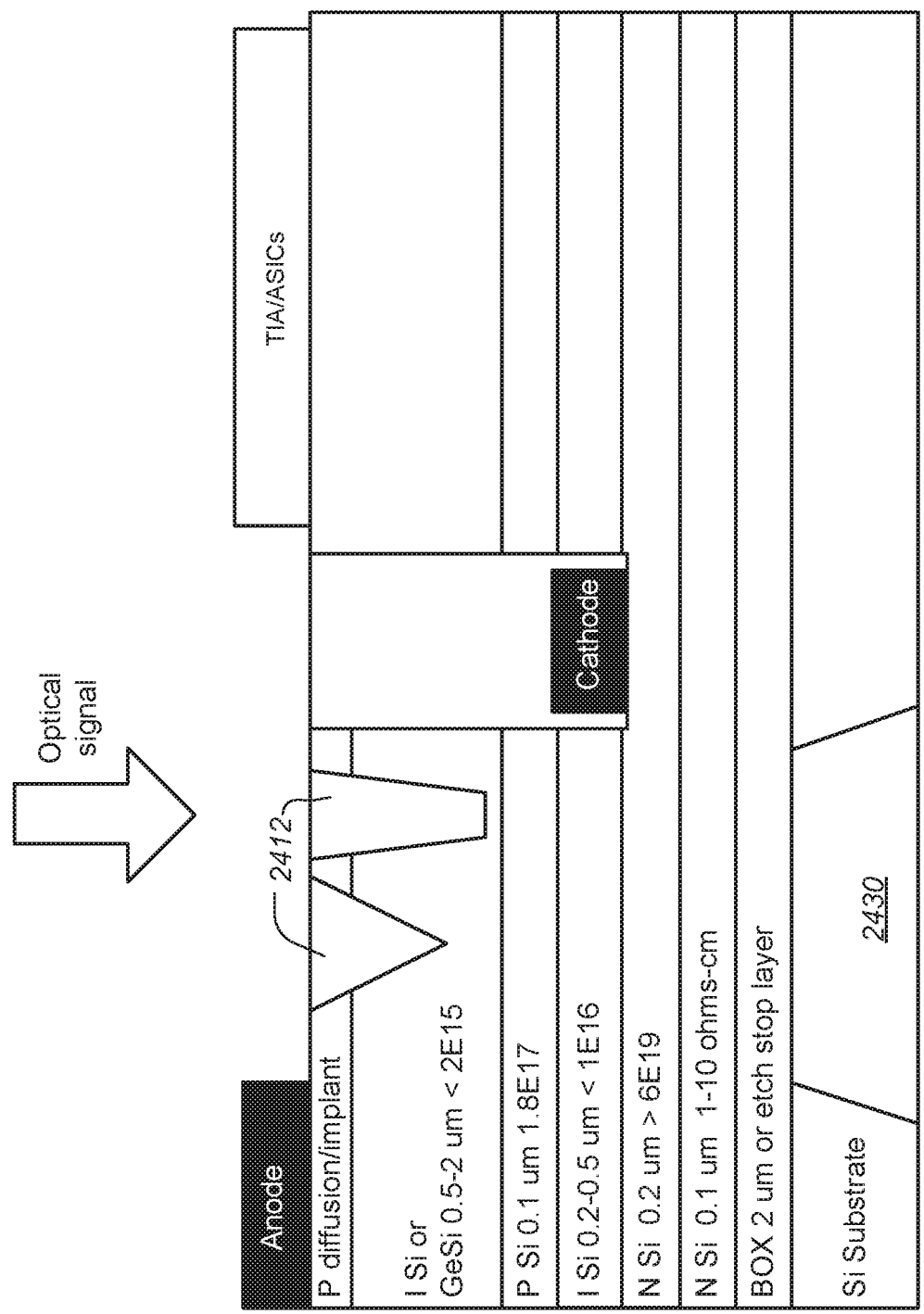
FIG. 27 is schematic diagram illustrating integration of the MSAPD structure in FIG. 24 with CMOS and/or BiCMOS electronics, according to some other embodiments.

FIG. 27 is schematic diagram illustrating integration of the MSAPD structure in FIG. 24 with CMOS and/or BiCMOS electronics, according to some other embodiments. FIG. 27 is similar to FIG. 24 except only the I layer is GeSi or Si and all other layers are Si. In the case of GeSi I layer, the P is doped by diffusion and/or ion implantation into the I layer as in FIG. 26, the N layer can be Si and is less absorbing to incident photons for example in the 950-980 nm range and the GeSi I layer can be more absorbing. Such double heterojunction is conducive to improving the QE of the MSAPD (MSPD) and can reduce the diffusion of photogenerated carriers in the P and N region which can result in a slower response time for the MSAPD/MSPD. Doping and thickness ranges are similar to those in FIG. 24 except for the surface P doped region into the I layer. An example of integration of the MSAPD with CMOS and/or BiCMOS electronics can be seen showing only the basic layers. CMOS and/or BiCMOS layers and/or P and N wells can be formed directly on the I layer and/or can be grown on top of the I layer. The CMOS and/or BiCMOS electronics can be fabricated first together with any concurrent or similar steps such as diffusion and/or doping for the MSAPD/MSPS. This can be followed by forming the MSAPD (MSPD) microstructure holes and the anode and cathode of the MSAPD connected by a transmission line to the electronics and biasing circuits. Reverse bias voltage can range from −6 to −26 volts. Optical signal can impinge either from the top or bottom surface. Metal, transparent conducting metal oxides can be used on the P and N surfaces to reduce sheet resistance. In addition metal and/or dielectric mirrors such as Bragg reflectors can be used on the bottom surface after a via to further enhance the QE of the MSAPD/MSPD. Only the very basic elements are shown for simplicity, passivation, planarization, and many other processing steps and elements are not shown. In some cases, via 2430 may not be implemented.

FIG. 28 is a table showing experimental measurements of a MSPD with approximately 1000 nm thick I layer, 200 nm N layer and approximately 1500 nm P layer on 2000 nm BOX on silicon substrate, according to some embodiments. The funnel hole structure and spacing is similar to those shown in FIG. 10. The responsivity range from 0.4 A/W to 0.1 A/W in the wavelength range from 800 nm to 1000 nm. In the KOH only etched holes, the holes are rectangular inverted pyramids. The MSPD have over 10× higher responsivity than a similar photodiode without microstructures to enhance the absorption and therefore the quantum efficiency.

Figure 29:
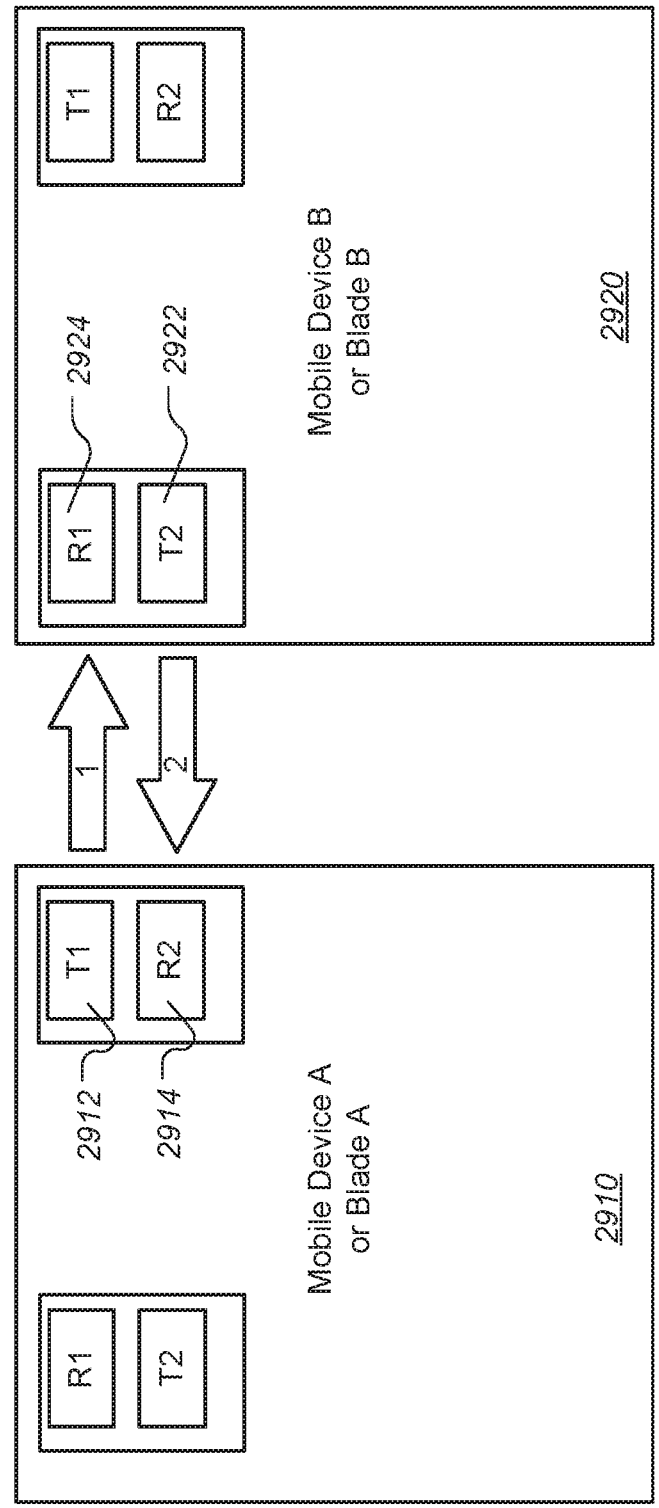
FIG. 29 is a schematic drawing of a vertical cavity surface emitting laser (VCSEL) being used together with a MSPD/MSAPD that is monolithically integrated with ASIC CMOS and/or BiCMOS electronics for close proximity free space optical data link, according to some embodiments.

FIG. 29 is a schematic drawing of a vertical cavity surface emitting laser (VCSEL) being used together with a MSPD/MSAPD that is monolithically integrated with ASIC CMOS and/or BiCMOS electronics for close proximity free space optical data link, according to some embodiments. Device A 2910 includes an optical transmitter 2912 at wavelength 1 and an optical receiver 2914 at wavelength 2. Device B 2920 includes an optical transmitter 2922 and an optical receiver 2924. The two devices 2910 and 2920 can transfer data to each other using the two wavelengths 1 and 2 as shown. The close proximity free space (i.e. no optical cable) link can be used for example with: mobile devices such as tablets, laptops, and smartphones; home entertainment boxes; home security boxes; secure payment at stores; and devices to secure bank transactions. Since the laser light can diverge quickly over short distances, for example less than one meter and in some cases less than 10 centimeters, and in some cases less than 2 centimeters, the communication between devices can be very secure and not picked up by unintended recipients. An example of the close proximity optical link is shown, where the transmitter and receiver can be paired with a certain wavelength in one direction and another wavelength in the opposite direction to minimize cross talk. According to some embodiments, each mobile device can have multiple ports such that it can multitask several transfers of data simultaneously from multiple devices. Data rates can range from 1 Gb/s to 25 Gb/s or more and in some cases can range from 6 Gb/s to 30 Gb/s or more.

Safety features can include low power pinging to see if a recipient receiver is nearby in close proximity before increasing the laser power for high data rate low error transfers.

Other applications can include blade-to-blade free space optical communication in close proximity with multiple high-speed ports at 25 Gb/s and greater and in some cases at 50 Gb/s or greater. The optical transceiver ports can be located on any surface of the blade or mobile device and/or can be attached to an umbilical cord that can be magnetically coupled to another transceiver to complete the optical data link. Arrays of optical ports can be implemented on blades and/or mobile and non mobile devices to increase the aggregated data rates to greater than 40 Gb/s and in some cases greater than 100 Gb/s and in some cases greater than 1 Tb/s. Multiple wavelengths can be used in such arrays to avoid cross talks; wavelengths such as 780, 800, 820, 840, 860, 880, 900, 920, 940, 960, 980, 1000 nm for example and any other wavelengths in between and beyond the ranges given.

In some cases, RF and microwave frequencies can be used for proximity data transmission. In many prior art proximity RF data links, the RF field is propagating and can be detected by unintended recipients thereby compromising security. Instead of propagating RF or microwave fields, evanescent RF and/or microwave field should be used such that the field is not propagating and can only be transmitted by a close proximity receiver that can couple the evanescent field to the receiver. An example of evanescent RF/microwave field is the use of metamaterial such a RF/microwave superlens where the RF/microwave after the superlens is a near field or evanescent field and decays rapidly over a wavelength distance approximately and can couple to another superlens that is in close proximity of about one wavelength distance and can be detected. Other elements may be also used to detect the evanescent wave such as a microwave coupler.

Figure 30:
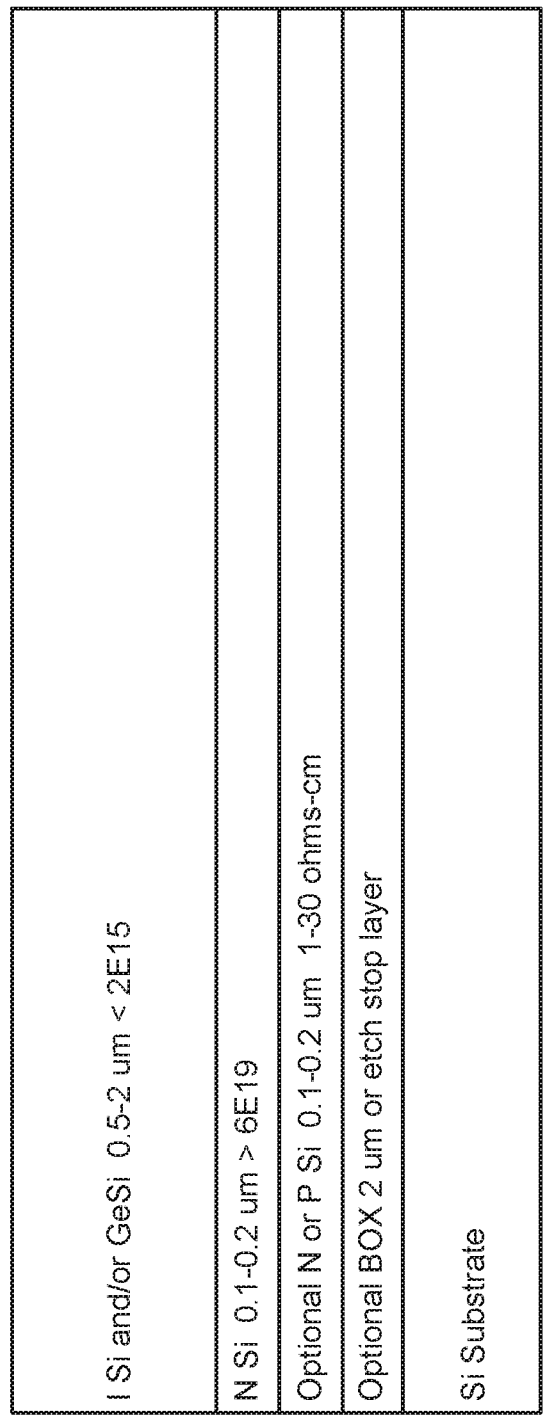
FIG. 30 is a cross section view of a basic epitaxial layer structure for monolithic integration of a MSPD with ASICs such as a TIA, according to some embodiments.

FIG. 30 is a cross section view of a basic epitaxial layer structure for monolithic integration of a MSPD with ASICs such as a TIA, according to some embodiments. The layers can be grown on a silicon substrate N or P type, and/or a SOI (silicon on insulator) with a buried oxide (BOX) layer and/or with an etch stop layer and/or with buried holes. If SOI is used, the device layer can be P or N with any resistivity and with a layer thickness ranging from 0.05-0.3 micrometers (micron, um). An N layer (N and P can be interchanged, PIN can also be NIP for different applications and/or fabrication requirements) of Si and/or GeSi where the Ge fraction can range from 0.001 to 0.6 has a thickness ranging from 0.05-0.5 microns and in some cases 0.05 to 0.3 microns (micrometers) and in some cases 0.1 to 0.2 microns, and a doping (xEy is the same as x $10^y$ dopants/cm$^3$) of greater than 3E19 and in some cases greater than 6E19 or a resistivity in the range of 0.005 to 0.001 ohm-cm or less. An I Si and/or GeSi layer where the Ge fraction can range from 0.001 to 1, has a thickness ranging from 0.5 to 5 microns and in some cases 0.5 to 2 micrometers and in some cases approximately 1 micrometer. Doping of the I layer is less than 2E15 and/or a resistivity in the neighborhood of 1-30 ohm-cm or greater. The I layer may not be intentionally doped and can have very low P or N doping. In some cases ion implantation during the CMOS integration process and/ or diffusion process can form a P$^+$ region on the surface of the I layer with resistivity in the neighborhood of 0.01-0.001 ohm-cm or less and with a thickness ranging from 50 nm to 500 nm and in some cases 50 nm to 300 nm and in some cases 200 nm. In addition, a Schottky contact and/or ohmic contact with semi transparent metal such as Pt, Al, Cu, Au, Ni, of 50 nm or less thickness and in some cases 10 nm or less, and/or transparent conducting metal oxide such as indium tin oxide (ITO) can be used to further reduce the sheet resistance of the P$^+$ layer which can have microstructured holes. In some cases a very thin P layer of 0.05 microns or less can be used and fortified with ITO to reduce the sheet resistance.

CMOS and/or BiCMOS layer(s) in some cases may be grown on the I layer and if it is not compatible with MSPD/MSAPD processing, the layer(s) can be selectively etched off prior to MSPD/MSAPD processing.

According to some embodiments, many variations to the structure shown in FIG. 30 are possible such as addition of buffer layers, low temperature Ge layers, polysilicon layers, other heterogeneous layers such as GaP, InP, GaAs, InN, GaN, AlN, and AlP.

Figure 31:
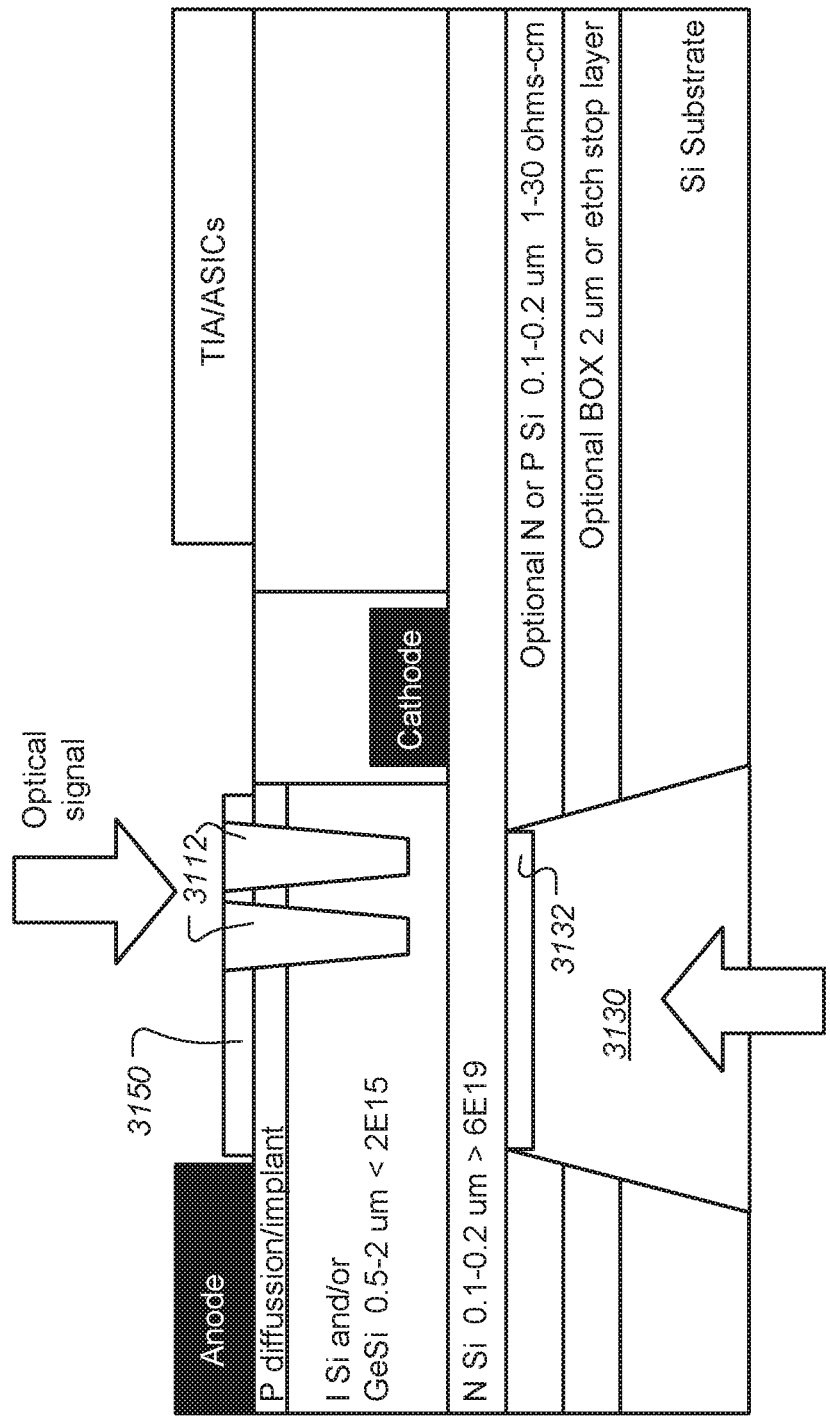
FIG. 31 is a cross section view showing some aspects of a MSPD integrated with CMOS/BiCMOS ASICs, according to some embodiments.

FIG. 31 is a cross section view showing some aspects of a MSPD integrated with CMOS/BiCMOS ASICs, according to some embodiments. The CMOS/BiCMOS ASICs can include one or more of the following: TIAs; clock data recovery (CDR) circuitry; equalizers; and limiting amplifiers (LA), as some examples. Additional epitaxial layers can be used for the integration of the ASICs can be formed directly on the I layer with P and N wells as discussed in Swoboda. The CMOS and/or BiCMOS ASICs can be first fabricated and some of the steps such as diffusion, ion implantation, and thermal annealing can be grouped together for the MSPD (or MSAPD) processing steps. Ion implantation can be applied to both the ASICs and the MSPD if needed and can be activated together for example. In general, the ASICs can be first fabricated, with some processing steps that can be shared with the MSPD/MSAPD, followed by MSPD microstructure hole etching, wet and/or dry, mesa etching if needed to the cathode N layer and passivation. Anode and cathode ohmics and transmission lines connecting the MSPD to the TIA can be formed after an air bridging, if needed, and/or other insulating step where the transmission lines do not add to extra parasitic capacitance and/or resistances and/or inductances. Mesa diameters can range from 10 to 1000 microns, and in some cases from 20 to 80 microns. Other form of defining the photosensitive area can be disordering of the semiconductor, pn junction isolation, selective P and N junctions on the surface of the I layer, for example. However mesa can have the lowest fringing capacitance. Passivation to the mesa and microstructure holes can be applied to reduce surface recombination.

The P surface well, for the P-I-N photodetector can be formed by diffusion and/or by ion implantation of P type ions such as boron for example, to a thickness ranging from 50 nm to 500 nm and in some cases 50 nm to 300 nm with a resistivity ranging from 0.01 to 0.001 ohm-cm or less, and in some cases semitransparent metal film such as Pt, Ag, Au, Cu, Ni, or V can be deposited on the surface of the P shallow well prior to hole etch. Thickness of the metal can range from 1 nm to 50 nm. In some cases transparent conducting metal oxide can be used such as indium tin oxide.

The diameter or diagonal of holes 3112 can range from 200 to 3000 nm and in some cases from 400 to 2500 nm and in some cases from 600 to 1800 nm. Holes 3112 can have same and/or different diameters. Spacing of the holes can range from 10 to 5000 nm and in some cases 10 to 2000 nm and in some cases 10 to 1000 nm and in some cases at least one point of the hole touches the adjacent hole. Holes 3112 can be periodic or aperiodic. The pattern can be periodic in groups of holes while being aperiodic within the group. Holes 3112 can be shaped as a funnel, inverted pyramid, cylindrical, hourglass, rectangular, polygonal, amoebic, and/or other shapes. The sidewalls can be smooth and/or textured. The holes 3112 can be etched to a depth ranging from 0.2 to 5 microns, and in some cases partially into the I layer and in some cases through the I layer and in some cases to and/or into the N (orP) layer and in some cases through the N (or) layer.

Transparent and/or semi transparent metal and/or transparent conducting metal oxide 3150, such as ITO can be used on the P and N layer to reduce the sheet resistance as shown in FIG. 31.

A via 3130 can be etched through the substrate to the BOX and/or etch stop layer and/or to the N cathode layer such that a metal and/or ITO and/or dielectric layer(s) 3132 can be deposited to reduce the sheet resistance and/or to reflect optical signal back toward the microstructure region for further absorption enhancements. The bottom N layer can be textured and/or with microstructure holes.

Tavemier et al, Power Efficient 4.5 Gbit/s Optical Receiver in 130 nm CMOS with Integrated Photodiode; Solid-State Circuits Conference, 2008. ESSCIRC 2008. 34th European (incorporated herein by reference and referred to herein as "Tavemier 2008") discusses a silicon photodiode integrated with CMOS electronics. The stand alone silicon photodiode has reported bandwidth of 500 MHz and responsivity of 5 mA/W at 850 nm. With integration to a TIA, the bandwidth improved to 4.5 Gb/s and responsivity improved to 74 mA/W. Monolithic integration can significantly improve the performance of a stand alone MSPD or MSAPD.

CMOS Manufacturing Process, EE141 UCBerkeley, http://bwrcs.eecs.berkeley.edu/Classes/icdesign/ee141_s02/Lectures/Lecture5-Manufacturing.pdf (incorporated herein by reference) discusses basic processes for CMOS process which are compatible with MSPD/MSAPD processes.

Data rates can range from 3 to 100 Gb/s or more; operating wavelength range for all silicon layers can range from 800-1000 nm with responsivity greater than or equal to 100 mA/W and in some cases greater than or equal to 300 mA/W and in some cases greater than or equal to 600 mA/W and in some cases greater than or equal to 800 mA/W for at least one wavelength in the range.

With a GeSi I layer and with Ge fraction ranging from 0.01 to 1, the wavelength can range from 800-1600 nm and in some cases from 900 to 1100 nm and in some cases from 950-1350 nm and in some cases from 990 to 1350 nm and in some cases from 990 to 1100 nm and in some cases from 1250-1550 nm and in some cases from 1250 to 1450 nm. The responsivity can be greater than or equal to 100 mA/W and in some cases greater than or equal to 300 mA/W and in some cases greater than or equal to 600 mA/W and in some cases greater than or equal to 800 mA/W for at least one wavelength in the range.

A reverse bias voltage ranging from −2 to −10 Volts or more and in come cases −1 to −4V and in some cases −3.3V can be applied to the anode and cathode of the MSPD or MSAPD.

Light shields can be added on top of the TIA/ASICs so that stray light does not interfere with the CMOS operation. The light shield can be a low dielectric constant polymer, black paint, and/or any other material to block the light illuminating the CMOS ASICs. The light shield can be on the front and/or on the back of the substrate. The backside via is optional and is used if optical signals impinge from the backside. In some cases the via can be etched to the BOX layer.

Figure 32:
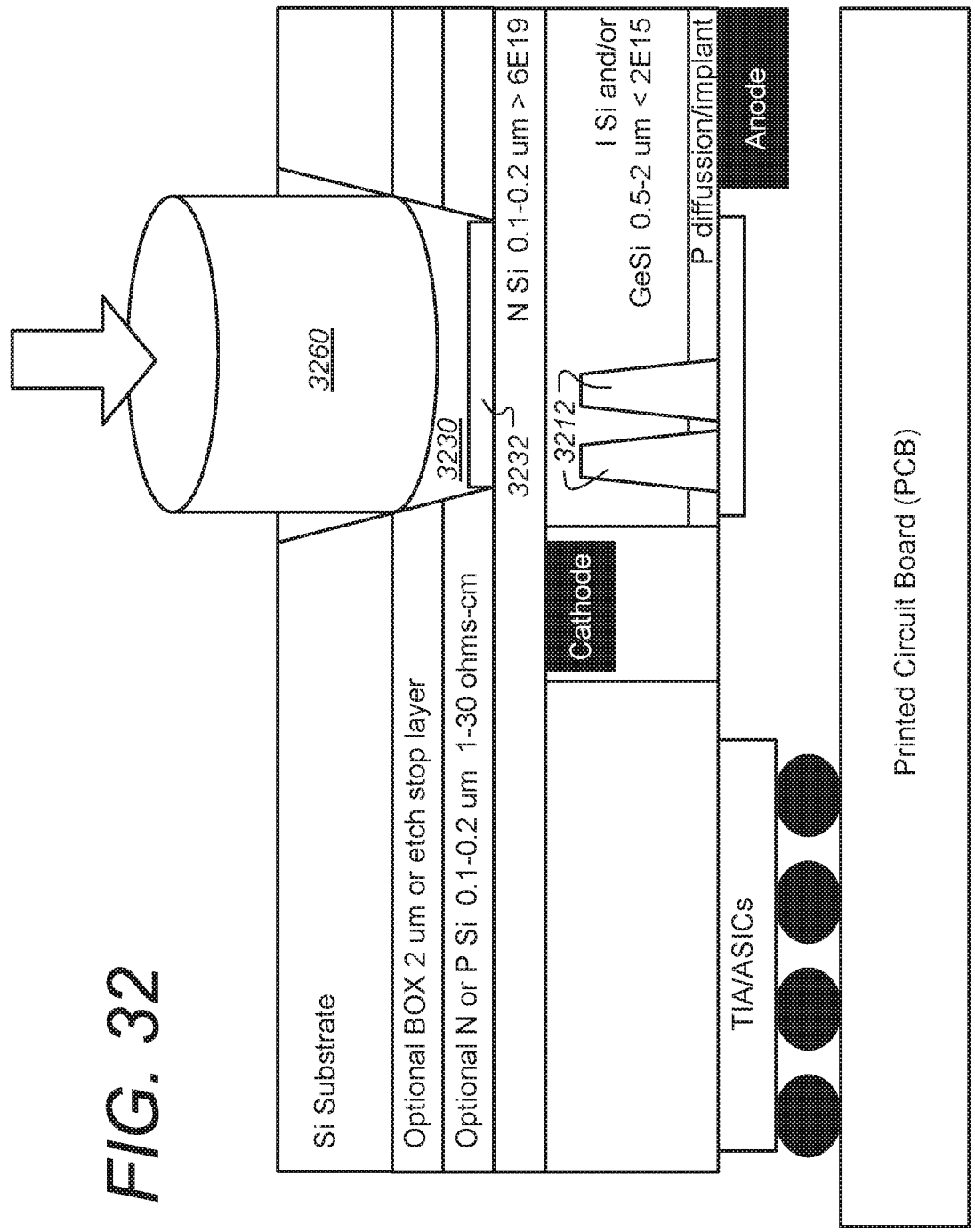
FIG. 32 is a diagram showing a monolithically integrated MSPD with TIA and other ASICs that is flip chip mounted on a printed circuit board using solder bump technology, according to some embodiments.

FIG. 32 is a diagram showing a monolithically integrated MSPD with TIA and other ASICs that is flip chip mounted on a printed circuit board using solder bump technology, according to some embodiments. The MSPD has microstructure holes 3212. The via 3230 can be also used to guide a multi mode and/or single mode optical fiber 3260 to the MSPD thus simplifying significantly the optical alignment process. The via 3230 can also be at an angle off normal such that the fiber can have an angle off normal to reduce back reflected optical signal back into the optical fiber. Anti reflection coating 3232 can be applied to the back Si surface to further reduce reflection.

In some cases, the optical signal can impinge from the top surface (lower in FIG. 32), and the monolithically integrated chip can be solder bumped to the printed circuit board using through silicon vias (TSV) to connect the solder bump pads on the bottom surface with the electrode pads on the front surface for example.

FIG. 33 is a diagram showing a similar structure to FIG. 30 but with selective P layer growth, diffusion and/or ion implantation on parts of the I layer surface, according to some embodiments. The P layer can have a different bandgap material than that of the I layer. The CMOS/BiCMOS layer(s) can be selective area growth on the I layer if needed and can be P and/or N type. The P layer for the PIN MSPD can be formed with ion implantation process for example, using P type dopants such as B, C, Al, Ga, and/or In. A thermal anneal step is used to activate the dopants implanted and/or the P layer can be selective area grown with the same and/or different bandgap as the I layer. The substrate can be silicon p or n type with or without etch stop layers and/or SOI.

Figure 34:
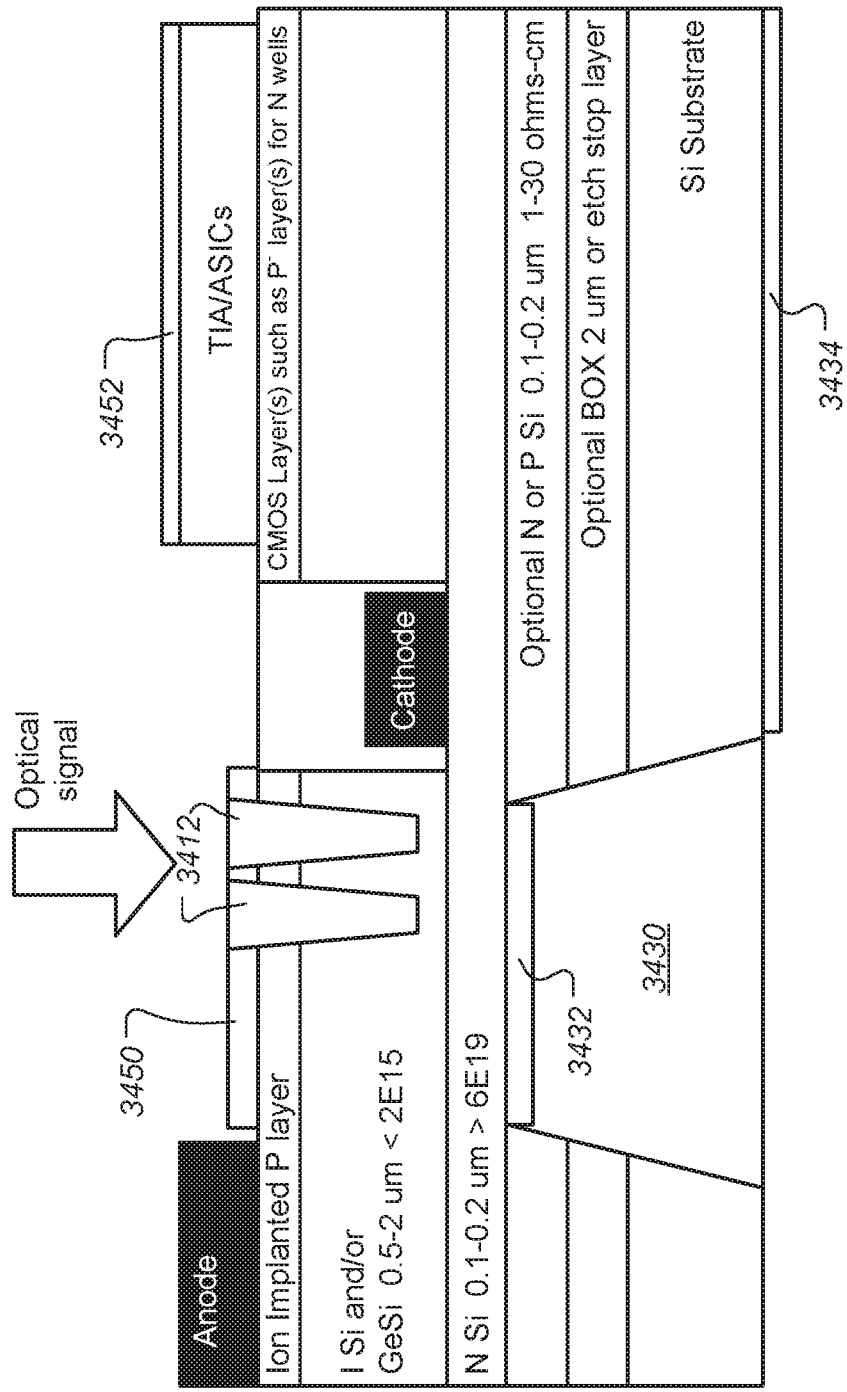
FIG. 34 is a cross section view showing some aspects of a MSPD integrated with TIA/ASICs using a layer structure as in FIG. 33, according to some embodiments.

FIG. 34 is a cross section view showing some aspects of a MSPD integrated with TIA/ASICs using a layer structure as in FIG. 33, according to some embodiments. The P layer adjacent to the I layer can be ion implanted and/or selective area grown. Metal film and/or ITO 3450 can be applied as in FIG. 31 to reduce the sheet resistances. Not shown as in FIG. 31 are the transmission lines from the MSPD to the TIA/ASICs. Other features are similar to FIG. 31 including optional via 3430 and metal, ITO and/or dielectric layer(s) 3432.

In addition, in all the MSPD/MSAPD monolithic integration with CMOS ICs, a light shield 3452 can be added over the CMOS TIA/ASICs such that stray light from the optical signal is kept from impinging on the CMOS transistors, capacitors, which can degrade performance and cause errors. A light shield 3434 can also be added on the bottom of the substrate for bottom illuminated MSPD, MSAPD and/or the light shield can be added on both surfaces, top and bottom. The light shield(s) can be an opaque (to the wavelengths of the optical signal and other light sources) polymer, black form, metal, a combination of dielectric and metal, or other materials that are mostly opaque to near infrared radiation and/or visible radiation.

If the optical signal is impinging on the top surface where the microstructured holes 3412 are, a via 3430 may not be provided, and in some cases the substrate can be a N or P Si substrate instead of a SOI substrate. In the case of a N substrate, the cathode can also be on the bottom of the N substrate for example.

FIG. 35 is a cross section view showing an epitaxial layer structure for an MSAPD monolithically integrated with CMOS/BiCMOS ASICs, according to some embodiments. The structure is similar to that of FIG. 30 with the addition of a charge and multiplication layers. The charge P layer can be Si and/or GeSi with Ge fraction ranging from 0.001 to 0.6 or higher and thickness ranging from 0.05 to 0.25 microns and in some cases from 0.1 to 0.3 microns and doping ranging from 8E16 to 3E17 and is between the absorption I layer and the multiplication I layer. The multiplication I layer on top of the cathode N layer can be Si and/or GeSi with Ge fraction ranging from 0.001 to 0.6 and thickness ranging from 0.3 to 1.0 microns and in some cases from 0 to 0.5 microns and doping can range from 1E15 to 1E16 or less or a resistivity of 1-10 ohm-cm or higher. The N layer can have a thickness ranging from 0.2 to 0.5 microns or more, and a resistivity ranging from 0.01 to 0.001 ohm-cm or lower. In some cases a BOX layer may not be provided and a N type silicon substrate may be used.

Similarly to FIG. 33, the P top layer can be formed by selective ion implantation of dopants such as B, Al, C, Ga, and/or In. Any additional CMOS/BiCMOS layer(s) may be included on the I layer and in some cases, the CMOS/BiCMOS P and N wells can extend into the I layer as discussed in Swoboda. In some cases, the MSAPD process can incorporate any CMOS/BiCMOS layer by either diffusion doping and/or ion implantation and forming a shallow P well. The CMOS/BiCMOS layers can be selectively etched off areas where the MSAPD will be formed. As in FIG. 30 the substrate can be silicon N or P type with or without an etch stop layer, or SOI with p or n device layer.

Figure 36:
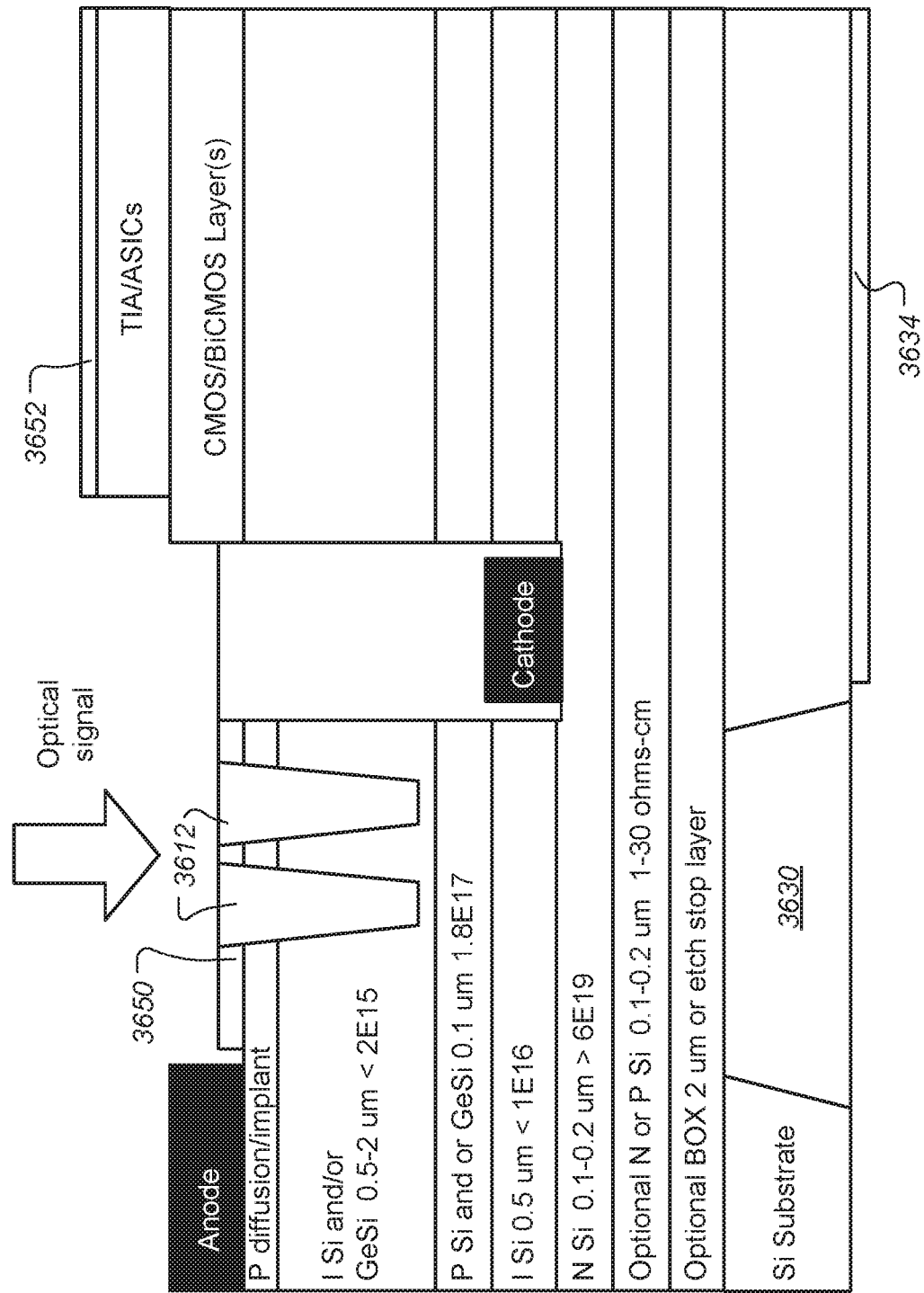
FIG. 36 is a cross section view showing some aspects of a MSAPD monolithically integrated with CMOS/BiCMOS TIA/ASICs, according to some embodiments.

FIG. 36 is a cross section view showing some aspects of a MSAPD monolithically integrated with CMOS/BiCMOS TIA/ASICs, according to some embodiments. Features shown in FIGS. 31 and 32 can be applied to this structure including optional via 3630, optional ITO/metal/dielectric coating 3650, and optional light shields 3652 and 3634. With a reverse bias applied between the anode and cathode of the MSAPD with voltages ranging from −8 to −25 volts, the gain can range from greater than 1 to 10 or more, in some cases the gain can range from 2 to 4 and in some cases the gain can range from 2 to 8 or more. Gain bandwidth product can range from 20 to 300 Gb/s or more. Gain the quantum efficiency can be 50% or greater and in some cases 80% or greater and in some cases 100% or greater and in some cases 200% or greater. Responsivity can be 0.5 A/W (amperes/watt) or greater and in some cases 1 A/W or greater for some wavelengths in the range 800-1600 nm depending on the Ge fraction in the GeSi alloy which can range from 0 (all Si) to 1 (all Ge). A shallow $P^+$ well is formed on the surface of the I layer by diffusion of P type dopants and/or by ion implantation of P type ions. The $P^+$ well completes the P-I-P-I-N MSAPD structure, and can have a thickness ranging from 50 to 500 nm and in some cases 100 nm to 300 nm and can have a resistivity in the neighborhood of 0.01 to 0.001 ohm-cm or lower, In addition, a thin semitransparent metal layer with thickness ranging from 1-50 nm and/or transparent conducting metal oxide (TCMO) such as ITO with thickness ranging from 1 nm to 500 nm can be deposited on the P shallow well prior to microstructure hole etch. The addition of metal and/or TCMO can assist in reducing the series sheet resistance of the P shallow well. In some cases, it is desirable to have thin P+ shallow wells to reduce the generation of photocarriers in the P+ well that can reduce the overall quantum efficiency and/or reduce the data rate bandwidth of the MSAPD due to photogenerated carriers in the P+ region diffusing to the high field region in the I layer that can result in a slow "tail" in the impulse response. The wavelength range is similar to the device in FIG. 31. Light shield 3652 can be added to protect the CMOS electronics from stray lights, stray optical signals. The I layer GeSi can have Ge fraction ranging from 0 to 1 ($Ge_x Si_{1-x}$ where x can range from 0 to 1)

In FIG. 1 of Kang et al 2008, a Ge on Si avalanche photodiode is shown. A similar structure can be fabricated with microstructured holes 3612 and where the holes can be etched through the contact layer and into the absorption layer partially and/or entirely. In some cases the holes can be etched to the charge layer and in some cases through the multiplication layer and in some cases to the bottom contact layer. As in Kang et al 2008, passivation can be amorphous silicon (a-Si) and/or silicon nitride.

Figure 37:
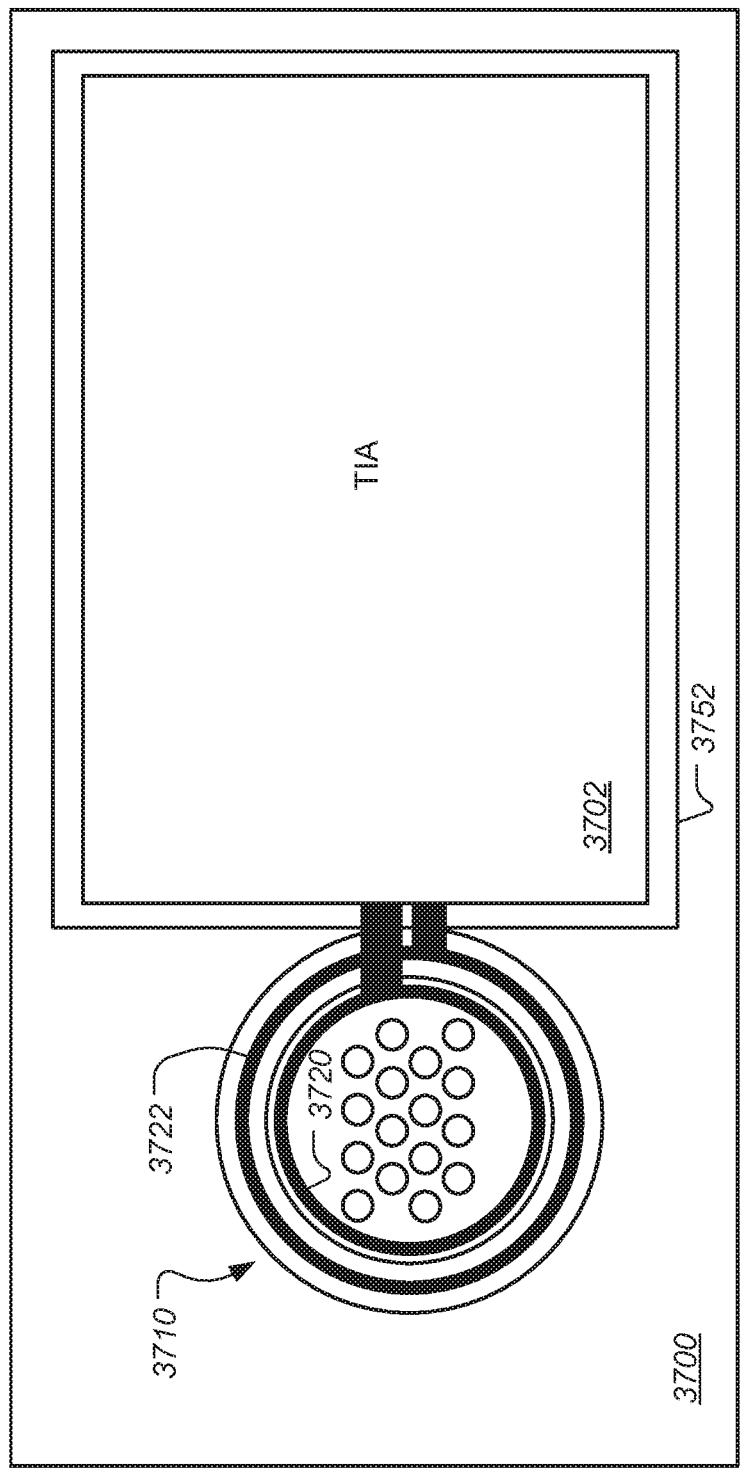
FIG. 37 is a top view showing some aspects of a MSPD/MSAPD monolithically integrated with a TIA/ASICs without the solder bumps and/or bond pads, according to some embodiments.

FIG. 37 is a top view showing some aspects of a MSPD/MSAPD monolithically integrated with a TIA/ASICs without the solder bumps and/or bond pads, according to some embodiments. The integrated chip 3700 shown can be for a single MSPD/MSAPD 3710 or an array of MSPDs/MSAPDs. The TIA/ASICs 3702 can also have an opaque coating and/or cover 3752 such that any stray light does not impinge on the CMOS that can interfere with the CMOS operation. Light absorbed in the CMOS transistors can generate undesirable electron hole pairs that can change its operating parameters and can cause errors.

The coating 3752 can be an opaque form like material with low dielectric constant such that is does not load the CMOS. The opaque material can cover the top surface of the TIA/ASIC 3702 for a top illuminated MSPD/MSAPD 3710 and/or the bottom surface of the TIA/ASIC 3702 for bottom illuminated MSPD/MSAPD 3710. For a bottom surface coating (such as coatings 3434 and 3634 in FIGS. 34 and 36), it can be an opaque polymer for example such as black paint.

Basic fabrication steps can include: CMOS TIA/ASIC steps; etching microstructure holes; forming P ohmic; mesa etch; forming N ohmic; and forming transmission line connecting MSPD/MSAPD anode and cathode to the TIA/ASICs. In some cases, passivation can be inserted before ohmic metal deposition. For example, such passivation can include: oxidation; deposition of aluminum oxide on the side walls using atomic layer deposition; depositing poly silicon and/or a-Si; and depositing dielectrics such as hafnium oxide, silicon dioxide silicon nitride and other dielectrics using atomic layer deposition.

Data rates can range from 3 to 100 Gb/s or more for the integrated chip consisting of MSAPD/MSPD and TIA and other signal processing and enhancing ASICs, and each MSPD/MSAPD can detect the same wavelength and/or different wavelength with the addition of a bandpass filter that can be deposited on the MSPD/MSAPD in the form of dielectric starts such as Bragg filters for example. Detection at different wavelengths can avoid cross talk.

The MSAPD/MSPD 3710 can have a photosensitive area that can be circular, square, polygonal and can have a diameter and/or diagonal ranging from 20 microns to 1000 microns and in some cases for high data rate applications from 20 microns to 100 microns and for LIDAR applications from 100 microns to 1000 microns. The distance of the MSAPD/MSPD 3710 to the CMOS/BiCMOS electronics ICs 3702 can range from a few microns to 1000 microns and in some cases from 10 to 250 microns. The first inner ring can be the anode 3720 and the outer ring can be the cathode 3722 for a P-I-P-I-N MSAPD or a P-I-N MSPD structure.

Figure 38:
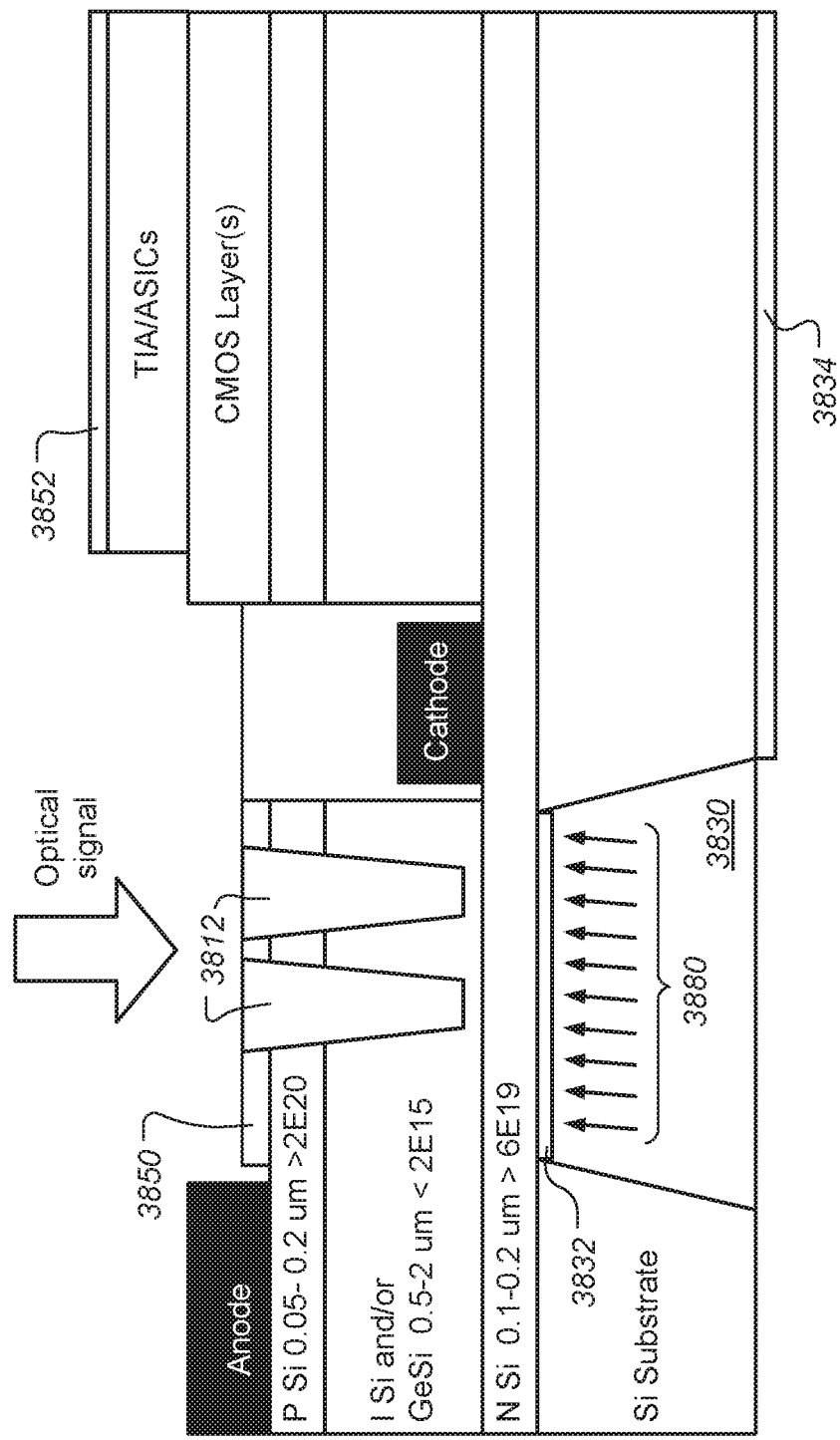
FIG. 38 is cross section view showing some aspects of a MSPD/MSAPD monolithically integrated with a TIA/ASICs, according to some embodiments.

FIG. 38 is cross section view showing some aspects of a MSPD/MSAPD monolithically integrated with a TIA/ASICs, according to some embodiments. The structure is similar to that of FIGS. 31 and 34, including microstructure holes 3812, optional via 3830, optional ITO/metal/dielectric coating 3850, and optional light shields 3852 and 3634. In FIG. 38, however, a bottom ion implantation process 3880 is provided, which can either be a blanket ion implantation into the entire bottom surface of the wafer and/or masked such that only certain areas receive the ions from ion implantation. The ion implantation process 3880 can be N type ions such as C, N, P, As, Sb, and/or Bi, implanted into the N layer (or P type ions can be implanted in P layer, ions such as C, B, Al, Ga, and/or In) to further increase the doping concentration that can reduce the sheet resistance and the minority carrier lifetime. A thermal anneal can activate the implanted ions and remove some of the damage caused by ion implantation. See, e.g., Williams, Ion Implantation of Semiconductors, Materials Science and Engineering A253 (1998) 8-15 (incorporated herein by reference).

In some cases, ions such as Ar, N, O, He, H, and/or Xe can be used to cause damage to the semiconductor in the N or P layer which can further reduce minority carrier lifetime. In addition, in some cases, buried or not buried silicon oxide, silicon nitride layers can be formed with O and/or N ions implanted into the silicon.

According to some embodiments, ion implantation can also be performed with or without a conducting layer such as a metal and/or silicode layer where the ions can penetrate the metal and/or silicode layer and into the silicon layer and can be followed by a rapid thermal anneal.

The optical signal can impinge from the top surface and/or from the bottom surface as in FIG. 32. If light is impinging from the bottom surface, the top surface can include a reflector such that light not absorbed can be reflected back toward the absorption enhancing microstructures.

Figure 39:
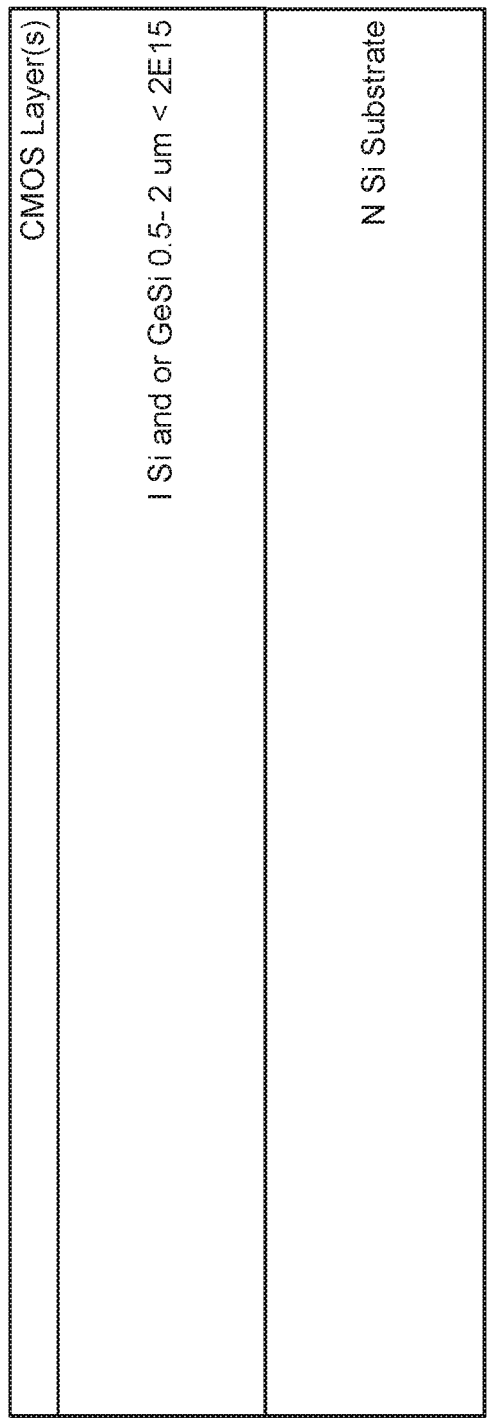
FIG. 39 is a cross section view an epitaxial layer structure, according to some embodiments.

FIG. 39 is a cross section view an epitaxial layer structure, according to some embodiments. The epitaxial layers are grown on a N or P wafer and where the layers can consist of an intrinsic I Si and/or GeSI layer where the background doping of N or P type is less than $2 \times 10^{15}/cm^3$ (<2E15) and can have a thickness ranging from 500 nm to 2500 nm and in some cases 500 nm to 3500 nm or more. CMOS layer(s) for TIA/ASICs and other electronics can be grown on the I layer. Not shown are etch stop layers that can be grown prior to the I layer, marker layer(s) which can contain a signature ion that can be inactive and/or active, used for dry etching and the etch is monitored by a mass spectroscopy where when the signature ions are detected, it is know that etching has reached that layer. Other etch depth monitoring techniques include the use of optical interference, and can include one or more different optical refractive index layers to monitor etch depth. Other etch depth monitoring techniques such as electro chemical etching, resistance monitoring, may also be used.

Buffer layers, superlattice layers such as Si/GeSi/Si/GeSi for etch depth monitoring, lattice matching, bandgap grading, carrier lifetime reduction, isolation, PN junctions, stress reduction and/or enhancement are not shown but can be included between the Si substrate and/or the I layer and/or between the I layer and/or the CMOS layer(s) and in some case can be embedded in the I layer at any location.

The Ge fraction of the GeSi in the I layer can have single and/or multiple values, and can range from less than 1% to 100%, ($Ge_xSi_{1-x}$ where x can range from <0.01 to 1). In some cases Ge fraction range from 1% to 10% and in some cases range from 8% to 20% and in some cases range from 20% to 40% or more and the GeSi layer can be relaxed and/or not relaxed.

Figure 40:
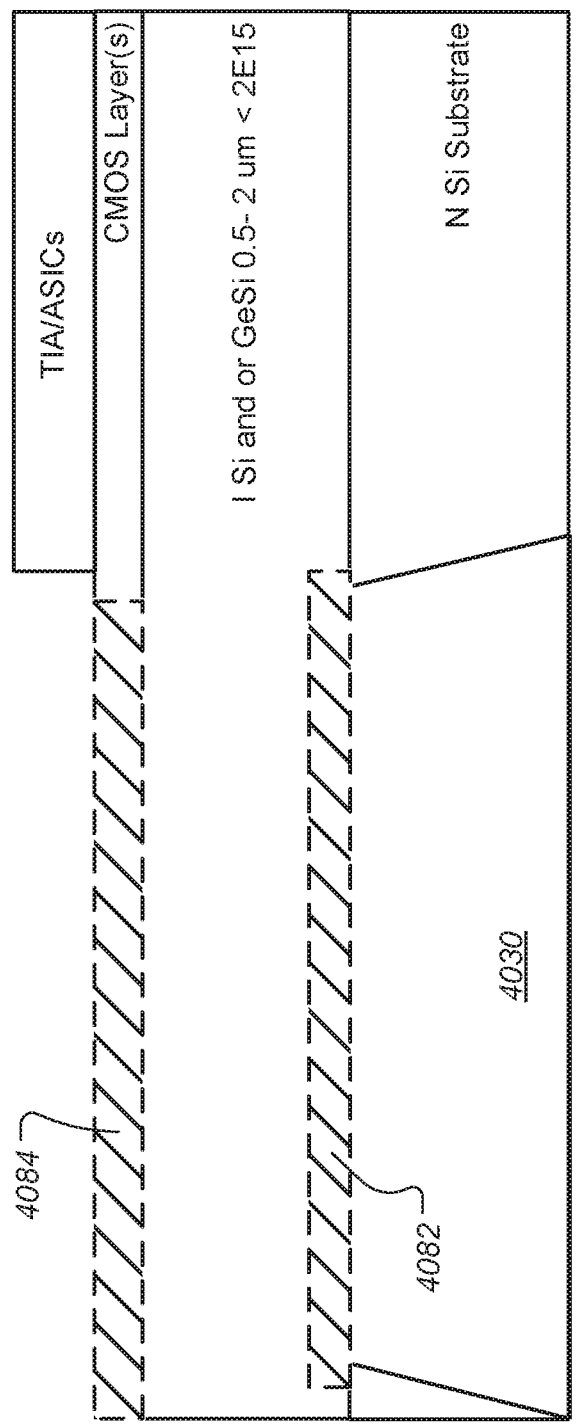
FIG. 40 is a cross section view illustrating some aspects of MSPD-ASIC monolithic integration, according to some embodiments.

FIG. 40 is a cross section view illustrating some aspects of MSPD-ASIC monolithic integration, according to some embodiments. The CMOS electronics can fully or partially fabricated first. In the cases where there are common processing steps between the electronics and the MSPD, the steps can be grouped together if possible. For example, in the case where the fabrication processes for the CMOS electronics and the MPSD both call for ion implantation of N and/or P type dopants, the rapid thermal anneal process to activate the implanted ions can be processed together for the CMOS electronics and the MSPD. Other examples of processes that can be grouped together are the ohmic contact anneals for the CMOS electronics and the MSPD.

In FIG. 40, after TIA/ASICs are mostly formed, P type ions using B for example, can be implanted into the CMOS layer and/or the CMOS layer can be first partially and/or entirely removed to expose the I layer, and P type ions can be implanted into the partial CMOS and/or I layer. P type ions can include B, C, Al, Ga, In for example. A P type region 4084 can be created with doping ranging from $5 \times 10^{19}/cm^3$ to $2 \times 10^{20}/cm^3$ or higher (5E19 to 2E20 or higher) and an implant range from 50 to 250 nm. See, e.g., Table III of Gibbons, Ion Implantation in Semiconductors-Part I Range Distribution Theory and Experiments, PROCEEDINGS OF THE IEEE, VOL. 56. NO. 3, M29A5RCH 1968 (incorporated herein by reference and referred to herein as "Gibbons") which gives the P and N type ions and ion implant energies in to Si with peak position of the ions in Si $R_p$ and the width of the distribution $\Delta R_p$. For example, a multiple staggered implant with energies of 10, 20, 40, 60, 80, 100 KeV can be used to reach a peak depth of 328 nm of B ions and/or a single implant of 100 KeV. The doping is approximately given by dose (ions/$cm^2$)/$\Delta R_p$ so that to reach 2E20 at 328 nm depth the dose is approximately $1.5 \times 10^{15}$ ions/$cm^2$.

A via 4030 is etched in the backside of the Si N (can be P if N and P are interchanged) type substrate to the I layer and/or almost to the I layer and/or to the etch sop/monitoring layers, and/or to the super lattice and ion implant of N type ions such as N, P, As, Sb as given in Table III of Gibbons, can be implanted to create an N type region 4082 with doping ranging from $3 \times 10^{19}/cm^3$ to $2 \times 10^{20}/cm^3$ or higher (3E19 to 2E20 or higher) and with a thickness of implanted ion range of 225 nm at 180 KeV using P ions. Multiple energies can be used to create a smoother distribution of ions in the N region. Dose of approximately 1E15 can be used to reach a doping of approximately 2E20 with 180 KeV P ions in Si. A rapid thermal anneal can be performed to activate the implanted ions.

According to some embodiments, the P and N regions 4084 and 4082 can also be formed by diffusion. In such cases, dopants of P and/or N type can be diffused into Si thermally from either a solid source that can be deposited on Si surface and/or in close proximity and/or from a gaseous source.

In addition, Schottky (metal-semiconductor) type junction(s) can be formed at least on either the top and/or bottom Si surface replacing one or both P to I junction and/or N to I junction in the MSPD/MSAPD. In addition to integration, the implant process can also be used for MSPD single and/or array photodiodes.

Ion implantation processes can also be used for isolation, where ions such as H, O, and/or N can be used and where in some cases O and/or N ions can be implanted to form oxides and/or nitrides of silicon. This method of isolation can be used by it self and/or in conjunction with mesa etching.

Figure 41:
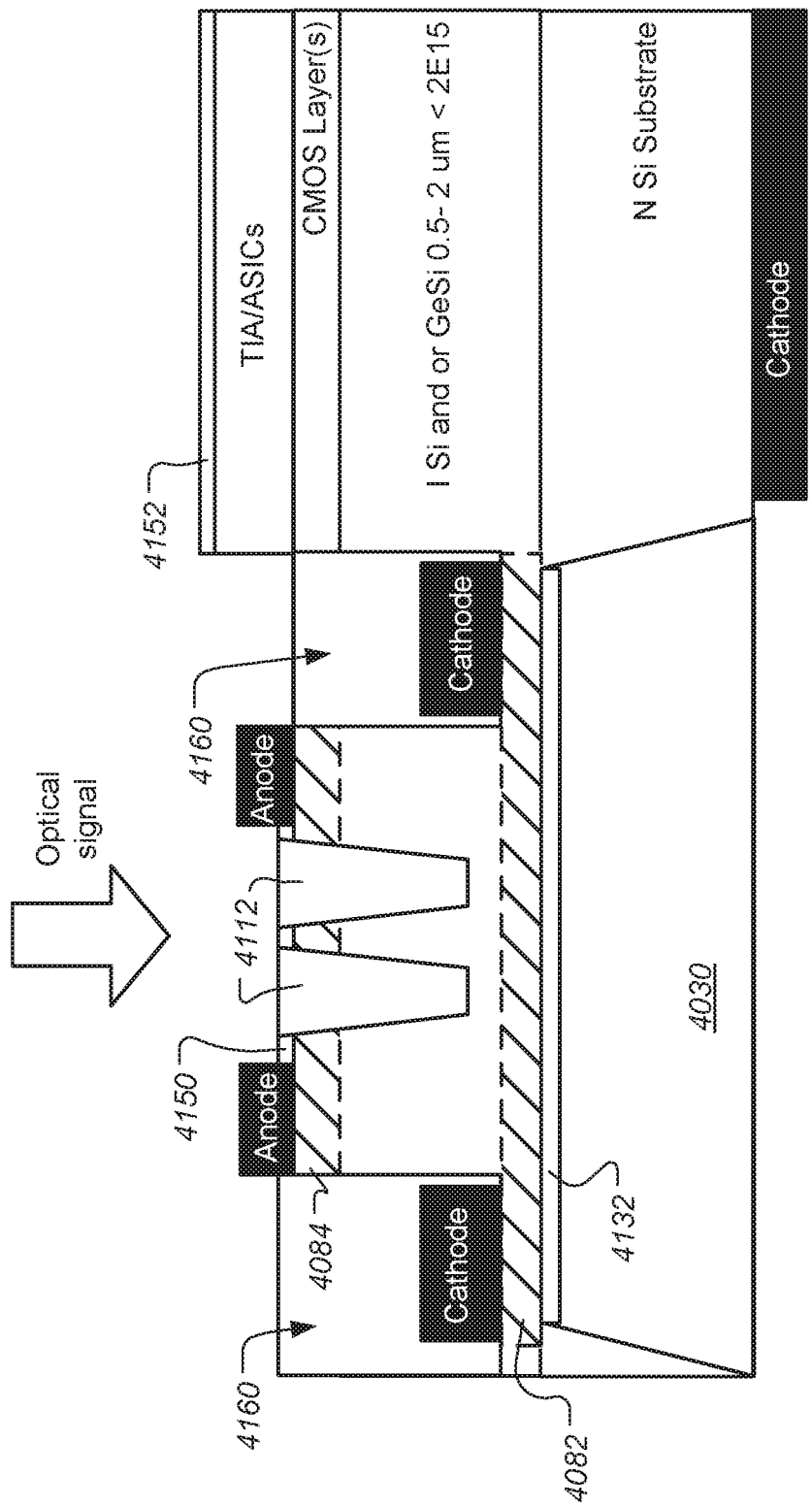
FIG. 41 is a cross section view illustrating some further aspects of MSPD-ASIC monolithic integration, according to some embodiments.

FIG. 41 is a cross section view illustrating some further aspects of MSPD-ASIC monolithic integration, according to some embodiments. From the structure shown in FIG. 40, microstructure holes 4112 are etched into the I layer and in some case can be through the I layer to the N layer and in some case can be into the N layer and in some cases through the N layer. A mesa etch 4160 can also be provided to such that cathode ohmic metal can be deposited on the N region and anode ohmic metal can be deposited on the P region. Interconnect transmission lines from the MSPD cathode and anode to the TIA/ASICs are not shown. Also not shown are passivation and planarization layers. A metal and/or transparent conducting metal oxide such as ITO and/or silicide and/or dielectric and/or Bragg reflectors/filters 4150 and 4132 can be deposited on the P and N regions. The metal, ITO and silicide can reduce the sheet resistance and also provide a more uniform distribution of the electric field to deplete the I layer during reverse bias. A reverse bias of −2 to −10 volts can be applied between the anode and cathode. In some cases, the reverse bias is −2 to −4 volts.

The optical signal can impinge from either the top (as shown) and/or bottom surface. In addition, as in FIG. 32, the monolithically integrated MSPD and CMOS ASICs can be solder bumped. In some cases, through substrate vias (TSVs) can be implemented on the monolithically integrated MSPD/MSAPD and CMOS TIA/ASICs such that solder bumps can be attached on the substrate side and attached to the PCB. In this case, using the TSVs, a flip chip configuration can be avoided.

Hole spacing, size, depth, shape, wavelength ranges, QE, responsivity, and data rates can be as described in elsewhere herein, such as in connection with FIGS. 31, 32, 34, 36, 38. Data rates of 3 Gb/s to 60 Gb/s or higher can be attained by the MSPD/MSAPD. Optical signal wavelengths can range from 800-1000 nm and in some cases 800 nm to 1100 nm and in some cases 800 nm to 1400 nm and in some cases 800 nm to 1600 nm and the QE can be 20% or greater at at least one or more wavelengths in the range and in some cases the QE can be 50% or greater at at least one or more wavelength in the range and in some cases the QE can be 70% or greater at at least one or more wavelength in the range.

Hole diameters and/or diagonals and/or width range from 350 nm to 2500 nm and in some cases from 400 nm to 3000 nm and in some cases 500 nm to 2000 nm and in some cases 500 nm to 1300 nm. Hole spacing can range from 10 nm to 3000 nm at the surface and in some cases can intersect at at least one point with an adjacent hole. Hole diameter/width can vary as depth and in some cases the diameter/width becomes smaller with depth and in some cases can vary with depth. Holes can be etched wet and/or dry partially into the I layer, through the I layer, to the N or P layer at the bottom, into and/or through the P and/or N layer and in some cases can be etched completely through to the bottom surface.

In addition, the MSPD and MSAPD have very linear output current verses optical input power. The MSPD have been experimentally observed to have a linear photocurrent-input optical power from less than a mW to over 10 mW. Linearity is important for pulse amplitude modulation (PAM-4). See, e.g., Ingham, Future of Short-Reach Optical Interconnects based on MMF Technologies, OFC 2017 ©OSA 2017 (incorporated herein by reference).

Monolithic integration of MSPD/MSAPD with CMOS ASICs is expected to significantly reduce the cost of an optical transceiver. See, e.g., Assefa et al, Monolithically Integrated Silicon Nanophotonics Receiver in 90 nm CMOS Technology Node, OFC/NFOEC Technical Digest© 2013 OSA (incorporated herein by reference), where the authors from IBM state in the introduction: "Monolithic integration of optical transceivers in a standard CMOS foundry is expected to significantly reduce the cost of optical communication links for their wide deployment in datacenters and high-performance computing systems . . . ".

In addition, in some applications in high performance computing wavelength ranges include 900-1100 nm and in some cases 900-1065 nm. See, e.g., Taubenblatt, Optical Interconnects for High-Performance Computing, JOURNAL OF LIGHTWAVE TECHNOLOGY, VOL. 30, NO. 4, Feb. 15, 2012 (incorporated herein by reference). MSPDs/MSAPDs in Si and/or GeSi can address these wavelengths and still be monolithically integratable with CMOS/BiCMOS ICs such as TIA and/or ASICs for functions such as signal amplification, conditioning, normalization, processing, storage, transmission and other signal enhancements for error reduction processing.

Figure 42:
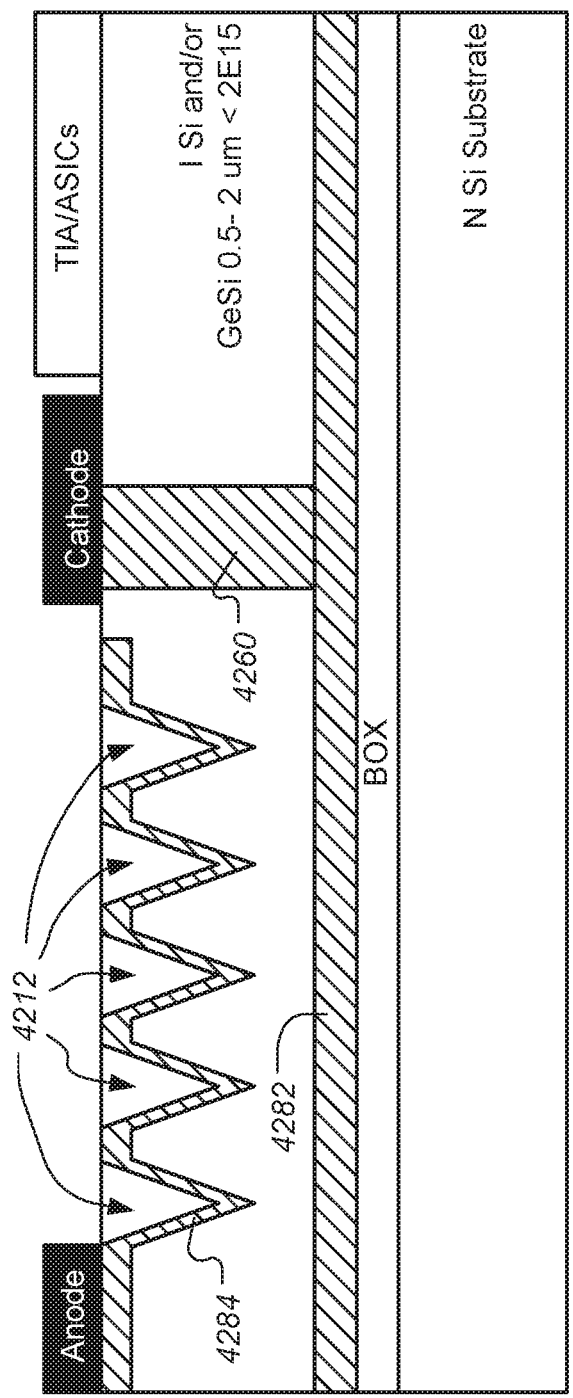
FIG. 42 is a cross section view illustrating aspects of MSPD monolithically integrated with CMOS/BiCMOS electronics, according to some embodiments.

FIG. 42 is a cross section view illustrating aspects of MSPD monolithically integrated with CMOS/BiCMOS electronics, according to some embodiments. The CMOS/BiCMOS electronics can be for a TIA and can include other ASICs for signal processing, conditioning and transmission. The microstructure holes 4212 can be etched first partially into the low doped and/or undoped I Si and/or GeSi layer with resistivity of 1 ohm-cm or greater and in some cases 10 ohm-cm or greater and with a thickness ranging from 0.5 to 5 micrometers and in some cases from 0.5 to 2 micrometers. After the microstructure hole etch, the $P^+$ (or $N^+$ with P and N interchanged from a P-I-N to N-I-P) layer 4284 can be formed conformally to the microstructure holes 4212 by ion implantation of the P (or N) type ions and/or by diffusion of P or N type dopants. Inverted pyramid holes are shown in FIG. 42 that can be wet etched in KOH solutions and also can be wet etch and/or dry etched to form holes of different shapes. The bottom N layer 4282 can be epitaxially grown on a SOI wafer with a BOX and in some cases on a N type Si wafer without a BOX. Layer 4282 can also be ion implantation and/or diffused with dopants into the device layer of the SOI. In cases where a N substrate is used without BOX and the substrate resistivity is in the range of 0.01 ohm-cm or less, the additional doping and $N^+$ epitaxial layer may not be provided. A $N^+$ connecting well 4260 formed by ion implantation and/or diffusion can connect the cathode on the surface to the $N^+$ layer/region 4282 and in the case of a N substrate the cathode can be on the bottom of the substrate with or without additional connect wells. In some cases a TSV (through silicon via) and/or a deep trench may be provided to connect the bottom cathode to the surface ASICs in cases where a surface cathode is not available. Not shown, for simplicity, are the connecting transmission line electrodes from the MSPD/MSAPD to the electronics ASICs.

In all ion implantation situations, multiple energy can be used, and single and/or multiple types of ions can be used that can be P type and/or N type and/or isoelectronic type. Various isolation, formation of dielectrics and N and P type doped regions can be formed to optimize the performance of the MSPD and MSAPD.

Recently, experimental results were published on the microstructured hole silicon photodiode. See, Gao et al, Photon-trapping microstructures enable high-speed high-efficiency silicon photodiodes, PUBLISHED ONLINE: 3 Apr. 2017 | DOI: 10.1038/NPHOTON.2017.37 (incorporated herein by reference and referred to herein as "Gao et al"); which discussed data rates as high as 25 Gb/s attained with quantum efficiency of 50% or greater at 850 nm. Note that in FIG. 5B of Gao et al, the optical current verses power is linear to over 25 mW of optical power. Such linearity of output current to input optical power makes the MSPD attractive for PAM-4 type multi-level amplitude modulation to increase the bit rate of a given optical channel.

In addition, the number of holes can be singular and/or multiple and the spacing between holes can vary from 10 nm to 10000 nm and the holes can have different shapes such as square, rectangle, and/or polygon with diagonals ranging from 200 nm to 5000 nm and in some cases 500 nm to 2500 nm and can be aperiodically and/or periodically arranged on the surface of the MSPD/MSAPD. In addition, the diameter and/or diagonal and/or a significant measure of dimension of the hole can change with depth and can range from 0 nm (come to a point such as the point at the apex of an inverted pyramide) to 5000 nm.

The microstructure holes are etched partially into the I or low doped or undoped region, in some cases 10% or less into the I or low doped region, and in some cases 20% or less and in some cases 30% or less and in some cases 40% or less and in some cases 50% or less and in some cases 60% or less and in some cases 70% or less and in some cases 80% or less and in some cases 90% or less.

Figure 43:
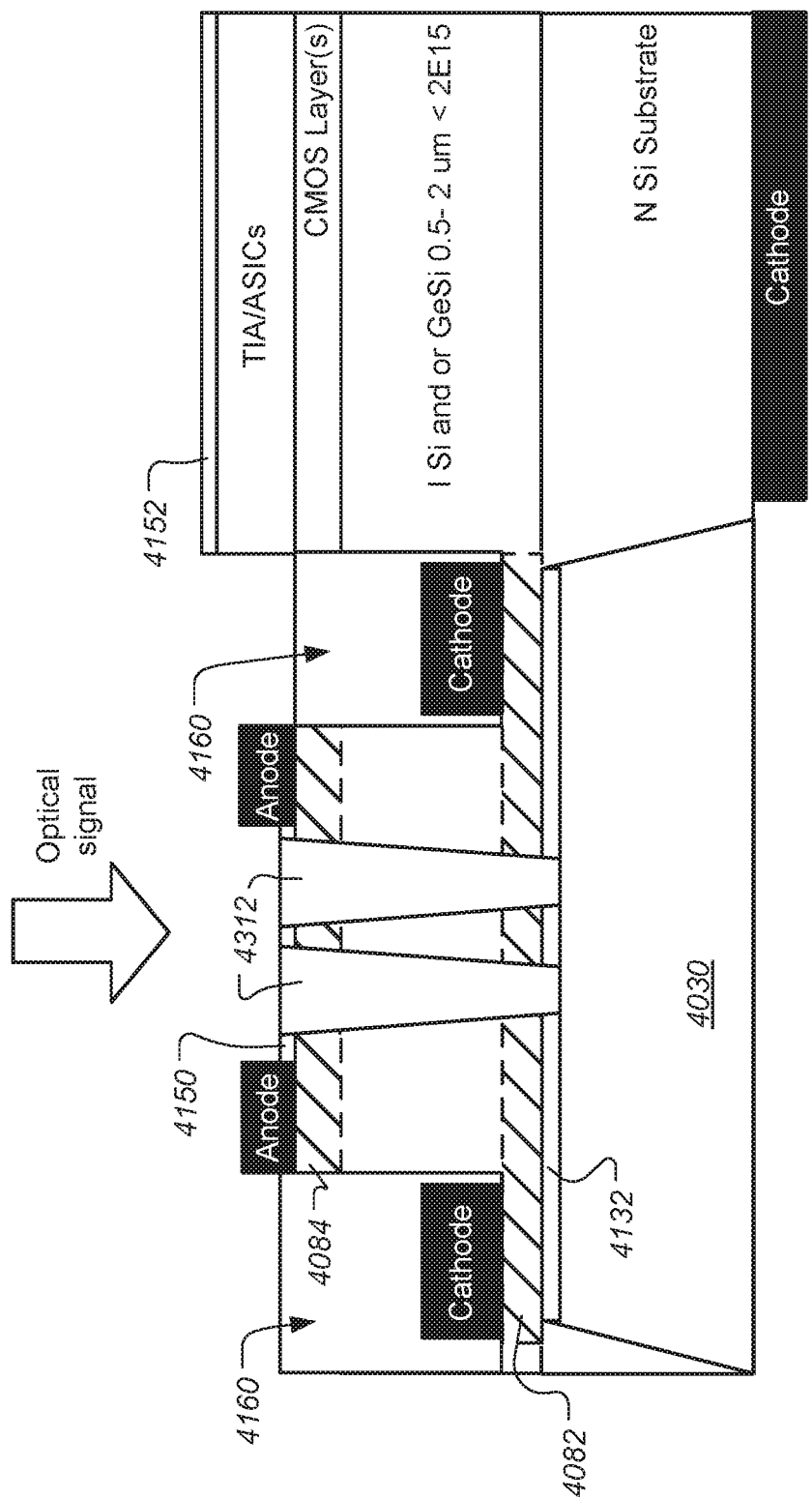
FIG. 43 is a cross section view of a structure similar to FIG. 41 except that the holes are etched through the P-I-N structure, according to some embodiments.

FIG. 43 is a cross section view of a structure similar to FIG. 41 except that the holes are etched through the P-I-N structure, according to some embodiments. The holes 4312 can be bound both top and bottom by air and in some cases at least one side (surface) is bound by a dielectric and/or dielectrics and/or metal.

The bottom surface doping, N type (can be P type with P and N interchanged) can be ion implanted with N type ions such as N, P, As, Sb, Bi, C and in some cases the N layer 4082 can be epitaxially grown in which case the N layer extends past the via 4030 and is between the substrate and the I layer and in some cases can have other layers in between such as etch stop layer(s), buffer layers, buried oxide and/or nitride layer(s), amorphous silicon layers, and/or polycrystalline silicon layers. In addition, with an epitaxial and/or amorphous and/or microcrystalline and/or polycrystalline layer(s), ion implantation can still be used to increase the doping concentration of N (or P) type ions to reduce lifetime and to reduce sheet resistance.

With the I layer thickness ranging from 300 nm to 3000 nm or thicker, and the P and N layers/regions thicknesses ranging from 100 nm (and in some cases less than 100 nm) to 300 nm (and in some cases more than 300 nm), the bulk of the optical absorption occurs in the I layer and can increase the quantum efficiency. The thin P and N layer/regions 4084 and 4082 can have a transparent metal conducting oxide such as indium tin oxide and/or semitransparent metal layer(s) 4050 and 4032 on their surfaces to reduce the sheet resistance. Doping concentration of the P and N layer/region 4084 and 4082 can range from $5 \times 10^{18}$/ cm$^3$ to 5×10$^{20}$/cm$^3$ or greater. The higher doping concentrations also reduce the minority carrier lifetime and therefore any diffusion of photogenerated carriers in the P and/or N layer/region.

The surface of the holes 4312 can be passivated with native oxide and/or dielectric and/or semiconductor crystalline and/or microcrystalline material. The passivation can also be chemical such as with an HF treatment to reduce surface recombination that can reduce the quantum efficiency. In some cases surface recombination at the surface of holes in the P and/or N layer/region can help reduce the diffusion of photogenerated carriers in the P and/or N layer/region into the high field I region which can degrade the speed/bandwidth response of the MSPD, MSAPD. Thin layer/region of N and P type can reduce the amount of photogenerated carriers in the P and N layer/region and therefore reduce the amplitude of the diffused current. In addition with thinner P and N layer/region the time to diffuse of the photogenerated carriers in the P and N layer/region is shorter and therefore the "tail" of diffusion current is correspondingly shorter. Damage due to ion implantation, high doping levels are all methods that can be used to reduce the lifetime of minority carriers in the P and N layer/region.

In some cases, the surface of the substrate, that can be N or P type and with resistivity than can range from 0.1 to 100 ohm-cm for example, can have a surface ion implant of: N and/or P type ions; O and/or nitrogen ions; an inert ion such as Ar, Ne, Xe; and/or ions such as Al, Ni, Pt, Zr, and/or Cr. Such ions can be implanted at and/or beneath the surface of the substrate prior to I layer growth where the I layer can have a resistivity of approximately greater than 8 ohm-cm and in some cases greater than 12 ohm-cm and in some cases greater than 10 ohm-cm and in some cases greater than 5 ohm-cm with a thickness ranging from 500 nm to 3000 nm and in some cases to 5000 nm or more. The implanted ions can behave as an etch stop layer and/or a buried dielectric layer that can also be used for etch stop and/or as a marker layer when the etching is dry etching and the exhaust is monitored by a mass spectrometer such that when it detects Ar and/or Xe and/or other marker ions, then the etching has reached those marker layers. Such methods can be used to precisely etch the via to the correct depth desired.

In some cases, the I layer can be grown on a SOI wafer where the device layer can be a few to tens of ohm-cm resistivity and the buried oxide can have a thickness ranging from 100 nm to 2000 nm and where the device layer can have a thickness ranging from 50 nm to 500 nm and in some cases the device layer can be greater than 500 nm for high resistivity device layers with resistivity ranging from 5-30 ohm-cm or greater. The I layer can be grown on the device layer with resistivity ranging from 3 to 30 ohm-cm or higher and thickness ranging from 300 nm to 5000 nm and in some cases from 500 nm to 2500 nm. A via can be etched to the buried oxide layer on the substrate side and ion implantation can be implanted through the oxide layer and into the device and/or I layer. Multiple ion energies can be used to create a more uniform distribution of dopant in the device and/or I layer. Single and/or multiple kinds of ions can also be used as dopants.

Figure 44A:
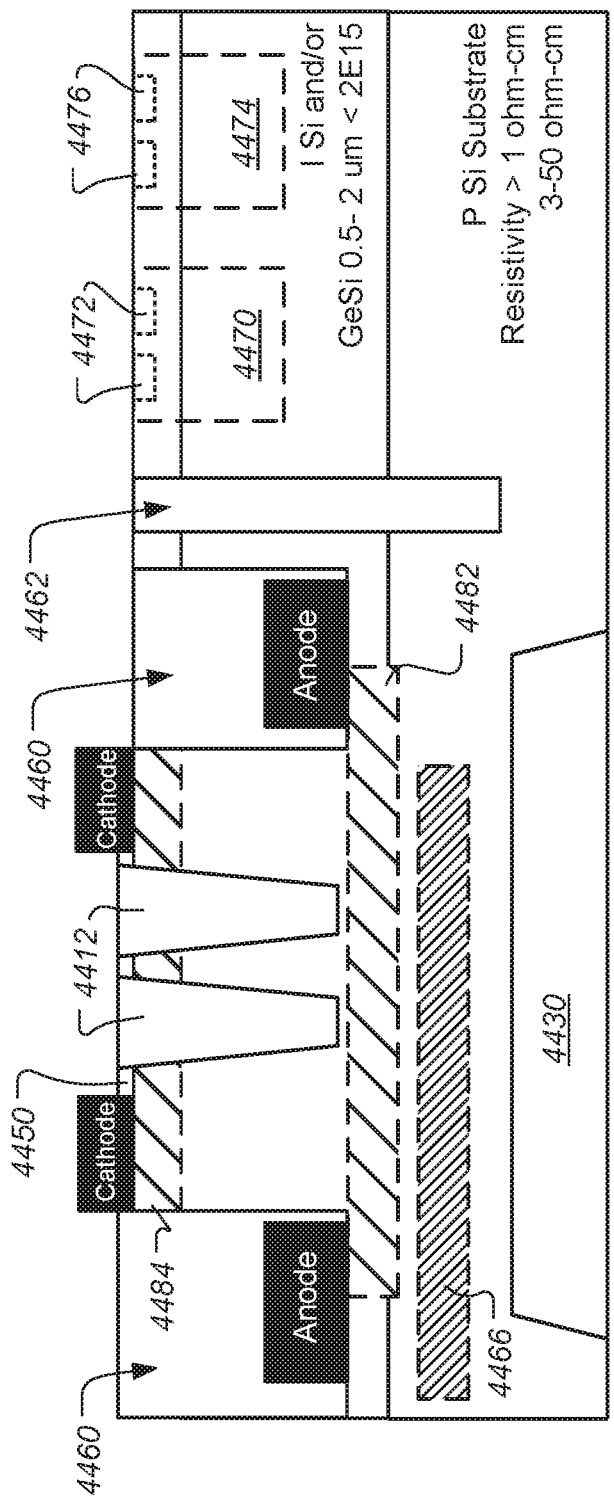
FIGS. 44A-44C are cross section views illustrating some further aspects of MSPD-ASIC monolithic integration, according to some embodiments.
Figure 44B:
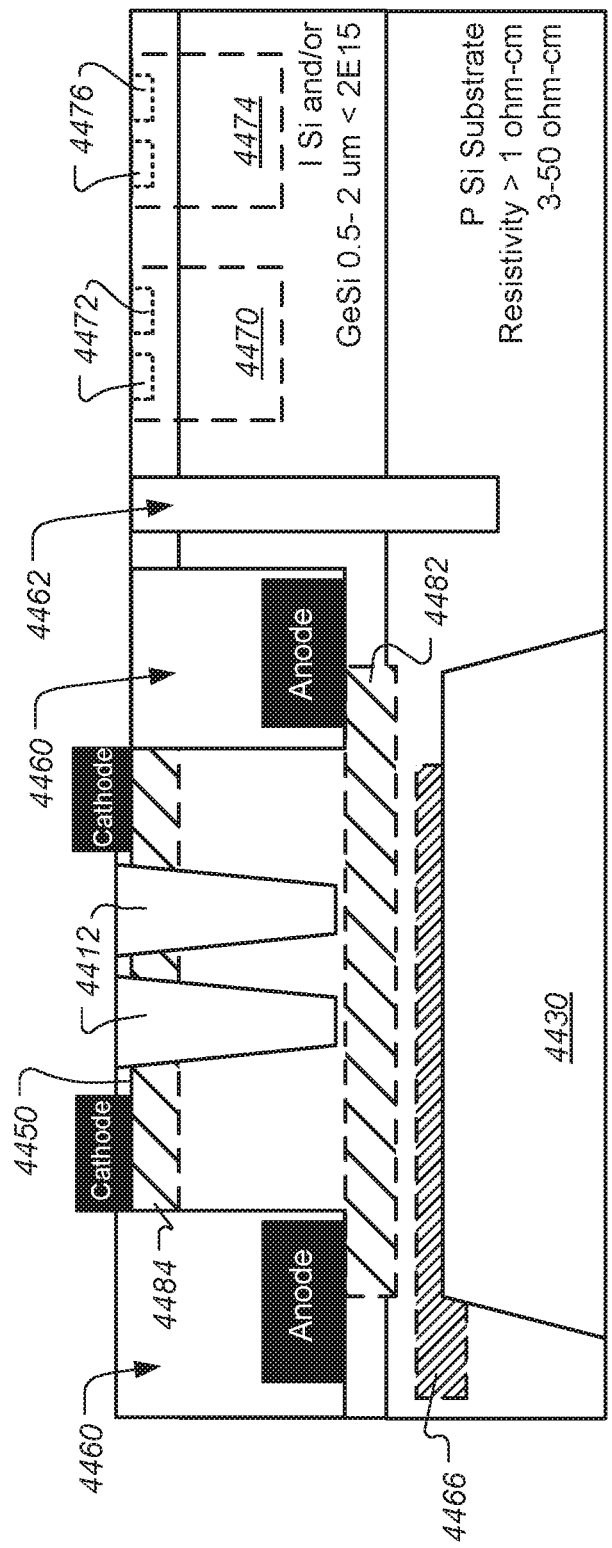
Figure 44C:
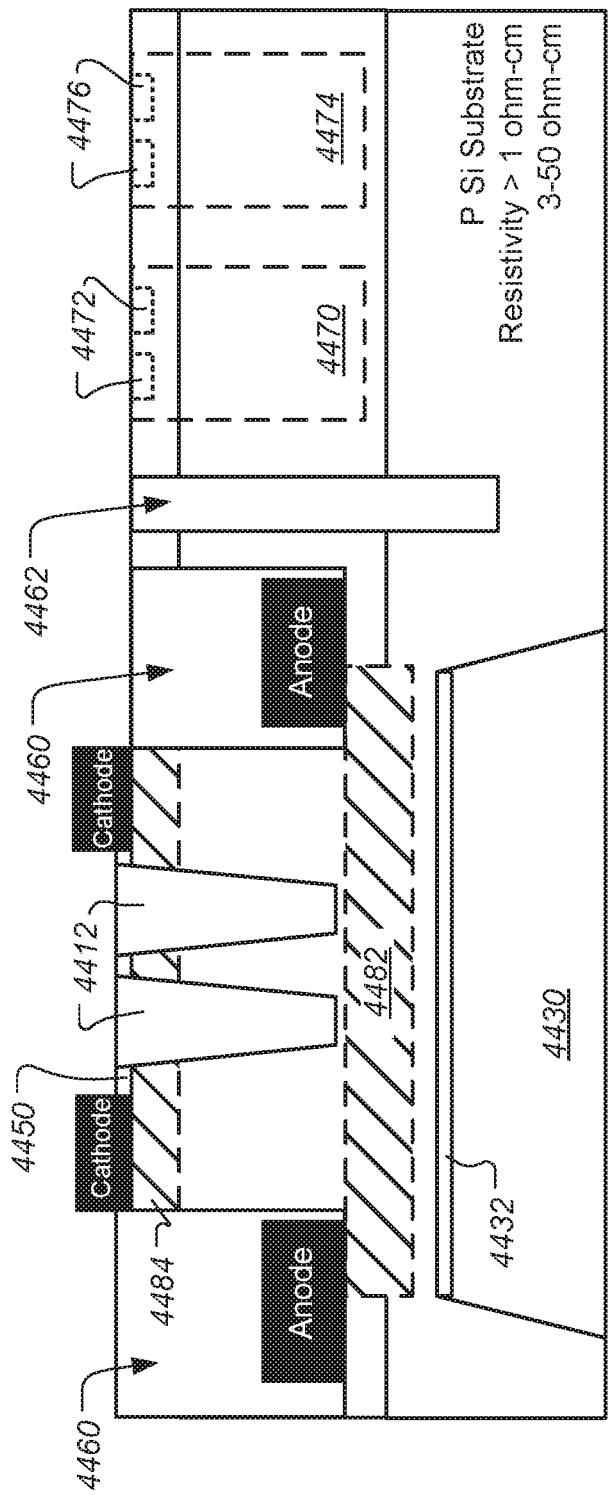

FIGS. 44A-44C are cross section views illustrating some further aspects of MSPD-ASIC monolithic integration, according to some embodiments. FIG. 44A is similar to FIG. 41. An isolation trench 4462 is shown that electrically isolates to some extent the MSPD from the CMOS and/or BiCMOS electronics such as TIA and other ASICs. The electrical isolation would be more complete if the substrate was SOI and the trench 4462 was etched to the buried oxide.

Ion implantation to form region 4482 can be implemented from the bottom surface by first etching a via 4430 with a thickness from the implanted bottom region by 10 or 10s or less than 10 micrometers or so to provide some rigidity during thermal anneal. The bottom implant can be P or N type ions. In addition in some cases, bottom implant can be achieved by implanting through the top surface and create a buried P or N type ions in the bottom region. If ion implantation for the bottom P or N type region is initiated from the top surface, then a via will may not be implemented until after thermal anneal and all other processing is complete. A bottom via 4430 can then be etched that can provide higher refraction index contrast and also transparent metal oxide layer and/or metal layers can be deposited as in FIG. 41 to reduce series resistance and sheet resistance.

In addition in FIG. 44A, P well 4470 and N well 4474 are implanted, P channel 4476 and N channel 4472 are also implanted for the CMOS/BiCMOS electronic transistors. Other layers are not shown for simplicity. See, e.g., Tavernier 2008; Chen et al, A 1.8-V 10-Gb/s Fully Integrated CMOS Optical Receiver Analog Front-End, IEEE JOURNAL OF SOLID-STATE CIRCUITS, VOL. 40, NO. 6, June 2005 (incorporated herein by reference). Data rates of 5, 10, 25, 50 Gb/s or higher BiCMOS TIA are possible. See, e.g: Kuchta et al, A 55 Gb/s Directly Modulated 850 nm VCSEL-Based Optical Link, IEEE Photonics Conference 2012 (IPC 2012) Post Deadline Paper PD 1.5 (incorporated herein by reference); and Lengyel et al, Sensitivity Improvements in an 850-nm VCSEL-Based Link Using a Two-Tap Pre-Emphasis Electronic Filter, JOURNAL OF LIGHTWAVE TECHNOLOGY, VOL. 35, NO. 9, May 1, 2017 (incorporated herein by reference), where MSPDs/MSAPDs can be integrated into such CMOS and/or BiCMOS electronics, ICs for optical receiver applications.

In addition, complex micro electro mechanical systems (MEMS) can be integrated with CMOS electronics. See, e.g., Ghosh et al, On Integrated CMOS-MEMS System-on-Chip, IEEE-NEWCAS Conference, 2005. The 3rd International (incorporated herein by reference); where such processing methods can be used in the MSPD/MSAPD integration with CMOS ICs for optical receiver applications.

In addition, FIG. 44A shows a depth etch monitor layer 4466 that can be implanted with ions such as Ar, Ne, Xe, O, and/or N, so that using a mass spectrometer to monitor the exhaust of etching process if such a monitor ion is detected, the etch depth can be determined. Also shown are upper ion implanted region 4484, mesa etch 4460, microstructure holes 4412, and optional ITO, metal, dielectric coatings 4450.

FIG. 44B shows that after bottom ion implantation and thermal anneal(s) in the integration fabrication process, the via 4430 can be further etched to the desired depth for optimal or near optimal MSPD (or MSAPD) operation.

FIG. 44C shows that a transparent conducting metal oxide such as indium tin oxide (ITO), and/or a metal layer and/or dielectric coatings 4432 can be used on either the bottom and/or the top surface to reduce sheet resistance.

Figure 45:
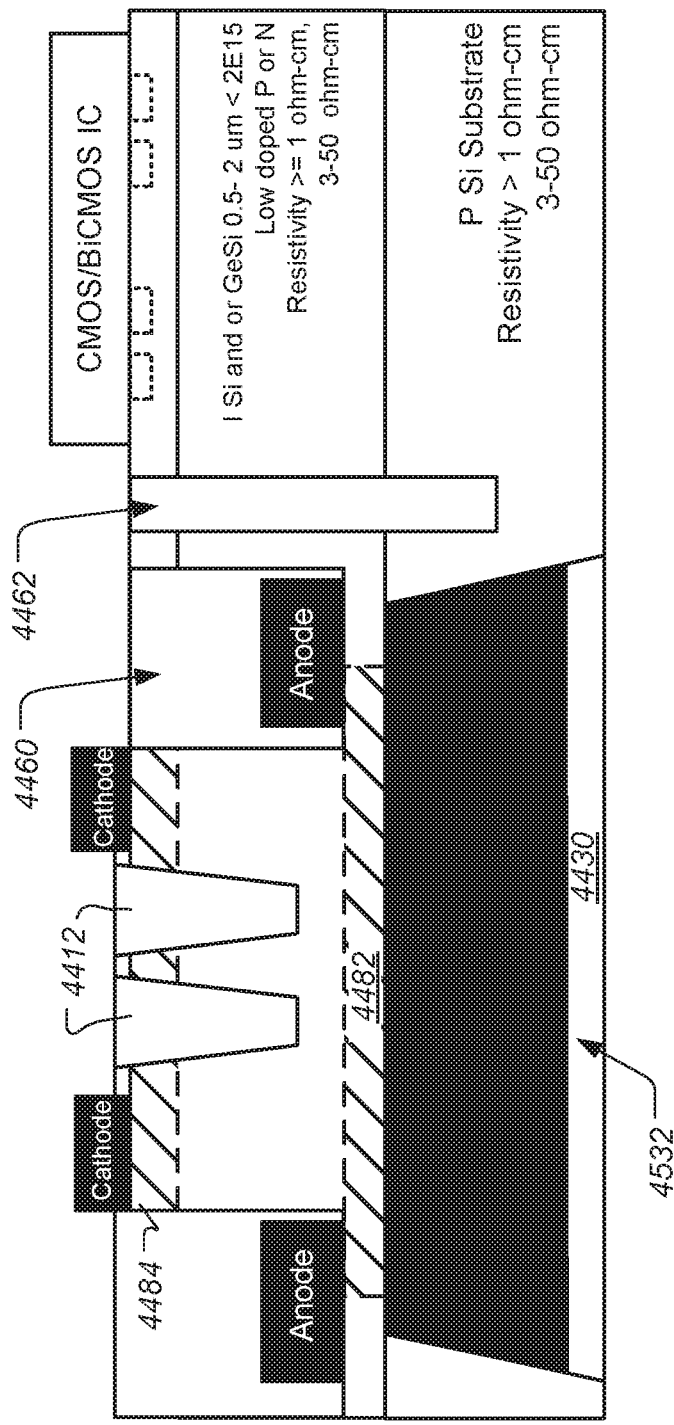
FIG. 45 is a cross section view as in FIGS. 44A-44C illustrating some further aspects of MSPD-ASIC monolithic integration, according to some embodiments.

FIG. 45 is a cross section view as in FIGS. 44A-44C illustrating some further aspects of MSPD-ASIC monolithic integration, according to some embodiments. In this example, the via 4430 can be filled with another material 4532 such as metal, dielectric, poly silicon, amorphous silicon either fully and/or partially to provide heat sinking and/or possibly reinforcement of the MSPD/MSAPD structure and CMOS/BiCMOS IC electronics.

In all of the TIAs, ASICs, and any other electronics described herein, the process can be with CMOS technology and/or BiCMOS technology. Bipolar transistors are known to be able to provide high speed at a larger node. See, e.g., Kalogerakis et al, A Quad 25 Gb/s 270 mW TIA in 0.13 μm BiCMOS with <0.15 dB Crosstalk Penalty, ISSCC 2013/SESSION 7/OPTICAL TRANSCEIVERS AND SILICON PHOTONICS/7.1 (incorporated herein by reference); Knochenhauer et al, 40 Gbit/s transimpedance amplifier with high linearity range in 0.13 mm SiGe BiCMOS, ELECTRONICS LETTERS 12 May 2011 Vol. 47 No. 10 (incorporated herein by reference); Nishihara et al, 10.3 Gbit/s burst-mode PIN-TIA module with high sensitivity, wide dynamic range and quick response, ELECTRONICS LETTERS 31 Jan. 2008 Vol. 44 No. 3 (incorporated herein by reference); and Racanelli et al, SiGe BiCMOS Technology for Communication Products, IEEE 2003 CUSTOM INTEGRATED CIRCUITS CONFERENCE (incorporated herein by reference).

Figure 46:
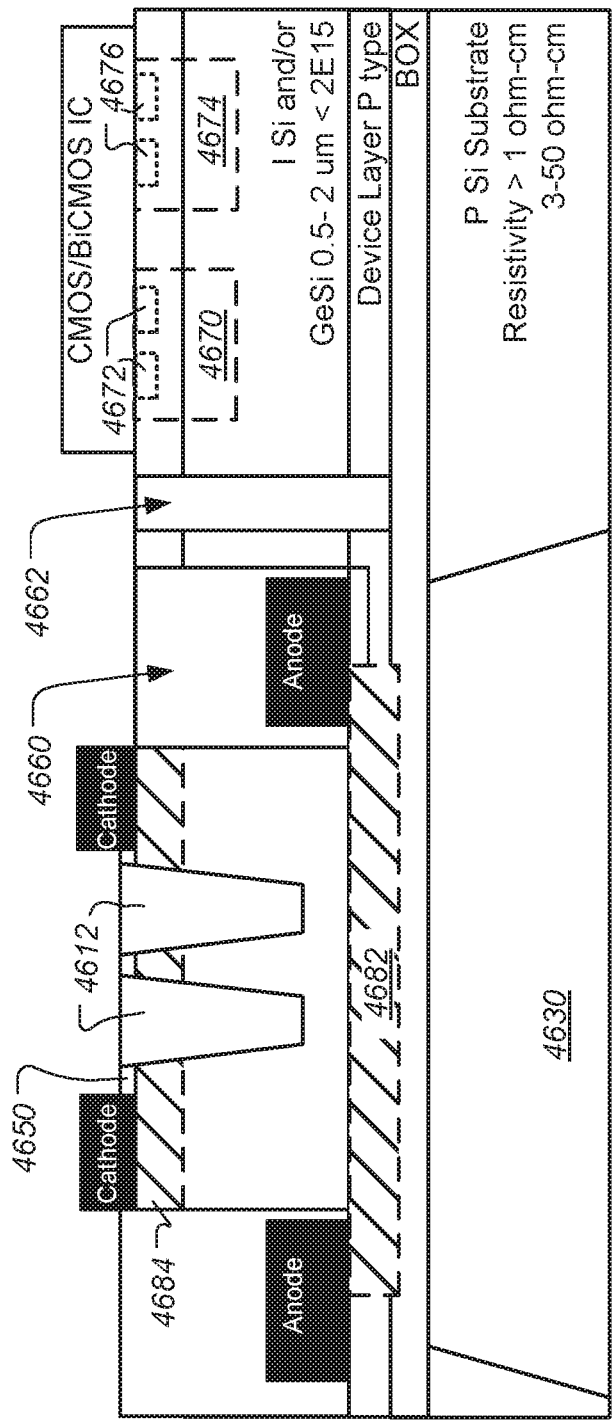
FIG. 46 is a cross section view illustrating some further aspects of MSPD-ASIC monolithic integration, according to some embodiments.

FIG. 46 is a cross section view illustrating some further aspects of MSPD-ASIC monolithic integration, according to some embodiments. The starting wafer is a SOI (silicon on insulator) wafer that can have a P type device layer of thickness 50-500 nm or more and doping range from less than $1 \times 10^{15}$ s/cm$^3$ to greater than $1 \times 10^{20}$/cm$^3$ and where to reduce the sheet resistivity, the device layer can be pre selective area ion implanted and annealed with P (or N) type dopants to a doping concentration ranging from $2 \times 10^{19}$/cm$^3$ to $5 \times 10^{20}$/cm$^3$ or greater to reduce the series and sheet resistance (region 4682). A via 4630 can be opened on the substrate side for additional ion implantation and anneal to further reduce the sheet resistance. The I layer is not intentionally doped and can have a very low N type and in some cases a P type ion concentration of less than $2 \times 10^{15}$/cm$^3$ and with a thickness ranging from 500 nm to 5000 nm and in some cases more than 5000 nm in thickness, and an N type ion such as P, As, Sb can be ion implanted to form a N type region with doping concentration ranging from $1 \times 10^{19}$/cm$^3$ to $2 \times 10^{20}$/cm$^3$ or greater. Thermal annealing can be used to activate the implanted ions. The N type region 4684 thickness can have a range from 50 nm to 500 nm and can be covered with a transparent conducting metal oxide such as ITO 4650 and the microstructured holes 4612 are etch through the ITO and into the I silicon layer and/or I GeSi layer where the Ge fraction can range from 1% or less to 100% where the layer is all Ge. (In all the discussions herein of the I layer, the I layer can be Si and/or GeSI alloy with the Ge fraction ranging from less than 1% to 100%).

An electrical isolation trench 4662 is etched between the MSPD/MSAPD and the CMOS/BiCMOS electronics to minimize electrical interference. The trench can be etched to the BOX layer. Also shown in FIG. 46 are implanted P well 4670 and N well 4674, and P channel 4676 and N channel 4672 for the CMOS/BiCMOS electronic transistors.

Figure 47:
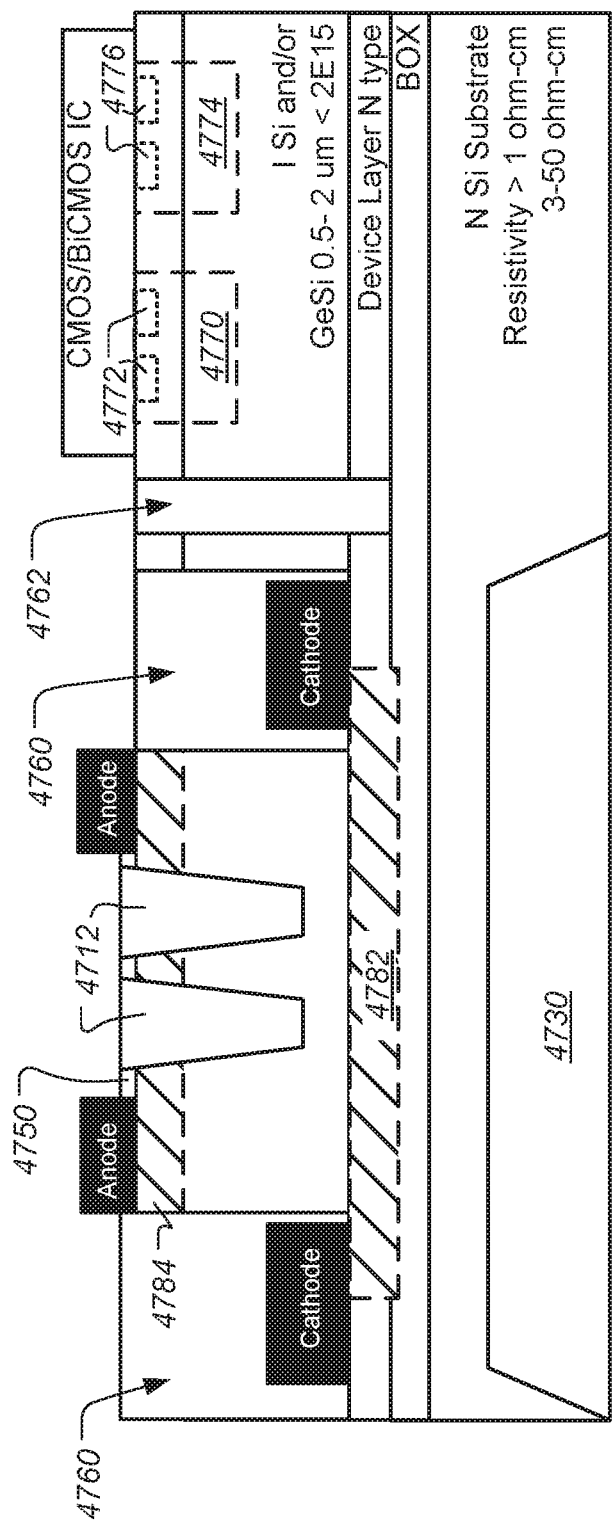
FIG. 47 is a cross section view illustrating some further aspects of MSPD-ASIC monolithic integration, according to some embodiments.

FIG. 47 is a cross section view illustrating some further aspects of MSPD-ASIC monolithic integration, according to some embodiments. In this example, the MSPD has an I layer that is Si and/or GeSi integrated with CMOS and/or BiCMOS integrated circuits (IC). The circuits can be for amplification and signal processing and can include TIA and other signal processing electronics for an application. An SOI substrate with an N type device layer with resistivity less than or equal to 0.03 ohm-cm and in some cases greater than 0.03 ohm-cm. See e.g., http://www.pveducation.org/pvcdrom/materials/general-properties-of-silicon (incorporated herein by reference). In some cases ion implantation of N type ions can be implanted to decrease the resistivity of the region 4782 below the MSPD to less than and/or equal to 0.002 ohm-cm. The N type ion implant can either be implanted from the bottom through the BOX layer which can have a thickness from 500 nm to 4000 nm and/or from the starting SOI wafer where selective area ion implantation can be achieved on the device layer and anneal. The MSPD/MSAPD can then be aligned over the region where the N type ions are implanted and the CMOS/BICMOS can be over regions where it is not ion implanted with N type ions.

In some cases a buried N or P type region can be created by ion implanting through the top surface at high enough energy, 200-400 KeV for example, such that N or P type ions can be implanted in the region at or near the bottom of the I layer and/or the device layer adjacent to the BOX for example.

A via 4730 can be etched to the BOX layer and/or before the BOX layer and additional reflector such as metal and/or Bragg reflectors can be deposited to reflect back the any optical signal that are not absorbed. In addition, the back Si and/or silicon dioxide layer can be patterned with micro/nanostructures to further improve the enhanced absorption of the I layer.

The I layer can be very low doped P or N type, with resistivity greater than 2 ohm-cm for N type and greater than 6 ohm-cm for P type, and in some cases greater than 0.2 ohm-cm. The I layer thickness can range from 500 nm to 5000 nm. The CMOS/BiCMOS layers can be etched off partially and/or completely and P type ions can be implanted at single and/or multiple energies and single and/or multiple species of ions (also applicable to bottom N type ion implant), to create a P type doped region 4784 with thickness ranging from 50 nm to 500 nm and with resistivity less than or equal to 0.002 ohm-cm, and in some cases greater than 0.002 ohm-cm. A transparent conducting metal oxide such as indium tin oxide layer 4750 can be used on the top surface where the holes 4712 can be etched through to reduce the sheet resistivity. An electrical isolation trench 4762 can be etched between the MSPD/MSAPD and the CMOS/BiCMOS ICs. Microstructured holes 4712 can have any shape and can be periodic and/or aperiodic; the surface diameter and/or significant dimension of the holes can range from 300 nm to 3000 nm and in some cases from 400 nm to 2500 nm and in some cases from 500 nm to 3500 nm and spacing between nearest neighboring holes can range from 0 nm to 5000 nm or more. Hole depth can range from 200 nm to 5000 nm and the hole can be etched partially into the I layer, and/or through the I layer and/or pass the I layer to the bottom N or P type layer and/or to the BOX (buried oxide) layer. The hole can have a combination of shapes such as funnel, inverted pyramid, cylindrical, hourglass, spherical, and combination of shapes at different depth of the hole. Hole depth can be uniform and/or non uniform, hole shape can be the same for each hole and/or different for some and/or all holes, hole diameter can be the same and/or different for some and/or all holes, hole spacing with adjacent neighboring holes can be the same and/or different for some and/or all holes. This applies to both MSPDs and MSAPDs. In some cases the microstructure hole depth can range from 50 nm to 5000 nm or more from the surface of the semiconductor.

The MSPD is connected to the CMOS/BiCMOS ICs with a transmission line (not shown) and the MSPD/MSAPD can be 10 to 300 micrometers or more separated from the CMOS/BiCMOS to reduce optical interference with the CMOS/BiCMOS transistors and other circuit elements. A reverse bias is applied to the anode and cathode of −2 to −10 volts and in some cases −2 to −4 volts for MSPD and −5 to −40 volts for MSAPD. Operating wavelength range for Si I layer can range from 750 nm to 1070 nm and for GeSi can range from 750 nm to 1350 nm and in some cases 900 nm to 1350 nm and in some cases 1100 nm to 1350 nm and in some cases 1250 nm to 1550 nm and in some cases 1250 nm to 1650 nm and in some cases to 2000 nm depending on the Ge fraction in the GeSi alloy.

Quantum efficiency can be 20% or greater at at least one or more wavelengths in the wavelength span, and in some cases QE can be 30% or greater and in some cases QE can be 40% or greater and in some cases QE can be 50% or greater and in some cases QE can be 60% or greater and in some cases QE can be 70% or greater and in some cases QE can be 80% or greater and in some cases QE can be 90% or greater for MSPD/MSAPD. MSAPD can have over 100% QE with gain and in some cases over 200% QE with gain and in some cases over 300% QE with gain and in some cases over 400% QE with gain.

Data rates can range from 5 Gb/s to 60 Gb/s or higher and in some cases 10 Gb/s to 25 Gb/s and in some cases 25 Gb/s to 50 Gb/s or more. Also shown in FIG. 47 are mesa etch 4760, as well as implanted P well 4770, N well 4774, P channel 4776 and N channel 4772 for the CMOS/BiCMOS electronic transistors.

Figure 48:
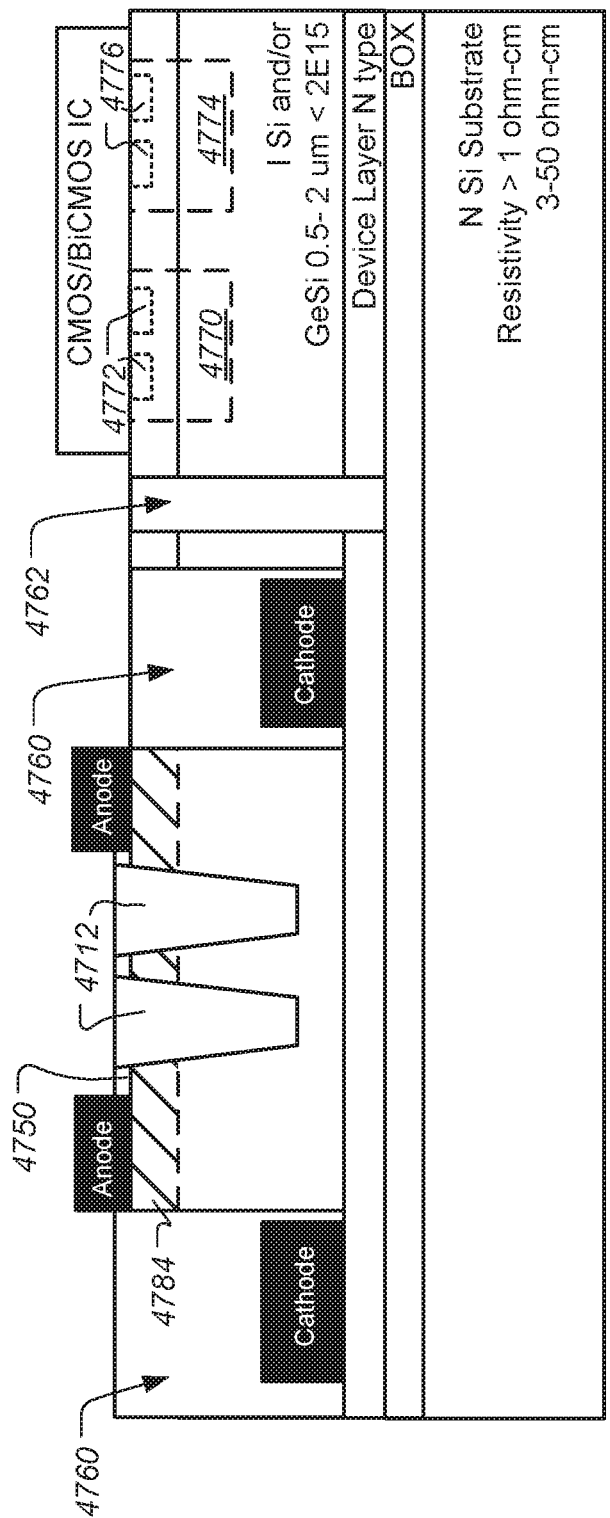
FIG. 48 is a cross section view illustrating some further aspects of MSPD-ASIC monolithic integration similar to FIG. 47, according to some embodiments.

FIG. 48 is a cross section view illustrating some further aspects of MSPD-ASIC monolithic integration similar to FIG. 47, according to some embodiments. The N type device layer of the SOI has sufficiently low resistivity, ranging from 0.005 ohm-cm or less and a thickness range from 100 nm to 500 nm. In some cases the device layer has a resistivity of 1 ohm-cm or more and with a thickness ranging from 50-150 nm, in which case an epitaxial growth of a highly doped N layer is needed with a resistivity of 0.005 ohm-cm or less and with the N layer thickness ranging from 100 nm to 500 nm.

The holes 4712 as in FIG. 47 can be etched partially into the I layer and/or through the I layer and/or to the BOX layer (thickness can range from 100 nm to 5000 nm and in some cases 500 nm to 2000 nm). The I layer can be Si and/or GeSi alloy with the Ge fraction ranging from less than 1% to 100%.

Light and/or optical signal can impinge from the surface with the holes and in some cases light/optical signal can impinge from the substrate side through a via. The optical signal is brought to the MSPD/MSAPD via an optical fiber that can have a lens and is focused onto the surface with a certain numerical aperture such that there may be an angular distribution of light rays that are impinging on the surface of the MSPD/MSAPD.

Figure 49:
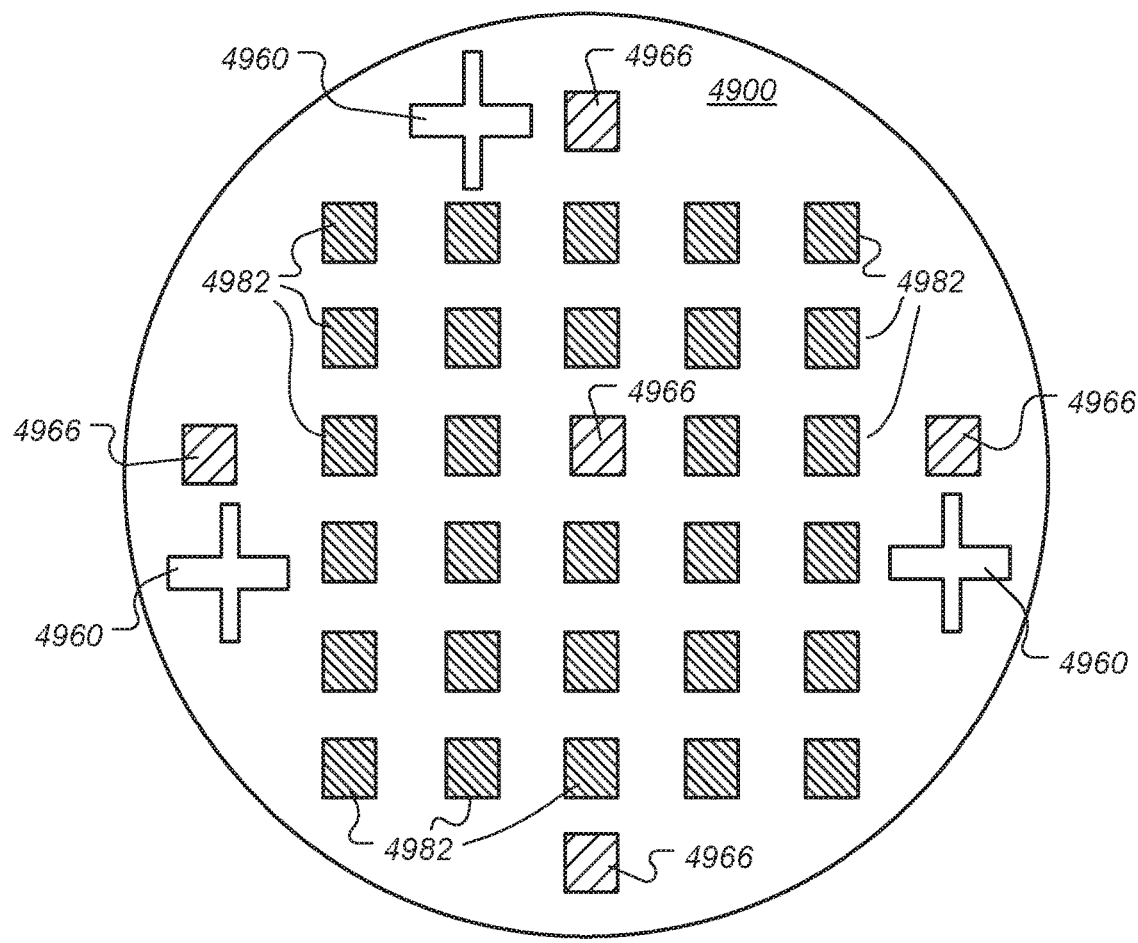
FIGS. 49, 50A and 50B are top views and a cross section view illustrating some aspects of selective ion implantation for MSPD-ASIC monolithic integration, according to some embodiments.
Figure 50A:
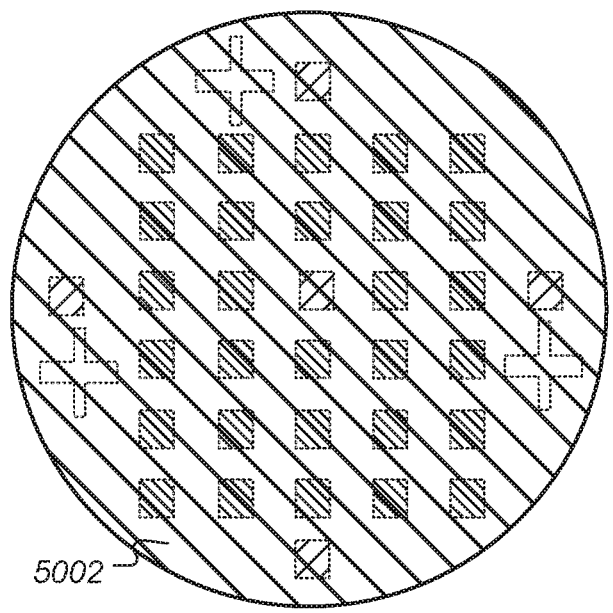
Figure 50B:
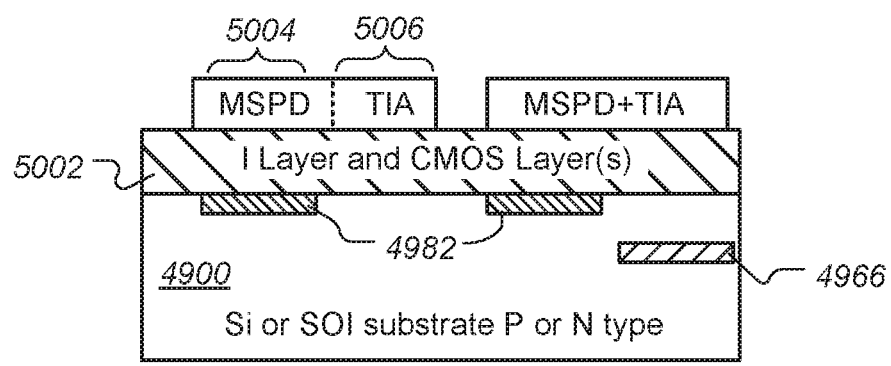

FIGS. 49, 50A and 50B are top views and a cross section view illustrating some aspects of selective ion implantation for MSPD-ASIC monolithic integration, according to some embodiments. FIG. 49 is a top view showing a starting Si or SOI wafer 4900 where it was masked for selective area ion implantation and where the square or any other shapes such as rectangular, oval, circular, and any combination of shapes, regions 4982 on the surface are areas that are implanted with P and/or N type ions to a resistivity ranging from equal to or less than 0.01 ohm-cm to equal to or less than 0.001 ohm-cm following a thermal anneal process, usually rapid thermal anneal. In addition to the P and/or N type regions 4982 selectively implanted with single and/or multiple ion species and single and/or multiple ion implantation energies, other regions 4966 can be implanted with marker ions such as Ar, Ne, Xe, N, O, and/or Al, at the same and/or different energies. Typically higher energies are used for deeper implants, as an aid for back side via etching to determine the depth of the etching process by monitoring the exhaust from the etching chamber with a mass spectrometer analyzer. Once the marker ions are seen on the mass spectrometer, the approximate depth of the etching can be determined. Further alignment marks 4960 can be created by etching a mesa or by implanting a metal ion such as Al, Cu, Ni and/or V, so that alignment marks 4960 can be seen by a backside infrared illumination and the mask can be placed such that the MSPD/PSAPD is over the N and/or P type implanted areas 4982. Other alignment marks may also be used for example O and/or N ion implant to create an oxide or nitride rich region such that subsequent epitaxial growth over the alignment marks can result in a polycrystalline, microcrystalline and/or amorphous Si so that it appears different from a shiny single crystal epitaxial regions.

FIG. 50A is a top view of a Si or SOI wafer shown in FIG. 49 that was selective area ion implanted, thermally annealed and an I layer 5002 of Si and/or GeSi and CMOS/BiCMOS layer(s) grown on top of the selective area implanted Si or SOI wafer. FIG. 50B is cross sectional view showing the buried selective area ion implanted regions 4982 and an MSPD/MSAPD 5004 fabricated over one of the selective area ion implanted regions 4982 and the CMOS/BiCMOS IC 5006 is fabricated over areas not directly above regions 4982 that have a buried P and/or N type ions.

Figure 51:
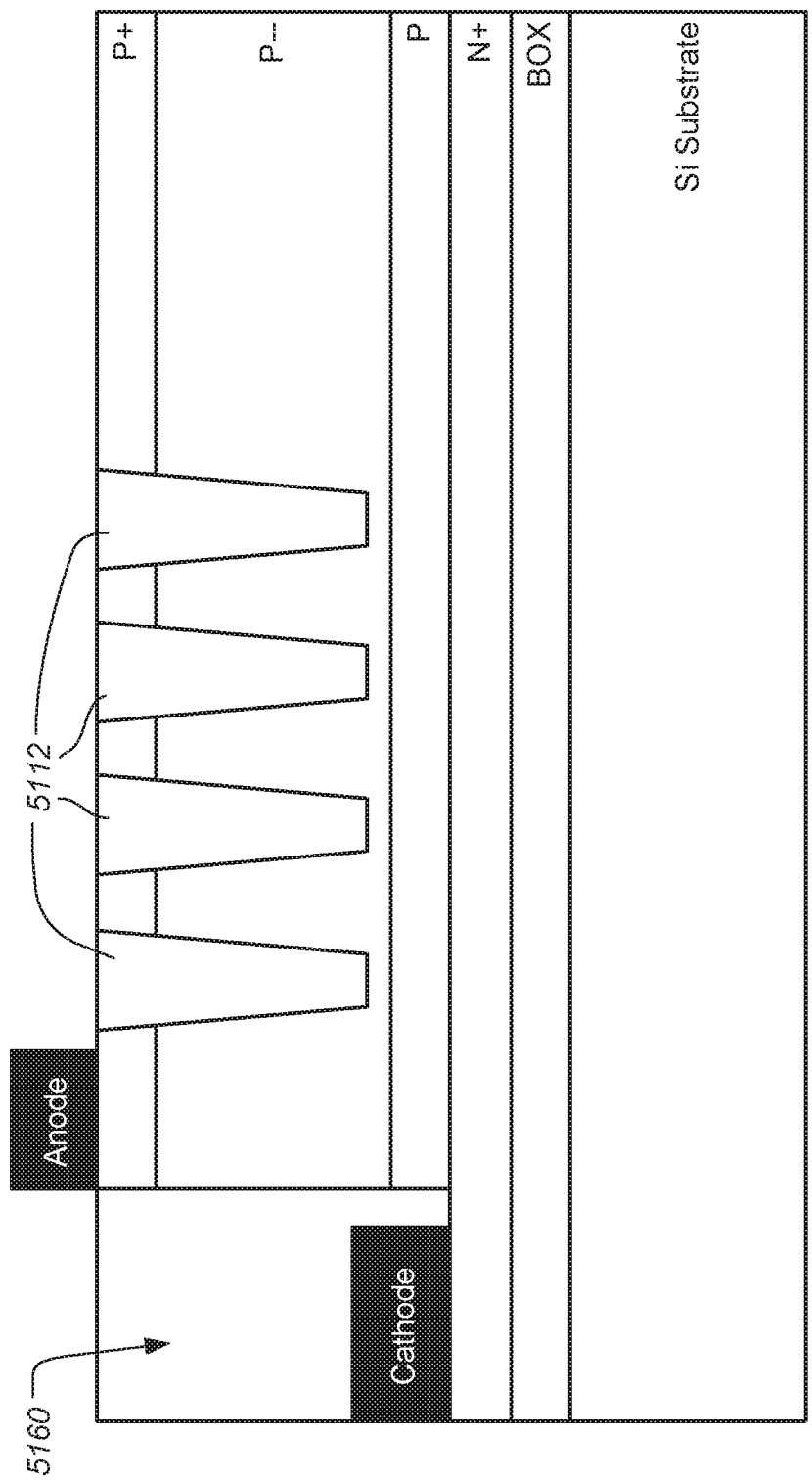
FIG. 51 is a cross sectional view of a microstructured avalanche photodiode (MSAPD) with a $P^+P^{--}PN^+$ structure on SOI wafer, according to some embodiments.

FIG. 51 is a cross sectional view of a microstructured avalanche photodiode (MSAPD) with a $P^+P^{--}PN^+$ structure on SOI wafer, according to some embodiments. The MSAPD can also be formed on a P or N type silicon wafer, in which case a via (not shown) may be etched on the bottom as described elsewhere herein for MSPD structures. The layer structure for the MSAPD is similar to that of a conventional silicon APD. See e.g., WÊGRZECKA et al, Design and properties of silicon avalanche photodiodes, OPTO-ELECTRONICS REVIEW 12(1), 95-104 (2004) (incorporated herein by reference). In the MSAPD structure, some and/or all the layers can be Si and/or GeSi grown either on Si P or N type or SOI wafers. The $N^+$ layer can be grown on a SOI wafer with a device layer that is N type for example and where the device layer thickness can range from 50 nm to 200 nm and the $N^+$ layer can have a thickness ranging from 100 nm to 500 nm. In some cases, as described herein for MSPDs the device layer can either be selective area implanted with N type dopant and/or implanted from the bottom through a via and through the BOX layer and/or from the top surface at a high ion acceleration energy and create a buried implant into the device layer. The $N^+$ layer can have a resistivity ranging from equal to or less than 0.006 ohm-cm. The P layer adjacent to the $N^+$ layer can have a thickness ranging from 50 nm to 650 nm with a resistivity ranging from 0.2 to 0.06 ohm-cm followed by a $P^{--}$ layer with a thickness ranging from 500 nm to 5000 nm with a resistivity ranging from equal to or greater than 3 ohm-cm followed by $P^+$ layer that can be ion implanted with ions such as B, Al, Ga, In for example with a thickness ranging from 50 nm to 500 nm and with a resistivity ranging from equal to or less than 0.002 ohm-cm. The top surface can include a transparent conducting metal oxide such as indium tin oxide (ITO) (not shown) to further reduce the sheet resistivity. The microstructure holes 5112 can be etched through the ITO and partially into the I layer that can be Si and/or GeSi where the Ge fraction can be less than 1% to 100%. The holes are as described elsewhere herein for MSPDs and can have any shape and/or combination of shapes that include funnel, inverted pyramids, cylindrical, spherical, polygonal, hourglass, and can be etched partially into the I layer and/or through the I layer and/or into the bottom P layer and/or to the bottom $N^+$ layer and/or to the BOX layer. The hole diameter and/or significant lateral dimension can range from 350 nm to 5000 nm and in some cases from 500 nm to 2500 nm and can have uniform hole diameters and/or non uniform hole diameters and the spacing of the holes with adjacent neighboring holes can range from 0 nm to 5000 nm and in some cases from 100 nm to 3000 nm. The cathode is formed on the $N^+$ layer (in mesa etch 5160) and the anode formed on the $P^+$ layer. The MSAPD can be operated in a reverse bias mode between the cathode and anode with w voltage range of −6 Volts to −25 Volts. The MSAPD can have a gain of 2 to 10 dB or more and can have a gain bandwidth product of 60 Gb/s or higher and in some cases 100 Gb/s or higher and in some cases 200 Gb/s or higher and in some cases 300 Gb/s or higher. The operation wavelength can have a range from 750 nm to 1070 nm and in some cases 850-950 nm and in some cases 900 nm to 1060 nm and in some cases 950 nm to 1250 nm and in some cases 1250-1350 nm and in some cases 1250 to 1550 nm and in some cases 1000 nm to 2000 nm. In some cases, an I layer can be between the P and $N^+$ layer and can be called the multiplication layer as discussed previously in MSAPD structures. In FIG. 51, the multiplication takes place in and around the PN+ interface where the electric field is the highest.

The light and/or optical signal can impinge from the surface with the holes and in some cases, with a via (not shown), light can impinge from the bottom substrate side.

Figure 52:
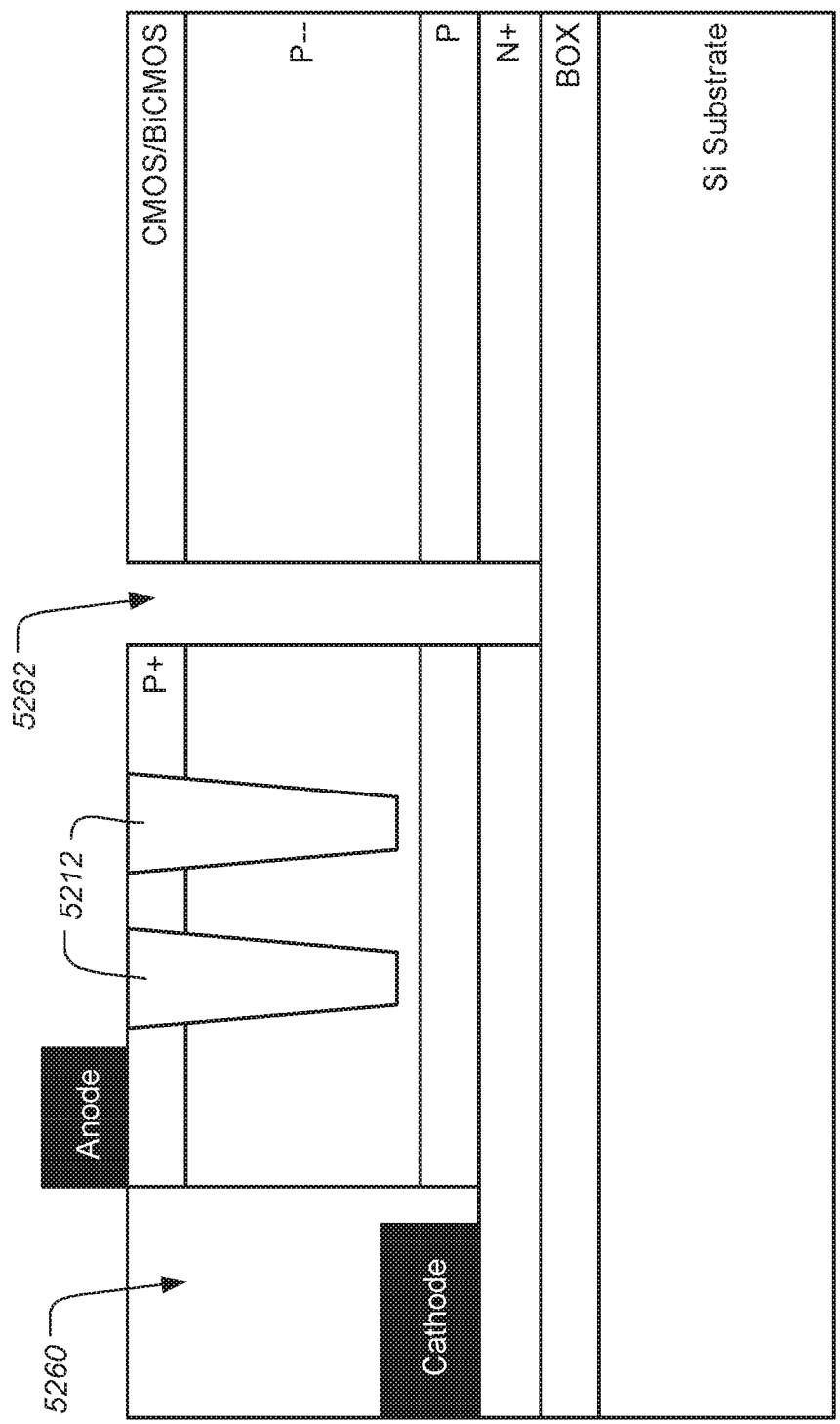
FIG. 52 is a cross section view of a MSAPD integrated with CMOS/BiCMOS ICs such as TIA and other ASICS for signal processing, according to some embodiments.

FIG. 52 is a cross section view of a MSAPD integrated with CMOS/BiCMOS ICs such as TIA and other ASICS for signal processing, according to some embodiments. As in earlier discussions herein on selective area ion implantation, the $N^+$ layer can be a selective area ion implanted region in which case only a P layer need to be grown on the substrate followed by $P^{--}$ followed by CMOS and/or BiCMOS layer (s) and the P region for the MSAPD can be ion implanted with P type ions. In addition in some cases as discussed earlier for MSPD, ion implantation for the $N^+$ layer can be implanted with N type ions from the bottom through a via and through the BOX, in which case the device layer of the SOI can be N or $N^-$ doping.

The device layer of a SOI (layer on top of the BOX) is typically low doped P or N and can have a thickness ranging from 50-300 nm which is not shown in FIG. 52 for simplicity. A $N^+$ layer is grown on the device N layer with resistivity of 0.006 ohm-cm or less and with a thickness range of 100-500 nm, followed by a P layer of resistivity ranging from 0.07 to 0.3 ohm-cm and a thickness ranging from 50 to 700 nm (in some cases an I layer can be inserted between the $N^+$ and P to form a $N^+IP$ structure where the I layer can have a resistivity of 0.3 ohm-cm or higher and in some cases 1 ohm-cm or higher and a thickness ranging from 300 to 600 nm) followed by a $P^{--}$ layer with resistivity of 1 ohm-cm or greater and in some cases 8 ohm-cm or greater and in some cases 30 ohm-cm or greater, and with a thickness range of 200 nm to 5000 nm followed by P type ion implantation to the top surface of the $P^{--}$ layer to form $P^+$ region with resistivity less than or equal to 0.002 ohm-cm and with a thickness ranging from 50 nm to 500 nm. Ion implantation can have single and/or multiple acceleration energies and can have single and/or multiple ion species for either the top and/or bottom implants and/or selective area ion implants. A rapid thermal anneal activate the implanted ions and anode and cathode and microstructure holes 5212 can be formed as in FIG. 51.

An electrical isolation trench 5262 is etched as shown in FIG. 52 to isolate the MSAPD from the CMOS/BiCMOS electronics. In some cases, the electronics can be shielded from stray optical signal with a light blocking polymer form for example. Other light blocking methods such as metal, polymer, form can be used. Black polymer form layer can have a low dielectric constant and can be less of a loading factor to the high frequency microwave signals. The isolation trench 5262 can also be partially or fully filled with a light blocking material such as a polymer form, and/or dielectric and/or metal layer for example.

Optical signals can impinge from the top (surface illuminated) and/or from the bottom through a via (bottom illuminated) and the whole integrated chip can be attached to a printed circuit board either holes facing up or holes facing down using solder bump technology and TSV (through silicon via) to connect the integrated chip electrical and microwave connections to the printed circuit board and/or other boards to external electronics.

A reverse bias is applied to the anode and cathode of the MSAPD with voltages ranging from −6 volts to −25 volts, in some cases −10 V to −25V.

The diameter of the mesa formed by mesa etch 5260 that defines the junction area and therefor the junction capacitance can range from 20 to 200 micrometers and in some cases 30 to 100 micrometers and in some cases 30 to 80 micrometers for the MSPD/MSAPD structures. The mesa can also have other shapes such as square, rectangular, polygonal, to name a few. For lower data rate applications, less than 5 Gb/s, the diameter or diagonal can range from 100 to 500 micrometers. The smaller diameters are mainly for high data rate applications with datarate equal to or greater than 10 Gb/s and in some cases equal to or greater than 25 Gb/s and in some cases equal to or greater than 50 Gb/s.

Figure 53:
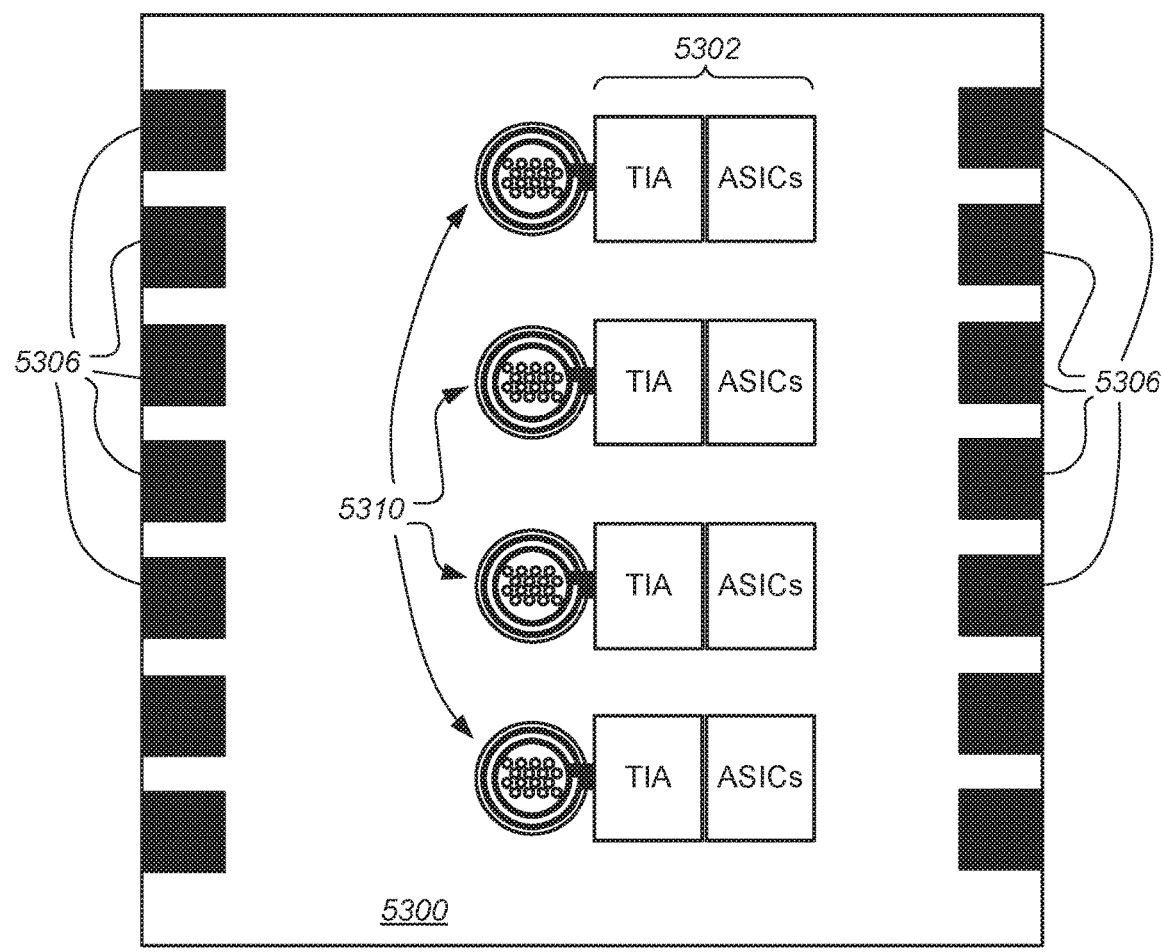
FIG. 53 is a top view schematic of an array of MSPDs/MSAPDs integrated with CMOS/BiCMOS ICs such as TIA and other signal processing ASICs, according to some embodiments.

FIG. 53 is a top view schematic of an array of MSPDs/MSAPDs integrated with CMOS/BiCMOS ICs such as TIA and other signal processing ASICs, according to some embodiments. A single chip 5300 with bond pads 5306 includes an array of MSPDs/MSAPDs 5310 integrated with electronics 5302. In some cases the electronics 5302 can be a single block with transmission lines running to different MSPDs/MSAPDs 5310. The number of MSPDs/MSAPDs 5310 in an array can be 1 to 100 or more and in some cases from 2-16 and can be arranged in any fashion. The distance of the MSPDs/MSAPDs 5310 to the electronics 5302 can have a range from 10 micrometer or less to 300 micrometers or more, and depends on the size of the array and bandwidth of the application and size of the MSPD/MSAPD.

In addition, MEMS (microelectromechanical systems) structures can be implemented on top and/or below the MSPD/MSAPD such that a tunable filter can be integrated together on the MSPD/MSAPD and CMOS/BiCMOS electronics to allow coarse wavelength division multiplexing.

A silicon process allows the integration of MEMS, MSPD/MSA{D and CMOS/BiCMOS ICs to be integrated on a single silicon chip. See e.g., Xie et al, Post-CMOS Processing for High-Aspect-Ratio Integrated Silicon Microstructures, JOURNAL OF MICROELECTROMECHANICAL SYSTEMS, VOL. 11, NO. 2, April 2002 (incorporated herein by reference).

Figure 54:
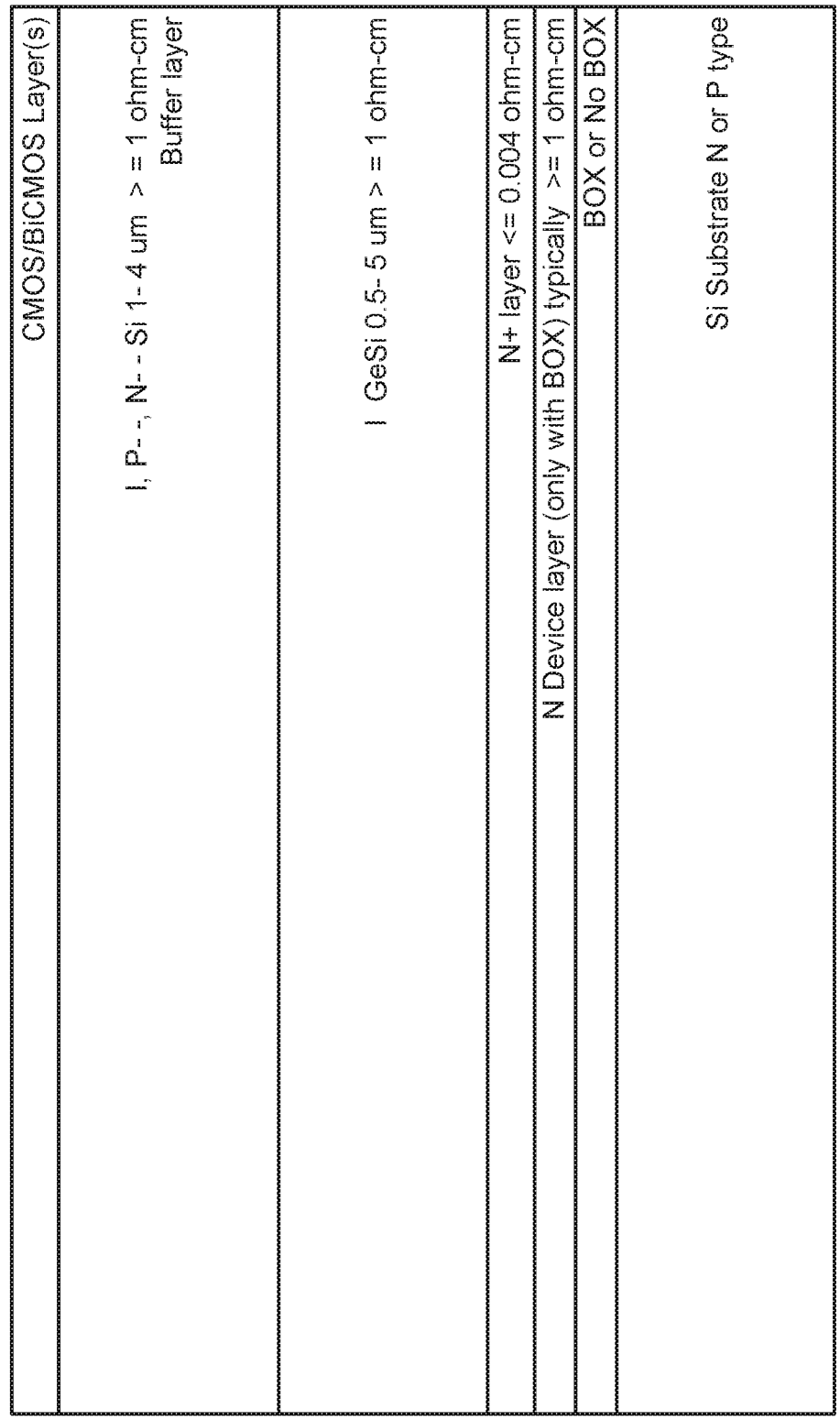
FIG. 54 is a cross section of a possible layer structure for integrating MSPD/MSAPD with CMOS/BiCMOS electronics, according to some embodiments.

FIG. 54 is a cross section of a possible layer structure for integrating MSPD/MSAPD with CMOS/BiCMOS electronics, according to some embodiments. In the structure shown, a buffer layer of an intrinsic I layer and/or very low doped $P^{--}$ type layer, often also referred to as a π layer and/or a very low doped $N^{--}$ type layer also referred to as an ν layer in the scientific literature. The very low doping layers can have a resistivity of greater than or equal to 1 ohm-cm and in some cases greater than or equal to 10 ohm-cm. The Si buffer layer can have a thickness range of 1 to 4 micrometers. In some cases, the Si buffer layer may contain Ge such that it can be GeSi with Ge fraction less than a few percent. The buffer Si (or GeSi) layer can be between the CMOS/BiCMOS layer(s) and the GeSi I layer (which can be low and/or very low doped P and N type material also with resistivity greater than or equal to 1 ohm-cm.) The GeSi I layer can range in thickness from 0.5 to 2 micrometers and in some cases can range from 0.5 to 5 micrometers. Below this I Ge Si layer can be a Si or GeSi N+ layer with resistivity less than or equal to 0.006 ohm-cm with thickness ranging from 0.05 to 0.5 micrometers. Below the Si of GeSi N+ layer is can be an N type device layer with thickness ranging from 0.05 to 0.5 micrometers and typically with a resistivity equal to or greater than 1 ohm-cm. Below this can be a BOX layer with thickness ranging from 0.5 to 5 micrometers on top of a handle silicon wafer that can be N type and in some cases P type.

According to some embodiments, all herein described ranges and/or values in thicknesses, resistivity, doping, ion implant depth and energies, hole diameters/diagonals, hole spacing, hole depth, quantum efficiencies, responsivity, bias voltages, data rates, operational wavelengths, sheet resistances, photosensitive areas and diameters/diagonals, capacitances, and any other ranges/parameters are not fixed and can vary outside the range suggested by from plus or minus a few percent to 50% or more.

The buffer layer may or may not be needed for CMOS/BiCMOS device fabrication to minimize interference with its standard process. In some cases the BOX may not be needed. In some cases a via (not shown) can be opened to allow further ion implantation into the N and N+ layers (in some cases it can be P and P+ type layers depending on the MSPD/MSAPD layer doping structures) and in some cases, the wafer can be selective area ion implanted such that the MSPDs/MSAPDs are over the heavily doped areas of the silicon or SOI wafer.

Figure 55:
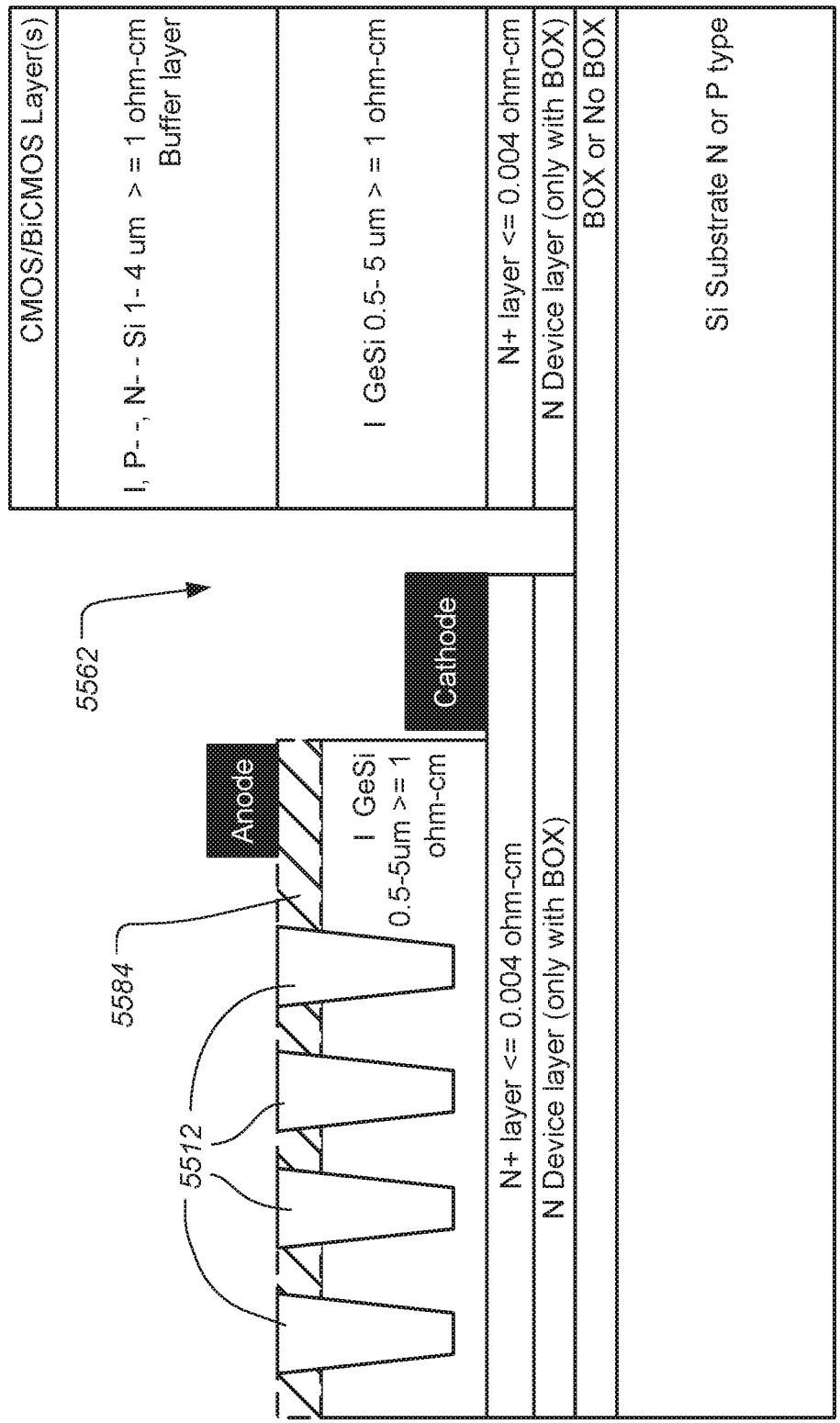
FIG. 55 is a cross section view illustrating some aspects of MSPD/MSAPD integration with CMOS/BiCMOS integrated circuits, according to some embodiments.

FIG. 55 is a cross section view illustrating some aspects of MSPD/MSAPD integration with CMOS/BiCMOS integrated circuits, according to some embodiments. The MSPD(s) and/or MSAPD(s) with the inclusion of an avalanche region(s), are integrated with CMOS/BiCMOS integrated circuits such as TIA(s), and/or other signal enhancements and/or processing and/or storage and/or communication ASICs. Many parts are not shown such as CMOS/BiCMOS transistors, capacitors, inductors, resistors, interconnect layers to form the ICs, transmission line between the MSPD(s)/MSAPD(s) to the ICs, isolation layers, additional transparent conducting metal oxide layer(s) to reduce sheet resistance, anti-reflection coatings, and passivations for simplicity and clarity.

The CMOS/BiCMOS ICs are first processed fully and/or partially followed by the processing of the MSPD/MSAPD. The buffer layer can be etched off and selective area ion implantation, by masking off regions not intended for ion implantation with polymer and/or metal layer(s), of P type ions can be implanted into the I GeSi layer (or Si layer in some cases) to form a highly doped P type region 5584 with resistivity less than or equal to 0.003 ohm-cm with a thickness ranging from 0.05 to 0.3 micrometers using single and/or multiple ion implant energies and single and/or multiple ion implant species. A transparent conducting metal oxide (not shown) can be deposited on the P region to further reduce the sheet resistance. Holes 5512 can then be etched through the transparent conducting metal oxide such as indium tin oxide and into the I GeSi (or in some cases Si layer) as also described herein supra. In some cases the P and N type can be reversed, where the top implant can be N type and the bottom layer can be P type. The anode is formed on the P type region 5584 and cathode on the N type layer/regions. An electrical isolation trench 5562 can be etched between the MSPD/MSAPD and the CMOS/BiCMOS ICs.

In some cases, the bottom N or P layer can be formed by ion implantation from the top surface at high energy creating a buried N or P region. BOX layer can be used to minimize diffusion current generated outside the high field I or low doped regions; however without BOX then an etch stop layer such as a highly doped P layer can be used when etching vias.

The GeSi I layer or very low doped layer can have Ge fraction ranging from a few percent to 100 percent. In some cases the Ge fraction can range from 1 to 10%, in some cases between 10 and 20%, and in some cases between 20-40% and in some cases between 40-80% and in some cases between 80-100%.

The microstructured holes 5512 can be etched wet and/or dry partially into the I layer and/or through the I layer and/or to the BOX layer. The holes can be funnel, cylindrical, rectangular, triangular, polygonal, and can vary in lateral dimension as a function of etch depth. Hole diameter, diagonal can range from 300 nm to 5000 nm and in some cases from 450 nm to 2500 nm and in some cases from 500 nm to 2500 nm. Hole spacing can range from 50 nm to 5000 nm and in some cases from 300 nm to 3000 nm. Operating wavelength can range from 750 nm to 2000 nm and in some cases 840 nm to 1065 nm and in some cases 1100 nm to 1350 nm and in some cases 1550 nm to 2000 nm and in some cases from 1200 nm to 1550 nm. Data rates can range from 1 Gb/s to 5 Gb/s and in some cases 1 Gb/s to 10 Gb/s and in some cases 5 Gb/s to 25 Gb/s and in some cases 4 Gb/s to 10 Gb/s and in some cases to 50 Gb/s or higher. Responsivity can be 0.2 A/W or higher at at least one of the wavelengths in the wavelength span. And in some cases 0.1 A/W or higher at at least on wavelength and in some cases 0.3 A/W or higher at at least one wavelength in the span and in some cases responsivity can be 0.5 A/W or higher at at least one wavelength in the wavelength span.

The optical signal can impinge from the top surface where the microstructured holes 5512 are etched and in some cases the optical signal can impinge from the bottom surface through a via (not shown) such as a through a silicon via (TSV).

Additional coatings can be included to further enhance the absorption by reflecting any stray optical signal back toward the microstructure holes as discussed earlier. The coating can be metal and/or dielectric on either of the top or bottom surfaces.

In addition, the die can contain either a single MSPD/MSAPD and CMOS/BiCMOS electronics or multiple MSPDs/MSAPDs and CMOS/BiCMOS electronics for parallel optical fiber applications or CWDM applications. Other applications can include LIDAR, free space optical links, sensors, data center optical interconnect, and fiber to the home.

In the integrated MSPD and CMOS/BiCMOS electronics the MSPD is operated at a reverse bias between the anode and cathode with applied reverse bias voltage ranging from −1V to −5V.

Doped regions that are created by ion implantation methods can also be created using diffusion methods and/or a combination of diffusion and ion implantation.

Figure 56:
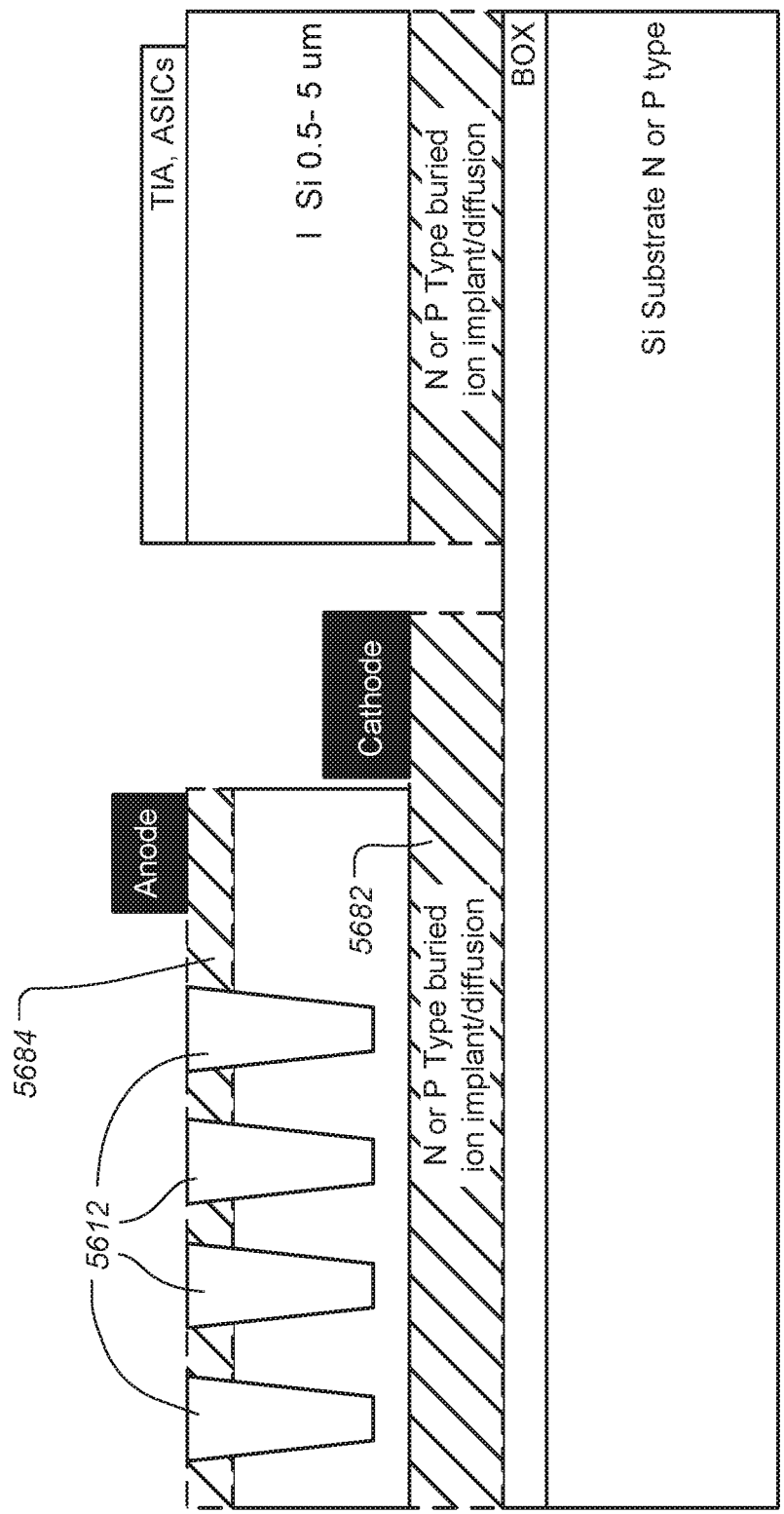
FIG. 56 is a cross section view illustrating some aspects of MSPD/MSAPD integration with CMOS/BiCMOS integrated circuits, according to some embodiments.

FIG. 56 is a cross section view illustrating some aspects of MSPD/MSAPD integration with CMOS/BiCMOS integrated circuits, according to some embodiments. The MSPD/MSAPD is integrated with CMOS/BiCMOS electronics that are fabricated using standard CMOS/BiCMOS processes. The electronics may include additional CMOS/BiCMOS layer(s). The structure uses an I or very low doped P or N type Si layer on an optional BOX. The bottom N or P type region 5682 can be buried ion implanted and/or diffusion before the growth of the I layer and/or low doped layer. In some cases the buried implant can be a selective area implant such that only regions under the photodiode is implanted and/or selective area diffusion. In some cases, a blanket ion implantation and/or diffusion may be used. Thermal anneal can be used to activate the ion implanted areas with P and/or N type dopants. The buried N or P layer 5682 can be close to the BOX layer, when a BOX layer is included. The buried N or P layer 5682 can have a resistivity of less than or equal to 0.01 ohm-cm and in some cases less than or equal to 0.002 ohm-cm. The buried implanted region 5682 can have a thickness of 100 nm to 500 nm. In some cases the buried N or P type layer 5682 can be doped using a diffusion method instead of ion implantation and the diffusion of dopants can be selective area diffusion. The N or P doped region 5682 can then be buried by the growth of the I or low doped layer. In some cases, during epitaxial growth, some dopant may diffuse into the I or low dope region. See, e.g., Swoboda. The I or low doped region can have a layer thickness ranging from 0.5 to 5 microns and in some cases 0.5 to 2 microns and a resistivity in the neighborhood of 1-10 ohm-cm or greater.

The top surface layer 5684 can be P (or N) type ion implantation and/or diffusion also with resistivity less than or equal to 0.002 ohm-cm with a thickness ranging from 100-500 nm. In addition a transparent conducting metal oxide can be used on the top surface to further reduce the sheet resistance.

The microstructured holes 5612 can be etched wet and/or dry partially into the P or N doped region and/or partially into the I layer or low doped P or N layer, and/or through the I layer or low doped P or N layer, and/or to the BOX layer and/or to the bottom doped layer in the case without a BOX. The holes 5612 can be funnel, cylindrical, inverted pyramid, ball shaped, rectangular, triangular, polygonal, and can vary in lateral dimension as a function of etch depth. Hole diameter, diagonal can range from 300 nm to 3500 nm and in some cases from 450 nm to 2500 nm and in some cases from 500 nm to 2500 nm. Hole spacing can range from 50 nm to 3500 nm and in some cases from 300 nm to 3000 nm. Operating wavelength can range from 750 nm to 1065 nm and in some cases 840 nm to 1065 nm and in some cases 950 nm to 1065 nm and in some cases 840 nm to 1100 nm. Data rates can range from 1 Gb/s to 5 Gb/s and in some cases 1 Gb/s to 10 Gb/s and in some cases 10 Gb/s to 25 Gb/s and in some cases 4 Gb/s to 10 Gb/s and in some cases 25-50 Gb/s or higher. Responsivity can be 0.2 A/W or higher at at least one of the wavelengths in the wavelength span. And in some cases 0.1 A/W or higher at at least on wavelength. And in some cases 0.3 A/W or higher at at least on wavelength. And in some cases 0.4 A/W or higher at at least on wavelength. And in some cases 0.5 A/W or higher at at least on wavelength.

The integrated MSPD is operated at a reverse bias between the anode and cathode with a reverse bias voltage ranging from −1 V to −5 V.

The integrated MSPD/MSAPD and CMOS/BiCMOS electronics can be a single or multiple MSPD/MSAPD and electronics for parallel fiber and/or CWDM applications. Other applications can include LIDAR, free space optical communication, data center optical interconnect, high performance computing, fiber to the home, sensors, and Lifi.

The optical signal can impinge from the top, surface illuminated, and/or from the bottom through a via (not shown).

The photosensitive region of the MSPD/MSAPD can be circular, rectangular, polygonal, quarter circle, or any other shape. For circular photosensitive the diameter can range from 10 micrometer to 500 micrometer or more depending on the application and data rate needed. For data rates of 10 Gb/s to 25 Gb/s the diameter can range from 20 micrometer to 80 micrometer or more for example. For lower data rate applications, larger area MSPD/MSAPD can be used with diameter ranging from 50 to 500 micrometers or more.

In some cases, using a standard CMOS wafer and fabricating a silicon photodiode as discussed in Tavemier 2008, the responsivity at 850 nm was reported as 5 mA/W. With the addition of microstructured holes to the silicon photodiode, the responsivity can be significantly improved by several factors and in some cases by order of magnitude or more. With the addition of microstructured holes, the absorption of silicon photodiodes can be enhanced and extend the operational wavelength to 900 nm and in some cases to 990 nm and in some cases to 1065 nm and in some cases to 1100 nm and in some cases to 1170 nm. See, e.g., Tavemier 2008. With the addition of a few percent or more of Ge to form a GeSi I layer, the wavelength can be further extended beyond 1170 nm.

Figure 57:
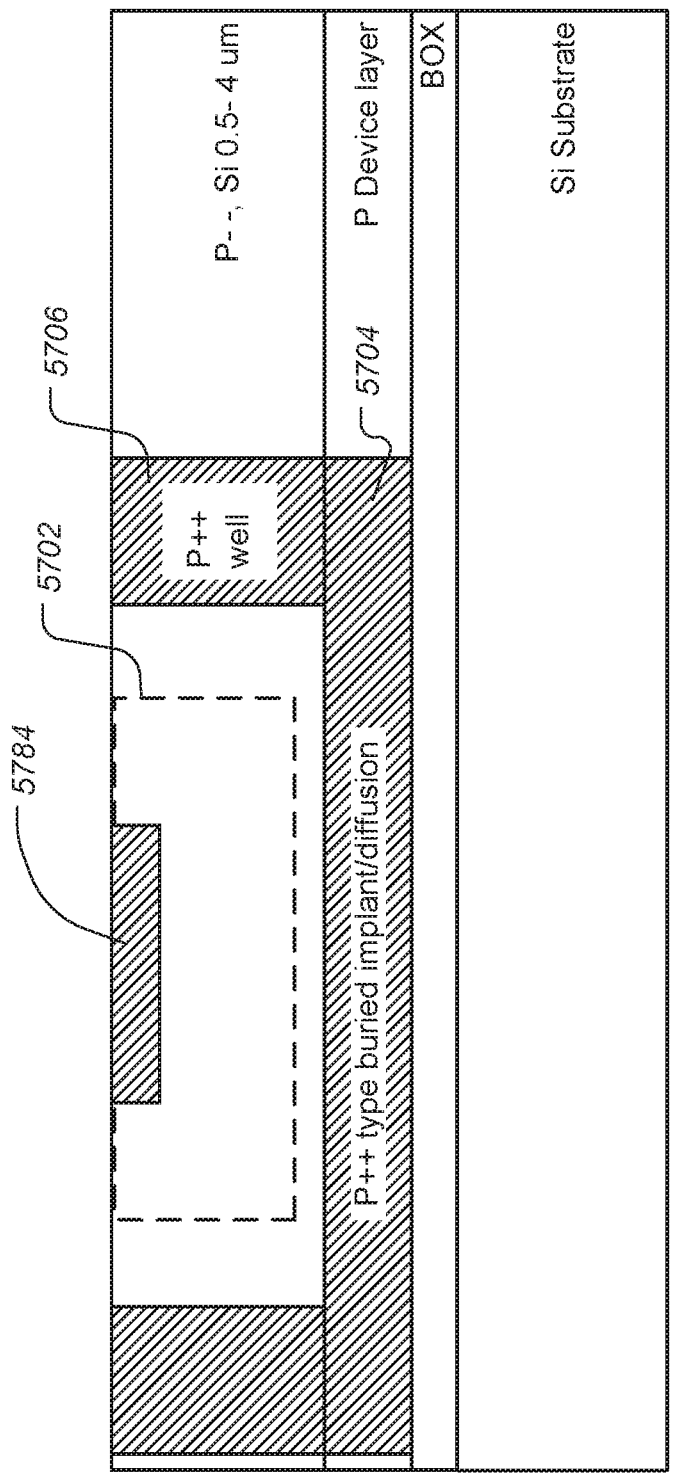
FIG. 57 is cross section view of a CMOS/BiCMOS wafer on SOI for use in integration with MSPDs/MSAPDs, according to some embodiments.

FIG. 57 is cross section view of a CMOS/BiCMOS wafer on SOI for use in integration with MSPDs/MSAPDs, according to some embodiments. The structure has a low doped P$^{--}$ layer on a P device layer. The resistivity of the P$^{--}$ layer can be equal to or greater than 1-10 ohm-cm and in some cases equal to or greater than 20 ohm-cm, with a thickness of 0.5 to 5 micrometers and in some cases 1-3 micrometers and in some cases 0.5-2 micrometers. A buried P$^{++}$ well 5704 with resistivity that can be equal to or less than 0.01-0.001 ohm-cm, can be ion implanted and/or diffused as in Swoboda, close to the BOX layer with a thickness ranging from 0.1 to 0.5 micrometers and/or entirely the P device layer. As in Swoboda, the buried P$^{++}$ region 5704 can be formed by epitaxially growing the I or low doped layer subsequently. The buried P$^{++}$ region can be selective area and/or blanket area. A P$^{++}$ connecting well 5706 with resistivity equal to or less than 0.01-0.001 ohm-cm, can be implanted or diffused to intercept and/or in close proximity to the buried P$^{++}$ well 5704 which in some cases may require multiple epitaxial growth as discussed in Swoboda, and form the outside circumference of the photosensitive area. A N$^{++}$ well 5784 can be ion implanted or diffused on the top surface, with resistivity less than or equal to 0.01-0.005 ohm-cm and a thickness ranging from 0.05 to 0.5 micrometers. In some cases a thin semitransparent metal layer (not shown) such as Pt, Au, Cu, V, Ni, Ag, Al, and/or Cu, with thicknesses ranging from 1 nm to 50 nm and/or transparent conducting metal oxide with thickness in the range of 10 nm to 1000 nm, can be deposited on the N$^+$ region prior to hole etch. The N$^{++}$ doped region 5784 defines the photosensitive area of the MSPD and can be circular, square, polygonal and/or any combinations of shapes with lateral dimensions such as diameter and/or diagonal ranging from 20-1000 microns and in some cases from 20 to 100 microns and in some cases 30 to 100 microns.

Thermal annealing can be done together with CMOS/BiCMOS thermal anneal step to activate the P and N type ion implanted regions or in some cases it can be thermally annealed prior to CMOS/BiCMOS device processing. See, e.g., Huang et al, A 10-Gb/s OEIC with Meshed Spatially-Modulated PhotoDetectorin0.18-umCMOSTechnology, IEEE JOURNAL OF SOLID-STATE CIRCUITS, VOL. 46, NO. 5, May 2011 (incorporated herein by reference and referred to herein as "Huang et al"), which shows a deep N well, which in some cases may require multiple epitaxial growth, connected to an N well (FIG. 6 of Huang et al). See also: Tavernier et al, High-Speed Optical Receivers With Integrated Photodiode in 130 nm CMOS, IEEE JOURNAL OF SOLID-STATE CIRCUITS, VOL. 44, NO. 10, October 2009 (incorporated herein by reference and referred to herein as "Tavernier 2009"), which shows a surface N well; Kao et al, A 5-Gbit/s CMOS Optical Receiver With Integrated Spatially Modulated Light Detector and Equalization, IEEE TRANSACTIONS ON CIRCUITS AND SYSTEMS—I: REGULAR PAPERS (incorporated herein by reference and referred to herein as "Kao et al"), which shows a spatially modulated photodetector with guard rings; Youn et al, which shows a P in an N well avalanche photodiode; Hartman et al, A Monolithic Silicon Photodetector/Amplifier IC for Fiber and Integrated Optics Application, Journal of Lightwave TECHNOLOGY, VOL. LT-3, NO. 4, August 1985 (incorporated herein by reference), which shows a PIN photodiode integrated with IC electronics; and Radovanovic et al, A 3-Gb/s Optical Detector in Standard CMOS for 850-nm Optical Communication, IEEE JOURNAL OF SOLID-STATE CIRCUITS, VOL. 40, NO. 8, August 2005 (incorporated herein by reference), which shows an interdigitated silicon photodiode. Swoboda shows a PIN silicon photodiode integrated with TIA and other ASIC electronics.

The Si photodiode structures in these references can be used with the addition of microstructure holes and/or other microstructures such as microstructure optical waveguide photodetectors as in FIG. 61, infra, to enhance the absorption and further improve its performances and perhaps use less complex electronics for signal processing. A higher signal to noise ratio can be desirable and the system can be more stable in adverse operating conditions such as high temperatures environments in data centers and high performance computing and LIDAR for example. In addition, low reverse bias voltages for MSPD in the range −1 to −4V and MSAPD in the range −6 to −25 V can be desirable for reliable system operation and/or compatible with CMOS/BiCMOS voltages. The dotted line 5702 represents the depletion when a reverse bias is applied to the anode and cathode (not shown).

Figure 58:
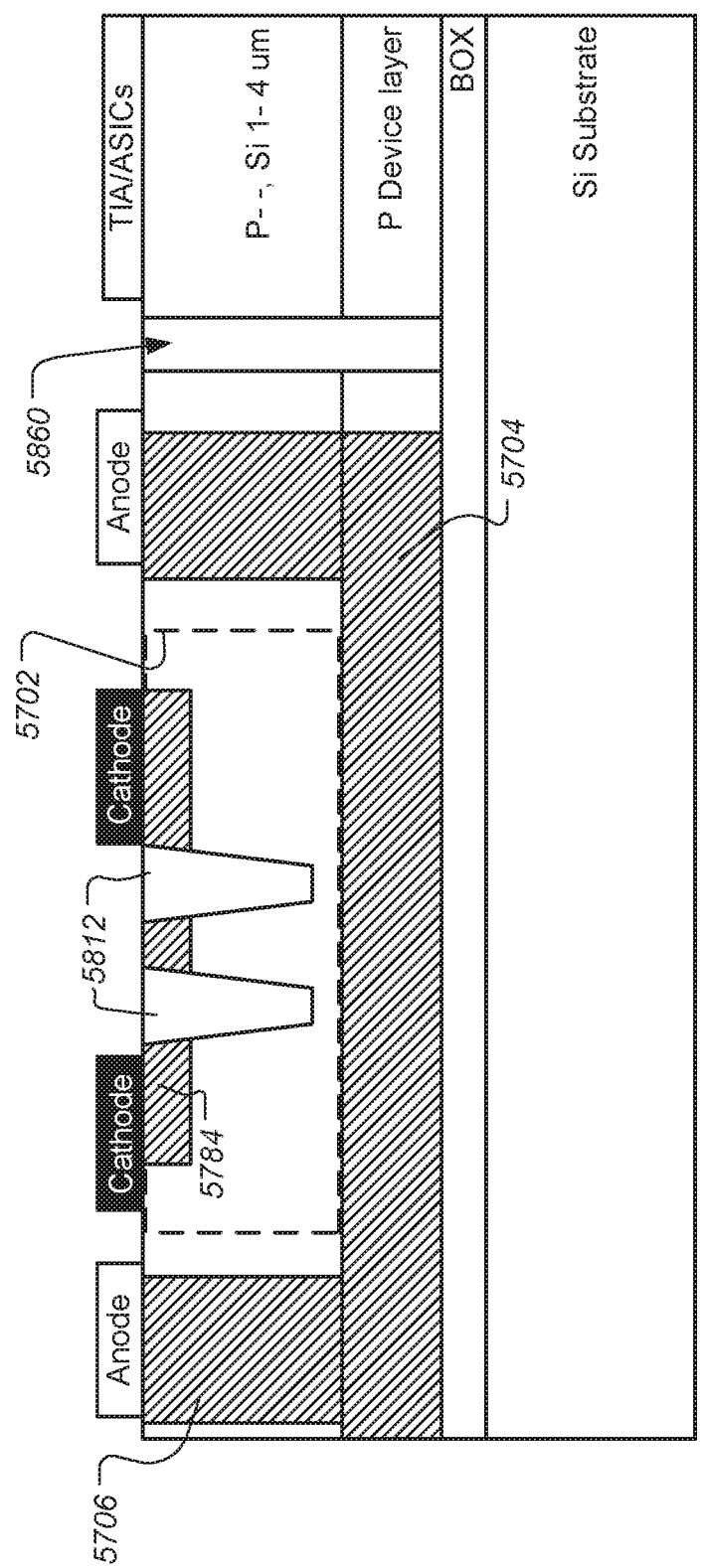
FIG. 58 is cross section showing some aspects CMOS/BiCMOS integration with MSPDs/MSAPDs, according to some embodiments.

FIG. 58 is cross section showing some aspects CMOS/BiCMOS integration with MSPDs/MSAPDs, according to some embodiments. The layer structures and implanted and/or diffused regions as shown in FIG. 57 are used. Shown is a monolithically integrated MSPD in a N-I-P configuration with CMOS/BiCMOS TIA and any other signal processing, enhancing, transmitting ASICs into a single chip. Note that although the layer structures and implanted and/or diffused regions shown in FIG. 57 are used, the ions activation by rapid thermal annealing can occur before, during or after the CMOS/BiCMOS processing is partially and/or fully completed. Microstructured holes 5812 can be etched into the top surface with depth ranging from 100 nm to 10000 nm and in some cases from 200 nm to 5000 nm and in some cases 500 nm to 2500 nm and in some cases 500 nm to 1100 nm. The holes can be partially into the N region 5784, and/or partially into the I or low doped high field I or P$^{--}$ region and/or through the low doped region and and/or to the P$^+$ doped region 5704 and/or to the Box layer. The holes 5812 can be circular, square, polygonal, oval, amoeba, hourglass or other shape. The lateral dimension, diameter/diagonal/significant length of the holes can range from 200 nm to 5000 nm and in some cases from 450 nm to 2000 nm and in some cases 500 nm to 1650 nm. Spacing between holes can range from 50 nm to 3000 nm and in some cases from 100 nm to 2000 nm. The holes cross section can be of any shape, for example funnel, inverted pyramid, cylindrical, V shape, polygonal, ball like, hourglass, and/or any combination of shapes that can be dry and/or wet etched and/or electrochemically etched. The holes can be period, aperiodic and/or combination of periodic and aperiodic. In some cases prior to hole etch, a layer of transparent conducting metal oxide (not shown) can be deposited on the N surface to assist in the reduction of sheet resistivity. The N and P type can be reversed to form an P-I (P$^{--}$ or N$^{--}$ region) on N and for MSAPD a charge and multiplication region can be added). The cathode and anode can be formed on the surface and the device for MSPD is operated at a reverse bias voltage ranging from −1 to −5 volts and for MSAPD the reverse bias voltage can range from −6 to −30 volts. The cathode and anode are connected to the TIA and/or other ASICs and can include an inductor and/or other circuit elements in the transmission line and/or ASICs such as equalizers for peaking the frequency response of the photodiode integrated with TIA and other ASICs. Passivations, planarization, metal interconnects, transistors, capacitors, resistors, inductors, memory elements, to name a few are not shown.

An optical and/or electrical isolation or attenuation region 5860 can be included to avoid light interference with the IC electronics. This isolation region can be a trench, and/or an ion implanted region to create an amorphous semiconductor region where it has poor electrical conductivity and high optical absorption. It can also be implanted with O, N ions and/or metal ions.

Light can impinge from the surface where the holes are etched and/or from the bottom where a via (not shown) can be etched to the BOX layer.

By etching microstructured holes 5812, the absorption of light at wavelengths 800-1170 nm can be significantly enhanced for Si and/or GeSi where Ge fraction is less than 0.1 and in some cases less than 0.2 for example. For example, in Tavernier 2008, at 850 nm the responsivity observed was 5 mA/W whereas with absorption enhancing microstructured holes and microstructured optical waveguides, 350 mA/W can be observed. At 1000 nm wavelength responsivity of 150 mA/W have been observed on Si photodiodes with microstructure holes for absorption enhancements and can reach data rates in excess of 20 Gb/s. Data rates of 25 Gb/s and 50 Gb/s can be achieved with equalization, and other electronic signal conditioning methods for silicon photodiodes with microstructured holes at wavelength range from 800-1000 nm and in some cases from 840 nm to 1100 nm.

With the addition of Ge to form GeSi alloy the wavelength can be further extended to 1350 nm and in some cases to 2000 nm depending on the Ge content and can also depend if the layers are relaxed or not relaxed.

In some cases the MSPD/MSAPD can be fabricated on a silicon wafer and where a BOX layer and/or SOI wafer may not be needed and in some cases a buried oxide layer can be implemented by ion implantation of O ions into the silicon substrate and can be a blanket implant and/or selective area implant followed by a second buried implant and/or diffusion of shallower depth of P or N type dopants that can be thermally anneal to activate the dopants and recrystallize the Si if necessary followed by epitaxial growth of the I or low doped layer. The purpose of the buried O implant is to reduce the photogenerated carrier lifetime that are generated outside the high electric field region and may diffuse slowly back to the high field region that may result in a slow component in the impulse response of the MSPD/MSAPD. The buried O ions can have a doping range of 1E18 to 1E21 and the P or N buried dope layer can have a resistivity in the range 0.01 to 0.001 ohm-cm or less and a thickness range of 100 nm to 500 nm. In addition a back side via is an option for backside optical signal illumination. This can also apply to any other figures herein where a BOX is included.

In known references on integration of silicon photodiode and TIA and other electronics, such as Huang et al, which presented a summary of silicon photodiode integrated with TIA and additional ASICs for signal enhancement and processing, the responsivity, photodetector bandwidth and bias voltage can be key parameters. In many cases the responsivity is either too low, thus requiring low noise amplifiers of several stages which can increase power consumption, or more sensitive to noise due to a low signal to noise ratio caused by, for example, hot environments or electromagnetic interference. Low photodetector bandwidth may lead to the use of significant signal processing electronics to achieve good responsivity, which can further reduce the responsivity at high frequency and in many cases high bias voltages. See. e.g., Swoboda, where their P-I-N silicon photodiode had a 10 micrometers thick I layer to achieve a responsivity of 260 mA/W at 850 nm and a data rate bandwidth of 2.2 GHz, required a bias voltage of −17V.

With the addition of microstructured holes on a silicon photodiode, as disclosed in herein, a thinner I layer can be used to achieve a high responsivity due to absorption enhancements, resulting in high data rate bandwidth, high responsivity and low bias voltage which are desirable for low power consumption electronics, high signal to noise ratio and high data rate bandwidth that can simplify electronics resulting in a more stable system in adverse environments.

Figure 59A:
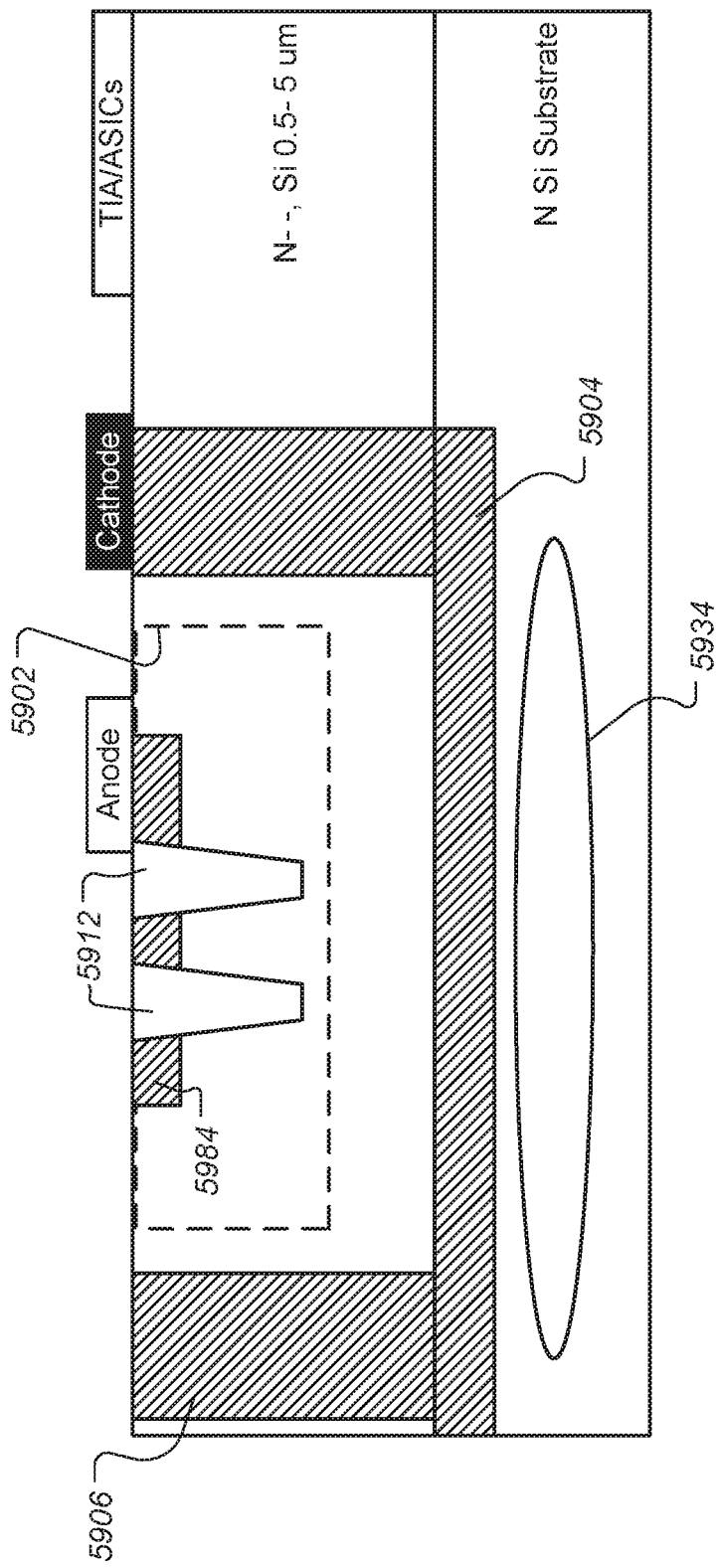
FIGS. 59A and 59B are cross sections illustrating some aspects of a MSPD integrated with CMOS/BiCMOS ASICs that include a TIA on a CMOS/BiCMOS compatible silicon substrate, according to some embodiments.
Figure 59B:
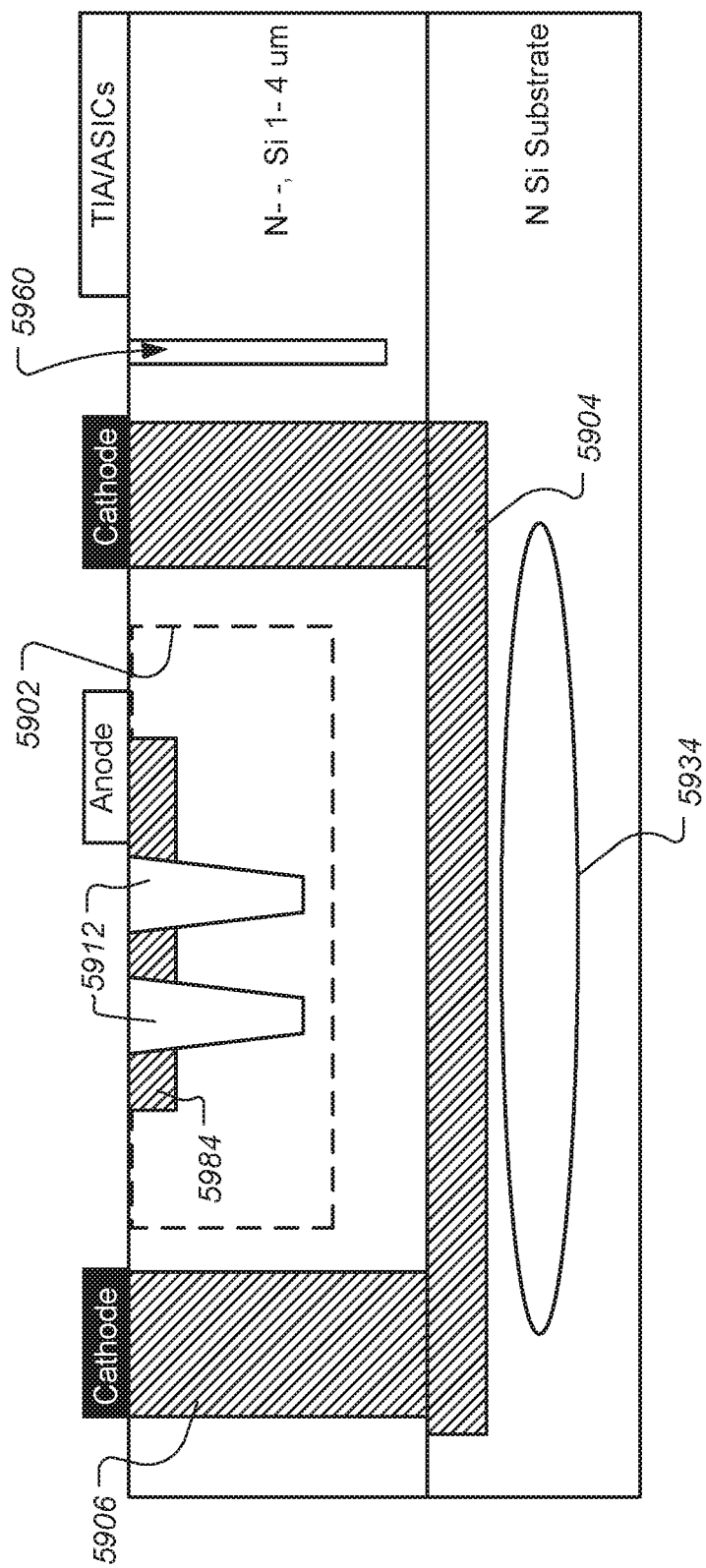

FIGS. 59A and 59B are cross sections illustrating some aspects of a MSPD integrated with CMOS/BiCMOS ASICs that include a TIA on a CMOS/BiCMOS compatible silicon substrate, according to some embodiments. FIG. 59A shows a N type substrate, 0.5-5 micrometer thick $N^{--}$ layer with resistivity equal to or greater than 1 ohm-cm and in some cases greater than or equal to 10 ohm-cm, is epitaxially grown on buried $N^+$ implanted and/or diffused region 5904 and oxygen ion implanted region 5934 below the $N^+$ region 5904 in the N substrate. In some cases if the N substrate resistivity is 0.01 ohm-cm or less, the $N^+$ buried implant may not be necessary. Further CMOS/BiCMOS layer(s) may be formed. As discussed in Swoboda, there may be no further CMOS/BiCMOS layers (see, e.g., FIG. 13.5.1 of Swoboda). It may also be the case for some other MSPDs/MSAPDs integrated with CMOS/BiCMOS ICs that no further CMOS/BiCMOS epitaxial layers are necessary and the layer(s) maybe just be low doped $N^{--}$ or $P^{--}$ type layer(s) with resistivity greater than or equal to 1 ohm-cm and in some cases greater than or equal to 3 ohm-cm. In some cases, extra CMOS/BiCMOS layers will be provided such as where GeSi is used in the transistor process.

In FIG. 59A, a P-I-N MSPD is formed with buried $N^{++}$ type well 5904 implanted/diffused and $N^{++}$ type connecting well 5906 that can be implanted and/or diffused and a $P^{++}$ type well 5984 that can be implanted or diffused. The $N^{++}$ type wells can have resistivity equal to or less than 0.004 ohm-cm and the $P^{++}$ type well can have resistivity equal to or less than 0.004 ohm-cm. The depth of the deep $N^{++}$ type well, which may require multiple epitaxial growths, can range from 0.5 to 5 micrometers and in some cases from 0.5 to 2 micrometers and in some cases 0.5 to 2.5 micrometers.

The microstructured holes 5912, including their size, shape and spacings are as described elsewhere herein, and can be etched wet and/or dry into the $P^{++}$ layer and/or partially into the $N^{--}$ layer and/or partially into the $N^{++}$ layer and/or through the $N^{++}$ layer. In some cases a transparent conducting metal oxide such as indium tin oxide layer can be applied to the top surface prior to hole etching to assist in reducing the sheet resistivity.

In some cases, $N^+$ buried layer 5904 may not be necessary if the N substrate resistivity is 0.01 ohm-cm or less.

The dotted line 5902 represents the depletion when a reverse bias is applied to the anode and cathode. Reverse bias voltages can range from −1 to −5V and in some cases −1 to −3.3 V.

In some cases, a deep buried ion implantation of oxygen ions and/or nitrogen ions can be used to create a buried oxide and/or oxygen rich layer and/or a nitride and/or a nitrogen rich layer 5934. This buried oxide and/or nitride layer 5934 can be to reduce photogenerated carriers outside the high field region which can create a slow diffusion current that can degrade the bandwidth of the MSPD/MSAPD. In addition such a buried oxide and/or nitride layer 5934 can also help reflect any stray signal photons back toward the microstructured holes for further absorption enhancements. In some cases ions such as O, N and/or metal ions such as Al, Cu, Be, and/or Mg create a disorder region such that optical absorption and recombination of minority carriers time is short to reduce diffusion current generated away from the high field depletion region. In some cases, the implants can be buried by multiple epitaxial growths where the ions are first implanted and followed by epitaxial growth to bury the implant. Doping density of the O, N and other ions can range from $1E18/cm^3$ to $1E22/cm^3$ for example. In some cases, the buried O, N and/or other ions for reducing minority carrier lifetimes may not be provided. Other methods may be the use of heavily doped N or P regions with resistivity less than 0.01-0.001 ohm-cm to reduce minority carrier lifetimes. In some cases, PN junctions, single and/or multiple such as PNPNPNPN may be used to impede minority carriers from diffusing back to the high field region of the I layer/region.

The optical signal can impinge from the surface, surface illuminated, where the holes are etched and/or from the bottom through a via.

The optical signal wavelength can range from 810 nm to 1100 nm and in some cases 750 nm to 1100 nm and in some cases 840 nm to 1070 nm and where the responsivity can be 100 mA/W or higher at at least one wavelength in the range, and in some cases 200 mA/W or higher at at least one wavelength in the range and in some cases 300 mA/W or higher at at least one wavelength in the range and in some cases 400 mA/W or higher at at least one wavelength in the range and in some cases 500 mA/W at at least one wavelength in the range. Data rate bandwidths can range from 1-50 Gb/s or higher and in some cases 15-25 Gb/s or higher and in some cases 25-50 Gb/s or higher and in some cases 1-25 Gb/s or higher. Diameter/Diagonal of the photosensitive area can range from 15-500 micrometers or more and in some cases 30-100 micrometers.

As discussed herein supra, the MSPD/MSAPD integrated with TIA and other signal processing/storage/transmitting ICs can be single and/or multiple, for example a quad for parallel fiber links where the aggregated signal is 4× that of a single MSPD/MSAPD and ICs, it can be 16×, 32×, or 64×.

The MSPD and TIA and other ASICs integration can also apply to MSAPDs and TIAs and other ASICs with the addition of a charge and multiplication layers such that instead of a P-I-N, it can be P-I-PN or P-I-P-I-N as described elsewhere in this disclosure. See e.g., Youn et al. According to some embodiments, Si avalanche photodiodes with microstructured holes can have higher data rate bandwidth, higher responsivity and lower reverse bias voltage than a comparable Si avalanche photodiode without microstructured holes for enhancement of the absorption of the optical signal photons.

FIG. 59B shows a simple cross section of a MSPD integrated with TIA and other ASICs similar to FIG. 59A with the addition of an isolation trench 5960 that can have a depth ranging from 0.1 to 10 micrometers and can have a width of 0.1 to 10 micrometers or more that can be around the MSPD and/or MSAPD completely or partially. In addition, it can be a single trench as shown and/or multiple trenches and in some cases the trench spacings and width can satisfy the Bragg condition for a distributed Bragg reflector. The trench can be for electrical and/or optical isolation. In some cases, the trenches can be filled fully and/or partially with a dielectric and/or polymer and/or metallic material and/or metallic like material.

Figure 60:
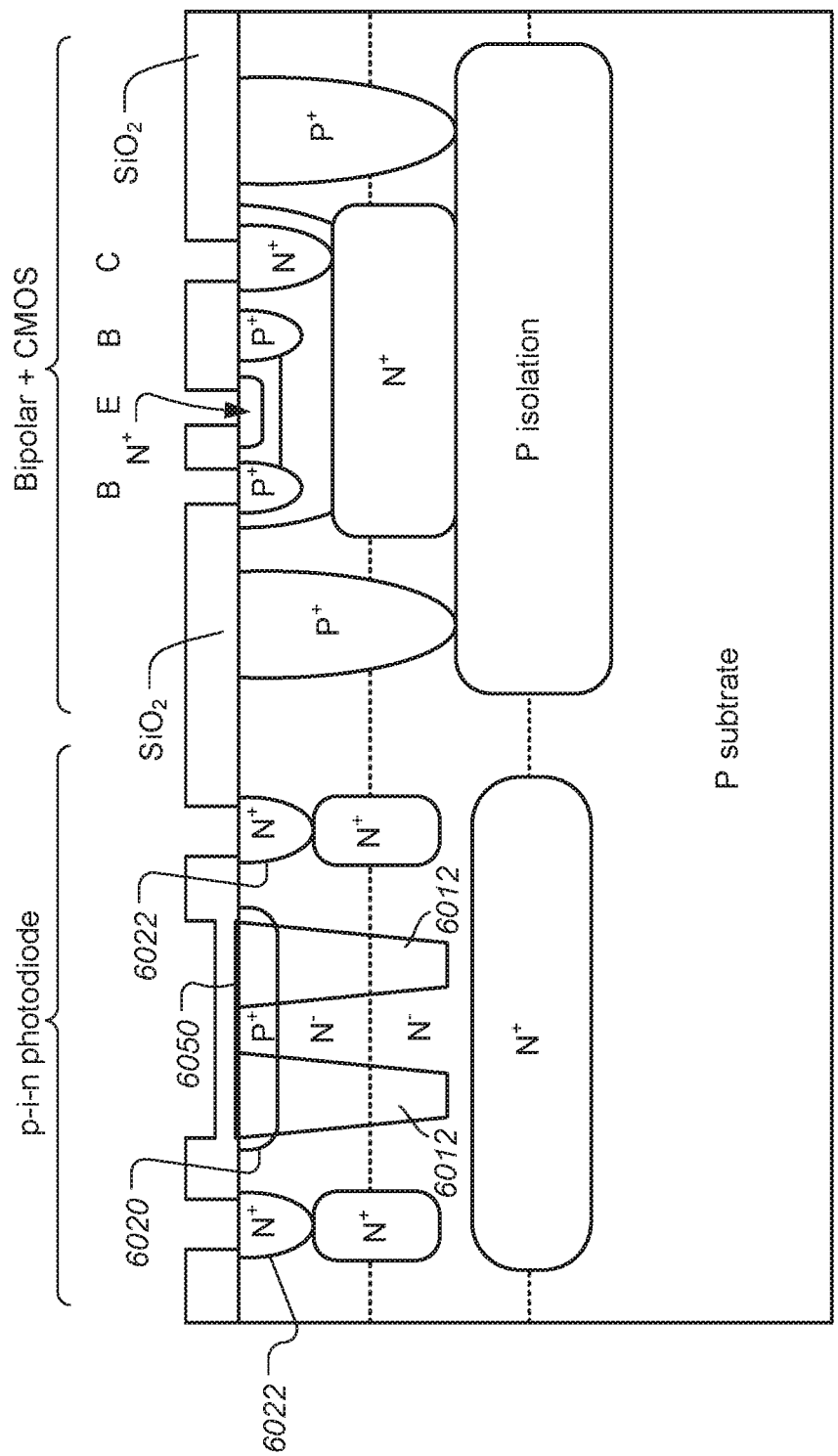
FIG. 60 is a cross section view of a silicon PIN photodiode integrated with TIA and other ASICs, according to some embodiments.

FIG. 60 is a cross section view of a silicon PIN photodiode integrated with TIA and other ASICs, according to some embodiments. Note that many of the cross sections shown in this disclosure have been simplified for purposes of clarity. Techniques according to embodiments of this disclosure are used to modify a structure disclosed in Swoboda. In FIG. 13.5.1 of Swoboda the distance between the top surface $P^+$ region and buried $N^+$ region is about 10 micrometers and a reverse bias voltage of −17 V is used to reach a bandwidth of 2.2 GHz. According to some embodiments of this disclosure, microstructured holes 6012 are etched wet and/or dry, as a back end of the line (BEOL) CMOS/BiCMOS process and/or as a part of the CMOS/BiCMOS trench processes. By etching the microstructured holes, the silicon photodiode is converted to a MSPD with absorption enhancement. The thickness between the $P^+$ and $N^+$ region can be reduced to 1-5 micrometers and in some cases from 0.5 to 3 micrometers and in some cases 0.5-2 micrometers. With $N^-$ regions resistivity in the range 1-10 ohm-cm or greater, a reverse bias voltage of −2 to −4 V can deplete the $N^-$ region. In some cases a reverse bias voltage of −2 to −3.3 V can deplete the $N^-$ region of 0.5-2 micrometers approximately. In some cases a reverse bias voltage of −2 to −3.3 V can deplete the N-region of about 1 micrometer, in some cases about 2 micrometers, and in some cases 0.5-5 micrometers. The microstructured holes 6012 can be etched such as described herein supra. The holes 6012 can have cross sectional shapes such as funnel, inverted pyramid, cylindrical, trapezoidal, polygonal, hourglass, ball and/or any combination of shapes. The holes can have diameter/diagonal/significant lateral dimensions ranging from 350 nm to 2000 nm, from 500 nm to 1700 nm and in some cases 250 nm to 3000 nm. The holes can have spacing from 50 nm to 3000 nm and in some cases 100 nm to 2000 nm. The etch depth can range from 100 nm to 2000 nm, from 200 nm to 2500 nm, from 250 nm to 6000 nm, and in some cases from 50 nm to 5000 nm. The holes can be partially in the $P^+$ region and/or first doped region, and/or partially into the $N^-$ region and/or low doped region and/or intrinsic region, and/or partially into the $N^+$ region and/or the second doped region and/or through the second doped region. With microstructured holes the responsivity can be 100 mA/W or higher for at least one wavelength in the range 800 nm to 960 nm, and in some cases from 840 nm to 1100 nm. Responsivity can be 200 mA/W or greater for at least one wavelength in the range 800 nm to 1100 nm, and in some cases responsivity can be 300 mA/W or greater for at least one wavelength in the range 800 nm to 1100 nm. In some cases responsivity can be 400 mA/W or higher for at least one wavelength in the range 800-1100 nm. In some cases responsivity can be 500 mA/W or higher for at least one wavelength in the range 800-1100 nm.

Data rate bandwidths can range from 1-5 Gb/s and in some cases 3-10 Gb/s and in some cases from 10-25 Gb/s and in some cases 25-50 Gb/s and in some cases 50-100 Gb/s or higher from the monolithically integrated MSPD and TIA and ASICs chip.

Diameter/diagonal of the MSPD photosensitive area and/or area defining the capacitance of the P-I-N or N-I-P structure, (lateral width of the $N^+$ region and/or first doped region, and/or width of the mesa) can range from 20 to 100 micrometers, in some cases 30 to 80 micrometers, in some cases 100 to 500 micrometers, and in some cases 10 microns to 1000 microns. Also shown in FIG. 60 are $P^+$ anode 6012, $N^+$ cathode 6022 and antireflection coating 6050. The dash lines in FIG. 60 represent multiple epitaxial layer growths as discussed in Swoboda.

Without microstructured holes, as discussed in Swoboda, silicon PIN photodiodes can achieve a responsivity of 260 mA/W at 850 nm wavelength for the 10 micrometer thick I or N-region resulting in a 2.2 GHz photodiode bandwidth at −17V bias. Complex signal processing electronics are required to achieve a 11 Gb/s data rate bandwidth resulting in a high power consumption of 310 mW. Such high reverse bias and power consumption are not desirable. In addition, such a structure will be difficult to push the "chip" (integrated PD and TIA and ASICs) bandwidth to 25 Gb/s. Whereas, using embodiments of this disclosure, with thinner I layer of 0.5-2 microns together with microstructure holes and/or microstructure optical waveguides as in FIG. 61, infra, for photon trapping and absorption enhancements, chip data rate output of 25, 50, 80 and 100 Gb/s can be achieved.

In some cases the resistivity of the $P^+$ and/or $N^+$ regions discussed earlier and thereafter, can be 0.1 ohm-cm or less, and in some cases 0.01 ohm-cm or less and in some cases 0.001 ohm-cm or less. N- and P-regions, the low doped regions and/or intrinsic regions, can have resistivity or 0.2 ohm-cm or greater and in some cases 1 ohm-cm or greater and in some cases 10 ohm-cm or greater.

Csutak et al, High-Speed Monolithically Integrated Silicon Photoreceivers Fabricated in 130-nm CMOS Technology, JOURNAL OF LIGHTWAVE TECHNOLOGY, VOL. 20, NO. 9, September 2002 (incorporated herein by reference) shows a lateral P-I-N. According to some embodiments of the present disclosure, microstructured holes can be etched in an I region of a lateral P-I-N structure which will enhance the absorption of optical signal and improve the responsivity.

Note that in Swoboda, two epitaxial growths represented by the dotted lines are grown to bury the deep $N^+$ and P Isolation regions that can be formed by diffusion of dopants and/or ion implantation. The second epitaxial growth is used form the connecting $N^+$ wells of the P-I-N photodiode and the elements for a bipolar transistors for the TIA and equalizer ICs. In Swoboda, however, the thickness of the 10 micron I layer limits to chip data rate bandwidth to 11 Gb/s.

Figure 61A:
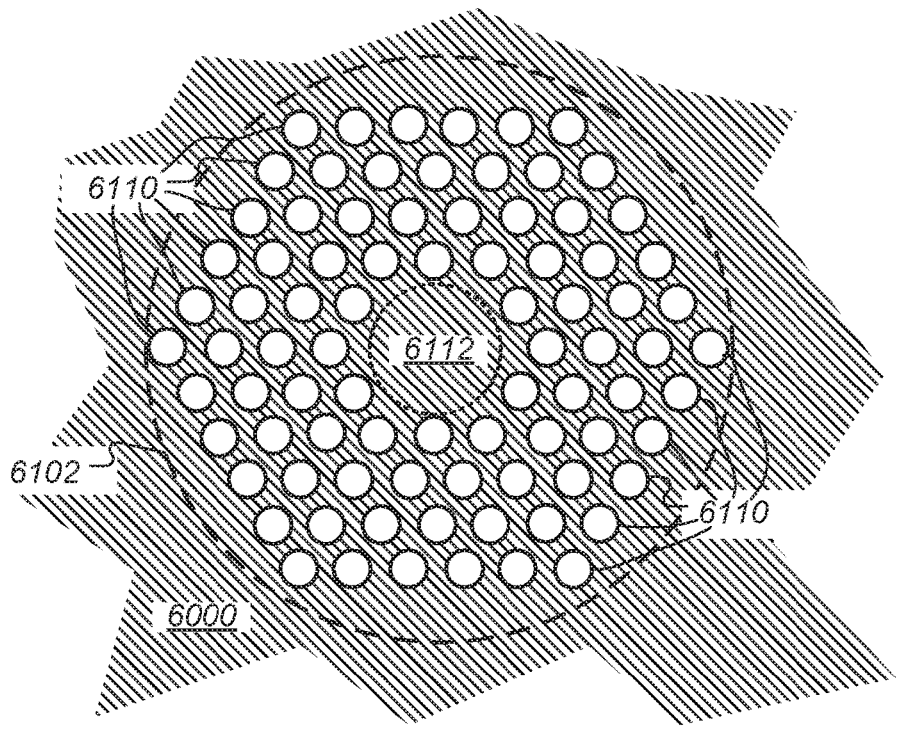
FIGS. 61A-61D are top views illustrating aspects of microstructured optical waveguides, according to some embodiments.
Figure 61B:
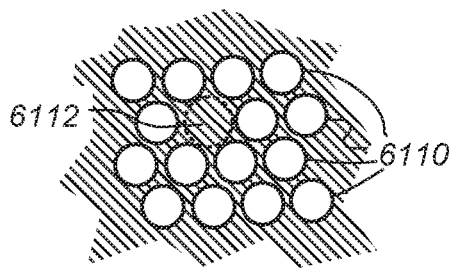
Figure 61C:
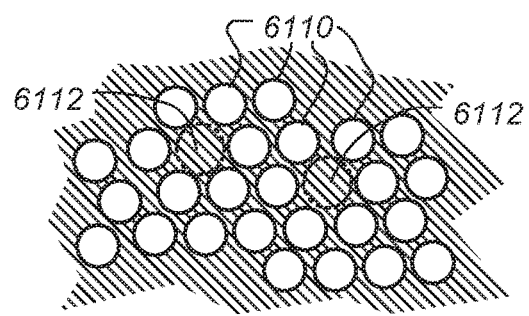
Figure 61D:
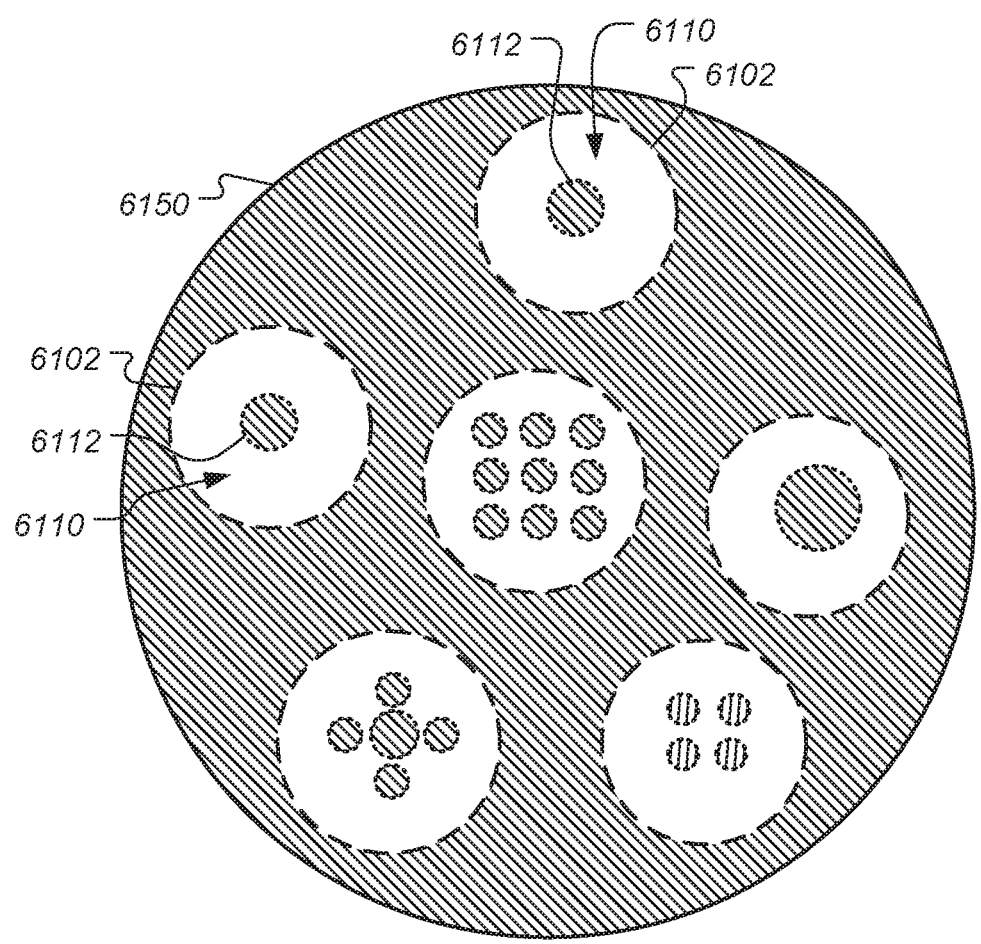

FIGS. 61A-61D is a top views illustrating aspects of microstructured optical waveguides, according to some embodiments. In FIG. 61A, a basic microstructured optical waveguides (MSOW) structure is shown. In a material 6000, a number of holes 6110 are formed. The holes 6110 are confined within a region 6102, marked with dashed line. At the core of the region 6102 there is a region 6112 marked with a dotted line that is free of holes 6110. The MSOW is formed by a high optical refractive index, hole-free core region 6112 surrounded by a region 6102 that a low optical refractive index due to the presence of holes 6110. The lateral dimensions of the core region 6112 ranges from sub optical wavelengths to tens of optical wavelengths. FIGS. 61B and 61C show further MSOW examples, in this case where the core(s) 6112 are closer to the size of the holes 6110. FIG. 61D is a wider view wherein the individual holes 6110 are not shown for clarity. In that example several MSOWs are shown in close proximity to one another on an isolated mesa 6150. Two of the MSOWs have a single central core such as shown in FIG. 61A. Other examples of MSOWs are shown that have larger cores, non-centered cores, and multiple cores in various arrangements.

The close proximity of the MSOWs allows cross coupling of the optical fields of adjacent microstructured optical waveguides thereby promoting a collective ensemble of coupled microstructure optical waveguides with optical waves propagating laterally. This results in absorption enhancements of the signal photons by the silicon photodiodes with microstructured optical waveguides or microstructured optical waveguide photodiodes (MSOWPDs) and equivalently a microstructured optical waveguide avalanche photodiode (MSOWAPDs). As used herein the terms "microstructure hole" and "microstructure photodetector" can also refer to MSPD, MSOWPD, MSAPD and MSOWAPD.

For silicon I and/or low doped layer, where I can represent undoped, intrinsic and low doped, the wavelength can range from 800-1100 nm, and in some cases from 840 to 960 nm and in some cases from 840 to 1070 nm. Microstructure holes 6110 can have shapes which are circular, oval, rectangular, polygon, hourglass and/or any other shapes and/or combination of shapes. The holes can have a lateral dimension, diameter, diagonal, ranging from 300 nm to 5000 nm. The core 6112 can be circular, rectangular, polygonal, oval and/or any other shapes and/or combination of shapes. The core can have a lateral dimension, diameter, diagonal ranging from 200 nm to 4500 nm and a single microstructure hole can have a single and/or multiple cores of same and/or different diameters for example.

For GeSi I or low doped layer, depending on the Ge fraction, the wavelength can range from 800 nm to 2000 nm. For Ge fraction less than or equal to 50%, the wavelength span can range from 800 nm to 1350 nm and for Ge fraction less than or equal to 80% the wavelength can range from 800 nm to 1550 nm and for 100% Ge fraction the wavelength can be extended to 2000 nm. For high data rate applications of 10 Gb/s or greater and in some cases 25 Gb/s or greater, the thickness of the I or low doped layer can range from 0.5 to 5 micrometers and in some cases 1 to 3 micrometers and in some cases 1 to 2 micrometers. The thinner I layer is not only for high data rate but also for low voltage reverse bias, since in most system, the voltage range from 1 to 5 V and in some cases 1 to 3.3 volts.

For lower data rate applications, I layer thickness of 3-5 micrometers may be used together with a larger photosensitive area, for example a diameter or diagonal of 100 micrometer or larger. For high data rate applications, data rates of 10-50 Gb/s the diameter/diagonal of the photosensitive area can range from 20 to 80 micrometers. In some cases 25 to 50 micrometers.

Within a photosensitive area of an MSPD or MSAPD (such as a mesa 6150 shown in FIG. 61D), the microstructured optical waveguides can have different configurations, for example with single or multiple cores, cores diameter can be different, the confining microstructure hole can be different shape and/or dimensions, and the core and/or the MSOWs can periodic and/or aperiodic and/or any combination of shape, dimensions, number of cores. These variation can result in a responsivity vs wavelengths that is smoother and has less undesirable resonances.

The photosensitive area can be defined by a mesa and/or a diffused P or N region and can be circular, oval, rectangular, triangular, hour glass, polygon and/or any other shapes and combination of shapes. In some cases, it can be a single photosensitive area and/or a multiple of photosensitive areas such as an array that can be a stand-alone array and/or the array can be integrated with CMOS/BiCMOS ASICs for signal processing, image processing, sensings, for applications such as optical data communications, LIDAR, LiFi, and free space optical communications.

The hole-free areas 6112, shown as a dotted circles, form an optical waveguide, and can also be a photonic crystal waveguide and/or in some cases where the holes are not regular, and/or periodic, and/or a certain size, can be a guided refractive index waveguide. In some cases the optical mode in the waveguide can interact with optical modes in the holes to generate photon trapping and/or slowing effects for example. Single and/or multiple such waveguides can be provided can also couple to each other and the holes dimensions and periods around each waveguide can be same and/or different from adjacent waveguides and can be periodic and/or aperiodic and/or combination of periodic and aperiodic.

Figure 62C:
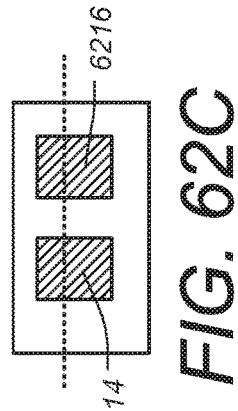
FIGS. 62B and 62C are top views showing further aspects of microstructured optical waveguides photodiodes according to some embodiments.
Figure 62B:
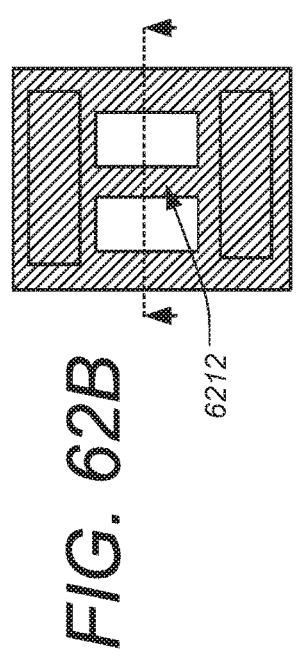
Figure 62A:
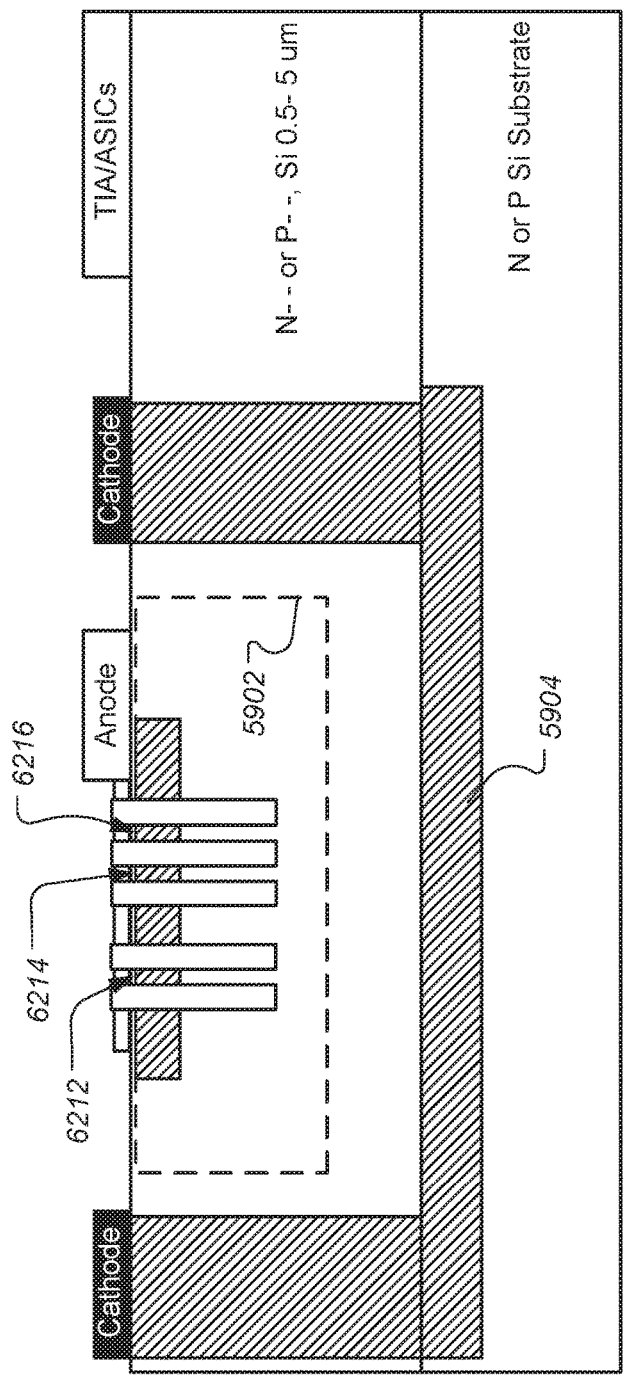
FIG. 62A is a cross section view showing aspects of a microstructured optical waveguides photodiode (MSOWPD) integrated with CMOS/BiCMOS ASICs, according to some embodiments.

FIG. 62A is a cross section view showing aspects of a microstructured optical waveguides photodiode (MSOWPD) integrated with CMOS/BiCMOS ASICs, according to some embodiments. The MSOWPD replaces the MSPD as in FIGS. 58, 59 and 60. Microstructured optical waveguide avalanche photodiodes (MSOWAPDs) can similarly be fabricated and integrated with the addition of a charge and multiplication (avalanche) layers/regions to create a P-P-PN or P-I-P-I-N structure. The cores (e.g. 6212, 6214 and 6216) of the MSOWPDs can be connected by first coating the surface with the MSOWPD with a polymer such as polyimide that can fill only the top gaps due to its viscosity and surface tension. After curing, a plasma ashing can be performed to remove the polymer from the surface but not in the gaps, exposing the top of the cores. This layer is not shown in FIG. 62A for simplicity. A transparent conducting metal oxide can be deposited on the top surface to connect the cores and the top surface electrically such that a reverse bias can be applied to the cores and the top surface anode and cathode. A reverse bias voltage can range from −1 to −5 volts.

As shown in FIG. 62A the structure except for the MSOWPD, is similar to FIGS. 59A and 59B and in some cases a BOX can be included as in FIG. 58.

The microstructure optical waveguide (MSOW) can be etched partially into the I or low doped region and/or though the I or low doped region and in some cases to the $N^{++}$ doped region and in some cases pass the $N^+$ doped region. The lateral dimension of the MSOW which can consist of a microstructured hole and one or more microstructure cores, can range from 500 nm to 8000 nm and the core lateral dimension can range from 300 nm to 7500 nm and spacing between the MSOW can range from 50 nm to 5000 nm.

The MSOW core shape can be circular, oval, hourglass, square, polygon for example. The core shape can also be circular, oval, square, or polygonal. The cores can be uniformly space and/or not uniformly spaces. The MSOW can be periodic and/or aperiodic.

The dimension of the MSOWs range from sub wavelength to 10 wavelength and can have photon trapping properties, slow wave effects, that can enhance the absorption of material with weak absorption for wavelengths at or just shorter than the bandgap wavelength of an indirect bandgap semiconducting material. Weak absorption can mean at certain wavelengths of light, the material bulk absorption coefficient is between 10s to 100s cm$^{-1}$. In certain cases, when the material is strained the bandgap can be smaller than the same material that is not strained. Use of microstructure holes and/or waveguides can enhance the absorption of both relaxed and non-relaxed semiconductors resulting in higher responsivity over the same material without microstructure holes and/or waveguides for absorption enhancements.

Rectangular cross sectional holes are shown in FIG. 62 for the MSOW, the holes can be funnel shaped for example and the core can have a varying diameter such as a tapered core for example. Other shapes can include trapezoidal, and inverted bottle shaped.

FIGS. 62B and 62C are top views showing further aspects of microstructured optical waveguides photodiodes according to some embodiments. As can be seen, different topographies can be provided. In FIG. 62B, rectangular holes are on either side of the middle core 6212s. In FIG. 62C two cores 6214 and 6216 are surrounded by larger rectangular hole.

The MSOWPD/MSOWAPD can also be fabricated in a mesa structure as shown for example in FIG. 56 with or without a BOX. The optical signal can impinge from the top surface and in some cases can impinge from the bottom surface through a via.

Data rates of 3-50 Gb/s or higher can be achieved and in some cases data rates from 3-10 Gb/s and in some cases from 20-30 Gb/s and in some cases from 25-50 Gb/s or higher. Signal wavelengths as in earlier discussions can span from 800-1100 nm and in some cases from 800 to 1350 nm depending on the Ge fraction in GeSi alloy and strain. And in some cases from 1250 nm to 1550 nm and in some cases to 2000 nm depending on the Ge fraction in the GeSi alloy and strain.

In all the MSPD/MSAPD/MSOWPD/MSOWAPD integration with CMOS/BiCMOS TIA, equalizers, limiting amplifiers and/or other ASICs as necessary, a trench and/or multiple trenches as in FIG. 59B can be included.

See, e.g., Yin et al, Integrated ARROW waveguides with hollow cores, 14 Jun. 2004/Vol. 12, No. 12/OPTICS EXPRESS 2710 (incorporated herein by reference); and Litchinitser et al, Antiresonant reflecting photonic crystal optical waveguides, OPTICS LETTERS/Vol. 27, No. 18/Sep. 15, 2002 (incorporated herein by reference and referred to herein as "Litchinitser et al"); In FIG. 1C of Litchinitser et al, a MSOW is shown with one core in the middle. In contrast, according to embodiments of this disclosure, single and/or multiple cores of same or different dimensions can be provided. In addition, it should be noted that the cores surfaces can be contiguous with the surface surrounding the holes as in FIG. 1C of Litchinitser et al. Where as in the embodiments shown in FIGS. 61A-61D, the cores can also be represented by hole-free areas or regions and in some cases the holes can be photonic crystal. According to embodiments of present disclosure, an MSOW can be a variation of ARROW waveguides with a solid core or cores and a propagation distance in the vertical direction along the waveguide of 0.5 to 10 micrometers.

Microstructured photodetectors (MS-PD) can be made polarization insensitive or polarization sensitive by the shape and arrangements of the microstructure holes. Microstructured holes that are asymmetric in direction tend to be polarization sensitive and microstructure holes that are symmetric in directions (X-Y) tend to be polarization insensitive.

Figure 63A:
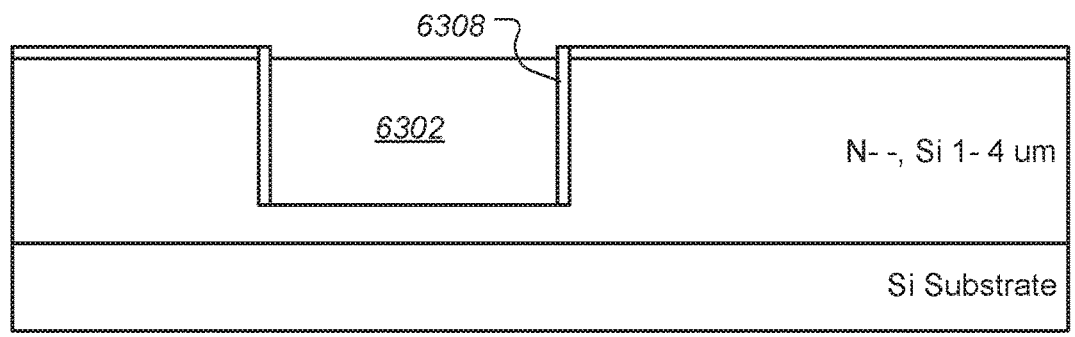
FIGS. 63A-63C are cross section views illustrating aspects of MSPDs integrated with CMOS/BiCMOS circuitry utilizing selective area growth of Ge and/or GeSi on silicon, according to some embodiments.
Figure 63B:
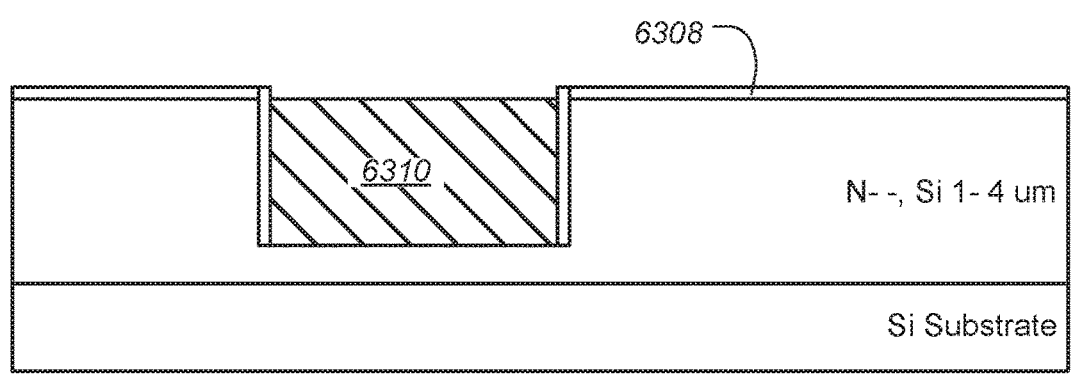
Figure 63C:
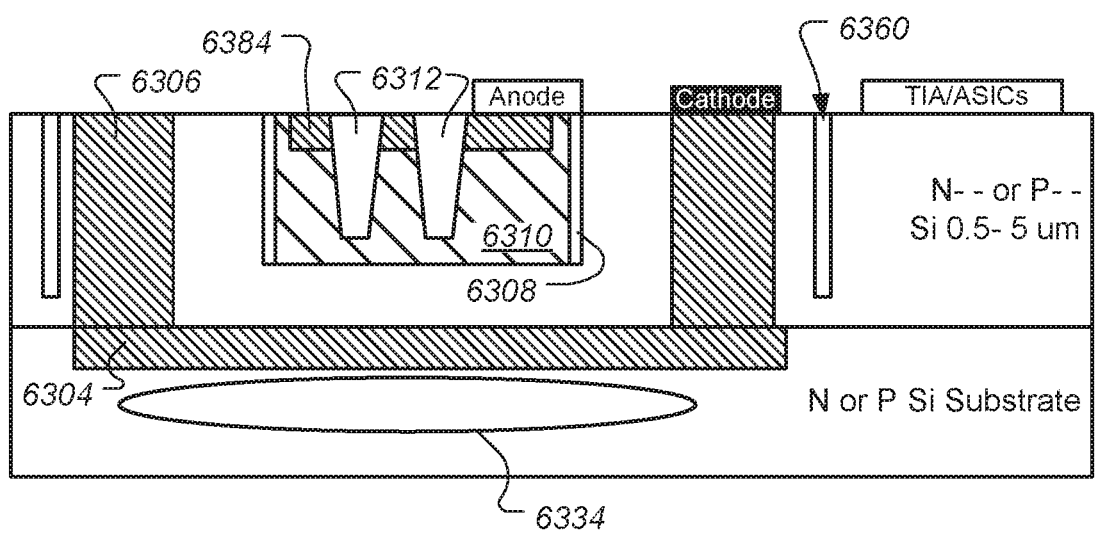

FIGS. 63A-63C are cross section views illustrating aspects of MSPDs integrated with CMOS/BiCMOS circuitry utilizing selective area growth of Ge and/or GeSi on silicon, according to some embodiments. A silicon wafer is used with epitaxial layer(s) that are compatible with CMOS/BiCMOS fabrication that can also include a BOX (buried oxide) layer. In FIG. 63A, a void 6302 is etched into the N$^{--}$ or P$^{--}$ layer and where the top surface and sidewalls can be coated with a dielectric 6308 such as silicon oxide, silicon nitride. In FIG. 63B, selective area growth of Ge and/or GeSi alloy 6310 with Ge fraction ranging from 0 to 100%. The selective area growth of Ge and/or GeSi 6310 can be undoped and/or lightly doped with doping levels less than $5 \times 10^{16}/cm^3$ and in some cases less than $3 \times 10^{15}/cm^3$ and in some cases less than $3 \times 10^{17}/cm^3$. Thicknesses of the Ge and/or GeSi 6310 can range from 300 nm to 5000 nm and in some cases from 500 nm to 2500 nm. The shape of Ge and/or GeSi 6310, as viewed from the top, can be circular, rectangular, polygonal, diamond shaped, oval, and/or a combination of those and other shapes. Ge and/or GeSi 6310 can have a lateral dimension ranging from 10 micrometers to 500 micrometers or more and in some cases from 25 micrometers to 100 micrometers. The cross sectional shape can be a rectangle (as shown in FIG. 63B), and in some cases can follow the lattice plane of the Si in an anisotropic wet etch and in some cases can be polygonal and the shape in the two perpendicular lateral directions can be different. See, e.g., Michel et al, High-performance Ge-on-Si photodetectors, 30 Jul. 2010 | DOI: 10.1038/NPHOTON.2010.157 (incorporated herein by reference). According to some embodiments, chemical mechanical polishing (CMP) can be performed after the selective area growth to present a smooth flat surface for processing of the CMOS/BiCMOS and photodiode integration.

FIG. 63C shows an MSPD formed on the structure having selective area growth of Ge and/or GeSi on silicon. The Ge and/or GeSi 6310 top surface can be ion implanted and/or diffused with dopants of P type (can also be N type) to form a P (Ge and/or GeSi)—I(Ge and/or GeSi)—N(Si) structure 6384 and can include microstructured holes 6312 etched into the I Ge/GeSi 6310 partially and/or entirely using wet and/or dry etching. The Ge and/or GeSi layer 6310 thickness can range from 500 nm to 5000 nm and in some cases 500 nm to 2500 nm for data rate bandwidths of 10 to 50 Gb/s or more. Lateral dimension of the photosensitive area for high speed operation where a high electric field is externally applied via a reverse bias between the anode and cathode, can range from 10 micrometers to 500 micrometers and in some cases from 25 micrometers to 80 micrometers and in some cases from 25 to 100 micrometers For MSPD, MSAPD, MSOWPD, MSOWAPD, the hole dimension laterally can range from 100 nm to 5000 nm and in some cases from 350 nm to 2500 nm and spacing with adjacent holes can range from 50 nm to 5000 nm and in cases can range from 100 nm to 2000 nm and can be periodic and/or aperiodic and/or combination of periodic and aperiodic. The hole cross sections can be any combination of cross sectional shapes including funnel, inverted pyramid, cylindrical, trapezoidal, hourglass, ball shaped, rectangular, and polygonal. The surface shape of the holes can be circular, oval, hourglass, rectangular, polygon, amoeba, or combinations thereof. The holes can be periodic and/or aperiodic. Etch depth of the holes can range from 100 nm to 10000 nm and in some cases can partially etch into the top doped layer, and/or partially into the I layer or lightly doped layer and/or fully through the I or lightly doped layer and/or partially into the lower doped layer and/or through the lower doped layer. In some cases the microstructured holes can extend into the silicon regions vertically and/or laterally.

Operating wavelength can range from 800 nm to 2000 nm depending on the Ge fraction in the GeSi alloy. In some cases from 1250 nm to 1350 nm, and in some cases from 1550 nm to 1650 nm. In some cases from 840 nm to 960 nm and in some cases from 900 nm to 1070 nm and in some cases from 840 nm to 1100 nm and in some cases from 900 nm to 1350 nm. Responsivity can range from 0.1 A/W to 1 A/W at at least one of the wavelength in the wavelength span. In some cases responsivity can be 0.1 A/W or greater at at least one wavelength in the wavelength span, in some cases 0.3 A/W or greater at at least one wavelength in the wavelength span, in some cases 0.5 A/W or greater at at least one wavelength in the wavelength span, in some cases 0.8 A/W or greater at at least one wavelength in the wavelength span, and in some cases 1 A/W or greater at at least one wavelength in the wavelength span.

Data rates can range from 10-50 Gb/s or higher, in some cases 25 Gb/s or higher, in some cases 40 Gb/s or higher, and in some cases 50 Gb/s or higher.

Analog Devices, Inc. data sheet ADN3010-11 11.3 Gbps Optical Receiver (incorporated herein by reference), shows the integration of a SiGe PIN photodiode with TIA and LA with data rate bandwidth to 11.3 Gb/s. The bandwidth can be limited by the thickness of the SiGe layer which was chosen to achieve a responsivity of 1A/W. This requires a thickness ranging from 3-4 micrometers with a saturation velocity of approximately $0.7 \times 10^7$ cm/s for electrons in Ge. The data rate is thus limited to approximately 9 GHz or less or approximately 10-13 Gb/s. According to some embodiments, to achieve higher data rates a thinner GeSi layer can be provided, and to achieve high responsivity, microstructured holes can be provided to enhance the absorption and therefore the quantum efficiency and responsivity of a thinner GeSi layer. For example, a 2 micrometer or less thick Ge layer can achieve in excess of 22 Gb/s data rate bandwidth and microstructured holes can enhance the absorption of thinner Ge and/or GeSi layers to improve the responsivity and therefore the system sensitivity.

In FIG. 63C, shallow $P^+$ well 6384 can be implanted and/or diffused into the surface of the Ge/GeSi 6310 to a depth ranging from 50 nm to 300 nm and with resistivity less than 0.01 ohm-cm and in some cases a thin metal and/or transparent conducting metal oxide layer (not shown) can be deposited on the Ge/GeSi prior to microstructure hole etch with thicknesses ranging from 1 nm to 300 nm. Buried $N^+$ region 6304 can be formed using selective area ion implantation and/or diffusion, and/or epitaxially grown with resistivity of 0.01 ohm-cm or less and in some cases 0.001 ohm-cm or less and with thicknesses ranging from 100 nm to 500 nm or more, on N or P substrate. A buried O and/or N ion implant at selective areas 6334 can be implemented on the N or P substrate prior to $N^{--}$ (or $P^{--}$) or undoped or intrinsic epitaxial growth of 0.5 to 5 microns with resistivity of 1 ohm-cm or greater and in some cases 10 ohm-cm or greater. In some cases a SOI substrate can be use.

$N^+$ connecting wells 6306 can be formed to connect the cathode to the buried $N^+$ layer 6304. The connecting wells 6306 can be post-like with the post around the perimeter of the photosensitive region defined by the $P^+$ doped layer 6384 and/or a continuous wall around the perimeter. The posts and/or walls can be approximately 2 times the depletion width, for example if the depletion width between the $P^+$-I-$N^+$ is 2 microns, then the post and/or wall can be 4 microns or more distance from the $P^+$ region. Cathode metallization is formed on the $N^+$ well 6306 and can be ring shaped for circular shaped photosensitive areas and anode metallization can be formed on the $P^+$ region 6384. The anode can also be in the shape of a ring for a circular shaped photosensitive region (or it can be other shapes such as a polygonal). Transmission lines (not shown) conned the anode and cathode to the TIA and ASICs. CMOS/BiCMOS TIA and other ASICs can be fabricated on the low doped layer and other layer(s) may be provided if Ge/GeSi transistors are used and which are not shown in for simplicity. Electrical and/or optical isolation trench(es) 6360 can surround the entire MS-photodetector and in some cases partially surround the MS-photodetector. Many details are not shown, such as passivation, planarization, connecting metals, dielectric layers, antireflections, backside ohmic metallization if necessary, shallow trenches, and TSVs for solder bumps, for simplicity and clarity.

Figure 64:
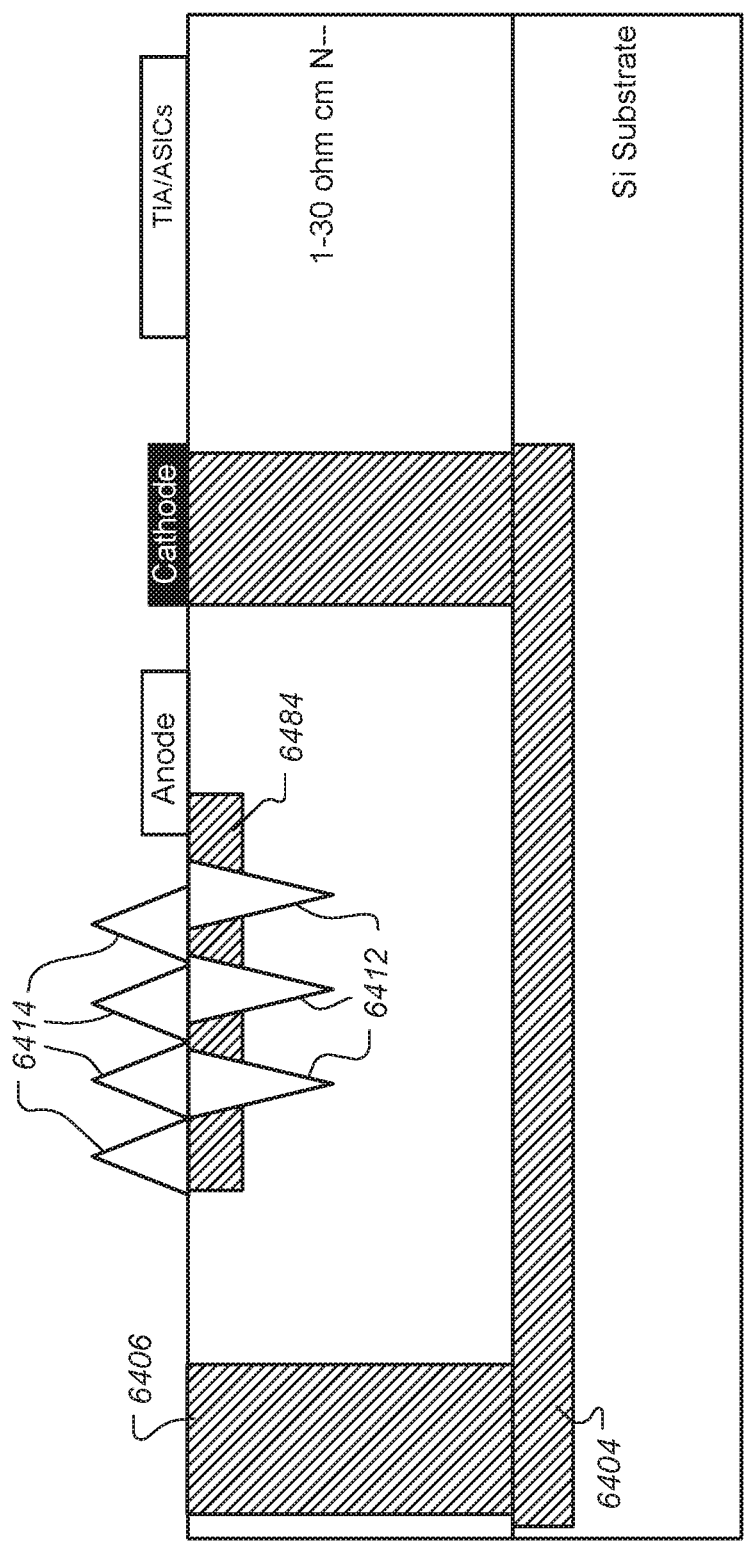
FIG. 64 is a cross section view showing aspects of a MSPD/MSAPD/MSOWPD/MSOWAPD having surface microstructures and is monolithically integrated with CMOS and/or BiCMOS ICs, according to some embodiments.

FIG. 64 is a cross section view showing aspects of a MSPD/MSAPD/MSOWPD/MSOWAPD having surface microstructures and is monolithically integrated with CMOS and/or BiCMOS ICs, according to some embodiments. The CMOS and/or BiCMOS ICs can include: TIAs, equalizers, limiting amplifiers, clock data recovery ICs, and other ASICs for optical data communication. In this example, microstructures are shown for both on top of the semiconductor surface and/or etched into the semiconductor surface. The microstructures 6414 on top of the surface can be a continuation of the semiconductor material above the photodetectors and/or deposited separately. The upper microstructures 6414 can also be a non-semiconductor material such as dielectric, amorphous semiconductor, metal, a combination thereof, or a combination of semiconductor, non-semiconductor and/or other materials such as transparent conducting metal oxides. The above the surface microstructures 6414 can reduce reflection, and/or channel trapped photons to the photodetecting region and/or supplement the microstructures 6412 etched into the semiconductor to further enhance the absorption. The above surface microstructures 6414 can have any cross sectional shape, for example funnel, inverted pyramids, cylindrical, trapezoidal, V shaped, hourglass, ball shaped and/or a combination of shapes. The lateral shapes of microstructures 6414 can be grating-like, circular, rectangular, polygon, oval, hourglass, amoeba shaped, star shaped, chevron shaped, or combination of shape and sizes. The lateral dimensions of microstructures 6414 can range from 20-10000 nm and the thickness can range from 10-10000 nm. The spacing of microstructures 6414 can range from 10-5000 nm and can be periodic and/or aperiodic.

The monolithic integrated microstructure enhanced photodetectors and CMOS/BiCMOS electronics may not need further hermetic packaging since the entire chip can be passivated with native oxides and/or dielectrics. However in some cases the entire monolithically integrated MSPD/AMSPD with CMOS and/or BiCMOS electronics chip can be entirely and/or partially hermetically sealed with dielectrics such as silicon oxide, silicon nitride, aluminum oxide, aluminum nitride, polymers such as polyimide, and/or spin-on-glass.

Yashiki et al, 5 mW/Gbps hybrid-integrated Si-photonics-based optical I/O cores and their 25-Gbps/ch error-free operation with over 300-m MMF, OFC 2015 ©OSA 2015 (incorporated herein by reference and referred to herein as "Yashiki") shows a hybrid packaging of photodetector with TIA using a glass and silicon platform. In contrast, according to some embodiments of this disclosure, a MSPD is monolithically integrated with CMOS/BiCMOS ASICs, which can reduce the entire 25 Gb/s optical receiver to a single chip. The single chip can include TSVs (through silicon vias) that can provide a hollow optical waveguide to the MSPD/MSAPD/MSOWPD/MSOWAPD. According to some embodiments, glass may be used to provide a TGV (through glass via) hollow optical waveguide to the MSPD/MSAPD/MSOWPD/MSOWAPD.

Also shown in FIG. 64, ion implanting and/or diffusion with dopants of P type (N type) can be used to form a $P^+$ layer/region 6384. Also, $N^+$ connecting wells 6406 can be formed to connect the cathode to a buried $N^+$ layer 6404. These structures can be formed according the descriptions of similar structures shown herein (e.g. FIG. 63C).

Figure 65:
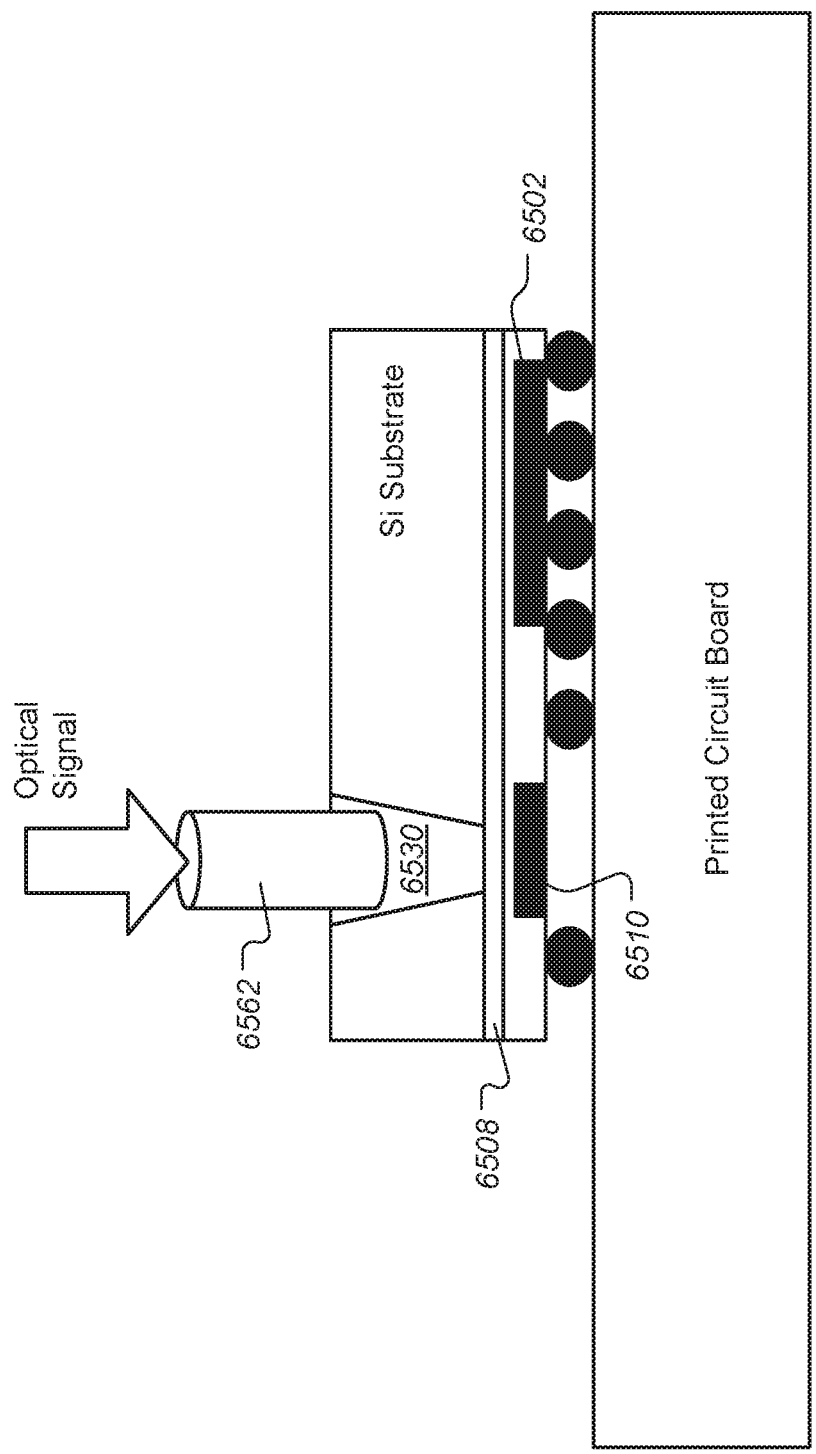
FIGS. 65, 66 and 67 are cross sectional views showing aspects of monolithically integrated MSPDs and CMOS/BiCMOS ICs with a through silicon via (TSV), according to some embodiments.
Figure 66:
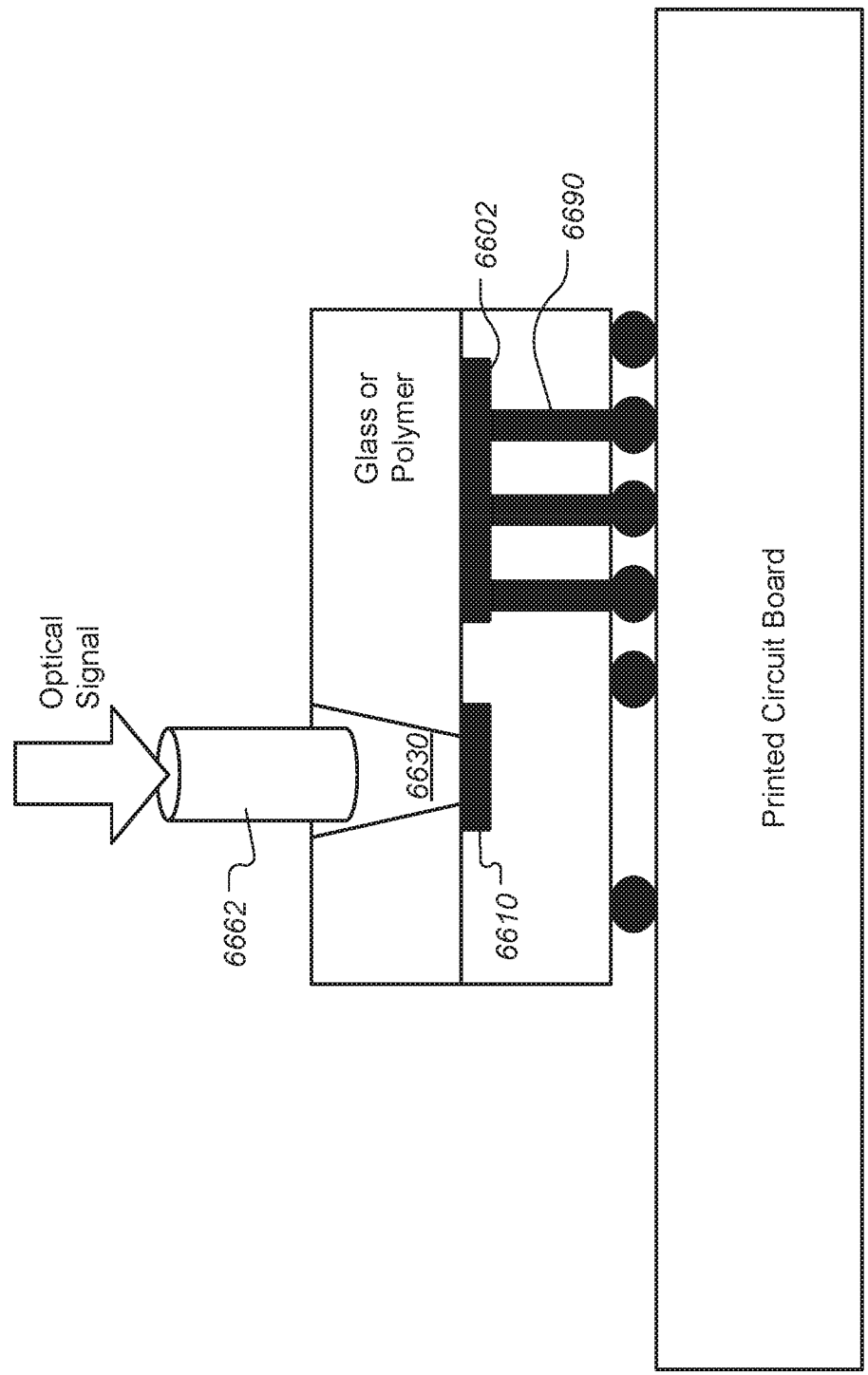
Figure 67:
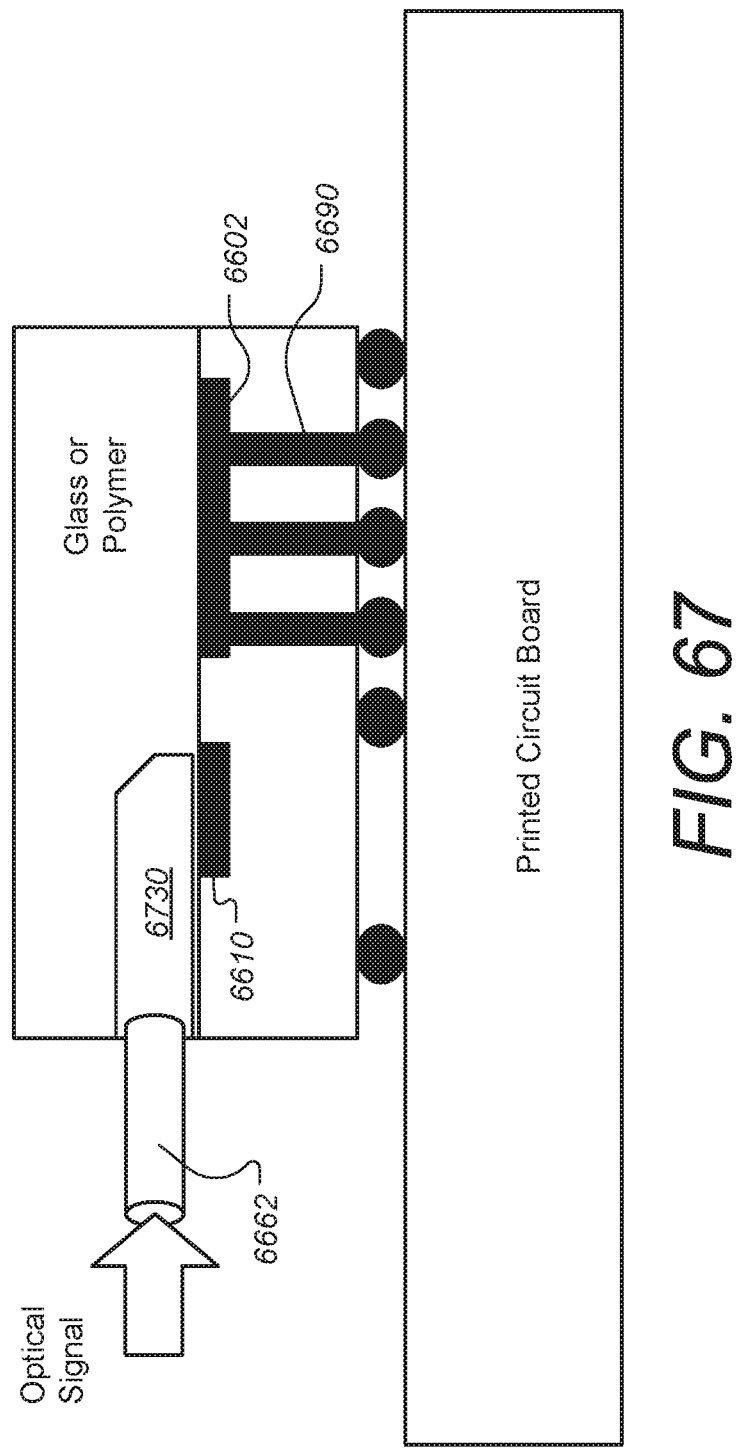

FIGS. 65, 66 and 67 are cross sectional views showing aspects of monolithically integrated MSPDs and CMOS/BiCMOS ICs with a through silicon via (TSV), according to some embodiments. As used herein the terms MSPD/MSAPD/MSOWPD/MSOWAPD collectively can also be referred to as Microstructured Photodetector, MS-PD, or MSPD. FIG. 65 shows a monolithically integrated MSPD such as one shown in FIG. 58 with an MSPD 6510 integrated with CMOS/BiCMOS circuitry 6502 on a silicon substrate. The CMOS/BiCMOS circuitry 6502 be ASICs with TIAs that also include equalizers, limiting amplifiers, clock data recovery, buffers, and/or electrical signal transmitters. In FIG. 65 a TSV 6530 is etched through the silicon substrate, which can range in thickness from 300 to 1000 micrometers. The sidewalls of TSV 6530 can be coated with metal and/or dielectrics to assist in guiding the optical signal to the MSPD. A BOX layer 6508 can be used as an etch stop layer for the TSV etching process. In some cases the optical fiber 6562, which can be single mode fiber (SMF) and/or multimode fiber (MMF), is inserted partially into the TSV 6530. The monolithically integrated MSPD 6510 with CMOS and/or BiCMOS ASICs 6502 can be in the form of a single chip and can be solder bumped directly onto a printed circuit board in a flip chip manner. This significantly simplifies packaging when compared to FIG. 1 of Yashiki. The simplification can reduce the cost of the optical receiver by 25% or more.

FIG. 66 show a integrated structure as in FIGS. 58-64, with the addition of a TSVs 6690 to provide electrical contacts between the CMOS/BiCMOS electronics 6602 to the printed circuit board with the aid of solder bumps that both fix the chip in place and provide electrical connectivity to external circuits. A glass and/or polymer superstrate can be attached to the monolithically integrated chip to provide a light guide to the MSPD 6610 and can also provide an encapsulation for the chip to seal the chip against the environment. An example of such a superstrate is discussed in Yashiki.

In some cases, the glass and/or polymer superstrate may be attached at wafer level to simplify packaging and in some cases the glass and/or polymer superstrate may be 3D (dimension) printed at wafer level. A through glass via (TGV) 6630 is provided that may be coated with metal and/or dielectric to provide light guiding with minimal loss and in some cases SMF and/or MMF 6662 can be partially inserted into the TGV 6630.

FIG. 67 is similar to FIG. 66, except showing a 45 degree bend in a light pipe 6730 which allows SMF and/or MMF 6662 to be inserted and/or coupled to, parallel to the plane of the chip which in some cases may be desirable. The light pipe 6730 is a hollow optical waveguide that can be coated with metal and/or dielectric layers. In some cases, the superstrate can be glass and/or polymer and can be applied at the wafer level for example and in some cases can be 3D printed at the wafer level. See, e.g., Pyo et al, 3D Printed Nanophotonic Waveguides, http://onlinelibrary.wiley.com/doi/10.1002/adom.201600220/abstract (incorporated herein by reference). In some cases, the optical waveguide 6730 can be made of semiconductor. See, e.g., Miura et al, Modeling and Fabrication of Hollow Optical Waveguide for Photonic Integrated Circuits, Jpn. J. Appl. Phys. Vol. 41 (2002) pp. 4785-4789 (incorporated herein by reference).

FIG. 68A is a cross section showing a layer structure of Ge and/or GeSi on Si for monolithic integration of an MSPD with CMOS/BiCMOS ASICs, according to some embodiments. The Ge and/or GeSi layer 6802 is low doped and/or not intentionally doped layer with resistivity in the neighborhood of 1-10 ohm-cm or higher. $N^{++}$ and/or $P^{++}$ layer(s) can also be included on opposite sides of the Ge and/or GeSi layer 6802. Layer 6804 is one such layer, and another layer (not shown) could be diffused or grown on top of layer 6802. The doped layers can have a resistivity in the neighborhood of 0.005-0.001 ohm-cm or lower and thickness can range for the doped layers from 50 nm to 500 nm and in some cases from 100 nm to 300 nm. The $N^+$ (or $P^+$) doped layer 6804 can be buried by selective area ion implantation and/or diffusion of N type dopants in the $N^{--}$ or $P^{--}$ I Si layer, in some cases, the $N^+$ layer 6804 can be epitaxially grown on the I Si layer 6806 and in some cases the $N^+$ layer 6804 can be selectively etched away in areas where the CMOS/BiCMOS TIA/ASICs will be fabricated together with the Ge/GeSi layer 6802. In some cases, the ion implant and/or diffusion can be a blanket area implant instead of selective area and the doped region can be etched off prior to CMOS/BiCMOS processing. Ge/GeSi can be grown on the buried $N^+$ layer 6804 which is in and/or on top of the low doped Si layer 6806 as shown in FIG. 68A.

The undoped or low doped layer 6802 can range from 500 nm to 5000 nm and in some cases from 500 nm to 2000 nm. The Ge fraction in the GeSi alloy can range from 0.1% to 100%, where 100% is all Ge. The Ge and/or GeSi layer 6802 can be grown on a Si layer 6806 that can have a resistivity in the neighborhood of 1-30 ohm-cm or more and a thickness ranging from 0.5 to 2 microns and in some cases approximately 1.1 microns. In some cases the Ge and/or GeSi layer 6802 can be grown on other layer(s) that may be needed for CMOS/BiCMOS electronics, which can include circuitry for signal processing; conditioning; enhancements; storage; buffering; transmission; and other processes for specific applications such as data centers, high performance computing, and LIDAR. The thicknesses of the Ge/GeSi layer for MSPD may be determined for desired specific applications, bandwidths, responsivity, voltages, for high bandwidth data rate optical communications for datacenters and/or for high sensitivity lower data rate bandwidth for LIDAR for example. Germanium resistivity verses doping is given by http://www.ioffe.ru/SVA/NSM/Semicond/Ge/electric.html (incorporated herein by reference).

Figure 68B:
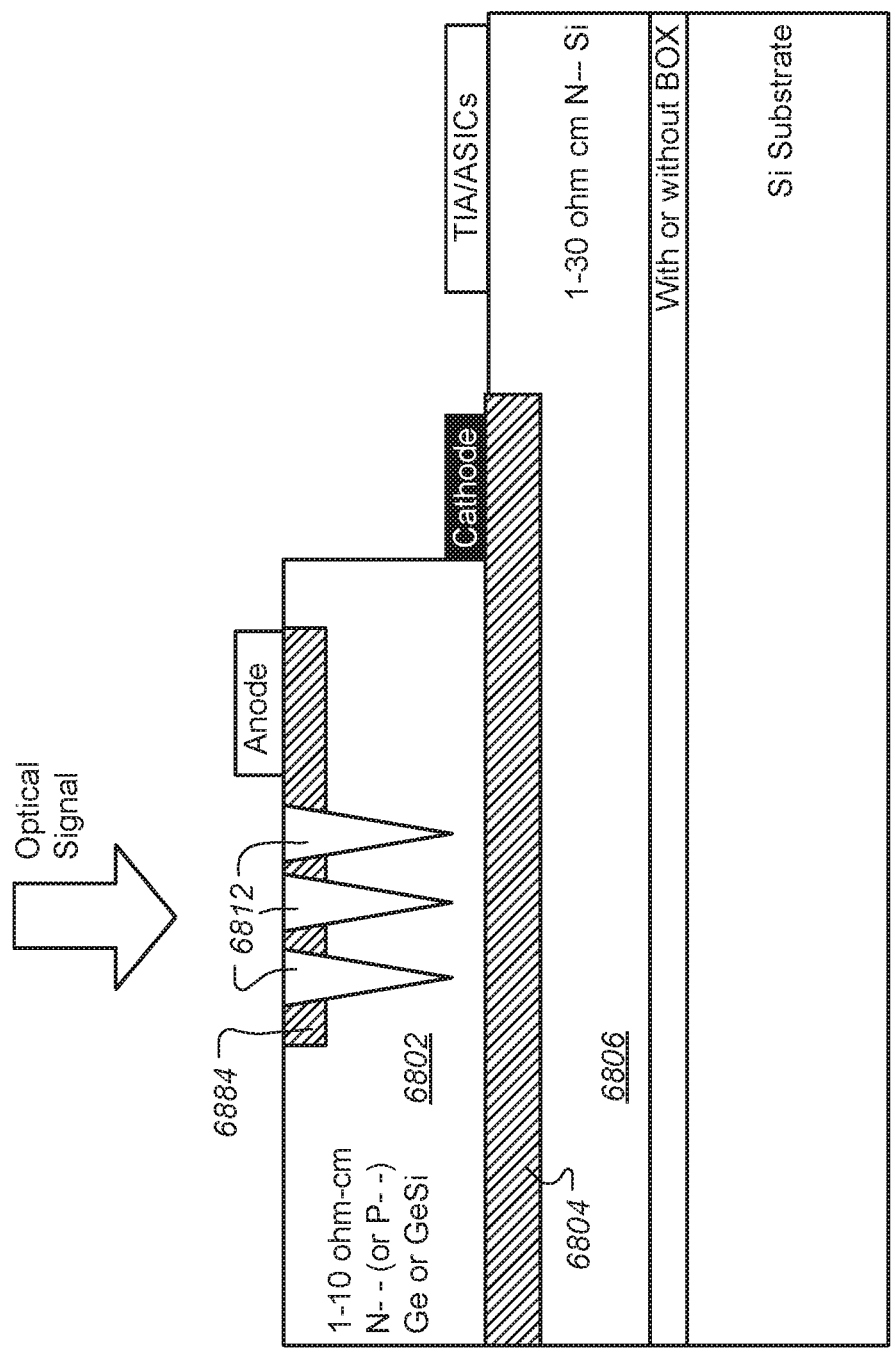
FIG. 68B is a cross section showing some further aspects of a monolithically integrated CMOS/BiCMOS ASICs with a MSPD using a Ge and/or GeSi on Si, according to some embodiments.

FIG. 68B is a cross section showing some further aspects of a monolithically integrated CMOS/BiCMOS ASICs with a MSPD using a Ge and/or GeSi on Si, according to some embodiments. For simplicity conical cross sectional holes 6812 are shown which can also be inverted pyramids, funnels, cylindrical, hourglass, microstructured optical waveguides and/or any combinations thereof for example. Lateral dimensions of the microstructures holes and/or waveguides can range from 100 nm to 5000 nm and in some cases from 300 nm to 2500 nm, spacings between adjacent holes, waveguides can range from 50 nm to 2500 nm and in some cases from 100 nm to 1000 nm. Microstructure holes 6812 can be periodic and/or aperiodic and any combination of periodic and aperiodic. Vertical depth of the holes and/or waveguides can range from 100 nm to 5000 nm and in some cases from 300 nm to 2000 nm. The microstructured holes/waveguides 6812 can be etched pass the first doped layer 6884 on the surface, and/or into the low doped or undoped region 6802 and in some cases can be etched to the second doped layer 6804 and in some cases can be etched past the second doped layer 6804.

FIG. 68B also shows a bottom $N^{++}$ doped layer 6804 that can either be epitaxially grown on the I or low doped Si layer and/or it can be formed by selective area ion implantation and/or diffusion of N type dopants. The $N^{++}$ (or $P^{++}$) region 6804 can be formed in the silicon I or low dope layer prior to Ge and/or GeSi layer growth. A $P^{++}$ shallow well 6884 can be formed partially on the Ge and/or GeSi surface and on which an anode metallization and electrodes can be formed. A mesa etch to the $N^{++}$ region and the $N^{++}$ region, cathode metallization and electrodes can be formed to compete a P-I-N microstructure photodiode and/or microstructure avalanche photodiode with the addition of a charge and multiplication (avalanche) layers. Passivations are not shown and can be the same as Kang et al 2008 for example. The CMOS/BiCMOS integrated circuits are formed first by etching the Ge and/or GeSi away, and in some cases the etching may not be performed if CMOS and/or BiCMOS are formed on the GeSi. An electrical isolation trench (not shown) is optional. The optional trench can also provide optical isolation. A BOX layer can be included. A reverse bias voltage is applied between the anode and cathode and the high speed electrical signal is extracted from the anode and cathode via a transmission line that is connected to the inputs of electronics such as a transimpedance amplifier (TIA) and/or equalizer and/or other ASICs. Wavelength range can span from 800 nm to 2000 nm and in some cases to 2100 nm or longer if the Ge is not relaxed, and in some cases from 800 nm to 1100 nm, in some cases from 1250 nm to 1350 nm, in some cases from 1250 nm to 1550 nm, in some case from 1000 nm to 1650 nm, in some cases from 900 nm to 1700 nm, and in some cases from 900 nm to 1350 nm. Data bandwidth for a single channel can be 5 Gb/s, 10 Gb/s, 25 Gb/s, 30 Gb/s, 40 Gb/s, 40 and/or 50 Gb/s, 80 Gb/s, 100 Gb/s or higher at the output of the electronics of the monolithically integrated chip at at least part of the wavelengths described above depending on the Ge fraction in the GeSi alloy. Responsivity can be 0.1 A/W or higher at at least part of the wavelength spectrum, in some cases can be 0.3 A/W or higher, in some case can be 0.5 A/W or higher and in some case can be 0.8 A/W or higher. Using amplification by avalanching process, the responsivity can be higher by 3 dB, 6 dB, 9 dB and/or 12 dB, respectively.

Optical signals can impinge from the top surface as shown. The lateral dimension of the microstructure photodetector (MSPD, MSAPD, MSOWPD, MSOWAPD) can range from 20 to 500 micrometers. In some cases the microstructured (MS) photodetector is circular, and the diameter can range from 20 to 500 micrometers or more and in some cases from 30 to 80 micrometers. The MS photodetector can also be illuminated from the bottom through a via (not shown). TSV(s) can be used to solder bump the monolithically integrated chip to the printer circuit board either from the front or from the back as shown for example in FIGS. 65-67. Passivation and/or encapsulation can be used to avoid the use of hermetic packaging.

The MSPD's large photosensitive area can be used for both single mode fiber and multimode fiber. Since the photosensitive area is large, the alignment of the optical fiber can be passively aligned with alignment tolerances of many micrometers and in some cases 10 or more micrometers which can greatly reduce the cost of packaging. For comparison, with waveguide type detectors having dimensions of a few microns, single mode fiber alignment can have alignment tolerances less than a micrometer. Such tolerances are sometimes achieved using active alignment techniques where a fiber light is transmitted into the fiber during coupling to the waveguide photodiode while the output of the photodiode is monitored. This active alignment can represent a significant portion of the packaging cost.

In addition, the monolithic integration of MSPDs with CMOS/BiCMOS ASICs can be single MSPD and/or multiple such as 4 MSPDs connected to CMOS/BiCMOS ASICs. In some cases 8, 16, 32 or more MSPDs can be integrated for parallel optical and/or coarse wavelength division multiplexing (CWDM). In addition, for LIDAR applications, the lateral dimension of the MSPD/MSAPD can be 1000 microns and can be a square, rectangular or polygonal shaped MS-photodetector to provide high sensitivity at low revers bias voltages in the range of −10 to −35V. The use of MS-holes allow the use of thin layers and therefore lower voltages. Commercial Si APDs can have a reverse bias voltage as high as −100 volts for example.

Figure 69A:
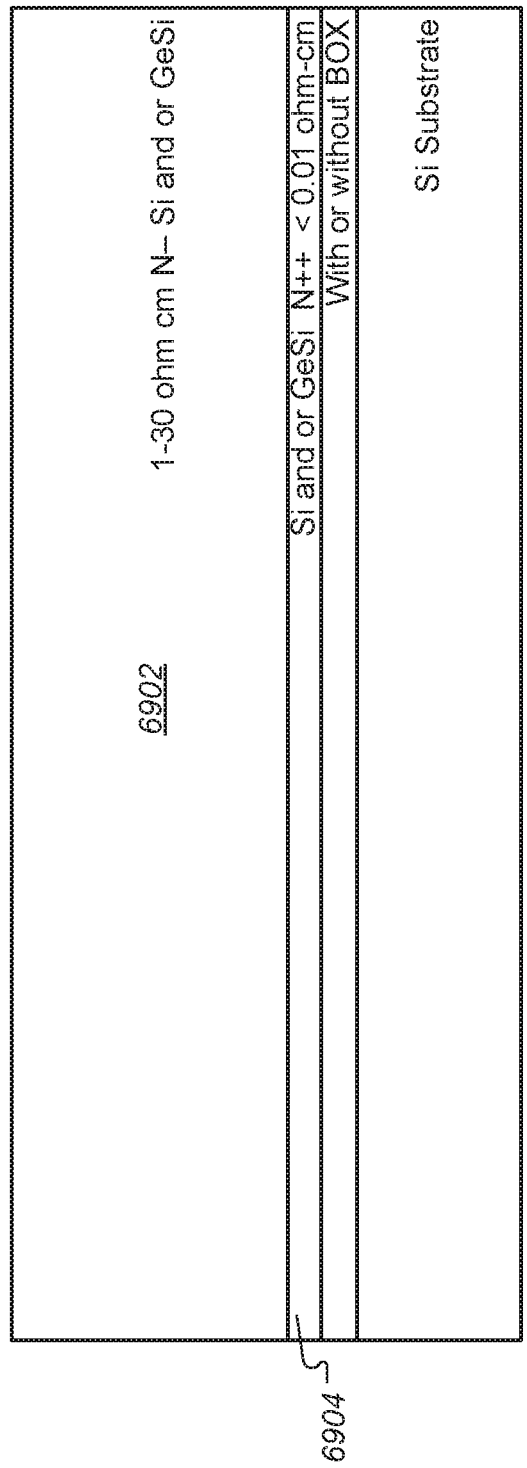
FIGS. 69A and 69B are cross section views showing some aspects of monolithic integration of a MSPD with CMOS/BiCMOS ASICs, according to some embodiments.
Figure 69B:
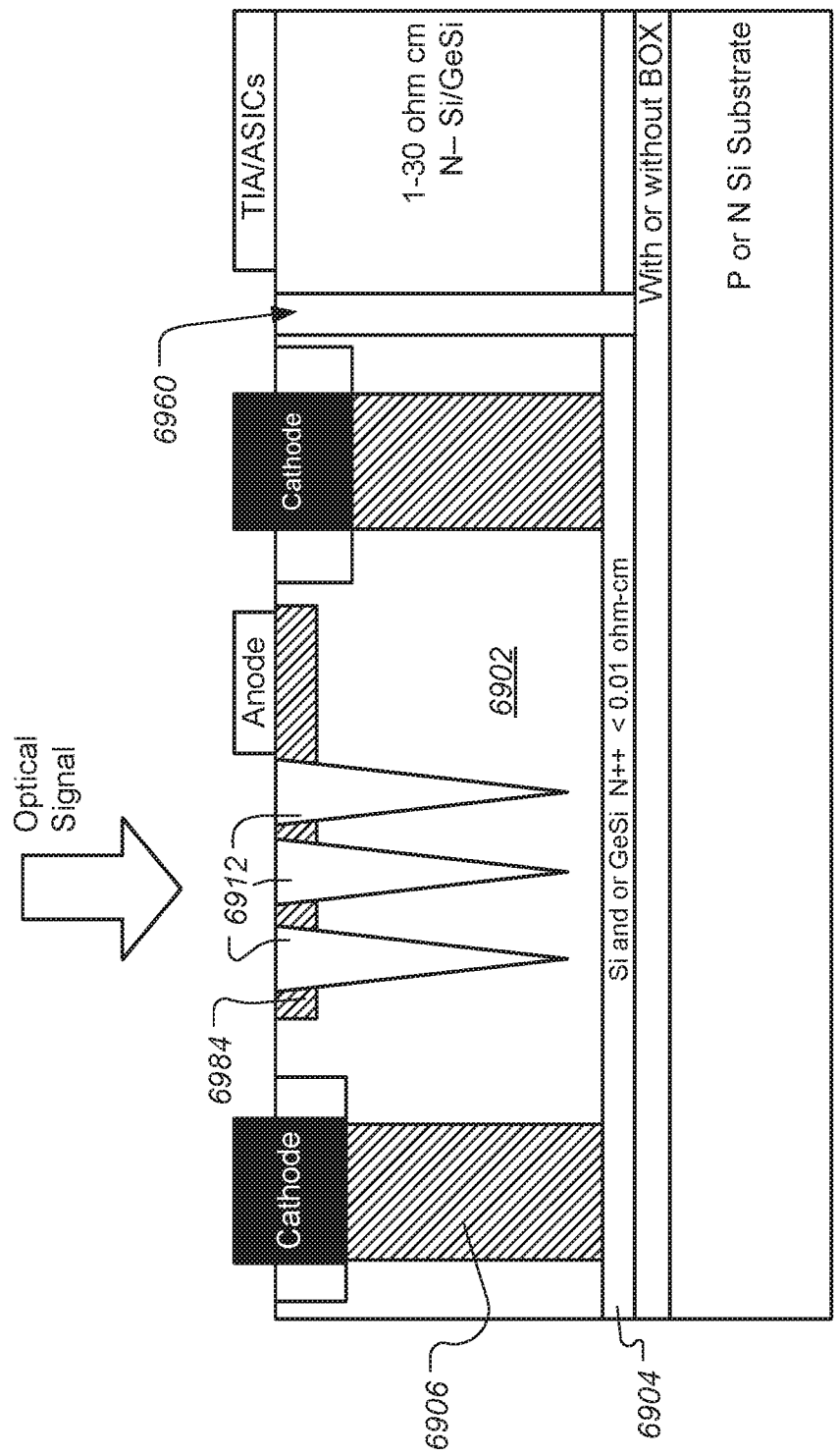

FIGS. 69A and 69B are cross section views showing some aspects of monolithic integration of a MSPD with CMOS/BiCMOS ASICs, according to some embodiments. Note that some necessary CMOS/BiCMOS layers may not be shown for simplicity. A BOX layer can be included followed by a doped layer 6904 such as $N^{++}$ (or $P^{++}$) implanted and/or diffused into the device layer of the SOI and/or grown on the device layer epitaxially with resistivity in the neighborhood of 0.01 ohm-cm or less and in some cases 0.001 ohm-cm or less. A low doped or undoped layer 6902 of Si and/or GeSi can be formed with resistivity in the neighborhood of 1-30 ohm-cm or more. Further layers used for the CMOS/BiCMOS ICs are not shown. Thickness of the low doped and/or undoped $N^{--}$ ($P^{--}$) layer 6902 can range from 0.5 to 5 micrometers and in some cases from 0.5 to 2 micrometers. The doped layer 6904 thickness can range from 0.1 to 0.5 micrometers. The BOX layer, if included, can range from 0.2 to 4 micrometers or more. A device layer (not shown) can be formed between the BOX and layer 6904, that can range from 0.1 to 0.3 micrometers. A handle wafer and/or silicon substrate can range from 400 to 1000 micrometers.

The highly doped layer 6904 may be gown and/or implanted and/or diffused prior to the low doped and/or undoped layer of Si and/or GeSi 6902 where the Ge fraction is less than 100% and in some cases less than 50% and in some cases less than 40% and in some cases can be relaxed and/or not relaxed. Shown in FIG. 69B, a $N^{++}$ connecting well 6906 can be diffused and/or implanted to make contact with the doped layer $N^{++}$ (or $P^{++}$) 6904 and cathode metallization such as an ohmic contact and metal electrodes are formed on the doped $N^{++}$ connecting well 6906 which can have a resistivity of 0.01 ohm-cm or less and in some cases 0.001 ohm-cm or less. A shallow trench can be etched around the photosensitive region defined by the $P^+$ or $P^{++}$ doped region 6984 on the surface of the Si and/or GeSi, to reduce the distance of the diffusion and/or ion implantation to the doped $N^{++}$ layer 6904. The doped $N^{++}$ connecting well 6906 can form a continuous perimeter around the $P^{++}$ region 6984 and/or the connecting $N^{++}$ well 6906 can form a few points such as posts that is non-continuous around the $P^{++}$ region 6984, which can reduce the contribution of capacitance to the over all P-I-N structure. The P$^{++}$ layer 6984 can be formed on part of the surface of the Si and/or GeSi with a resistivity of 0.01 ohm-cm or less and in some cases 0.001 ohm-cm or less, and with an anode metallization to complete the P-I-N structure and microstructure holes 6912 (or waveguides) can be dry and/or wet etched as discussed in earlier monolithic integrated structures. The microstructure holes 6912 can be inverted pyramids, be funnel shaped, and/or have cylindrical, conical, or hourglass cross sections. The holes 6912 can be circular, oval, square, polygonal, hourglass, amoeba and/or any combination of shapes. Dimensions, spacings, doping, thicknesses, bandwidths are similar to those discussed earlier such as for example FIG. 68B. For example, the lateral dimensions of the microstructures holes can range from 100 nm to 5000 nm and in some cases from 500 nm to 2500 nm. The spacing between adjacent microstructures can range from 50 nm to 5000 nm, in some cases from 100 nm to 1500 nm and in some cases 20 nm to 2000 nm. The spacing can be periodic, aperiodic or a combination of periodic and/or aperiodic. The depth of the microstructure holes can range from 100 nm to 5000 nm. In some cases the holes can be etched past the first doped layer 6984 and partially into the low doped and/or undoped layer 6902, in some cases entirely through the low doped layer 6902 and partially into and/or past the second doped layer 6904. In some cases, the first doped layer 6984 can be formed after microstructure holes 6912 are etched partially into the low doped and/or undoped region 6902 by selective area ion implantation and/or selective area diffusion of dopants as in FIG. 42. The thickness of the doped layers 6984 and 6904 can range from 100 nm to 500 nm with resistivity in the neighborhood of 0.01-0.001 ohm-cm or less. The low doped layer 6902 can have a thickness ranging from 0.5 to 5 micrometers and in some cases 0.5 to 2 micrometers. The low doped layer 6902 can have a resistivity in the neighborhood of 1-100 ohm-cm or higher. Data rates from the output of the monolithically integrated MS-photodetector with CMOS/BiCMOS ASICs chips can range from 2-50 Gb/s or higher, 10 to 50 Gb/s or higher, 25 Gb/s or higher, 30 Gb/s or higher, 40 Gb/s or higher, 50 Gb/s or higher, 80 Gb/s or higher, and in some cases 100 Gb/s or higher. Multiple MSPDs and CMOS/BiCMOS ASICs (application specific integrated circuits) can be monolithically integrated on a single silicon chip that can be solder bumped directly to a printed circuit board. The optical signal can enter from the top, the bottom and/or from the side as in FIGS. 65, 66 and 67. Arrays of MSPDs of 4 for example each operating at 25 Gb/s can achieve an aggregated bandwidth of 100 Gb/s and if each MSPD and associated ASICs can operate at 50 Gb/s then the aggregated bandwidth can be 200 Gb/s. In some cases an array of 4×2 each at 50 Gb/s can achieve an aggregated bandwidth of 400 Gb/s. A 4×4 array can achieve 800 Gb/s. The array can keep increasing to n×m where n and m are whole numbers, and n×m×BW (BW is the output bandwidth of the monolithic chip for each channel, where channel can be a single MS-PD with its associated ASICs) will give the aggregated bandwidth. The diameter, assuming a circular photosensitive area can range from 10 to 500 micrometers, in some cases 25 to 100 micrometers and in some cases 30 to 80 micrometers. The photosensitive area can have other shapes such as square, polygonal, or oval. The distance between multiple MSPDs is determined by applications. For example in parallel optics, the distance can be as much as 250 micrometers, while for other applications, such as imaging or LIDAR, the MSPD can be as closely spaced as a few micrometers. In some applications the spacing may be in a regular and/or irregular patterns, MSPDs/MSOWPDs can be operated at a reverse bias voltage in the range of −1 to −5 V applied to the anode and cathode, in some cases at −3.3V. MSAPDs/MSOWAPDs can be operated at a reverse bias voltage in the range −5 to −30V applied to the anode and cathode. These ranges can be applied to monolithically integrated MSPSs/MSAPDs with CMOS/BiCMOS ASICs. described herein, supra.

The wavelength span can range from 800 nm to 1100 nm, in some cases to 840 nm to 960 nm, in some cases 940 nm to 1100 nm, in some cases 1100 nm to 1250 nm, in some cases 1250 nm to 1350 nm, in some cases 1350 nm to 1550 nm, and in some cases 1550 to 2000 nm. Responsivity can be 0.1 A/W or higher at at least part of the wavelength span, in some cases 0.2 A/W or higher, in some cases 0.3 A/W or higher, in some case 0.5 A/W or higher, in some cases 0.8 A/W or higher at at least part of the wavelength span. For MSAPD and/or MSOWAPD, the gain can range from 2-10 or higher, in some cases 2-100 or higher and the responsivity of the MSPD/MSOWPD can be multiplied by the gain factor of 2-10 and/or 2-20 or more. For example, a MSPD having responsivity of 0.5 A/W can correspond to a MSAPD having a responsivity of 5 A/W with a gain of 10. In some cases, the gain times bandwidth product can be a constant, and the higher the gain the lower the data rate bandwidth. For LIDAR and some LiFi applications, high sensitivity can be a higher priority than bandwidth in which case a high gain can be desirable and bandwidth can be in the high Mb/s to low Gb/s. Reverse bias voltage may range in the −20 to −50V. The different wavelength spans depends on the amount of Ge in GeSi alloy.

In all the monolithically integrated MSPDs with CMOS/BiCMOS ASICs an electrical isolation trench (such as trench 6960) may be used to isolate the MSPD from the electronics. The trench can also isolate stray optical signals from interfering with the electronics.

In some cases, in all the monolithically integrated MSPDs with CMOS/BiCMOS electronics, transparent conduction metal oxides, semitransparent metal of a few nm thickness, can be used on the top doped layer where the holes are etched through to help reduce series resistance.

As described herein supra, the optical signal can impinge from the top surface and a TSV can be used to contact the electrodes to the bottom of the substrate such that solder bump can be formed to solder bump the monolithic chip directly to a printed circuit board. The optical signal can also be illuminated from the back (or bottom) through a via and the front (or top) side is solder bumped to the printed circuit board. As described herein supra, a reflective layer can be used on one surface to reflect back any stray optical signal back to the microstructures for further enhancement of the absorption and to reduce the thickness of the low dope or undoped layer further to increase the bandwidth.

In some cases multiple MS-photodetectors are integrated with CMOS/BiCMOS electronics to increase the aggregated bandwidths to 100 Gb/s, to 200 Gb/s, 400 Gb/s, 800 Gb/s, 1200 Gb/s or more. In some cases a dense multiple MS-photodetector with CMOS/BiCMOS can be used for imaging such as for LIDAR and/or other robotic applications where high data rates from each MSPD maybe a few Gb/s or less but the aggregated rate from the entire array of MSPDs may be high, such as 100 Gb/s or higher.

Microstructured holes and/or waveguides for photon trapping for the enhancement of absorption can be applied to single crystalline, poly crystalline, micro crystalline, and amorphous material, and in some cases to polymers, semi-metals, semiconductors, dielectrics, glass, and insulators. In the case of insulators, dielectrics and glass, those materials can be doped with photo active ions such as Yt, Er and other rare earth elements and F-center, other color centers, for optical gain such as for fiber laser, optical disk amplifiers, or holographic image storage. Microstructured holes and/or waveguides for photon trapping for the enhancement of absorption can be applied to the detection of photons and/or the amplification of photons where the material can have gain for example, such as optical amplifiers, light emitting diodes and lasers. In the detection of photons, an external reverse bias voltage is applied between the anode and cathode, in the amplification and/or generation of photons a forward bias voltage is applied between the anode and cathode. In some cases, such a fiber amplifiers, an optical source provides a pump to amplify the optical signal where the microstructure holes can be used to photon trap both the pump source and the optical signal such that photon trapping or slowing can enhance their interaction time for more efficient amplification.

Figure 70A:
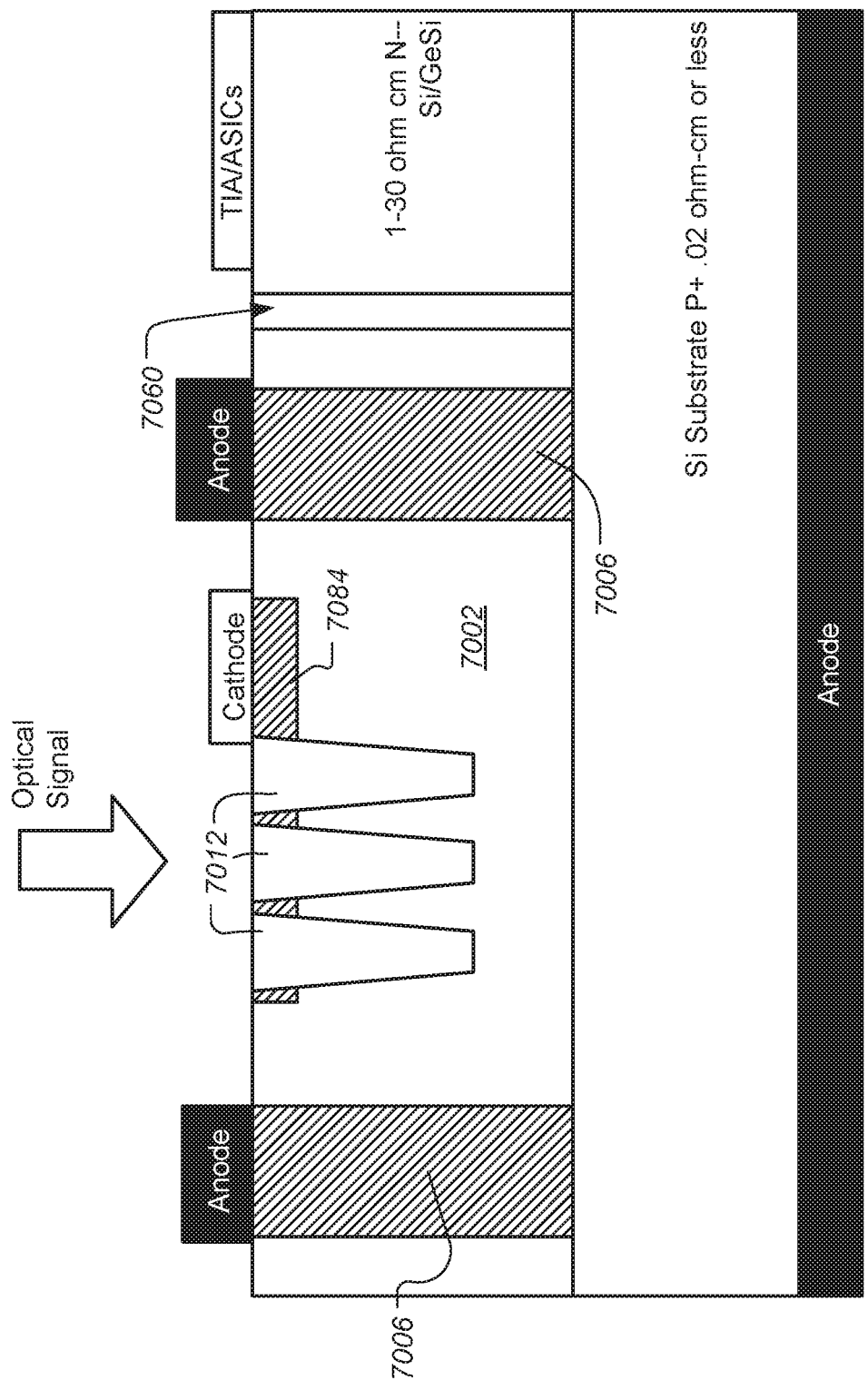
FIG. 70A is a cross section illustrating some aspects of integration of a MSPD with CMOS/BiCMOS ASICs, according to some embodiments.

FIG. 70A is a cross section illustrating some aspects of integration of a MSPD with CMOS/BiCMOS ASICs, according to some embodiments. The MSPD can be a MSAPD, MSOWPD, MSOWAPD, and the ASICs can include TIAs, Equalizers, Limiting Amplifiers, buffers, drivers, other signal processing circuitry, data transmission circuitry, and other computing/storage components using standard CMOS/BiCMOS processing. On a P Si wafer with resistivity in the neighborhood of 0.02 ohms-cm or less, a $N^{--}$ layer 7002 is epitaxially grown. The layer 7002 can have a thickness of 0.5-2 micrometer, in some cases approximately 1 micrometer, in some cases approximately 2 micrometers, and in some cases 1-5 micrometers or more. $N^{--}$ layer 7002 can have resistivity in the neighborhood of 1-30 ohm-cm or more and in some cases 10 ohm-cm or higher. CMOS/BiCMOS ASICs are formed. In some cases additional layers such as GeSi may be provided for the CMOS/BiCMOS components. The $N^{++}$ shallow well 7084 can be formed on part of the surface and the $N^{++}$ defines approximately the area of photosensitivity for high speed and/or high sensitivity applications. The cathode is formed on the well 7084. The $N^{++}$ well 7084 can be diffused and/or ion implanted with N type ions to a depth ranging from 100 nm to 300 nm and with resistivity in the neighborhood of 0.01-0.001 ohm-cm or less. A multiple energy ion implantation process can be used to for a more uniform distribution of implanted ions. The $P^{++}$ connecting well 7006 to the $P^+$ substrate can be formed and where the anode metallization can be formed on the $P^{++}$ well. In some cases the $P^{++}$ connecting well 7006 may not be needed since the anode for the MSPD can be formed on the bottom of the P substrate such as shown in FIG. 70A. In some cases a metal connecting electrode can be formed from the surface to the $P^+$ substrate via a trench (not shown) and in some cases a TSV (not shown) can be formed to the bottom anode metal. As described herein supra, the connecting well 7006 can be at a few spots/posts or it can form a continuous perimeter around the photosensitive region defined mainly by the region under the $N^{++}$ layer 7084 where a high electric field can exist with a reverse bias between the cathode and anode with voltages in the range −1 to −4 volts and in some cases −3.3 volts. Microstructures such as holes 7012 and/or waveguides can be etched past the first doped layer 7084 and partially (5% to 95% for example) into the low doped and/or undoped region 7002. In some cases the microstructures can be etched pasts the low doped and/or undoped region 7002 and to the $P^+$ (or $N^+$) substrate.

Shape, dimensions and spacing of the microstructures are as described herein supra, and a combination of holes and/or microstructure optical waveguides can be provided as in FIG. 61. The lateral dimensions of the microstructures can range from 100 nm to 3000 nm and in some cases 300 nm to 3000 nm. The spacing can range from 50 nm to 3000 nm and can be periodic, aperiodic and/or a combination of periodic and aperiodic. The depth of the microstructures can range from 50 nm to 10000 nm, in some cases 300 nm to 2000 nm and in some cases 300 nm to 5000 nm. The cross sectional shape of the microstructure holes can be funnel as shown, inverted pyramid, cylindrical, polygonal, ball like, oval, hourglass, conical, and/or any combination of shapes with multiple sidewall angles achieved by a combination of dry etchings and/or wet etchings. The microstructures can be passivated with native thermal oxide, amorphous semiconductor, dielectric, cryalline semiconductor, micro and/or poly crystalline semiconductor, polymer, and/or any combination of passivations physical, chemical, hermetic and/or non hermetic sealing and/or packaging. Antireflection using dielectric, dielectric stacks, nanostructures, microstructures can be used to reduce reflection. In addition the CMOS/BiCMOS ASICs can be covered with a light shield to minimize interference. An electrical and/or optical isolation trench 7060 may be etched for further electrical and/or optical isolation. As in earlier discussions the integrated MSPD(s) with CMOS/BiCMOS ASICs can be solder bumped either on the front and/or back surface with appropriate paths for the optical signal to reach the MSPD.

Not shown for simplicity are the CMOS/BiCMOS structures and interconnect metals to form the ASICs nor the electrodes connecting the MS-PD to the ASICs.

Depending on the Ge fraction in the GeSi, the wavelength can span from 800 nm to 1600 nm, in some cases from 840 nm to 1100 nm, in some cases from 1250 nm to 1350 nm, in some cases 1500 nm to 1600 nm, in some cases 800 nm to 2000 nm, in some cases 800 nm to 880 nm, and in some cases 1000 nm to 1350 nm. Responsivity can be 100 mA/W or higher at at least a few wavelengths in the span, in some cases can be 200 mA/W or higher at at least a few wavelength in one of the wavelength spans, in some cases 300 mA/W or higher at at least a few wavelengths in one of the wavelength spans, in some cases 400 mA/W or higher at at least a few wavelengths in one of the wavelength spans, in some cases 500 mA/W or higher at at least a few wavelengths in one of the wavelength spans, in some cases 600 mA/W or higher at at least a few wavelengths in one of the wavelength spans, and in some cases 700 mA/W or higher at at least a few wavelengths in one of the wavelength spans. Data rate bandwidth from the integrated MSPD(s) and ASICs can range from 10 to 100 Gb/s or higher for a single MS-PD-ASICs integration, in some cases 25 Gb/s, in some cases 30 Gb/s, in some cases 40 Gb/s, in some cases 50 Gb/s, in some cases 80 Gb/s and in some cases 100 Gb/s. In a quad configuration where 4 MSPDs are integrated with ASICs, data rate from the integrated chip can be quadrupled to 40-400 Gb/s. With higher number of MSPDs in the array, the data rate can be further increased, approaching 1000 Gb/s or more.

For some applications such as LIDAR, where high data rate is less important, high sensitivity is more important and an MSAPD and/or MSOWAPD can improve system sensitivity significantly, a low voltage APD is desirable for integration with CMOS/BiCMOS. Using microstructures, the layer thicknesses can be reduced without sacrificing quantum efficiency and therefore the MSAPD and/or MSOWAPD can be operated at voltages less than −30V, in some cases less than −25 V, in some cases less than −20V, in some cases less than −15V, and in some cases less than −10V. Gain for the MSAPD can range from 2-10 and in some cases 2-100. The responsivity of the MSAPD/MSOWAPD can be 10× that of a MSPD/MSOWPD, and can be 20× or more than that of the MSPD/MSOWPD. For example, if the MSPD/MSOWPD responsivity is 0.3 A/W and a MSAPD/MSOWAPD with 20× results in responsivity being 6 A/W.

Figure 70B:
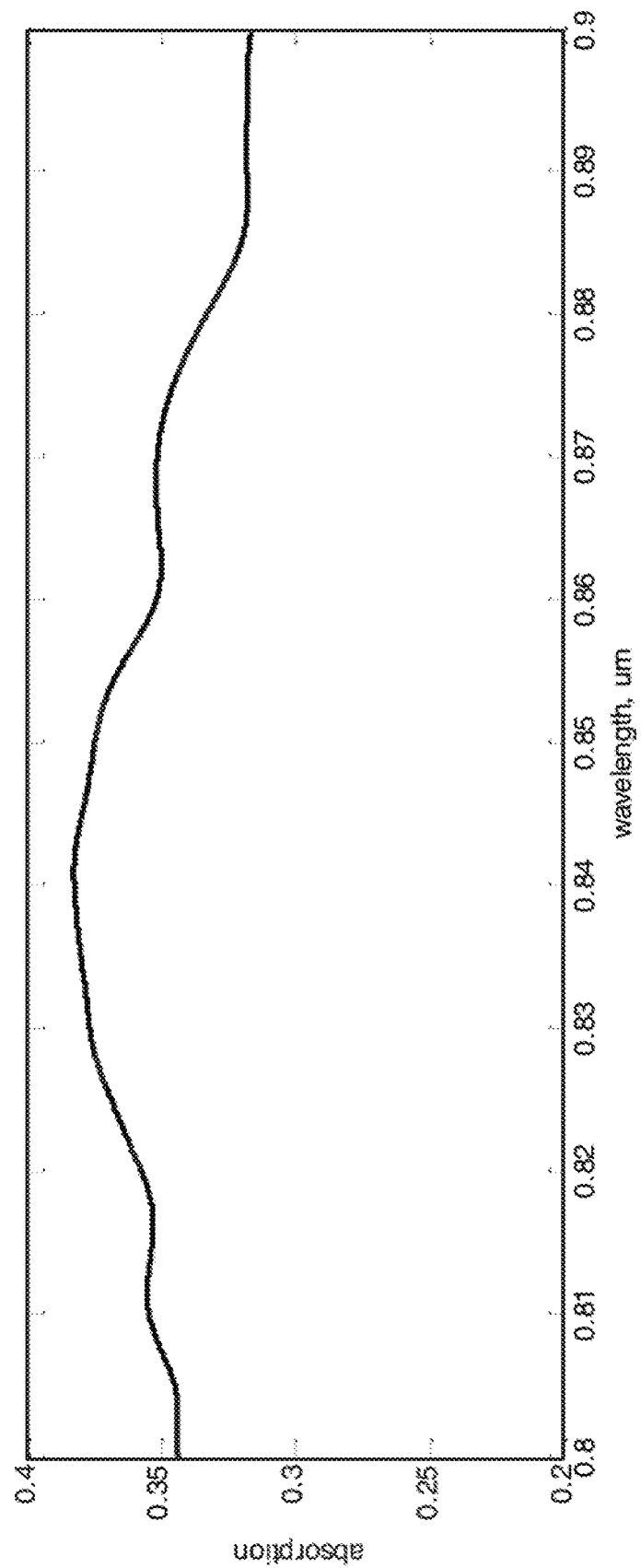
FIG. 70B is a plot showing absorption for an MSPD simulated using using finite difference time domain analysis (FDTD), according to some embodiments.

FIG. 70B is a plot showing absorption for an MSPD simulated using using finite difference time domain analysis (FDTD), according to some embodiments. Note that absorption is directly proportional to QE. The absorption is for 0.9 micrometer thick I or low doped region (which can also be the quantum efficiency). The horizontal axis is wavelength from 800 nm to 900 nm. At 850 nm wavelength, the absorption coefficient of Si is 535/cm which results in a 5% absorption without microstructure holes. As shown in FIG. 70B, absorption as high as 37% with microstructured holes can be achieved with 0.9 micron thick I and/or undoped Si layer. This is an over 7× improvement over a similar structure without microstructured holes for photon trapping and absorption enhancements. The microstructured holes used in this simulation has a hexagonal lattice, funnel cross section, with a diameter of 700 nm, a period of 900 nm, and an etched depth of 600 nm. The total thickness from the surface to the P+ substrate is 1.1 microns, referring to the structure of FIG. 70A, the N+ surface doped well 7084 is 200 nm thick, the P+ substrate thickness can range from 500 to 1000 microns.

Figure 70C:
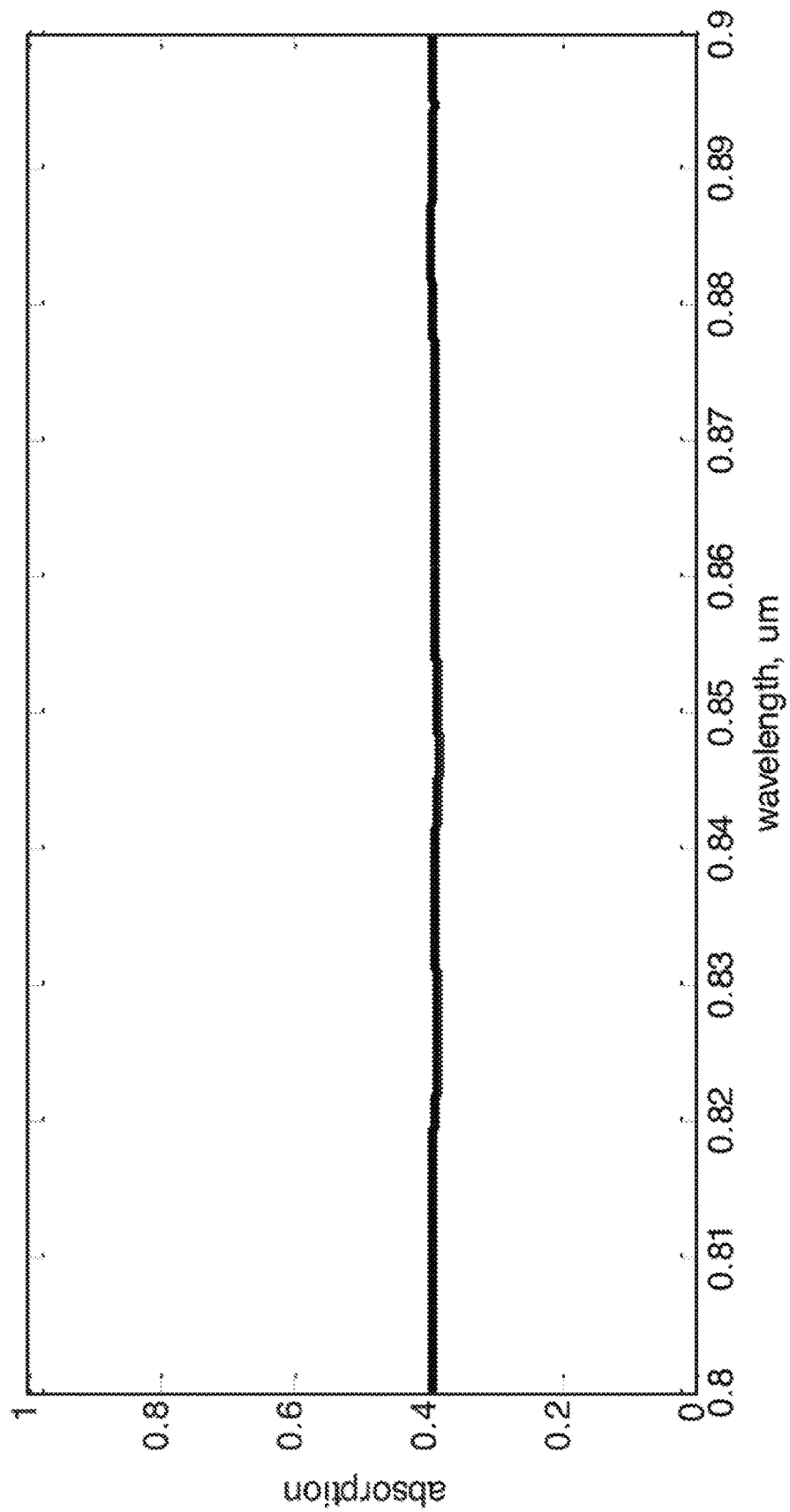
FIG. 70C is a plot showing a FDTD simulation of the optical field in the microstructure holes, according to some embodiments.

FIG. 70C is a plot showing a FDTD simulation of the optical field in the microstructure holes, according to some embodiments. The simulation is for a 0.9 micron thick I or low doped layer and 0.2 micron N+ doped surface layer on P+ substrate as in FIG. 70B. The holes are square inverted pyramids using wet etch such as KOH and in a square lattice with a period of 1000 nm. The lateral dimension of the microstructure hole is 900 nm per side. An enhanced absorption of 40%, equivalent to 40% quantum efficiency, is simulated which is over 7× a similar structure without microstructure holes. The wavelength span is 800 nm to 900 nm and almost constant 40% across the entire wavelength span.

Figure 70D:
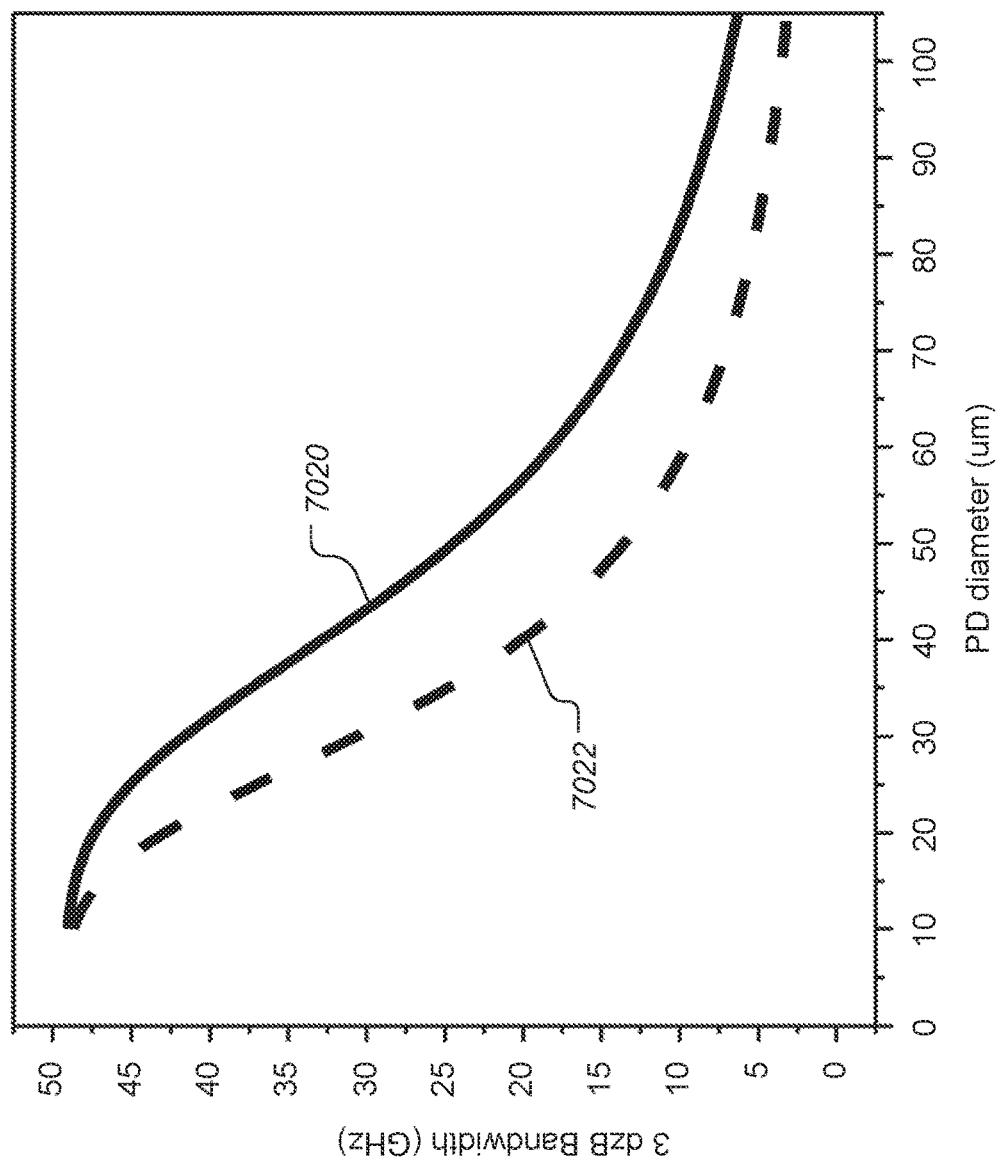
FIG. 70D is a plot of a data rate bandwidth calculation, according to some embodiments.

FIG. 70D is a plot of a data rate bandwidth calculation, according to some embodiments. Curve 7020 is for the MSPD simulated in FIGS. 70B and 70C, and curve 7022 is for similar photodiode without microstructure holes taking into account the transit time and RC time of the photodiode. The I or low doped layer is assumed to be 0.9 microns and fully depleted with a reverse bias voltage of −2 to −3.3V and with a series resistance of 50 ohms. The bandwidth is given in GHz and can be converted to Gb/s by dividing GHz by 0.675 (0.675 is an approximate average, depending on the digital signal coding, NRZ-not return to zero or RZ-return to zero, in some cases it can be 0.5 and in other cases it can be 0.75 approximately). For example, 24.5 GHz can be 36.3 Gb/s. As can be seen from the curves 7022 for a PD without microstructure holes and curve 7020 solid for a MSPD, the data rate bandwidth can be significantly higher for the same diameter PD. For example at 50 microns diameter, a PD without microstructure holes has a −3 dB bandwidth of 13.6 GHz where as for the same diameter MSPD the −3 dB bandwidth is 24.5 GHz or 1.8 times higher bandwidth.

The MSPD data rate, depending on diameter of the MSPD, can range from 72.6 Gb/s to 7.4 Gb/s with a structure such as FIG. 70A (and in some cases FIG. 69B) where the I or low doped layer is 0.9 microns thick. The material can be Si and/or GeSi and applies for wavelengths from 800 nm to 2000 nm depending on the Ge fraction in the GeSi which can range from 0 to 1 where 0 is all Si and 1 is Ge.

Figure 71:
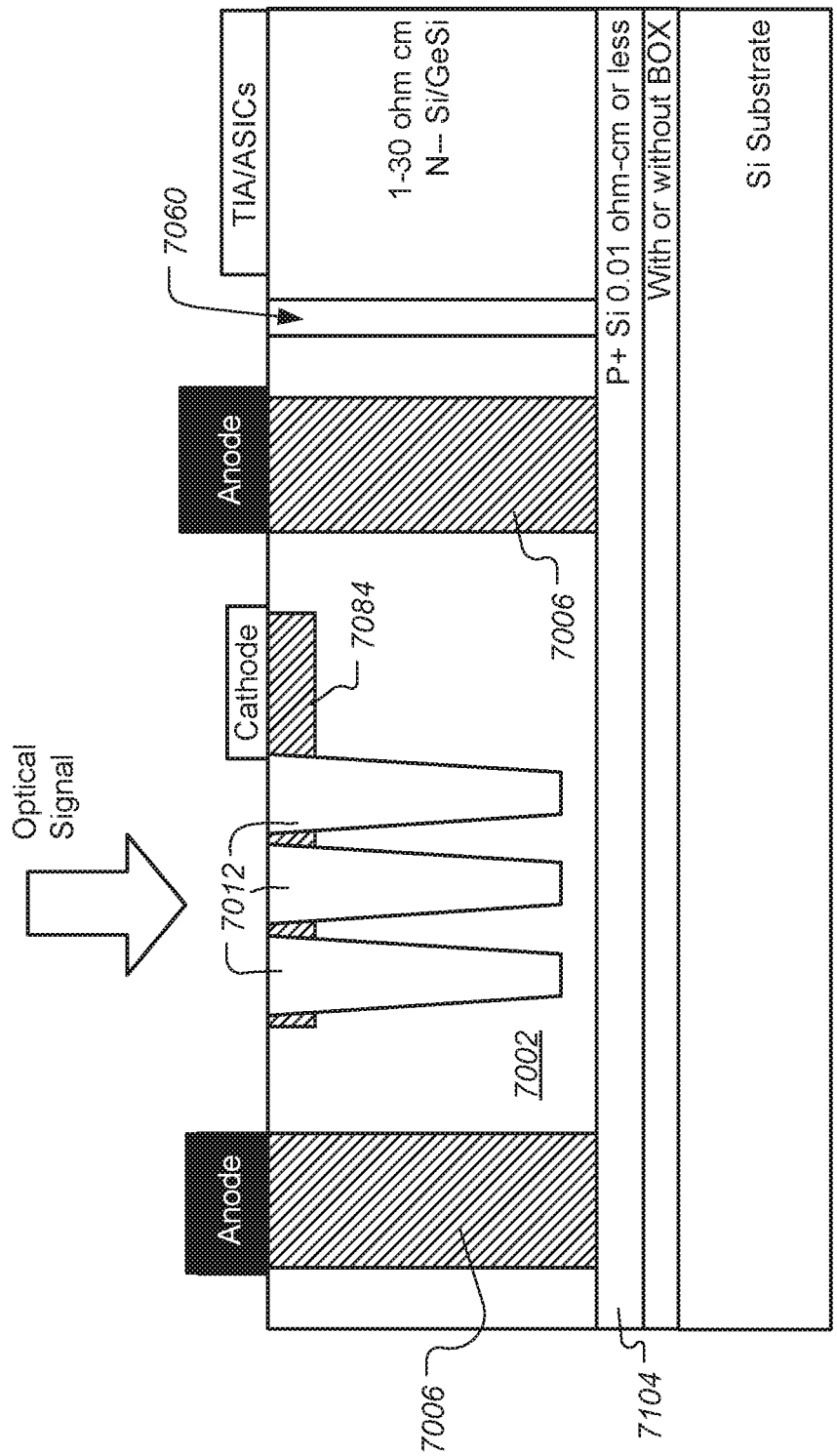
FIG. 71 is cross section view similar to FIG. 70A with the addition of a BOX (buried oxide) layer.

FIG. 71 is cross section view similar to FIG. 70A with the addition of a BOX (buried oxide) layer. The BOX layer can improve the response of the MSPD by reducing the number of photogenerated carriers outside the high field region between the top N+ layer 7084 and bottom P+ layer 7104. In addition, the BOX layer can provide a discontinuity in the optical refractive index that can reflect optical signal not trapped in the microstructures in the first pass and reflect the optical signal back toward the microstructures for further absorption enhancements for improved quantum efficiencies. In some cases, in place of a BOX (SOI) wafer, a bulk wafer such as in FIG. 70A can be used with selective area and/or blanket ion implantation of oxygen and/or nitrogen ions into the P+ substrate to retard and/or to impede the diffusion of deep photogenertated carriers from diffusing back to the high field region that can cause a slow tail in the impulse response and can degrade the data rate bandwidth of the MS-photodetector. Doping levels of O and N ions can range from 1E17 to 1E22/cm$^3$ and in some cases, other ions such as metal ions, isoelectronic ions such as H, He, Ar, Ne may be used to reduce the mobility and lifetime of the photogenerated carriers deep in the P+ substrate.

Figure 72:
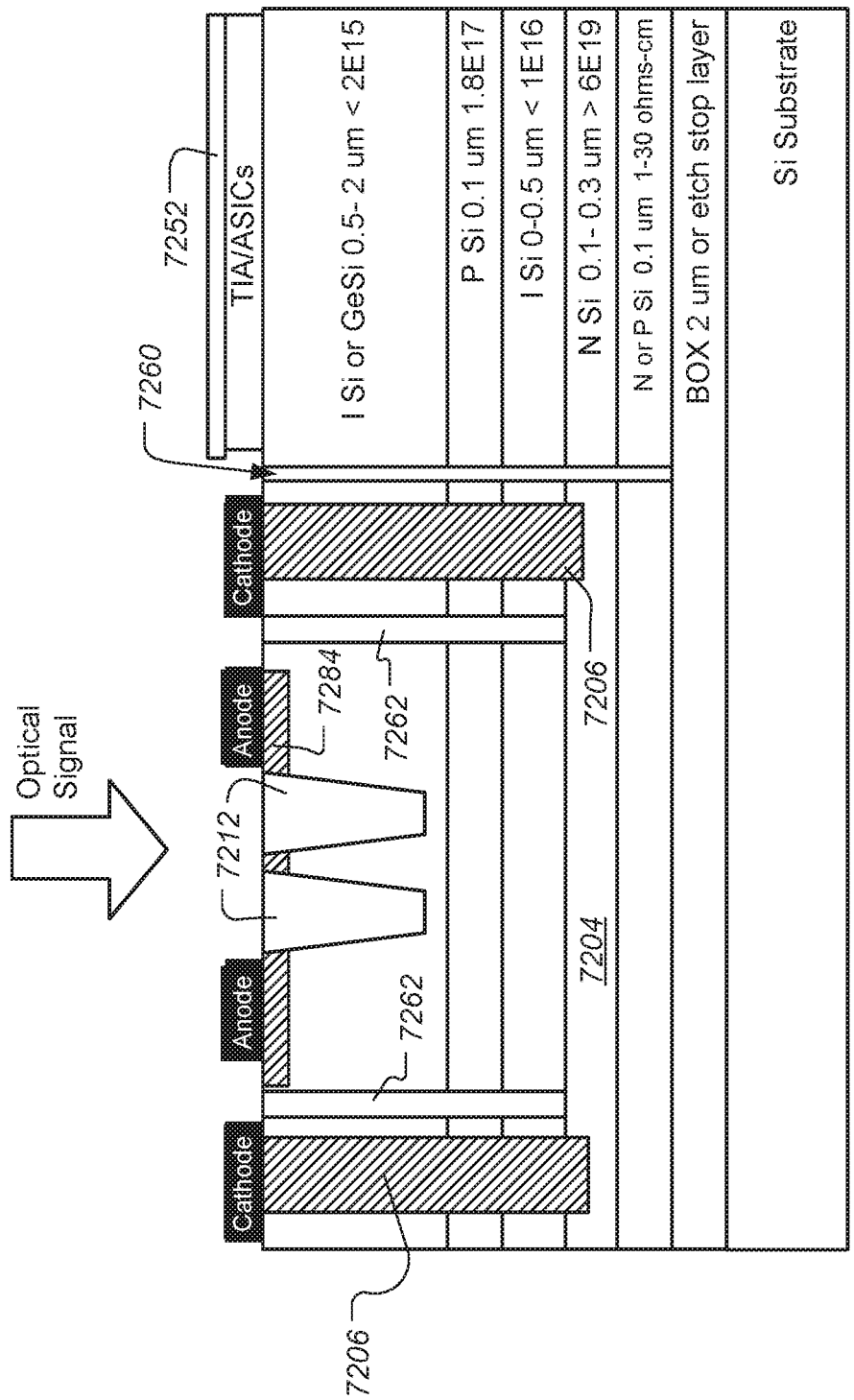
FIG. 72 is a cross section showing some aspects of a MSAPD monolithically integrated with CMOS/BiCMOS ICs, according to some embodiments.

FIG. 72 is a cross section showing some aspects of a MSAPD monolithically integrated with CMOS/BiCMOS ICs, according to some embodiments. The structure is similar to that of FIG. 36 except instead of mesa etching and/or a trench etch to connect N+ layer, a connecting N+ well 7206 is used and in some cases a trench 7262 can be used between the connecting N+ well 7206 and the photosensitive P+ region 7284 for electrical isolation and in some cases such a trench 7262 may not be necessary. If an isolation trench 7262 is used, the etch depth can vary and in some cases it continues to the N+ layer/region 7204 and in some cases to the multiplication I layer and in some cases through the P charge layer. Such isolation trenches may also be used in MSPDs, MSOWPDs as described elsewhere herein if desirable for improvement in device performance. In addition, an isolation trench 7260 may be used between the MSAPD/MSOWADP and the CMOS/BiCMOS integrated circuits.

With a reverse bias applied between the anode and cathode of the MSAPD/MSOWAPD with voltages ranging from −8 to −35 volts, the gain can range from greater than 2 to 10 or more, in some cases the gain can range from 2 to 4, in some cases the gain can range from 2 to 8 or more, in some cases the gain can range from 2 to 20 and in some cases from 2 to 100. Gain bandwidth product can range from 20 to 300 Gb/s or more and in some cases 500 Gb/s or more. With gain the quantum efficiency can be 50% or greater, in some cases 80% or greater, in some cases 100% or greater, in some cases 200% or greater and in some cases 500% or greater. Responsivity can be 0.5 A/W (amperes/watt) or greater, in some cases 1 A/W or greater, in some cases 5 A/W or greater and in some cases 10 A/w or greater. The responsivity is for some wavelengths in the range 800-1600 nm, in some cases 800 nm to 990 nm, in some cases 800 nm to 1100 nm, in some cases 900 nm to 1250 nm, in some cases 1250 nm to 1350 nm, in some cases from 1300 nm to 1550 nm, in some case 1500 nm to 2000 nm and in some cases 1500 nm to 1600 nm depending on the Ge fraction in the GeSi ally which can range from 0 (all Si) to 1 (all Ge). A shallow P+ well 7284 is formed on the surface of the I layer by diffusion of P type dopants and/or by ion implantation of P type ions. The P+ well 7284 completes the P-I-P-I-N MSAPD structure, and can have a thickness ranging from 50 to 500 nm and in some cases 100 nm to 300 nm and can have a resistivity in the neighborhood of 0.01 to 0.001 ohm-cm or lower. In addition, a thin semitransparent metal layer with thickness ranging from 10-100 nm and/or transparent conducting metal oxide (TCMO) such as ITO (not shown) with thickness ranging from 1 nm to 500 nm can be deposited on the P shallow well prior to microstructure hole etch. The addition of metal and/or TCMO can assist in reducing the series sheet resistance of the $P^+$ shallow well 7284. In some cases, it is desirable to have thin $P^+$ shallow wells to reduce the generation of photocarriers in the $P^+$ well that can reduce the overall quantum efficiency and/or reduce the data rate bandwidth of the MSAPD due to photogenerated carriers in the $P^+$ region diffusing to the high field region in the I layer that can result in a slow "tail" in the impulse response.

The I or low doped layer Si and/or GeSi ($N^{--}$) can have a thickness range from 0.5 to 5 microns with a resistivity in the range of 1-100 ohm-cm and in some cases 10 ohm-cm or greater. The P charge layer Si or GeSi can have a thickness in the range 0.05 to 0.2 microns with a resistivity in the range 0.05 to 0.2 ohm-cm approximately. The multiplication I Si or GeSi layer can have a thickness ranging from 0 nm to 0.5 microns and with resistivity ranging from 0.5-1 ohm-cm or greater. The $N^+$ layer of Si and/or GeSi can have a thickness range of 0.1-0.5 microns and in some cases 0.1 to 0.3 microns and with a resistivity in the range of 0.005 ohm-cm or less. The N or P Si device layer can be approximately 0.1 to 0.2 microns thick. The BOX layer can be a few microns thick on Si substrate. In some cases instead of a SOI wafer, a bulk silicon $N^+$ wafer without a BOX can be used. In some cases O, N and other ions can be implanted into a $N^+$ Si wafer prior to the growth of the avalanche photodiode layers. See, e.g., FIG. 1 of Kang et al 2008, which shows a Ge on Si avalanche photodiode. A similar structure can be fabricated with microstructured holes and where the holes can be etched through the contact layer and into the absorption layer partially and/or entirely. In some cases the holes can be etched to the charge layer and in some cases through the multiplication layer and in some cases to the bottom contact layer. As in Kang et al 2008, passivation can be amorphous silicon (a-Si) and/or silicon nitride.

Microstructure holes 7212 can be circular, square, rectangular, polygon, star, amoeba, hourglass, dog bone, oval and/or any combination of shapes and the cross-sectional shapes can be inverted pyramids, funnel, tapered holes, conical, trapezoidal, hourglass, and any combination of shapes created by wet and/or dry etching and/or electrochemical. Lateral dimensions at the surface of the microstructure holes can range from 200 nm to 5000 nm, in some cases 300 nm to 3000 nm and in some cases 500 nm to 2500 nm. The microstructured holes can be arranged in a random pattern, a periodic patter, an aperiodic patter, or a combination of the foregoing. The hole lateral diameter can also be varied in any manner. The spacing between adjacent microstructure holes can range from 20 nm to 3000 nm, in some cases 30 nm to 1000 nm, in some cases 50 nm to 1000 nm, in some cases 100 nm to 1000 nm, and in some cases 100 nm to 600 nm. The microstructure holes can be etched to depths ranging from 50 nm to 5000 nm, in some cases 300 nm to 2000 nm and in some cases 300 nm to 1500 nm. The microstructured holes can be etched first, followed by formation of the P region 7284 as in FIG. 42. Or the microstructure holes can be etched through the P region, an any other layers such a thin metal layer 1-20 nm, ITO layer, and/or partially into the I or low doped Si and/or GeSi layer. For example the holes can be etched into 10% of the I or low doped layer thickness, in some cases 20% or less, in some cases 30% or less, in some cases 40% or less, in some cases 50% or less, in some cases 60% or less, in some cases 70% or less, in some cases 80% or less, and in some cases 90% or less. In some cases the microstructure holes can be etched through the I or low doped layer and partially into the charge layer and/or partially into the multiplication layer and/or partially into the $N^+$ layer 7204 and/or to the BOX layer and/or if there is no BOX layer, into the $N^+$ Si Substrate.

The $N^+$ connecting well 7206 connects the cathode metallization with the $N^+$ layer 7204 and can be all along the perimeter of the $P^+$ region separated by 2-10× the depletion distance. For example if the I layer is 2 microns then the connecting well can be 4-20 microns or more from the $P^+$ region. The connecting well can be a continuous wall and/or posts around the $P^+$ region. In addition in some cases without a BOX the avalanche photodiode layers are grown on a $N^+$ substrate of milli-ohm-cm range (e.g., 1-30 milli-ohm-cm). The cathode can also be formed on the bottom of the wafer and connecting $N^+$ wells may or may not be necessary depending on how the transmission line from the anode and cathode are connected to the CMOS/BiCMOS ASICs. A TSV may be used to connect the bottom cathode to the electrodes of the ASICs. In some cases surface cathodes and anodes are preferred for high speed transmission and the connecting wells are desirable. In certain applications where high data rates may not be necessary, such as LIDAR applications, a bottom cathode may suffice. An optional light shield 7252 is also shown in FIG. 72.

Figure 73:
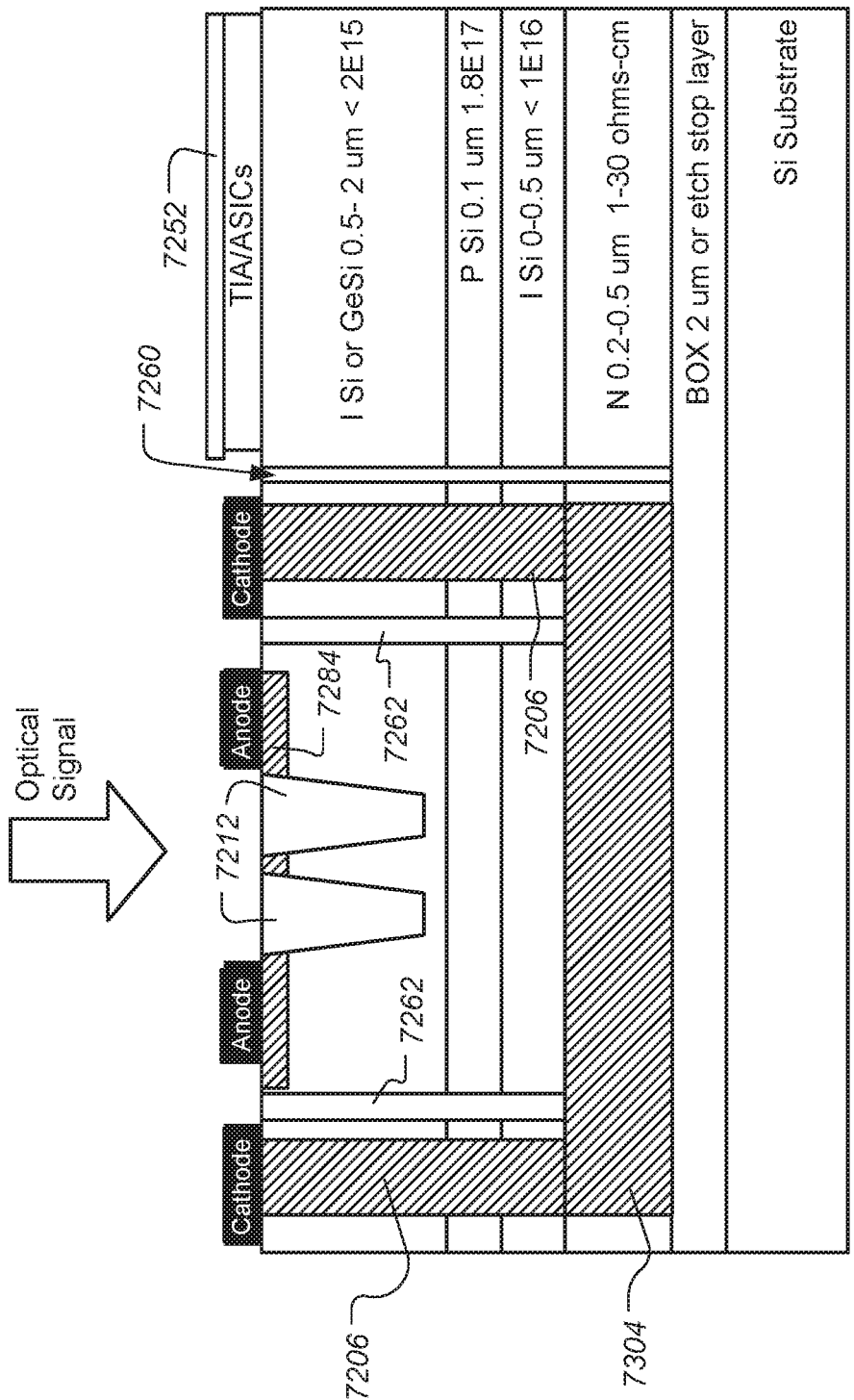
FIG. 73 is a cross section view of a structure that is similar to that of FIG. 72 except that a buried N type device layer is included.

FIG. 73 is a cross section view of a structure that is similar to that of FIG. 72 except that a buried N type device layer is included. The selective area buried ion implant and/or diffusion is made into the N type device layer of a SOI can have a thicknesses ranging from 0.2 to 0.5 microns with resistivity in the range 1-30 ohm-cm or more. The ion implanted and/or diffused $N^+$ region 7304 can have a resistivity in the range of 6 milli-ohm-cm or less. The multiplication layer and the rest of the avalanche photodiode layers can be grown on the buried $N^+$ layer 7304 and the CMOS/BiCMOS ASICs can be integrated on the I or low doped layer and may include extra BiCMOS layers if necessary.

As in FIG. 72, SOI can be replaced with a bulk $N^+$ Si substrate and buried O, N and/or other ions into the $N^+$ substrate can be implemented to reduce the diffusion of photogenerated carriers in the $N^+$ substrate from diffusion back to the high field regions of the MSAPD.

Figure 74:
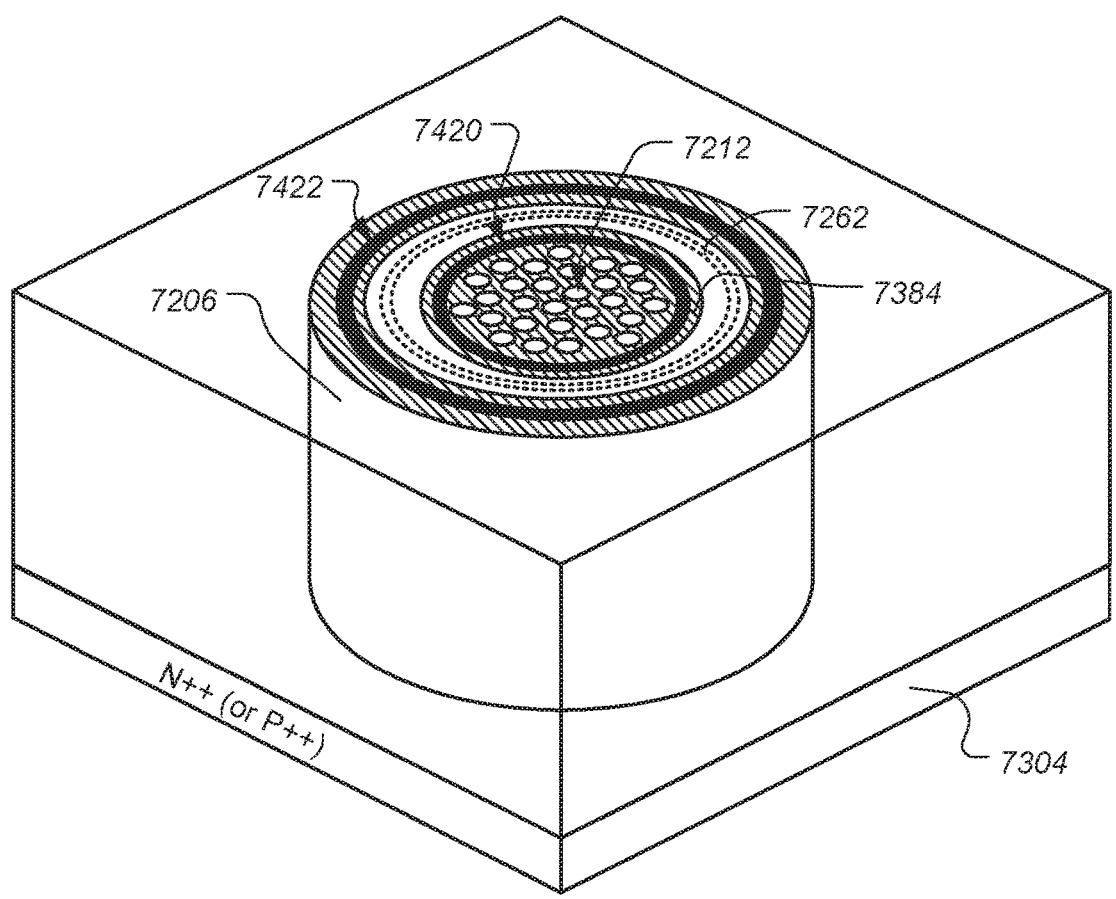
FIGS. 74 and 75 are perspective views showing some aspects of a connecting wells for connecting surface electrodes to lower layers, according to some embodiments.
Figure 75:
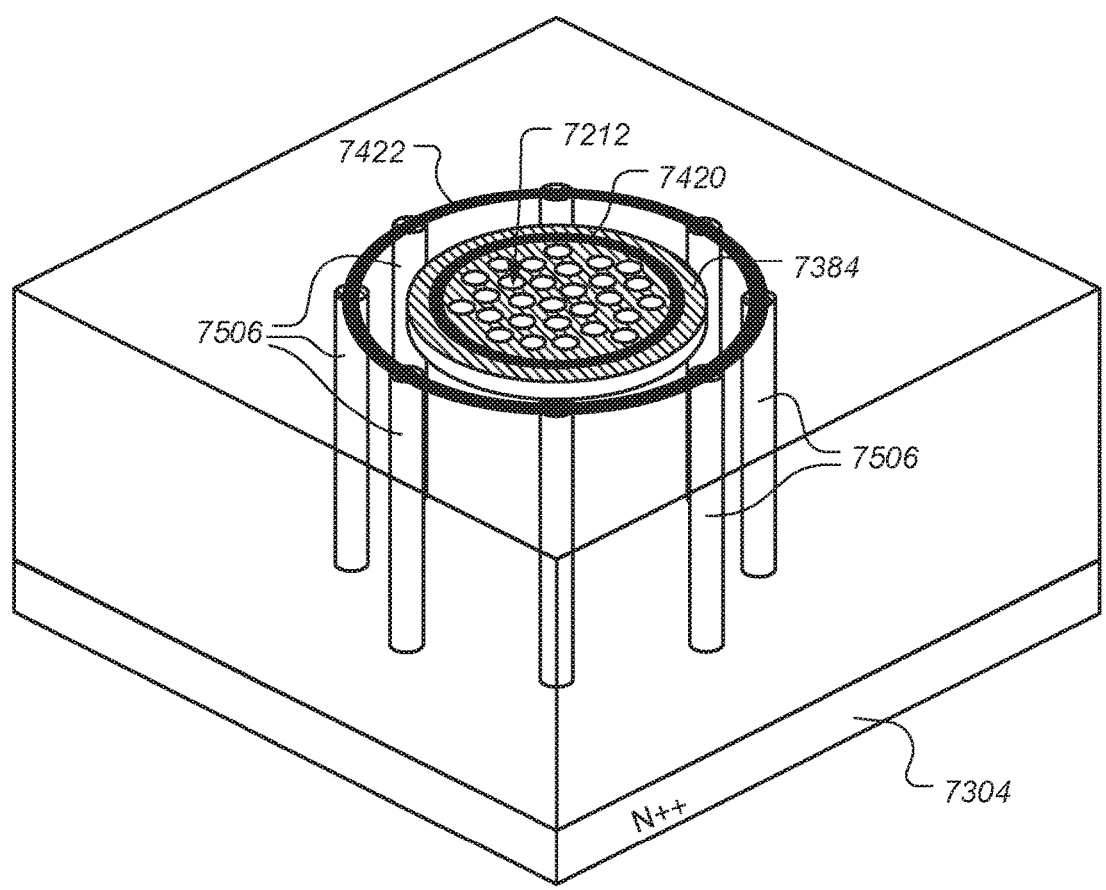

FIGS. 74 and 75 are perspective views showing some aspects of a connecting wells for connecting surface electrodes to lower layers, according to some embodiments. The structures as shown in FIG. 73. Although an MSAPD is shown in FIG. 73, the description in FIGS. 74 and 75 apply as well to MSPDs. In FIG. 74, well $N^+$ 7206 is wall-shaped and connects the surface cathode 7422 with the bottom $N^+$ layer 7304. The P region 7384 is enclosed by the continuous wall of $N^+$ connecting well. Ring-shaped cathode metallization 7422 on top the $N^+$ connecting wall-shaped well 7206. A ring-shaped anode metallization 7420 is shown near the perimeter of the $P^+$ region 7384. The microstructured holes 7212 are etched into the $P^+$ region 7384. Shown in dotted outline is the optional isolation trench 7262. Not shown for simplicity are the monolithically integrated CMOS/BiCMOS ASICs.

FIG. 75 is similar to FIG. 74 except the connecting $N^+$ wells are in the form of a series of post-shaped $N^+$ wells 7506. The tops of each of $N^+$ wells 7506 are connected by the ring of cathode metallization 7422 encircling the $P^+$ region 7384 which has a ring anode metallization 7420. For simplicity, the depth of microstructure holes 7212 is not shown. Also not shown are the integrated CMOS/BiCMOS ASICs. In some cases, for both the N⁺ connecting wall and the N⁺ connecting posts, the distance to the P⁺ region 7384 can be less and/or equal to the I layer or low doped layer thickness and/or the fully depleted region thickness and in some cases it can be equal to and/or greater than the I layer or low doped layer thickness. For example the distance between the connecting well 7206 or 7506 to the P⁺ 7384 (or N⁺ for N-I-P or N-I-P-I-P structures) can range approximately from 0.5-10× or more of the I layer and/or low doped layer thickness.

FIGS. 76A to 76K are diagrams illustrating aspects of a basic process flow for fabricating MSPDs monolithically integrated with CMOS/BiCMOS ASICs, according to some embodiments. Note that the focus is on the MSPD process flow rather than the well-known ASICs processes flow.

Figure 76A:
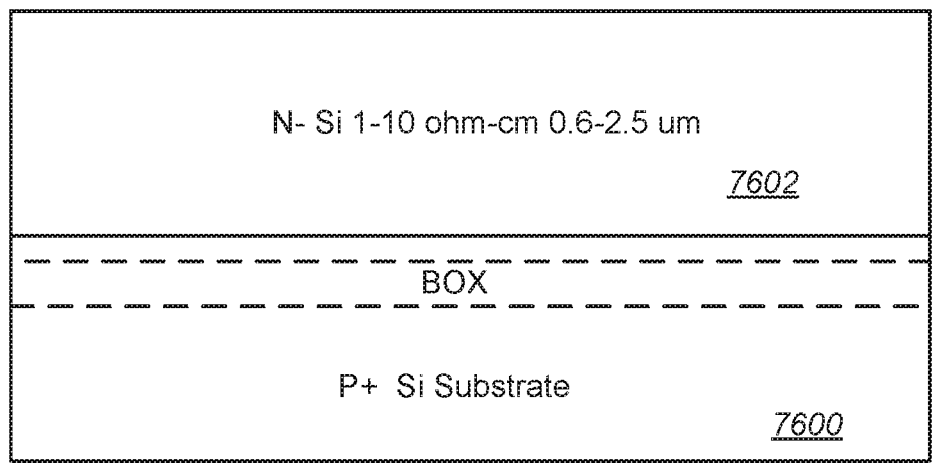
FIGS. 76A to 76K are diagrams illustrating aspects of a basic process flow for fabricating MSPDs monolithically integrated with CMOS/BiCMOS ASICs, according to some embodiments.

In FIG. 76A shows a simple cross section of a possible CMOS/BiCMOS starting wafer, with a 1.1 microns N⁻ layer 7602 having resistivity in the neighborhood of 10 ohm-cm on a P⁺ silicon substrate 7600 with resistivity in the neighborhood of 20 milli ohm-cm. In some cases the N⁻ layer 7602 can be 2 microns thick or more. In some cases a SOI wafer (dotted BOX layer) can be used with a P⁺ device layer of thickness ranging from 0.2 to 0.5 microns and resistivity ranging from 10 milli ohm-cm to 1 milli ohm-cm or lower. The BOX layer can block the photogenerated carriers in the substrate from returning to the high field I region where they could be swept out and could contribute to a slow diffusion "tail" to the impulse response of the MSPD. Such a "tail" could degrade the bandwidth of the monolithic chip (MSPD integrated with ASICs). The BOX (buried oxide) layer can also provide a low-refractive optical index and can enhance the microstructure holes in higher enhanced absorption. The inverted pyramids microstructure holes (shown in FIG. 76E) have lateral dimension variations from greater than a wavelength (900 nm sides and wavelength at 850 nm for example) to approximately 0 nm at the apex of the inverted pyramid which is much less than the wavelength. In between the surface lateral dimension and the apex, there can be a range of lateral dimensions where the microstructure holes can vary from greater than a wavelength to subwavelength. In certain regions the microstructured holes of the inverted pyramid can behave similar to a lossy high contrast grating (HCG) when there is a large refractive index difference such as the addition of a BOX layer. In some cases, front end of line (FEOL) processes can include an ion implantation into the P⁺ silicon substrate to a depth of 0.3 to 0.6 microns or more, and in some cases 0.1 to 0.3 microns, of O, N, metal ions, Ar, and/or Xe, with doping ranging from $1\times10^{17}$ to $1\times10^{22}$ ions/cm³. The doping reduces lifetime of photogenerated carriers, and in some cases P type dopants ions such as C, B, Al, Ga, and/or In ions can be implanted 0.01-0.6 microns or more and in some cases 0.1 nm to 300 nm or more, into the P⁺ substrate. This doping reduces lifetime of photogenerated carriers in the P⁺ silicon substrate. Similarly for an N⁺ substrate, N type dopant ions such as C, N, P, As, Sb, and/or Bi can be implanted to depths ranging from 0.1 nm to 600 nm or more and with doping concentration ranging from $1\times10^{17}$ to $1\times10^{22}$ ions/cm³ with doping ranging from $1\times10^{18}$ to $1\times10^{22}$ ions/cm³.

Figure 76B:
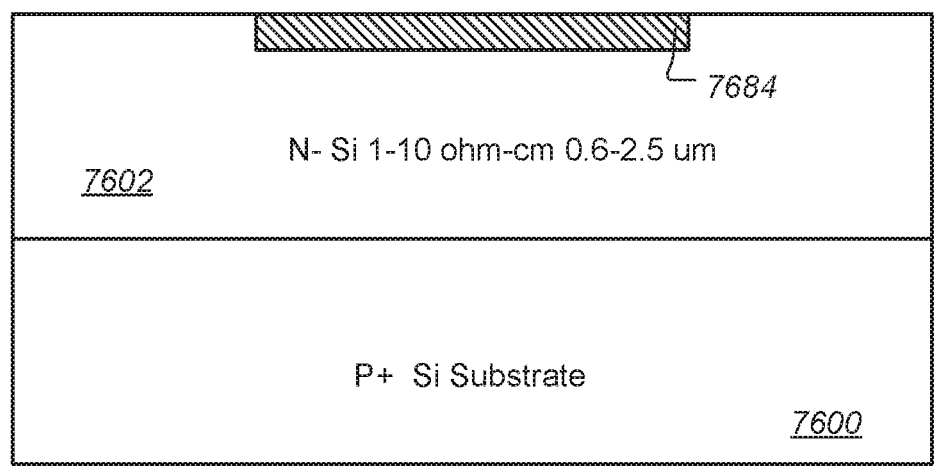

FIG. 76B shows a shallow surface well 7684 of N⁺ that can be implanted and/or diffused to a depth of 0.2 microns with a resistivity in the neighborhood of 1 milli ohm-cm and can have a range of 20 milliohm-cm or less. The well width can range from 20-80 microns wide in a circular and/or square and/or polygon shape and in this example is 30 microns wide in a circular shape and in selective area. In some cases a thin layer of metal such as Pt, Au, Cu, Al, Ni, Cr, V, or Ag can also be deposited on the N⁺ well of similar diameter and with thickness ranging from 1 to 200 nm prior to microstructure hole etch to assist in the reduction of series resistance. In some case transparent conducting metal oxide can also be use with similar thicknesses.

Figure 76C:
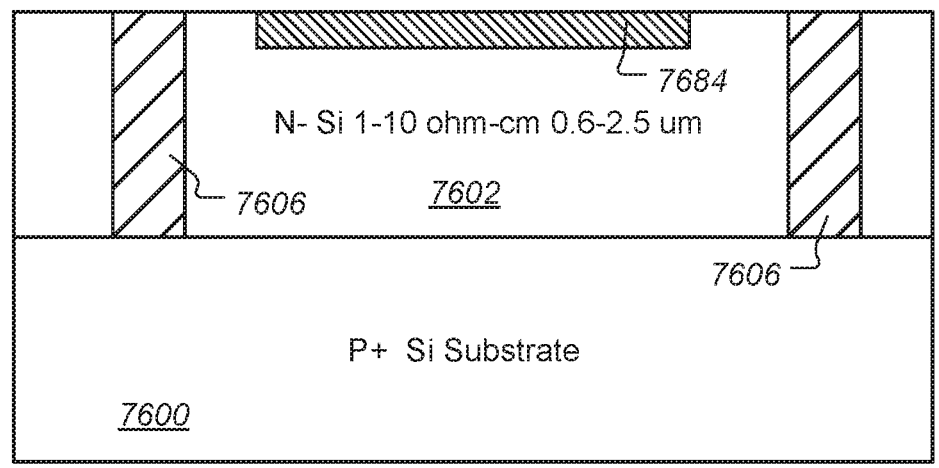
Figure 76D:
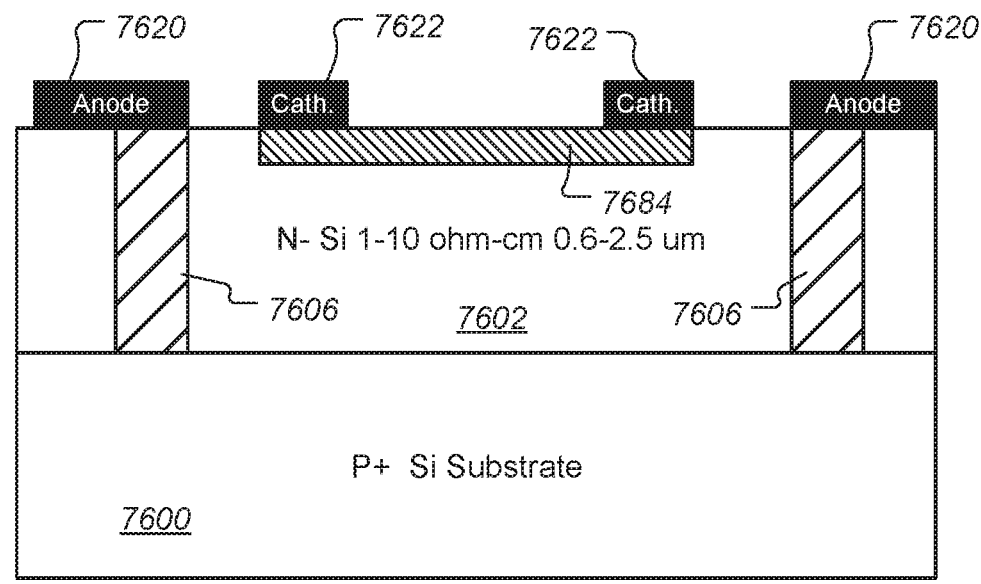

FIG. 76C is a cross section view adding P⁺ connecting wells 7606 to connect the surface to the P⁺ substrate 7600. The P⁺ connecting well 7606 can ion implanted and/or diffused and can be a ring (as in 7206 shown in FIG. 74) and/or posts/columns (as in 7506 shown in FIG. 75). In this example well 7606 is ring-shaped/wall-shaped. The P⁺ connecting well 7606 can have a width ranging from 5 to 50 microns and 1.1 microns deep or more and a resistivity in the neighborhood of 10 milli ohm-cm or less and in some cases 1 milli ohm-cm or less. FIG. 76D shows anode 7620 and cathode 7622 ohmic metal and metallization on the P well 7060 and N⁺ region 7684 respectively. In some cases the P⁺ connecting well 7606 may not be necessary and the anode 7620 can be formed on bottom of the P⁺ substrate 7600 and a through silicon via (TSV) and/or deep trench can connect the bottom anode with a surface electrode connecting to the CMOS/BiCMOS ASICs.

Figure 76E:
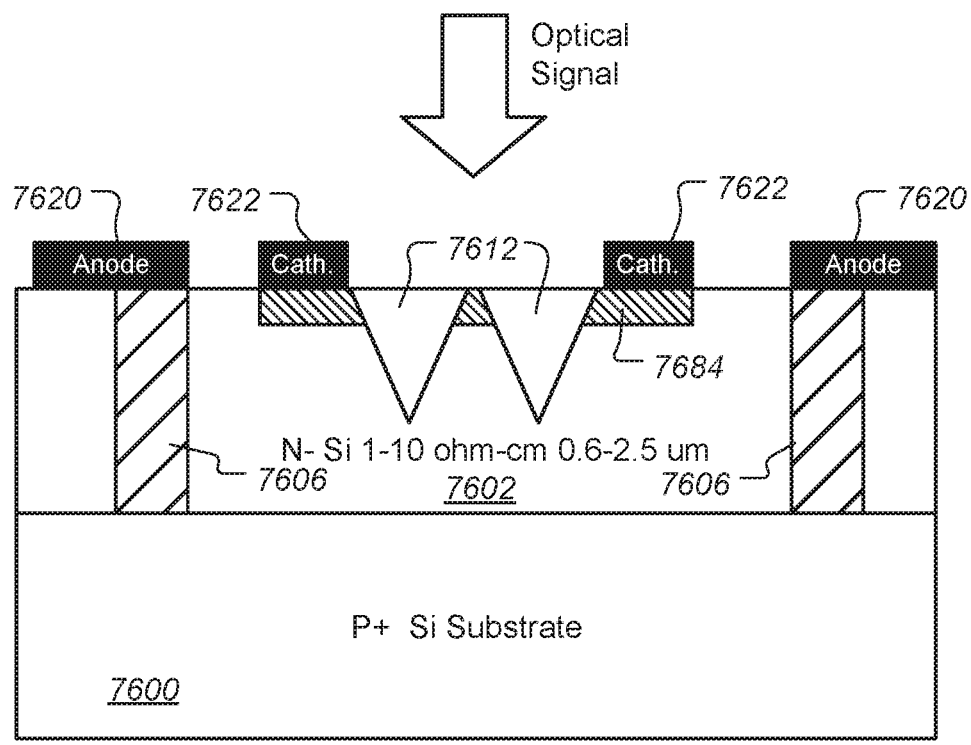
Figure 76F:
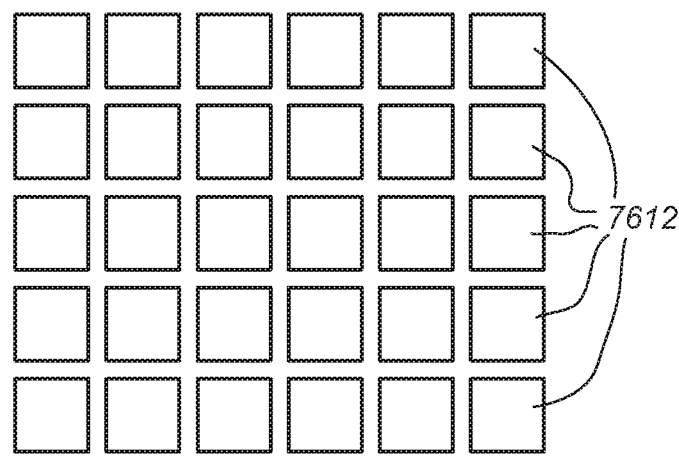

FIG. 76E shows the MSPD with inverted pyramid holes 7612 etched using KOH solutions wet etch on a (100) Si wafer with the square microstructure hole aligned along the wafer flat and the etch is along the (111) lattice plane. This wet etch process can be a back end of line (BEOL) process after the bulk of the processing for the CMOS/BiCMOS integrated circuits are completed. Passivation of the holes can also be a BEOL process. The microstructure holes can be square and can have a side lateral dimension of 900 nm and a period of 1100-1200 nm in a square lattice. The side wall angle is approximately 54.7 degrees from the plane of the surface resulting in an etch depth of approximately 636 nm. In some cases the surface lateral dimension can range from 500 nm to 2000 nm and the spacing between adjacent microstructure holes can range from 100 nm to 500 nm. In some cases, as mentioned earlier, a BOX layer can be included to further enhance the absorption and therefore the quantum efficiency. FIG. 76F is a top view showing a square lattice of square holes 7612. In some cases, it can be aperiodic and in some cases can be arranged in a random manner with same and/or different hole lateral dimensions. In some cases, the microstructure holes can be arranged in a hexagonal lattice. In some cases the microstructure holes can be oriented not parallel to the wafer flat and in some cases different orientations of the wafer such as (111) and (110) can be used and the microstructure holes may or may not be inverted pyramids. See, e.g., Mavrokefalos et al, Efficient Light Trapping in Inverted Nanopyramid Thin Crystalline Silicon Membranes for Solar Cell Applications, Nano Lett. 2012, 12, 2792-2796 (incorporated herein by reference and referred to herein as "Mavrokefalos"), which discusses using inverted pyramids for solar cell applications. In some embodiments of the present disclosure, an external reverse bias is applied to the anode and cathode for high data rate bandwidth absorption enhanced photodiode (or avalanche photodiode) and for high sensitivity MSAPD (microstructure avalanche photodiode) with reduced avalanche reverse bias voltages for imaging, and LIDAR applications. Improvements in efficiency in Mavrokefalos for a solar cell with inverted nanopyramids and a solar cell without inverted nanopyramids is about 170% where as in some embodiments of the present disclosure, the improvement in quantum efficiency can range from 500% to 1000% or more for a photodiode with microstructure holes as compared with a photodiode without microstructure holes. In addition solar cells are not biased where as MSPD/MSAPD and other microstructure photodetectors operate at a reverse bias with voltages ranging from −1 to −45 volts. In addition, solar cells are not limited by the thickness of the absorption layer since sun light is a constant source (CW constant wave) and no time is involved, in many cases nanostructured pillar and/or hole solar cells are only a few percent better than a conventional Si solar cell with thick absorption layers and often times the nanostructured solar cells have worst efficiency than a conventional solar cell. In some embodiments of the present disclosure, the micro/nanostructured hole photodetectors have time scales ranging from a few picosecond to tens of nanoseconds, data rate bandwidths from 1 Gb/s to over 100 Gb/s and in some cases less than 1 Gb/s and in some cases from 25 Gb/s to 100 Gb/s or more. Micro and nano structure holes and/or waveguides allow a thinner I or low doped layer of Si and/or GeSi to achieve high data rate bandwidth and high quantum efficiency at the same time. For example, data rates greater than 20 Gb/s and quantum efficiency greater than 50% at 800-850 nm wavelength have not being achieved, to the inventors' knowledge, simultaneously in any known silicon photodiode with a usable wavelength spectrum of 50 nm or more and where the quantum efficiency does not vary by more than 50%, in some cases 30%, in some cases 20%, and in some cases 10% and is not a resonant photodiode where the QE is sharply peaked. In FIG. 4 A of Gao et al, the quantum efficiency (QE) monotonically decrease from 60% at 800 nm to 40% at 900 nm and the data rate bandwidth can be maintained at greater than or equal to 20 Gb/s at all the wavelengths. In some cases nano/microstructure holes can be applied to GeSi and/or Ge photodiodes and can achieve high data rate bandwidths and high quantum efficiencies with I and/or low doped layers of less than or equal to 2 microns and in some cases 3 microns and in some cases 5 microns at wavelengths where the bulk absorption coefficient is weak. For example, in the neighborhood of 1000/cm or less, in some cases 2000/cm or less, in some cases 700/cm or less, and in some cases 500/cm or less, as compared to III-V direct bandgap material which can be 5000-10000/cm or more. Without the use nano/microstructure holes, a thick I and/or low doped layer may be used to achieve high QE but high data rate bandwidths at the same time cannot be achieved. In some applications such as for APD, a low avalanche voltage is desirable and with nano/microstructure holes the avalanche voltage can be significantly less than a comparable APD without nano microstructure holes. A conventional Si APD requires a thick I or low doped region which requires a high reverse bias voltage to deplete the I and/or low doped region before the voltage can be dropped across the multiplication or avalanche region, voltages of −80 to −100 volts are common. Whereas with nano and/or microstructure holes APD, the I and/or low doped region can be thinner by 2 to 10 times or more resulting in a lower reverse bias voltage to deplete the I and/or low doped region before the voltage drop across the multiplication or avalanche region with reverse bias voltages ranging from −10 to −45 volts approximately. This is also another advantage of using nano and/or microstructure holes for MSAPD than cannot be achieved with conventional Si and/or GeSi and/or Ge APD. Applications include monolithically integrated MSAPD with CMOS/BiCMOS ASICs for LIDAR and imaging.

In addition, in some cases, the microstructure holes can be very complex, as for example in Berenschot et al, Fabrication of 3D fractal structures using nanoscale anisotropic etching of single crystalline silicon, J. Micromech. Microeng. 23 (2013) 055024 (10pp) (incorporated herein by reference) where the 3D structure can be applied to microstructure holes.

FIGS. 76G to 76K are top views showing some aspects of MSPDs/MSAPDs for integration with CMOS/BiCMOS ASICs on a single silicon chip. In some cases array of MSPD/MSAPD can be integrated with CMOS/BiCMOS ASICs on a single silicon chip. Only a basic masking and processing steps for the MSPD/MSAPD are shown for simplicity.

Figure 76G:
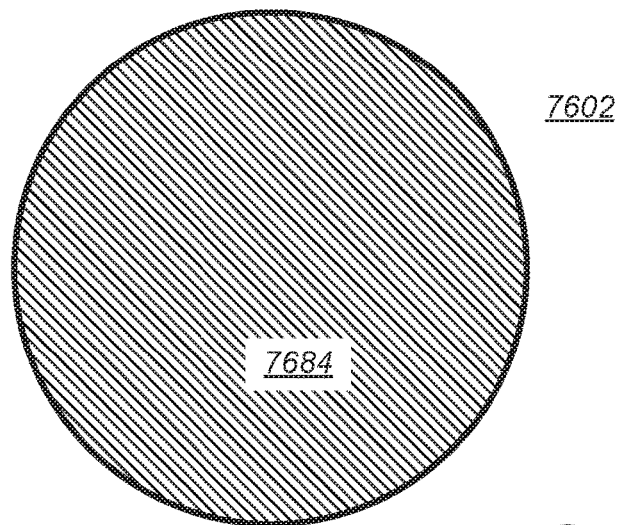

FIG. 76G shows the surface $N^+$ (can also be $P^+$) well 7684 with a diameter ranging from 10 to 150 microns and in some cases from 25 to 150 microns and in some cases 100 to 500 microns or more. The $N^+$ surface well 7684 defines approximately the N-i-P junction capacitance and also the photosensitive area for high data rate bandwidth applications. The $N^+$ well 7684 can be implanted and/or diffused with N type dopants. Other shapes other than circular are also possible, such as square, polygon, triangular, and rectangular. In this example, the $N^+$ well 7684 is formed on a $N^-$ layer 7602.

Figure 76H:
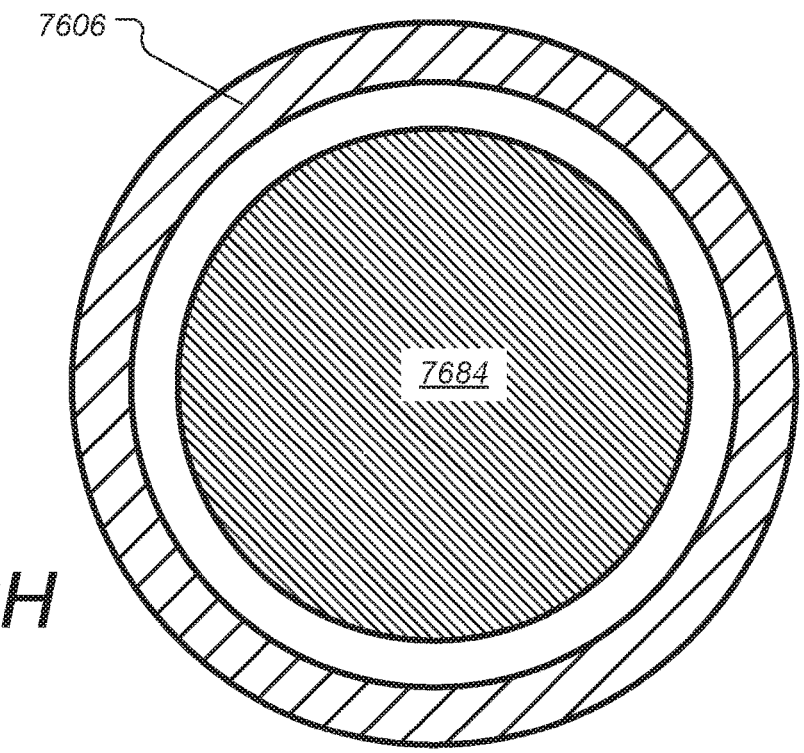

FIG. 76H shows a concentric ring of P connecting well 7606 formed around the $N^+$ surface well 7684. The connecting ring 7606 can have a width ranging from 1 to 100 microns and can be spaced from the edge of the $N^+$ well 7684 by 1 (and in some cases less than 1) to 50 times the depletion depth, if the depletion depth is 1 micron, then in the range from 1 to 50 microns and in some cases 0.5 to 50 microns. The depth of the connecting $P^+$ well 7606 is to the $P^+$ substrate 7600 (shown in FIGS. 76A-76E) and in some cases to the $P^+$ device layer of a SOI wafer. In some cases, instead of a concentric ring, the connecting $P^+$ (or $N^+$) well can be a concentric series of posts/columns from the surface to the $P^+$ layer (as in wells 7506 shown in FIG. 75). The number of post/column can range from 1 to 20 for example.

Figure 76I:
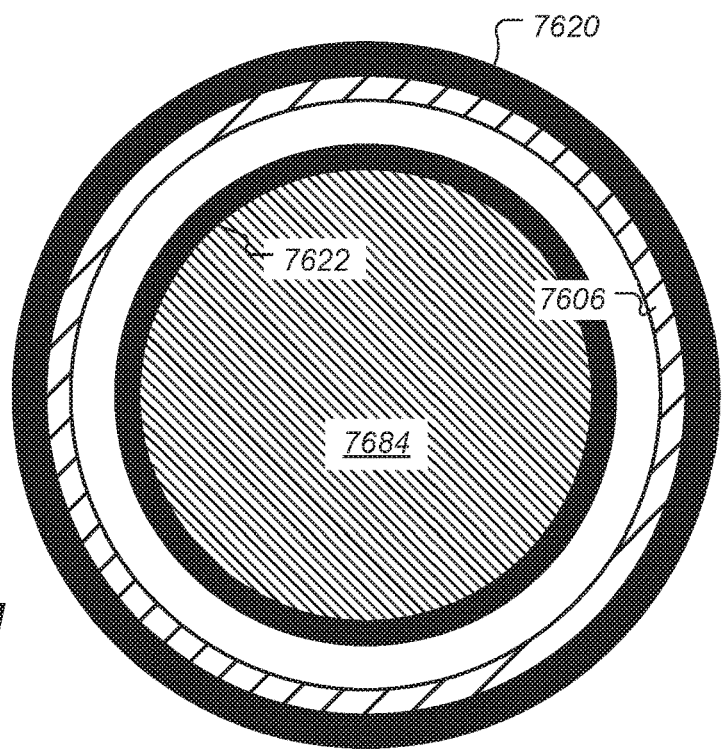

FIG. 76I shows N and P ohmic metal and electrode to form the cathode 7622 and anode 7620 metallization. The metal can be Al, SiAl, Ti, Pt, and/or Ni, and/or silicides. The width of the metal can range from 1 to 50 microns and the metal thicknesses can range from 50 nm to 5000 nm and in some cases to 10000 nm.

Figure 76J:
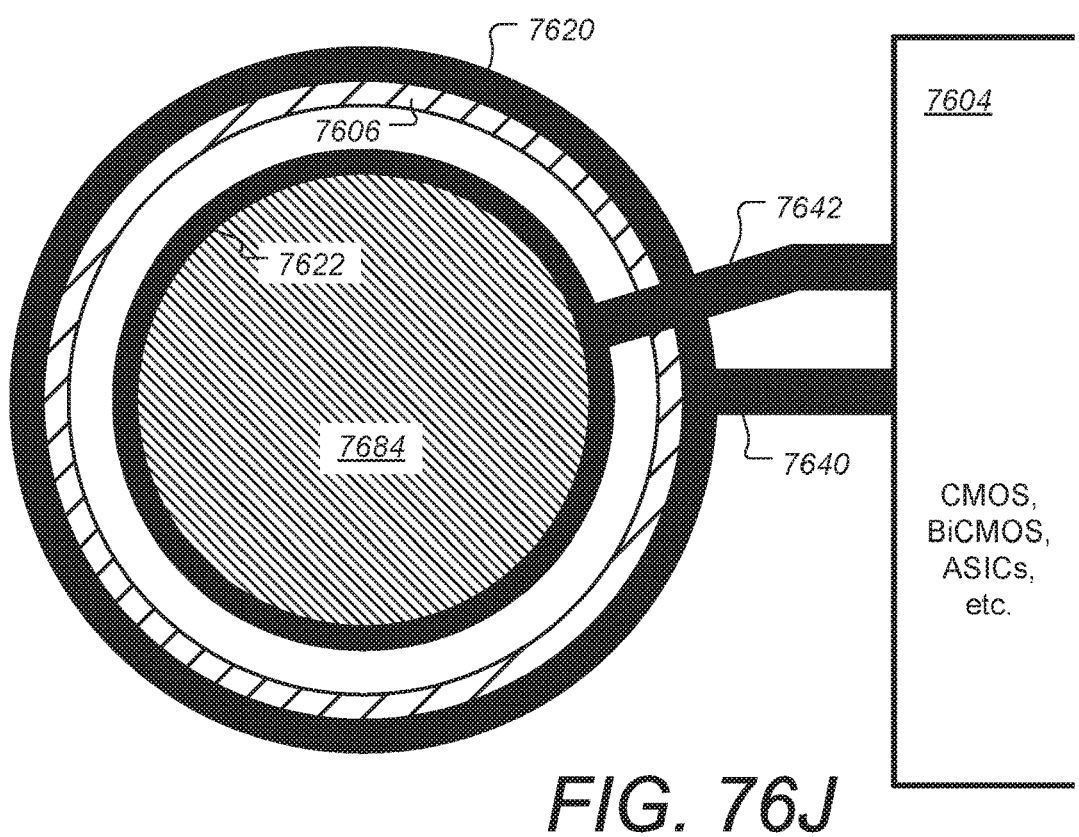

FIG. 76J shows coplanar transmission lines 7640 and 7642 attached to the anode and cathode respectively of the MSPD. The transmission lines 7640 and 7642 to the CMOS/BiCMOS ASIC 7604. Not shown are also dielectric and/or polymer layers for the cathode coplanar line to cross over the anode contacts and in some cases the anode and the connecting well can have a gap to allow the coplanar transmission line to cross. In some cases, a dielectric insulating layer may be provided under the coplanar transmission lines.

Figure 76K:
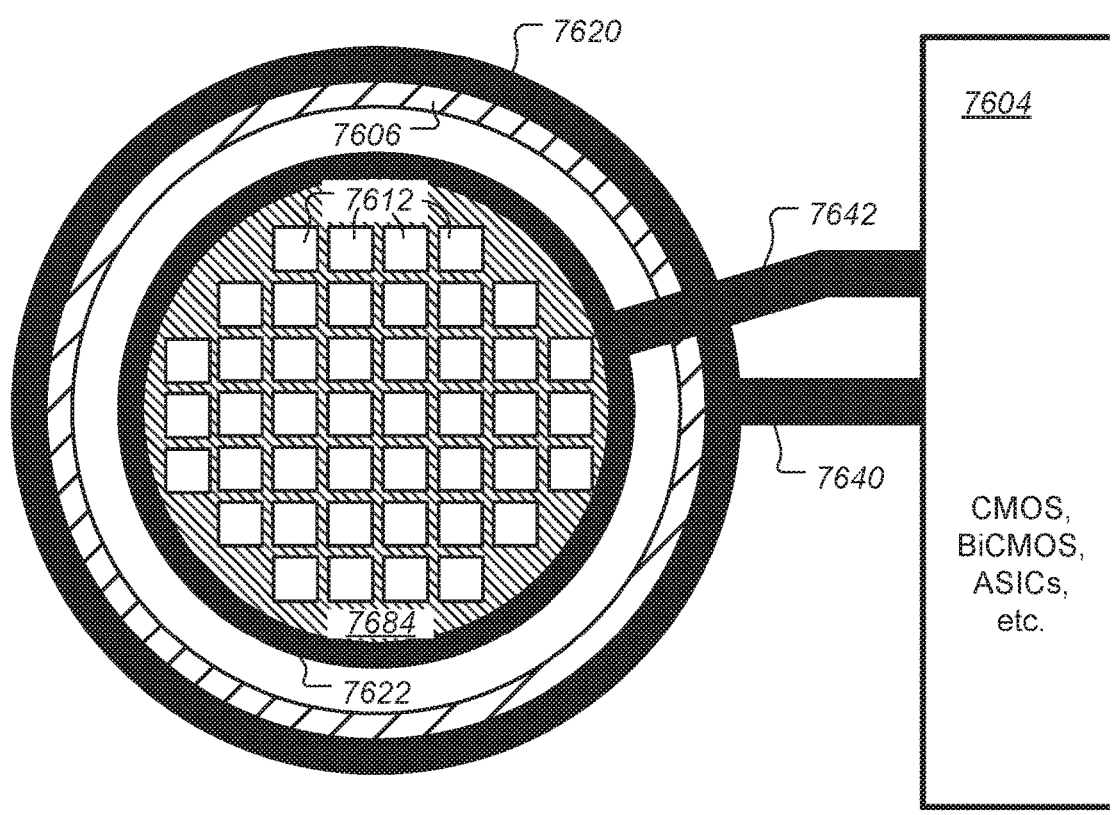

FIG. 76K shows the square microstructure holes 7612 that are inverted pyramids as a result of wet KOH etch into the silicon. This can be a back end of line (BEOL) process after the completion of the CMOS/BiCMOS ASICs. The holes are as described earlier and can be 900 nm to each side and a period of 1000 nm to 1200 nm in this example and in a square lattice. Passivations of the microstructure holes and surfaces are not shown for simplicity. The separation of the MSPD/MSAPD to the CMOS/BiCMOS electronics can range from a few microns to 100s of microns and in some cases from 10 to 500 microns and in some cases from 5 to 1000 microns or more.

Figure 77A:
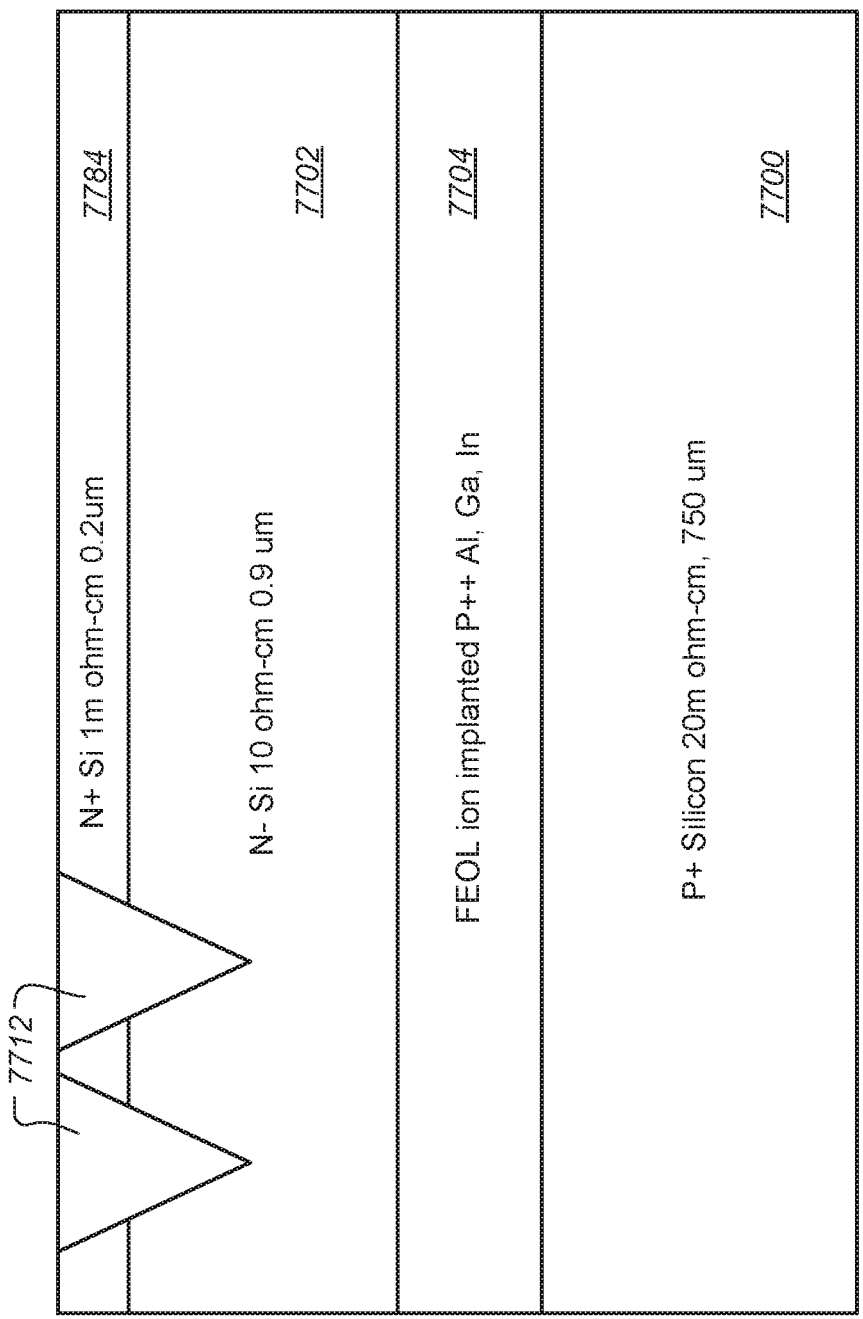
FIG. 77A is cross section view of an MSPD, according to some embodiments.

FIG. 77A is cross section view of an MSPD, according to some embodiments. The structure shown is similar to FIG. 76A. A 1.1 micron $N^-$ Si layer 7702 epitaxially grown on a $P^+$ Si substrate 7700. In this case, a FEOL (front end of line) CMOS/BiCMOS process is carried out. The $P^+$ substrate 7700 is first either blanket and/or selective area ion implanted with a P type dopant ion such as Al, Ga, In that has minimal diffusion during N⁻ growth for example. B ions may be used if the N⁻ layer is grown at a lower temperature. Similarly for an N⁺ Si substrate, N type dopant ions as discussed earlier can be implanted. In this example, the P⁺⁺ ion implanted and/or diffused layer 7704 can be on the surface of the P substrate 7700 (as shown) or it can be buried beneath the surface and the depth can range from 0 nm to 600 nm for example, and the thickness of the layer can range from 10 nm to 1000 nm or more and with a resistivity ranging from 0.1 to 0.0001 ohm-cm or less. The high doping levels can reduce the lifetime of photogenerated carriers in this P⁺⁺ region 7704 to a few ps approximately and in some cases to less than a few hundred ps and/or also to reduce mobility of photogenerated carriers. In some cases if the substrate 7700 is highly doped already, the addition of more P type ions (or N type ions for N substrate) may not be provided. Preventing the diffusion of photogenerated carriers back to the high field I and/or low doped region under a reverse bias voltage, can reduce the effect of a "tail" in the impulse response of the microstructured PD when illuminated with a short pulse optical laser light. Any energy in the tail can reduce the data rate bandwidth of the microstructure PD. N surface well 7784 is also shown. The complete MSPD is not shown, the P connecting well and the anode and cathode as in FIGS. 76A-E are not shown for simplicity and for FDTD simulation purposes. The hole size of holes 7712 can range from 600 nm to 2000 nm and the period can range from 900 nm to 3000 nm and can be in a square, and/or hexagonal lattice and/or aperiodic arrangements.

In some cases the N⁻ layer 7702 can be I and/or P-layer with resistivity equal to or greater than 10 ohm-cm approximately and with layer thicknesses ranging from 1 to 2 microns for I, N⁻ or P⁻ layers and in some cases 1-2.5 microns. In some cases the substrate can be N⁺ and in some cases the surface well can be P⁺ and in some cases the FEOL process of diffusion and/or ion implantation into the N⁺ substrate can be P and/or As ions to a depth ranging from 10 nm to 500 nm and from the surface ranging from 0 nm to 500 nm or more below the surface. Resistivity of this layer can range from 0.01 to 0.0001 ohm-cm or less.

Figure 77B:
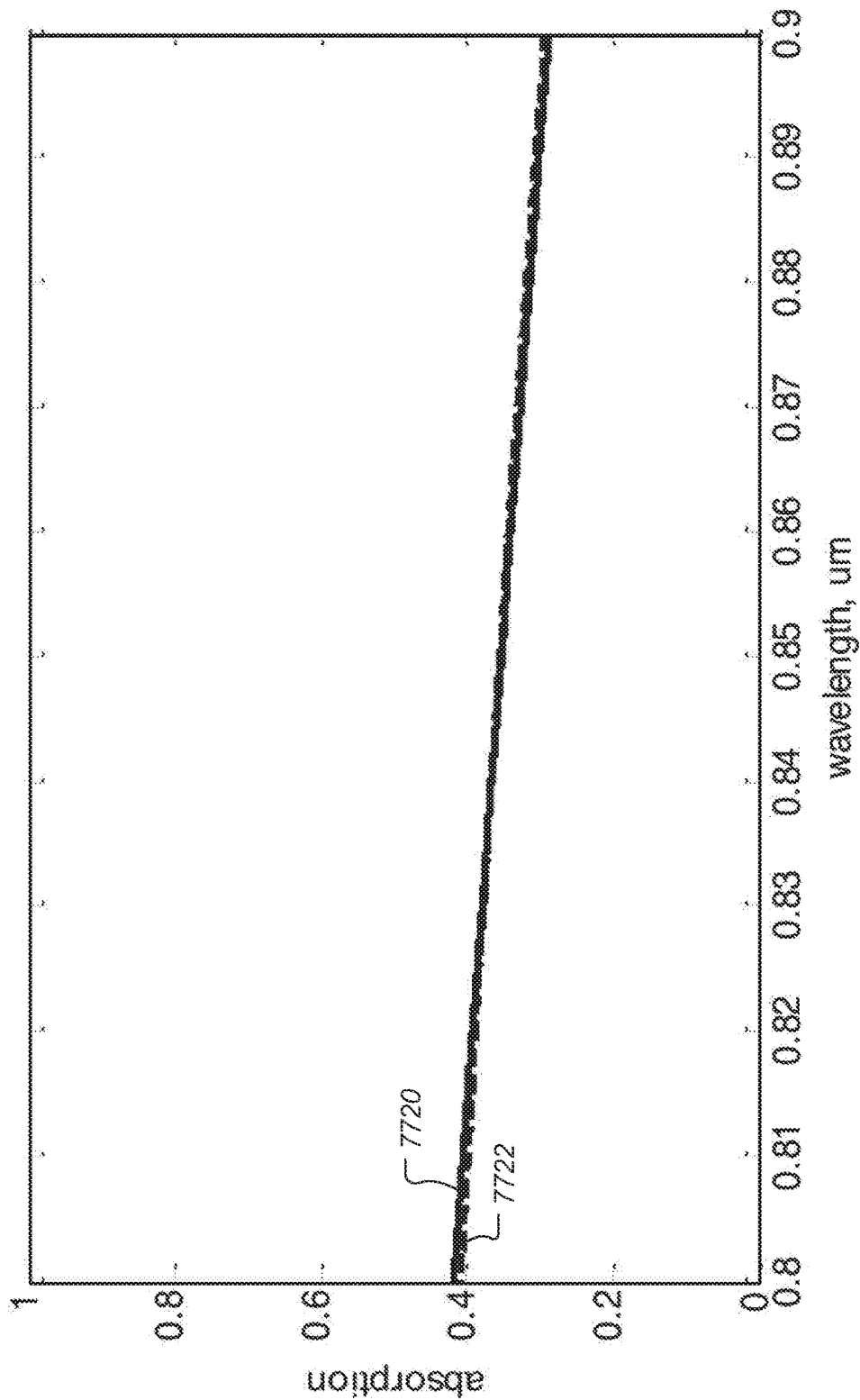
FIG. 77B is a plot showing a FDTD simulation of the optical field spanning wavelengths from 800 nm to 900 nm interacting with microstructure holes, according to some embodiments.

FIG. 77B is a plot showing a FDTD simulation of the optical field spanning wavelengths from 800 nm to 900 nm interacting with microstructure holes, according to some embodiments. The holes are inverted pyramid cross sectional shapes in silicon and where the absorption and therefore the quantum efficiency in the I or low doped layer 7702 of 0.9 microns as shown in FIG. 77A as a function of incident wavelength with the optical signal impinging from the surface where the microstructure holes are etched. The microstructure holes are etched with a KOH solution on (100) silicon plane, along (111) planes resulting in an inverted pyramid with 54.7 degree from the plane of the surface. See e.g., Sato, Basic 2 Anisotropic Wet-etching ⌴ of Silicon: Characterization and Modeling of Changeable Anisotropy, http://gcoe.mech.nagoya-u.ac.jp/basic/pdf/basic-02.pdf (incorporated herein by reference and referred to herein as "Sato") which discusses various anisotropic etches for silicon, and where KOH is one of the etchants. Passivation with HF dip and/or oxide, dielectric can be used on the microstructure holes to reduce leakage current. The quantum efficiency can be at and/or just below 40% in the wavelength span of 800-900 nm for square microstructure holes with 900 nm and 1200 nm sides and a square lattice of 1500 nm period. The solid line 7720 is for the 900 nm microstructure hole and the dash line 7722 is for the 1200 nm microstructure holes. In some cases the QE is 30% or more for certain wavelengths in the wave length range 800-900 nm and in some cases the QE is 20% or more for certain wavelengths in the wavelength range 800-900 nm.

Figure 78:
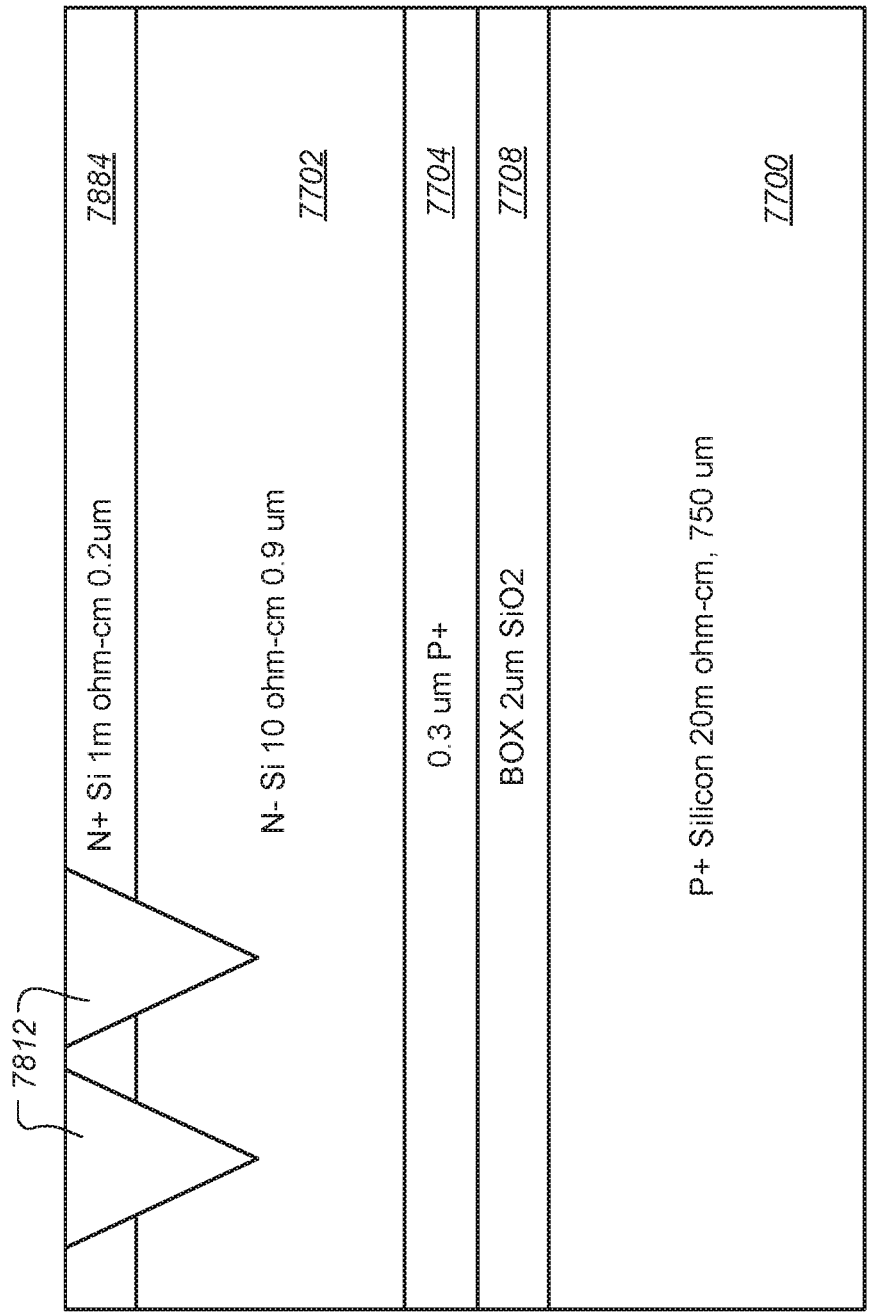
FIG. 78 is a cross section view of a structure similar to FIG. 76A with a BOX layer (or on a SOI wafer), according to some embodiments.

FIG. 78 is a cross section view of a structure similar to FIG. 76A with a BOX layer (or on a SOI wafer), according to some embodiments. The device layer 7704 is P⁺ and 0.3 microns thick and the BOX 7708 is about 2 microns thick (can have a range from 0.1 to 5 microns or more) and the device layer can be ion implanted as in FIG. 77A and/or diffused or doped during growth to a resistivity in the range from 0.01 to 0.001 ohm-cm or less and an I or low doped N⁻ layer 7702 with resistivity of 10 ohm-cm or more epitaxially grown and/or wafer bonded on the P⁺ layer to a thickness of 1.1 microns. After the N⁺ layer 7884 is formed, square microstructure holes 7812 are etched using KOH solutions resulting in an inverted pyramid with the side wall (111) plane at a 54.7 angle from the plane of the surface. The side of the microstructure holes 7812 are 900 nm in a square lattice with 1200 nm periods. The hole size can range from 600 nm to 2000 nm and the period can range from 900 nm to 3000 nm and can be in a square lattice and/or hexagonal lattice and/or aperiodic and/or random arrangements.

The complete MSPD is not shown, for example the P⁺ connecting well and the anode and cathode as in FIGS. 76A-C for simplicity and for FDTD simulation purposes.

Figure 79:
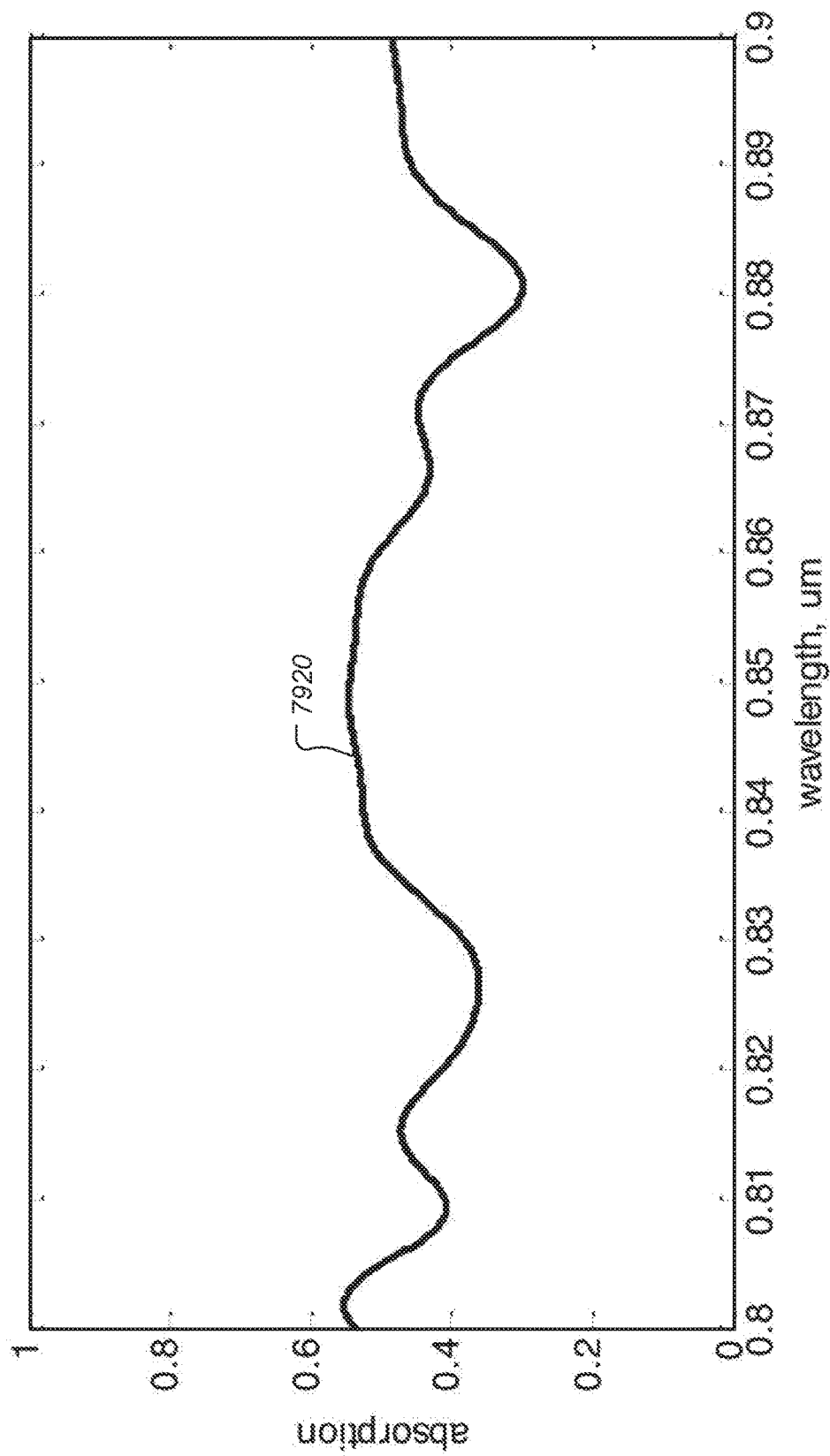
FIG. 79 is a plot showing a FDTD simulation of the structure shown in FIG. 78 of the optical field interacting with the microstructure holes in silicon.

FIG. 79 is a plot showing a FDTD simulation of the structure shown in FIG. 78 of the optical field interacting with the microstructure holes in silicon. The absorption of the I or low doped N⁻ layer 7702 is 0.9 microns thick (also the quantum efficiency of the MSPD) as a function of the optical signal wavelength from 800 nm to 900 nm impinging on the top surface where the square holes are etched. The solid curve 7920 is for square holes with 900 nm sides in a square lattice with a period of 1200 nm. The absorption and therefore the QE is mostly above 40% from 800 nm to 900 nm and in certain wavelengths it can be over 50%. In some cases, the QE is 30% or more at certain wavelengths in the range 800-900 nm. And in some cases the QE can be 20% or more at certain wavelengths in the wavelength range 800-900 nm.

In some cases, KOH may not be allowed in CMOS/BiCMOS fabrication laboratories due to the possibility of K contamination, in which case TMAH, EDP and other isotropic and/or anisotropic etchants may be used. See, e.g., Sato; Sato et al, Anisotropic etching rates of single-crystal silicon for TMAH water solution as a function of crystallographic orientation, Sensors and Actuators, 73 (1999) 131-137 (incorporated herein by reference); Bassous, Fabrication of Novel Three Dimensional Microstructures by the Anisotropic Etching of (100) and (110) Silicon, IEEE Transactions of Electron Devices, ED-25, 10, 1978 (incorporated herein by reference). In addition other combinations of wet etch and/orientations, not necessary an inverted pyramid, are possible. The wet etched and/or dry etched microstructure holes can be any cross sectional shapes and in addition, different cross sections, for example perpendicular cross sections can have same and/or different cross sectional shapes. See, e.g., Zubel, Anisotropic etching of silicon in solutions containing tensioactive compounds, Proc. of SPIE Vol. 10175 101750L-1 (incorporated herein by reference). In some cases, wet and dry etching can be combined to produce cross sectional shapes that cannot be achieved by either wet or dry etching alone. In some cases wet etch can be used after dry etch to remove surface damage caused by dry etching plasmas.

In some applications as mentioned earlier, a superstrate can be attached with precision to the monolithically integrated microstructure photodetector and CMOS/BiCMOS ASICs and in some cases the microstructure photodetectors can be an array. The superstrate can be precision molds from three dimensional printing with built in bandpass filters and reflectors for CWDM, and/or precision silicon platforms such as MEMS with or without actuators for movement of mirrors, filters and in some cases the superstrate can be a passive silicon with 45 degree mirror etched to redirect the optical signal that can enter the monolithic chip in plane for example. See, e.g., Hsiao et al, Compact and passive-alignment 4-channel×2.5-Gbps optical interconnect modules based on silicon optical benches with 45° micro-reflectors, 21 Dec. 2009/Vol. 17, No. 26/OPTICS EXPRESS 24250 (incorporated herein by reference); and Rola et al, Triton Surfactant as an Additive to KOH Silicon Etchant, JOURNAL OF MICROELECTROMECHANICAL SYSTEMS, VOL. 22, NO. 6, December 2013 (incorporated herein by reference). Rola, Anisotropic etching of silicon in KOH+Triton X-100 for 45° micromirror applications, Microsyst Technol (2017) 23:1463-1473 (incorporated herein by reference and referred to herein as "Rola"), in connection with FIG. 1 of Rola an optical fiber is coupled to a silicon bench mirror etched 45 degree to re direct the optical beam perpendicular to the fiber.

Figure 80:
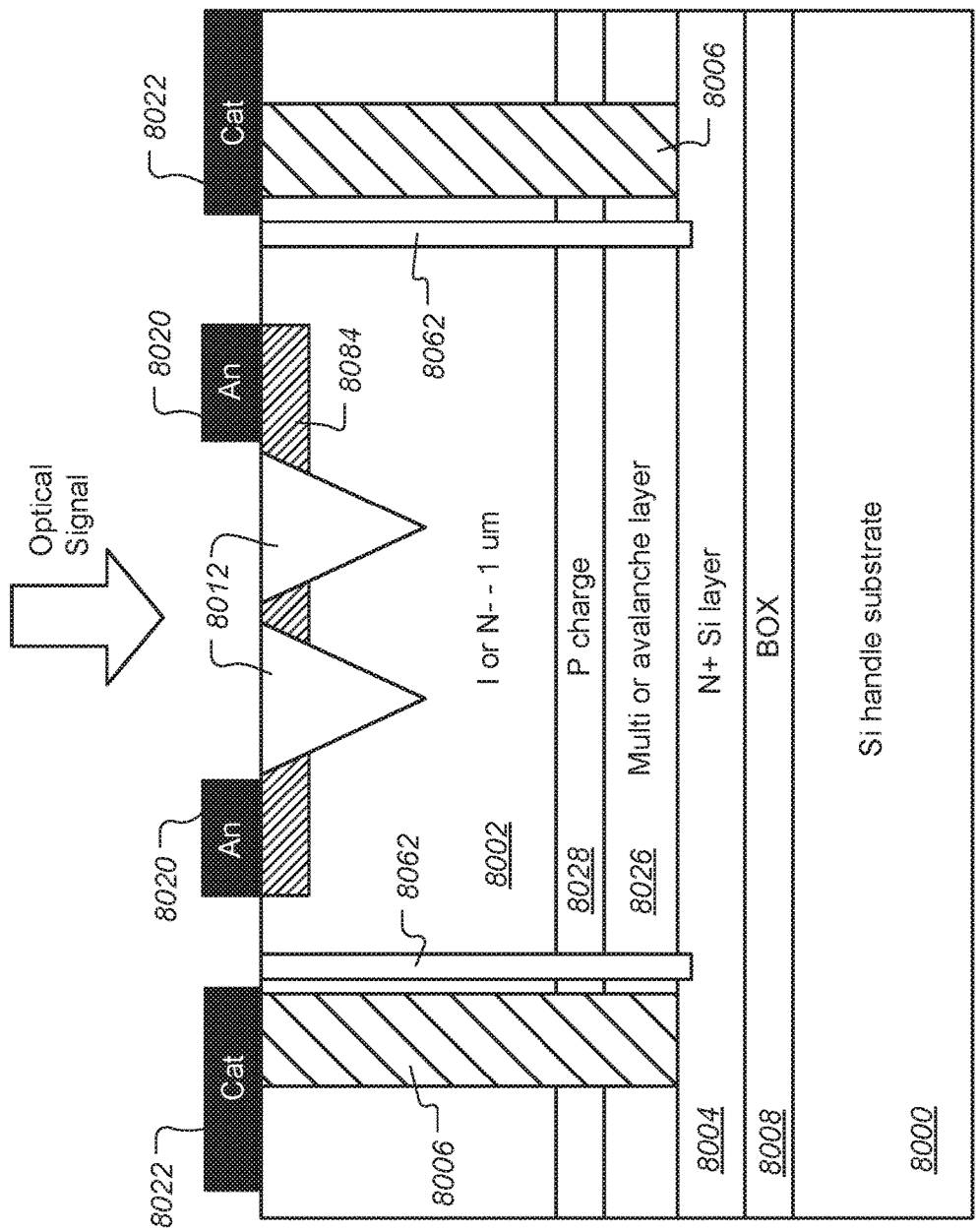
FIG. 80 is a cross section illustrating some aspects of a MSAPD with microstructure holes, according to some embodiments.

FIG. 80 is a cross section illustrating some aspects of a MSAPD with microstructure holes, according to some embodiments. In this example the microstructure holes 8012 can be inverted pyramids. In some cases the holes are not inverted pyramids and can be more complex. The holes can be etched with wet anisotropic and/or isotropic wet and/or dry, and/or dry etching. Not shown for simplicity are the CMOS/BiCMOS ASICs that can be monolithically integrated with the MSAPD. An electrical isolation trench 8062 can be etched between the anode 8020 and cathode region 8022 as shown in a ring and/or perimeter fashion such that the $N^+$ connecting well 8006 can be isolated from the depletion regions. This isolation trench 8062 between the anode and cathode can also be applied to earlier discussed MSPD with connecting wells to isolate the connecting wells from the depletion regions. In this example of a MSAPD, a SOI wafer is used with a BOX layer 8008 thickness ranging from 0.2 to 4 microns or more. A device layer (not shown) can be formed between layers 8008 and 8004 that has a thickness ranging from 100 nm to 500 nm, and can be diffused and/or ion implanted with N type dopants to a resistivity of 0.01 ohm-cm or less. An epitaxial $N^+$ layer 8004 can be grown with thicknesses ranging from 200 to 500 nm and with resistivity of 0.01 ohm-cm or less. A multiplication or avalanche layer 8026 can then be grown with thickness ranging from 0 to 500 nm that can be intrinsic and/or low doped N and with a resistivity of 0.6 ohm-cm or higher and/or 2 ohm-cm for low doped P. A P type charge layer 8028 has a thickness ranging from 50 nm to 200 nm and resistivity in the neighborhood of 0.2 to 0.07 ohm-cm. The I and/or low doped N-layer 8002 has thickness ranging from 0.5 to 5 microns and in some cases 0.8 to 2 microns, in some cases 0.8 to 1.2 microns and in some cases 1 microns, and has resistivity 1-10 ohm-cm or higher (in some cases it can be P-layer with resistivity ranging from 5-10 ohm-cm or higher). A $P^+$ well 8084 can be diffused and/or implanted to a depth of 50-300 nm and in some cases 100 nm, and in some cases can have a thin layer of metal such as Al, Pt. Cu, Cr, Au, Ag, Ta, V, Zr, W, and/or Fe with thickness ranging from 1 nm to 100 nm and/or transparent conducting metal oxide such as indium tin oxide with thickness ranging from 50 nm to 500 nm that can be deposited on the $P^+$ surface prior to microstructure hole patterning and etching. Not discussed are thermal anneals for diffusion processes and for ion implant activation processes and these can be a part of or separate from the CMOS/BiCMOS processes. Passivation is not shown for simplicity and clarity. A $N^+$ connecting well 8006 can be diffused and/or implanted (multiple energy if necessary) to form a connection for the surface cathode 8022 to the $N^+$ layer 8004. The depth of the well 8006 can be to the $N^+$ layer 8004 and/or past the $N^+$ layer. The width of well 8006 can range from 1 to 30 microns and the resistivity can be 0.1 ohm-cm or less. Cathode ohmic metallization ring 8022 and anode ohmic metallization ring 8020 can be formed as in FIG. 76I for example. An electrical isolation trench 8062 can be etched between the cathode ring 8022 and anode ring 8020. The trench 8062 can be formed to a depth of the $N^+$ layer 8004 for example as shown in FIG. 80. Similarly such an electrical isolation ring between the cathode and anode can also be etched for MSPD shown in FIG. 76E for example to a depth where it reaches and/or passes the $P^+$ layer 8084. In addition, a second electrical isolation ring and/or perimeter (not shown) can be etched outside the MSAPD and/or the MSPD, and between the MSAPD and/or MSPD, and the CMOS/BiCMOS ASICs if necessary. The width of the rings can range from 100 nm to 1000 nm or more and can be dry and/or wet etched. In some cases, multiple rings for between the anode and cathode and/or between the microstructure photodetectors and the ASICs can be etched to form a Bragg reflector to confine the light within the MSAPD/MSPD to further enhance absorption and therefore improve the quantum efficiency. Also not shown are the transmission lines connecting the anode and cathode to the ASICs and external power supply that power the ASICs and provide the reverse bias for the MSAPD and MSPD.

As discussed earlier, the microstructure holes 8012 lateral dimensions can range from 300 nm to 3000 nm or more, in some cases from 500 nm to 3000 nm, and in some cases from 600 nm to 2000 nm. The holes can have any shape, for example, circular, square, rectangle, polygonal, star, amoeba, or fractal. The cross-sectional shape of the holes can be inverted pyramids, fractal, cone, funnel, polygonal, hourglass, amoeba, or continuous curve. Different lattice directions can have different cross sectional shape, and any combinations of shapes by anisotropic, isotropic and/or dry etching. The spacing of adjacent microstructure holes can vary and/or be constant and can range from 50 nm to 500 nm or more and can be periodic such as square, hexagonal lattice, aperiodic, random and/or a combination of periodic and aperiodic. In this example, microstructure holes 8012 can be square with each side ranging from 900-1200 nm and a period ranging from 1000 nm to 1500 nm in a square lattice.

The layer thicknesses for the MSAPD is thinner than a conventional silicon APD without microstructure holes by a factor of 2 to over 10 with similar quantum efficiencies. Thinner layers of the MSAPD can result in significantly lower reverse bias voltages. For example, instead of −100V in a conventional APD, −45V or less can be achieved with similar gain, and in some cases −30V or less.

In some cases some or all of the layers, except for the substrate 8000, can be some composition of GeSi where the Ge fraction can vary from 0 to 1 for the MSAPD and MSPD.

Figure 81:
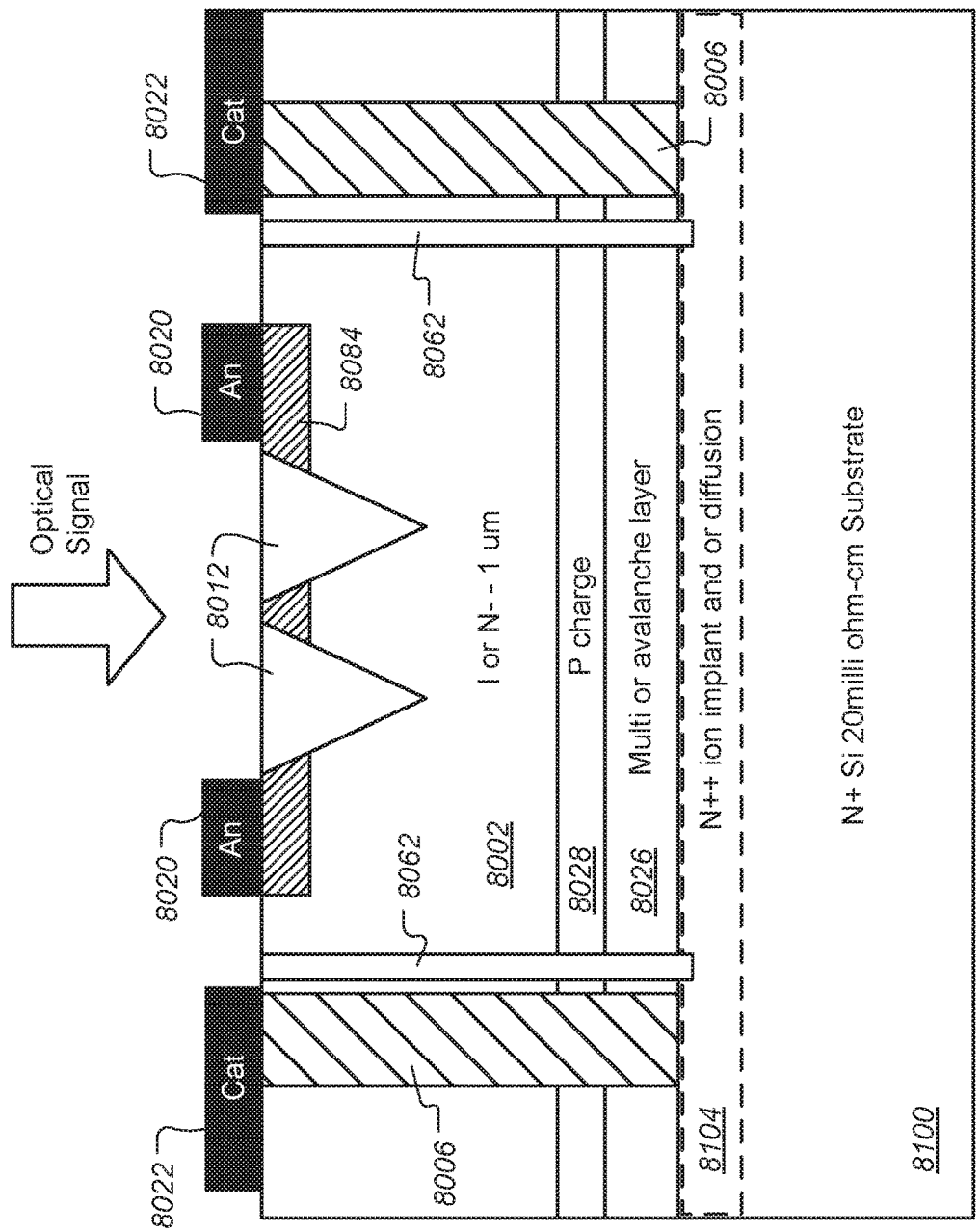
FIG. 81 is a cross section similar to FIG. 80, and illustrating some aspects of a MSAPD with microstructure holes, according to some embodiments.

FIG. 81 is a cross section similar to FIG. 80, and illustrating some aspects of a MSAPD with microstructure holes, according to some embodiments. In this case, instead of a BOX layer a $N^+$ silicon substrate 8100 is used. A FEOL (front end of line) process of selective and/or blanket ion implantation and/or diffusion of $N^+$ type ions into the $N^+$ substrate 8100 can be performed to form region 8104. The implantation and/or diffusion can be carried out prior to the growth of the multiplication/avalanche layer, charge layer, I or low doped layer. P type ions such as Al and/or Ga is attractive due to its larger size than B and may diffuse less during epitaxial growth. Resistivity of 0.001 ohm-cm or less or a dopant density of 1E20 or greater and a thickness ranging from 10 nm to 300 nm or more and with a depth ranging from 0 nm to 300 nm or more, can be desirable to reduce the photogenerated carrier lifetime in these regions away from the high electric field to minimize diffusion of the photogenerated carriers back to the high field region that can degrade the high frequency response of the MSAPD. In certain applications where high bandwidth is not necessary. The BOX and/or high doping regions may also not be provided and the low avalanche voltage is the most important factor. Such applications may include LIDAR and image processing. n some cases, some or all of the epitaxial layers can be GeSi with Ge fraction ranging from 0 to 1.

In some cases, the connecting well 8006, connecting the surface cathode and/or anode to $N^+$ and/or $P^+$ layers, can be metal for the MSAPD and MSPD and either a ring or post/columns can be used and the number of post/columns can range from 1 or 25 or more. Trench isolations as discussed earlier may be used for electrical and/or optical isolation.

In some cases, for the highly doped layers, other atoms may be added to compensate for lattice strain. For example, in highly doped boron layers Ge may be added to compensate for lattice strain with approximately similar amount as the doping ions for example.

Figure 82A:
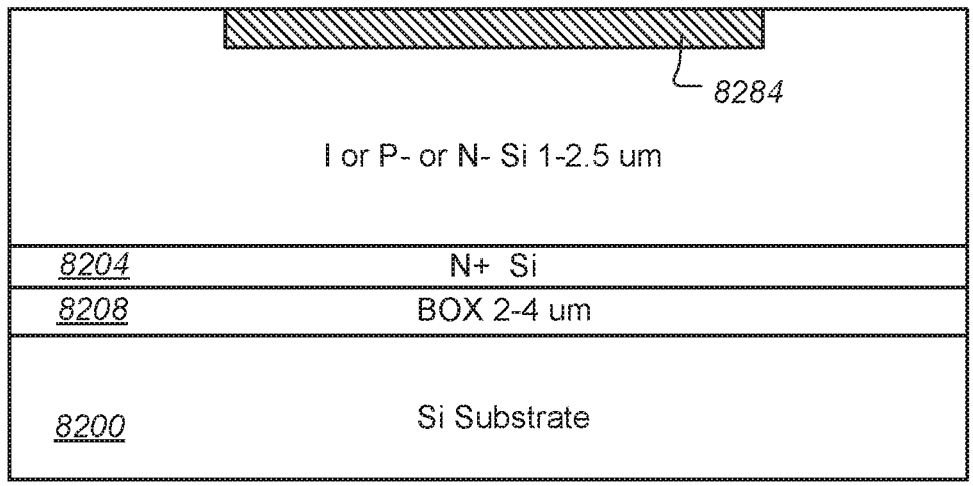
FIGS. 82A and 82B are cross sectional views of layer structures prior to integration of a MSPD with CMOS/BiCMOS ASICs, according to some embodiments.
Figure 82B:
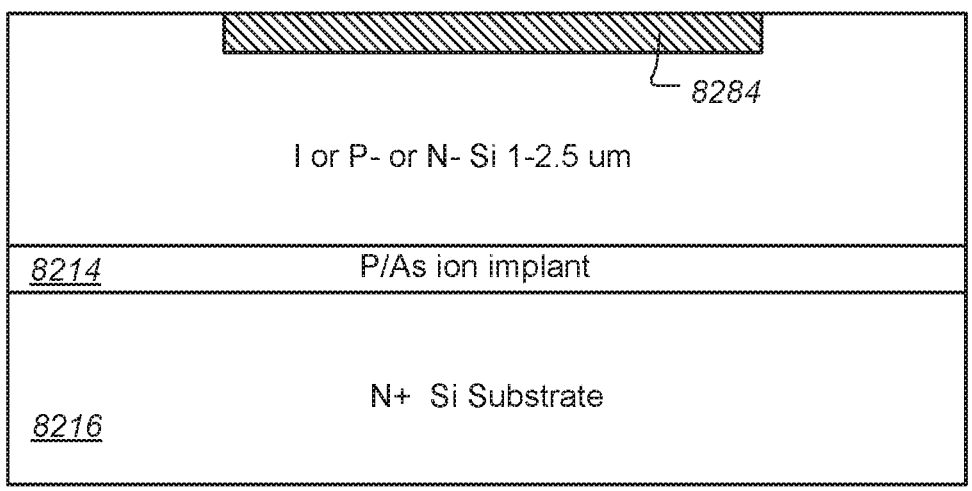

FIGS. 82A and 82B are cross sectional views of layer structures prior to integration of a MSPD with CMOS/BiCMOS ASICs, according to some embodiments. Shown are variations of structures shown in FIGS. 77A and 78 and prior to microstructure hole etching and connecting wells. In some cases, the I or $N^-$ or $P^-$ low doped layers of FIG. 76A, 77A, 78 can have a thickness ranging from 0.5 to 5 microns and in some cases from 1 to 2.5 microns. FIGS. 82A and 82B show further variations of the starting material for CMOS/BiCMOS integration with MSPD. In FIG. 82A the substrate is $N^+$ 8200 and/or the device layer is $N^+$ in a SOI. The BOX layer 8208 can have a range in thickness from 0.1 to 10 microns. FIG. 82A is on SOI and the device layer 8204 thickness can range from 100 nm to 500 nm with a resistivity of less than 10 ohm-cm an can be diffused and/or ion implanted with P and/or As ions to a resistivity of less than 0.01 ohm-cm and in some cases less than 0.001 ohm-cm. A $P^+$ surface well 8284 can be diffused and/or ion implanted with B and/or Al ions to a depth ranging from 10 nm to 500 nm and can include multiple energy ion implant such that the doping can be uniform to the surface. The width of the $P^{++}$ well 8284 can range from 20 to 100 microns and in some cases from 25 to 80 microns and in some case from 30 to 500 microns or more. In some cases a thin metal and/or transparent conducting metal oxide layer can be added on the surface of the $P^+$ region with thicknesses ranging from 1 nm to 500 nm to reduce series resistance, prior to etching of the microstructure holes. FIG. 82B shows a $N^+$ substrate 8216 with a FEOL diffusion and/or ion implantation of P and/or As ions to a depth ranging from 10 to 500 nm from the surface of the substrate and can be 0 nm to 500 nm or more beneath the surface after thermal annealing where the dopants may diffuse. The resistivity of the $N^{++}$ layer 8214 can range from 0.01 ohm-cm or less to 0.001 ohm-cm or less to 0.0001 ohm-cm or less. In some cases the addition of $N^{++}$ layer may not be provided if the substrate 8216 is highly doped and/or in some cases where the data rate bandwidth degradation due to diffusion current can be tolerated in certain applications. Not shown in FIGS. 82A and 82B for clarity and simplicity are structures such as the connecting wells and/or electrodes, the cathode and anodes and its metallization and transmission lines connecting the MSPD to the ASICs, the microstructure holes which are similar to earlier figures, passivations, antireflection layers, planarization effects, and dielectric cross-overs for the electrodes. Optical signals can impinge from the surface where the microstructure holes are etched and in some cases the optical signal can impinge from the bottom where a via can be etched.

In some cases, the monolithically integrated MSPD/MSAPD layer structures can have one or more GeSi layers with Ge fraction varying from 0 to 1 and where the layer(s) can have the same and/or different Ge fractions. This can apply to all earlier discussions and later discussions on microstructure photodetectors.

Figure 83:
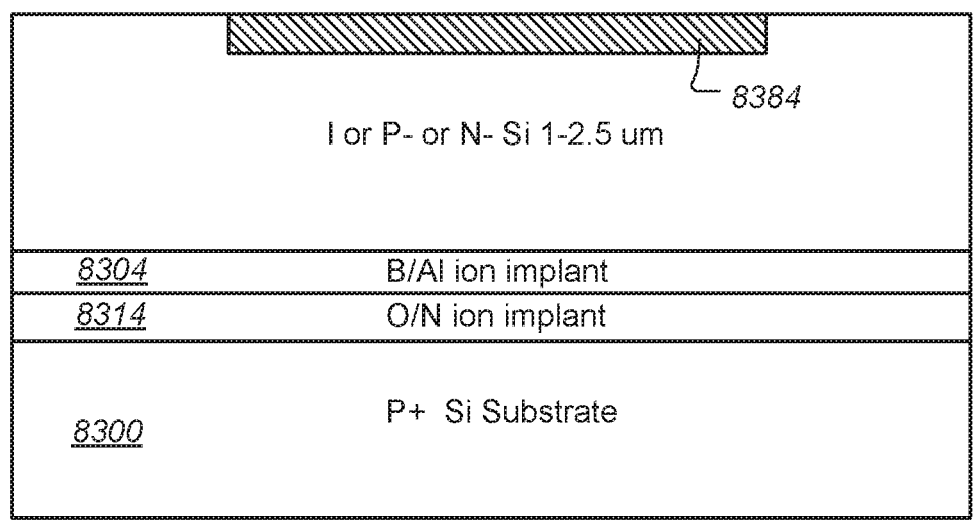
FIG. 83 is a cross section view showing aspects of a starting layer structure with $N^+$ surface well, according to some embodiments.

FIG. 83 is a cross section view showing aspects of a starting layer structure with $N^+$ surface well, according to some embodiments. The structure is similar to that of FIG. 76B, except with a FEOL (front end of line) ion implant of buried O and/or N ions in the P substrate 8300. See, e.g., Izumi et al, C.M.O.S. DEVICES FABRICATED ON BURIED SiO2 LAYERS FORMED BY⊥ OXYGEN IMPLANTATION INTO SILICON, ELECTRONICS LETTERS 31 Aug. 1978 Vol. 14 No. 1 (incorporated herein by reference); Hauthan et al, Improvement in buried silicon nitride silicon-on-insulator structures by fluorine-ion implantation, J. Appl. Phys., Vol. 83, No. 7, 1 Apr. 1998 (incorporated herein by reference). The implantation energy can range from 50 to 200 KeV or more and the dose can range from 1E14 to 8E18/$cm^2$ ($1\times10^{14}$ to $8\times10^{18}$) or more. B and/or Al can be diffused and/or ion implanted for a P substrate if necessary above the buried O/N region 8314 to from region 8304 having a thickness ranging from 50 to 300 nm and can be 0 to 300 nm below the surface of the P substrate and can have a resistivity of 0.01 ohm-cm or less. For N substrate, P and/or As can be diffused and/or ion implanted similarly and with a resistivity of 0.01 ohm-cm or less. The width of the surface well 8384, $N^+$ in this case, can range from 20 to 500 microns and in some cases from 25 to 100 microns and in some cases 500 to 1000 microns and can be circular, square, or polygonal. Basic processing steps can be similar to FIGS. 76A to 76F and can include depletion isolation trench ring/perimeter as in FIGS. 80 and 81.

In some cases, the buried O/N implant may not be provided. In some cases the additional $P^+$ and/or $N^+$ doping on the P or N substrate 8300 may not be provided. In some cases both buried O and/or N region 8314 and $P^+$ or $N^+$ doping on the substrate 8300 can be provided.

The O/N buried ion implant can also applied FEOL to MSAPD for example in FIG. 81 a buried oxygen and/or nitrogen layer can be implanted with similar dose as for MSPD followed by P/As diffusion and/or ion implantation for an $N^+$ layer or region. In some cases, one or more of the layers can be GeSi with Ge fraction ranging from 0 to 1.

Figure 84A:
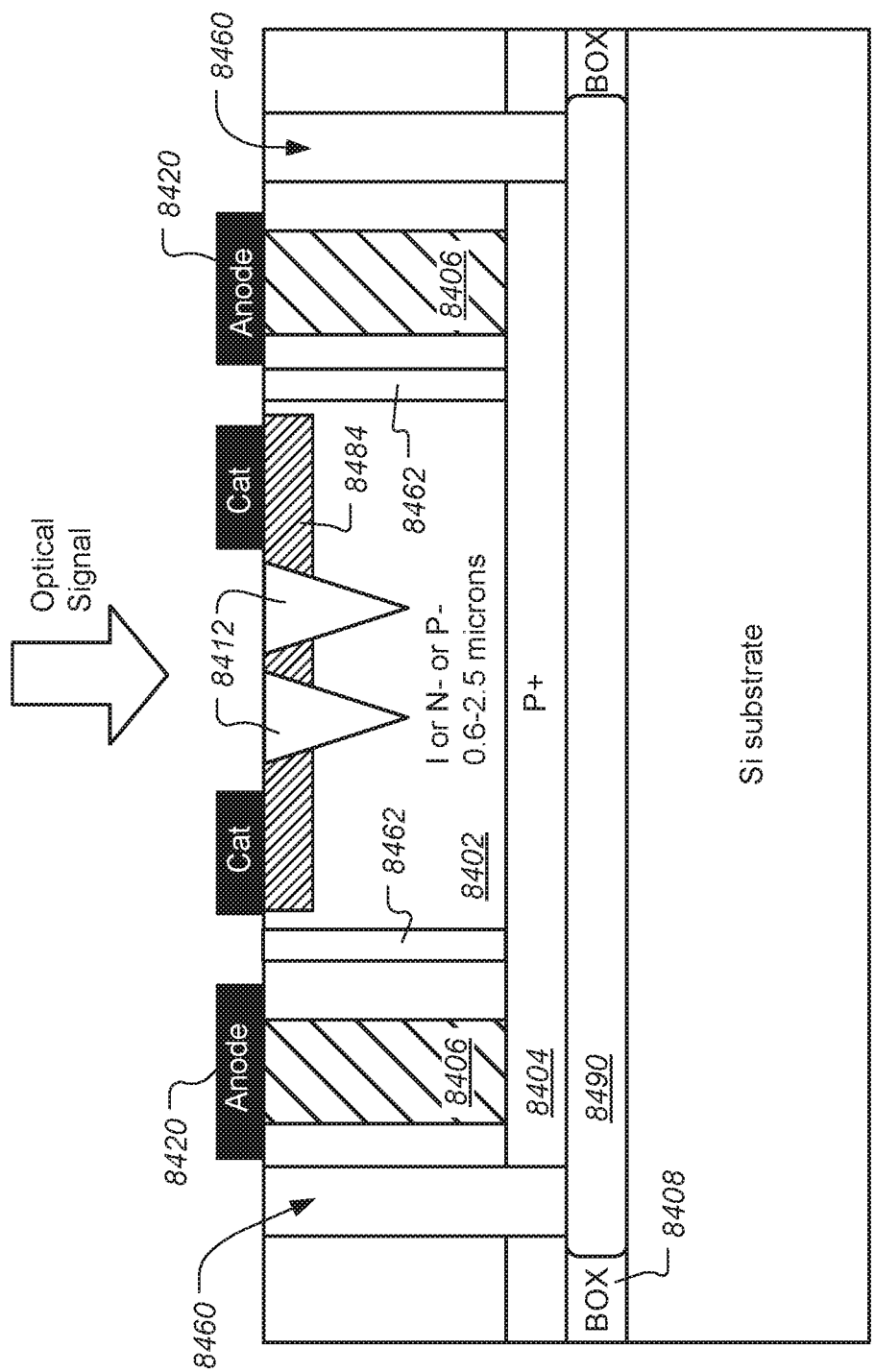
FIGS. 84A and 84B are cross sectional views of a MSPD/MSAPD on SOI and/or a sacrificial layer, according to some embodiments.
Figure 84B:
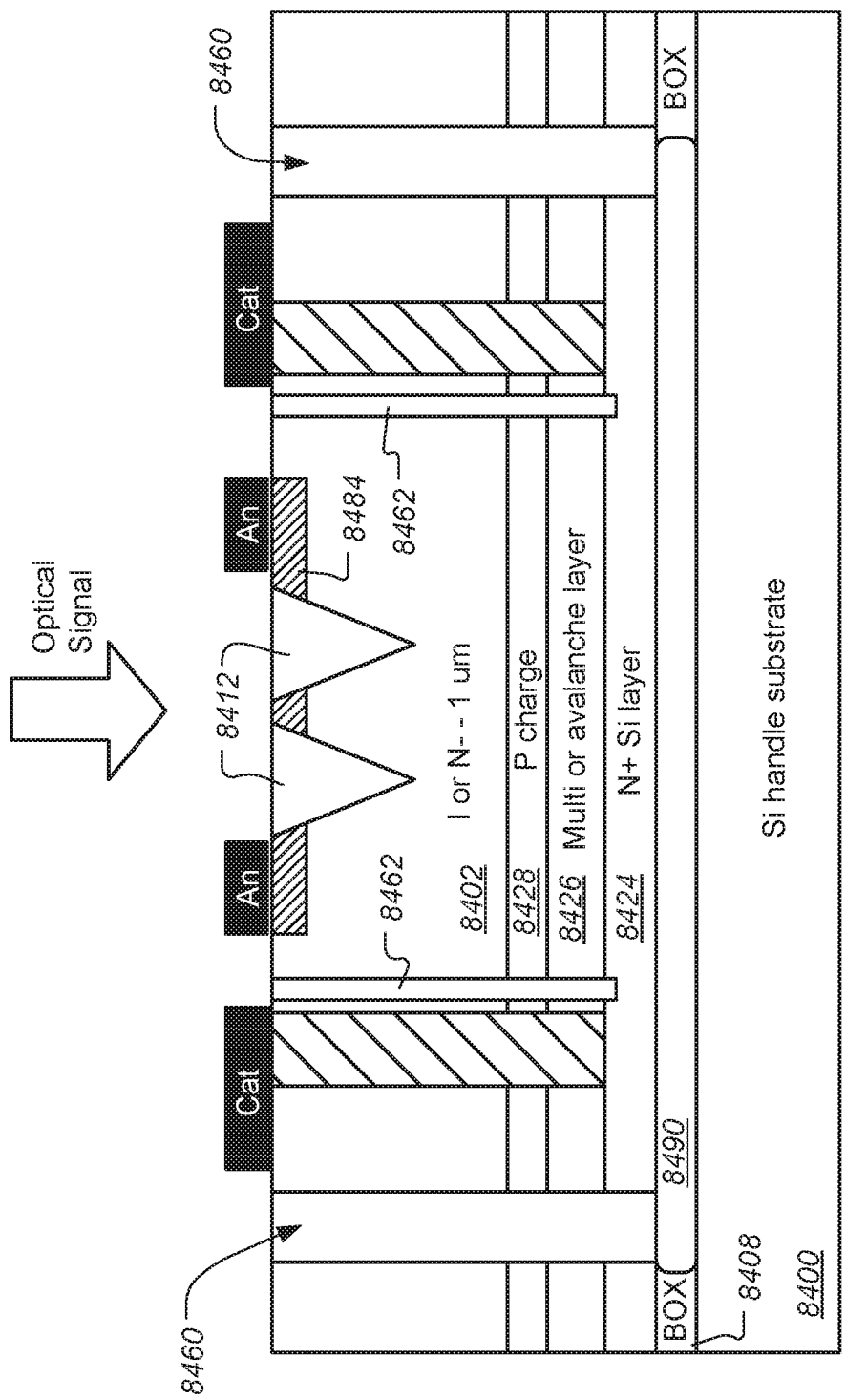

FIGS. 84A and 84B are cross sectional views of a MSPD/MSAPD on SOI and/or a sacrificial layer, according to some embodiments. The structure in FIG. 84A is similar to that of FIG. 71. In this case, the BOX layer 8408 is etched away selectively in the region 8490 below the microstructure holes 8412 and surrounding regions. An etching trench 8460 or via is dry etched to the BOX layer 8408 and wet etch can be introduced through the etch trench to the BOX or sacrificial layer to be etched mostly away and leaving mostly air beneath the microstructure holes. The wet etch for silicon dioxide can be HF based for example. The etch patter can be circular and these circular patters can converge to remove most of the oxide and/or sacrificial layer. In FIG. 84A only the region under the microstructure holes are shown etched mostly away for simplicity. However, in practice the region 8490 may extend into a larger region of oxide and/or sacrificial layer extending roughly equidistance from the etch trench 8460 in all lateral directions with the etch trench 8460 as the center. In some cases some silicon dioxide and/or sacrificial layer may remain as a spacer layer in the form of posts, islands and/or regions to provide separation between the bottom doped layer and the substrate. See, e.g., Judy, Microelectromechanical systems (MEMS): fabrication, design and applications, Smart Mater. Struct. 10 (2001) 1115-1134 (incorporated herein by reference); and Smith et al, Embedded Micromechanical Devices⌐ for the Monolithic Integration of MEMS with CMOS, *Proc.* 1995 *IEDM*, pp. 609-612 (incorporated herein by reference). In some cases, the etch trench/via 8460 can be located in the same region as the microstructure holes 8412 and in some cases can be located between the cathode and anode and in some cases in region outside the ohmic contact regions.

Figure 86:
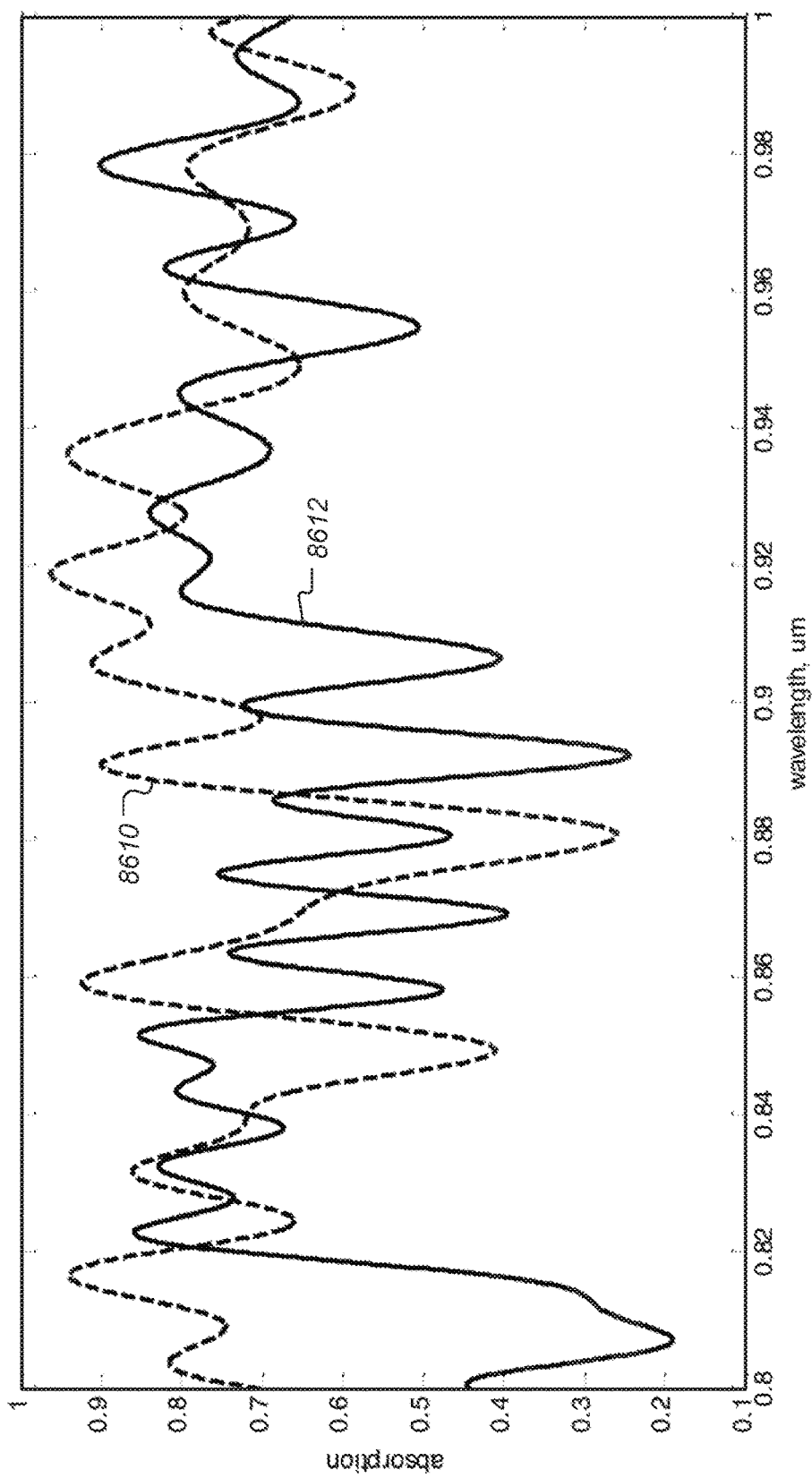
FIG. 86 is a plot showing the results of a FDTD simulation of the optical field on inverted pyramid holes on 1 micron thick silicon with air interfaces on both the top and bottom.

The removal of the BOX 8408 or sacrificial layer allows higher reflection from the semiconductor-air interface than from semiconductor-silicon dioxide interface. This higher reflection, as shown in FIG. 86 infra, can result in an absorption and/or quantum efficiency of greater than 80% for a one micron thick I or low doped N or P layer of silicon at certain wavelengths in the range of 800 nm to 1000 nm. The BOX layer 8408 thickness can range from 0.5 to 10 microns or more and in some cases less than 0.5 microns. The P$^+$ layer 8404 can range from 100 nm to 500 nm with resistivity of 0.01 ohm-cm or less. The I or low doped N or P layer 8402 can have a thickness ranging from 0.5 to 5 microns and have a resistivity of 1 ohm-cm or more. The N$^+$ surface well 8484 can have a thickness ranging from 50 nm to 500 nm and in some cases can have a thin metal and/or transparent conduction metal oxide layer with thickness ranging from 1 nm to 500 nm and the N$^+$ well can have a resistivity of 0.01 ohm-cm or less. The width of the N$^+$ well 8484 can range from 20-1000 microns and in some cases from 25 to 100 microns, and can be circular, polygonal, star shaped, and/or any combinations of shapes. The P+ connecting wells 8406, in ring/perimeter and/or post form, can be diffused and/or ion implanted to form a connection to the P$^+$ layer 8404 and the surface Anode 8420. In some cases, the connecting well 8406 can be formed by dry and/or wet etching holes to the P$^+$ layer and filling with conducting material such as silicide and/or metal and/or high doped amorphous semiconductor. Also shown is an isolation trench 8462 between the anode and cathode region, which can serve as a depletion isolation trench ring/perimeter to further reduce parasitic capacitance. In some cases such a depletion isolation ring may not be necessary. In some cases, the depletion isolation ring/perimeter can be etched partially into the I or low doped N or P layer and not entirely to the P$^+$ layer. Not shown nor discussed are passivation, thermal anneals, chemical dips, hermetic sealing if necessary, to reduce surface damage and to reduce leakage current The microstructure holes 8412 can have cross sectional shapes as inverted pyramids, funnel, cone, cylindrical, hourglass, keyhole, fractal and any combination of shapes that can be created with wet and/or dry etching and in some cases electrochemical etching. Etch depth of holes 8412 as discussed earlier, can be partially into the I or low doped N or P layer, partially in the surface doped layer, through the I or low doped P or N layer, partially into the bottom doped P$^+$ or N$^+$ layer, through the P$^+$ or N$^+$ layer. In some cases if the microstructure holes are etched to the BOX layer, the silicon dioxide can be etched mostly away by using the microstructure holes as a conduit for the wet etch to remove the silicon dioxide and an extra etch trench or via may not be necessary. In some cases, microstructure holes can be etched to the BOX layer and in some cases can be etched into the BOX layer and in some cases pass the BOX layer and into the Si substrate. Mixtures of HF solutions in liquid and/or vapor can be used to remove all and/or mostly all and/or partially the silicon dioxide of the BOX layer and in some cases only dry etching into and/or through the BOX layer is necessary and HF solutions in liquid and/or vapor may not be used at all. In some cases, the microstructure holes 8412 can be used as a conduit for the HF and/or similar oxide etching solutions in liquid and/or vapor to etch all and/or mostly all and/or partially the silicon dioxide of the BOX layer. In some cases dry etching alone can be used to remove the BOX layer partially and/or entirely by etching the BOX layer via the microstructure holes.

Microstructure hole lateral dimension can range from 300 nm to 3000 nm and in some cases from 100 nm to 5000 nm, and the spacing between microstructure holes can range from 50 nm to 3000 nm and can be periodic and/or aperiodic and/or any combination of periodic and aperiodic. The microstructure holes 8412 can be in a square and/or hexagonal lattice and/or in a random arrangement that can also have lateral dimension of the holes varying in a pattern and/or random within certain bounds for example within 500 to 1500 nm lateral dimension. The microstructure hole dimensions lateral and vertical and spacing can be optimize for certain wavelength ranges. The variation can be from subwavelength to about 2× wavelength in free space. For example for 1500-2000 nm wavelength the microstructure hole range may be 800 nm to 3500 nm. For wavelength ranges from 800 to 1350 nm the microstructure holes can have lateral dimensions from 500 nm to 2500 nm range, In some cases, one or more of the layers in FIGS. 84A and 84B can be GeSi with Ge fraction ranging from 0 to 1 where 0 is all Si and 1 is all Ge.

In some cases, mesa etching can be used instead of connecting wells/electrodes. A mesa can be etched and passivated with the connecting electrode in the passivation region and in some cases outside the passivation region. See, e.g., FIG. 1 of Kang et al 2008. This can apply to FIG. 84B and all earlier discussions where connecting wells/electrodes were used.

Quantum efficiency can range from 30% to 90% for at least one or more wavelengths in the range of 800 nm to 1000 nm. With GeSi I and/or low doped layer, quantum efficiency can range from 30% to 90% for at least one or more wavelength in the range of 800 nm to 1350 nm, in some cases from 1000 nm to 1550 nm, and in some cases from 850 nm to 2000 nm. Note that quantum efficiency can be directly related to absorption if carriers are not lost to recombination and scattering in the I or low doped region.

Data rate bandwidth can range from 3 Gb/s to 10 Gb/s, in some cases 10 Gb/s to 40 Gb/s, in some cases 25 Gb/s to 50 Gb/s, and in some cases 25 Gb/s to 100 Gb/s or higher when monolithically integrated with CMOS/BiCMOS ASICs.

The structure shown in FIG. 84A can also be used for photovoltaic application where there is no external bias voltage and used for converting light to electrical energy. The high efficiency and the inertness of silicon material can be a good candidate for implant under the skin to power electronics such as heart pacers for example. In addition, the structure in FIG. 84A can also be used for energy harvesting of solar energy and convert to electrical energy. The microstructure holes allow a greater angle of incidence and can efficiently convert sunlight over a more hours during the daylight than conventional silicon solar cells.

FIG. 84B is similar to FIG. 80 except for the etch trench or via 8460 as in FIG. 84A to etch mostly away the silicon dioxide layer beneath the microstructure holes. A depletion isolation trench 8462 can be included if necessary between the anode and cathode and in some cases the depletion isolation trench ring/perimeter can be partially etched through the I or low doped layer and/or through the I or low doped layer into the P charge layer 8428 and/or to the multiplication layer 8426 and/or to the N$^+$ layer 8424. As mentioned earlier, some silicon dioxide may be allowed to remain to provide rigidity in the space left void when the silicon dioxide is removed. In a mesa can be etched and the connecting electrode can be outside the mesa area and supported by dielectric and/or poly/amorphous semiconductor that may or may not be a part of the passivation. In addition to the range of thicknesses and resistivity (or doping concentration) given in FIG. 80, the BOX layer 8408 can have a thickness ranging from 0.1 to 10 microns or more. The N device layer can have a thickness range of 100 nm to 500 nm and can have a resistivity of 1 ohm-cm or less and can be further doped by N type ions such as P and/or As in a FEOL process with resistivity of 0.01 ohm-cm or less, followed by epitaxial growth of N$^+$ Si layer with resistivity of 0.01 ohm-cm or less and in some cases 0.001 ohm-cm or less with thickness ranging from 50 nm to 300 nm. A multiplication layer I or low doped N$^-$ (or P$^-$) 8426 with resistivity of 0.5 ohm-cm or more can have a thickness ranging from 0 to 600 nm. P charge P layer 8428 can have resistivity ranging from 0.3 to 0.06 ohm-cm with thickness ranging from 50 nm to 250 nm. I and/or low doped N$^-$ (or P$^-$) layer 8402 can have thickness ranging from 0.5 to 5 microns and in some cases 0.9 to 2 microns and in some cases 1.2 microns and in some cases 1 micron, with resistivity 1 ohm-cm or greater. A surface P$^+$ well 8484 can be formed by diffusion and/or ion implant of P type ions such as B, Al, Ga, In, and/or C, with resistivity of 0.04 ohm-cm or less. In some cases a thin metal and/or transparent conducting metal oxide such as indium tin oxide can be deposited in top of the P$^+$ well with layer thickness ranging from 1 nm to 500 nm prior to microstructure hole etch. The thickness of the P$^+$ well can range from 0 nm (Schottky contact) to 500 nm and in some cases from 50 nm to 300 nm. In some cases one or more of the layers can be GeSi alloy where the Ge fraction can range from 0 to 1.

Microstructure holes 8412 can be inverted pyramids etched with KOH and/or TMAH anisotropic etch with square microstructure holes with lateral dimensions ranging from 300 nm to 1200 nm and in some cases from 600 nm to 2500 nm with an etch sidewall angle of approximately 54.7 degrees. A period of 900 to 2700 nm. In some cases the side dimensions of the microstructure holes can range from 900 nm to 1200 nm and a period ranging from 1000 nm to 1500 nm with square and/or hexagonal lattices. The microstructure holes 8412 can have other cross sectional shapes such as funnel, cone, cylindrical, trapezoidal, fractal, polygonal, hourglass, keyhole, and any other shapes that can be generated with wet, dry, electrochemical etching. The microstructure holes can be circular, oval, rectangular, square, polygonal, star-shaped, string shaped, or amoeba shaped. In a microstructure-photodetector, dimension of the ms-holes (microstructure holes) can be approximately constant. For example, no changes in the lateral dimensions, depth and spacing, and/or any of the dimensions, lateral dimension, depth and/or spacing, can vary in a systematic manner and/or in a non-systematic manner. For example a random manner and any combination of systematic and non systematic. This can apply to all MSPD, MSAPD, and other ms-photodetectors.

The MSAPD can have a low reverse bias avalanche voltage of less than −30V and reach QE as much as 1300%, in some cases 1000%, in some cases 800%, in some cases 600%, and in some cases 400% at the avalanche voltage. See, e.g., Kang et al 2008. Data rate bandwidth can range from 3 Gb/s to 10 Gb/s, in some cases 10 Gb/s to 40 Gb/s, in some cases 25 Gb/s to 50 Gb/s and in some cases 25 Gb/s to 100 Gb/s or higher when monolithically integrated with CMOS/BiCMOS ASICs.

In some cases, if the MSPD/MSAPD is released from the substrate in regions directly below the ms-holes, the application of an electrostatic voltage between the bottom doped layer (anode or cathode) with respect to the substrate can change the spacing of the air gap between the MSPD/MSAPD and the substrate which can result in a tuning effect of the QE with respect to incident wavelength and may be used to further optimize the QE.

In some cases for LIDAR applications, in any of the MSPDs/MSAPDs described in this disclosure, the I or low doped layer for photon absorption and trapping can have a thickness ranging from 2 to 10 microns or more. In such cases the microstructure holes can be partially etched into the I layer which in some cases can be GeSi with Ge fraction ranging from 0 to 1 and data rate bandwidth can be less than a few Gb/s. Sensitivity (QE or responsivity, gain) and avalanche voltage can be optimized with the addition of microstructure holes that can reduce the overall thickness of the APD structure while still maintaining desired sensitivity as compared to a comparable APD without microstructure holes.

Figure 85:
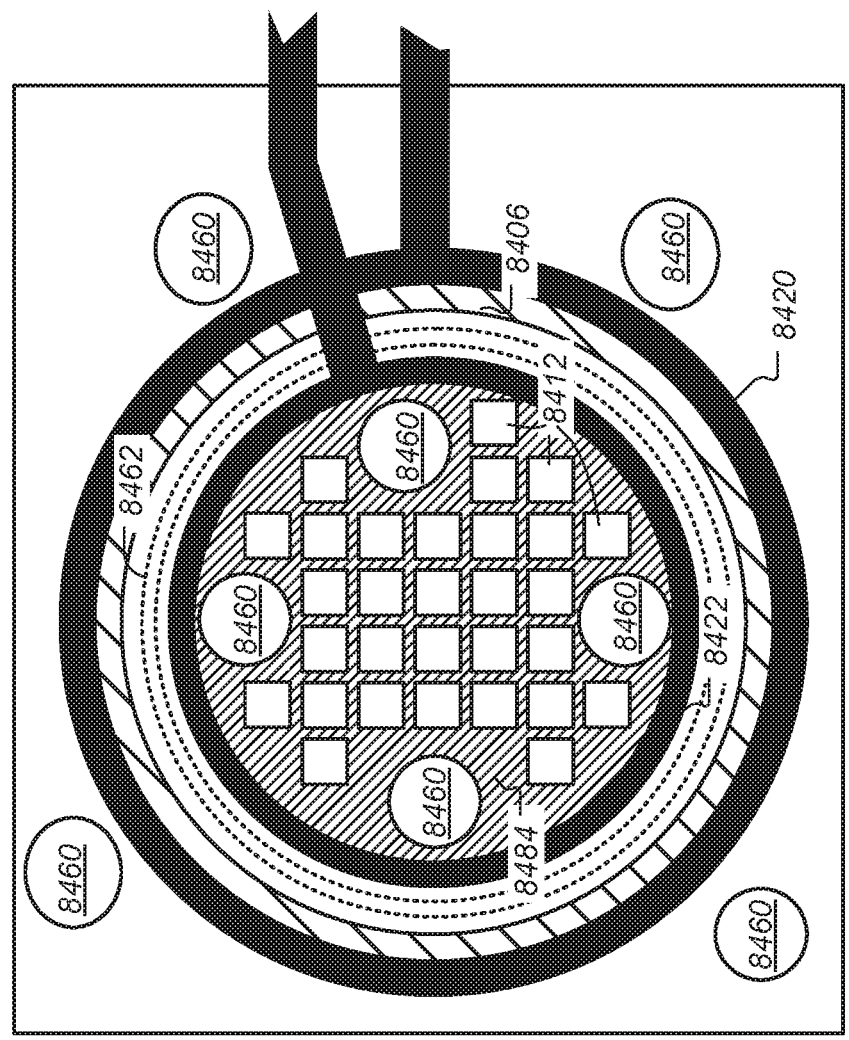
FIG. 85 is a top view of a MSPD/MSAPD integrated with CMOS/BiCMOS, according to some embodiments.

FIG. 85 is a top view of a MSPD/MSAPD integrated with CMOS/BiCMOS, according to some embodiments. In this example the MSPD/MSAPD can be as shown in FIGS. 84A and/or 84B. The inner ohmic contact ring and metallization 8422 and outer ring ohmic contact metallization 8420 are shown connected to transmission lines that are connected to CMOS/BiCMOS ASICs (not shown). A depletion isolation trench 8462 between the anode and cathode rings is also shown in dotted outline. Several examples of etch trench/vias 8460 are shown as outside the ms-photodetector. In some cases the etch trench/via can be inside the ms-photodetector as also shown in FIG. 85. In some cases, the microstructure holes 8412 can be etched to the BOX layer, in which case, the microstructure holes can be used as a conduit for HP based wet etchant to etch mostly away the silicon dioxide material underneath the microstructure holes in which case etch trench/via may not be necessary in this case. The etch trench/vias 8460 can be any shape and dimension from circular to polygon to slice of pie shape and dimensions can range from sub microns to multi microns and perhaps even 10 microns or more. Square microstructure holes 8412 are shown etched into the surface doped region 8484 that can be N$^+$ or P$^+$.

Many structures are not shown for simplicity, such as cross over dielectric isolation, thin metal and/or transparent conducting metal oxide layer, hermetic sealing, and planarization effects. The MSPD/MSAPD can be an array or 2D array that can be monolithically integrated on a single chip with CMOS/BiCMOS ASICs.

FIG. 86 is a plot showing the results of a FDTD simulation of the optical field on inverted pyramid holes on 1 micron thick silicon with air interfaces on both the top and bottom. The microstructure holes have the following dimensions for the simulations: square holes 900 nm on the side; in a square lattice with period 1000 nm (dash curve 8610); and 1200 nm (solid curve 8612) over a wavelength span from 800 nm to 1000 nm. The vertical axis is enhanced absorption in the 1 micron silicon with microstructure holes. Anisotropic wet etch with 54.7 degree (111) plane side walls on (100) silicon surface using KOH and/or TMAH based etchants.

Absorption as high as 90% at 920 nm can be seen in the dash plot 8610 and at 850 nm wavelength the absorption is close to 80%. In a similar structure without ms-holes, the absorption is approximately 5%. The enhancement is 1600%. Absorption without any recombination is directly proportional to QE, and in some cases absorption is equal to QE. Air-semiconductor interfaces for both top and bottom can greatly enhance the QE, and as in high contrast grating the lower the absorption the higher the Q which compensate for the low absorption and the high Q enhance the QE as the wavelength approach the silicon bandgap wavelength of 1100 nm at room temperature. Depending on the period, the QE can range from 20% to over 90% at certain wavelengths in the range 800 nm to 1000 nm. In FIG. 2 of Kang et al 2008, at avalanche voltage, the Ge on Si APD can achieve a QE of 1400% and at lower voltage bias without avalanche gain the QE is approximately 30% which is approximately 46 times gain or approximately a 17 dB gain. With similar layer structure, and with an avalanche gain of 46, the QE of the MSAPD can range from approximately 900% to 4000% at certain wavelengths in the wavelength range 800 nm to 1000 nm for a silicon MSAPD.

This high sensitivity can be useful to LIDAR applications in addition to its low avalanche voltage and wide wavelength span and can be integrated with CMOS/BiCMOS ASICs in 1 D or 2D arrays. The LIDAR chip can comprise the MSAPD CMOS/BiCMOS array and an array of VCSELs for generating short pulses. Other applications include LIFI and other free space optical communications.

The MSPD/MSAPD can be used for both single and multimode fiber for short reach, reach gap (1250-1350 nm), long reach data center applications and high performance computing applications. FTTH (fiber to the home) can also use MSPD/MSAPD integrated with CMOS/BiCMOS ASICs. With Si and GeSi and Ge on Si, all the wavelengths can be covered using MSPD and/or MSAPD with enhanced absorption, thinner layers, lower bias voltages, and higher data rate bandwidths.

A fully integrated MSPD with TIA and other ASICs may resemble structures discussed in Analog Devices Inc. product data sheet, for example, where a SiGe photodiode was integrated with CMOS TIA and other ASICs for 11.3 Gb/s at wavelengths ranging from 1300-1330 nm. With the addition of microstructured holes, the SiGe photodiode I or low doped layer can be made thinner for higher data rate and also the wavelength range can be extended by 100 nm or more and in some cases by 200 nm or more. And in some cases to 1550 nm wavelength or longer. Responsivity can be 0.3 A/W or higher at at least one wavelengths in the wavelength span from 1250 nm to 1550 nm, and in some cases 0.2 A/W or higher at at least one wavelength in the wavelength span from 1250 to 1550 nm. In some cases the SiGe or GeSi MSPD can have a bandwidth of 25 Gb/s and a responsivity of 0.2 A/W or higher at 1550 nm and in some cases the responsivity can be 0.3 A/W or higher and in some cases 0.5 A/w or higher and in some cases 0.6 A/W or higher.

At 1350 nm wavelength, the GeSi MSPD can have a data rate bandwidth of 25 Gb/s or higher and a responsivity of 0.5 A/W or higher and in some cases 0.3 A/W or higher and in some cases 0.6 A/W or higher and in some cases 0.7 A/W or higher.

In some cases, isolation trenches can be filled with dielectrics such as silicon dioxide and/or silicon oxide. The etch via trenches can be filled in some cases with silicon dioxide/oxide for passivation and hermetic and other purposes to improve performances and reliability. In some cases the entire MSPD/MSAPD can be covered with a dielectric layer such as silicon dioxide, or silicon nitride. In some cases silicon dioxide may not be stoichiometric and the oxide may be silicon oxide and may be a mixture of silicon dioxide and silicon oxide.

Figure 87:
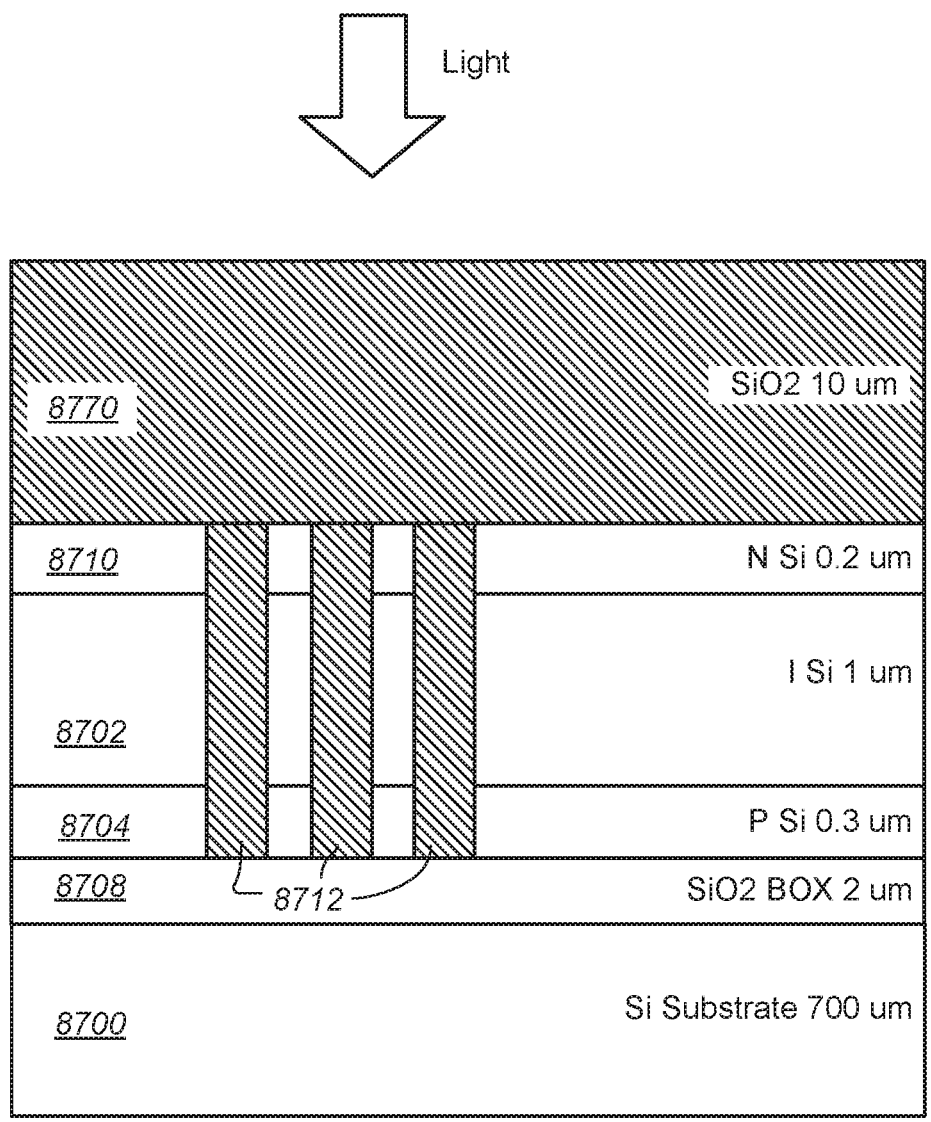
FIG. 87 is a cross section view of a N-I-P photodiode structure on SOI with a BOX layer, according to some embodiments.

FIG. 87 is a cross section view of a N-I-P photodiode structure on SOI with a BOX layer, according to some embodiments. Note that the N and P can be interchanged. Not shown for simplicity are structures such as: anode, cathode contacts, mesas, connecting wells, and isolation trenches. For clarity and simplicity only the microstructure holes and the N-I-P layers (8710, 8702 and 8704, respectively) on BOX 8708 are shown. The microstructure holes 8712 can have a range of size and shapes and depth and spacing as discussed earlier, however for purposes of the simulation shown FIG. 88, infra, the microstructure holes 8712 are circular, 900 nm in diameter with a cylindrical cross section and a period of 1200 nm. The holes 8712 are etched to the BOX layer 8708 and are filled with $SiO_2$ and/or $SiO_x$ and have about 10 microns of silicon dioxide/oxide 8770 on the top surface. In some cases, the microstructure holes 8712 can be partially filled with silicon dioxide/oxide and in some cases the microstructure holes can be partially etched into the I or low doped layer 8702. The BOX layer 8708 is 2 microns, the $P^+$ layer 8704 is 0.3 microns, the I or low doped layer 8702 is 1 micron and the $N^+$ layer 8710 is 0.2 microns. 10 microns of silicon dioxide 8770 is on top of the surface covering the microstructure holes for the FDTD simulation shown in FIG. 88, infra, of the optical field incident from the top surface. Other range of thickness can be used, the $P^+$ can range from 0.1 to 0.5 microns, the I or low doped layer can range from 0.5 to 5 microns and the $N^+$ layer can range from 0.1 to 0.5 microns. The dielectric in the hole and on the surface can be silicon oxide and/or dioxide, silicon nitride, and/or other insulating dielectrics that can be polymer for example and the thickness can range from 0 to 20 microns. The microstructure holes can be fully and/or partially filled with dielectrics.

In some cases, the microstructure holes can be formed partially in and/or through the I or low doped layer and in some cases the microstructure holes can be in the top P or N layer. The holes can be trapezoidal and/or any other shapes such as inverted pyramids and partially and/or fully filled with silicon oxide and/or dioxide.

In some cases, one or more of the layers can be GeSi where the Ge fraction can vary from 0 to 1 where 0 is pure silicon and 1 is pure germanium.

Figure 88:
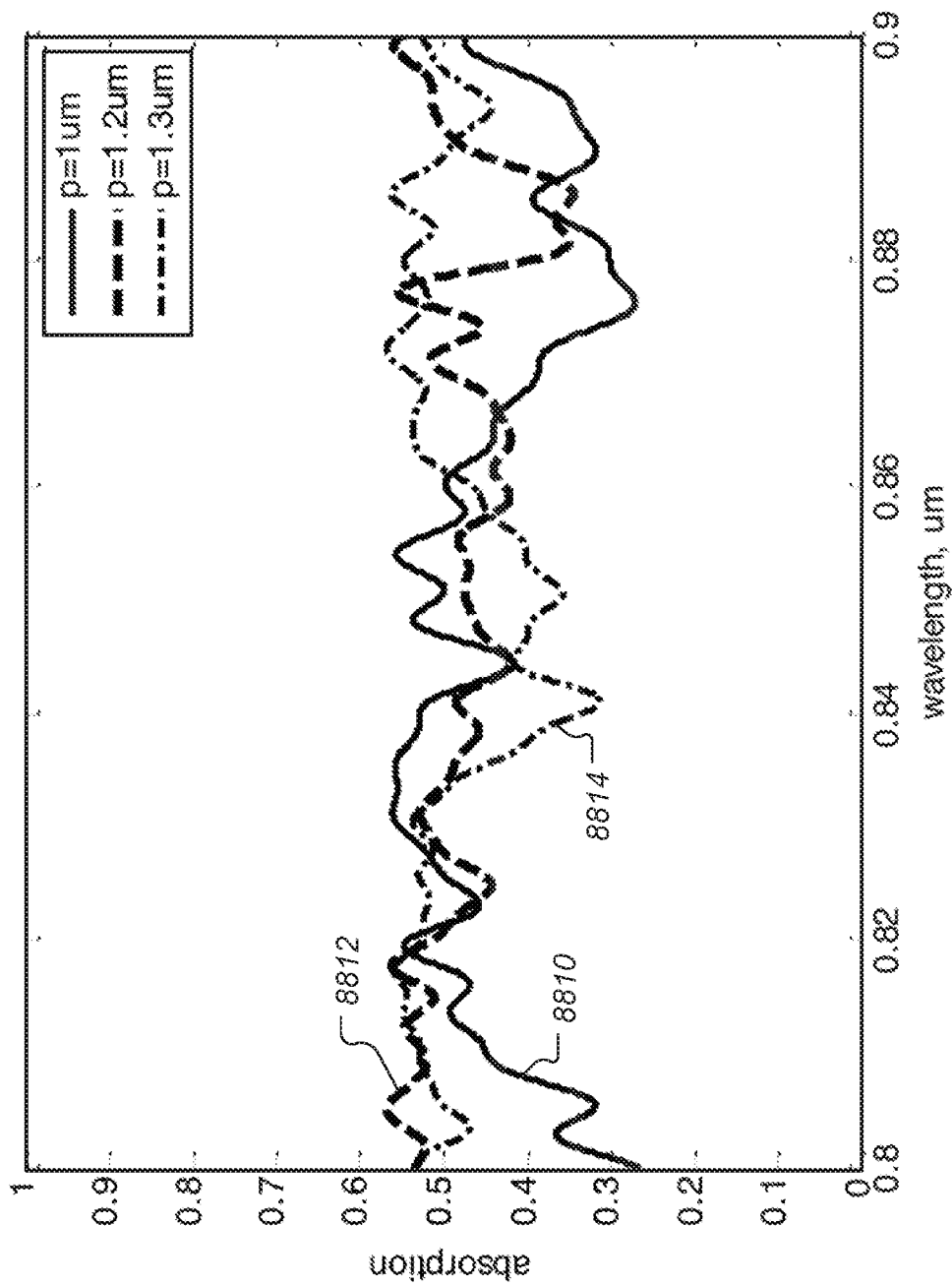
FIG. 88 is a plot showing a FDTD simulation of absorption of the incident photons in the I or low doped layer as a function of wavelength from 800-900 nm for the structure shown in FIG. 87.

FIG. 88 is a plot showing a FDTD simulation of absorption of the incident photons in the I or low doped layer as a function of wavelength from 800-900 nm for the structure shown in FIG. 87. Absorption can be directly proportional to quantum efficiency if all the photogenerated carriers are converted to external current. With an external reverse bias establishing a high electric field in the I or low doped region, most of the photogenerated carriers can be swept to the anode or cathode before the photogenerated carriers can recombine, therefore under these conditions absorption can be equated to quantum efficiency. Three plots are shown in FIG. 88 with periods of 1000 nm (curve 8810), 1200 nm (curve 8812) and 1300 nm (curve 8814). Absorption in the I or low doped layer or QE can be 50% at certain wavelength ranges for certain periods. For example, for 850 nm and with a period of 1000 nm with 900 nm diameter microstructure holes the QE can be 50% and at 880 nm wavelength the QE can be 50% with period of 1300 nm and with microstructure hole diameter of 900 nm. In an array of monolithically integrated MSPD/MSAPD with CMOS/BiCMOS ASICs, each photodiode can be optimized for certain wavelengths by having different periods and/or hole diameter and/or hole etch depth.

According to some embodiments of the present disclosure, the use of micro/nano structure holes enables the enhancement of absorption where the absorption of the material is weak, especially at wavelengths near the bandgap for indirect bandgap semiconductors such as silicon and germanium. By enhancing absorption, thinner layers can be used to achieve higher data rate bandwidth with good quantum efficiency and also lower bias voltages for microstructure avalanche photodiodes.

Usable wavelengths for Si MSPD can be extended to 1000 nm. See, e.g.; Gao et al, High Speed Surface Illuminated Si Photodiode Using Microstructured Holes for Absorption Enhancements at 900-1000 nm Wavelength, DOI: 10.1021/acsphotonics.7b00486 (incorporated herein by reference). This is a is a wider range than GaAs based photodiodes.

In some cases, a BOX layer is desirable when the wavelength is above bandgap wavelength of silicon since a BOX layer and/or other methods, as discussed earlier, disrupts the photogenerated carriers in the substrate from diffusing slowly back to the high field region in the I or low doped layer under reverse bias. The phenomenon of the carriers diffusing back could result in a slow tail in the response of the MSPD/MSAPD that can degrade the data rate bandwidth of the MSPD/MSAPD. For optical signal wavelengths that are below the bandgap wavelength of silicon, the silicon can be mostly transparent and will not generate significant photocarriers in the substrate and the BOX and/or methods to disrupt the lifetime and/or diffusion of photogenerated carriers back to the high field region is less important and may not be provided. GeSi and/or Ge on Si I or low doped layers that absorb in the wavelength region near and/or below the bandgap wavelength of silicon will generate insignificant amount of photocarriers in the silicon substrate and therefore not cause a degradation of the data rate bandwidth of the MSPD/MSAPD.

However in both cases, above or below the bandgap wavelength of silicon, a BOX and/or where the BOX is etched mostly away under the microstructured holes, will provide a reflection at the semiconductor-dielectric and/or semiconductor-air interface to result in a higher quantum efficiency which is desirable for MSPD/MSAPD devices.

In some cases, a buried O or N ion implant such as for layer 8314 of FIG. 83 can be implemented in a FEOL process prior to MSPD/MSAPD layer structure growth to improve the QE. In some cases the buried oxide and/or nitride layer can be etched entirely and/or partially away in regions under the microstructure holes by either using the microstructure holes itself as a etching conduits and/or a separate etching trench as discussed earlier to remove fully and/or partially the buried oxide and/or nitride regions under the microstructure holes. Other buried layers can be formed using ion species other than O and/or N such that the buried region can be selectively etched away fully and/or partially to allow a semiconductor-air interface.

Figure 89:
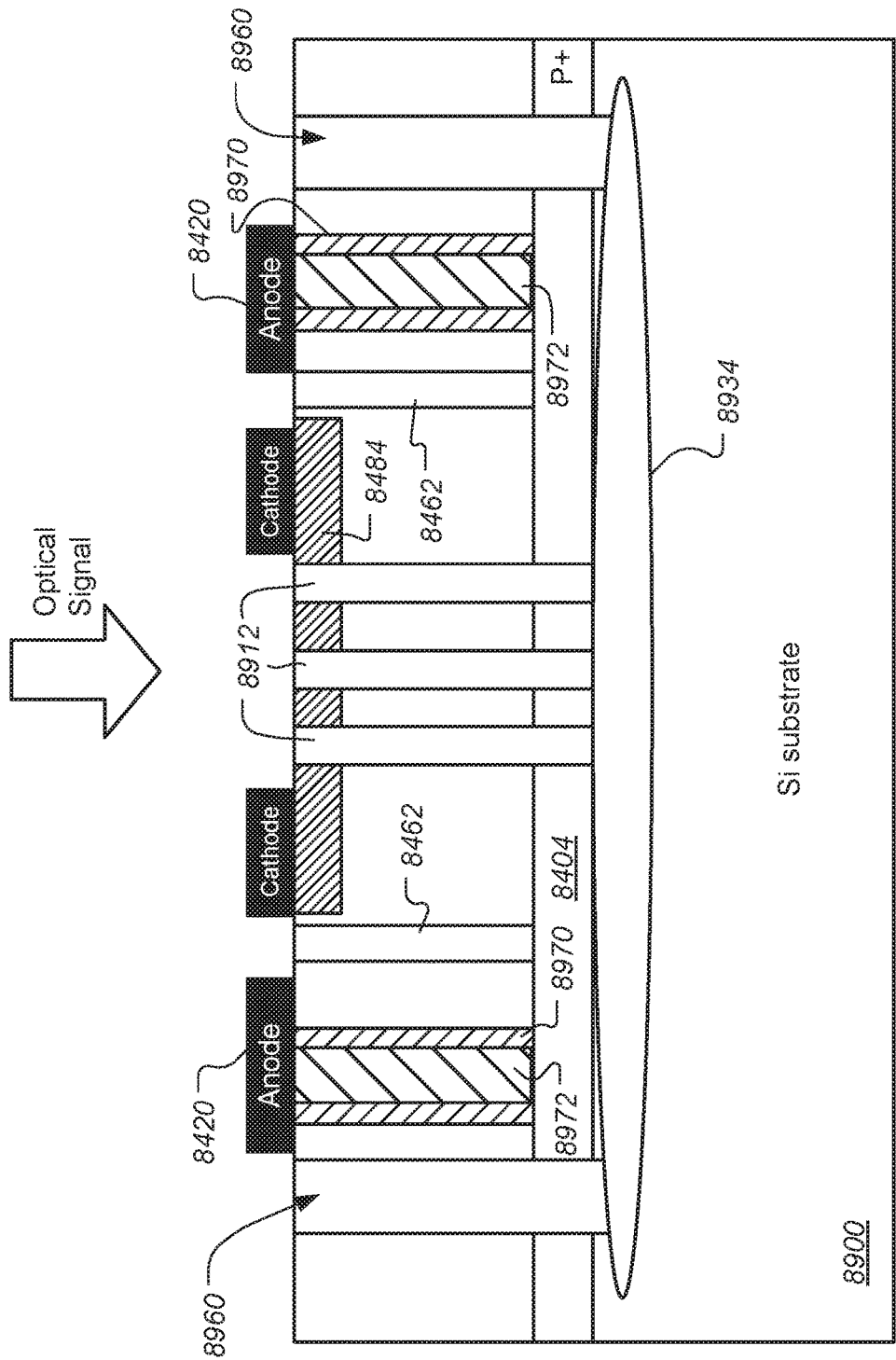
FIG. 89 is a cross section view of an MSPD, according to some embodiments.

FIG. 89 is a cross section view of an MSPD, according to some embodiments. The structure is similar to that shown in FIG. 84A except it is not formed on a SOI wafer. A FEOL process on a bulk silicon wafer 8900, P type in this example (but can be N type with P and N interchanged) implants buried O and/or N ions to create a buried mostly oxide and/or mostly nitride region 8934. This region 8934 can be used to provide a refractive index difference between the silicon and region 8934 that reflects light back to the microstructure holes for further absorption enhancement. In addition, for above bandgap optical signal radiation, this region can also inhibit the diffusion of photogenerated carriers in the substrate from diffusing back to the high field region in the I or low doped region that has a reverse bias applied.

In some cases the mostly oxide and/or nitride region 8934 can be selectively etched by dry and/or wet and/or vapor mostly and/or entirely away so that the region below the microstructure holes can be mostly and/or entirely air such that the optical field impinging from the from surface travelling through the semiconductor sees a semiconductor-air interface at the bottom beneath the microstructure holes 8912. This can provide a higher refractive index contrast and can result in a higher percentage of reflecting optical signal and/or light. The buried oxide and/or nitride 8934 can be etched through the microstructure holes 8912 if the microstructure holes are etched all the way to the buried oxide and/or nitride region. In some cases the holes 8912 can be etched past the buried region 8934. As shown in FIG. 89, cylindrical microstructure holes 8912 are etched to the buried oxide and/or nitride region 8934. In some cases, as in FIG. 84A where the microstructure holes are not etched to the buried oxide and/or nitride region, etch trenches 8960 can be used to etch the buried oxide and/or nitride region as shown.

In some cases, instead of a highly doped connecting well, a deep trench with oxide 8970 on its sidewalls and the center can have conducting silicide 8972 and/or metal as shown in FIG. 89 which is similar to Kang et al 2008.

The FEOL buried oxide and/or nitride can be formed by a selective area ion implantation. In some cases other species of ions can also be used to generate a buried region that can be selectively etched to create a buried cavity.

In FIGS. 84A/B and 89, the microstructure holes as in other MSPD/MSAPD structures can have cross sectional shapes such as cylindrical, funnel, cone, inverted pyramids, trapezoidal, hourglass, ball-like, or a combination of shapes. The holes can have a diameter ranging from 300 nm to 3000 nm with spacing ranging from 50 nm to 5000 nm. The spacing can be periodic, aperiodic, random or a combination of periodic, aperiodic and random. The depth of the microstructure holes can range from 50 nm to 10000 nm. In some cases the microstructure holes can be on a superstrate and do not penetrate the photodetector structure. The superstrate can be a high K dielectric such as hafnium oxide and in some cases not a high K dielectric. In some cases the superstrate can be another semiconductor, in some cases the superstrate can be transparent conducting metal oxide, in some cases can be a dielectric and in some cases it can be metal and/or conducting material. In some cases the superstrate can be a combination of dielectric, semiconductor, a conducting material such as metal and/or metal like, polymer and/or conducting polymer. In some cases a superstrate with microstructure holes on top of photodiode and avalanche photodiode can be used without the microstructure holes penetrating the photodetector structure. And in some cases the microstructure holes can penetrate both the superstrate and the photodetector structure and in some cases the holes in the superstrate and the photodetectors are not the same.

In some cases microstructure holes can be used to enhance the absorption of direct bandgap materials such as materials in the III-V family in cases where the absorbing layer is thin to the point where the absorption efficiency is poor. For example, GaAs at 850 nm wavelength and with the absorbing I or low doped layer of 1 micron or less, the QE can be 40% or less. The addition of microstructure holes can increase the QE by a factor of 2 or more. The same principle can be applied to other material in the III-V family such as InGaAs, InP, InGaAsP, AlGaAs, GaN, InN, AlGaN, InGaN, and AlN. The thin I or low doped layer is important for high bandwidth operation of the photodiode and/or avalanche photodiode. In addition, other material such as a-Si, polymers, CdS, can also benefit from the absorption enhancement of the microstructure holes for imaging, night vision scopes, and LIDAR. Wavelengths can range from 800 nm to 2000 nm depending on the material system. Enhancement of absorption and/or quantum efficiency can be a factor of 1.1 or greater and in some cases factor of 2 or greater for structures with microstructure holes over devices without microstructure holes, for absorbing layer(s) that have QE of 50% or less, in some cases 40% or less and in some cases 20% or less. The low QE can be due to the absorbing layer being 1 micron or less in thickness, in some cases 2 microns or less in thickness, and in some cases 5 microns or less in thickness.

According to some embodiments of this disclosure, using microstructure holes for enhancing absorption in a reverse biased photodiode can be applied to both indirect bandgap material and/or direct bandgap material and also other materials such as a-Si, a-Ge, A-GeSi, graphene, photosensitive polymers, and semiconducting oxides.

In some cases, in a forward biased diode application, the microstructure holes can enhance the interaction of photons with the gain in a material. For example, microstructure holes in a vertical cavity surface emitting laser can enhance the photon-gain interaction that can result in a more efficient laser and/or higher modulation bandwidth laser. In some cases, the microstructure holes can enhance the light output of a light emitting diode and/or the modulation rate of a light emitting diode.

As in the case of MSPD, microstructure holes can be etched through the P or N region and into or through the I or low doped region of a vertical cavity surface emitting laser and/or a light emitting diode. Applications include LIDAR laser arrays, detector arrays, lighting, LIFI, data centers, high performance computer, fiber to the home, and enterprise.

Figure 90:
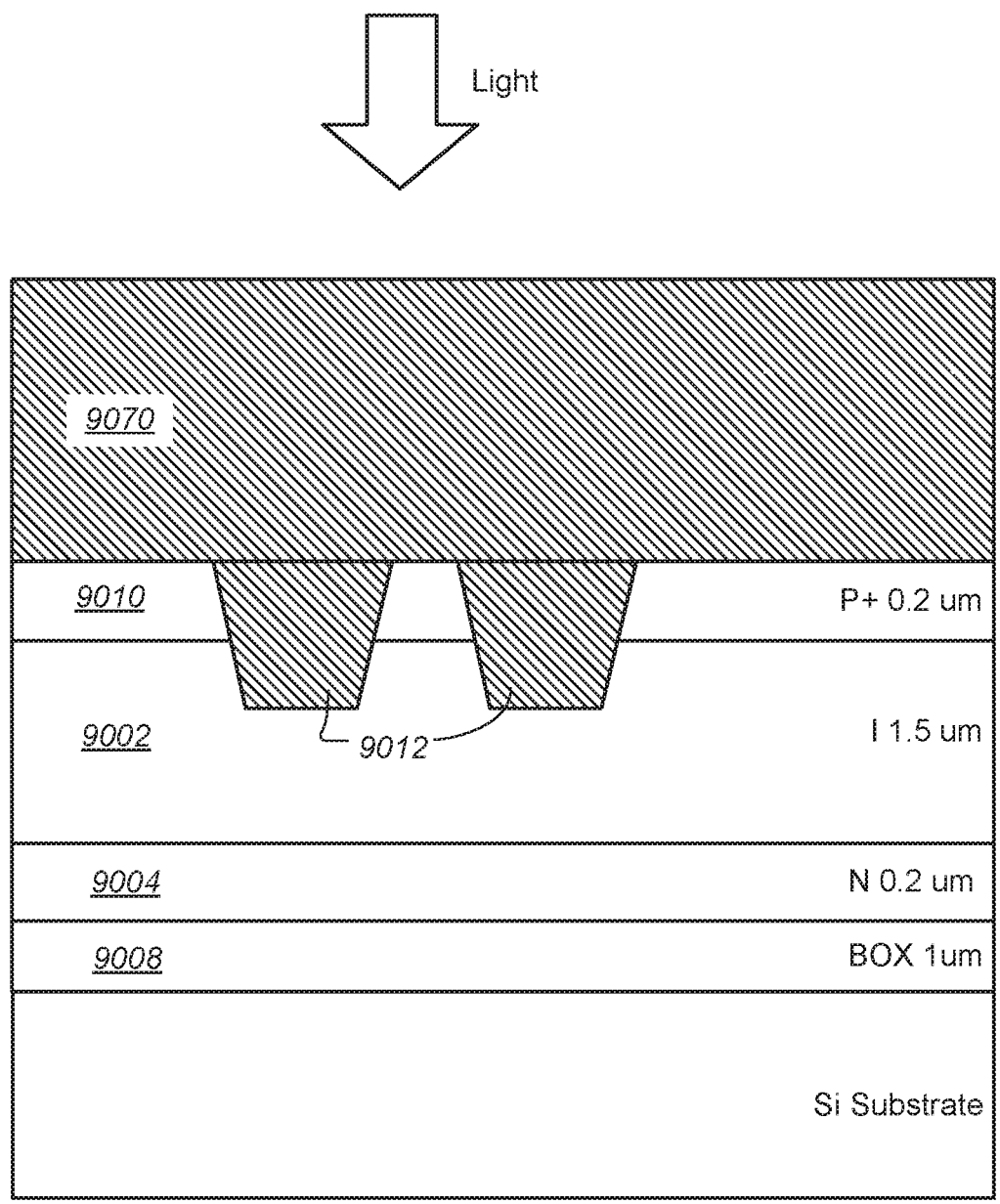
FIG. 90 is a cross section view of a MSPD PIN structure that can be monolithically integrated with CMOS/BiCMOS ASICs on a SOI wafer, according to some embodiments.

FIG. 90 is a cross section view of a MSPD PIN structure that can be monolithically integrated with CMOS/BiCMOS ASICs on a SOI wafer, according to some embodiments. Note that the CMOS/BiCMOS ASICs are not shown. In this example, the PIN layer thicknesses are approximately 0.2, 1.5 and 0.2 microns respectively and with resistivity of 0.1 ohm-cm or less for the P and N regions and 1 ohm-cm or greater for the I or low doped region 9002. The thicknesses of the P region 9010 and N region 9004 can vary from 0.05 to 0.5 microns and the thickness of the I or low doped region 9002 can vary from 0.4 to 5 microns. In this example for FDTD simulation of the optical field as it impinges from the top surface (shown in FIG. 91, infra), the microstructure holes 9012 are square with a side dimension of 900 nm and with a period of 1200 and 1300 nm in a square lattice. The cross section of the holes are trapezoidal, with a side wall angle of approximately 70 degrees and are filled with silicon dioxide to a thickness of 10 microns above the surface. The microstructure holes are etched to 0.3 and 0.5 microns. The BOX layer 9008 is 1 micron. In some cases, the microstructure holes 9012 can have other cross sectional shapes such as cylindrical, funnel, cone, inverted pyramids, fractal, hourglass, square, polygonal, trapezoidal with side wall angle ranging from about 160 to 20 degrees, or a combination of shapes. The plan view shapes of the holes can shapes such as circular, oval, rectangular, square, triangular, hexagonal, polygonal, hourglass-shaped, amoeba shaped, star shaped, or fractal shaped. The lateral dimensions at the surface can range from 300 nm to 3000 nm or more. Spacing can range from 50 nm to 5000 nm or more. The spacing can be random, periodic, aperiodic or a combination. The microstructure hole depths can range from 50 nm to 10000 nm or more and in some cases microstructure holes are not etched in the PIN, NIP, PIPIN, PIPN, NINIP, NINP layer structures but rather on a superstrate above the photodetectors. The silicon dioxide can be other dielectrics such as silicon oxide, silicon nitride, hafnium oxide, polymer, and/or any combination of dielectrics and can be fully and/or partially filling the microstructure holes and can be on the surface with thicknesses ranging from 0 to 10 microns or more, as depicted in FIG. 90 as layer 9070.

In some cases the microstructure holes 9012 are passivated and not filled with dielectric and in some cases the microstructure holes are passivated and filled fully and/or partially with dielectrics.

For simplicity, anode, cathode, connecting wells, connecting electrodes, passivation, anti reflection coatings, transmission lines to CMOS/BiCMOS ASICs and other components are not shown.

Figure 91:
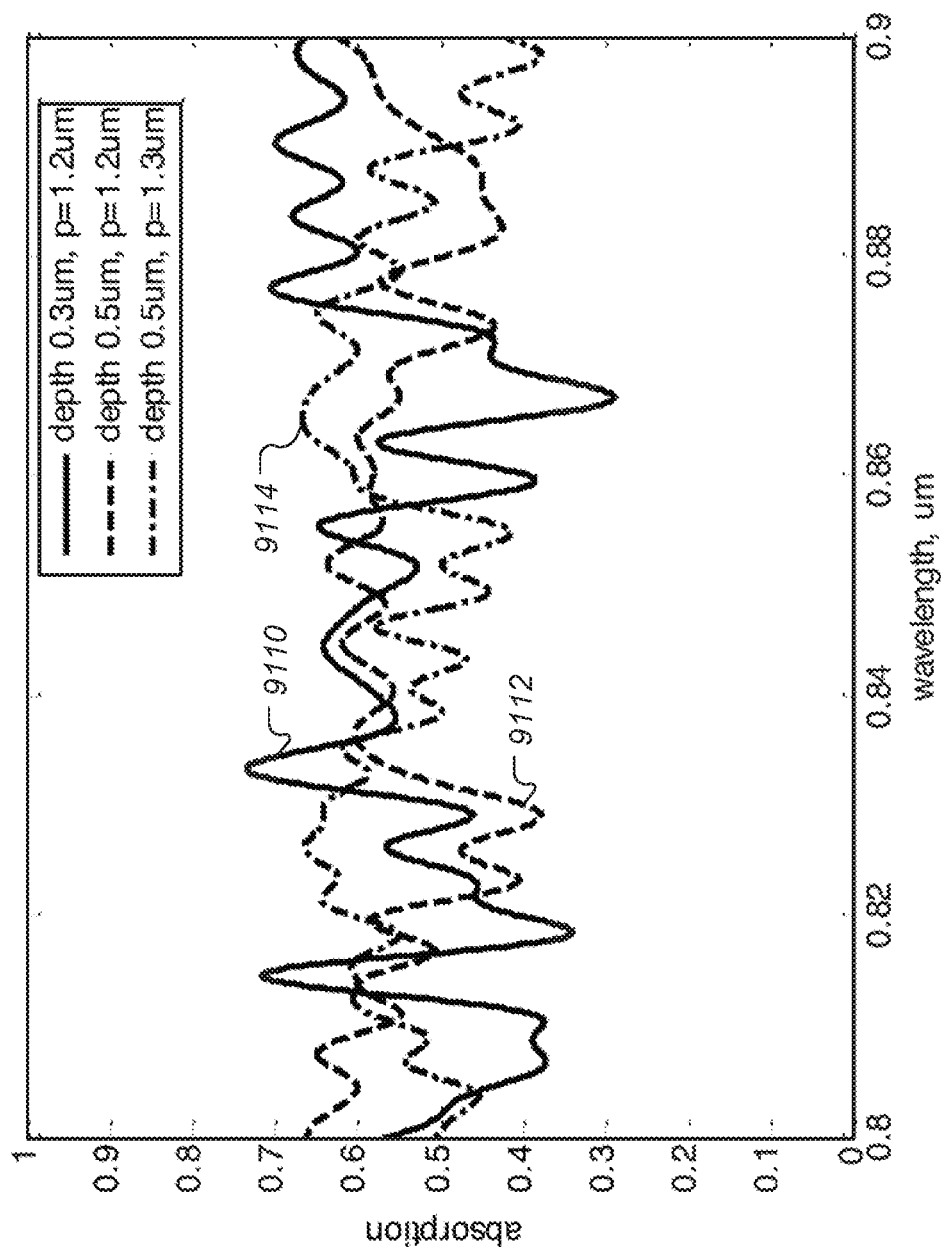
FIG. 91 is a plot showing a FDTD simulation of the optical field from 800-900 nm wavelength impinging on the top surface of a structure shown in FIG. 90.

FIG. 91 is a plot showing a FDTD simulation of the optical field from 800-900 nm wavelength impinging on the top surface of a structure shown in FIG. 90. The vertical axis shows the absorption of the photons in the I or low doped region 9002 (shown in FIG. 90) that is directly proportional to QE and in some cases without recombination and/or scattering, equivalent to QE. The horizontal axis is the incoming optical signal or light wavelength from 800-900 nm. The microstructure holes are square with 900 nm sides in a square lattice with period of 1200 nm and 1300 nm and the ms-holes are etched to 0.3 and 0.5 microns deep and filled with $SiO_2$ and have $SiO_2$ above the surface to a thickness of 10 microns. Curves 9110, 9112 and 9114 represent the hole depth and periods according to inset legend. The absorption in the I or low doped layer and/or the QE of the MSPD can be 50% or greater at 850 nm for both 0.3 and 0.5 etch depth and with period of 1200 nm. At 880-900 nm wavelengths the QE can be 60% or higher. The QE range from approximately 30 to 60% over the wavelength span and where at some wavelengths the QE can be as high as 60% or higher. This can be a factor of 2-10 or more higher than a comparable PIN photodiode without microstructure holes.

Figure 92:
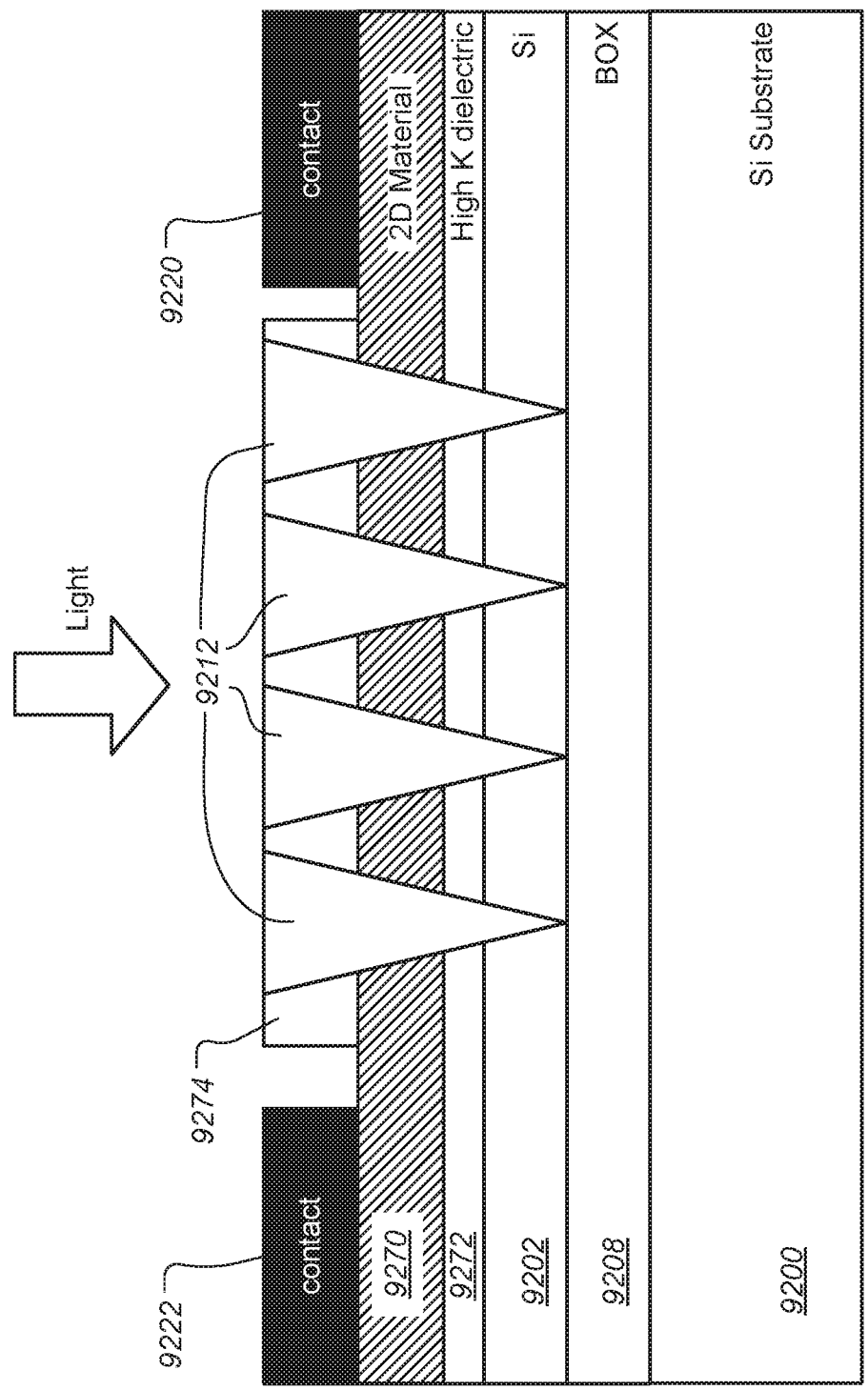
FIG. 92 is a cross section view of a two-dimensional (2D) material photodetector that can have an absorption enhancement by employing micro and/or nano holes for photon trapping, according to some embodiments.

FIG. 92 is a cross section view of a two-dimensional (2D) material photodetector that can have an absorption enhancement by employing micro and/or nano holes for photon trapping, according to some embodiments. In this example, the 2D material 9270 can be as discussed in Fiori et al, Electronics based on two-dimensional materials, PUBLISHED ONLINE: 6 Oct. 2014 | DOI: 10.1038/NNANO.2014.207 (incorporated herein by reference); Ref. Molle et al, Buckled two-dimensional Xene sheets, PUB- LISHED ONLINE: 16 Jan. 2017 | DOI: 10.1038/ NMAT4802 (incorporated herein by reference); and Ref. Mak et al, Photonics and optoelectronics of 2D semiconductor transition metal dichalcogenides, PUBLISHED ONLINE: 31 Mar. 2016 | DOI: 10.1038/NPHOTON.2015.282 (incorporated herein by reference). The 2D material 9270 can be sandwiched between two structures 9272 and 9274 with micro and/or nano holes 9212 for photon trapping and where the material in 9272 and 9274 can be high K dielectrics such as hafnium oxide and in some cases can be non high K dielectrics. The photon trapping structure can enhance the quantum efficiency of the 2D material for detecting photons in the wavelength range of visible to infrared to far infrared. Contacts 9220 and 9222 are make to the 2D material and a voltage and/or current bias can be applied to the contacts for collecting the photogenerated carriers in the 2D material and in some cases no bias need to be applied when operating in a photovoltaic mode. In some cases the 2D material can be stacked with spacer layers of dielectric and contacts can be made to each layer to further improve the QE of the 2D material photodetector efficiency. The micro/nano structure holes 9212 can extend through the 2D material 9270 and/or in some cases not extend through the 2D material and only in the top and/or bottom dielectric and/or silicon 9202. The nano/micro structure holes 9212 can have lateral surface dimensions ranging from 30 nm to 5000 nm or more and spacing between the nano micro structure holes can range from 10 nm to 10000 nm or more. The holes can be shaped as a circle, oval, square, polygon, hourglass, fractal, amoeba, star or a combination of shapes. The cross section of the micro nanoholes can be cylindrical, funnel, cone, inverted pyramids, trapezoidal, fractal, and any other cross sections or combinations that can be achieved by dry, wet, electrochemical, focused ion beam, vapor or any other etching and combination of etching methods. Other layers not shown can include thin metal, amorphous semiconductor, III-V semiconductor, conducting and/or insulating polymers, glass, doped glass. In some cases, the 2D photodetector arrays and/or stacked arrays can be monolithically integrated with CMOS and/or BiCMOS electronics. In some cases the 2D material can be functionalize to detect chemical species where the QE can change with such detection such that the output voltage and/or current from the contacts can change under a constant illumination of light at certain wavelengths. A superstrate 9274 can be used where the micro/nano microstructure holes can be etched without penetrating the 2D material and where the superstrate can be a dielectric and/or semiconductor and/or conductor and any combination thereof. In some cases only the substrate 9200 have micro nano holes and the substrate can be conducting, dielectric, semiconducting and/or any combination thereof.

Figure 93:
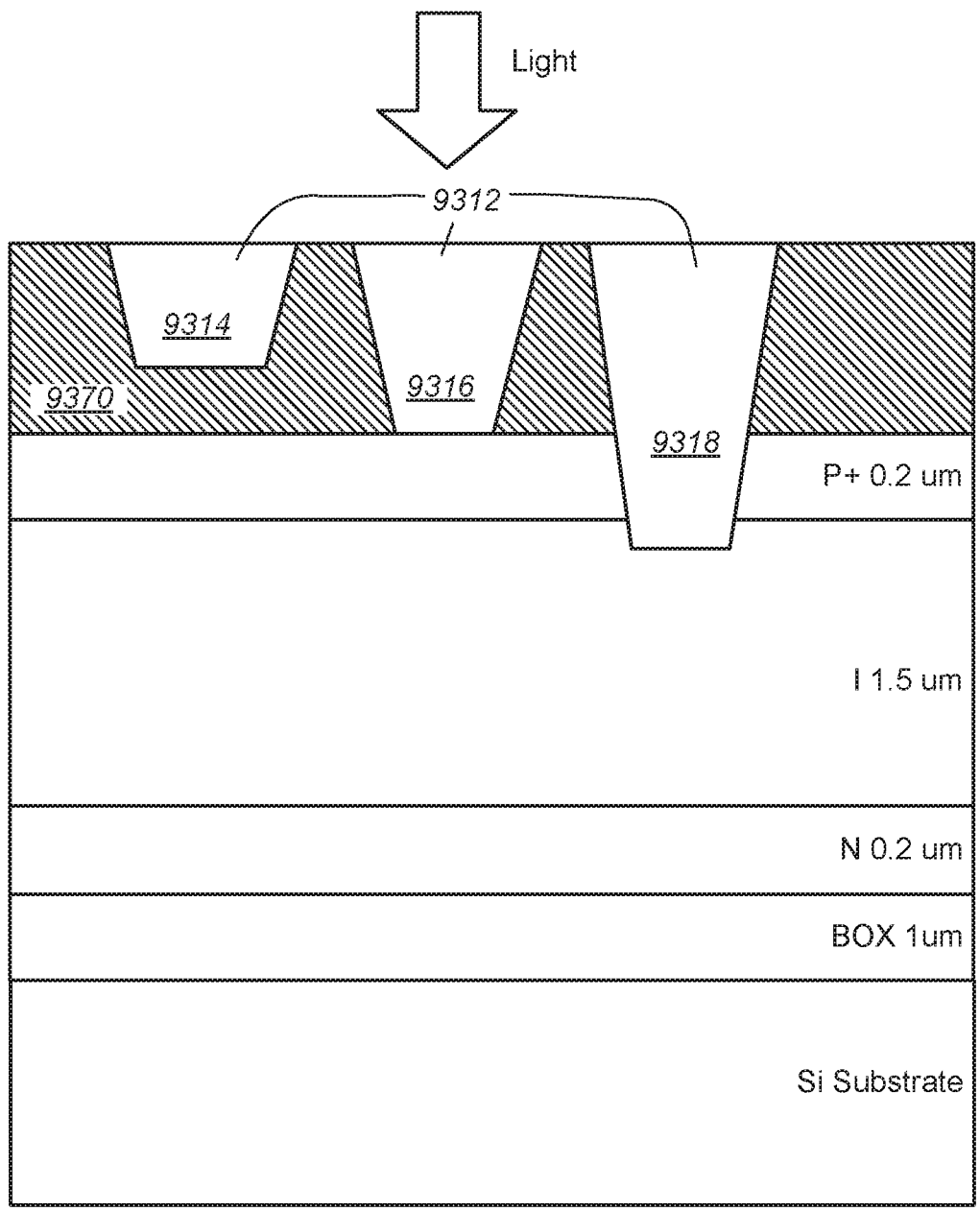
FIG. 93 is a cross section view of a MSPD PIN structure similar to that shown in FIG. 90, according to some embodiments.

FIG. 93 is a cross section view of a MSPD PIN structure similar to that shown in FIG. 90, according to some embodiments. The structure is also similar to those described elsewhere herein of microstructure holes on superstrates in contact with an MSPD/MSAPD. FIG. 93 shows a simple partial cross section schematic of a PIN photodiode structure on SOI wafer that can be monolithically integrated with CMOS and/or BiCMOS electronics. The electronics can include a TIA(s) and/or other ASICs for applications in datacenters, LIDAR, HPC, other optical purposes and/or imaging purposes. The PIN thicknesses are shown for simulation purposes and can range from, N layer 0.05 to 0.5 microns, I layer 0.5 to 5 microns and P 0.05 to 0.5 microns. The N and P layer can have resistivities of 0.1 ohm-cm or less and the I or low doped layer can have resistivity of 1 ohm-cm or more. The top P layer (or N layer if P and N are interchanged) can have a thin metal layer and/or transparent conducting metal oxide layer with thicknesses ranging from 1 nm to 100 nm or more. A dielectric layer 9370 can be deposited on the top surface and can be a high K dielectric layer(s) and/or silicon oxide and/or silicon nitride layer(s) and/or polymer layer(s) and/or spin on glass layer(s), with thicknesses ranging from 0.1 to 10 microns or more. Microstructure holes (and/or nanostructure holes) 9312 can be etched into the dielectric partially (9314) and/or entirely (9316) and/or through the dielectric and into the semiconductor (9318). Etch depth of the microstructure holes can range from 50 nm to 6000 nm or more. Microstructure hole lateral dimensions can range from 200 nm to 5000 nm and spacing between microstructure holes can range from 50 nm to 5000 nm. The spacing can be periodic, aperiodic, random or a combination thereof. Microstructure holes 9312 can be circular, oval, cross, polygonal, square, or amoeba shaped. The cross section can be shaped as a cylinder, funnel, cone, fishbowl, trapezoidal, box, inverted pyramid, or combination thereof. In some cases, the structure can be an avalanche diode of PIPIN or NINIP or PIPN or NINP. In some cases one or more of the layers can be GeSi with Ge fraction ranging from 0 to 1.

In some cases the BOX layer may not be necessary when the photon energy is below or near the bandgap energy of silicon where photogenerated carriers outside the high field region and in the silicon region can be less significant. In some cases the BOX layer can be etched partially and/or completely away in regions under the microstructure holes approximately and can extend beyond the regions under the microstructure holes as discussed earlier for example. As discussed earlier, MSPD, MSAPD with BOX layers can have the BOX layer etched partially and/or entirely away in regions under the microstructure holes by using etch trenches for example. The BOX and/or semiconductor-air interface can provide a higher enhancement of the absorption due to reflection at the semiconductor-dielectric and/or semiconductor-air interface.

The operational wavelength can range from 800-1000 nm, in some cases from 850 nm to 1250 nm, in some cases from 1250-1350 nm, in some cases from 1350 to 1550 nm, in some cases from 1350 nm to 2000 nm, in some cases from 950 nm to 1200 nm, in some cases 900 nm to 1350 nm and in some cases from 840 nm to 1350 nm. QE can be 30% or higher at at least some wavelengths in the span. In some cases QE can be 50% or higher at at least some wavelengths in the span, and in some cases the QE can be 70% or higher at some wavelengths in the span. Data rate can range from 1 to 100 Gb/s, in some cases 10 to 25 Gb/s, in some cases from 25-50 Gb/s and in some cases 60 Gb/s or higher.

Not shown are the anode, cathodes, connecting electrodes/wells, transmission lines to the CMOS/BiCMOS electronics, passivations, antireflections, and other necessary elements to complete a working and operational photodetector integrated with silicon electronics. A reverse bias is applied between the anode and cathode. The MSPD/MSAPD can be monolithically integrated with silicon electronics for applications in optical interconnects, LIDAR, image processing for example.

Figure 94:
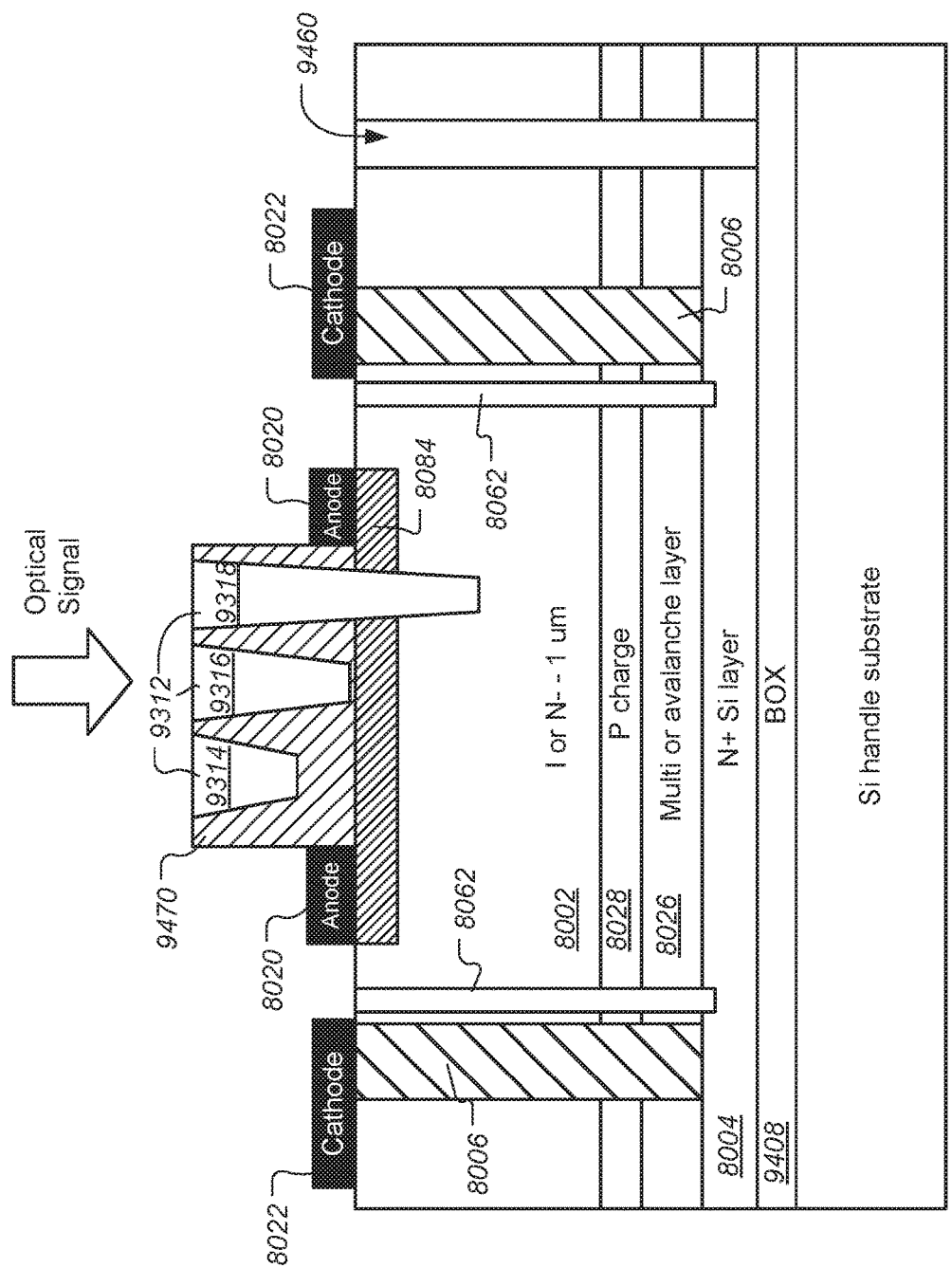
FIG. 94 is cross section showing a structure similar to FIG. 80 except with the addition of a superstrate as shown in FIG. 93.

FIG. 94 is cross section showing a structure similar to FIG. 80 except with the addition of a superstrate as shown in FIG. 93. In some cases, a BOX etch trench can also be provided. The superstrate 9470 as in FIG. 93 can be a high K dielectric such as hafnium oxide and/or simply silicon oxide and/or silicon nitride and/or polymer with similar thickness ranges and microstructure hole ranges and parameters as in FIG. 93. In addition, as in FIG. 93, a thin metal and/or transparent conducting metal oxide can be added to the top surface of the P layer 8084. BOX etch trenches 9460 can be included for etching the BOX layer 9408 partially and/or entirely away in regions under the microstructure holes 9312 and vicinity. And in some cases the BOX layer 9408 may not be provided. In some cases, one or more layers can be GeSi where the Ge fraction can range from 0 (all silicon) to 1 (all germanium). Not shown are passivations, transmission lines to CMOS/BiCMOS electronics that can be monolithically integrated with the MSAPD.

The operational wavelength can range from 800-1000 nm, in some cases from 850 nm to 1250 nm, in some cases from 1250-1350 nm, in some cases from 1350 to 1550 nm, in some cases from 1350 nm to 2000 nm, in some cases from 950 nm to 1200 nm, in some cases 900 nm to 1350 nm, and in some cases from 840 nm to 1350 nm. QE can be 60% or higher at at least some wavelengths in the span, in some cases QE can be 90% or higher at at least some wavelengths in the span, and in some cases the QE can be 150% or higher at some wavelengths in the span. Avalanche gain can range from 2-20 dB or more with reverse bias voltage applied to the anode and cathode ranging from −10 to −45 volts and in some cases to −50V.

Data rate can range from 1 to 100 Gb/s, in some cases 10 to 25 Gb/s, in some cases from 25-50 Gb/s, and in some cases 60 Gb/s or higher.

Not shown are the CMOS/BiCMOS ASICs. The MSPD/MSAPD can be monolithically integrated with CMOS/BiCMOS ASICs in arrays for parallel optical and/or for CWDM optical communication, for LIDAR, for imaging processing applications and/or other sensor applications. For LIDAR applications, see, e.g., Takai et al, Single-Photon Avalanche Diode with Enhanced NIR-Sensitivity for Automotive LIDAR Systems, Sensors 2016, 16, 459; doi: 10.3390/s16040459 (incorporated herein by reference).

In some cases, the superstrate 9484 can be crystalline and/or non-crystalline, can be epitaxially deposited on the MSPD/MSAPD structure and/or deposited by other methods such as e-beam deposition, chemical vapor deposition, plasma enhanced chemical vapor deposition, and sputtering. The superstrate 9484 can be spun on such as spin-on-glass and/or polymer. The superstrate 9484 could also be bonded to the photodetector assembly by soldering, by Van Der Waals force such as lift-off epitaxy where thin layers are held together by Van Der Waals force, and/or by wafer bonding where pressure and heat can be applied to bond the superstrate to the semiconductor comprising the photodetector. Other methods may include gluing the superstrate to the semiconductor. In addition to microstructure holes 9312 and/or pillars on the superstrate for absorption enhancement by providing some lateral propagating and/or standing and/or leaky and/or evanescent and/or non propagating and/or radiating optical modes in the semiconductor for example can enhance the absorption at certain wavelengths. The dimension of the microstructure holes and/or pillars can range from 100 nm to 50000 nm and the spacing between the microstructure holes and/or pillars can range from 100 nm to 5000 nm depending on the operational wavelengths which can range from 500 nm to 10000 nm. The depth of the microstructure holes and/or pillars can range from 30 nm to 10000 nm. The holes can have cross sections that are in the shapes of a funnel, cone, cylindrical, rectangle, polygon, inverted bell, inverted pyramid, hourglass, ball, or a combination thereof. In some cases, the superstrate can be a semiconductor and/or an insulator that is transparent and/or mostly transparent to the incident optical signal.

Applications for enhancement of absorption of photons at certain wavelengths and/or wavelength ranges, can include: LIDAR; imaging such as for camera sensors; high speed optical communication; chemical sensors; and night vision. For camera sensor applications, absorption of photons at at single and/or multiple wavelength ranges can be used where sensors are provided in an array and/or stacked where shorter wavelengths can be absorbed first and longer wavelengths absorbed last.

The microstructure holes and/or pillars can also be used for enhanced emission of photons such as for light emitting diodes and/or vertical cavity surface emitting lasers in cases where a forward bias can be applied to the anode and cathode of a PN or PIN semiconductor structure. In some cases, for LIDAR applications, the I or low doped layer for photon absorption and trapping can have a thickness ranging from 2 to 10 microns or more and the microstructure holes can be partially etched into the I layer which in some cases can be GeSi with Ge fraction ranging from 0 to 1.

Figure 95A:
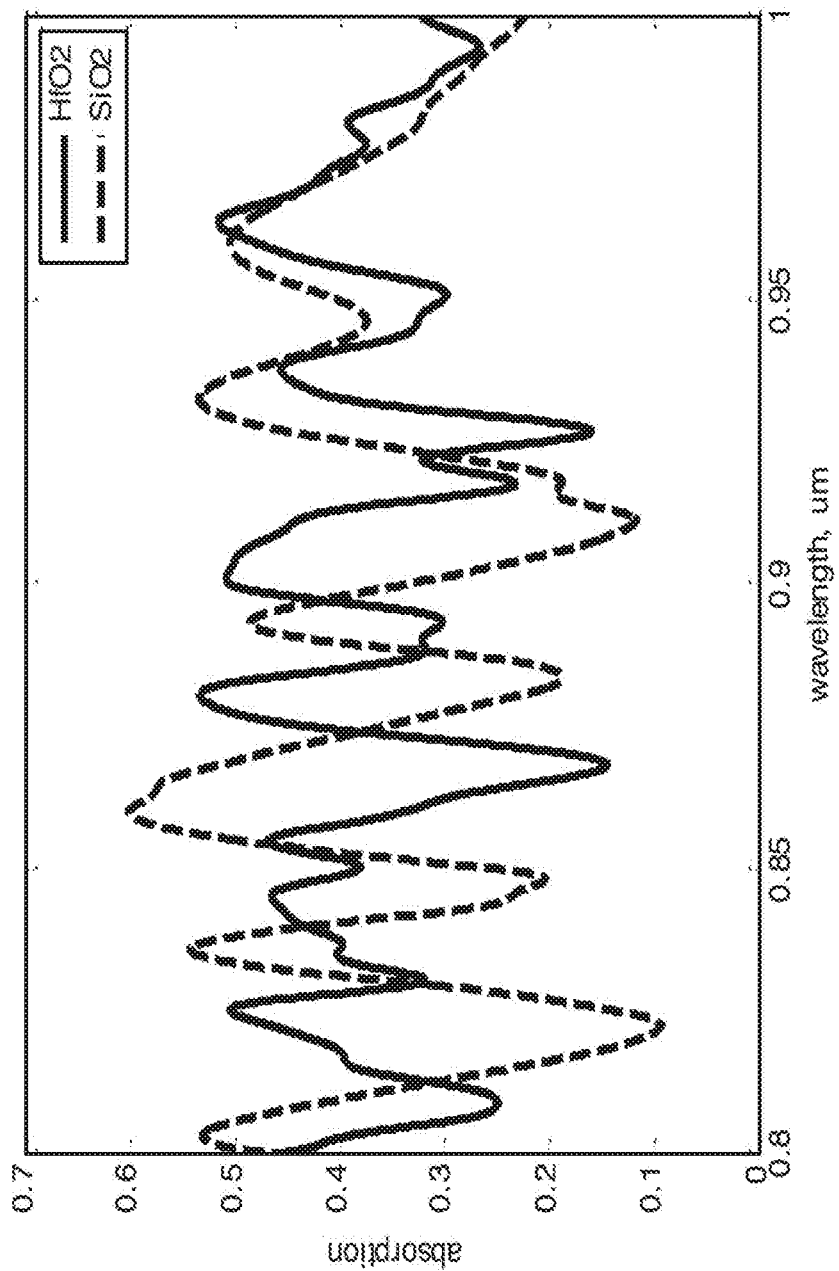
FIGS. 95A to 95C are plots showing a FDTD simulation of the optical field absorption in the I or low doped layers of FIGS. 93 and 94.
Figure 95B:
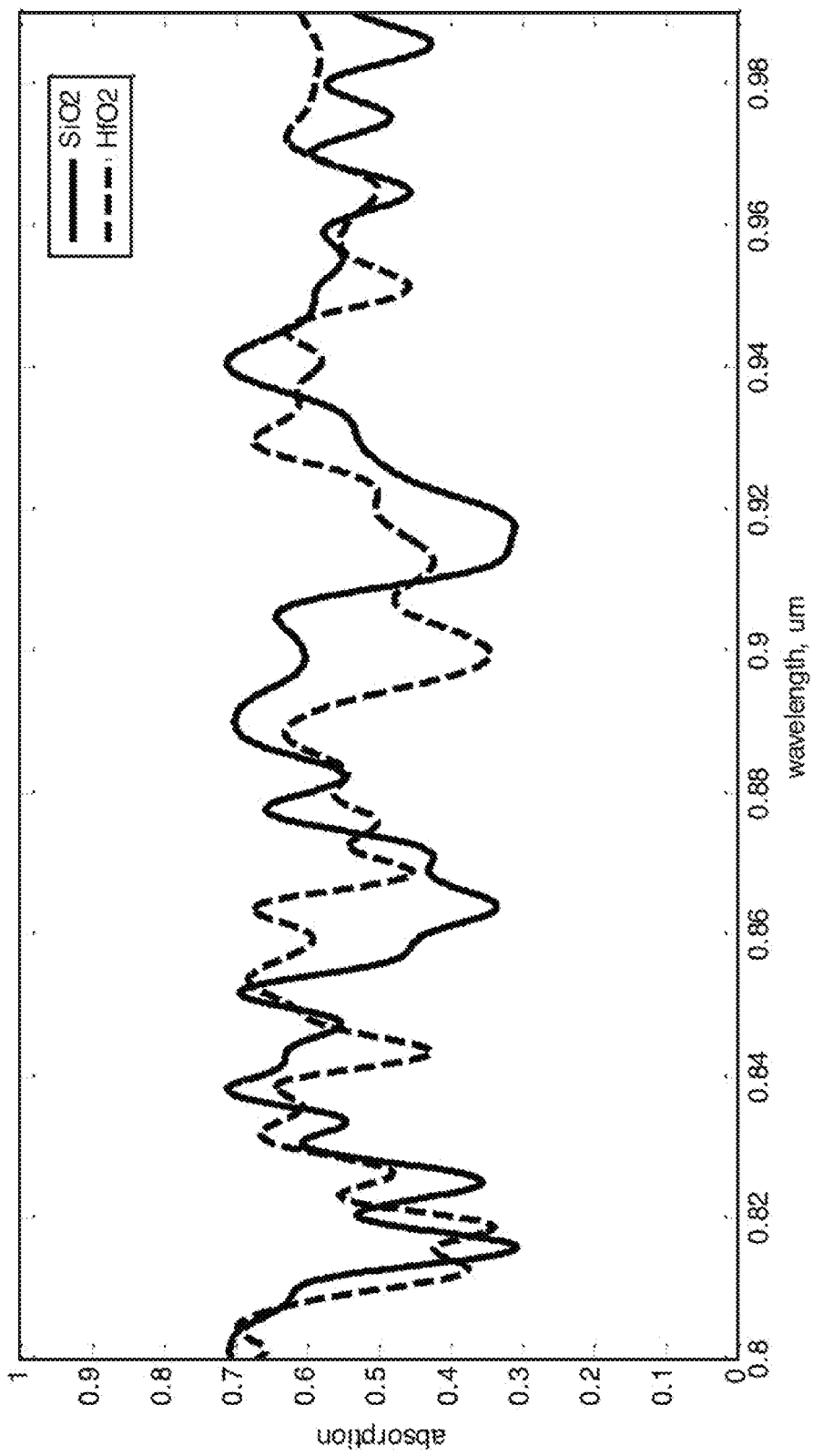

FIGS. 95A and 95B are plots showing a FDTD simulation of the optical field absorption in the I or low doped layers of FIGS. 93 and 94 for holes 9314 and 9318 in silicon dioxide and hafnium oxide superstrates with microstructure holes 9312 etched to certain depths as a function of incident optical wavelength from 800 to 1000 nm. In both FIGS. 95A and 95B the holes are square with a side dimension of 900 nm and a period of 1200 nm in a square lattice. In FIG. 95A, the holes are etched to a depth of 1.5 microns and shows approximately an average of 30-35% absorption in the I or low doped layer for either the silicon dioxide or the hafnium oxide. Some of the resonance may be due to interferences between the dielectric layers at the bottom and top of the photodetector, as in the case of a resonant photodiode. In case FIG. 95C, the microstructure holes are etched to a depth of 3.3 microns, or approximately 0.3 microns into the semiconductor, shows an approximate average of 50-55% absorption in the I or low doped layer of FIGS. 93 and 94. The resonance is less pronounced as in FIG. 95A, and may have lateral modes in the I or low doped region in addition to other optical modes resulting in higher absorption enhancements and therefore higher quantum efficiency and/or responsivity.

Figure 95C:
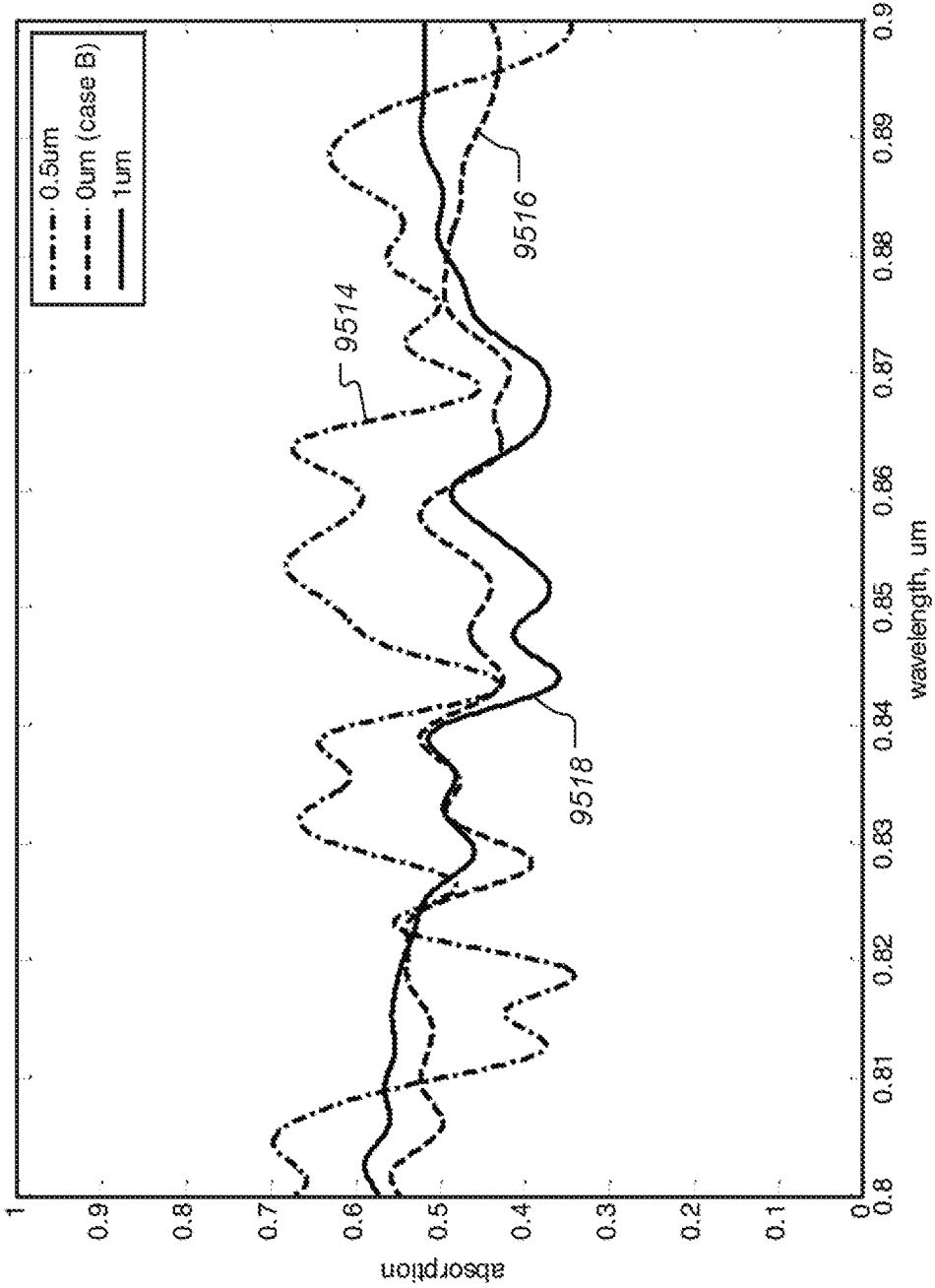

FIG. 95C as in FIGS. 95A-95B are square holes in a square lattice with the same dimensions but etched to different depths in a 3 microns thick silicon dioxide superstrate that is deposited on the silicon photodetectors, the etched depths are 0.5 microns above the silicon surface (curve 9514), at the surface (curve 9516) and 1 microns blow the surface (curve 9518). The absorption is plotted as a function of wavelength from 800-900 nm. In some cases the absorption and therefore the quantum efficiency can be as high as 70% at certain wavelengths but on average the enhanced absorption is between 40-50%. In some cases, one or more layers can be replaced with GeSi where the Ge fraction can vary from 0 to 1.

Figure 96:
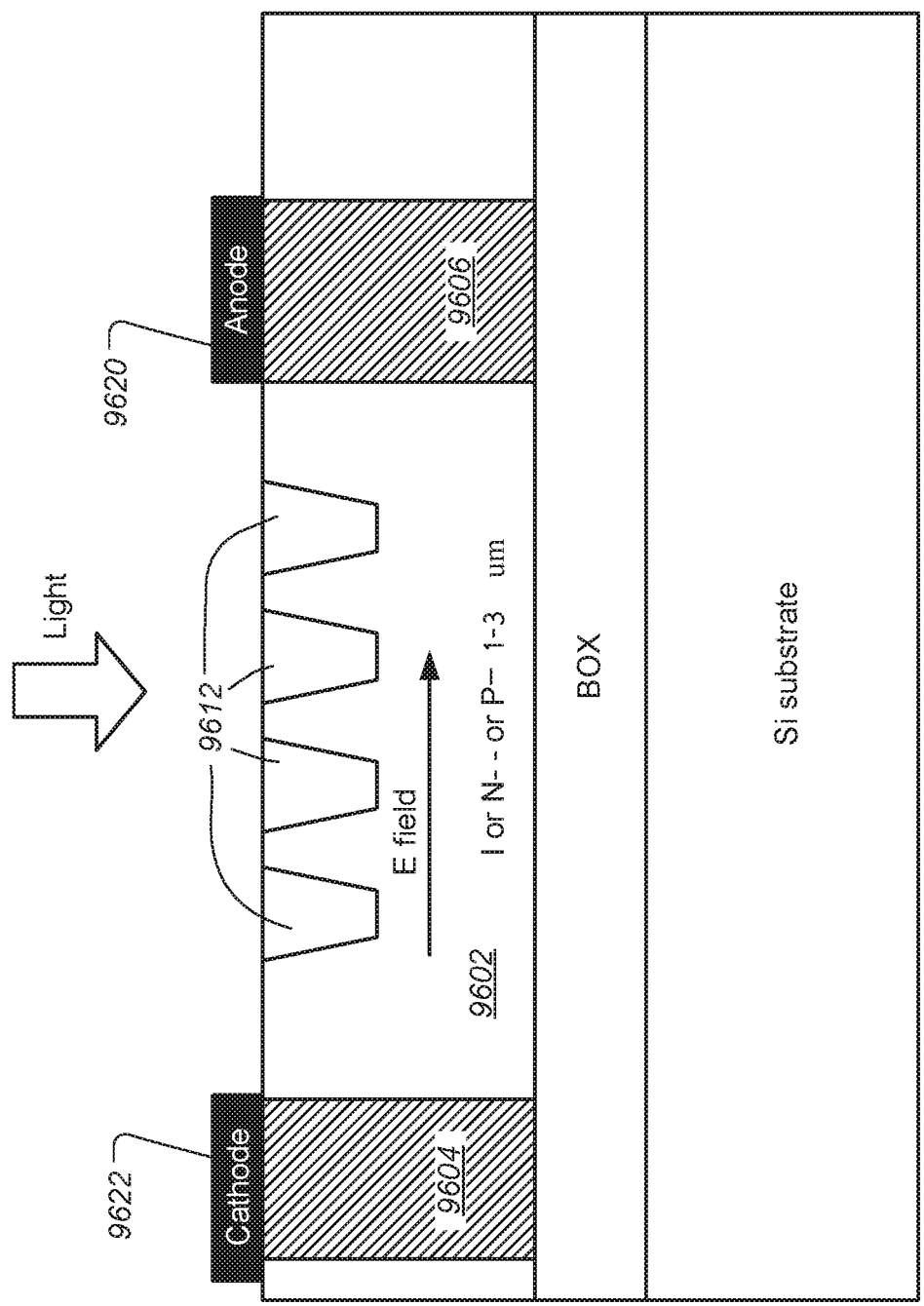
FIG. 96 is a cross section view of a lateral P-I-N photodiode structure that is surface illuminated, according to some embodiments.

FIG. 96 is a cross section view of a lateral P-I-N photodiode structure that is surface illuminated, according to some embodiments. Although the photodiode is shown in a P-I-N configuration some cases it can be a metal semiconductor metal (MSM) structure and in some cases it can be a N-I-N or P-I-P structure. The I layer 9602 can be intrinsic and/or have a resistivity of 10 to 100 ohm-cm or higher and in some cases 1 ohm-cm or higher. $P^+$ well 9606 and $N^+$ well 9604 can be implanted and/or diffused to depths of 0.5 to 5 microns for example, and in some cases 1 to 3 microns. Microstructure holes 9612 can be etched in the region of 9612 between the $P^+$ and $N^+$ region as shown, The $P^+$ and $N^+$ wells 9606 and 9604 can have a resistivity of 0.1 to 0.001 ohm-cm or less. The distance between the P+ and N+ wells 9606 and 9604 can range from 2-50 microns or more. A reverse bias can be applied on the anode and cathode with voltages ranging from −2 to −30 volts, and in some cases −3V and in some cases −2 to −10V. The photodetector structure can be grown on a SOI silicon wafer and in some cases on a silicon wafer without a BOX. Microstructure holes 9612 as in described herein supra, can have a variety of shapes and sizes, and cross sections, including circular, oval, square, polygonal, bowtie shaped, star shaped, and keyhole shaped. The cross sectional shapes can be any shape including: funnel, cone, inverted pyramid, cylindrical, ball, fractal, or combinations thereof. The holes 9612 can be formed by dry and/or wet etching. Lateral dimensions can range from 100 nm to 5000 nm, in some cases from 500 nm to 3000 nm, and in some cases from 400 nm to 2500 nm. Spacing between adjacent microstructure holes can range from 100 nm to 5000 nm and in some cases from 200 nm to 1000 nm. Depth of the holes can range from 100 nm to 10000 nm and in some cases superstrates can be used as discussed earlier. The electric field applied externally via a reverse bias between the anode and cathode can be predominately perpendicular and/or almost perpendicular to the optical incident ray direction. This is in contrast to many earlier configurations where the electric field between the anode 9620 can cathode 9622 can be predominately parallel and/or approximately parallel to the incident optical ray direction.

From FDTD simulations, the incident optical waves interact with the microstructure holes and can generate a very complex optical mode pattern with complex optical field directions. The directions can be parallel, perpendicular and/or at some other angle to the applied DC field as a result of the reverse bias voltage applied at the anode and cathode. This set of complex optical modes and fields can enhance the absorption of the incident photons in the semiconductor. Photons absorbed in the I or low doped region can contributed to the high data rate bandwidth response of the photodetector whereas photogenerated carriers outside the high electric field region of the I or low doped layer due to the reverse bias voltage, can result in a degradation of the high speed data rate bandwidth of the photodetector.

In some cases, one of more layers in FIG. 96 can be GeSi with the Ge fraction x ranging from 0 to 1 ($Ge_x Si_{1-x}$ where x can range from 0 to 1). This can be applied to all the photodetector structures described elsewhere herein.

According to some embodiments the structure shown in FIG. 96 can include multiple interleaving fingers of P+ and N+ regions to increase the area of the photodetector for example. The structure can be integrated with CMOS/BiCMOS ASICs into a single monolithic chip. The ASICs can include CDR, LA, TIA, and Equalizers. See, e.g., Ref. Kao et al.

Figure 97:
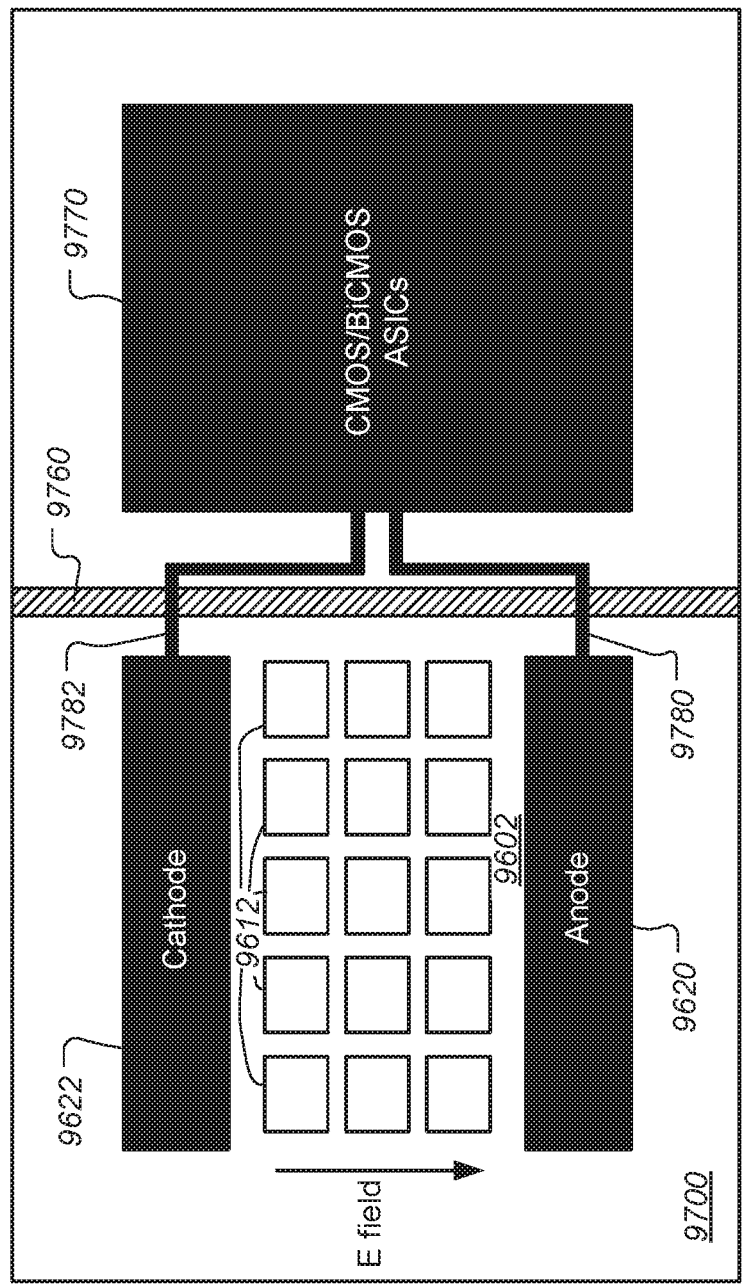
FIG. 97 is a top view of the structure shown in FIG. 96, according to some embodiments.

FIG. 97 is a top view of the structure shown in FIG. 96, according to some embodiments. The structure includes an array of microstructure holes 9612 for absorption enhancement and therefore quantum efficiency enhancement. Also shown are integrated CMOS/BiCMOS ASICs 9770 for signal processing and enhancements and for further data analysis and/or transmission to other electronic circuits. An electrical isolation trench 9760 can be included to separate any potential electrical interference between the photodetector and the ASICs. Transmission lines 9780 and 9782 can be used to connect the photodetector to the ASICs. In addition, arrays of photodetectors can be fabricated and integrated with CMOS/BiCMOS ASICs into a single monolithic chip 9700. Optical signals illuminate the surface and in some cases superstrates can be used to redirect the optical signal whose rays are parallel to the photodetector to illuminate at an angle normal and/or almost normal to the surface of the photodetector. In some cases one or more layers can be replaced with GeSi where Ge fraction can vary from 0 to 1.

According to some embodiments, the structure shown in FIG. 97 can be repeated, where multiple anodes and multiple cathodes are "interleaved" with an array of microstructure holes between each anode and cathode. Such a structure can be thought of as an interleaved fingers pattern.

Figure 98:
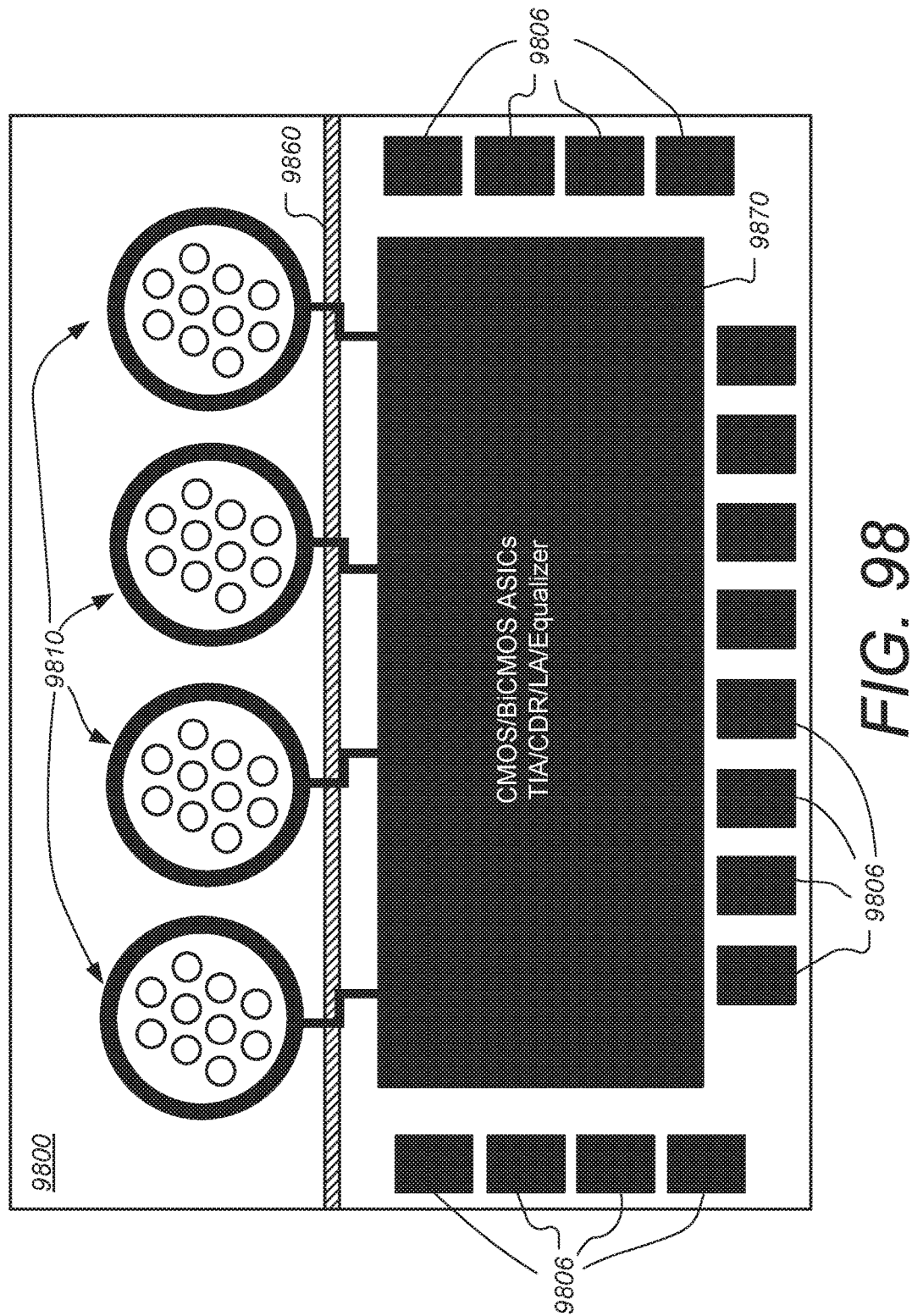
FIG. 98 is a top view of an integrated MSPD/MSAPD, according to some embodiments.

FIG. 98 is a top view of an integrated MSPD/MSAPD, according to some embodiments. The MSPD/MSAPDs 9810 can be formed with or without superstrates, as described herein supra. Monolithically integrated to CMOS/BiCMOS ASICs 9870 can include functionality such as transimpedance amplifier, clock data recovery, limiting amplifier, and equalizer. In the example shown chip 9800 include the ASICs 9870 and MSPD/MSAPDs 9810 in a 1×4 configuration (i.e. one ASICs module paired with four MSPD/MSAPDs. Other configurations such as 1×10, 2×5, and 2×4 are also possible. In some examples, the 1×4 configuration shown can be 4×25 Gb/s for a total of 100 Gb/s or 4×50 Gb/s for a total of 200 Gb/s. The MSPDs/MSAPDs 9810 can be spaced by 250 microns center to center with the diameter of the photodetectors ranging from 25 to 80 microns and in some cases 30 to 50 microns. An optional electrical isolation trench 9860 can be included that can be filled with dielectric and/or amorphous semiconductor. A number of bond pads 9806 can be provided. Not all elements are shown for simplicity. Examples of structure that could be included but are now shown include: anti reflection coatings, passivations, planarization effects, transmission lines, mesas, and implanted wells. Also the correct number of bond pads may not be shown. The chip size can vary from 1.5 mm×1.5 mm to 3 mm×3 mm or more depending on the number of photodetectors and the ASICs.

In some cases one of more layers can be replaced with GeSi and where the Ge fraction can vary from 0 to 1. In some cases, the MSPD/MSAPD with or without superstrates can have one or more of its layer made of a III-V family material. The substrate can be made of a III-V family material. The inclusion of microstructure holes in III-V material can enhance absorption and therefore the quantum efficiency of thin III-V material photon absorbing layer with thicknesses less than 2000 nm for example and in some cases with thicknesses equal to or less than 1000 nm. When the III-V or II-VI material is thin for high speed or high data rate bandwidth operation the quantum efficiency and/or responsivity can suffer from the reduced thickness resulting in reduced absorption of photons. With the addition of microstructure holes, the absorption can be enhanced and therefore the quantum efficiency by a factor ranging from 1.5 to 10 or greater as compared to a similar structure without microstructure holes.

Figure 99A:
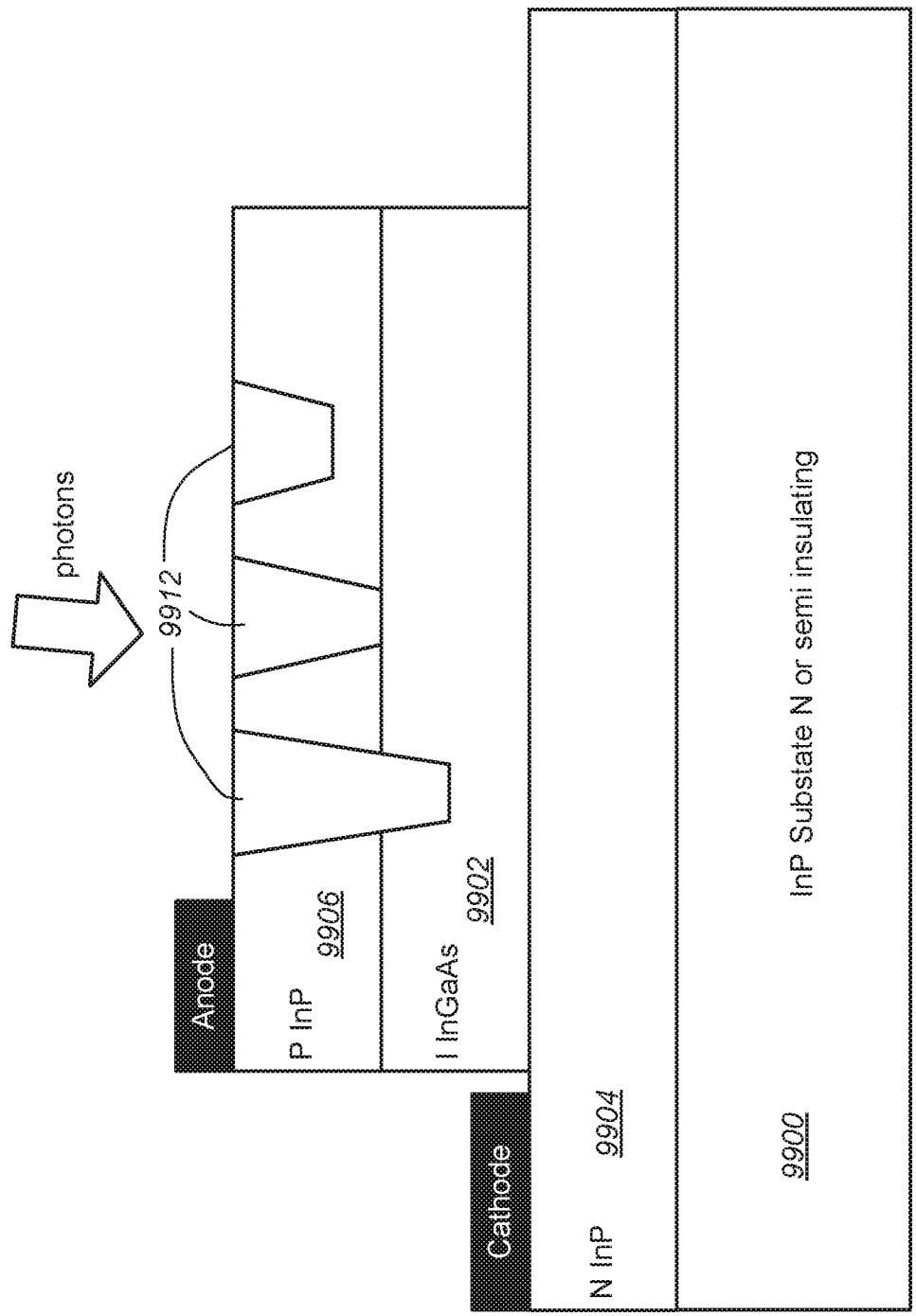
FIG. 99A is a cross section schematic of a microstructure enhanced III-V photodiode, according to some embodiments.

FIG. 99A is a cross section schematic of a microstructure enhanced III-V photodiode, according to some embodiments. For further detail of III-V photodiodes, see, e.g., K. W. Carey et al, Characterization of InP/GaInAs/InP heterostructures grown by organometallic vapor phase epitaxy for high-speed pin photodiode, Journal of Crystal Growth 1986 (incorporated herein by reference). The light absorbing region 9902 is an I or low doped InGaAs and/or InGaAsP layer of 1500 nm thickness. The I layer 9902 cladded by InP P and N type material (layers 9904 and 9906) The substrate 9900 is InP N or be semi insulating. The photodiode is used to detect photons at 1300 nm. To increase the data rate bandwidth of the photodiode, a thinner InGaAs photon absorption layer 9902 can be used to reduce the photogenerated carrier transit time under a reverse bias applied between the anode and cathode. The reduced thickness of the InGaAs layer can result in lower quantum efficiency and/or responsivity. Microstructure holes 9912 are etched into the P-I-N structure at depths ranging from 100 nm to 3000 nm. Microstructure holes can be shaped as discussed earlier (e.g. funnel, cone, cylindrical, inverted pyramids, etc.), and have lateral dimensions ranging from 300 nm to 5000 nm. The spacing of the microstructure holes can range from 100 nm to 3000 nm. The microstructure holes can be in a periodic array, aperiodic arrangement or random arrangements. The diameter of the photosensitive area can range from 10 to 100 microns or more. In some cases the diameter of the photosensitive area can range from 5 to 50 microns. In some applications where data rate may not be high, but the photon absorption region needs to be thin, the addition of microstructure holes can enhance the absorption and therefore the quantum efficiency and/or responsivity. In some cases a superstrate can be utilized as discussed earlier. And in some cases the substrate 9900 can be silicon.

In some cases, a III-V avalanche photodiode can be fabricated with microstructure holes in a P-I-P-I-N structure where the I layer between the P layers can be InGaAs and/or InGaAsP and microstructure holes can be etched partially into the top P layer and/or partially into the I absorption layer and/or entirely into the I absorption layer. In some cases, a superstrate as discussed earlier can be implemented on the avalanche photodiode with microstructure holes. See, e.g., Chen et al, Optimization of InGaAs/InAlAs Avalanche Photodiodes, Nanoscale Research Letters (2017) 12:33 (incorporated herein by reference) which discusses InP/InGaAs APDs without superstrate or holes. The microstructure holes with depth from the surface of the semiconductor ranging from 50 nm to 3000 nm and can have cross sectional shapes of funnel, cone, inverted pyramids, cylindrical, polygonal and/or any combinations of shapes, and the microstructure holes (applies to III-V photodiodes also) can be circular, square, polygonal, star, oval, fractal, keyhole and/or any combination of shapes, with lateral dimensions ranging from 300 nm to 5000 nm and with spacing between the microstructure holes ranging from 100 nm to 3000 nm or more and can be periodic and/or aperiodic and/or random. Wavelength ranges can span from 800-1600 nm depending on the III-V material combination of binary, ternary and/or quaternary. Quantum efficiency can range from 50% or higher at certain wavelengths and in some cases 70% or higher at certain wavelengths and in some cases 90% or higher at certain wavelengths and in some cases with avalanche gain due to a reverse bias between the anode and cathode can be 200% or higher and in some cases 400% or higher at certain wavelengths. Data rate bandwidth can range from 1 Gb/s to 100 Gb/s or higher depending on the thickness of the layers and size of the photodetector that can contribute to junction capacitance.

In some cases, a superstrate can be used with the III-V APD with microstructure holes. And in some cases one or more layers can be II-VI material family and in some cases the wafer can be silicon. In some cases one or more layers can be non crystalline and applies to all the structures discussed.

Figure 99B:
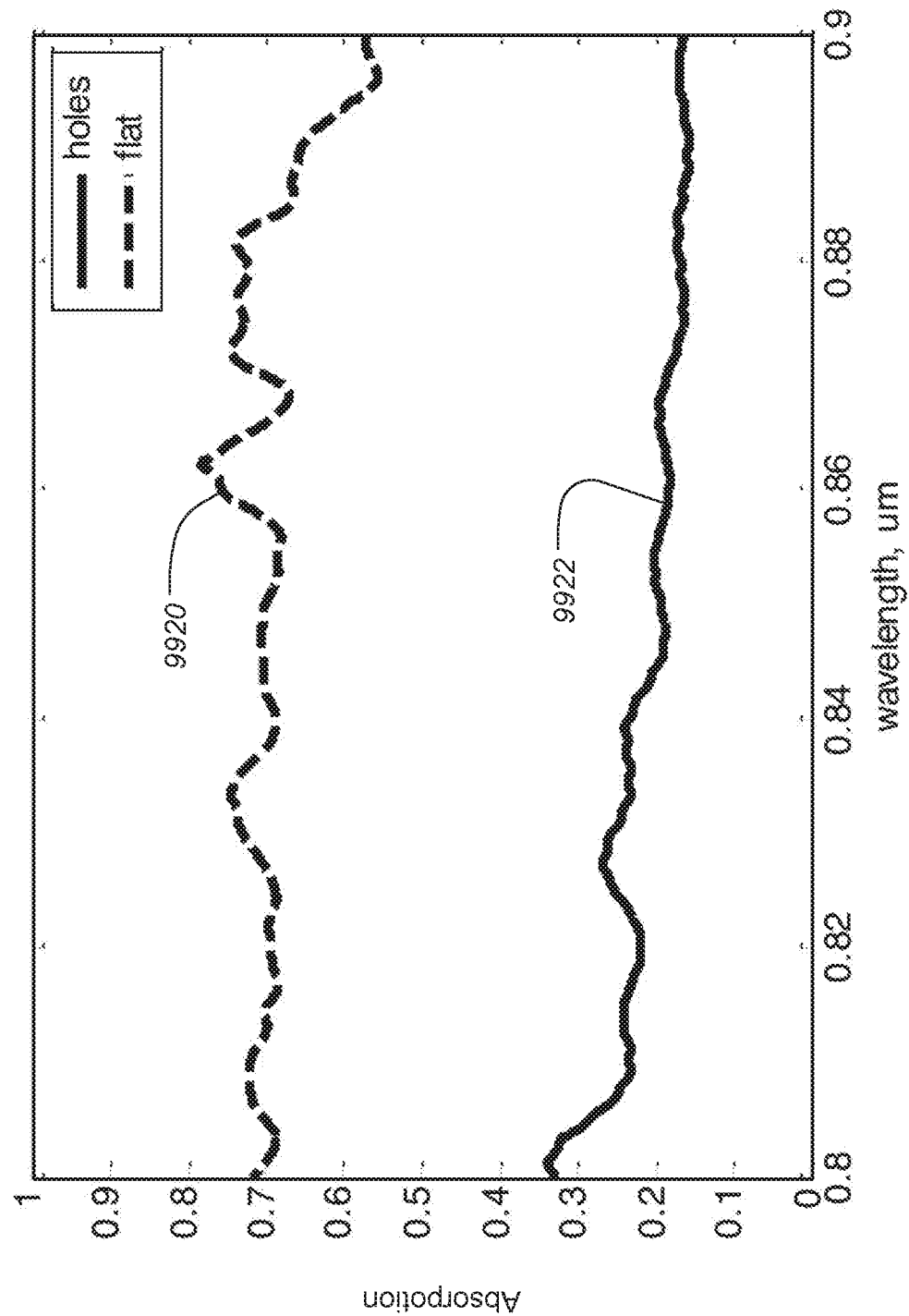
FIG. 99B is a plot showing an FDTD simulation of the structure shown in FIG. 99A.

Applications can include optical data communication, LIDAR, imaging, sensing, and other applications requiring high quantum efficiency optical detection that converts photons to electrons for further image processing or information processing. In some cases, the III-V photodetector can be a AlGaAs/GaAs structure for wavelengths ranging from 800 to 900 nm FIG. 99B is a plot showing an FDTD simulation of the structure shown in FIG. 99A. The following parameters where used for the simulation: P—AlGaAs (30% Al) 1 micron thick; I GaAs 1 micron thick; N AlGaAs (30% Al) 1 micron thick; and GaAs semi insulating substrate. The Microstructure holes were funnel shaped etched 1.5 micron deep, diameter 700 nm with a period of 1000 nm in a square lattice. The vertical axis is absorption and the horizontal axis is wavelength in microns. Curve 9922 is for the structure without microstructure holes and curve 9920 is for the structure with microstructure holes. As can be seen, the absorption and therefore the quantum efficiency QE with microstructure holes on the III-V MSPD can be 2 times or greater than a similar III-V photodiode without microstructure holes at at least one or more wavelengths in the span from 800-900 nm for GaAs and 1200 nm to 1600 nm for InGaAs absorption layers. The reduction in thickness of the I layer can significantly increase the data rate bandwidth of the III-V MSPD to 40 Gb/s or higher, in some cases 50 Gb/s or higher, in some cases 80 Gb/s or higher and in some cases 100 Gb/s or higher. This is while maintaining a QE that is higher than a similar III-V photodiode without microstructure holes by a factor of 1.5 times or more at certain wavelengths. Optical signals impinge from the top surface and in some cases from the bottom surface and photons are absorbed in the I layer. The same principle can be applied to III-V MSAPDs with the addition of avalanche layer(s). The addition of microstructure holes in an APD (Si, GeSi or Ill-V) can increase the QE and sensitivity and responsivity due to photon trapping over a similar structure without microstructure holes. Other attributes for an APD can be lower avalanche voltages of an APD with microstructure holes as compared to a comparable APD without microstructure holes.

Figure 100:
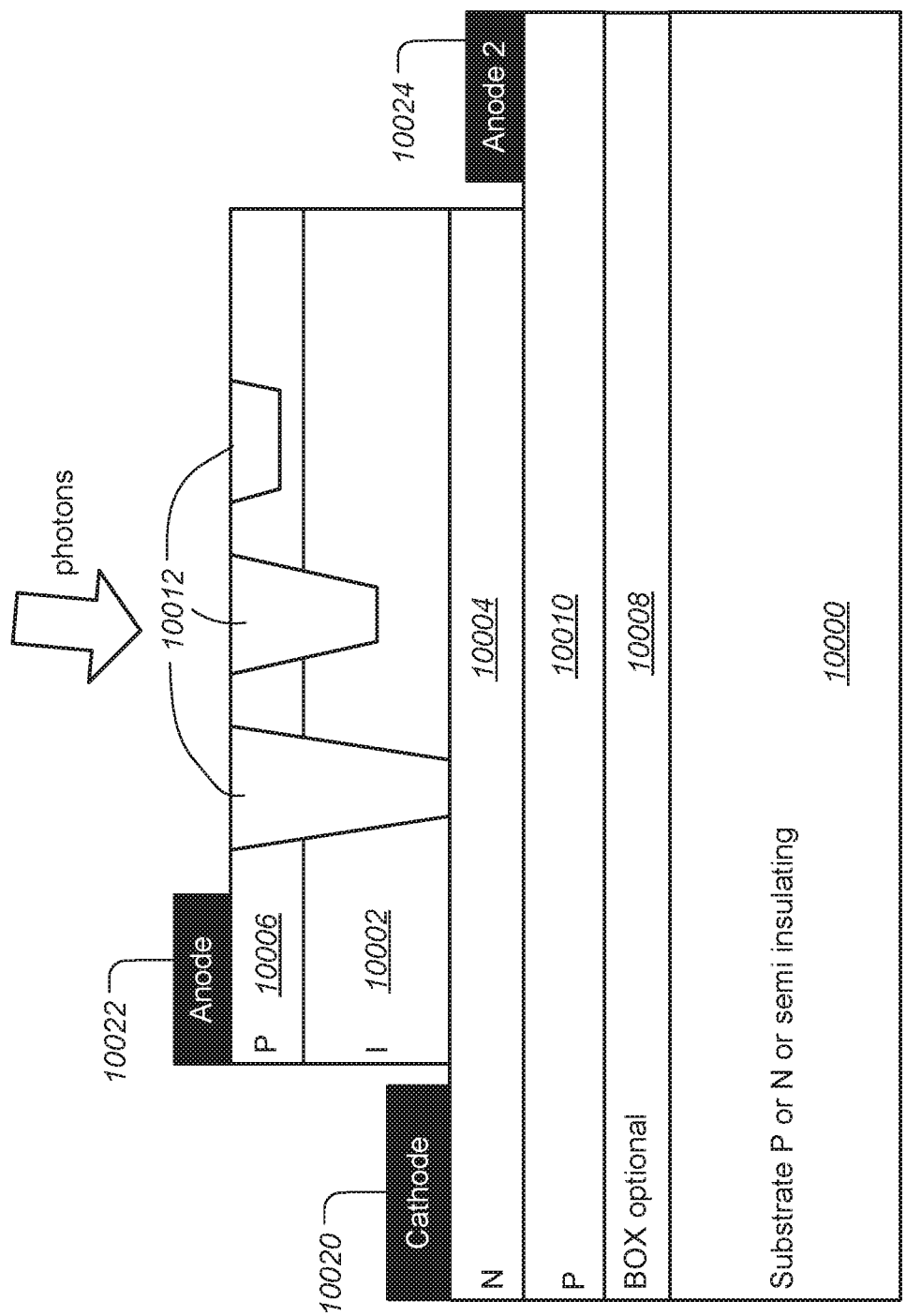
FIG. 100 is a cross section of a MSPD, according to some embodiments.

FIG. 100 is a cross section of a MSPD, according to some embodiments. A PINP photodetector structure is shown with an optional BOX layer. The structure could also be a MSAPD with added avalanche layers. The photodiode PIN layers 10006, 10002 and 10004 are grown on a P layer 10010 such that a second anode 10024 can provide a forward or reverse bias between anode 10024 and cathode 10020, while the photodiode PIN provides a reverse bias between the anode 10022 and cathode 10020. A reverse bias between anode 10024 and cathode 10020 can help reduce the effect of the slow diffusion of photogenerated carriers outside the high filed I region The forward biasing of the bottom PN layer provides a current injection at the interface between the bottom PN junction. In some cases, with a high enough current injection the P layer 10010 with resistivity ranging from 0.1 to 0.001 ohm-cm or less can change in its refractive index and in some cases can become more metallic therefore reflecting more of any photons that were not trapped by the microstructures back toward the photon trapping microstructure holes and/or other microstructures. This extra reflection of photons at the bottom PN junction can further increase the QE of the MSPD/MSAPD. In some cases the bias between anode 10024 and cathode 10020 can be modulating. In some cases the bias can be forward, reverse either modulating, DC or both. Mixing, heterodyne, homodyne, of RF with detected optical signals may improve signal to noise ratio, RF transmission applications, and other applications requiring high fidelity of signal.

The material can be silicon and/or in some cases one or more layers can be GeSi with Ge fraction x ranging from 0 to 1. In some cases, the material can be a non-silicon material, such as one or more layers being a III-V family and/or II-VI family material.

Microstructure holes 10012 and/or other microstructures are formed as described herein supra. The lateral dimensions, spacing, cross sectional shapes, depth, and other parameters such as wavelength, data rates, monolithic integration, QE, responsivity are as in any of the MSPD/MSAPD structures described herein supra.

In some cases, the PINP MSPD can have gain such as a PNP bipolar transistor. Such MSPDs with gain can be advantageous due to the low voltage nature and having transistor like gain.

In some cases the P Si layer 10006 can be 0.2-0.3 microns thick with doping with boron to concentration greater than $1 \ 10^{20}$ ions/cm$^3$. The I layer 10002 can have thickness ranging from 1.0 to 2.0 microns with background doping concentration of less than $1.5 \ 10^{15}$ ions/cm$^3$. The N layer 10004 can have thickness ranging from 0.2-0.3 microns with doping concentration of arsenic greater than $1 \ 10^{19}$ ions/cm$^3$, The P device layer 10010 can have thickness ranging from 0.1 to 0.25 microns. The optional BOX (buried oxide) 10008 can have thickness ranging from 1 to 4 microns on silicon handle wafer 10000.

Figure 101:
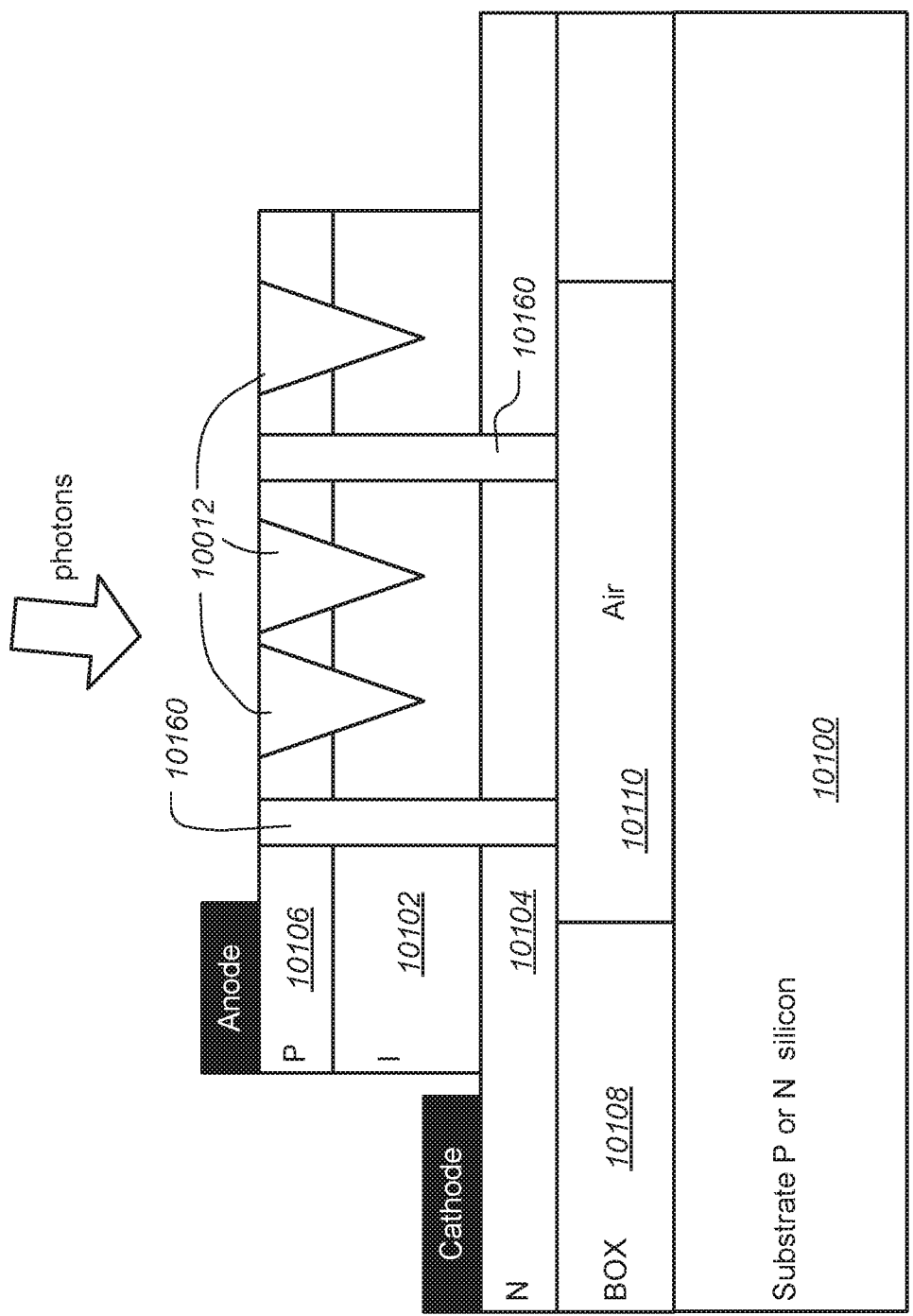
FIG. 101 is a cross section of a MSPD (or MSAPD) with a mesa and the regions under the microstructure holes selectively removed, according to some embodiments.

FIG. 101 is a cross section of a MSPD (or MSAPD) with a mesa and the regions under the microstructure holes selectively removed, according to some embodiments. In this example, the BOX layer 10108 is fully and/or partially removed to provide a higher refractive index contrast between the microstructure hole semiconductor regions. Instead of silicon dioxide, region 10110 can be mostly air which has a refractive index of 1 instead of approximately 1.45 for silicon dioxide. This higher refractive index contrast can further improve the enhancement of absorption in the microstructures 10112 and therefore improve the QE and responsivity. FIG. 101 shows cylindrical holes 10160 that are etched to the BOX layer 10108 with dimensions similar to the microstructures 10112. Microstructures 10112 are not etched all the way to the BOX layer 10108 and can be any shape such as inverted pyramids, funnels, cones, or combination of shapes that can be achieved with dry and/or wet etching.

The microstructured holes 10160 that are etched to the BOX layer can have lateral dimensions ranging from 300 nm to 3000 nm and can be an array spaced ranging from 1000 nm to 10000 nm. The shallower microstructure holes 10112 can have lateral dimensions ranging from 300 nm to 3000 nm and spacing ranging from 50 nm to 3000 nm. Microstructure holes 10112, as discussed earlier, can have surface shapes such as circular, oval, square, polygonal, hourglass, star, amoeba, fractal, or combinations of shapes, and cross sectional shapes such as inverted pyramids, funnels, cones, cylindrical, polygonal, hourglasses, balls, fractals or combinations thereof.

In some cases all or mostly all of the microstructure holes can be etched to the BOX layer. In some cases some of the microstructure holes can be etched to the BOX layer and in some cases the microstructure holes that are etched to the BOX layer can be in a periodic array and/or aperiodic ally arranged and/or arranged in a pattern such as circular for example to further assist confining the photons to regions for photon trapping with microstructures.

The material in FIG. 101 can be silicon or one or more layers can be GeSi with Ge fraction x ranging from 0 to 1. In some cases, one or more layers can be a III-V and/or a II-VI material. The MSPD/MSAPD can be operated with a reverse bias applied between the anode and cathode. Optical signals can impinge from the top surface and in some cases from the bottom surface.

Depending on the material, wavelength ranges can range from 800-1550 nm or longer, in some cases from 800 nm to 950 nm, in some cases from 800 nm to 1100 nm, in some cases from 1250 nm to 1350 nm, in some cases from 1250 nm to 1600 nm and in some cases 800 nm to 880 nm.

QE can range from 30% to 70% or higher at at least one wavelength in the wavelength span. The QE of MSPD and/or MSAPD can be higher than a comparable photodiode and/or avalanche photodiode without microstructure. Data rate bandwidth can range from 1 Gb/s to 100 Gb/s, in some cases 25 Gb/s to 50 Gb/s, and in some cases 50 Gb/s or higher.

In some cases the P Si layer 10106 can be 0.2-0.3 microns thick with doping with boron to concentration greater than $1 \ 10^{20}$ ions/cm$^3$. The I layer 10102 can have a thickness ranging from 1.0 to 2.0 microns with background doping concentration of less than $1.5 \ 10^{15}$ ions/cm$^3$. The N layer 10104 can have a thickness ranging from 0.2-0.3 microns with doping concentration of arsenic greater than $1 \ 10^{19}$ ions/cm$^3$. An N device layer (not shown) can exist between 10104 and 10108 having a thickness ranging from 0.1 to 0.25 microns. BOX (buried oxide) 10108 can have thickness ranging from 1 to 4 microns on silicon handle wafer 10100. In some cases, the BOX 10108 beneath the microstructure holes can be partially and/or fully etched away, and in some cases the BOX remain un-etched. The structures shown in FIG. 101 and other Si, GeSi and silicon based MSPDs/MSAPDs can all be monolithically integrated with CMOS and/or BiCMOS silicon electronics such as TIAs, CDRs, LAs, and/or equalizers. In some cases with heteroepitaxy, III-V MSPDs and/or III-V MSAPDs on silicon based material and substrates can also be monolithically integrated with CMOS/BiCMOS ASICs in silicon. Applications include optical communications, optical data communications, LIDAR, imaging, single photon detections, sensing, and biometrics. In some cases for LIDAR applications, the MSAPDs described in the present disclosure can be tailored for the LIDAR wavelengths, responsivity or QE, data rate bandwidth and avalanche voltage. In particular, the I or low doped region for photon absorption and trapping can have a thickness ranging from 2 to 10 microns or more and the photosensitive area can have a lateral dimension ranging from 50 to 5000 microns or more. Arrays of the MSAPDs can be monolithically integrated with CMOS/BiCMOS ASICs suitable for specific LIDAR applications such as automotive sensors and/or robotic sensors. Wavelengths can be tailored and optimized with the addition of GeSi with Ge fraction ranging from 0 to 1 to address wavelengths from 700 nm to 2000 nm. Low avalanche voltages can be achieved with the addition of microstructure holes to reach desired QE and responsivity with reduced overall thickness of the APD structure for higher reliability in hostile environments. The microstructure holes and the MSAPD can be fully passivated for low dark current. Avalanche gain can take place in an Si I layer for reduced noise characteristics.

In some cases the wavelength used for LIDAR applications is 903 nm and in some cases the wavelength range is 800-950 nm. For these wavelengths a GeSi alloy I or low doped absorption layer with photon trapping microstructure holes can be used in an MSAPD. The microstructure holes can be used to improve the QE and/or responsivity over a comparable APD without microstructure holes. The detection range can be extended from 100 meters to 250 meters in some cases. In some cases, the avalanche voltage can be reduced due to reduced layer thickness in a MSAPD as compared to a comparable APD without microstructure holes.

Figure 102:
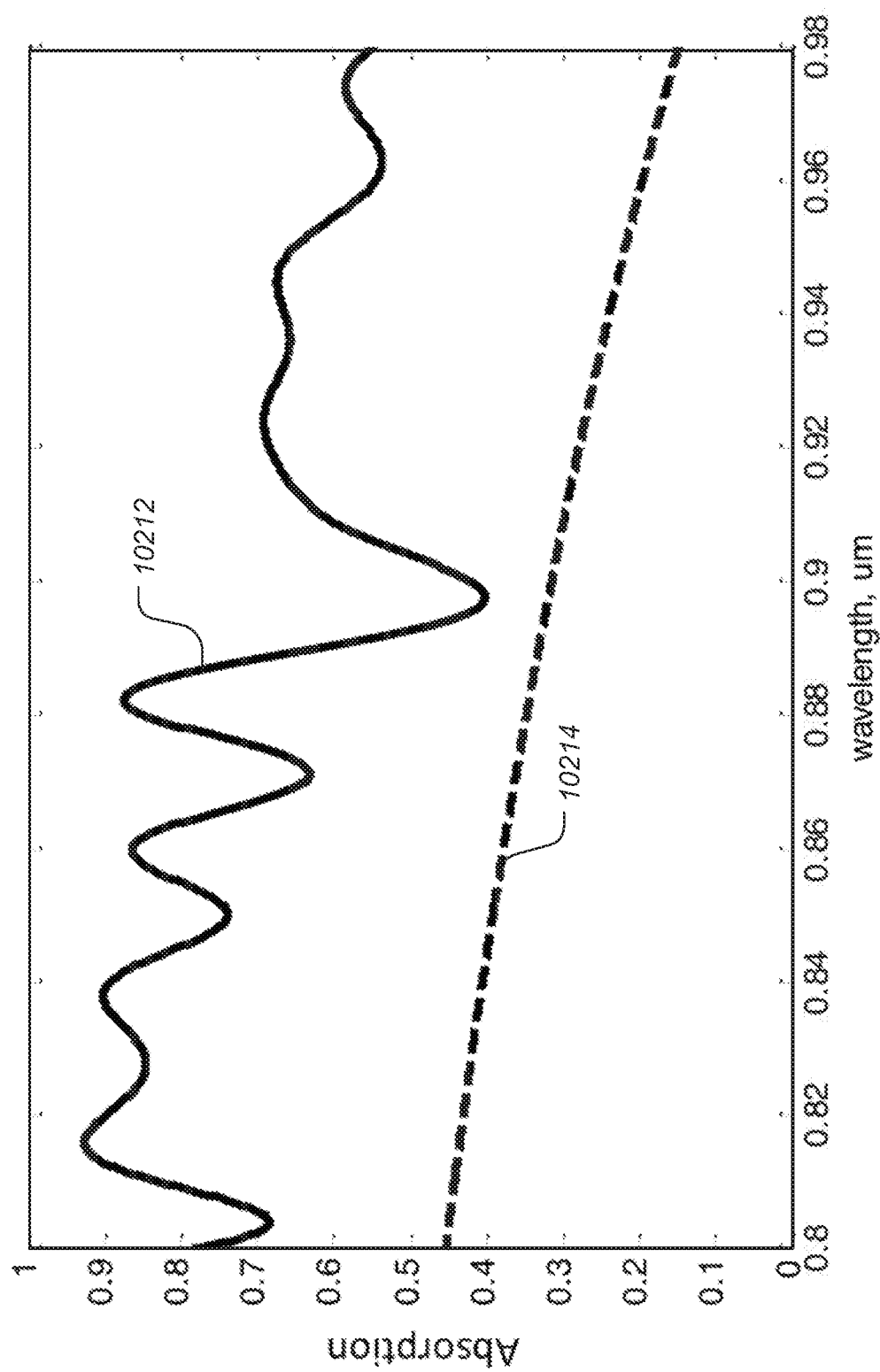
FIG. 102 is a plot showing an FDTD simulation of the optical field absorption enhancement verses wavelength for a MSPD structure and with either a PIPN or PIPIN structure for a MSAPD device, according to some embodiments.

FIG. 102 is a plot showing an FDTD simulation of the optical field absorption enhancement verses wavelength for a MSPD structure with PIPN, PP-N, PN-N, or PIPIN structure for a MSAPD device, according to some embodiments. The wavelength range is (800-980 nm). The device has microstructure holes in silicon with an I or low doped layer thickness of 5 micrometers (curve 10212) cladded by 0.2 and 0.4 microns of P and N layers on a BOX layer (SOI wafer) for a MSPD structure and with either a PIPN or PIPIN structure for a MSAPD device. The hole diameter is 700 nm and the hole period is 1000 nm in a square lattice and the holes are cylindrical, etched to a depth of 1000 nm for this simulation. Enhanced absorption at some wavelengths in the range 800-980 nm, can be 80% or higher and at some wavelengths the enhanced absorption can be 60% or higher. A comparable silicon photodetector absorption verses wavelength without microstructure holes with 10 micrometers of I or low doped layer and without a BOX layer, is shown in the dashed curve 10214. For a silicon photodetector to reach 80% absorption at some wavelengths in the range of about 800-980 nm, an I or low doped layer of thickness of approximately 30 microns may be necessary. Such thick I layer would require a reverse bias voltage of 100 to 200 volts for APD operation. Even for photodiode operation, a high reverse bias voltage of 20 volts or higher may be necessary to achieve good quantum efficiency. Absorption can be directly proportional to quantum efficiency and in some cases can be the quantum efficiency if recombination and scattering are negligible. With the addition of micro and or nano structure holes, a thinner I or low doped layer or region can be used to achieve a quantum efficiency that is approximately equivalent to a thicker micro/nanostructure hole-free I or low doped layer. Reverse bias voltages of MSPDs can be less than 20 volts and for MSAPD less than 100 volts. In some cases the reverse bias voltages for MSPDs can be less than 10V and for MSAPDs less than 50V. In some cases the reverse bias voltages for MSAPDs can be less than 35V. In some cases, for single photon MSAPD devices where the MSAPD can be operated at the Geiger-counter mode or beyond the breakdown voltages, the reverse bias voltage can be less than 25V, in some cases less than 15V, and in some cases less than 10V. The I or low doped layer or region for a single photon MSAPD detector can range from 0.3 to 5 microns for example. In some cases the I layer or region for MSAPDs and or MSPDs can range from 0.5 to 6 microns.

The thinner I layer or region of MSPDs, MSAPDs can be more conducive for monolithic integration with CMOS/BiCMOS electronics and the lower reverse bias voltages can result in high device reliability.

For LIDAR and or LiFi applications the data rate can range from hundreds of Mb/s to tens of Gb/s. Monolithic integration with CMOS/BiCMOS ASICs of arrays of MSPDs can be suitable for such applications. MSAPDs and MSAPD-single photon detectors can be implemented with significant cost reduction and improvement in performance due to low parasitics.

In some cases, wavelengths used for LIDAR can range from 780-980 nm, and in some cases from 800 nm to 2000 nm. MSPDs/MSAPDs can cover these wavelengths with Si and or GeSi I or low doped regions with microstructured holes for photon trapping and enhanced absorption. Microstructure holes can be etched or formed in Si and or GeSi photodiodes, Si and or GeSi avalanche photodiodes, Si and/or GeSi single photon avalanche photodiodes, Si and/or GeSi photomultipliers for example. See, e.g., Hamamatsu data sheet for Si photodetectors for LIDAR, https://www.hamamatsu.com/resources/pdf/ssd/Photodetector_lidar_kapd0005e.pdf, incorporated herein by reference.

In some cases, a thermal anneal and/or passivation can be performed after the etching and/or formation of the microstructure holes and structures and/or any mesas and/or any trenches to remove any damage due to etching. In some cases, the lateral dimension of the photodetector for LIDAR can range from 30 microns to 3000 microns or more. In some cases an array of photodetectors can be made such as an array of Si and or GeSi I layer SPAD (Single photon avalanche photodiode) that can be fabricated for high sensitivity imaging. The use of microstructure holes can further improve the sensitivity and extend the wavelength of the Si and or GeSi photodetector as compared to a comparable photodetector without microstructures holes or microstructures for photon trapping to enhance the absorption and therefore the QE. QE of photodetectors with microstructure holes for absorption enhancement can be formed in the superstrate, in the first doped layer, into the low doped or I layer or region and/or in the second doped region. QE can thereby be enhancement by a factor of 1.5 or more at certain wavelengths in the range 800 to 1000 nm for silicon, 900 nm to 1400 nm for GeSi, and 1000 nm to 2000 nm for Ge. In some cases the QE enhancement factor can be 2 or more times at certain wavelengths and in some cases the enhancement factor can be 10 times or more at certain wavelengths.

Figure 103:
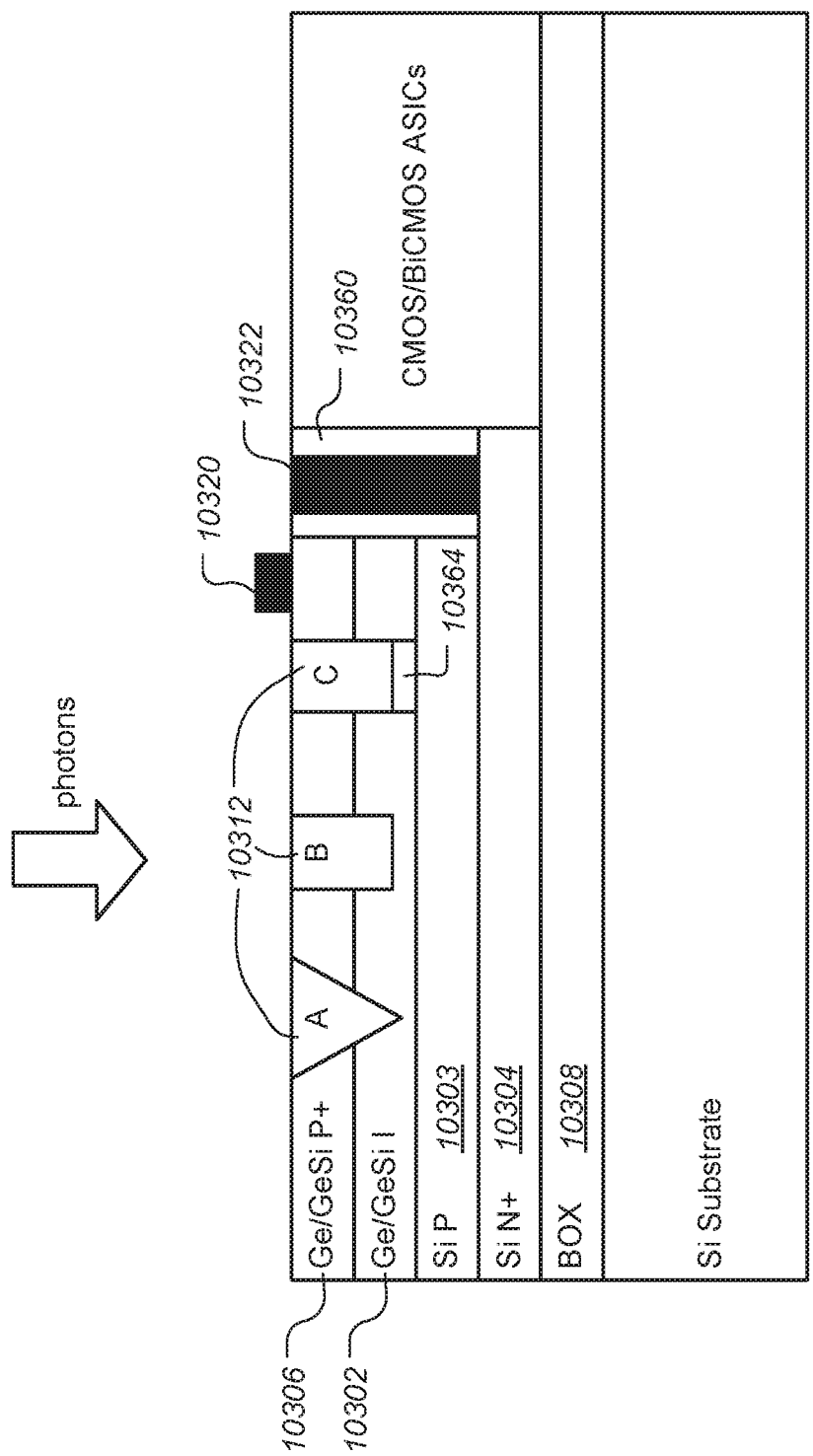
FIG. 103 is a cross section of an MSPD or MSAPD having Ge and/or GeSi layers grown on Si that is monolithically integrated with CMOS/BiCMOS ASICs, according to some embodiments.

FIG. 103 is a cross section of a MSPD or MSAPD having Ge and/or GeSi (with Ge fraction ranging from greater than 0 to 1 where 1 is all Ge, and in some cases from 0 to 1 where 0 is all silicon) layers grown on Si that is monolithically integrated with CMOS/BiCMOS ASICs, according to some embodiments. The ASICs can be configured for various applications such as high speed optical data communications using optical fibers, free space optical communications such as LIFI, light direction and ranging (LIDAR), and imaging. The layers/regions can be grown on SOI or bulk silicon substrates. Shown in FIG. 103, a BOX layer 10308 is used to provide higher refraction index contrast to confine the photon trapped light. As discussed earlier, the BOX layer 10308 can be partially and/or entirely removed beneath the photodetector to provide a higher refractive index contrast which can further improve the QE.

The N+Si layer 10304 adjacent to the BOX layer 10308 can have a resistivity of 0.02 ohm-cm or less with thickness ranging from 100 nm to 1000 nm approximately. Si P layer 10303 can have resistivity of 1 ohm-cm or less with thickness ranging from 50 nm to 500 nm. Ge and/or GeSi alloy I and or low doped layer/region 10302 can have resistivity of 0.2 ohm-cm or greater with thickness ranging from 100 nm to 5000 nm. Ge and/or GeSi P+ layer 10306 can have resistivity of 0.05 ohm-cm or less with thickness ranging from 50 nm to 1000 nm. In some cases a thin metal or transparent conducting metal oxide such as indium tin oxide (ITO) of thickness ranging from 5 nm to 1000 nm can be added to the top layer to reduce the series resistances.

In some cases, the Ge and/or GeSi layers 10302 and/or 10306 can be grown by selective area growth where dielectric layers such as silicon oxide, nitride for example, 10364 can be used to cover areas on the silicon to prevent crystalline or mostly crystalline Ge or GeSi growth. An array of dielectric pattern of rectangular, polygonal, circular, oval and/or any other shapes can be deposited or otherwise formed on the Si 10303 such that during selective area growth of Ge/GeSi, those areas with dielectric will be void and or mostly void of high quality Ge/GeSi such as crystalline or mostly crystalline. These voids can be called microstructure holes. The dielectric thin film pattern can be periodic and/or aperiodic with nearest edge to edge spacing ranging from 50 nm to 3000 nm and with lateral dimensions ranging from 100 nm to 3500 nm or more.

The microstructure holes 10312 formed using selective area growth are shown as holes "C" in FIG. 103. The sidewalls of the holes "C" may not be vertical as shown but may have slope depending on the thickness of the Ge/GeSi and growth conditions and crystal orientations. The C microstructure holes can be further etched to improve MSPD/MSAPD performances if necessary. In some cases, additional holes can be etched into the Ge/GeSi layers after selective area growth as shown in holes "A" and "B" where holes "A" can be an inverted pyramid and "B" can be cylindrical and or funnel or cone and/or any combination of shapes using dry and/or wet etch. The microstructure holes can be etched to depths into the first doped layer (P+) 10306 and/or into the I or low doped Ge/GeSi layer/region 10302. As discussed elsewhere herein, thermal annealing and/or passivation can be used to reduce leakage current due to etching damages and/or exposed surfaces. The wavelength range of operation can be from 800 nm to 1650 nm or longer depending on the composition of GeSi alloy and/or Ge and whether the layers are strained or relaxed. Data rates can range from less than 1 Gb/s to 50 Gb/s or higher depending on photodetector layer structure and diameter.

In the case of MSAPDs, a reverse bias voltage ranging from −5 to −35 volts can be applied to the anode 10320 and cathode 10322 (shown formed in a mesa/trench etch 10360) and can operate in either the avalanche mode and/or the persistent avalanche mode. In the case of MSPDs, the Si P 10303 layer may not be necessary and a reverse bias voltage of −2 to −10 volts can be applied to the anode 10320 and cathode 10322. In some cases, selective area growth may not be necessary and microstructure holes A and B can be etched into the first doped layer and or into the I or low doped region. The photodetectors with microstructure holes for photon trapping can have a QE (or external QE, EQE) greater than a comparable photodetector without microstructure holes for photon trapping for certain wavelengths.

According to some embodiments, the temperature range of operation for the MSPDs described herein can range from −40 to 95 degrees centigrade, in some cases from −5 to 95 degrees, and in some cases from −40 to 100 degrees C.

According to some embodiments, the thickness of the BOX layer for MSPDs/MSAPDs described herein can range from 5 nm to 5000 nm or more and in some cases from 20 nm to 5000 nm or more. In some cases the BOX layer or region can be ion implanted.

According to some embodiments, the pitch between MSPDs/AMSPDs in an array can range from 100 to 4000 micrometers.

According to some embodiments, high data rate bandwidth of the integrated chip comprising MSPD/AMSPD and CMOS and or BiCMOS ASICs with clean open eye diagrams can result in bit error rates (BER) of 1E-3 to 1E-12 or better for certain data rates in the range of less than 1 Gb/s to 25 Gb/s or higher, in some cases for data rates of 50 Gb/s or higher, and in some cases for data rates of 100 Gb/s or higher. BER also depends on the bit patter, and any error correcting algorithms and or forward error corrections.

Although the foregoing has been described in some detail for purposes of clarity, it will be apparent that certain changes and modifications may be made without departing from the principles thereof. It should be noted that there are many alternative ways of implementing both the processes and apparatuses described herein. Accordingly, the present embodiments are to be considered as illustrative and not restrictive, and the body of work described herein is not to be limited to the details given herein, which may be modified within the scope and equivalents of the appended claims.

The invention claimed is:

1. A single-chip device comprising an integrated combination of a microstructure-enhanced photodetector (MSPD) configured for reverse-bias operation and an active electronic circuit, both formed on or in a single substrate and configured to receive an optical input that in cross-section is substantially continuous spatially, convert the optical input to an electrical output, and process the electrical output into a processed output, wherein:
   the MSPD on or in said single substrate comprises an intermediate region, a first region at one side of the intermediate region, and a second region at an opposite side of the intermediate region, wherein:
      each of the regions comprises Silicon, Germanium, or an alloy thereof;
      at least one of said regions, and an optional overlying covering region, have holes intentionally formed therein
      each of the first and second regions comprises a doped material;
      the intermediate region comprises a material that is less doped than at least one of the first and second regions or is undoped, wherein the degree of doping is the same or different for different positions in the intermediate region;
   an input portion configured to concurrently receive at a plurality of said holes said optical input that has said substantially continuous cross-section; and
   an output portion configured to provide said electrical output from the MSPD;
   the MSPD includes reverse-bias contacts coupled therewith to establish an electrical field therein when energized to thereby sweep in a selected direction electrical charges generated in the MSPD by said optical input; and
   the active electronic circuit on or in said single substrate is configured to process the electrical output from the MSPD by applying thereto:
      amplification to form said processed output from the single-chip device;
      processing other than or in addition to amplification to form said processed output from the single-chip device; and
      routing to one or more selected destinations; and
   a communication channel on or in said single-chip device, configured to deliver the electrical output from the MSPD to the active electronic circuit.

2. The single-chip device of claim 1, in which said active electronic circuit at least partly extends beyond said substrate.

3. The single-chip device of claim 1, in which said active electronic circuit is at least partly inside said substrate.

4. The single-chip device of claim 1, in which said overlying region is present as a superstrate at one side of said first, intermediate, and second regions, and contains said holes.

5. The single-chip device of claim 1, in which said MSPD comprises a III-V materials family photodiode.

6. The single-chip device of claim 1, further including an air-filled volume between the substrate and the MSPD.

7. The single-chip device of claim 1, further including a region of a dielectric material that covers the holes and is in the propagation path of said optical input.

8. The single-chip device of claim 1, further including an avalanche region at one side of the MSPD, forming therewith an avalanche microstructured photodiode (MSAPD).

9. The single-chip device of claim 1, in which said holes are present in said intermediate region.

10. The single-chip device of claim 1, in which said holes are present in said intermediate region as well as in at least one of the first and second regions.

11. The single-chip device of claim 1, in which said holes are present in each of the first, second, and intermediate region.

12. The single-chip device of claim 1, in which each of said first and second regions and said intermediate region has a thickness and at least some of said holes extend through the entire thickness of said intermediate region and of one of said first region and second region and through at least a part of the thickness of the other one of said first and second regions.

13. The single-chip device of claim 1, in which at least some of said holes are shaped as inverted pyramids.

14. The single-chip device of claim 1, in which at least some of said holes have triangular sections in planes transverse to said regions.

15. The single-chip device of claim 1, in which at least some of said holes have triangular sections in planes transverse to said regions, with vertices within the intermediate region.

16. The single-chip device of claim 1, in which at least some of said holes have sidewalls that slope in planes transverse to said regions.

17. The single-chip device of claim 1, in which at least some of said holes have sidewalls with plural different slopes along the inside walls of the holes.

18. The single-chip device of claim 1, in which at least some of said holes differ from each other in at least one of (i) distance by which the holes extend in said directions, (ii) shape of the holes, and (iii) spacing of the holes from each other.

19. The single-chip device of claim 1, in which the holes are in the intermediate region and wherein one of said first and second regions conformally covers inside walls of the holes as well as spaces between the holes.

20. The single-chip device of claim 1, in which the holes are at least partly filled with a dielectric material.

21. The single-chip device of claim 1, in which the holes are entirely filled with a dielectric material.

22. The single-chip device of claim 1, in which said optical input enters the MSPD through one or both of said first and second regions, and each of the first and second regions through which the optical input enters is no more than 500 nanometers thick.

23. The single-chip device of claim 1, in which at least one of the first region, the second region, and the intermediate region comprises a material represented by $Ge_x Si_{1-x}$, where x is greater than zero.

24. The single-chip device of claim 1, in which said MSPD further comprises ohmic contacts configured for reverse-biasing the MSPD.

25. The single-chip device of claim 1, in which the MSPD further includes ohmic contacts to said first and second regions, at least one of said ohmic contact being through a via in said substrate.

26. The single-chip device of claim 1, further comprising a light guide to said MSPD for directing said optical input thereto, and electrical contacts from the active electronic circuit configured to carry said processed output out of the single-chip device.

27. The single-chip device of claim 1, further comprising a light guide to said MSPD configured to bend the optical input from an initial propagation direction to a propagation direction transverse to said regions, and electrical contacts from the active electronic circuit configured to carry said processed output out of the single-chip device.

28. The single-chip device of claim 1, further comprising one or more additional MSPD on or in the same substrate, and respective different optical bandpass filters coupled with at least two of the MSPDs on or in said single substrate, whereby at least two of said MSPDs are configured to respond to different wavelength ranges that are within said optical input.

29. The single-chip device of claim 1, further comprising one or more additional MSPDs on or in said single substrate, one or more additional active electronic circuits on or in the said single substrate, and one or more additional communication channels configured to supply electrical outputs from the MSPDs to the one or more of the active electronic circuits.

30. The single-chip device of claim 1, further comprising one or more additional active electronic circuits that are formed on or in the said single substrate.

31. The single-chip device of claim 1, further comprising one or more additional active electronic circuits that are formed on or in the said single substrate and comprise one or more transimpedance amplifiers (TIAs) and one or more application specific integrated circuits (ASICs).

32. The single-chip device of claim 1, further comprising one or more additional active electronic circuits that are formed on or in the said single substrate and comprise one or more of CMOS, BiCMOS, and bipolar active devices.

33. The single-chip device of claim 1, further comprising one or more additional MSPDs in an array on or in said single substrate and one or more additional active electronic circuits also on or in said single substrate, said MSPDs and active electronic circuits being configured into an optical communication structure or a light distance and ranging (LIDAR) structure.

34. The single-chip device of claim 1, further comprising a laser emitter formed on or in said single substrate.

35. The single-chip device of claim 1, further including a region of selected material that is over a side of one of the first and second regions facing away from the intermediate region and is configured to reduce sheet resistance.

36. The single-chip device of claim 1, further including a region of selected material that is over a side of one of the first and second regions facing away from the intermediate region and is configured to reflect light that has passed through the intermediate region back toward the intermediate region.

37. The single-chip device of claim 1, further including a deliberately textured surface at a side of one of said first and second regions facing away from the intermediate region.

38. The single-chip device of claim 1, further including a region of micro-nano structures formed at of one of said first and second facing, at a surface thereof facing away from the intermediate region.

39. The single-chip device of claim 1, further including one or more distributed Bragg reflectors formed at one of said first and second regions, at a surface thereof away from the intermediate region.

40. The single-chip device of claim 1, further including an isolation trench between the MSPD and the active electronic circuit.

41. The single-chip device of claim 1, in which said holes are in a pattern that is aperiodic.

42. The single-chip device of claim 1, in which said holes are in a pattern that extends laterally, along a surface of said intermediate region, and said first and second regions are spaced from each other laterally and are along sides of the intermediate region that are transverse to said surface thereof.

43. The single-chip device of claim 42, further comprising one or more additional MSPDs on or in the same substrate, each of said additional MSPDs having a respective pair of first and second regions, and respective anodes and cathodes coupled with said first and second regions to establish electric fields in said MSPDs.

44. The single-chip device of claim 43, in which said pairs of anodes and cathodes are interleaved with arrays of said holes in an interleaved fingers pattern.

* * * * *